US012660410B2

(12) United States Patent
Sim et al.

(10) Patent No.: US 12,660,410 B2
(45) Date of Patent: Jun. 16, 2026

(54) LIGHT EMITTING DEVICE AND FUSED POLYCYCLIC COMPOUND FOR THE LIGHT EMITTING DEVICE

(71) Applicant: Samsung Display Co., LTD., Yongin-si (KR)

(72) Inventors: Mun-Ki Sim, Yongin-si (KR); Taeil Kim, Yongin-si (KR); Jang Yeol Baek, Yongin-si (KR); MinJae Sung, Yongin-si (KR); Minjung Jung, Yongin-si (KR); Seonhyoung Hur, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 415 days.

(21) Appl. No.: 18/362,332

(22) Filed: Jul. 31, 2023

(65) Prior Publication Data

US 2024/0130148 A1 Apr. 18, 2024

(30) Foreign Application Priority Data

Sep. 19, 2022 (KR) ........................ 10-2022-0118170

(51) Int. Cl.
*H10K 50/11* (2023.01)
*C07F 5/02* (2006.01)
(Continued)

(52) U.S. Cl.
CPC ................ *H10K 50/11* (2023.02); *C07F 5/02* (2013.01); *H10K 85/346* (2023.02); *H10K 85/658* (2023.02); *C07B 2200/05* (2013.01)

(58) Field of Classification Search
CPC .... H10K 50/11; H10K 85/346; H10K 85/658; H10K 50/00; H10K 85/657;
(Continued)

(56) References Cited

U.S. PATENT DOCUMENTS

2020/0190115 A1 6/2020 Hatakeyama et al.
2021/0062078 A1* 3/2021 Kato .................. H10K 85/6572
2022/0112232 A1 4/2022 Macinnis et al.

FOREIGN PATENT DOCUMENTS

CN 114195813 A 3/2022
KR 10-2016-0119683 A 10/2016
(Continued)

OTHER PUBLICATIONS

Salcedo, Roberto et al., "Five and nine membered (heteronines) heterocyclic molecules. Theoretical approach", Tetrahedron, vol. 57, Issue 42, Oct. 15, 2001, pp. 8759-8765.

*Primary Examiner* — Ermias T Woldegeorgis
(74) *Attorney, Agent, or Firm* — Womble Bond Dickinson (US) LLP

(57) ABSTRACT

Provided is a light emitting device including a first electrode, a second electrode facing the first electrode, and an emission layer between the first electrode and the second electrode, wherein the emission layer includes a first compound represented by Formula 1 below.

Formula 1

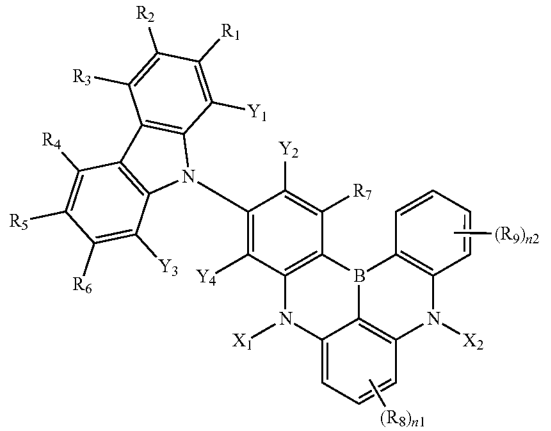

20 Claims, 9 Drawing Sheets

(51) Int. Cl.
*H10K 85/30* (2023.01)
*H10K 85/60* (2023.01)

(58) Field of Classification Search
CPC ........... H10K 85/6572; H10K 85/6574; H10K 85/322; C07F 5/02; C07B 2200/05
See application file for complete search history.

(56) References Cited

FOREIGN PATENT DOCUMENTS

| | | | |
|---|---|---|---|
| KR | 10-2022-0019714 | A | 2/2022 |
| KR | 10-2022-0021418 | A | 2/2022 |
| KR | 10-2022-0031512 | A | 3/2022 |
| WO | WO 2018/212169 | A1 | 11/2018 |

* cited by examiner

LIGHT EMITTING DEVICE AND FUSED POLYCYCLIC COMPOUND FOR THE LIGHT EMITTING DEVICE

CROSS-REFERENCE TO RELATED APPLICATION

This application claims priority to and the benefit of Korean Patent Application No. 10-2022-0118170, filed in the Korean Intellectual Property Office on Sep. 19, 2022, the entire contents of which are hereby incorporated by reference.

BACKGROUND

1. Field

Embodiments of the present disclosure herein relate to a light emitting device and a fused polycyclic compound used in the light emitting device.

2. Related Art

Recently, the development of an organic electroluminescence display apparatus as an image display apparatus is being actively conducted. Unlike liquid crystal display apparatuses and the like, the organic electroluminescence display apparatus is a so-called self-luminescent display apparatus in which holes and electrons injected from a first electrode and a second electrode recombine in an emission layer, and thus a luminescent material including an organic compound in the emission layer emits light to implement a display.

In the application of an organic electroluminescence device to a display apparatus, there is a demand for an organic electroluminescence device having a low driving voltage, high luminous efficiency, and a long service life, and the development of materials, for an organic electroluminescence device, capable of stably attaining such characteristics is being investigated continuously.

In recent years, for example, in order to implement a highly efficient organic electroluminescence device, technologies pertaining to phosphorescence emission using triplet state energy or delayed fluorescence using triplet-triplet annihilation (TTA) in which singlet excitons are generated by collision of triplet excitons are being developed, and thermally activated delayed fluorescence (TADF) materials using delayed fluorescence phenomenon are being developed.

SUMMARY

Embodiments of the present disclosure provide a light emitting device in which luminous efficiency and a device service life are improved.

Embodiments of the present disclosure also provide a fused polycyclic compound capable of improving luminous efficiency and a device service life of a light emitting device.

One or more embodiments of the present disclosure provide a light emitting device including a first electrode, a second electrode facing the first electrode, and an emission layer between the first electrode and the second electrode, wherein the emission layer includes a first compound represented by Formula 1 below:

Formula 1

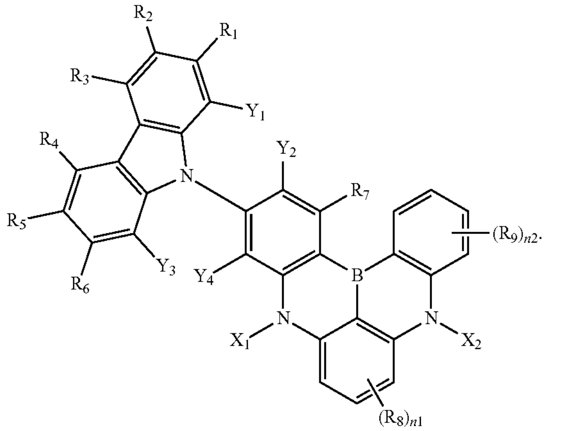

In Formula 1 above, $R_1$ to $R_9$ and $Y_1$ to $Y_4$ are each independently a hydrogen atom, a deuterium atom, a halogen atom, a cyano group, a substituted or unsubstituted silyl group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, $X_1$ and $X_2$ are each independently a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, n1 is an integer of 0 to 3, n2 is an integer of 0 to 4, and any one pair of $Y_1$ and $Y_2$ or $Y_3$ and $Y_4$ is a position to which a substituent represented by Formula 2 below is linked.

Formula 2

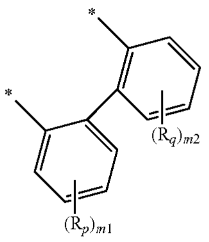

In Formula 2 above, -* is a position respectively linked to any one pair of $Y_1$ and $Y_2$ or $Y_3$ and $Y_4$, $R_p$ and $R_q$ are each independently a hydrogen atom, a deuterium atom, a halogen atom, a cyano group, a substituted or unsubstituted silyl group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and m1 and m2 are each independently an integer of 0 to 4.

In one or more embodiments, $R_p$ and $R_q$ may be each independently a hydrogen atom or a deuterium atom.

In one or more embodiments, the first compound represented by Formula 1 above may be represented by Formula 1-1 below:

Formula 1-1

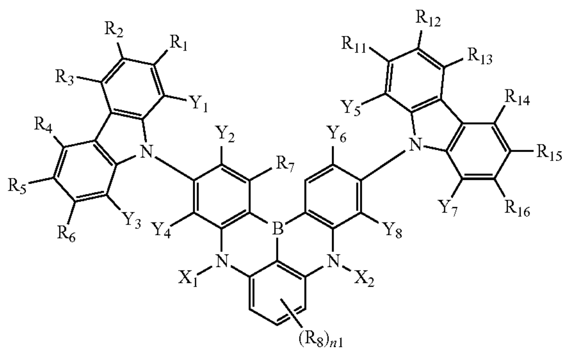

In Formula 1-1 above, $R_{11}$ to $R_{16}$ and $Y_5$ to $Y_8$ may be each independently a hydrogen atom, a deuterium atom, a halogen atom, a cyano group, a substituted or unsubstituted silyl group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form ring, any one pair of $Y_5$ and $Y_6$ or $Y_7$ and $Y_8$ may be a position to which a substituent represented by Formula 2 above is linked, and $R_1$ to $R_8$, $Y_1$ to $Y_4$, $X_1$, $X_2$ and n1 may be the same as defined with respect to Formula 1 above.

In one or more embodiments, the first compound represented by Formula 1 above may be represented by Formula 1-2 below:

Formula 1-2

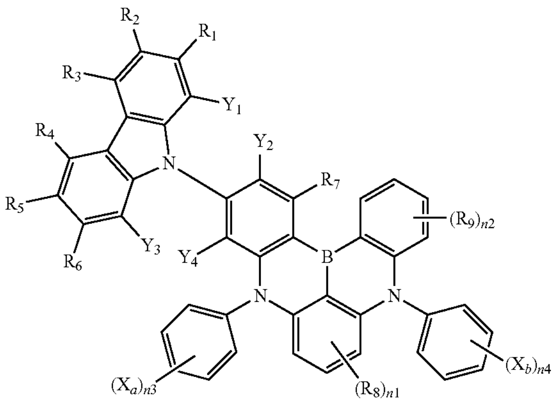

In Formula 1-2 above, $X_a$ and $X_b$ may be each independently a hydrogen atom, a deuterium atom, a cyano group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, and n3 and n4 may be each independently an integer of 0 to 5, and $R_1$ to $R_9$, $Y_1$ to $Y_4$, n1 and n2 may be the same as defined with respect to Formula 1 above.

In Formula 1-2 above, $X_a$ and $X_b$ may be each independently a substituted or unsubstituted butyl group, a substituted or unsubstituted aryl group having 6 to 30 ring-forming carbon atoms, or a substituted or unsubstituted heteroaryl group having 2 to 30 ring-forming carbon atoms.

In one or more embodiments, the first compound represented by Formula 1 above may be represented by Formula 1-3 or 1-4 below:

Formula 1-3

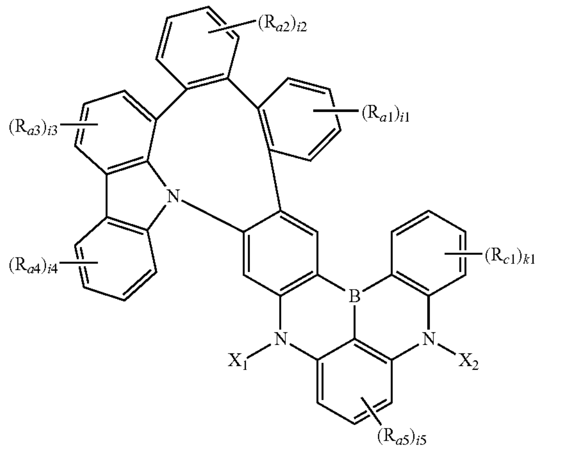

Formula 1-4

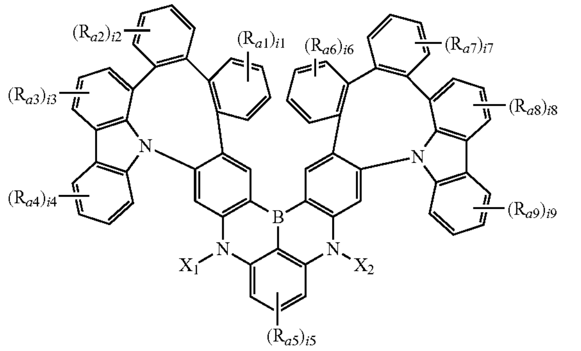

In Formula 1-3 and Formula 1-4 above, $R_{a1}$ to $R_{a9}$ may be each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, $R_{c1}$ may be a hydrogen atom, a deuterium atom, a halogen atom, a cyano group, a substituted or unsubstituted silyl group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, i1, i2, i4, i6, i7, i9, and k1 may be each independently an integer of 0 to 4, i3, i5, and i8 may be each independently an integer of 0 to 3, and $X_1$ and $X_2$ may be the same as defined with respect to Formula 1 above. In one or more embodiments, $R_{a1}$ to $R_{a4}$ and $R_{a6}$ to $R_{a9}$ may be each independently a hydrogen atom or a deuterium atom.

In one or more embodiments, the first compound represented by Formula 1 above may be represented by Formula 1-5 or 1-6 below:

independently an integer of 0 to 3, and $X_1$ and $X_2$ may be the same as defined with respect to Formula 1 above. In one or more embodiments, $R_{b1}$ to $R_{b4}$ and $R_{b6}$ to $R_{b9}$ may be each independently a hydrogen atom or a deuterium atom.

In one or more embodiments of the present disclosure, a fused polycyclic compound is represented by Formula 1 above.

BRIEF DESCRIPTION OF THE FIGURES

The accompanying drawings are included to provide a further understanding of the subject matter of the present Formula 1-5

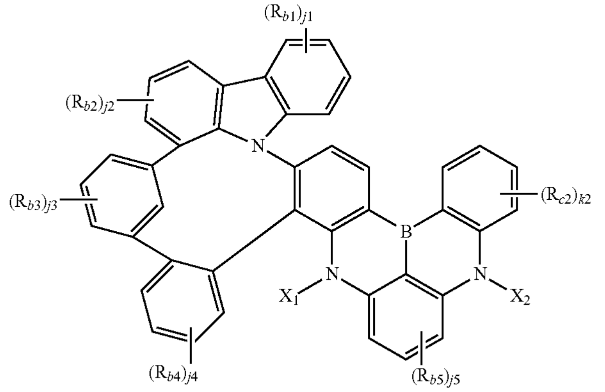

Formula 1-6

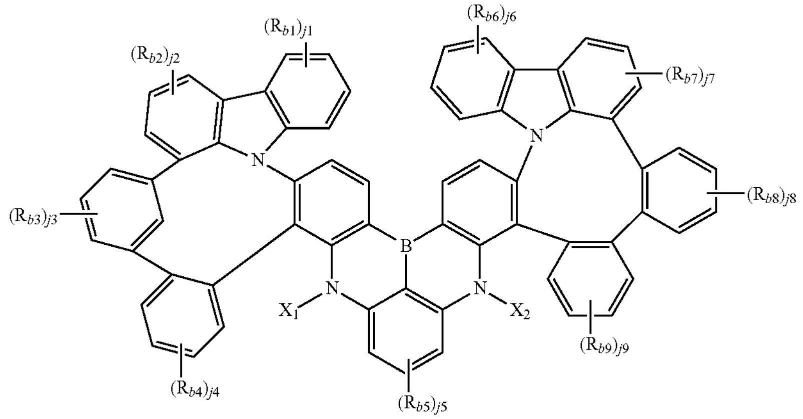

Figure 1:
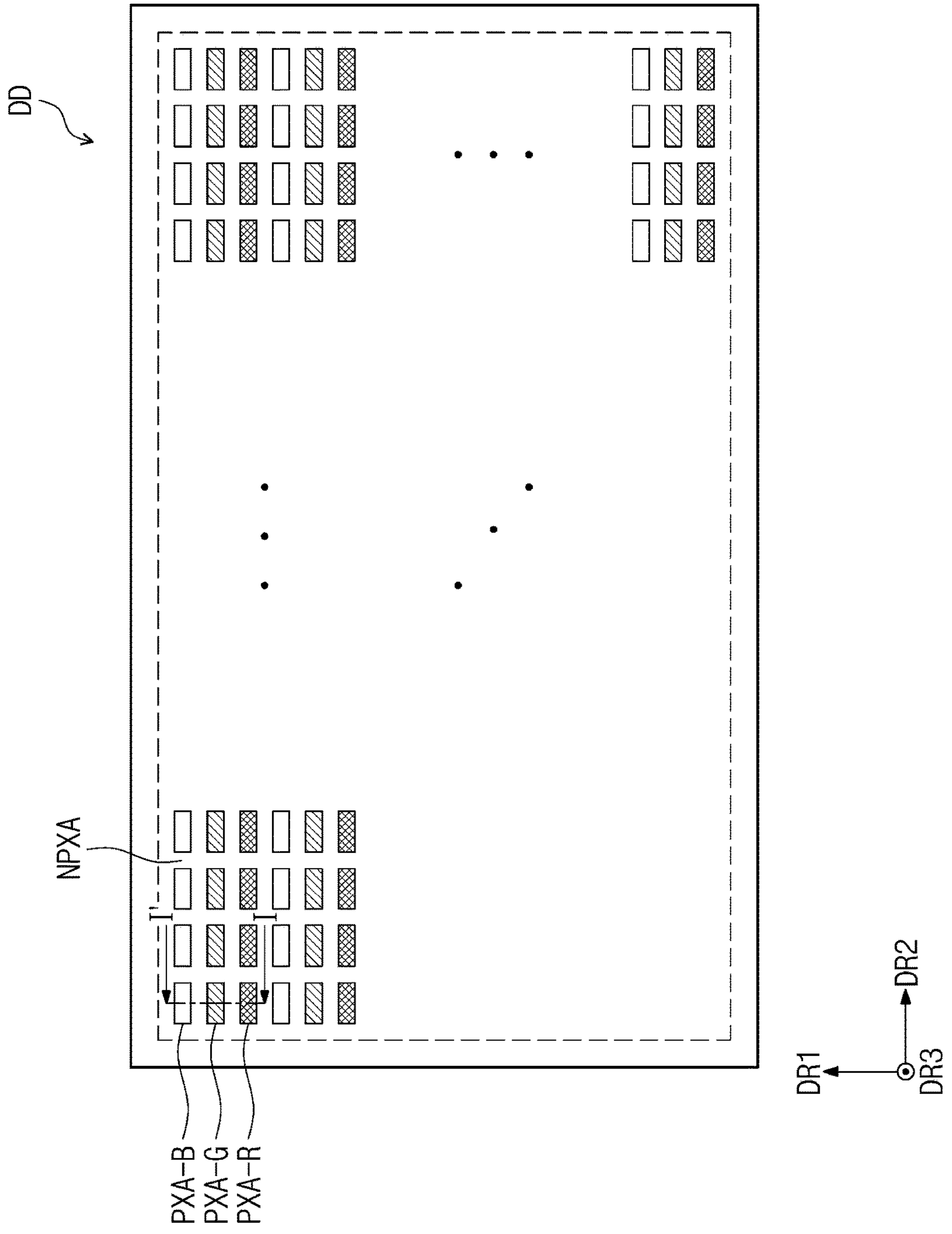
Figure 2:
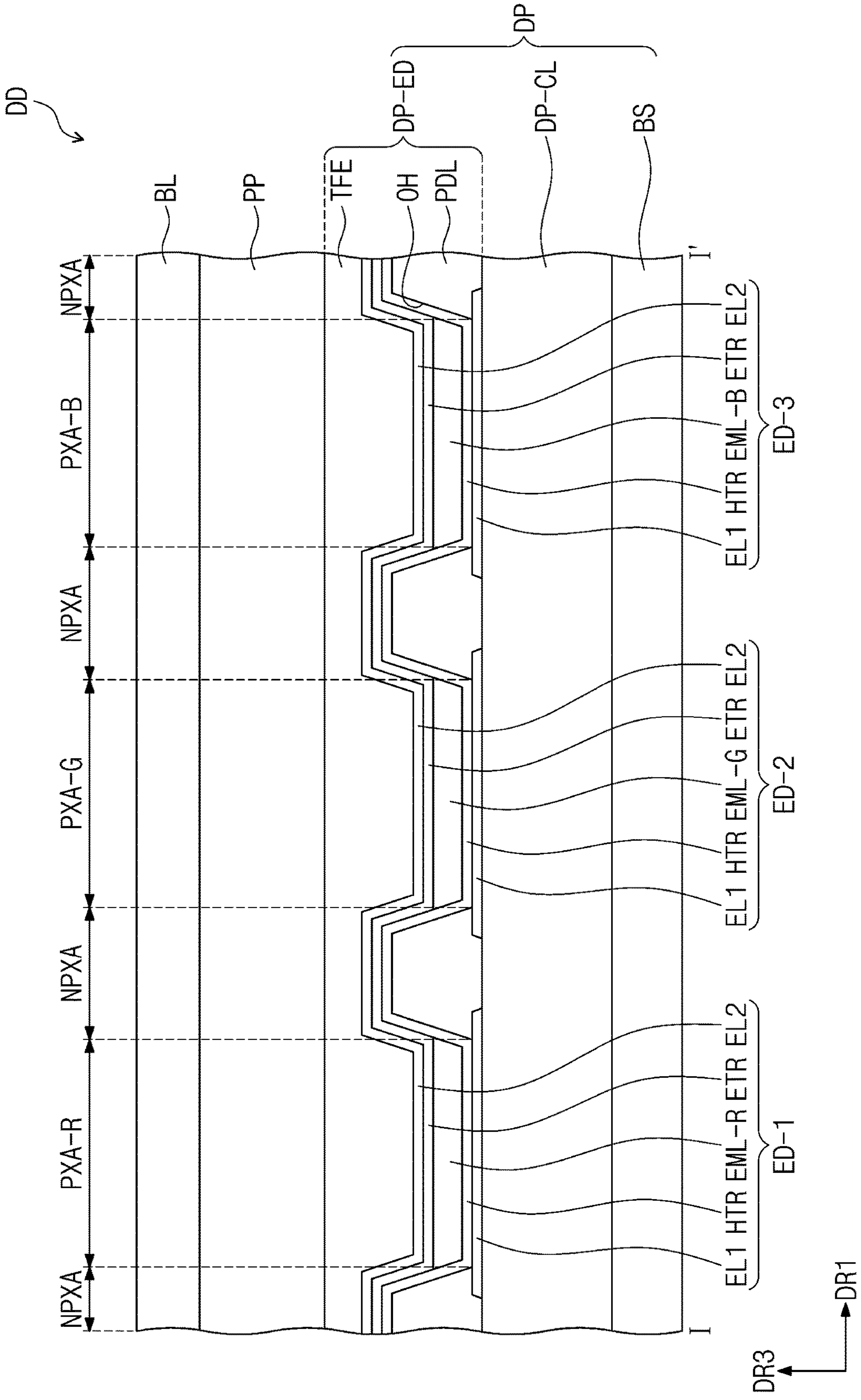
Figure 3:
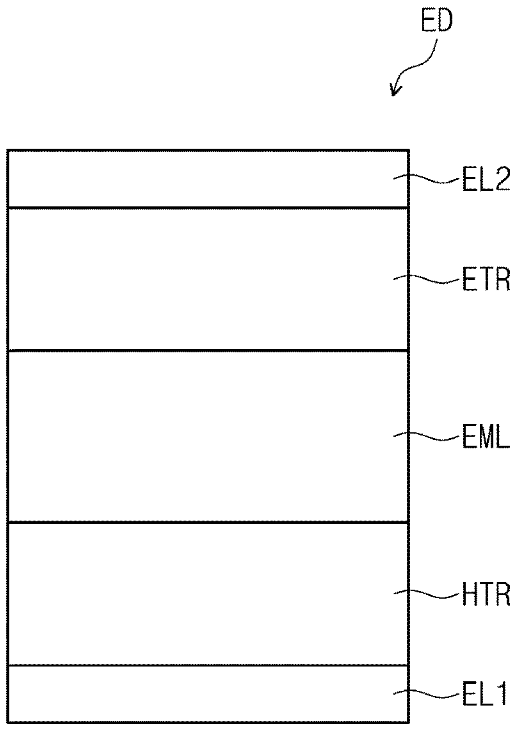
Figure 4:
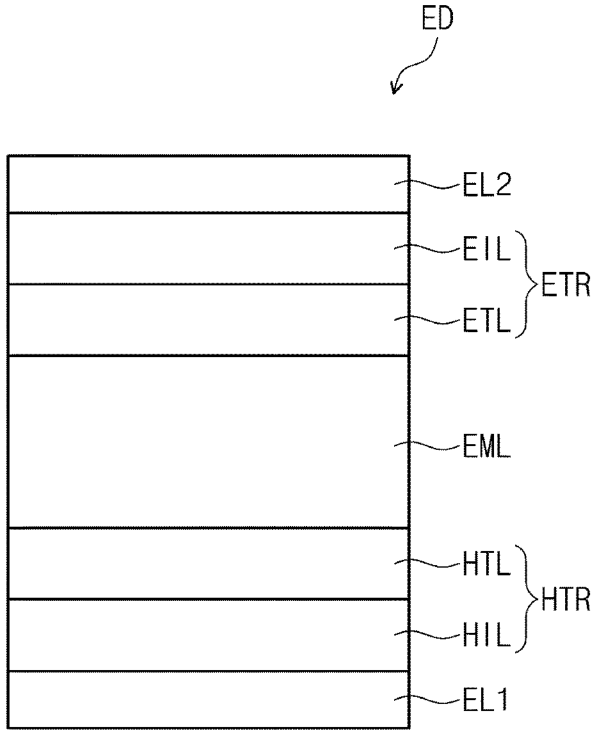
Figure 5:
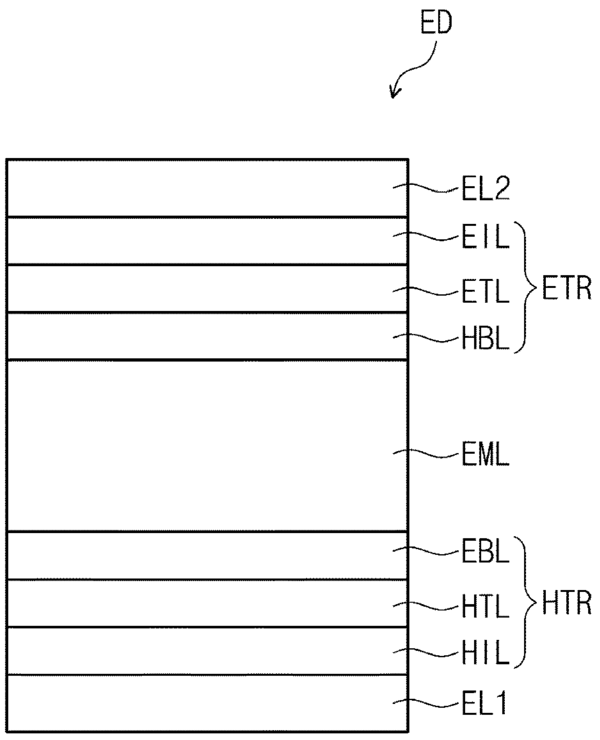
Figure 6:
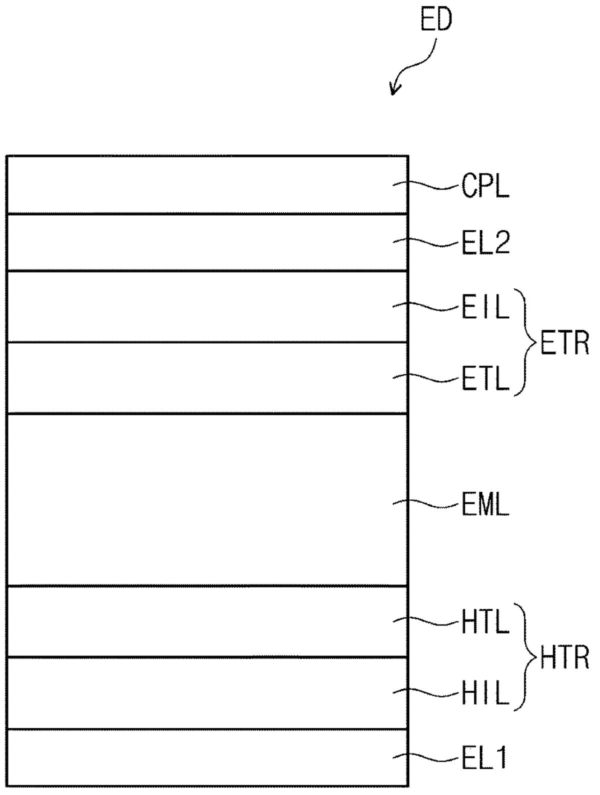
Figure 7:
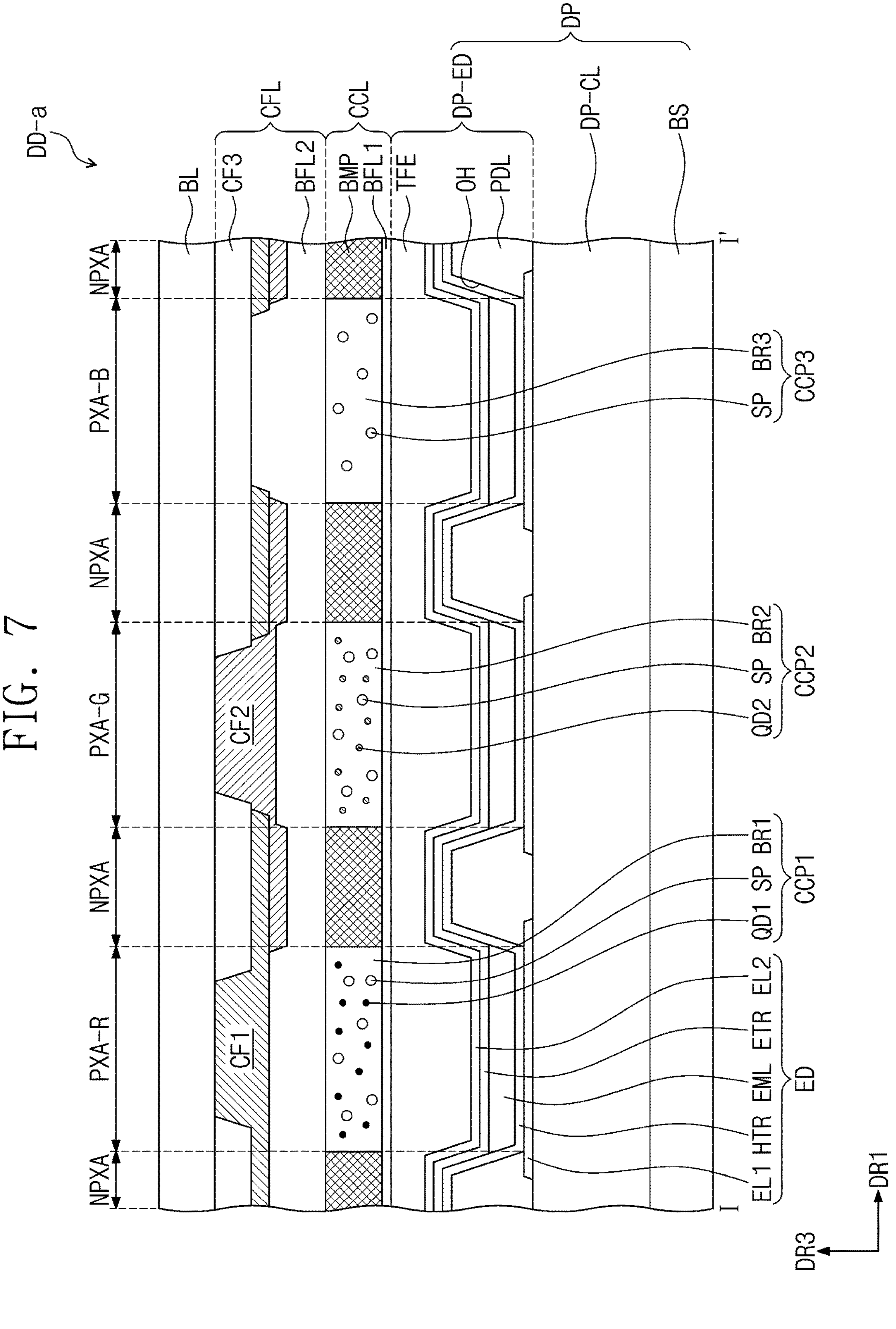
Figure 8:
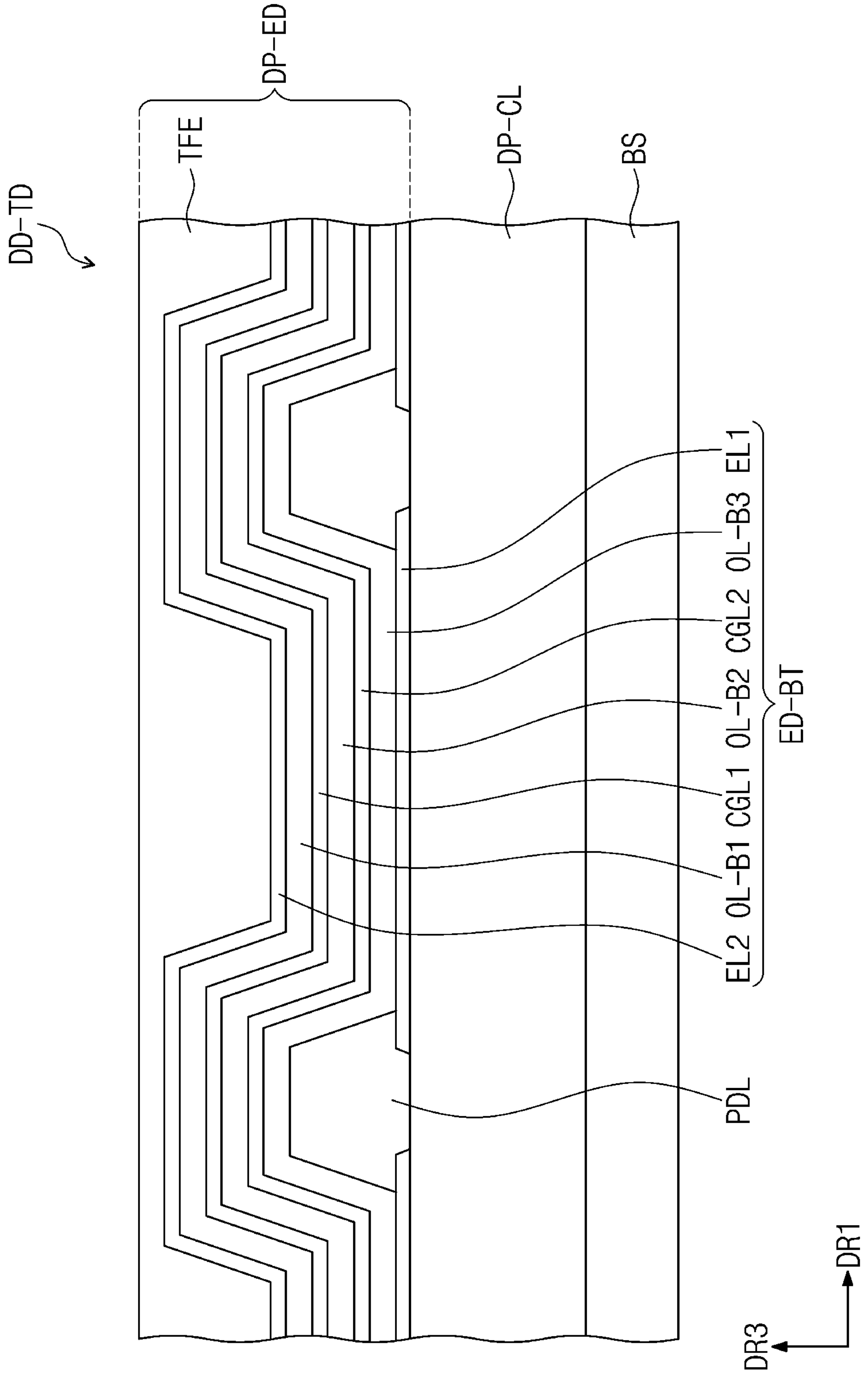
Figure 9:
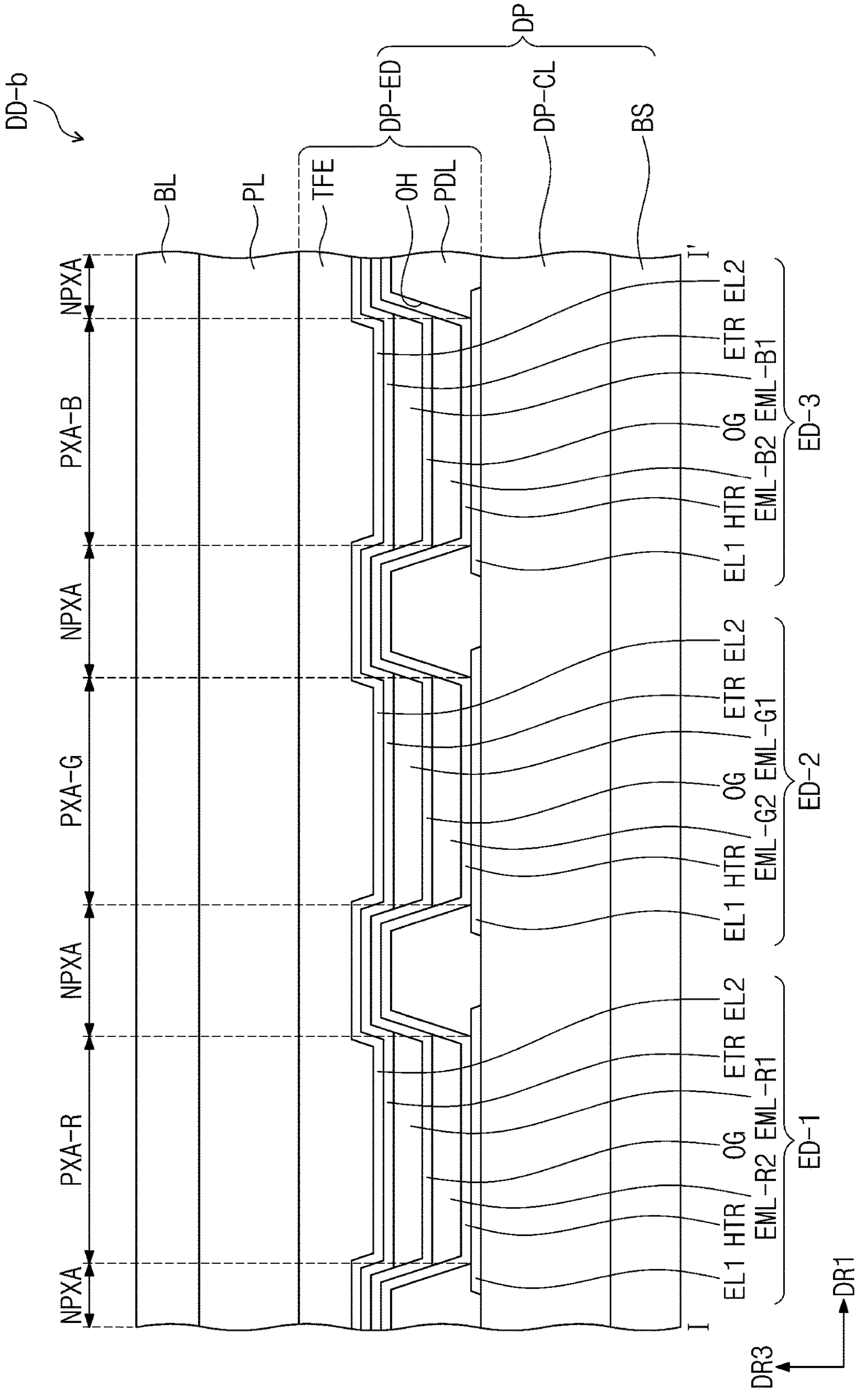
Figure 10:
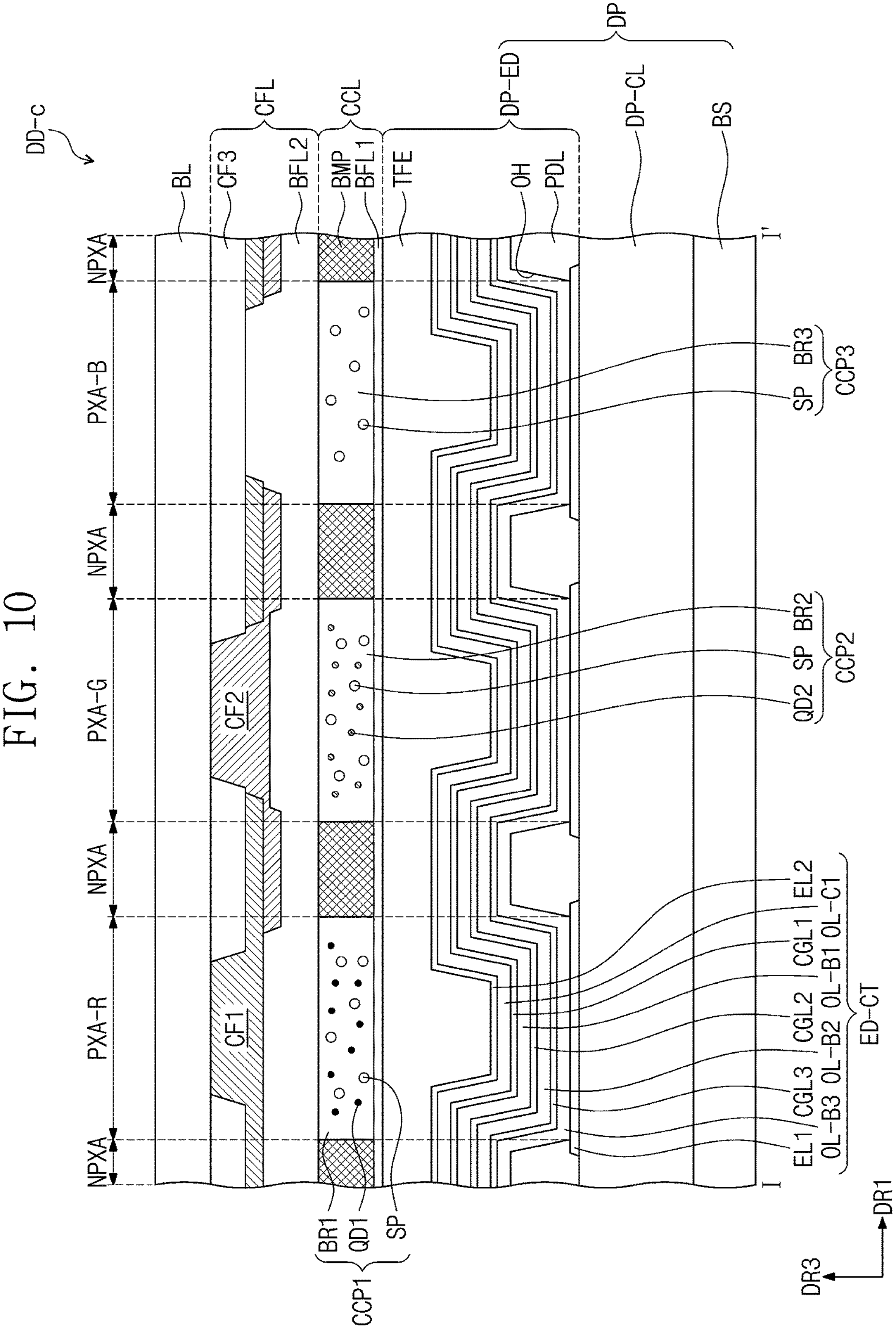
Figure 11:
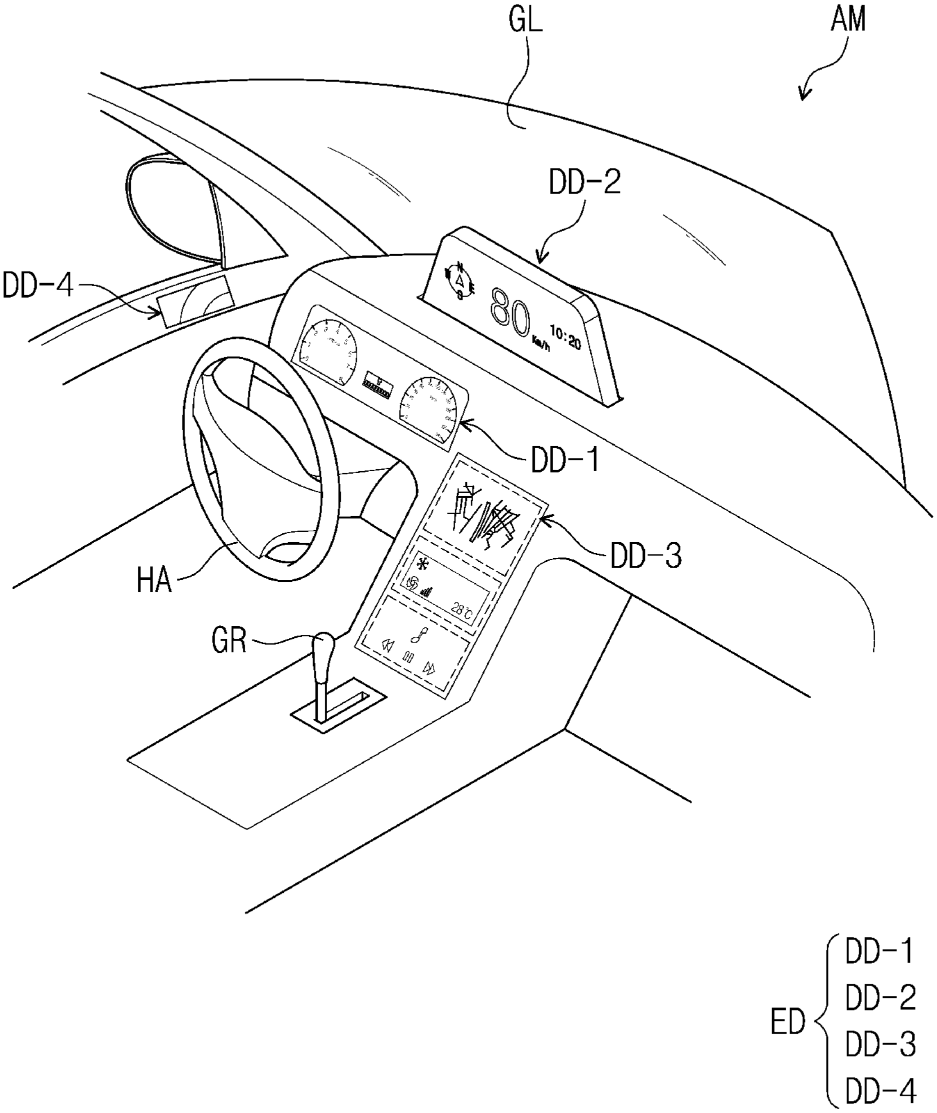

In Formula 1-5 and Formula 1-6 above, $R_{b1}$ to $R_{b9}$ may be each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, $R_{c2}$ may be a hydrogen atom, a deuterium atom, a halogen atom, a cyano group, a substituted or unsubstituted silyl group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, j1, j3, j4, j6, j7, j9, and k2 may be each independently an integer of 0 to 4, j2, j5, and j8 may be each disclosure, and are incorporated in and constitute a part of this specification. The drawings illustrate example embodiments of the present disclosure and, together with the description, serve to explain principles of the subject matter of the present disclosure. In the drawings:

FIG. 1 is a plan view of a display apparatus according to one or more embodiments of the present disclosure;

FIG. 2 is a cross-sectional view of a display apparatus according to one or more embodiments of the present disclosure;

FIG. 3 is a cross-sectional view schematically illustrating a light emitting device according to one or more embodiments of the present disclosure;

FIG. 4 is a cross-sectional view schematically illustrating a light emitting device according to one or more embodiments of the present disclosure;

FIG. 5 is a cross-sectional view schematically illustrating a light emitting device according to one or more embodiments of the present disclosure;

FIG. 6 is a cross-sectional view schematically illustrating a light emitting device according to one or more embodiments of the present disclosure;

Each of FIGS. 7 and 8 is a cross-sectional view of a display apparatus according to one or more embodiments of the present disclosure;

FIG. 9 is a cross-sectional view illustrating a display apparatus according to one or more embodiments of the present disclosure;

FIG. 10 is a cross-sectional view illustrating a display apparatus according to one or more embodiments of the present disclosure; and FIG. 11 is a perspective view schematically illustrating an electronic apparatus including a display apparatus according to one or more embodiments of the present disclosure.

DETAILED DESCRIPTION

The subject matter of the present disclosure may be modified in various manners and have many forms, and thus example embodiments will be illustrated in the drawings and described in more detail in the detailed description of the present disclosure. It should be understood, however, that it is not intended to limit the subject matter of the present disclosure to the particular forms disclosed, but rather, is intended to cover all modifications, equivalents, and alternatives falling within the spirit and scope of the present disclosure.

When explaining each of the drawings, like reference numbers are used for referring to like elements. In the accompanying drawings, the dimensions of each structure may be exaggeratingly illustrated for clarity of the present disclosure. It will be understood that, although the terms "first," "second," etc., may be used herein to describe various components, these components should not be limited by these terms. These terms are only used to distinguish one component from another. For example, a first component could be termed a second component, and, similarly, a second component could be termed a first component, without departing from the scope of example embodiments of the present disclosure. The terms of a singular form may include plural forms unless the context clearly indicates otherwise.

In the present application, it will be understood that the terms "include," "have" or the like specify the presence of features, numbers, steps, operations, component, parts, or combinations thereof disclosed in the specification, but do not exclude the possibility of presence or addition of one or more other features, numbers, steps, operations, component, parts, or combinations thereof.

In the present application, when a layer, a film, a region, or a plate is referred to as being "on" or "in an upper portion of" another layer, film, region, or plate, it may be not only "directly on" the layer, film, region, or plate, but intervening layers, films, regions, or plates may also be present. On the contrary to this, when a layer, a film, a region, or a plate is referred to as being "below", "in a lower portion of" another layer, film, region, or plate, it can be not only directly under the layer, film, region, or plate, but intervening layers, films, regions, or plates may also be present. In addition, it will be understood that when a part is referred to as being "on" another part, it can be above the other part, or under the other part as well.

In the specification, the term "substituted or unsubstituted" may mean substituted or unsubstituted with at least one substituent selected from the group consisting of a deuterium atom, a halogen atom, a cyano group a nitro group, an amine group, a silyl group, an oxy group, a thio group, a sulfinyl group, a sulfonyl group, a carbonyl group, a boron group, a phosphine oxide grot p, a phosphine sulfide group, an alkyl group, an alkenyl group, an alkynyl group, an alkoxy group, a hydrocarbon ring group, an aryl group, and a heterocyclic group. In addition, each of the substituents described above may be substituted or unsubstituted. For example, a biphenyl group may be interpreted as an aryl group or a phenyl group substituted with a phenyl group.

In the specification, the phrase "bonded to an adjacent group to form a ring" may mean that one is bonded to an adjacent group to form a substituted or unsubstituted hydrocarbon ring, or a substituted or unsubstituted heterocycle. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocyclic or polycyclic. In addition, the rings formed by being bonded to each other may b connected to another ring to form a spiro structure.

In the specification, the term "adjacent group" may mean a substituent substituted for an atom which is directly linked to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as "adjacent groups" to each other and two ethyl groups in 1,1-diethylcyclopentane may be interpreted as "adjacent groups" to each other. In addition, two methyl groups in 4,5-dimethylphenanthrene may be interpreted as "adjacent groups" to each other.

In the specification, examples of the halogen atom may include a fluorine atom, a chlorine atom, a bromine atom, or an iodine atom.

In the specification, the alkyl group may be a linear, branched or cyclic type (or kind). The number of carbons in the alkyl group is 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an 2-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but embodiments of the present disclosure are not limited thereto.

In the specification, an alkenyl group means a hydrocarbon group including at least one carbon double bond in the middle or terminal end of an alkyl group having 2 or more carbon atoms. The alkenyl group may be linear or branched. The number of carbon atoms in the alkenyl group is not specifically limited, but is 2 to 30, 2 to 20, or 2 to 10. Examples of the alkenyl group include a vinyl group, a 1-butenyl group, a 1-pentenyl group, a 1,3-butadienyl aryl group, a styrenyl group, a styryl vinyl group, etc., but embodiments of the present disclosure are not limited thereto.

In the specification, an alkynyl group means a hydrocarbon group including at least one carbon triple bond in the middle or terminal end of an alkyl group having 2 or more carbon atoms. The alkynyl group may be linear or branched. Although the number of carbon atoms is not specifically limited, it is 2 to 30, 2 to 20, or 2 to 10. Examples of the alkynyl group include an ethynyl group, a propynyl group, etc., without limitation.

In the specification, the hydrocarbon ring group means any suitable functional group or substituent derived from an aliphatic hydrocarbon ring. The hydrocarbon ring group may be a saturated hydrocarbon ring group having 5 to 20 ring-forming carbon atoms.

In the specification, an aryl group means any suitable functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but embodiments of the present disclosure are not limited thereto.

In the specification, the fluorenyl group may be substituted, and two substituents may be bonded to each other to form a spiro structure. Examples of the substituted fluorenyl group are as follows. However, embodiments of the present disclosure are not limited thereto.

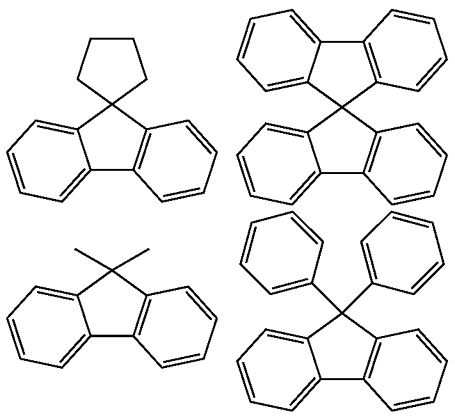

The heterocyclic group herein means any suitable functional group or substituent derived from a ring containing at least one selected from B, O, N, P, Si, and Se as a heteroatom. The heterocyclic group includes an aliphatic heterocyclic group and an aromatic heterocyclic group. The aromatic heterocyclic group may be a heteroaryl group. The aliphatic heterocycle and the aromatic heterocycle may be monocyclic or polycyclic.

In the present specification, when the heterocyclic group includes two or more heteroatoms, the two or more heteroatoms may be the same as or different from each other. The heterocyclic group may be a monocyclic heterocyclic group or a polycyclic heterocyclic group, and includes a heteroaryl group. The number of ring-forming carbon atoms in the heterocyclic group may be 2 to 30, 2 to 20, or 2 to 10.

In the specification, the aliphatic heterocyclic group may include at least one selected from B, O, N, P, Si, and S as a heteroatom. The number of ring-forming carbon atoms in the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., but embodiments of the present disclosure are not limited thereto.

In the specification, the heteroaryl group may include at least one selected from B, O, N, P, Si, and S as a heteroatom. When the heteroaryl group contains two or more heteroatoms, the two or more heteroatoms may be the same as or different from each other. The heteroaryl group may be a monocyclic heterocyclic group or a polycyclic heterocyclic group. The ring-forming carbon number of the heteroaryl group may be 2 to 60, 2 to 30, 2 to 20, or 2 to 10. Examples of the heteroaryl group may include a thiophene group, a furan group, a pyrrole group, an imidazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but embodiments of the present disclosure are not limited thereto.

In the specification, the above description of the aryl group may be applied to an arylene group except that the arylene group is a divalent group. The above description of the heteroaryl group may be applied to a heteroarylene group except that the heteroarylene group is a divalent group.

In the specification, the silyl group includes an alkylsilyl group and an arylsilyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., but embodiments of the present disclosure are not limited thereto.

In the specification, the number of ring-forming carbon atoms in the carbonyl group is not specifically limited, but may be 1 to 40, 1 to 30, or 1 to 20. For example, the carbonyl group may have the following structures, but embodiments of the present disclosure are not limited thereto.

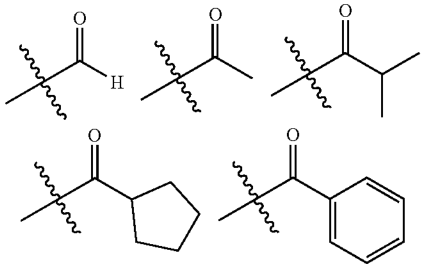

In the specification, the number of carbon atoms in the sulfinyl group and the sulfonyl group is not particularly limited, but may be 1 to 30. The sulfinyl group may include an alkyl sulfinyl group and an aryl sulfinyl group. The sulfonyl group may include an alkyl sulfonyl group and an aryl sulfonyl group.

In the specification, the thio group may include an alkylthio group and an arylthio group. The thio group may mean that a sulfur atom is bonded to the alkyl group or the aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, but embodiments of the present disclosure are not limited thereto.

In the specification, an oxy group may mean that an oxygen atom is bonded to the alkyl group or the aryl group as defined above. The oxy group may include an alkoxy group and an aryl oxy group. The alkoxy group may be a linear chain, a branched chain or a ring chain. The number of carbon atoms in the alkoxy group is not specifically limited, but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc., but embodiments of the present disclosure are not limited thereto.

The boron group herein may mean that a boron atom is bonded to the alkyl group or the aryl group as defined above. The boron group includes an alkyl boron group and an aryl boron group. Examples of the boron group may include a dimethylboron group, a trimethylboron group, a t-butyldimethylboron group, a diphenylboron group, a phenylboron group, etc., but embodiments of the present disclosure are not limited thereto.

In the specification, the alkenyl group may be linear or branched. The number of carbon atoms in the alkenyl group is not specifically limited, but is 2 to 30, 2 to 20, or 2 to 10. Examples of the alkenyl group include a vinyl group, a 1-butenyl group, a 1-pentenyl group, a 1,3-butadienyl aryl group, a styrenyl group, a styryl vinyl group, etc., but embodiments of the present disclosure are not limited thereto.

In the specification, the number of carbon atoms in a amine group is not specifically limited, but may be 1 to 30. The amine group may include an alkyl amine group and an aryl amine group. Examples of the amine group may include a methylamine group, a dimethylamine group, a phenylamine group, a diphenylamine group, a naphthylamine group, a 9-methyl-anthracenylamine group, a triphenylamine group, etc., but. In one or more embodiments, the amine group in the specification may mean a chained amine rather than the form of a fused ring. For example, a cyclic amine group such as a pyrrole group, an imidazole group, a pyridine group, a bipyridine group, a pyrimidine group, an indole group, or a carbazole group may be defined as a heteroaryl group in the specification, and the amine group in the specification may mean an amine group which does not form a ring.

In the specification, the alkyl group among an alkylthio group, an alkylsulfoxy group, an alkylaryl group, an alkylamino group, an alkyl boron group, an alkyl silyl group, and an alkyl amine group is the same as the examples of the alkyl group described above.

In the specification, the aryl group among an aryloxy group, an arylthio group, an arylsulfoxy group, an arylamino group, an arylboron group, an arylsilyl group, an arylamine group is the same as the examples of the aryl group described above.

In the specification, a direct linkage may mean a single bond (e.g., a single covalent bond).

In the specification,

" 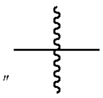 "

and "-*" mean a position to be connected.

Hereinafter, embodiments of the present disclosure will be described with reference to the accompanying drawings.

FIG. 1 is a plan view illustrating one or more embodiments of a display apparatus DD. FIG. 2 is a cross-sectional view of the display apparatus DD of one or more embodiments. FIG. 2 is a cross-sectional view illustrating a part taken along line I-I' of FIG. 1.

The display apparatus DD may include a display panel DP and an optical layer PP on the display panel DP. The display panel DP includes light emitting devices ED-1, ED-2, and ED-3. The display apparatus DD may include a plurality of light emitting devices ED-1, ED-2, and ED-3. The optical layer PP may be on the display panel DP to control reflected light in the display panel DP due to external light. The optical layer PP may include, for example, a polarization layer and/or a color filter layer. In one or more embodiments, the optical layer PP may be omitted from the display apparatus DD.

A base substrate BL may be on the optical layer PP. The optical layer PP may be on a base surface of the base substrate BL. The base substrate BL may be a glass substrate, a metal substrate, a plastic substrate, etc. However, embodiments of the present disclosure are not limited thereto, and the base substrate BL may be an inorganic layer, an organic layer, or a composite material layer. In one or more embodiments, the base substrate BL may be omitted.

The display apparatus DD according to one or more embodiments may further include a filling layer. The filling layer may be between a display device layer DP-ED and the base substrate BL. The filling layer may be an organic material layer. The filling layer may include at least one selected from an acrylic-based resin, a silicone-based resin, and an epoxy-based resin.

The display panel DP may include a base layer BS, a circuit layer DP-CL provided on the base layer BS, and the display device layer DP-ED. The display device layer DP-ED may include a pixel defining film PDL, the light emitting devices ED-1, ED-2, and ED-3 between portions of the pixel defining film PDL, and an encapsulation layer TFE on the light emitting devices ED-1, ED-2, and ED-3.

The display device layer DP-ED may be on a base surface of the base layer BS. The base layer BS may be a glass substrate, a metal substrate, a plastic substrate, etc. However, embodiments are not limited thereto, and the base layer BS may be an inorganic layer, an organic layer, or a composite material layer.

In one or more embodiments, the circuit layer DP-CL is on the base layer BS, and the circuit layer DP-CL may include a plurality of transistors. Each of the transistors may include a control electrode, an input electrode, and an output electrode. For example, the circuit layer DP-CL may include a switching transistor and a driving transistor for driving the light emitting devices ED-1, ED-2, and ED-3 of the display device layer DP-ED.

Each of the light emitting devices ED-1, ED-2, and ED-3 may have a structure of each light emitting device ED of embodiments according to FIGS. 3 to 6, which will be further described herein below. Each of the light emitting devices ED-1, ED-2, and ED-3 may include a first electrode EL1, a hole transport region HTR, emission layers EML-R, EML-G, and EML-B, an electron transport region ETR, and a second electrode EL2.

FIG. 2 illustrates one or more embodiments in which the emission layers EML-R, EML-G, and EML-B of the light emitting devices ED-1, ED-2, and ED-3 are in openings OH defined in the pixel defining film PDL, and the hole transport region HTR, the electron transport region ETR, and the second electrode EL2 are provided as a common layer in the entire light emitting devices ED-1, ED-2, and ED-3. However, embodiments of the present disclosure are not limited thereto, and unlike the configuration illustrated in FIG. 2, the hole transport region HTR and the electron transport region ETR in one or more embodiments may be provided by being patterned inside the openings OH defined in the pixel defining film PDL. For example, the hole transport region HTR, the emission layers EML-R, EML-G, and EML-B, and the electron transport region ETR of the light emitting devices ED-1, ED-2, and ED-3 in one or more embodiments may be provided by being patterned utilizing an inkjet printing method.

The encapsulation layer TFE may cover the light emitting devices ED-1, ED-2 and ED-3. The encapsulation layer TFE may seal the display device layer DP-ED. The encapsulation layer TFE may be a thin film encapsulation layer. The encapsulation layer TFE may be formed by laminating one layer or a plurality of layers. The encapsulation layer TFE includes at least one insulation layer. The encapsulation layer TFE according to one or more embodiments may include at least one inorganic film (hereinafter, an encapsulation-inorganic film). The encapsulation layer TFE according to one or more embodiments may also include at least one organic film (hereinafter, an encapsulation-organic film) and at least one encapsulation-inorganic film.

The encapsulation-inorganic film protects the display device layer DP-ED from moisture/oxygen, and the encapsulation-organic film protects the display device layer DP-ED from foreign substances such as dust particles. Tre encapsulation-inorganic film may include silicon nitride, silicon oxynitride, silicon oxide, titanium oxide, aluminum oxide, and/or the like, but embodiments of the present disclosure are not particularly limited thereto. The encapsulation-organic film may include an acrylic-based compound, an epoxy-based compound, and/or the like. The encapsulation-organic film may include a photopolymerizable organic material, but embodiments of the present disclosure are not particularly limited thereto.

The encapsulation layer TFE may be on the second electrode EL2 and may fill the opening OH.

Referring to FIGS. 1 and 2, the display apparatus DD may include a non-light emitting region NPXA and light emitting regions PXA-R, PXA-G and PXA-B. The light emitting regions PXA-R, PXA-G, and PXA-B may be regions in which light generated by the respective light emitting devices ED-1, ED-2, and ED-3 is emitted. The light emitting regions PXA-R, PXA-G, and PXA-B may be spaced apart from each other on a plane.

Each of the light emitting regions PXA-R, PXA-G, and PXA-B may be a region divided by the pixel defining film PDL. The non-light emitting areas NPXA may be areas between the adjacent light emitting areas PXA-R, PXA-G, and PXA-B, which correspond to the pixel defining film PDL. In the specification, the light emitting regions PXA-R, PXA-G, and PXA-B may respectively correspond to pixels. The pixel defining film PDL may divide the light emitting devices ED-1, ED-2, and ED-3. The emission layers EML-R, EML-G, and EML-B of the light emitting devices ED-1, ED-2, and ED-3 may be in openings OH defined in the pixel defining film PDL and separated from each other.

The light emitting regions PXA-R, PXA-G, and PXA-B may be divided into a plurality of groups according to the color of light generated from the light emitting devices ED-1, ED-2, and ED-3. In the display apparatus DD of one or more embodiments illustrated in FIGS. 1 and 2, three light emitting regions PXA-R, PXA-G, and PXA-B, which emit red light, green light, and blue light, respectively, are illustrated as examples. For example, the display apparatus DD of one or more embodiments may include the red light emitting region PXA-R, the green light emitting region PXA-G, and the blue light emitting region PXA-B that are separated from each other.

In the display apparatus DD according to one or more embodiments, the plurality of light emitting devices ED-1, ED-2 and ED-3 may emit light beams having wavelengths different from each other. For example, in one or ore embodiments, the display apparatus DD may include a first light emitting device ED-1 that emits red light, a second light emitting device ED-2 that emits green light, and a third light emitting device ED-3 that emits blue light. In one or more embodiments, the red light emitting region PXA-R, the green light emitting region PXA-G, and the blue light emitting region PXA-B of the display apparatus DD may correspond to the first light emitting device ED-1, the second light emitting device ED-2, and the third light emitting device ED-3, respectively.

However, embodiments of the present disclosure are not limited thereto, and the first to third light emitting devices ED-1, ED-2, and ED-3 may emit light beams in the same wavelength range or at least one light emitting device may emit a light beam in a wavelength range different from the others. For example, the first to third light emitting devices ED-1, ED-2, and ED-3 may all emit blue light.

The light emitting regions PXA-R, PXA-G, and PXA-B in the display apparatus DD according to one or more embodiments may be arranged in a stripe form. Referring to FIG. 1, the plurality of red light emitting regions PXA-R, the plurality of green light emitting regions PXA-G, and the plurality of blue light emitting regions PXA-B each may be arranged along a second directional axis DR2. In addition, the red light emitting region PXA-R, the green light emitting region PXA-G, and the blue light emitting region PXA-B may be alternately arranged in this order along a first directional axis DR1.

FIGS. 1 and 2 illustrate that all the light emitting regions PXA-R, PXA-G, and PXA-B have similar area, but embodiments of the present disclosure are not limited thereto. Thus, the light emitting regions PXA-R, PXA-G, and PXA-B may have different areas from each other according to the wavelength range of the emitted light. In this case, the areas of the light emitting regions PXA-R, PXA-G, and PXA-B may mean areas when viewed on a plane defined by the first directional axis DR1 and the second directional axis DR2.

In one or more embodiments, an arrangement form of the light emitting regions PXA-R, PXA-G, and PXA-B is not limited to the configuration illustrated in FIG. 1, and the order in which the red light emitting region PXA-R, the green light emitting region PXA-G, and the blue light emitting region PXA-B are arranged may be provided in various suitable combinations according to the characteristics of display quality required in the display apparatus DD. For example, the arrangement form of the light emitting regions PXA-R, PXA-G, and PXA-B may be a pentile (PENTILE®) arrangement form (e.g., an RGBG matrix, RGBG structure, or RGBG matrix structure) or a diamond (Diamond Pixel™) arrangement form. PENTILE® is a duly registered trademark of Samsung Display Co., Ltd.

In addition, the areas of the light emitting regions PXA-R, PXA-G, and PXA-B may be different from each other. For example, in one or more embodiments, the area of the green light emitting region PXA-G may be smaller than that of the blue light emitting region PXA-B, but embodiments of the present disclosure are not limited thereto.

Hereinafter, FIGS. 3 to 6 are cross-sectional views schematically illustrating light emitting devices according to embodiments. Each of the light emitting devices ED according to embodiments may include a first electrode EL1, a hole transport region HTR, an emission layer EML, an electron transport region ETR, and a second electrode EL2 that are sequentially stacked.

Compared with FIG. 3, FIG. 4 illustrates a cross-sectional view of a light emitting device ED of one or more embodiments, in which a hole transport region HTR includes a hole injection layer HIL and a hole transport layer HTL, and an electron transport region ETR includes an electron injection layer EIL and an electron transport layer ETL. In addition, compared with FIG. 3, FIG. 5 illustrates a cross-sectional view of a light emitting device ED of one or more embodiments, in which a hole transport region HTR includes a hole injection layer HIL, a hole transport layer HTL, and an electron blocking layer EBL, and an electron transport region E R includes an electron injection layer EIL, an electron transport layer ETL, and a hole blocking layer HBL. Compared with FIG. 4, FIG. 6 illustrates a cross-sectional view of a light emitting device ED of one or more embodiments including a capping layer CPL on a second electrode EL2.

The first electrode EL1 has conductivity (e.g., electrical conductivity). The first electrode EL1 may be formed of a metal material, a metal alloy, and/or a conductive compound (e.g., an electrically conductive compound). The first electrode EL1 may be an anode or a cathode. However, embodiments of the present disclosure are not limited thereto. In addition, the first electrode EL1 may be a pixel electrode. The first electrode EL1 may be a transmissive electrode, a transflective electrode, or a reflective electrode. The first electrode EL1 may include at least one selected from among Ag, Mg, Cu, Al, Pt, Pd, Au, Ni, Nd, Ir, Cr, Li, Ca, LiF, Mo, Ti, W, In, Sn, and Zn, a compound of two or more selected from among these, a mixture of two or more selected from among these, or an oxide thereof.

If the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca (a stacked structure of LiF and Ca), LiF/Al (a stacked structure of LiF and Al), Mo, Ti, W, a compound or mixture thereof (e.g., a mixture of Ag and Mg). In one or more embodiments, the first electrode EL1 may have a multilayer structure including a reflective film or a transflective film formed of the above-described materials, and a transparent conductive film formed of ITO, IZO, ZnO, ITZO, etc. For example, the first electrode EL1 may have a three-layer structure of ITO/Ag/ITO, but embodiments of the present disclosure are not limited thereto. In addition, embodiments of the present disclosure are not limited thereto, and the first electrode EL1 may include the above-described metal materials, combinations of at least two metal materials of the above-described metal materials, oxides of the above-described metal materials, and/or the like. The thickness of the first electrode EL1 may be from about 700 Å to about 10,000 Å. For example, the thickness of the first electrode EL1 may be from about 1,000 Å to about 3,000 Å.

The hole transport region HTR is provided on the first electrode EL1. The hole transport region HTR may include at least one selected from a hole injection layer HIL, a hole transport layer HTL, a buffer layer or an emission-auxiliary layer, and an electron blocking layer EBL. The thickness of the hole transport region HTR may be, for example, from about 50 Å to about 15,000 Å.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of the hole injection layer HIL or the hole transport layer HTL, or may have a single layer structure formed of a hole injection material and a hole transport material. In addition, the hole transport region HTR may have a single layer structure formed of a plurality of different materials, or a structure in which a hole injection layer HIL/hole transport layer HTL, a hole injection layer HIL/hole transport layer HTL/buffer layer, a hole injection layer HIL/buffer layer, a hole transport layer HTL/buffer layer, or a hole injection layer HIL/hole transport layer HTL/electron blocking layer EBL are stacked in order from the first electrode EL1, but embodiments of the present disclosure are not limited thereto.

The hole transport region HTR may be formed using various suitable methods such as, for example, a vacuum deposition method, a spin coating method, a cast method, a Langmuir-Blodgett (LB) method, an inkjet printing method, a laser printing method, and/or a laser induced thermal imaging (LITI) method.

The hole transport region HTR may include a compound represented by Formula H-2 below:

Formula H-2

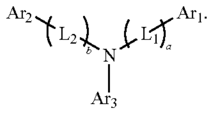

In Formula H-2 above, $L_1$ and $L_2$ may be each independently a direct linkage, a substituted or unsubstituted arylene group having 6 to 30 ring-forming carbon atoms, or a substituted or unsubstituted heteroarylene group having 2 to 30 ring-forming carbon atoms. A and b may be each independently an integer of 0 to 10. In one or more embodiments, when a or b is an integer of 2 or greater, a plurality of $L_1$'s and $L_2$'s may be each independently a substituted or unsubstituted arylene group having 6 to 30 ring-forming carbon atoms, or a substituted or unsubstituted heteroarylene group having 2 to 30 ring-forming carbon atoms.

In Formula H-2, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. In addition, in Formula H-2, $Ar_3$ may be a substituted or unsubstituted aryl group having 6 to 30 ring-forming carbon atoms, or a substituted or unsubstituted heteroaryl group having 2 to 30 ring-forming carbon atoms.

The compound represented by Formula H-2 above m y be a monoamine compound. In one or more embodiments, the compound represented by Formula H-2 above may be a diamine compound in which at least one selected from among $Ar_1$ to $Ar_3$ includes the amine group as a substituent. In addition, the compound represented by Formula H-2 above may be a carbazole-based compound including a substituted or unsubstituted carbazole group in at least one selected from $Ar_1$ and $Ar_2$, or a fluorene-based compound including a substituted or unsubstituted fluorene group in at least one selected from $Ar_1$ and $Ar_2$.

The compound represented by Formula H-2 may be represented by any one selected from among the compounds in Compound Group H below. However, the compounds listed in Compound Group H below are examples, and the compounds represented by Formula H-2 are not limited to those represented by Compound Group H below:

Compound Group H

H-1-1

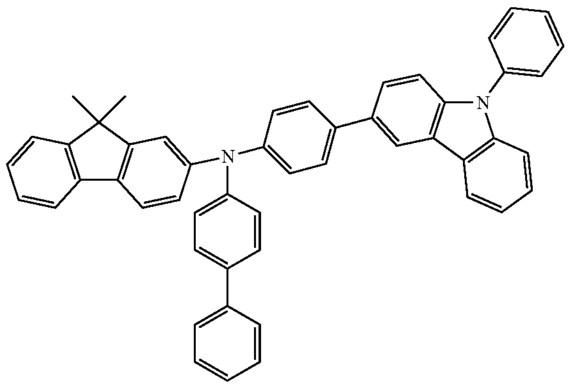

-continued

H-1-2

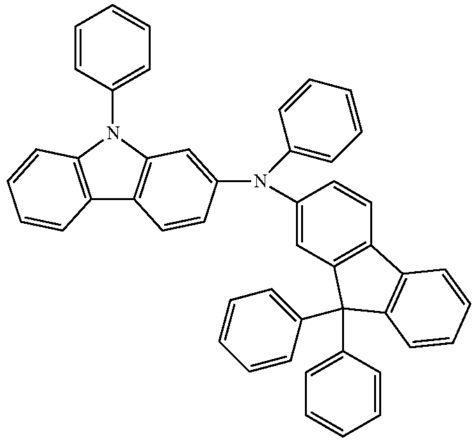

H-1-3

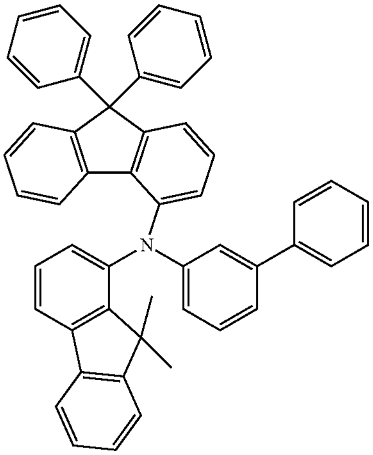

H-1-4

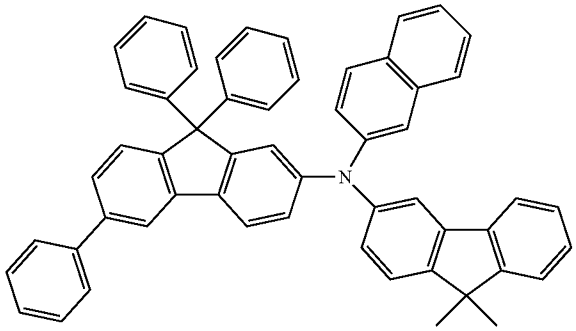

H-1-5

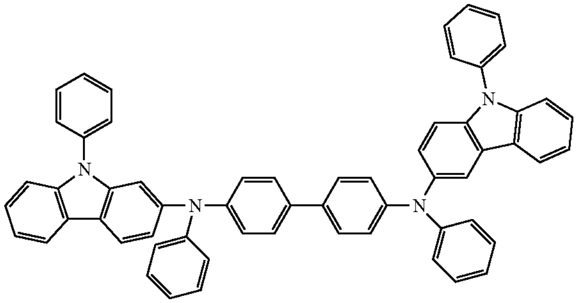

-continued
H-1-6
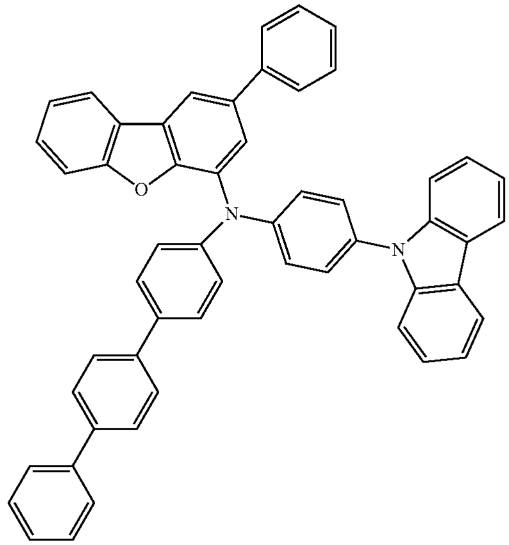
H-1-7
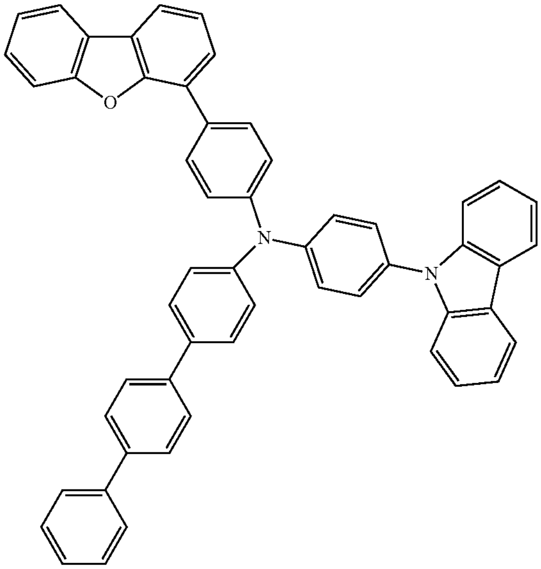
H-1-8
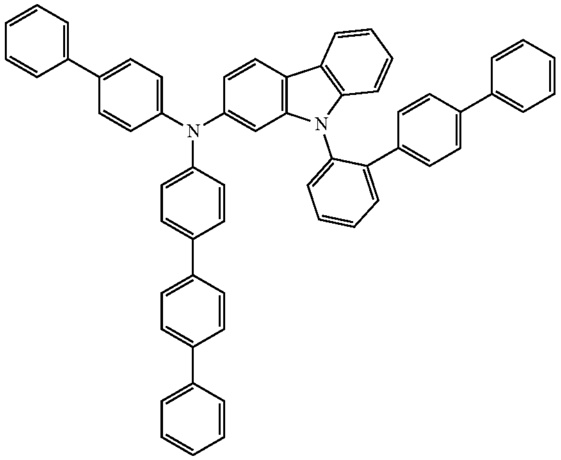
-continued
H-1-9
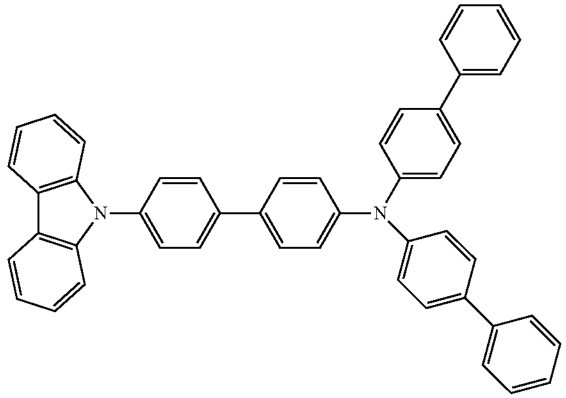
H-1-10
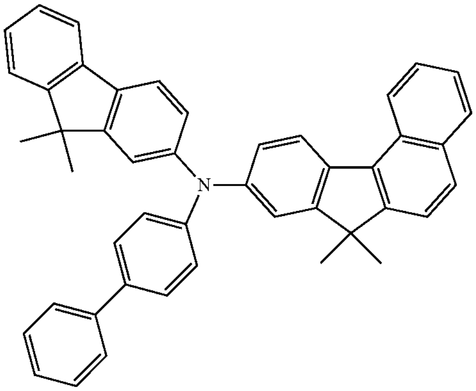
H-1-11
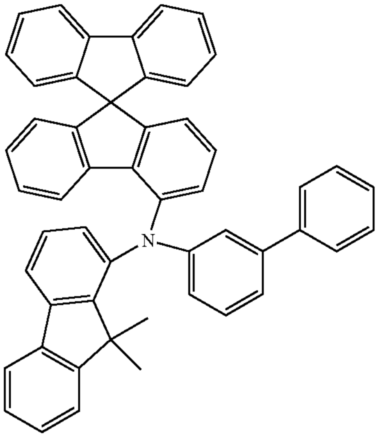

-continued
H-1-12
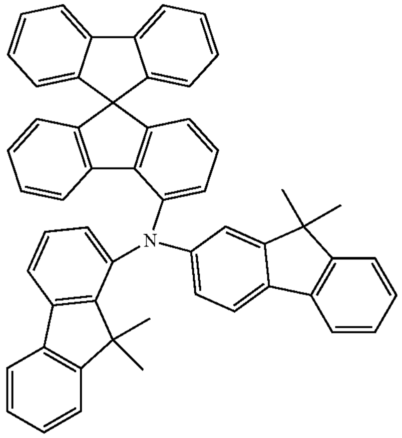
H-1-13
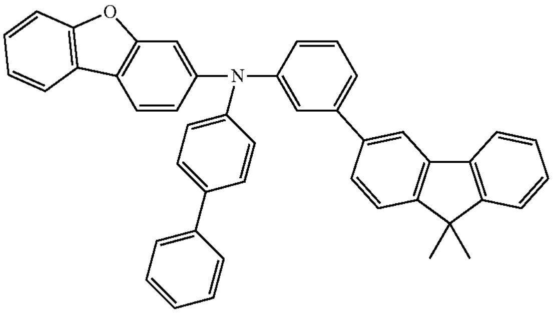
H-1-14
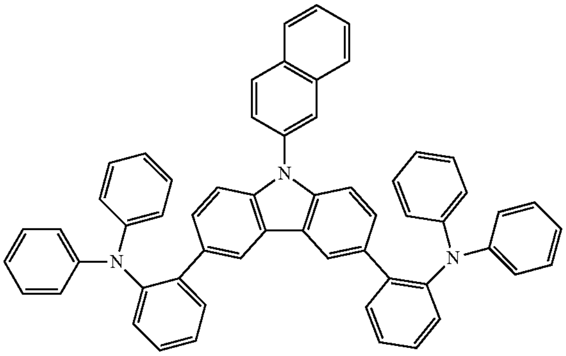
H-1-15
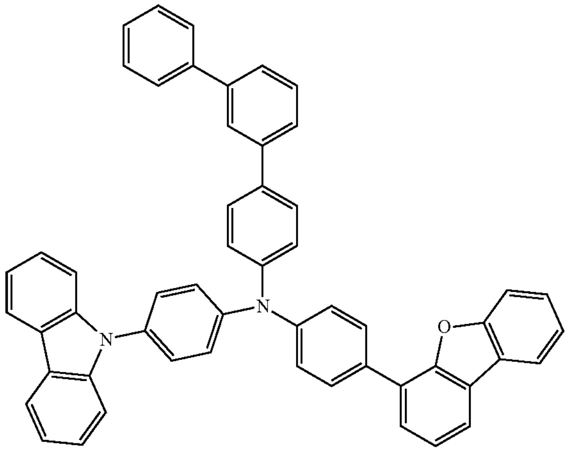
-continued
H-1-16
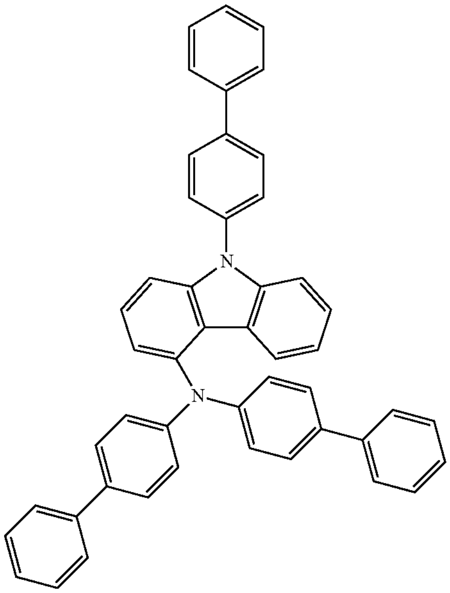
H-1-17
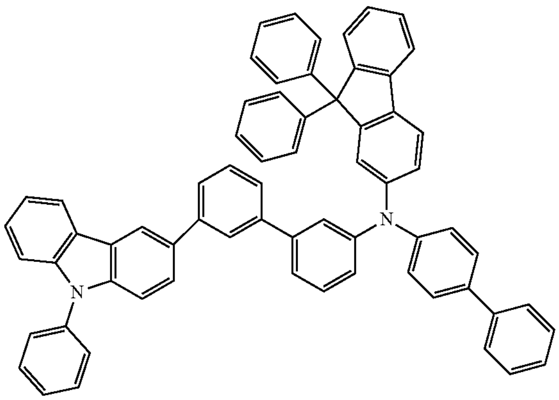
H-1-18
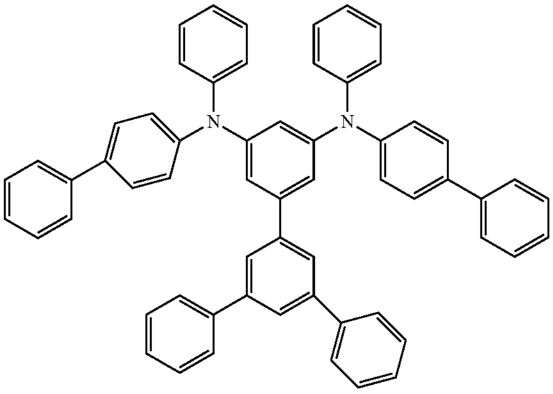

-continued

H-1-19

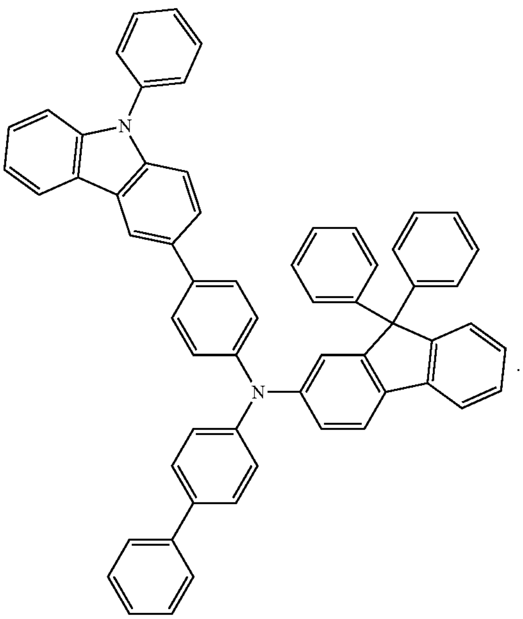

.

The hole transport region HTR may include a phthalocyanine compound such as copper phthalocyanine; $N^1$,$N^{1'}$-([1,1'-biphenyl]-4,4'-diyl)bis($N^1$-phenyl-$N^4$,$N^4$-di-m-tolyl-benzene-1,4-diamine) (DNTPD), 4,4',4"-[tris(3-methylphenyl)phenylamino]triphenylamine (m-MTDATA), 4,4',4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], dipyrazino[2,3-f: 2',3'-h]quinoxaline-2,3,6,7,10,11-hexacarbonitrile (HATCN), etc.

The hole transport region HTR may include a carbazole-based derivative such as N-phenyl carbazole and/or polyvinyl carbazole, a fluorene-based derivative, a triphenylamine-based derivative such as N,N'-bis(3-methylphenyl)-N,N'-diphenyl-[1,1-biphenyl]-4,4'-diamine (TPD) and/or 4,4',4"-tris(N-carbazolyl)trip enylamine (TCTA), N,N'-di (naphthalene-1-yl)-N,N'-diphenyl-benzidine (NPB), 4,4'-cyclohexylidene bis[N,N-bis(4-methylphenyl] benzenamine](TAPC), 4,4'-bis[N,N'-(3-tolyl)amino]-3,3'-dimethylbiphenyl (HMTPD), 1,3-bis(N-carbazolyl)benzene (mCP), etc.

In addition, the hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the above-described compounds of the hole transport region in at least one selected from a hole injection layer HIL, a hole transport layer HTL, selected from an electron blocking layer EBL.

The thickness of the hole transport region HTR may be from about 100 Å to about 10,000 Å, for example, from about 100 Å to about 5,000 Å. When the hole transport region HTR includes the hole injection layer HIL, the hole injection layer HIL may have, for example, a thickness of about 30 Å to about 1,000 Å. When the hole transport region HTR includes the hole transport layer HTL, the hole transport layer HTL may have a thickness of about 250 Å to about 1,000 Å. For example, when the hole transport region HTR includes the electron blocking layer EBL, the electron blocking layer EBL may have a thickness of about 10 Å to about 1,000 Å. If the thicknesses of the hole transport region HTR, the hole injection layer HIL, the hole transport layer HTL and the electron blocking layer EBL satisfy the above-described ranges, suitable or satisfactory hole transport properties may be achieved without a substantial increase in driving voltage.

The hole transport region HTR may further include a charge generating material to increase conductivity (e.g., electrical conductivity) in addition to the above-described materials. The charge generating material may be dispersed uniformly or non-uniformly in the hole transport region HTR. The charge generating material may be, for example, a p-dopant. The p-dopant may include at leas one selected from a halogenated metal compound, a quinone derivative, a metal oxide, and a cyano group-containing compound, but embodiments of the present disclosure are not limited thereto. For example, the p-dopant may include a metal halide compound such as CuI and/or RbI, a quinone derivative such as tetracyanoquinodimethane (TCNQ) and/or 2,3,5,6-tetrafluoro-7,7'8,8-tetracyanoquinodimethane (F4-TCNQ), a metal oxide such as tungsten oxide and/or molybdenum oxide, a cyano group-containing compound such as dipyrazino[2,3-f: 2',3'-h]quinoxaline-2,3,6,7,10,11-hexacarbonitrile (HATCN) and/or 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc., but embodiments of the present disclosure are not limited thereto.

As described above, the hole transport region HTR may further include at least one selected from the buffer layer and the electron blocking layer EBL in addition to the hole injection layer HIL and the hole transport layer HTL. The buffer layer may compensate for a resonance distance according to the wavelength of light emitted from the emission layer EML and may thus increase light emission efficiency. A material that may be included in the hole transport region HTR may be used as a material to be included in the buffer layer. The electron blocking layer EBL is a layer that serves to prevent or reduce injection of electrons from the electron transport region ETR to the hole transport region HTR.

The emission layer EML is provided on the hole trans ort region HTR. The emission layer EML may have a thickness of, for example, about 100 Å to about 1,000 Å or about 100 Å to about 300 Å. The emission layer EML may have a single layer formed of a single material, a single layer formed of a plurality of different materials, or a multilayer structure having a plurality of layers formed of a plurality of different materials.

The emission layer EML in the light emitting device E according to one or more embodiments may include a fused polycyclic compound of one or more embodiments. In one or more embodiments, the emission layer EML may include the fused polycyclic compound of one or more embodiments as a dopant. The fused polycyclic compound of one or more embodiments may be a dopant material of the emission layer EML. In one or more embodiments, the fused polycyclic compound, which will be further described herein below, may be referred to as a first compound.

The fused polycyclic compound of one or more embodiments may include a structure in which a plurality of aromatic rings are fused via a boron atom and a nitrogen atom. For example, the fused polycyclic compound of one or more embodiments may include a structure in which first to third aromatic rings are fused via one boron atom, a first nitrogen atom, and a second nitrogen atom. The first to third aromatic rings each may be linked to the boron atom, the first aromatic ring and the third aromatic ring may be linked via the first nitrogen atom, and the second aromatic ring and the third aromatic ring may be linked via the second nitrogen atom. In the present specification, the boron atom and the first and second nitrogen atoms, and the first to third aromatic rings which are fused via the boron atom and the first and second nitrogen atoms may be referred to as "fused ring core."

The fused polycyclic compound of one or more embodiments includes a structure in which a first heterocycle is fused at the first aromatic ring. The first heterocycle may include a carbazole moiety and a biphenyl moiety. The first heterocycle may be fused at the meta-position and the para-position with the boron atom of the fused ring core. The carbazole moiety may be linked to the first aromatic ring at the para-position carbon with respect to the carbon atom linked to the boron atom, among carbon atoms constituting the first aromatic ring. The nitrogen atom of the carbazole moiety may be linked at the para-position with the boron atom. The biphenyl moiety may be linked to the first aromatic ring at the meta-position carbon with respect to the carbon atom, linked to the boron atom, among ca-bon atoms constituting the first aromatic ring. The biphenyl moiety may be linked to the nitrogen atom of the carbazole moiety at the ortho-position. The first heterocycle includes the above-described carbazole moiety and the biphenyl moiety, and thus may be a structure containing an azonine moiety represented by Formula S1 below:

Formula S1

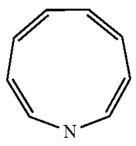

In addition, in the fused polycyclic compound of one or more embodiments, a second heterocycle having substantially the same structure as t e aforementioned first heterocycle may be further fused at the second aromatic ring. Thus, the fused polycyclic compound of one or more embodiments may have an increase in multiple resonance effects because the first heterocycle and/or the second heterocycle are linked to the fused ring core. Therefore, the fused polycyclic compound of one or more embodiments may achieve high efficiency and a long service life when applied to the light emitting device.

The fused polycyclic compound of one or more embodiments may be represented by Formula 1 below:

Formula 1

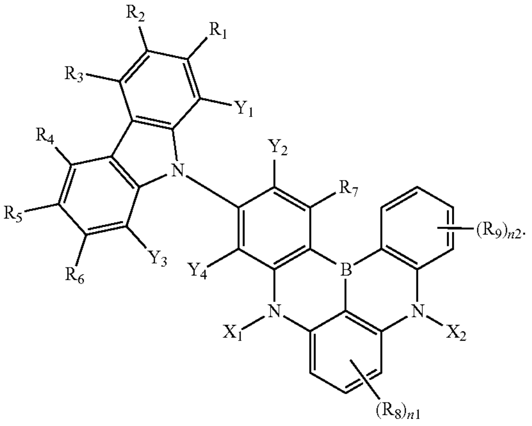

The fused polycyclic compound represented by Formula 1 of one or more embodiments may include a structure in which three aromatic rings are fused via one boron atom and two nitrogen atoms. In the present specification, the benzene ring, which is substituted with the substituent represented by $R_7$, may correspond to the aforementioned first aromatic ring, the benzene ring, which is substituted with a substituent represented by $R_9$, may correspond to the aforementioned second aromatic ring, and the benzene ring, which is substituted with a substituent represented by $R_8$, may correspond to the aforementioned third aromatic ring.

In Formula 1, $R_1$ to $R_9$ and $Y_1$ to $Y_4$ may be each independently a hydrogen atom, a deuterium atom, a halogen atom, a cyano group, a substituted or unsubstituted silyl group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms. For example, $R_1$ to $R_7$ may be each independently a hydrogen atom, a deuterium atom, a substituted or unsubstituted t-butyl group. For example, $R_8$ may be a substituted or unsubstituted t-butyl group, a substituted or unsubstituted aryl group having 6 to 30 ring-forming carbon atoms, or a substituted or unsubstituted heteroaryl group having 2 to 30 ring-forming carbon atoms.

In one or more embodiments, in Formula 1, $R_1$ to $R_9$ end $Y_1$ to $Y_4$ may each independently be bonded to an adjacent group to form a ring. The "adjacent group" may mean a substituent sterically adjacent to said substituent. For example, $R_1$ in Formula 1 may be a substituent adjacent to $R_2$, $Y_1$ may be a substituent adjacent to $Y_2$, and $Y_3$ may be a substituent adjacent to $Y_4$. For example, when n2 is an integer of 2 or greater, one $R_9$ among a plurality of $R_9$'s may be a substituted or unsubstituted carbazole group, another $R_9$ adjacent to the one $R_9$ among the plurality of $R_9$'s may be a substituted or unsubstituted biphenyl group, and the one $R_9$ and the another $R_9$ may be bonded to form a substituted or unsubstituted hydrocarbon ring.

$X_1$ and $X_2$ may be each independently a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms. For example, $X_1$ and $X_2$ may be each independently a substituted or unsubstituted aryl group having 6 to 30 ring-forming carbon atoms, or a substituted or unsubstituted carbazole group.

In Formula 1, n1 is an integer of 0 to 3, and n2 is an integer of 0 to 4. In Formula 2, if each of n1 and n2 is 0, the fused polycyclic compound of one or more embodiments may not be substituted with each of $R_8$ and $R_9$. In Formula 1, the case where each of n1 is 3, n2 is 4, and $R_8$'s and $R_9$'s are each hydrogen atoms may be the same as the case where each of n1 and n2 is 0 in Formula 1. When each of n1 and n2 is an integer of 2 or more, a plurality of $R_8$'s and $R_9$'s may each be the same or at least one selected from among the plurality of $R_8$'s and $R_9$'s may be different from the others.

In Formula 1, any one pair of $Y_1$ and $Y_2$ or $Y_3$ and $Y_4$ may be a position to which a substituent represented by Formula 2 below is linked. For example, $Y_1$ and $Y_2$ may correspond to a position at which the substituent represented by Formula 2 below is linked, and $Y_3$ and $Y_4$ may be each independently a hydrogen atom or a deuterium atom.

Formula 2

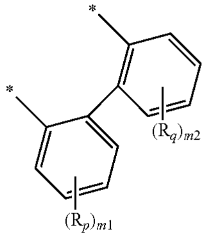

In Formula 2, -* is a position linked to any one pair of $Y_1$ and $Y_2$, or $Y_3$ and $Y_4$ linked to Formula 1. For example, -* may be a position linked to the fused ring core. Thus, at least one substituent represented by Formula 2 may be linked to the fused ring core, and thus an additional fused ring may be formed.

In Formula 2, $R_p$ and $R_q$ may be each independently a hydrogen atom, a deuterium atom, a halogen atom, a cyano group, a substituted or unsubstituted silyl group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms. For example, $R_p$ and $R_q$ may be each independently a hydrogen atom or a deuterium atom.

In Formula 2, m1 and m2 are each independently an integer of 0 to 4. In Formula 2, if each of m1 and m2 is 0, the fused polycyclic compound of one or more embodiments may not be substituted with each of $R_p$ and $R_q$. In Formula 1, the case where each of m1 and m2 is 4 and $R_p$'s and $R_q$'s are each hydrogen atoms may be the same as the case where each of m1 and m2 is 0 in Formula 1. When each of m1 and m2 is an integer of 2 or more, a plurality of $R_p$'s and $R_q$'s may each be the same or at least one selected from among the plurality of $R_p$'s and $R_q$'s may be different from the others.

In one or more embodiments, Formula 1 may correspond to the fused ring core, the first nitrogen atom, the second nitrogen atom, and the carbazole moiety of the first heterocycle as described above. In addition, Formula 2 may correspond to the biphenyl moiety of the first heterocycle as described above.

In one or more embodiments, the first compound represented by Formula 1 may be represented by Formula 1-1 below:

Formula 1-1

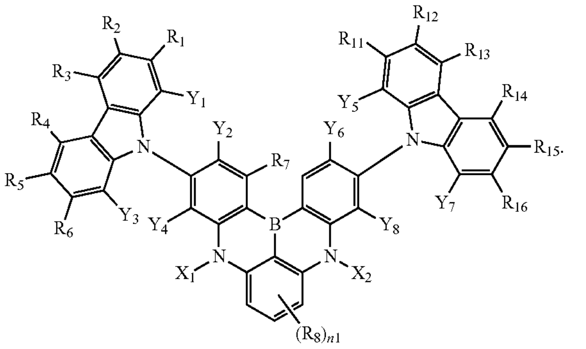

Formula 1-1 represents the case where the type (or kind) and number of $R_9$'s are specified in Formula 1. Formula 1-1 represents the case where substituted or unsubstituted carbazole groups are linked at the para-position carbon with the carbon atoms, linked to the boron atom of the fused ring core, in the second aromatic ring as well as in the first aromatic ring.

In Formula 1-1, $R_{11}$ to $R_{16}$ and $Y_5$ to $Y_8$ may be each independently a hydrogen atom, a deuterium atom, a halogen atom, a cyano group, a substituted or unsubstituted silyl group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms. In one or more embodiments, in Formula 1, $R_{11}$ to $R_{16}$ and $Y_5$ to $Y_8$ may each independently be bonded to an adjacent group to form a ring. For example, $R_{11}$ to $R_{16}$ may be each independently a hydrogen atom, a deuterium atom, a substituted or unsubstituted t-butyl group.

In Formula 1, any one pair of $Y_5$ and $Y_6$ or $Y_7$ and $Y_8$ may be a position linked to a substituent represented by Formula 2 above. For example, $Y_5$ and $Y_6$ may correspond to a position linked to the substituent represented by Formula 2 below, and $Y_7$ and $Y_8$ may be each independently a hydrogen atom or a deuterium atom.

In Formula 1-1, the same as described with respect to Formula 1 above may be applied to $R_1$ to $R_8$, $Y_1$ to $Y_4$, $X_1$, $X_2$, and n1.

In one or more embodiments, the first compound represented by Formula 1 may be represented by Formula 1-a or Formula 1-b below:

Formula 1-a

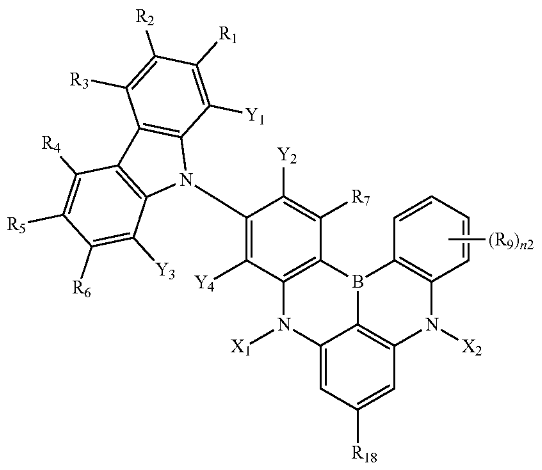

Formula 1-b

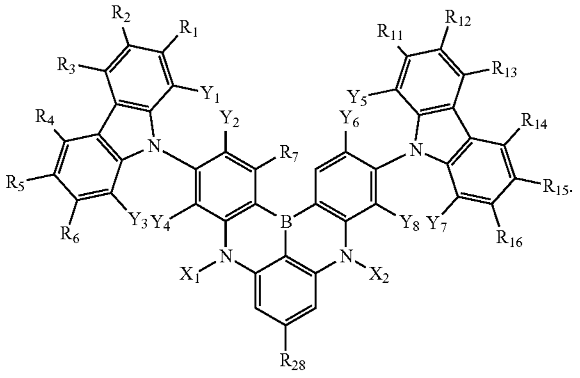

Formula 1-a and Formula 1-b represent the cases where the type (or kind) and number of $R_8$'s are specified in Formula 1 and Formula 1-1 respectively. Formula 1-a and Formula 1-b represent the cases where the substituent of the third aromatic ring is linked at the para-position with the carbon atom linked to the boron atom of the fused ring core.

In Formula 1-a and Formula 1-b, $R_{18}$ and $R_{28}$ may be each independently a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms. For example, $R_{18}$ and $R_{28}$ may be each independently a substituted or unsubstituted t-butyl group, a substituted or unsubstituted phenyl group, a substituted or unsubstituted carbazole group, or a substituted or unsubstituted dibenzofuran group.

In Formula 1-a and Formula 1-b, the same as described with respect to Formula 1 and Formula 1-1 above may be applied to $R_1$ to $R_{16}$, $Y_1$ to $Y_8$, $X_1$, $X_2$, and n2.

In one or more embodiments, the first compound represented by Formula 1 may be represented by Formula 1-2 below:

Formula 1-2

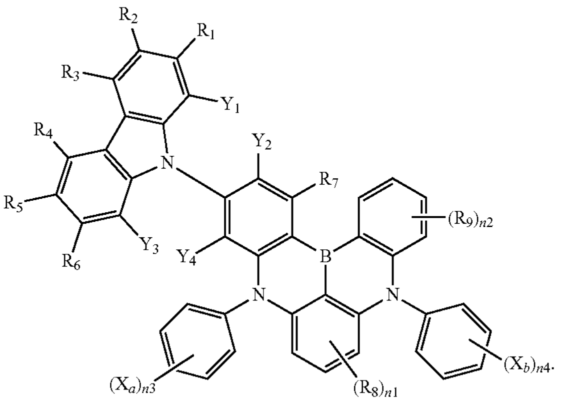

Formula 1-2 represents the case where each type (or kind) of $X_1$ and $X_2$ is specified in Formula 1. Formula 1-2 represents the case where the substituents linked to the first nitrogen atom and the second nitrogen atom of the fused ring core are substituted or unsubstituted phenyl groups.

In Formula 1-2, $X_a$ and $X_b$ are each independently a hydrogen atom, a deuterium atom, a cyano group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms. Alternatively, each of $X_a$ and $X_b$ may be bonded to an adjacent group to form a ring. For example, $X_a$ and $X_b$ may be each independently a substituted or unsubstituted t-butyl group, a substituted or unsubstituted aryl group having 6 to 30 ring-forming carbon atoms, or a substituted or unsubstituted heteroaryl group having 2 to 30 ring-forming carbon atoms.

In Formula 1-2, n3 and n4 are each independently an integer of 0 to 5. In Formula 1-2, if each of n3 and n4 is 0, the fused polycyclic compound of one or more embodiments may not be substituted with each of $X_a$ and $X_b$. In Formula 1-2, the case where n3 is 5, n4 is 5, and $X_a$'s and $X_b$'s are each hydrogen atoms may be the same as the case where each of n3 and n4 is 0 in Formula 1-2. When each of n3 and n4 is an integer of 2 or greater, a plurality of $X_a$'s and $X_b$'s may each be the same or at least one selected from among the plurality of $X_a$'s and $X_b$'s may be different from the others.

In Formula 1-2, the same as described with respect to Formula 1 above may be applied to $R_1$ to $R_9$ and $Y_1$ to $Y_4$, and n1 and n2.

In one or more embodiments, the first compound represented by Formula 1 may be represented by Formula 1-3 or Formula 1-4 below:

Formula 1-3

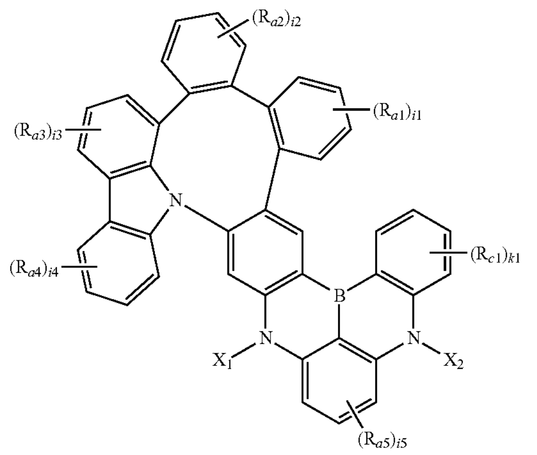

Formula 1-4

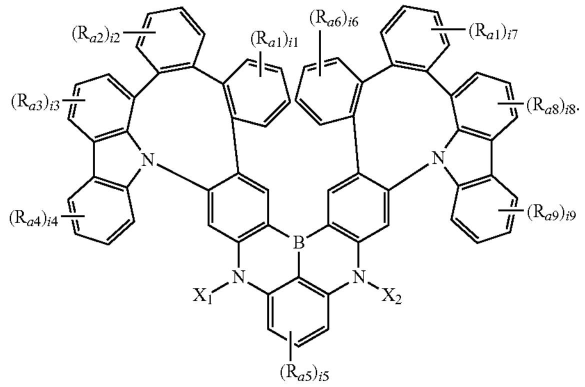

Formula 1-3 and Formula 1-4 represent the cases where Formula 2 is linked at a specific position to Formula 1 in Formula 1 and Formula 1-1, respectively. Formula 1-3 and Formula 1-4 represent the cases where substituted or unsubstituted biphenyl groups are linked at the meta-position carbon with the carbon atoms, linked to the boron atom of the fused ring core, in the first aromatic ring and/or the second aromatic ring, and the biphenyl group is linked to the carbazole group.

In Formula 1-3 and Formula 1-4, $R_{a1}$ to $R_{a9}$ are each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms. For example, $R_{a1}$ to $R_{a4}$ and $R_{a6}$ to $R_{a9}$ may be each independently a hydrogen atom or a deuterium atom. $R_{a5}$ may be a substituted or unsubstituted t-butyl group, a substituted or unsubstituted aryl group having 6 to 30 r ng-forming carbon atoms, or a substituted or unsubstituted heteroaryl group having 2 to 30 ring-forming carbon atoms.

In Formula 1-3, $R_{c1}$ is a hydrogen atom, a deuterium atom, a halogen atom, a cyano group, a substituted or unsubstituted silyl group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms. Alternatively, Rei may be bonded to an adjacent group to form a ring. For example, Rei may be a substituted or unsubstituted aryl group having 6 to 30 ring-forming carbon atoms, or a substitute or unsubstituted heteroaryl group having 2 to 30 ring-forming carbon atoms.

In Formula 1-3, i1, i2, i4 and k1 are each independently an integer of 0 to 4, and i3 and i5 are each independently an integer of 0 to 3. In Formula 1-3, if each of i1 to i5 and k1 is 0, the fused polycyclic compound of one or more embodiments may not be substituted with each of $R_{a1}$ to $R_{a5}$ and $R_{c1}$. In Formula 1-3, the case where each of i1, i2, i4, and k1 is 4, each of i3 and i5 is 3, each of $R_{a1}$ to $R_{a5}$, and $R_{c1}$ is a hydrogen atom may be the same as the case where each of i1 to i5 and k1 is 0 in Formula 1-4. In Formula 1-3, if each of i1 to i5 and k1 is an integer of 2 or greater, a plurality of $R_{a1}$'s to $R_{a5}$'s, and $R_{c1}$'s may each be the same or at least one selected from among the plurality of $R_{a1}$'s to $R_{a5}$'s, and $R_{c1}$'s may be different from the others.

In Formula 1-4, i1, i2, i4, i6, i7, i9, and k1 are each independently an integer of 0 to 4, and i3, i5, and i8 are each independently an integer of 0 to 3. In Formula 1-4, if each of i1 to i9 and k1 is 0, the fused polycyclic compound of one or more embodiments may not be substituted with each of $R_{a1}$ to $R_{a9}$ and $R_{c1}$. In Formula 1-4, the case where each of i1, i2, i4, i6, i7, i9, and k1 is 4, each of i3, i5, and i8 is 3, each of $R_{a1}$ to $R_{a9}$, and $R_{c1}$ is a hydrogen atom may be the same as the case where each of i1 to i5 and k1 is 0 in Formula 1-4. If each of i1 to i9 and k1 is an integer of 2 or greater, a plurality of $R_{a1}$'s to $R_{a9}$'s, and $R_{c1}$'s may each be the same or at least one selected from among the plurality of $R_{a1}$'s to $R_{a9}$'s, and $R_{c1}$'s may be different from the others.

In one or more embodiments, in Formula 1-3 and Formula 1-4, the same as described with respect to Formula 1 above may be applied to $X_1$ and $X_2$.

In one or more embodiments, the first compound represented by Formula 1 may be represented by Formula 1-5 or Formula 1-6 below:

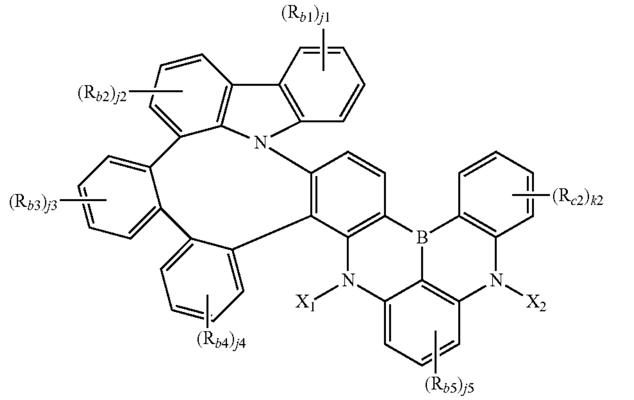

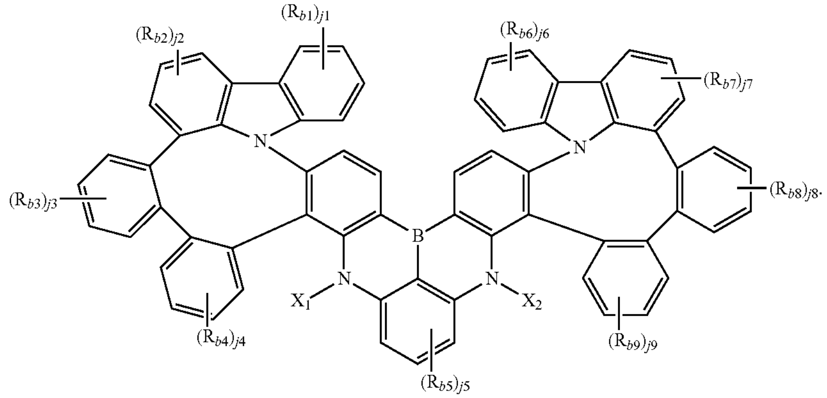

Formula 1-5 and Formula 1-6 represent the cases where Formula 2 is linked at a set or specific position to Formula 1 in Formula 1 and Formula 1-1, respectively. Formula 1-5 and Formula 1-6 represent the cases where substituted or unsubstituted biphenyl groups are linked at the meta-position carbon with the carbon atoms, linked to the boron atom of the fused ring core, in the first aromatic ring and/or the second aromatic ring, and the biphenyl group is linked to the carbazole group. In Formula 1-3 and Formula 1-4 as described above, the meta-position carbon position linked to the substituted or unsubstituted biphenyl group is the para position with the first nitrogen atom or the second nitrogen atom while in Formula 1-5 and Formula 1-6, the meta-position carbon position linked to the substituted or unsubstituted biphenyl group is the ortho position with the first nitrogen atom or the second nitrogen atom.

In Formula 1-5 and Formula 1-6, $R_{b1}$ to $R_{b9}$ are each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms. For example, $R_{b1}$ to $R_{b4}$ and $R_{b6}$ to $R_{b9}$ may be each independently a hydrogen atom or a deuterium atom. $R_{b5}$ may be a substituted or unsubstituted t-butyl group, a substituted or unsubstituted aryl group having 6 to 30 ring-forming carbon atoms, or a substituted or unsubstituted heteroaryl group having 2 to 30 ring-forming carbon atoms.

In Formula 1-5, $R_{c2}$ is a hydrogen atom, a deuterium atom, a halogen atom, a cyano group, a substituted or unsubstituted silyl group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms. Alternatively, $R_{c2}$ may be bonded to an adjacent group to form a ring. For example, $R_{c2}$ may be a substituted or unsubstituted aryl group having 6 to 30 ring-forming carbon atoms, or a substituted or unsubstituted heteroaryl group having 2 to 30 ring-forming carbon atoms.

In Formula 1-5, j1, j3, j4 and k2 are each independently an integer of 0 to 4, and j2 and j5 are each independently an integer of 0 to 3. In Formula 1-5, if each of j1 to j5 and k2 is 0, the fused polycyclic compound of one or more embodiments may not be substituted with each of $R_{b1}$ to $R_{b5}$ and $R_{c2}$. In Formula 1-5, the case where each of j1, j3, j4, and k2 is 4, each of j2 and j5 is 3, each of $R_{b1}$ to $R_{b5}$ and $R_{c2}$ is a hydrogen atom may be the same as the case where each of j1 to j5 and k2 is 0 in Formula 1-5. If each of j1 to j5 and k2 is an integer of 2 or greater, a plurality of $R_{b1}$'s to $R_{b5}$'s, and $R_{c2}$'s may each be the same or at least one selected from among the plurality of $R_{b1}$'s to $R_{b5}$'s, and $R_{c2}$'s may be different from the others.

In Formula 1-6, j1, j3, j4, j6, j7, j9, and k1 are each independently an integer of 0 to 4, and j2, j5, and j8 are each independently an integer of 0 to 3. In Formula 1-6, if each of j1 to j9 and k2 is 0, the fused polycyclic compound of one or more embodiments may not be substituted with each of $R_{b1}$ to $R_{b9}$ and $R_{c2}$. In Formula 1-6, the case where each of i1, i2, j1, j3, j4, j6, j7, i9, and k1 is 4, each of j2, j5, and j8 is 3, each of $R_{b1}$ to $R_{b9}$, and $R_{c2}$ is a hydrogen atom may be the same as the case where each of i1 to i9 and k2 is 0 in Formula 1-6. If each of j1 to j9 and k2 is an integer of 2 or greater, a plurality of $R_{b1}$'s to $R_{b9}$'s, and $R_{c2}$'s may each be the same or at least one selected from among the plurality of $R_{b1}$'s to $R_{b9}$'s, and $R_{c2}$'s m y be different from the others.

In Formula 1-5 and Formula 1-6, the same as described with respect to Formula 1 above may be applied to $X_1$ and $X_2$.

The fused polycyclic compound of one or more embodiments may be represented by one selected from among the compounds in Compound Group 1 below. The light emitting device ED of one or more embodiments may include at least one fused polycyclic compound among the compounds represented by Compound Group 1 in the emission layer EML.

Compound Group 1

1

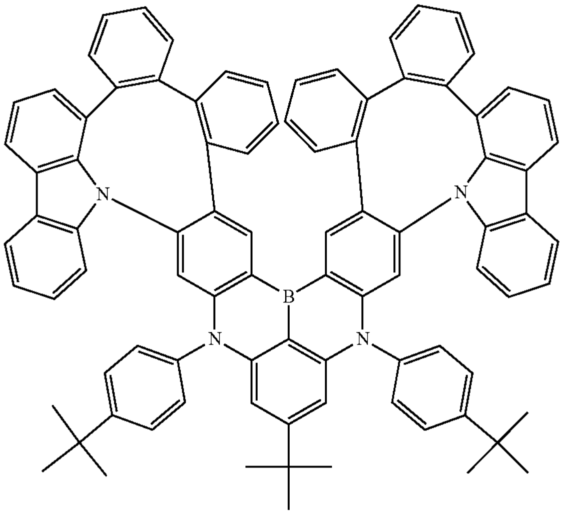

2

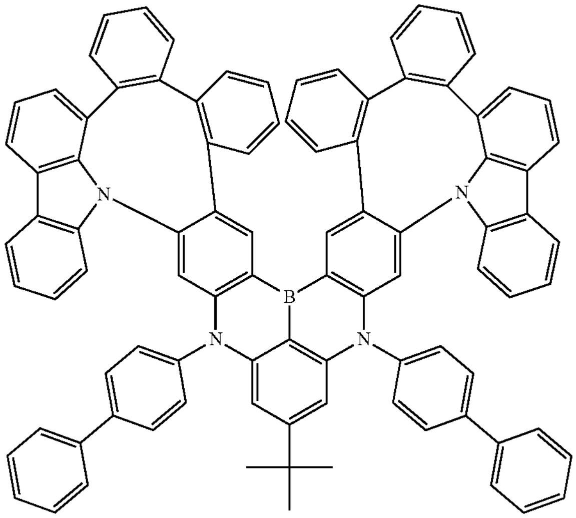

3

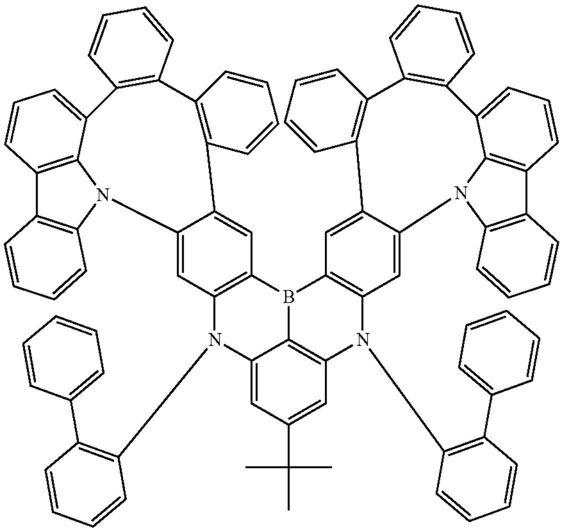

4

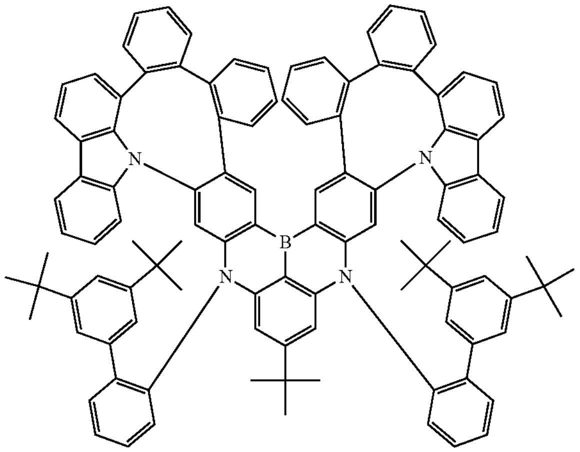

-continued
5
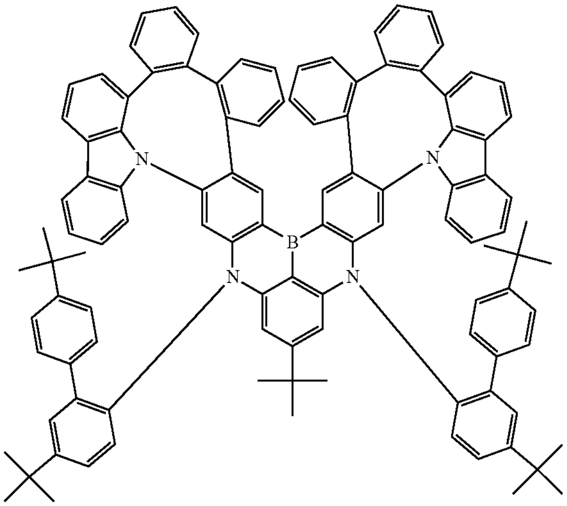
6
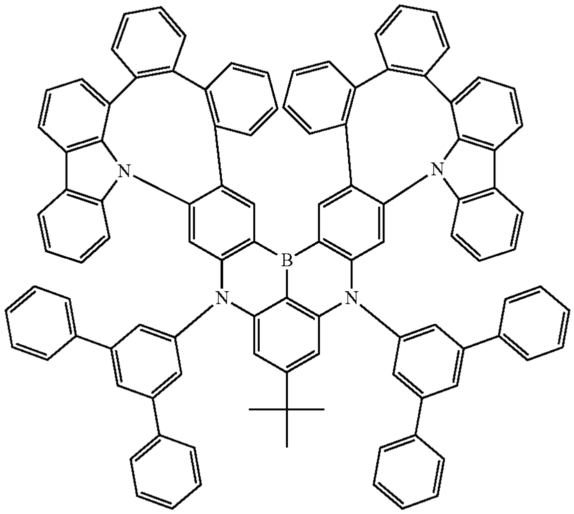
7
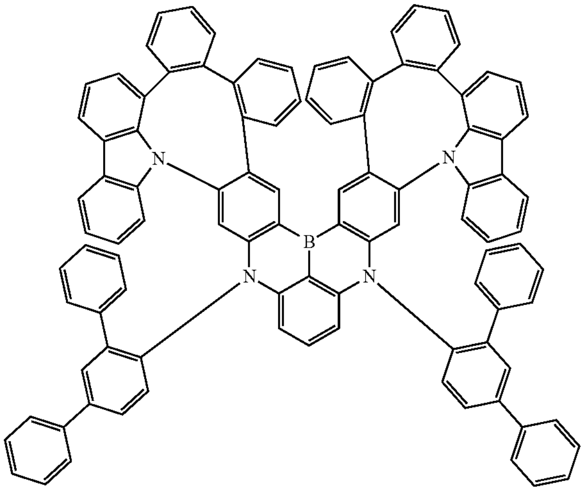
8
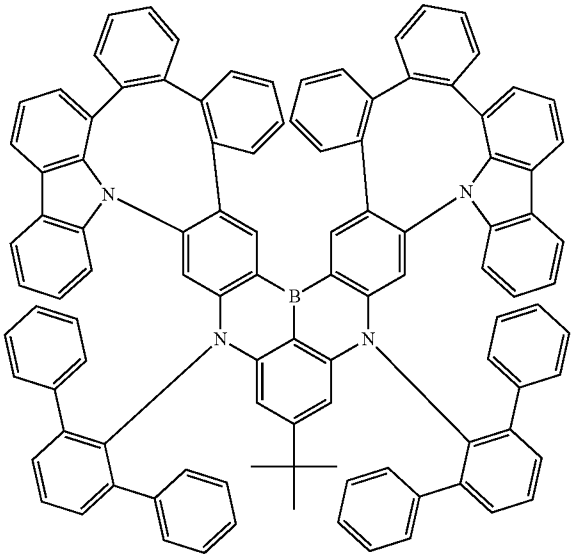
9
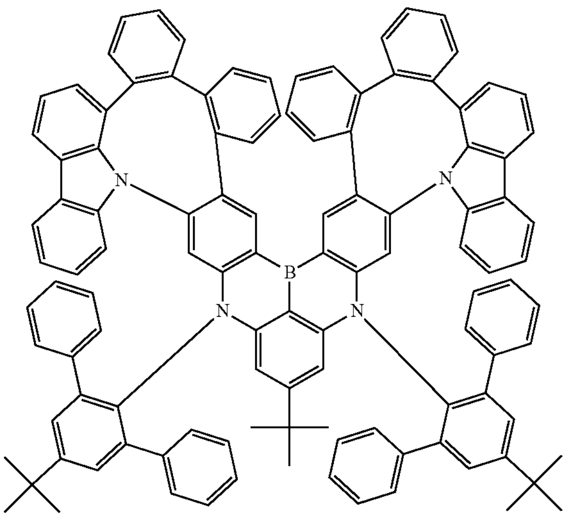

-continued
10
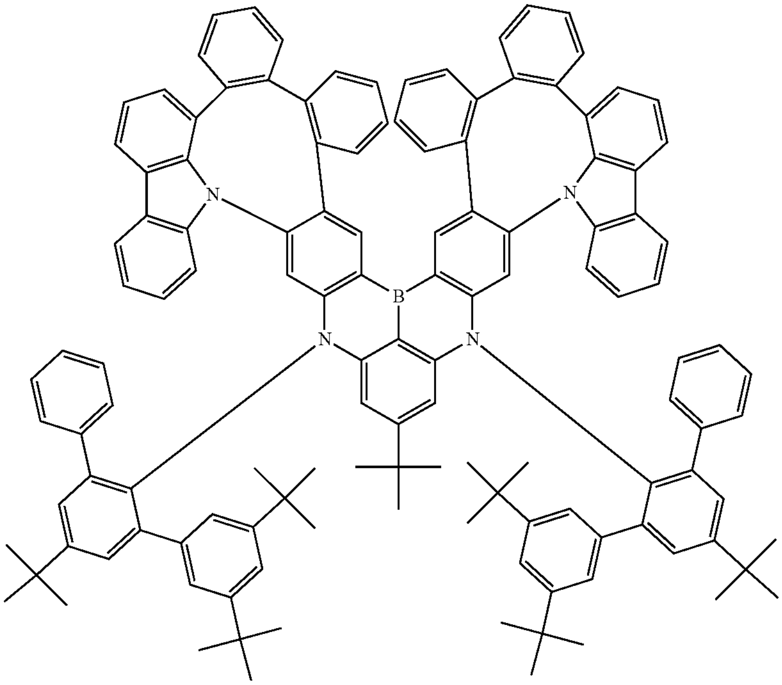
11
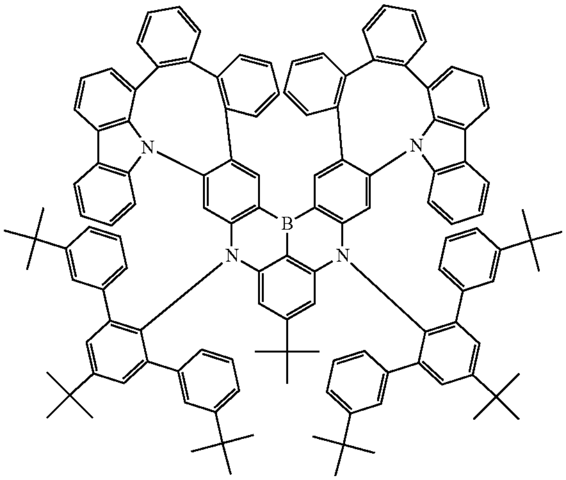
12
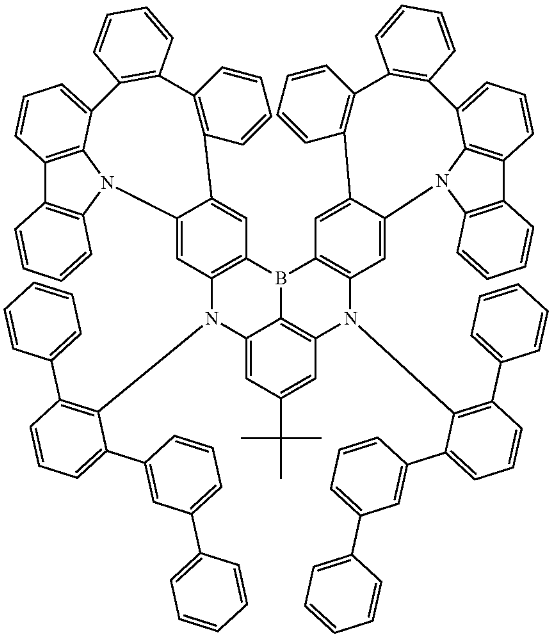

-continued
13
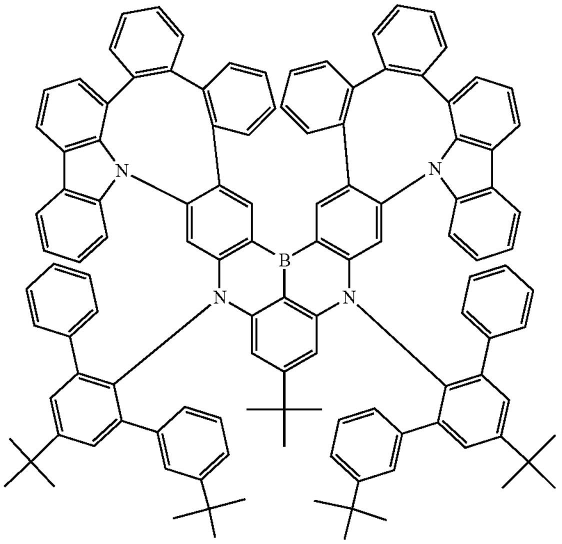
14
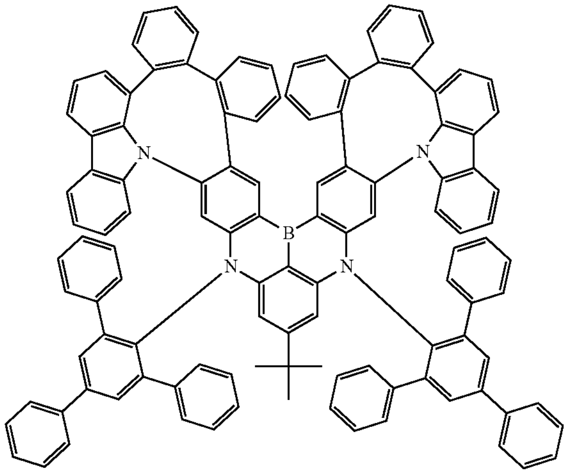
15
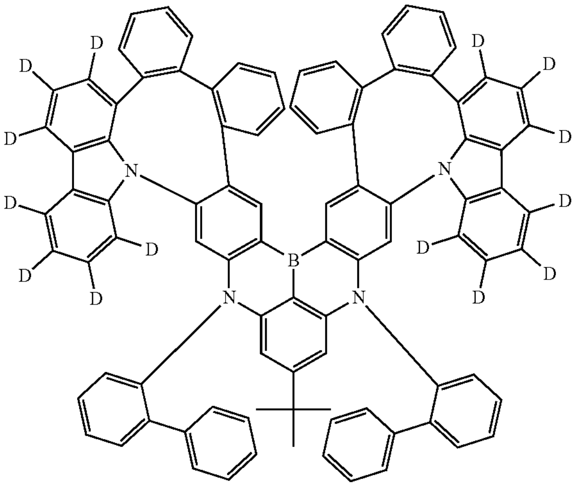
16
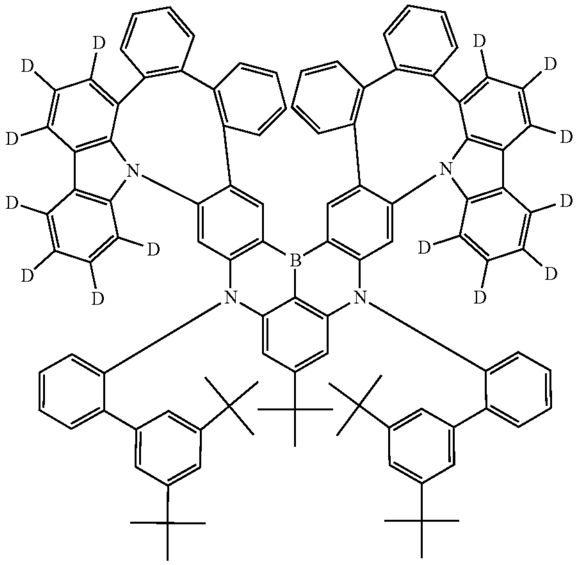

-continued
17
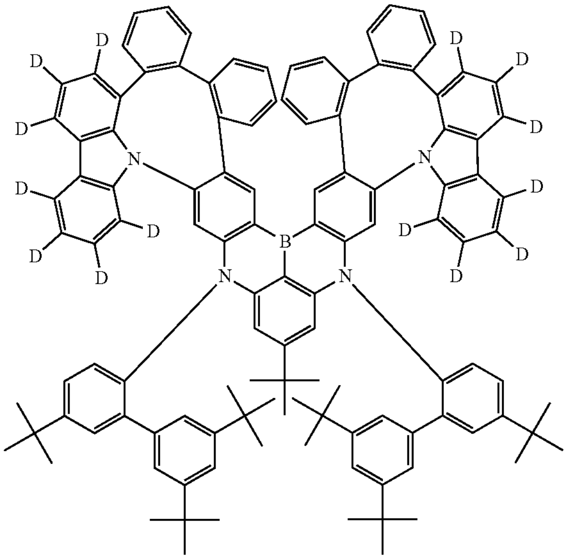
18
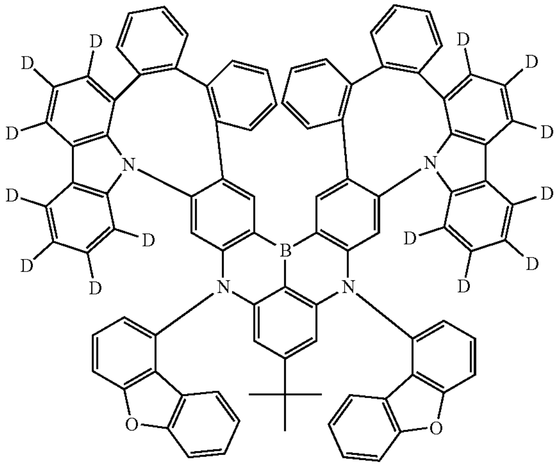
19
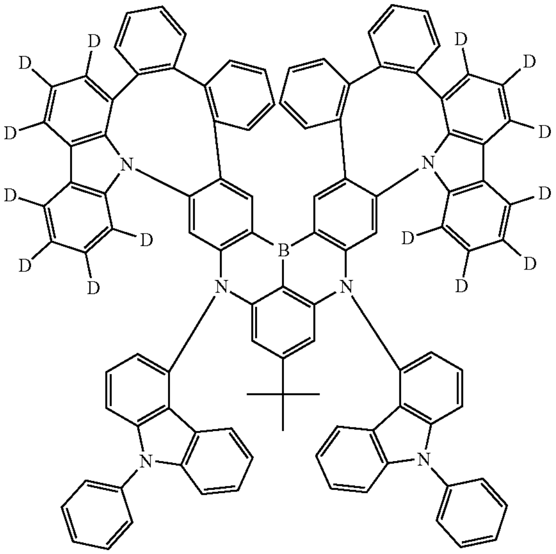
20
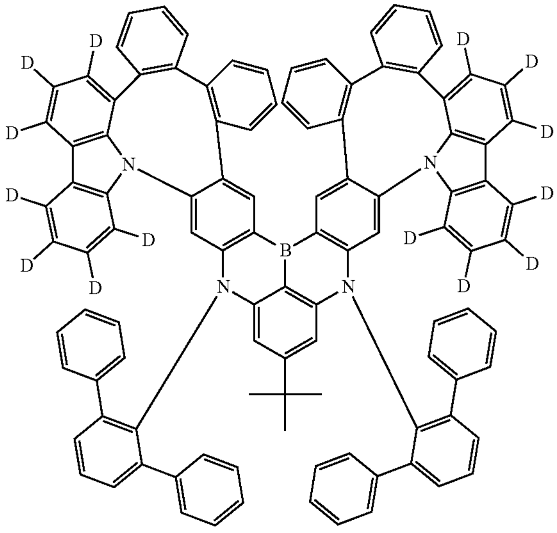

-continued
21
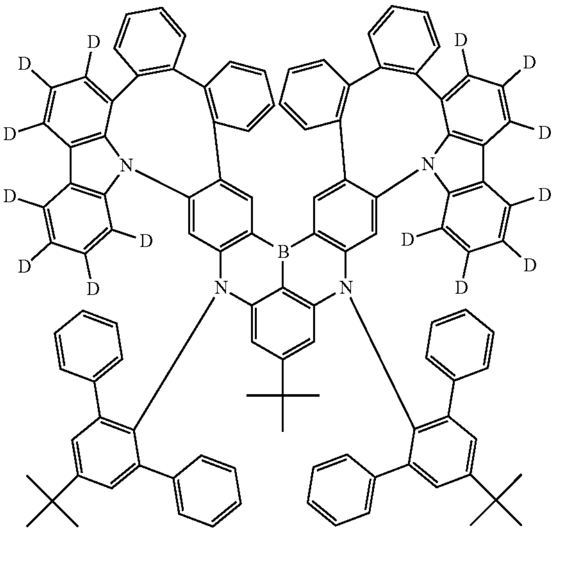
22
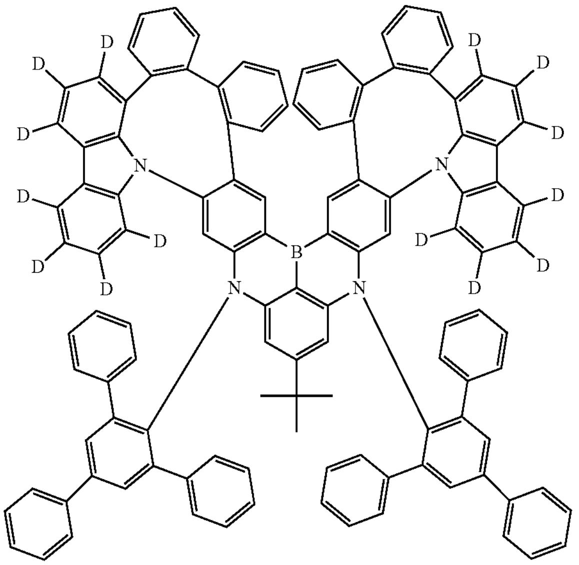
23
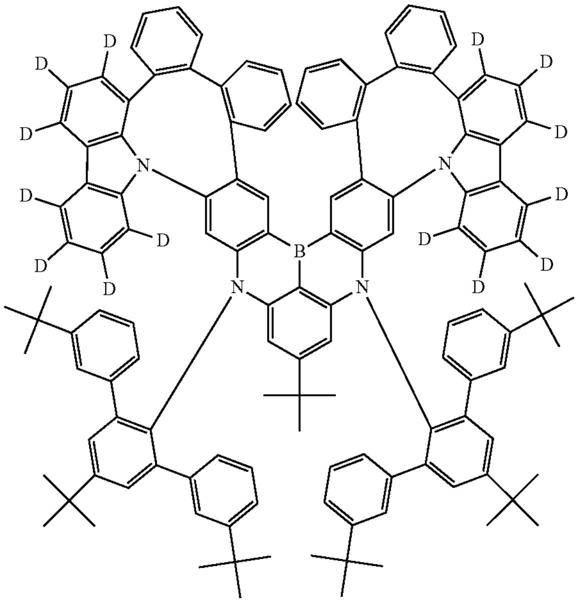
24
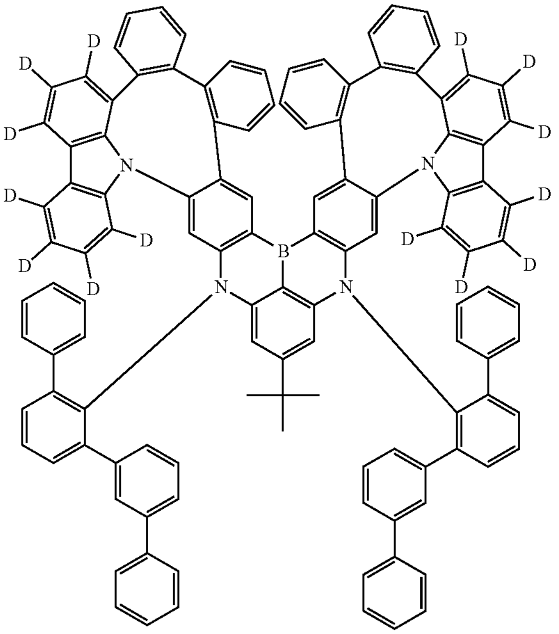

-continued
25
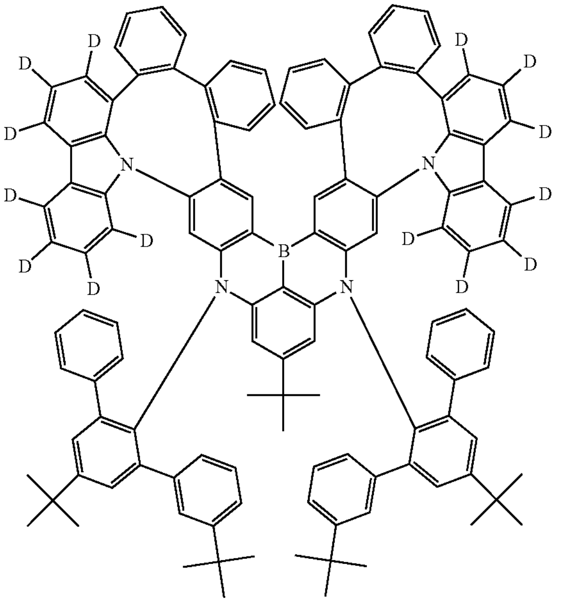
26
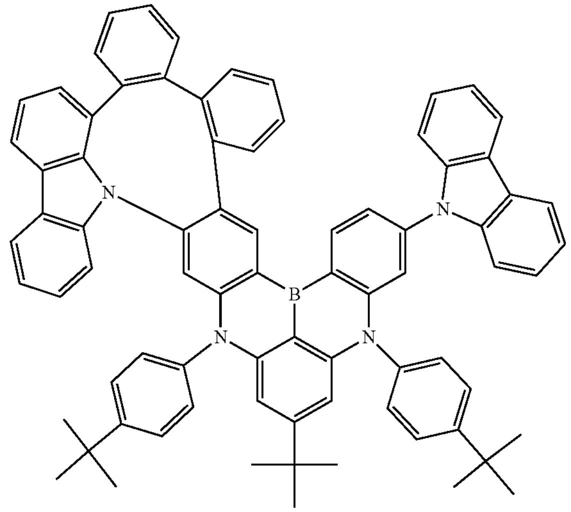
27
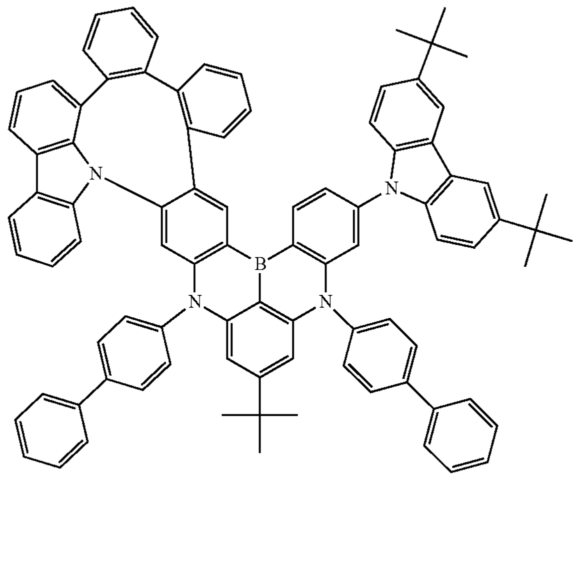
28
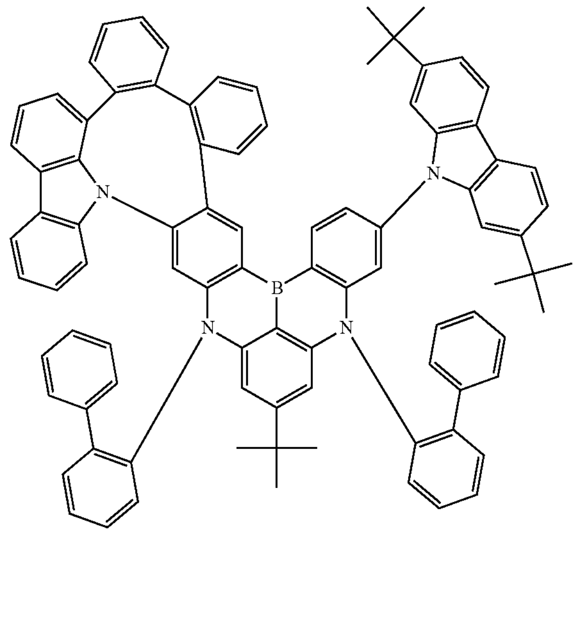

-continued
29
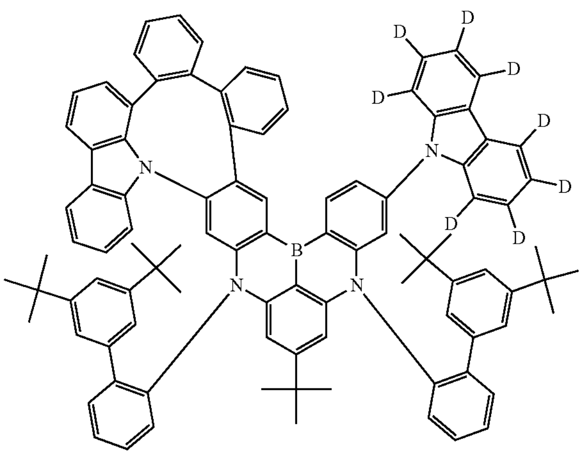
30
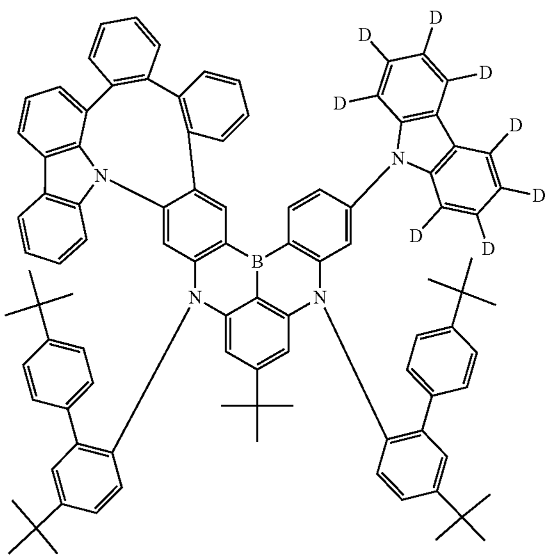
31
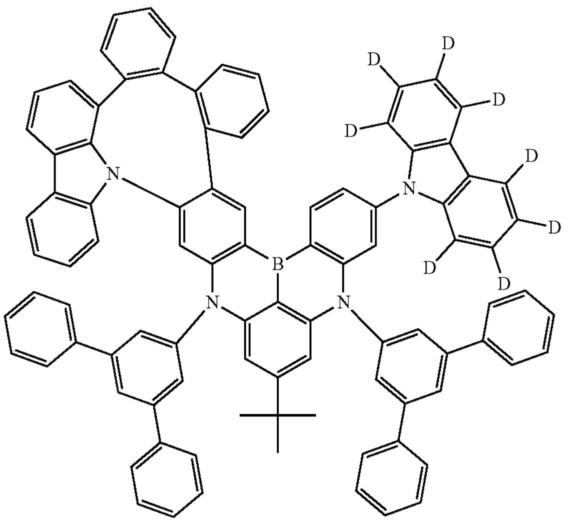
32
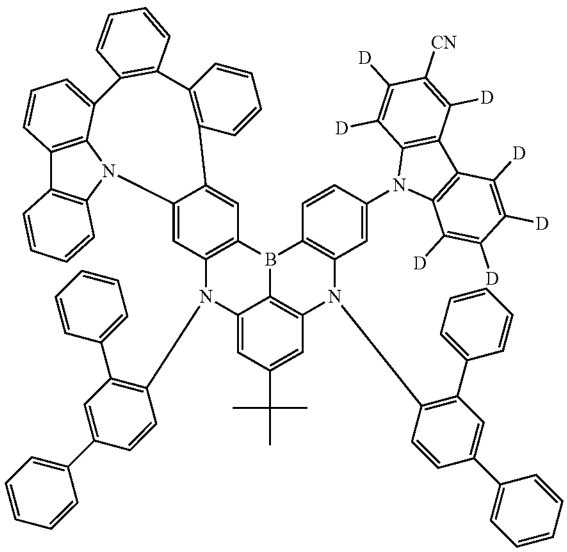

-continued
33
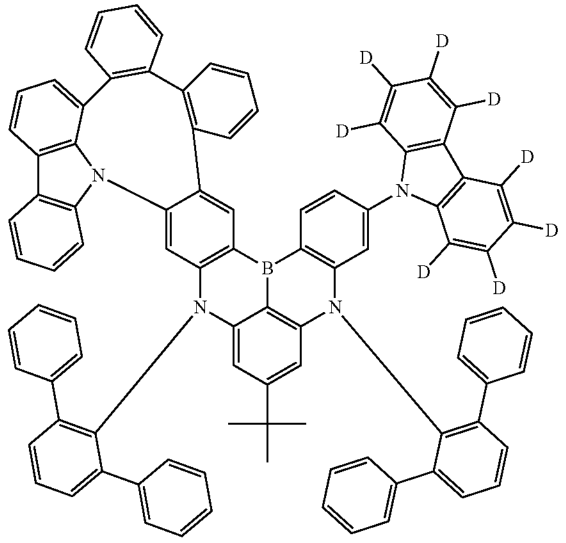
34
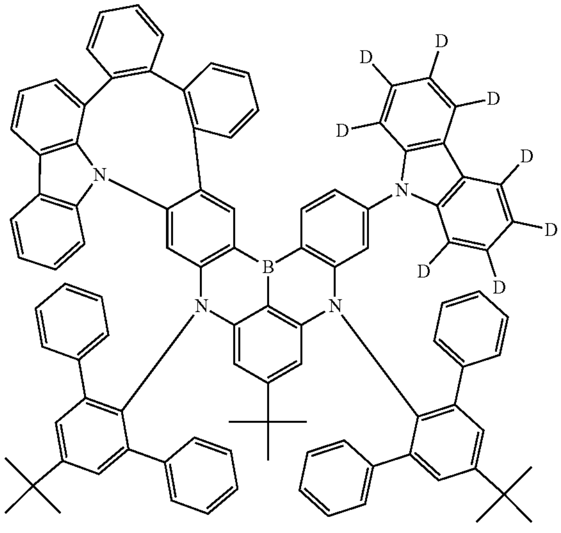
35
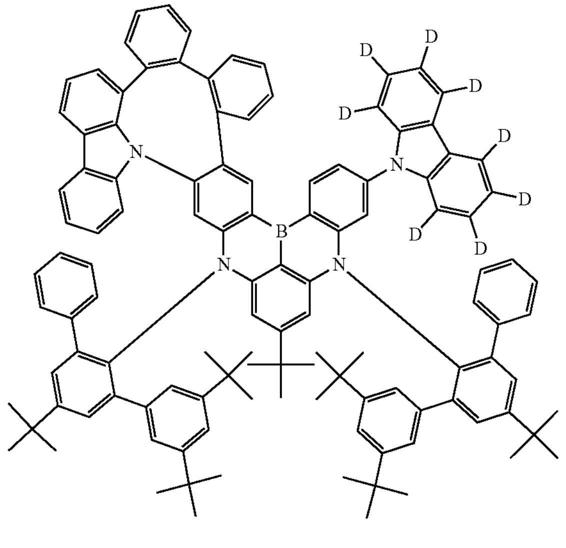
36
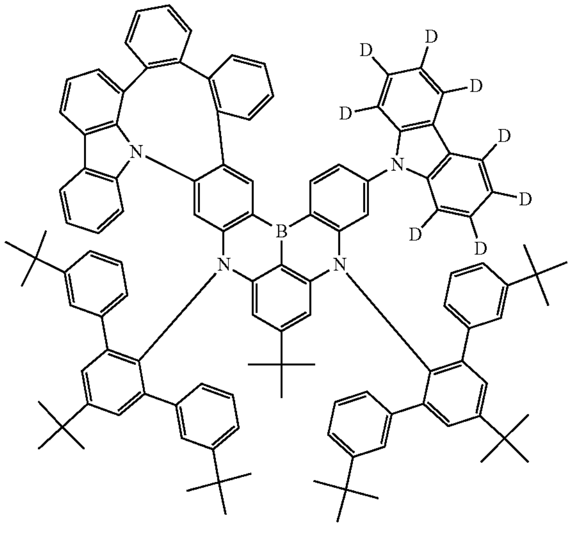

-continued
37
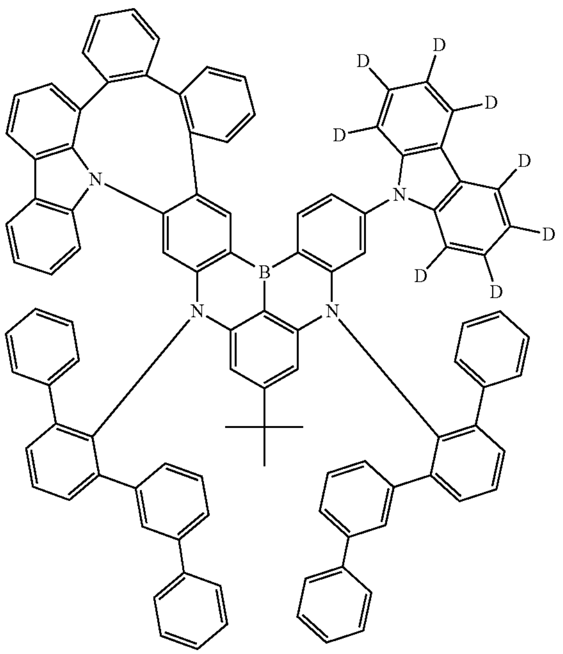
38
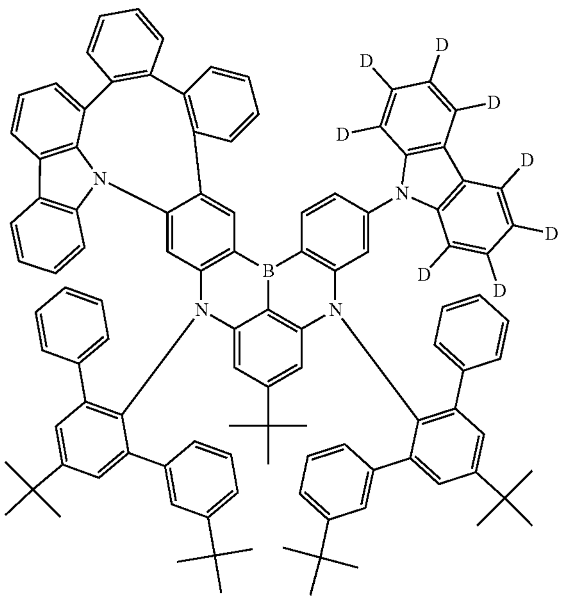
39
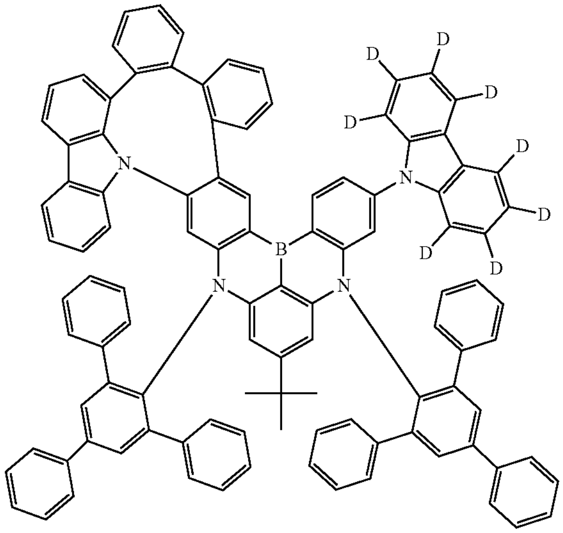
40
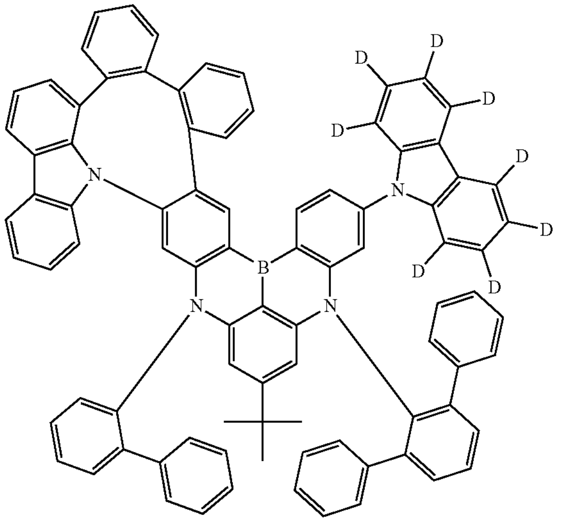

-continued
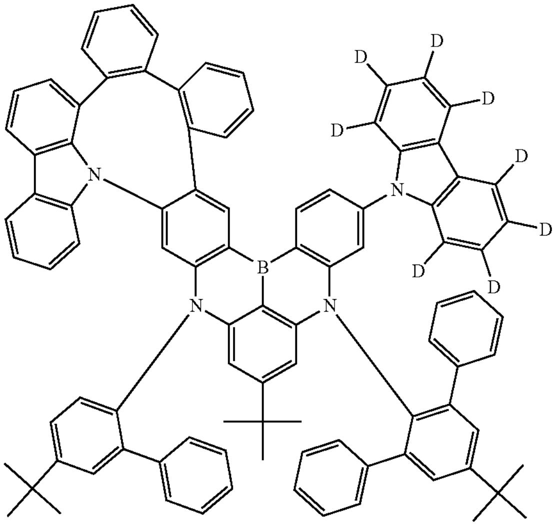
40
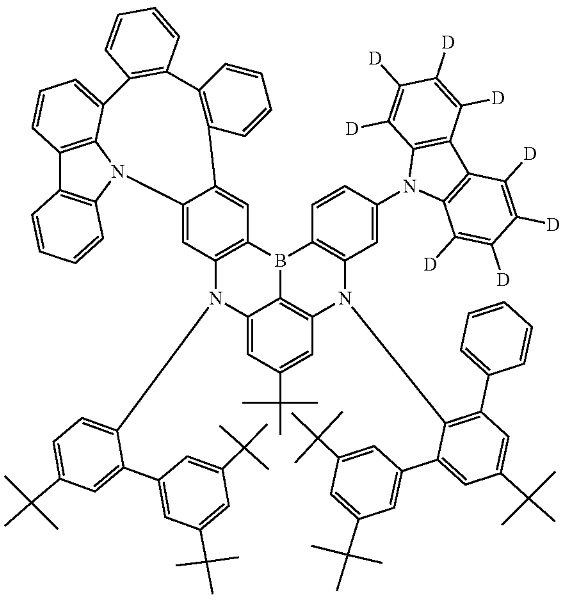
42
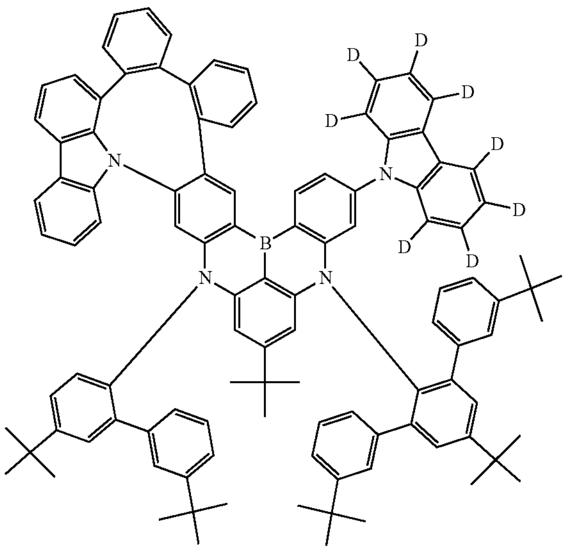
43

-continued
44
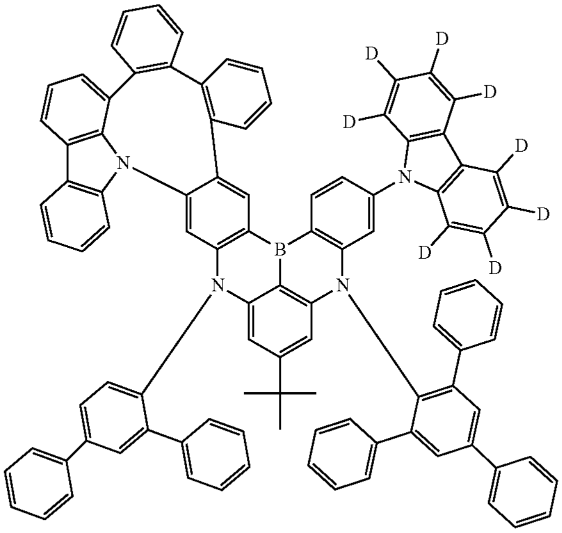
45
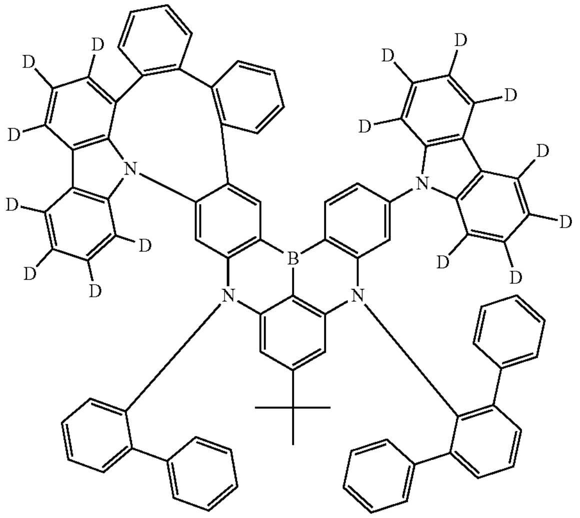
46
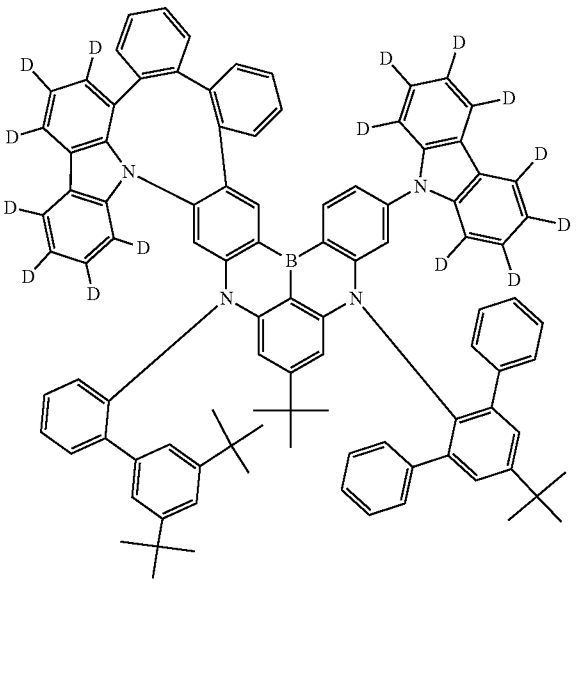
47
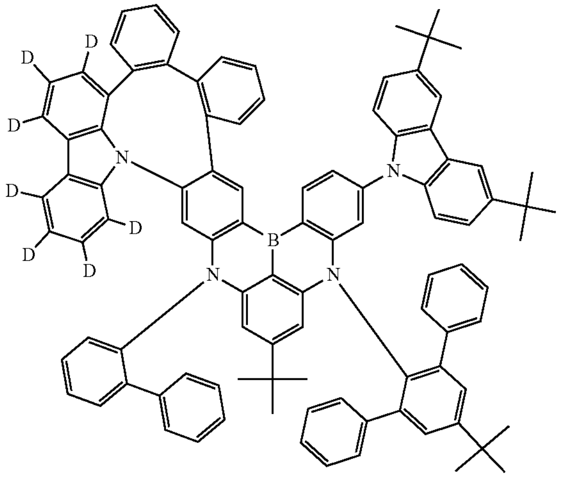

-continued
48
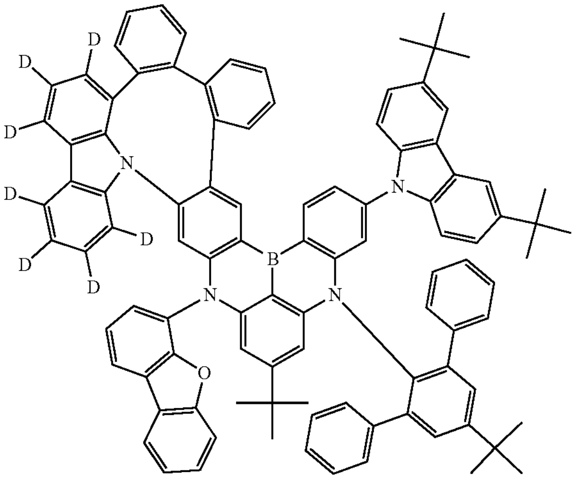
49
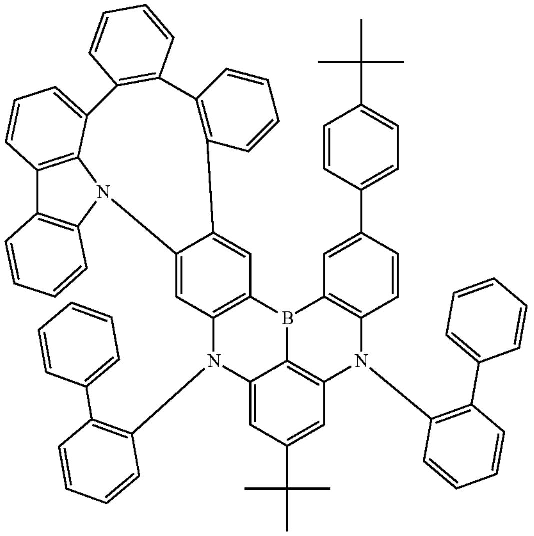
50
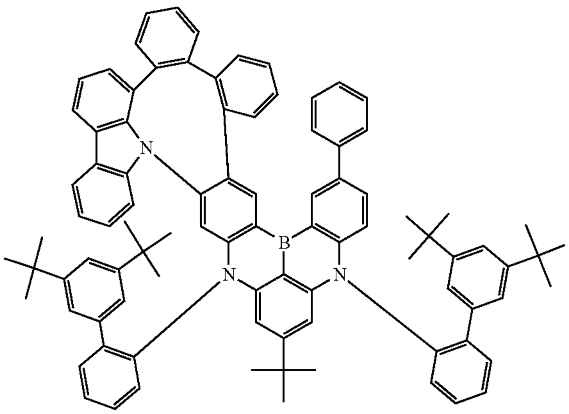
51
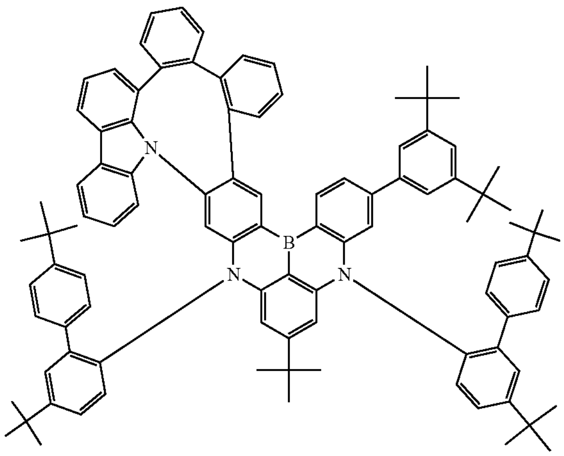
52
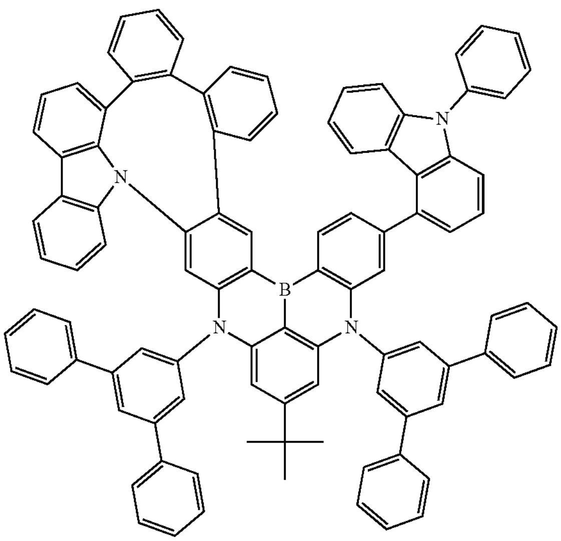
53
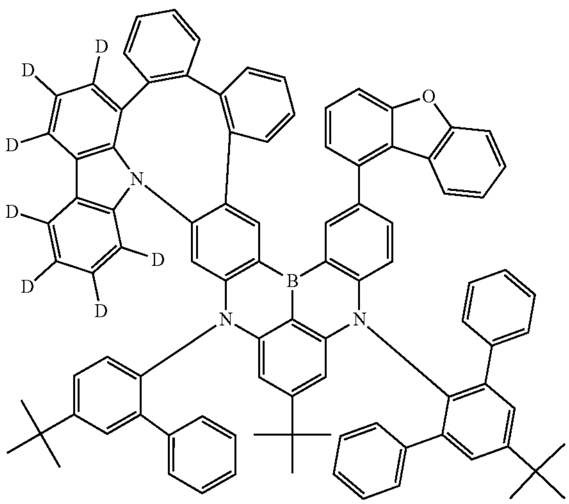

-continued
54
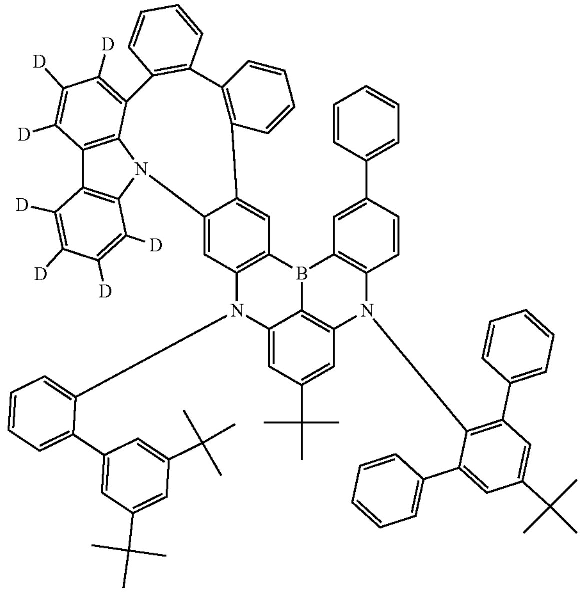
55
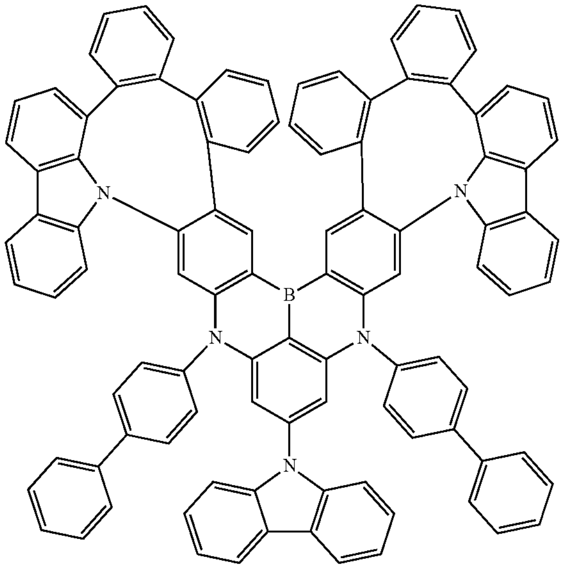
56
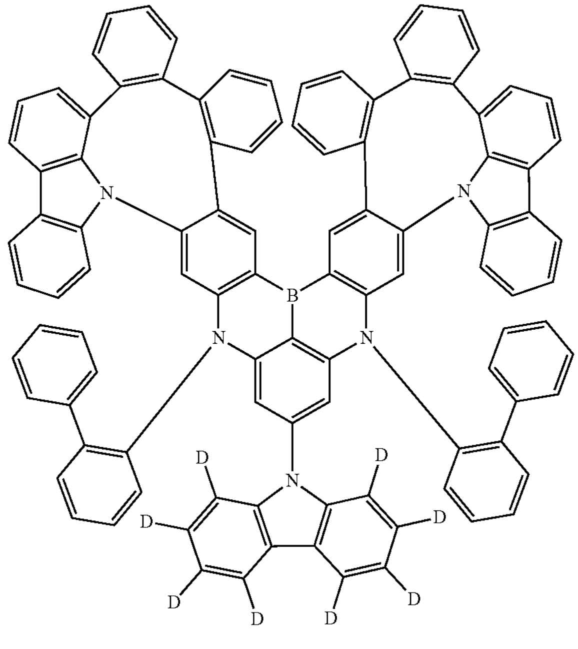
57
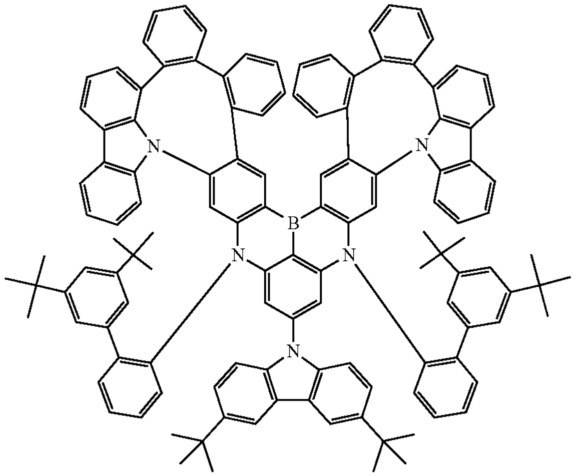

-continued
58
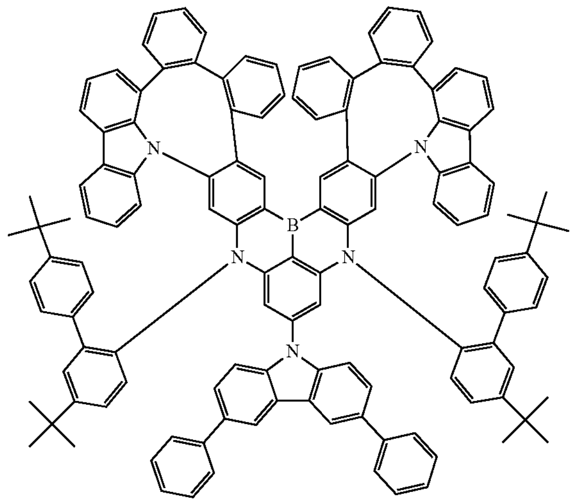
59
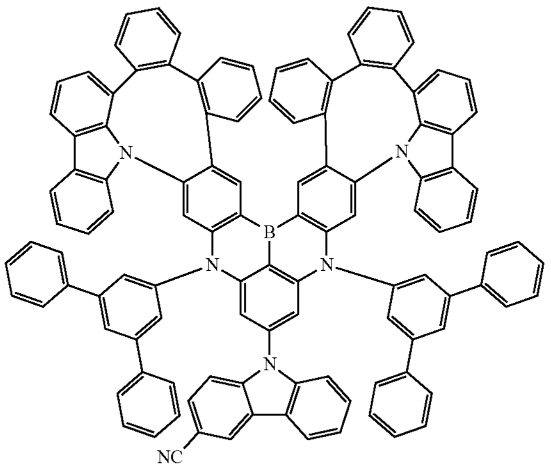
60
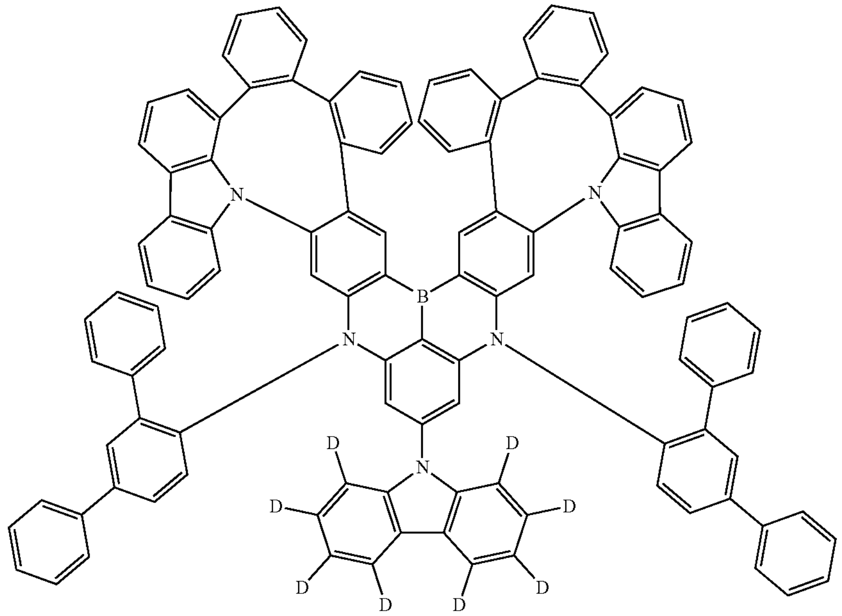

-continued
61
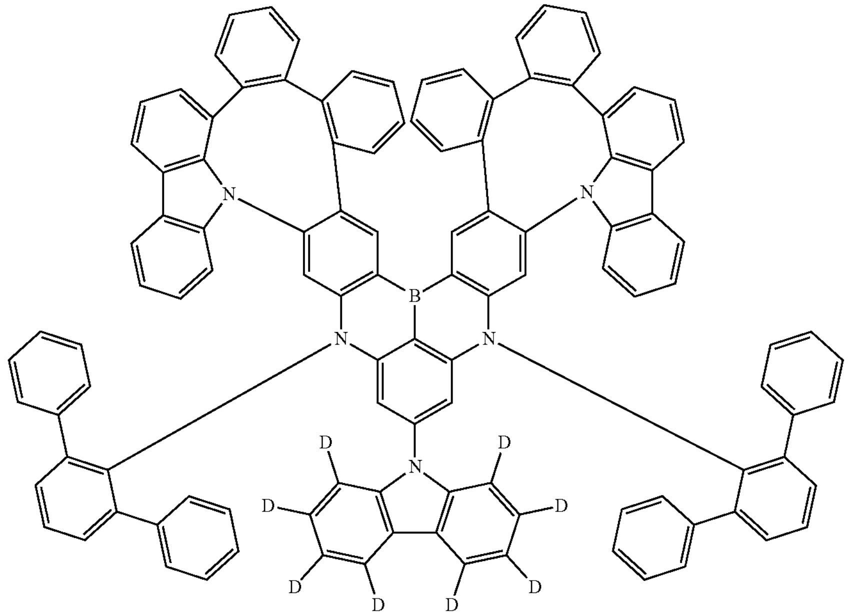
62
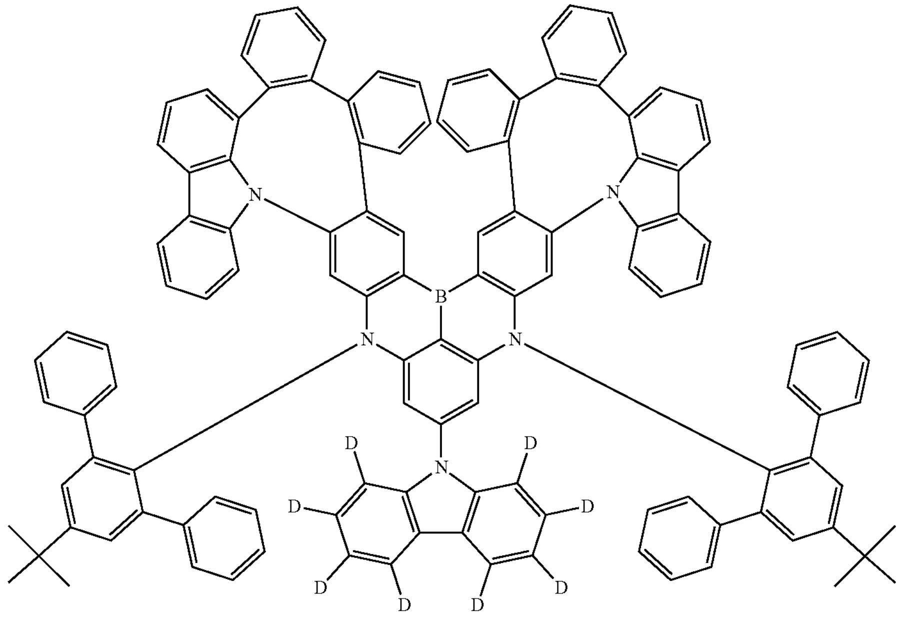

-continued
63
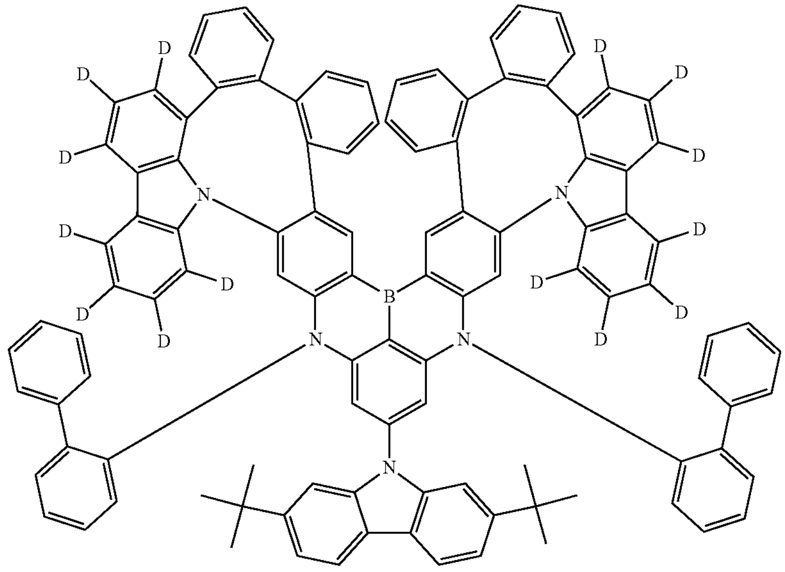
64
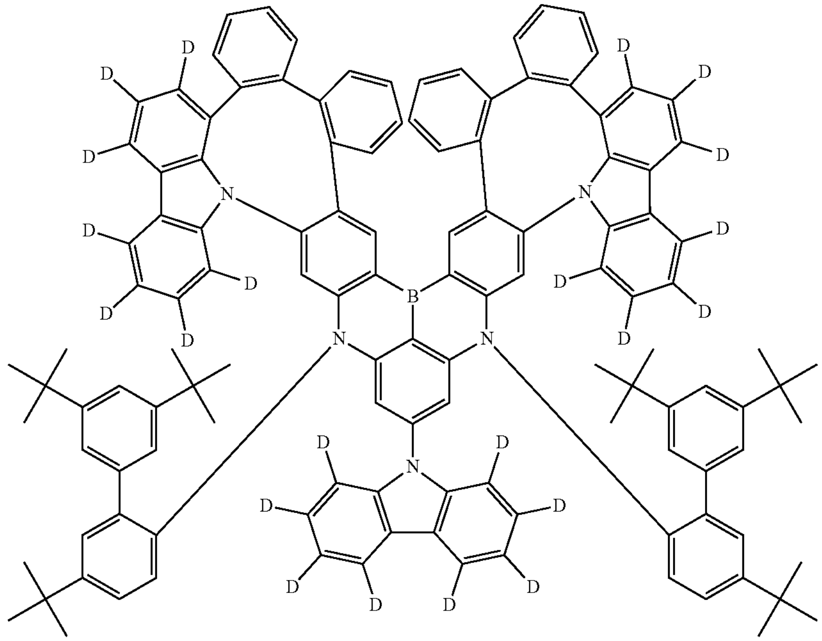

-continued
65
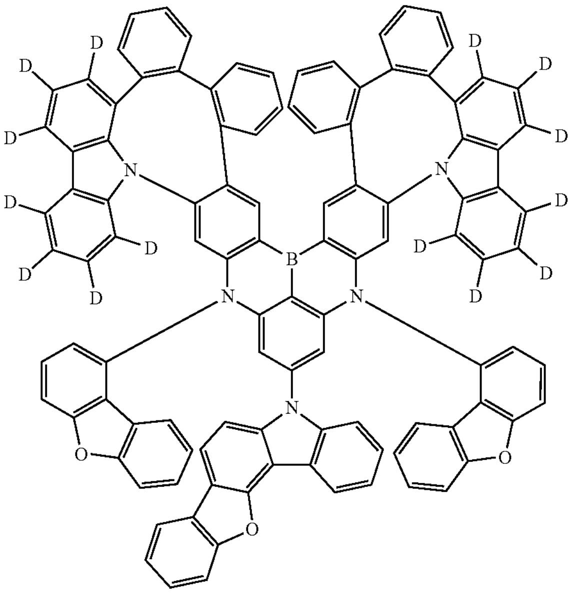
66
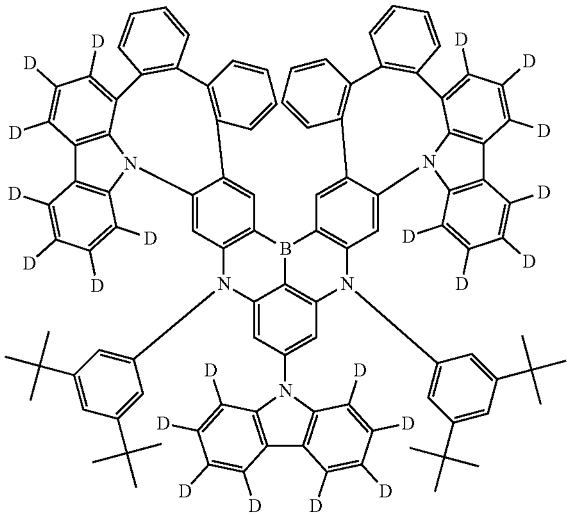
67
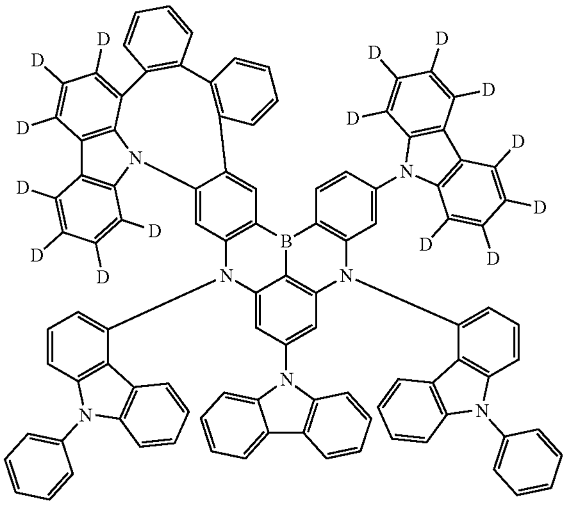
68
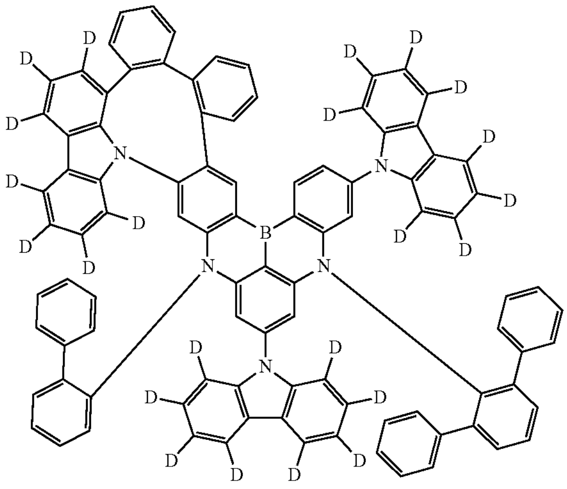

-continued
69
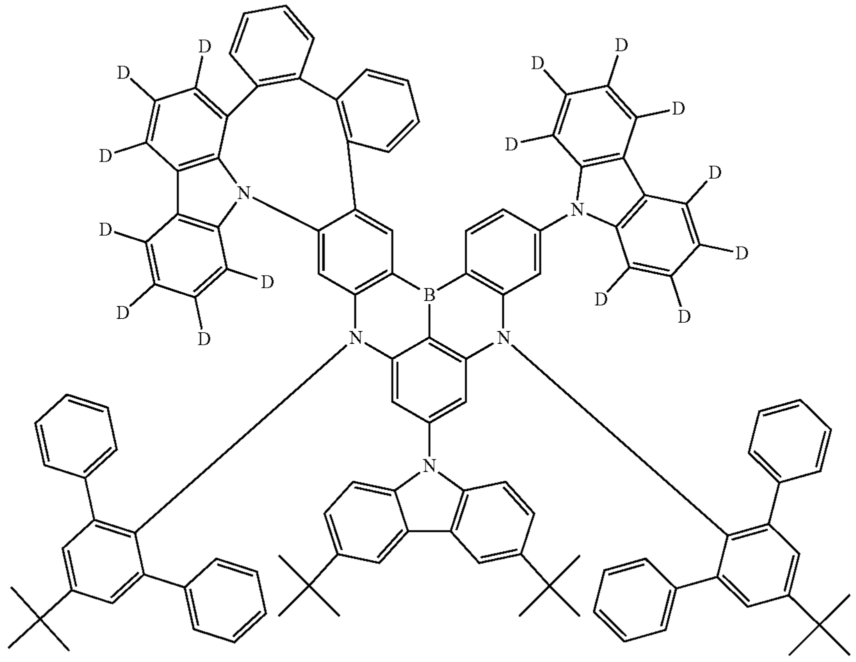
70
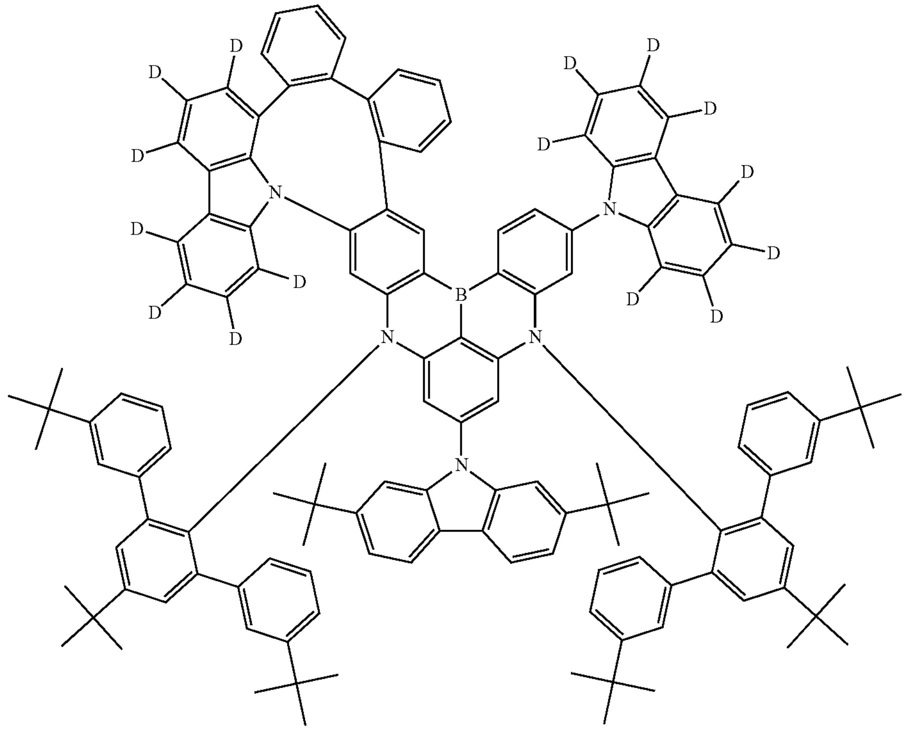

-continued
71
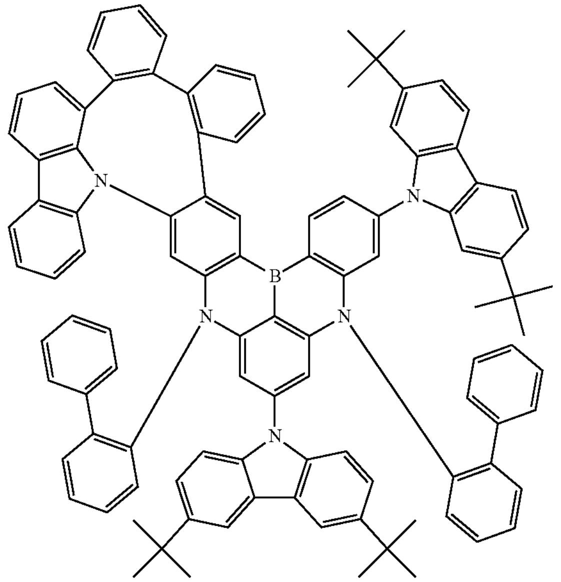
72
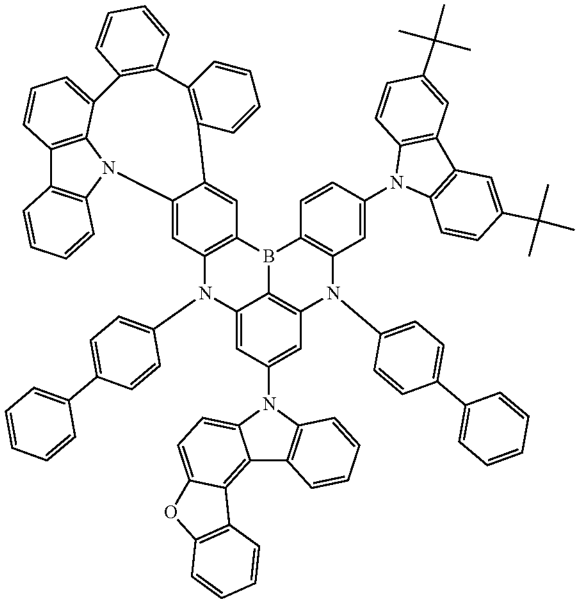
73
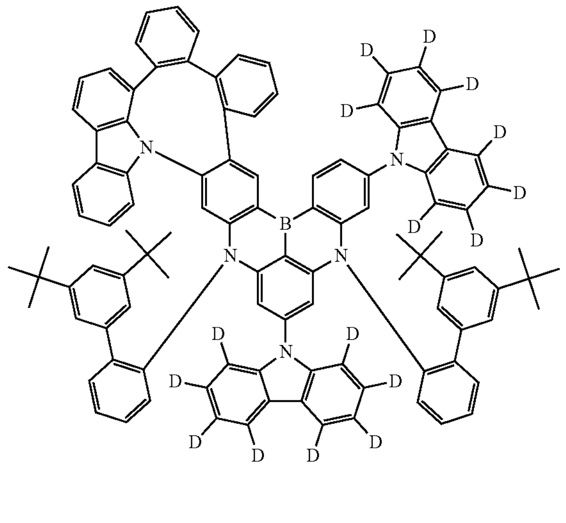
74
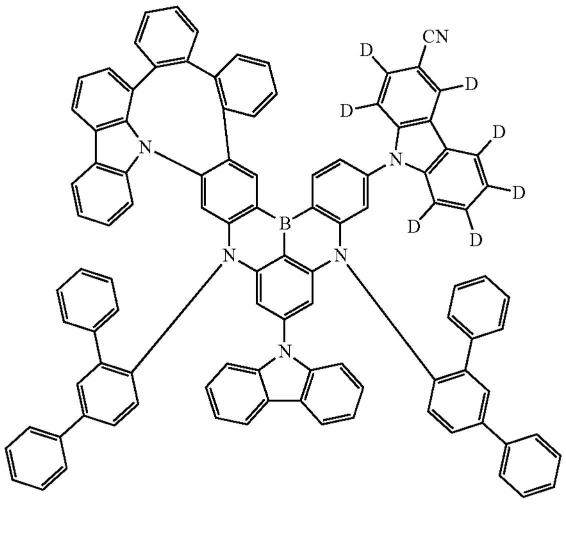

-continued
75
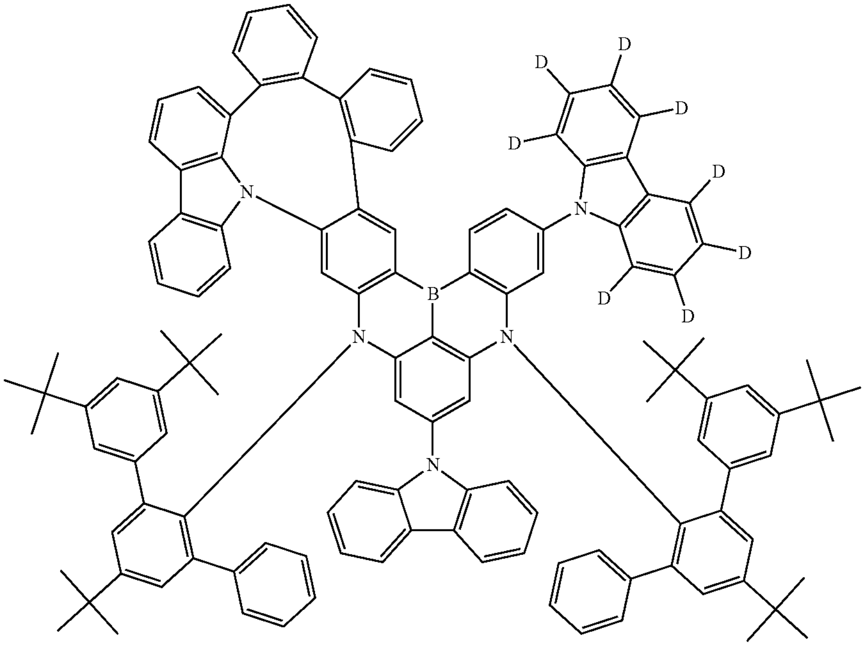
76
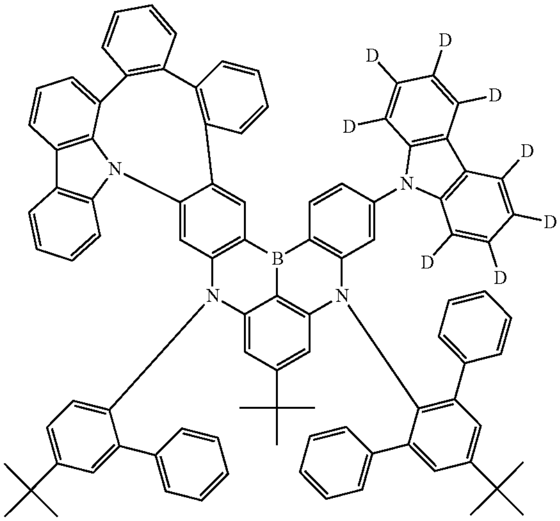

-continued
77
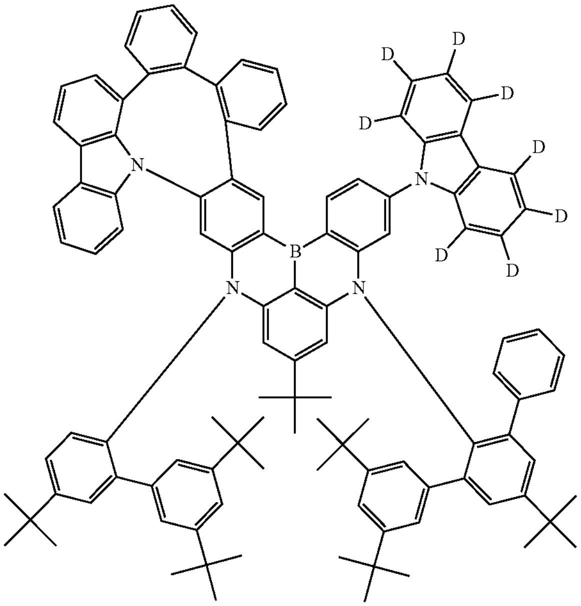
78
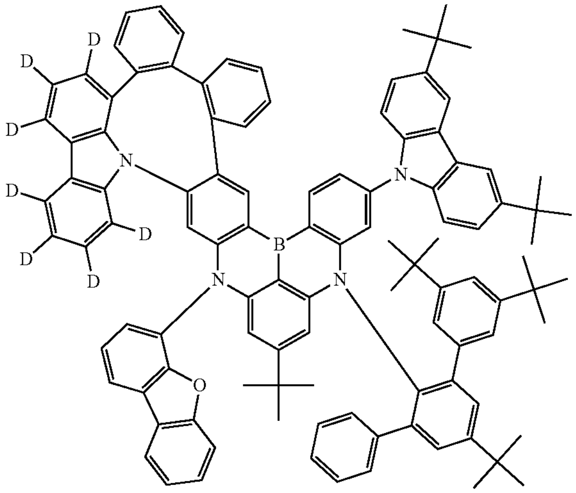
79
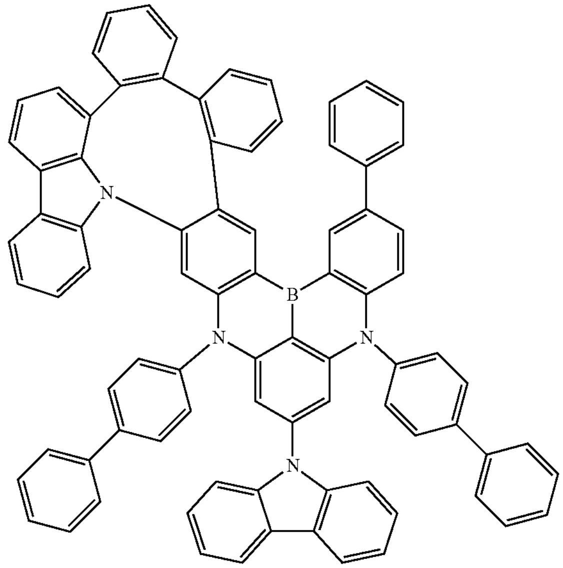

-continued
80
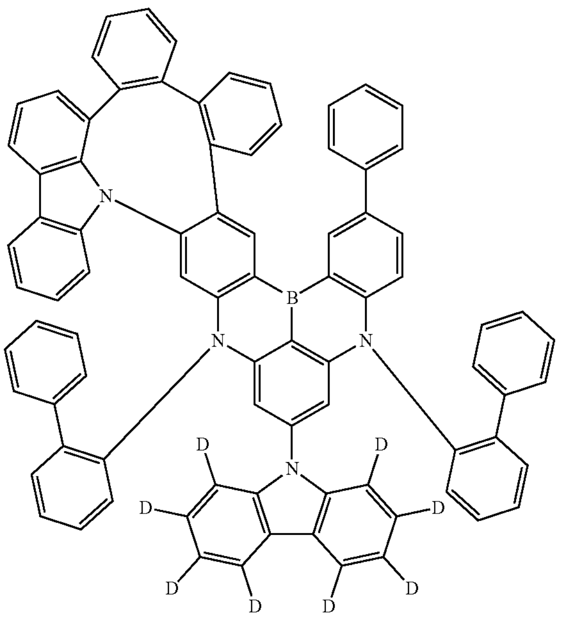
81
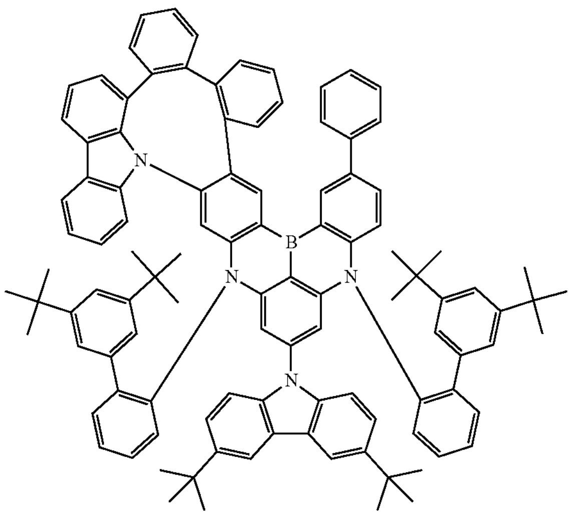
82
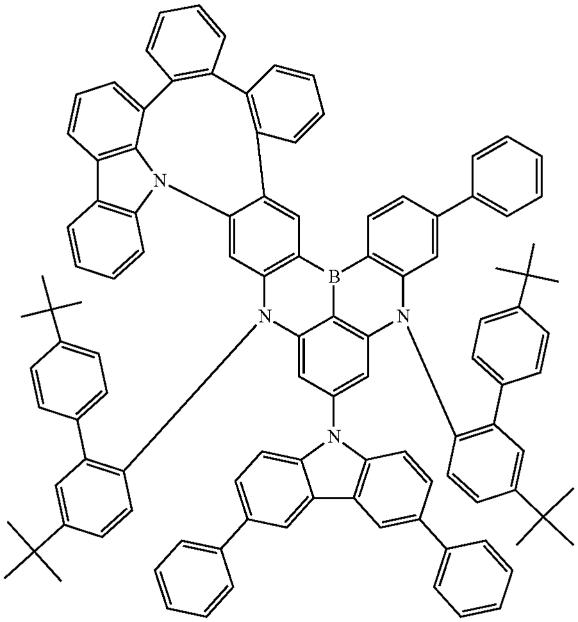
83
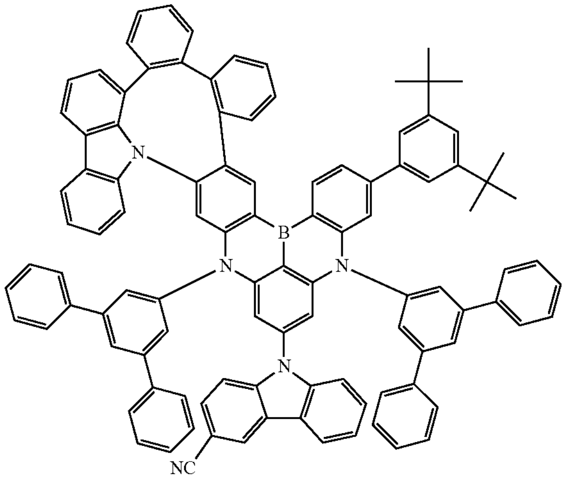

-continued
84
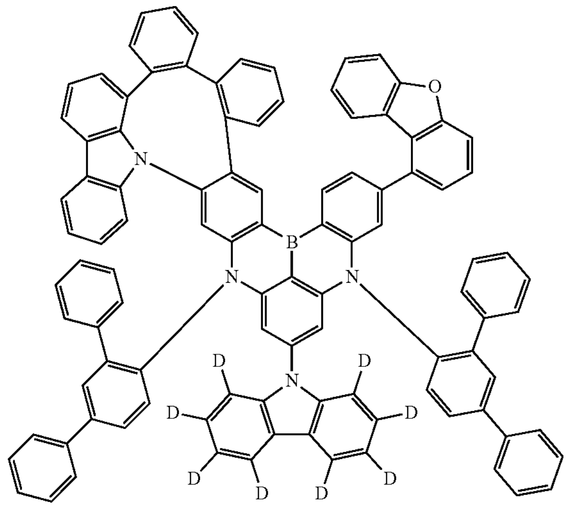
85
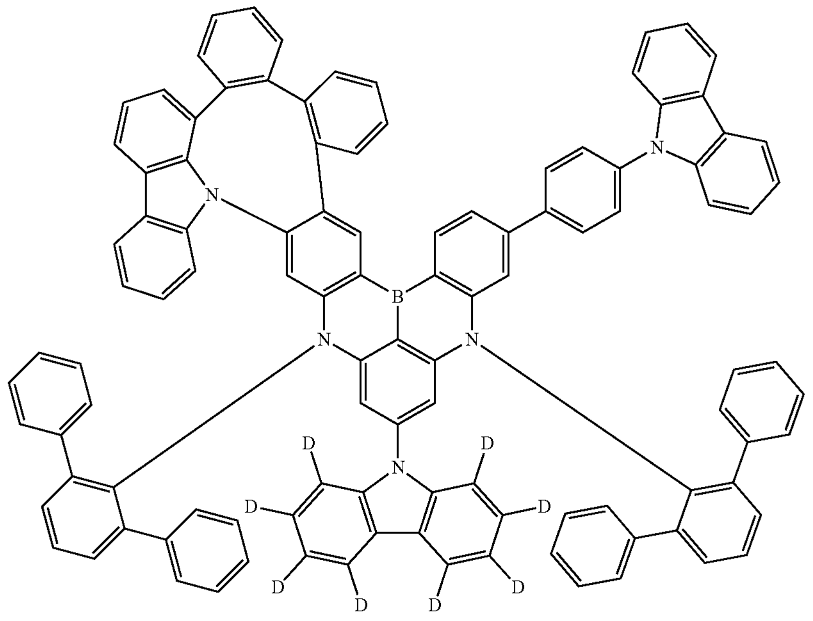

-continued
86
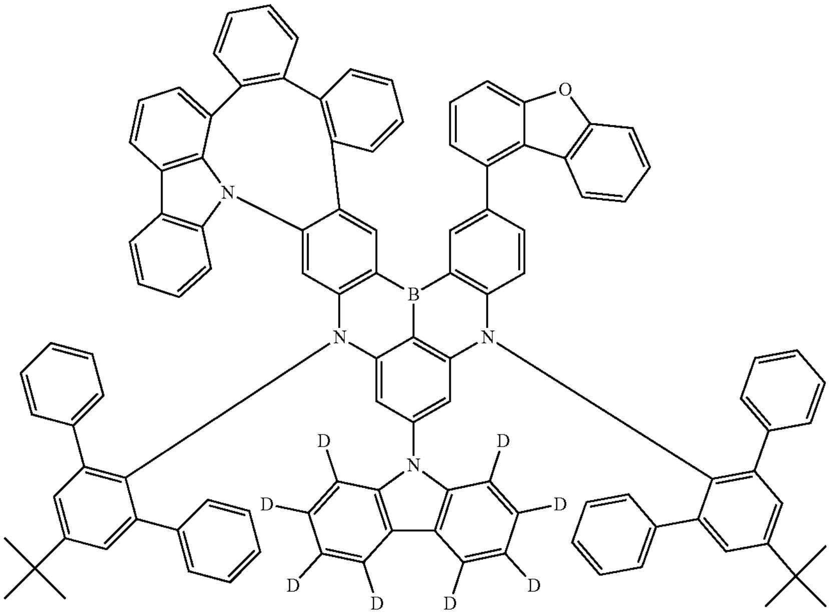
87
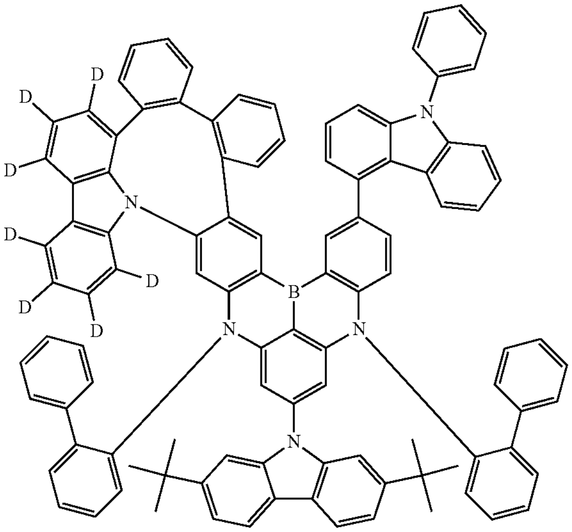
88
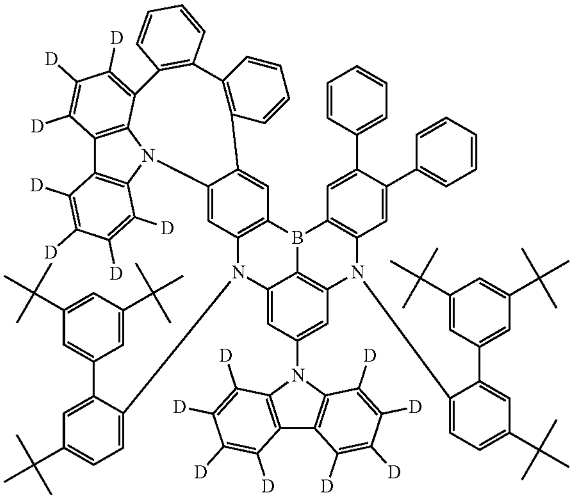

-continued
89
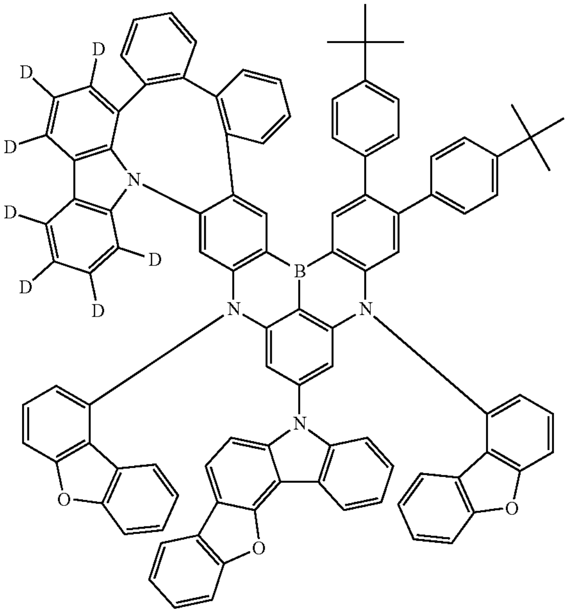
90
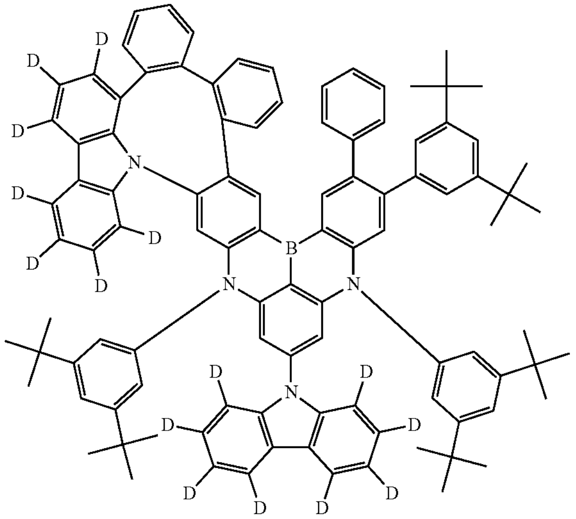
91
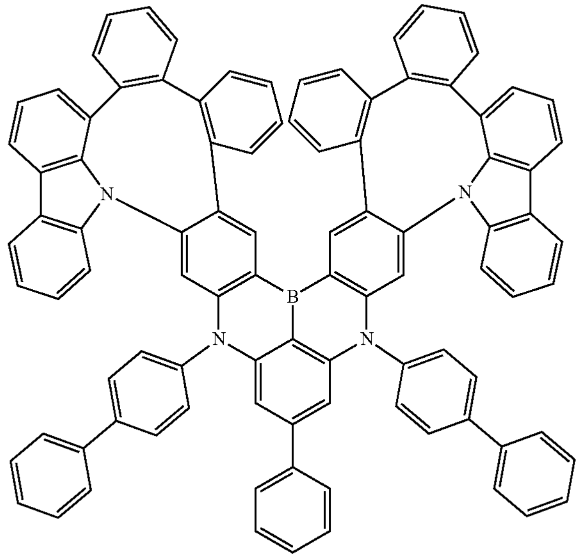
92
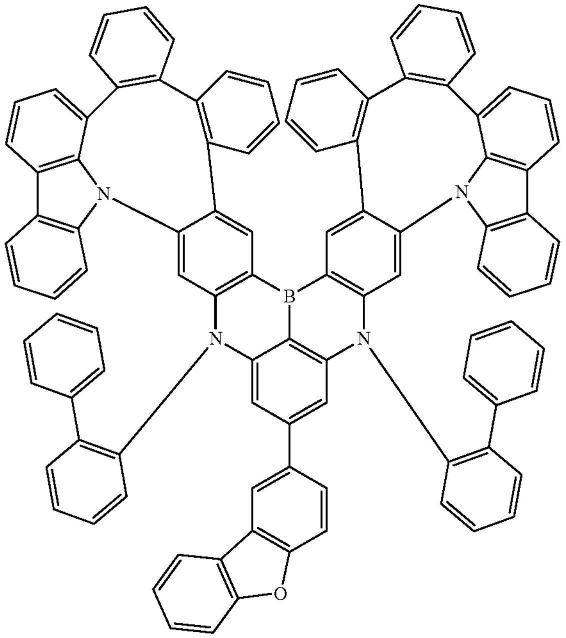

-continued
93
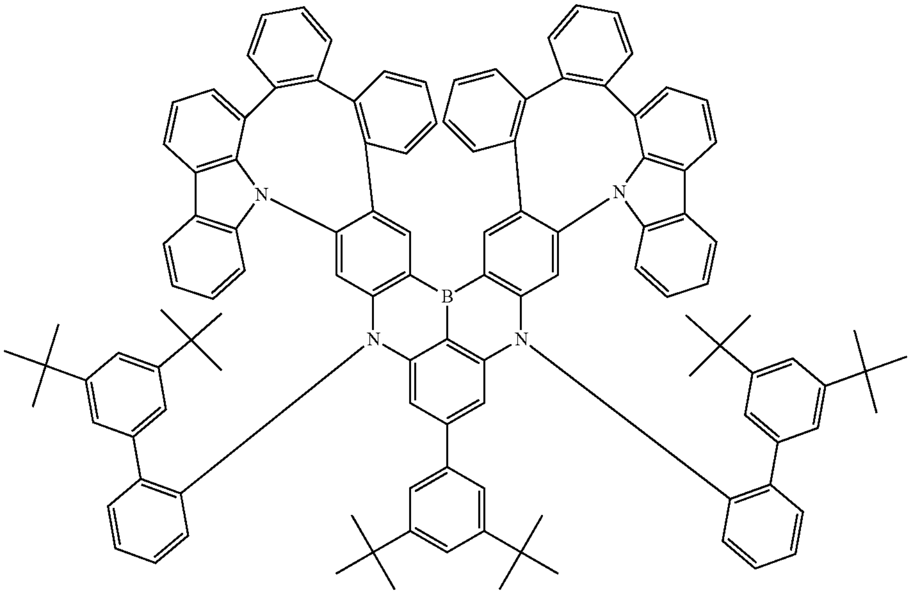
94
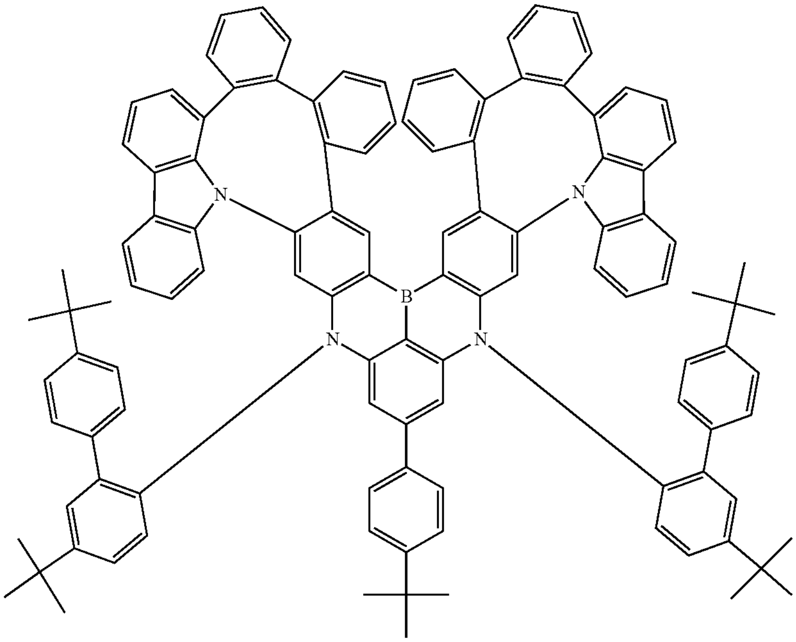

-continued
95
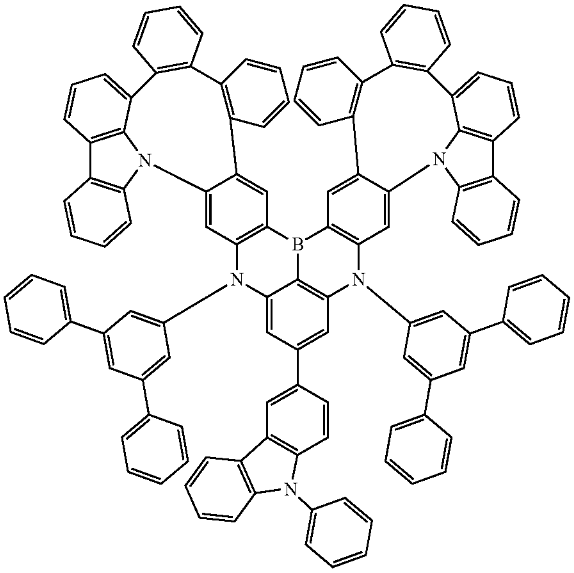
96
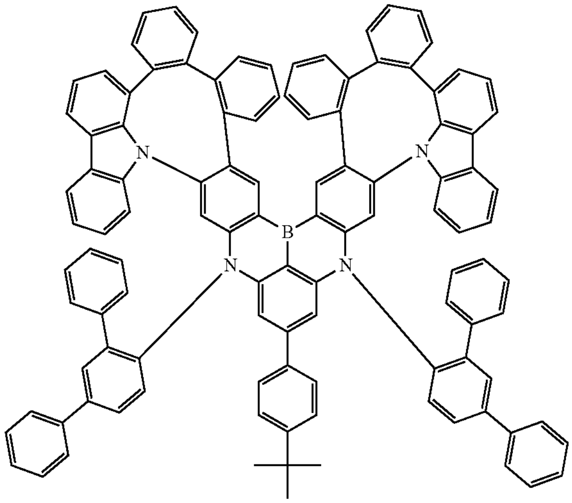
97
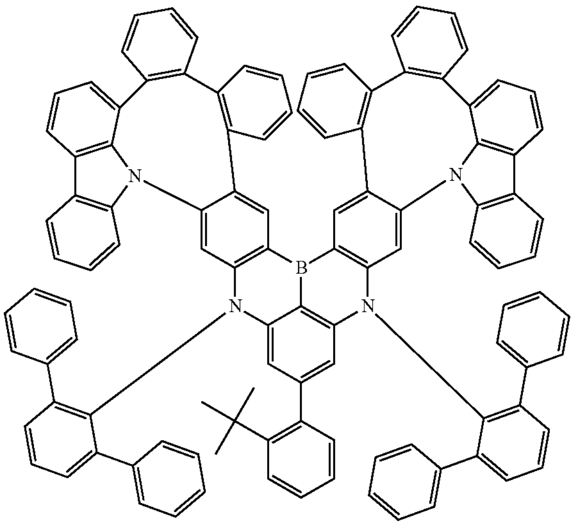
98
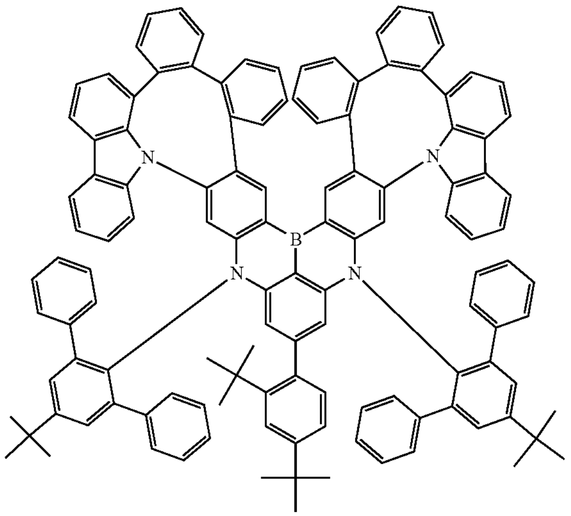

-continued
99
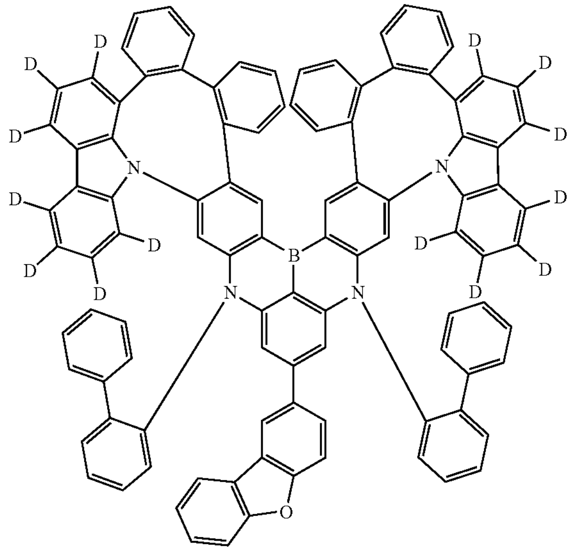
100
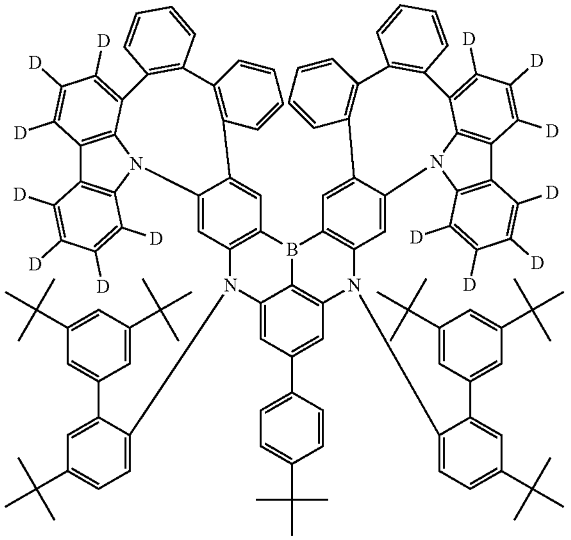
101
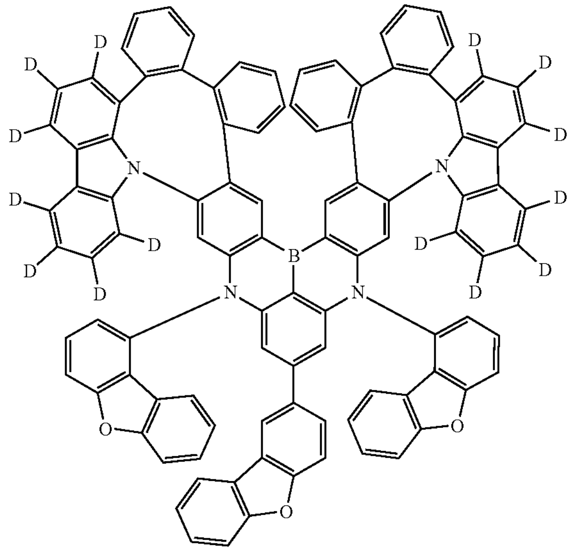
102
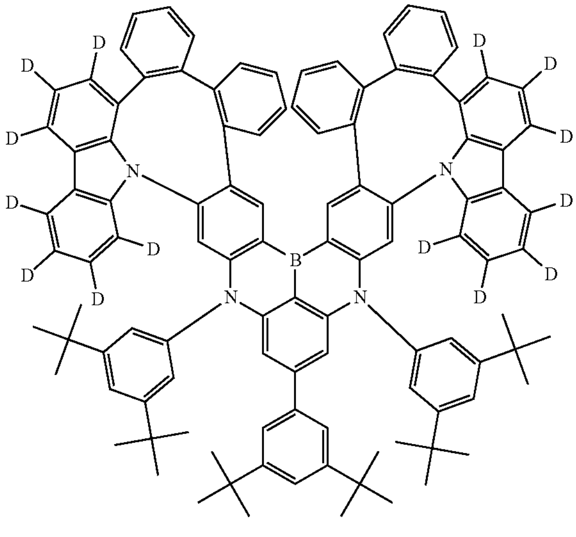

-continued
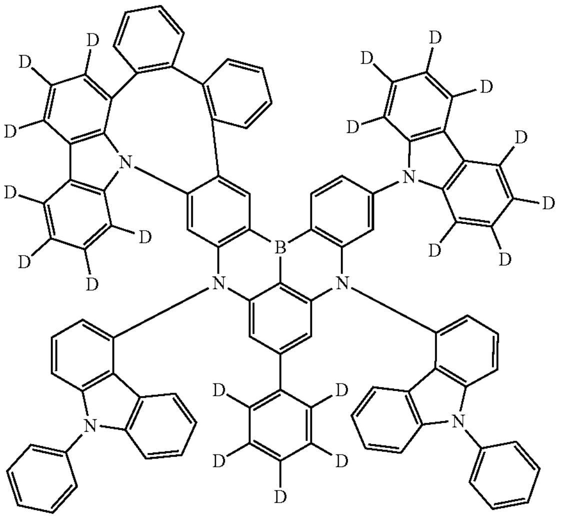
103
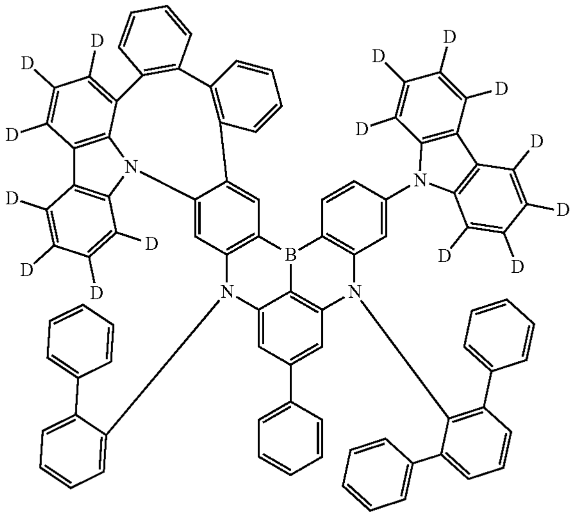
104
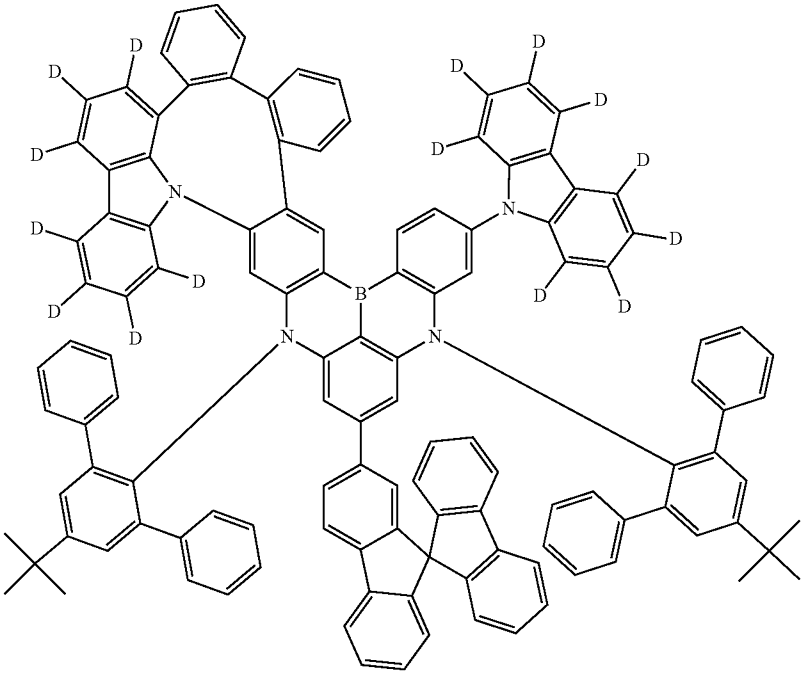
105

-continued
106
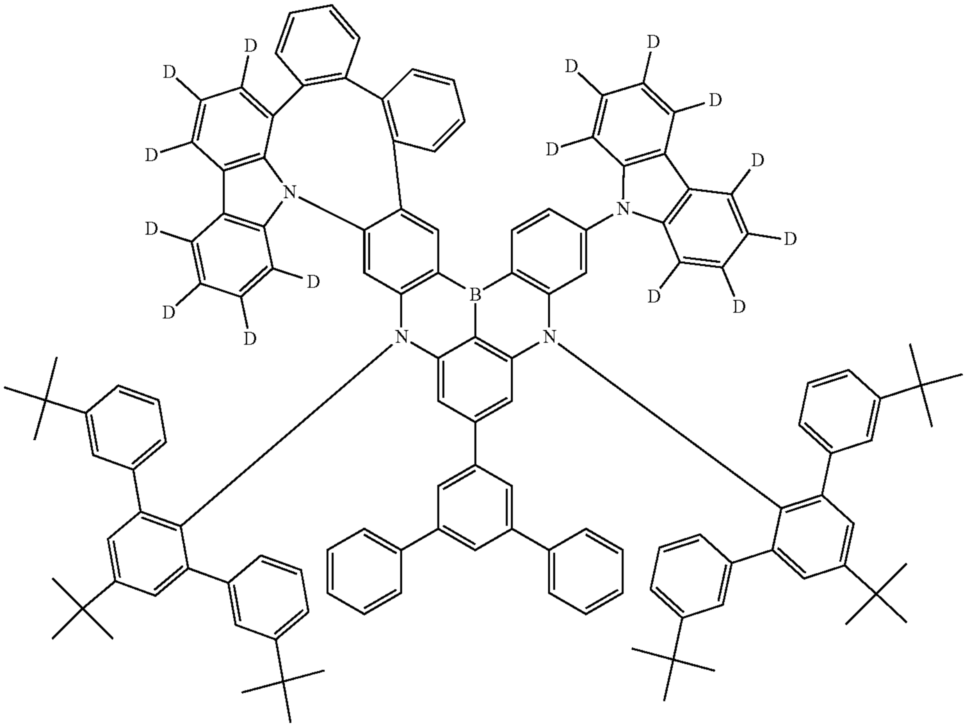
107
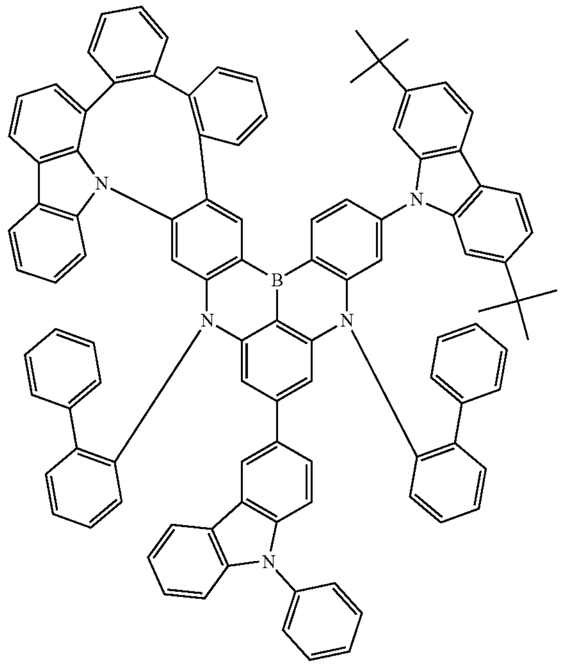
108
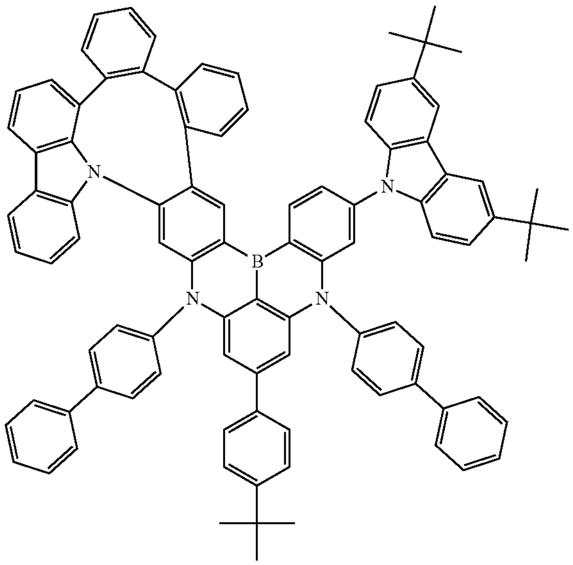

-continued
109
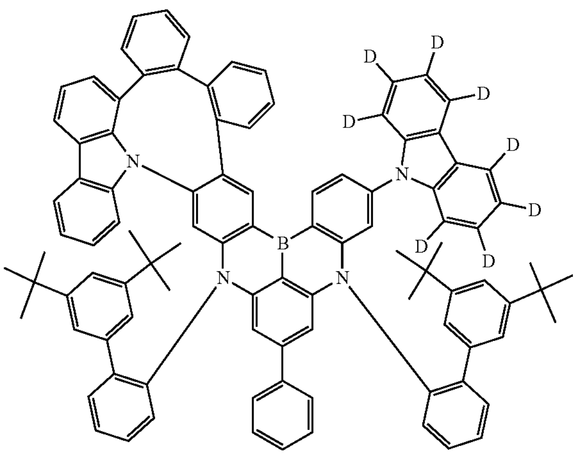
110
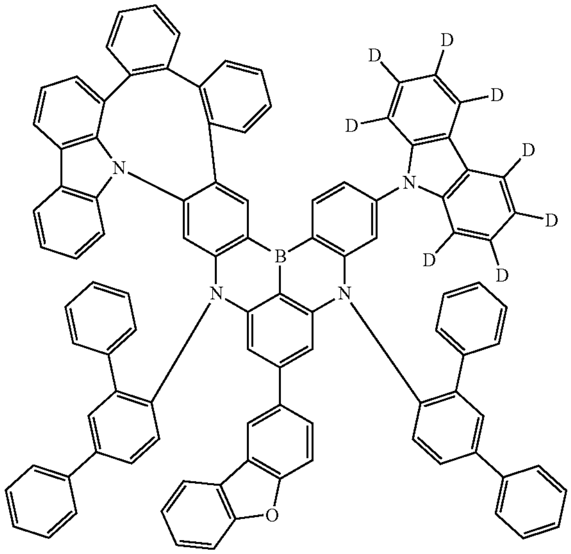
111
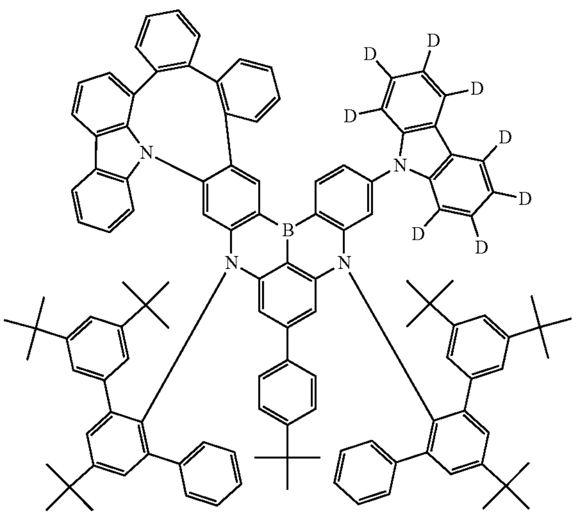
112
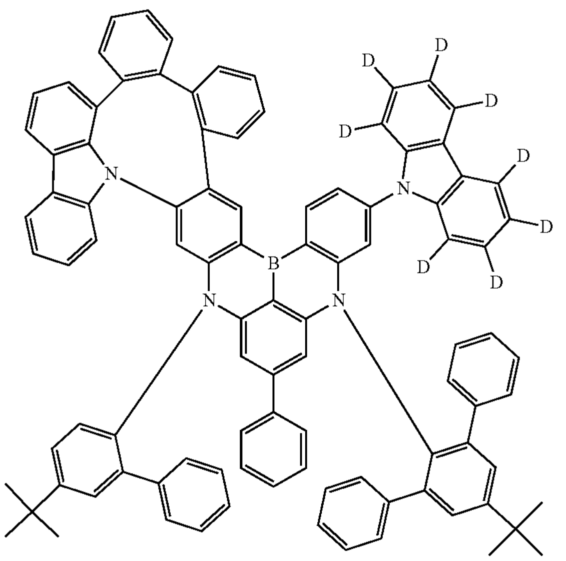

-continued
113
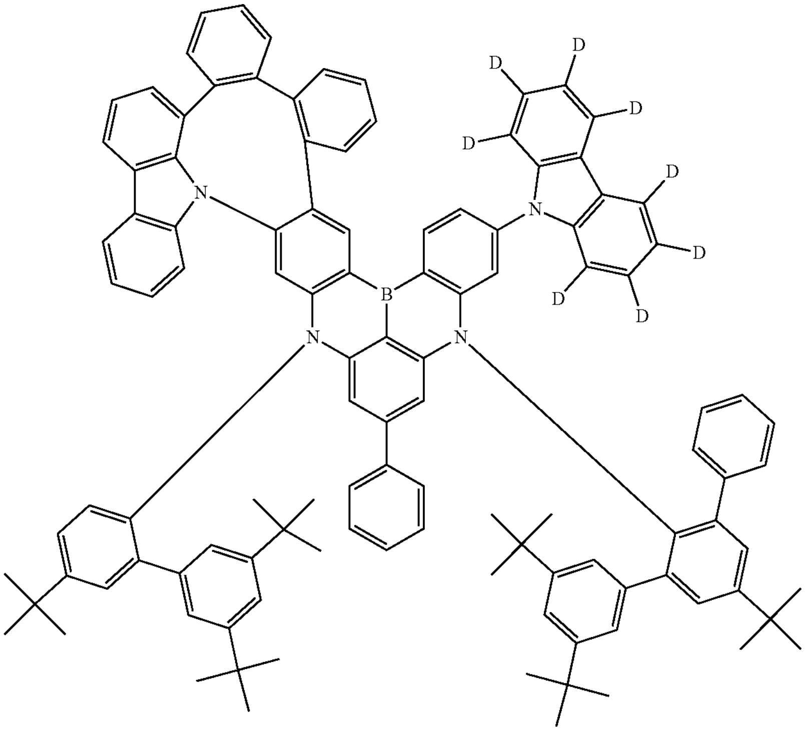
114
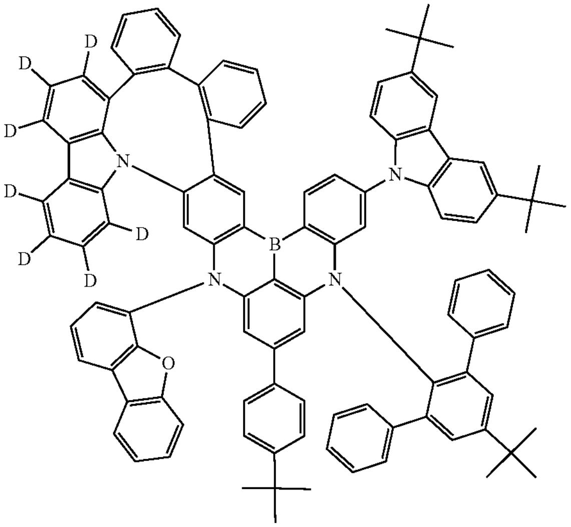
115
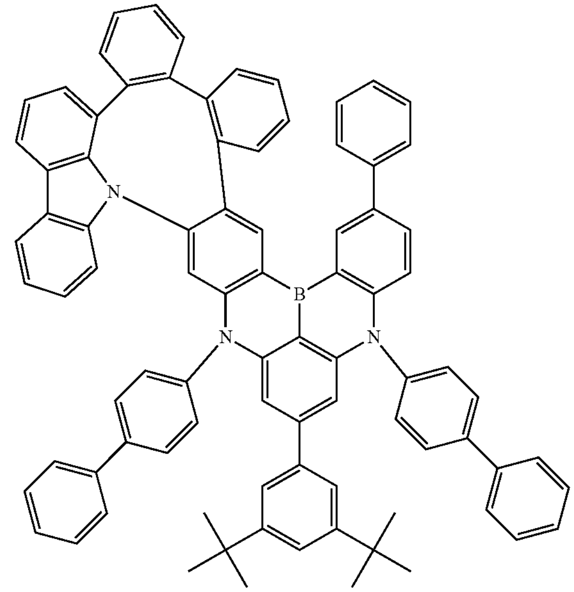

-continued
116
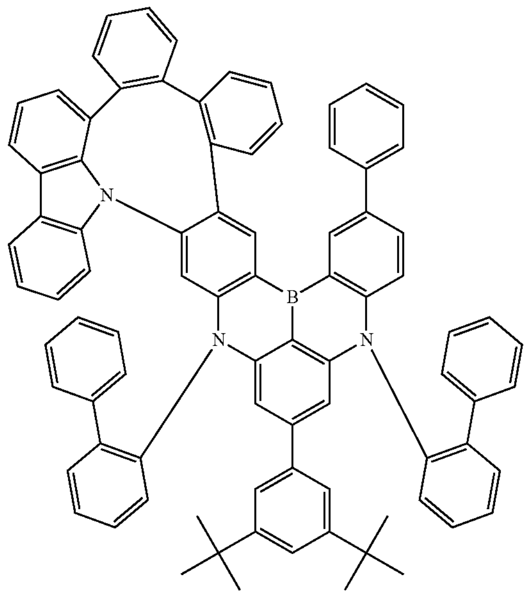
117
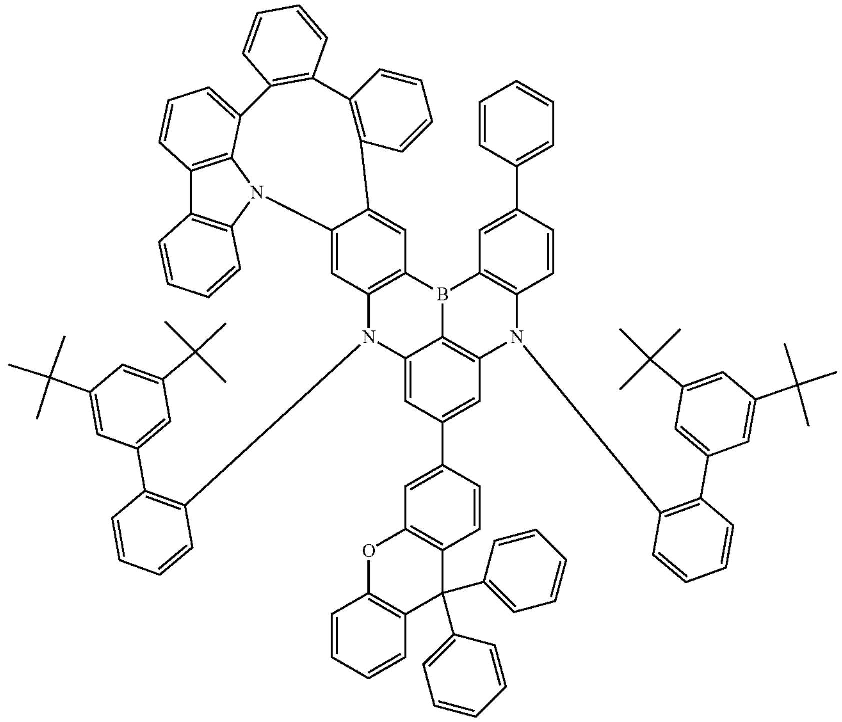

-continued
118
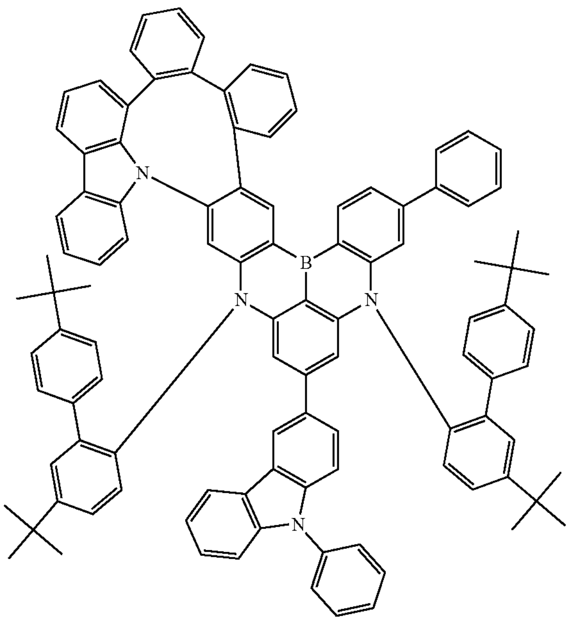
119
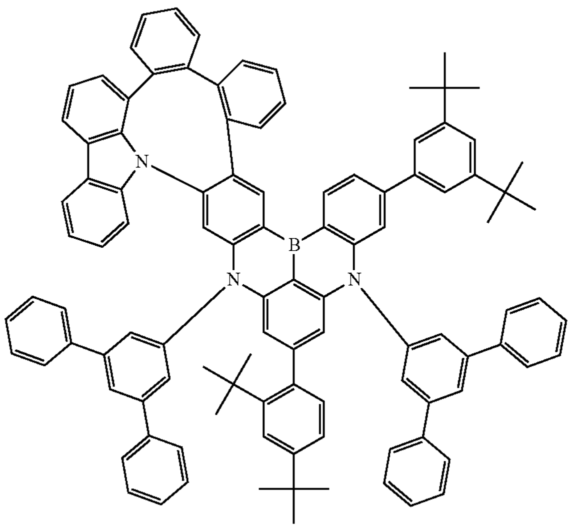
120
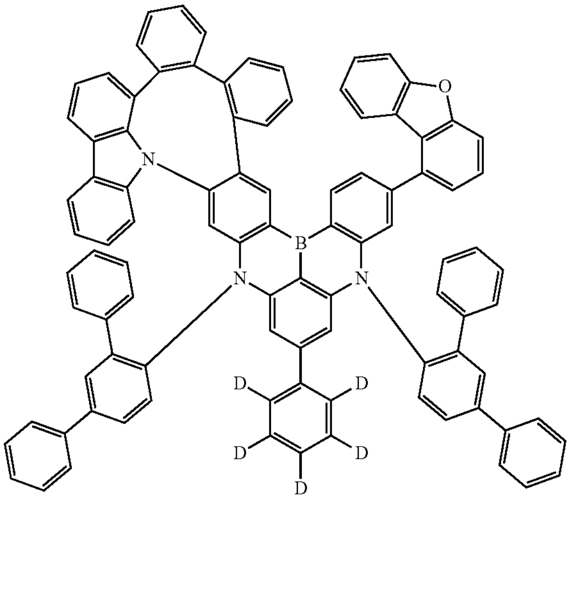
121
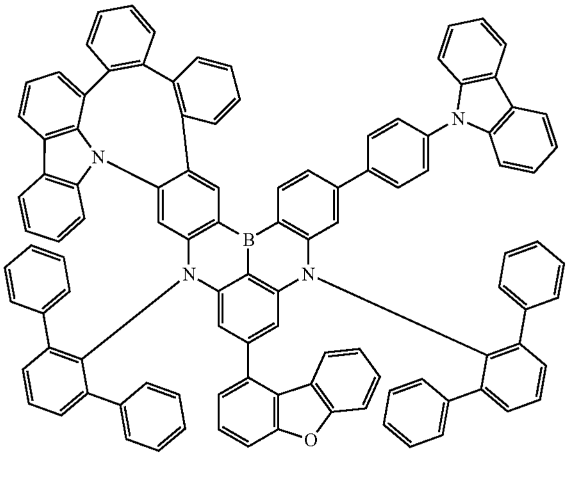

-continued
122
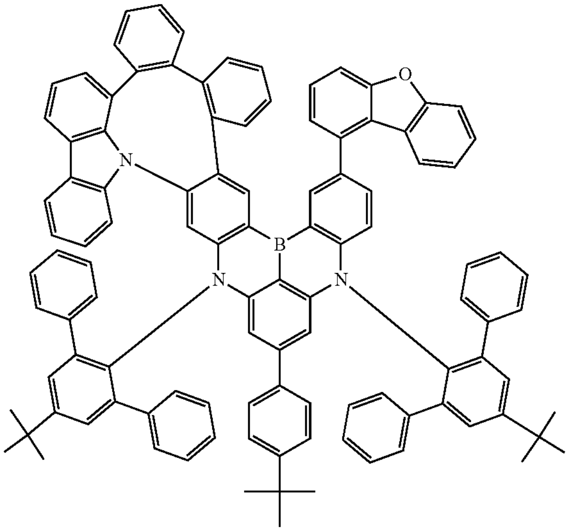
123
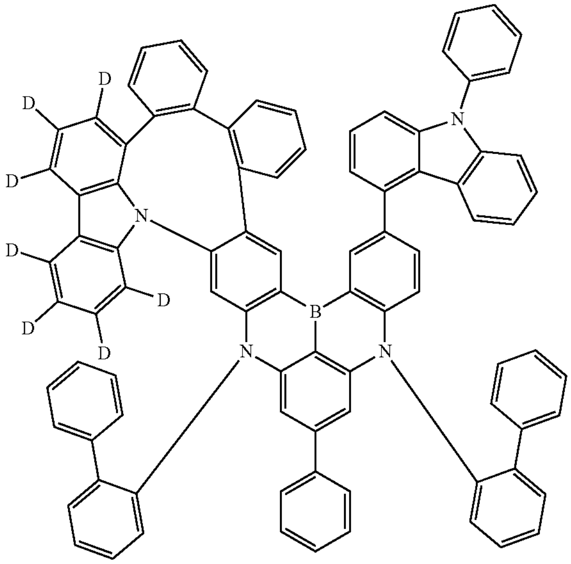
124
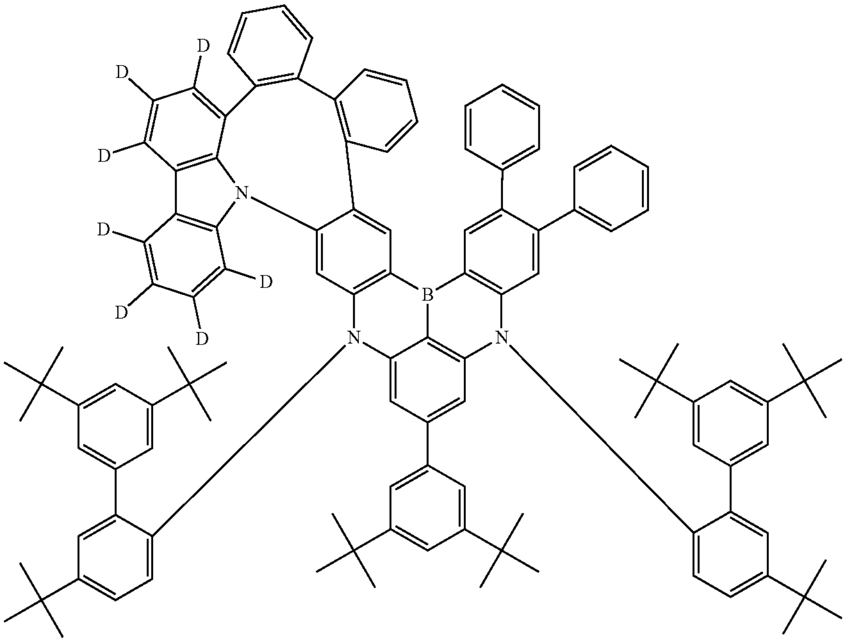

-continued
125
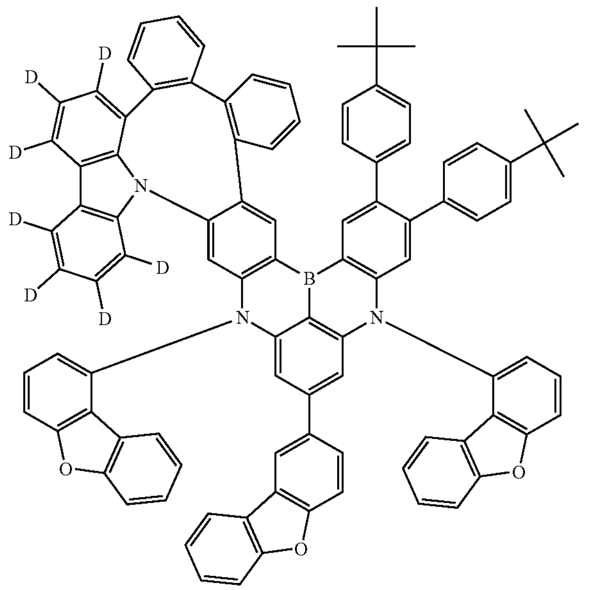
126
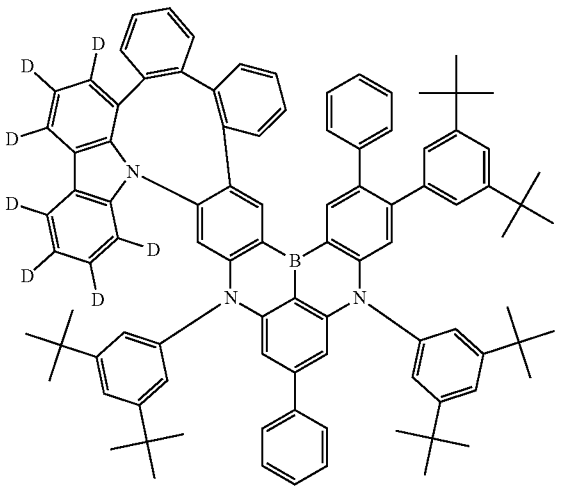
127
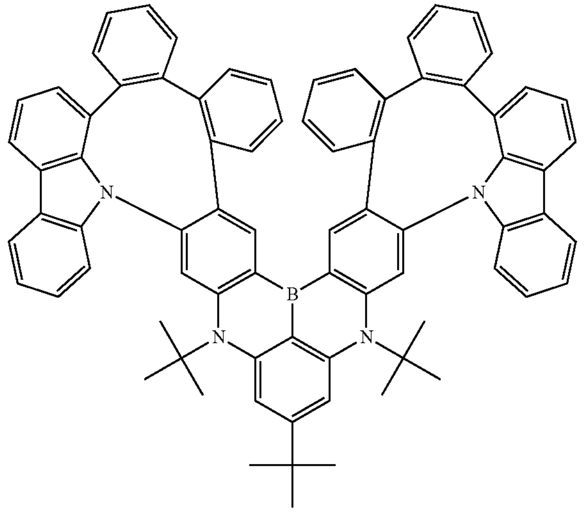
128
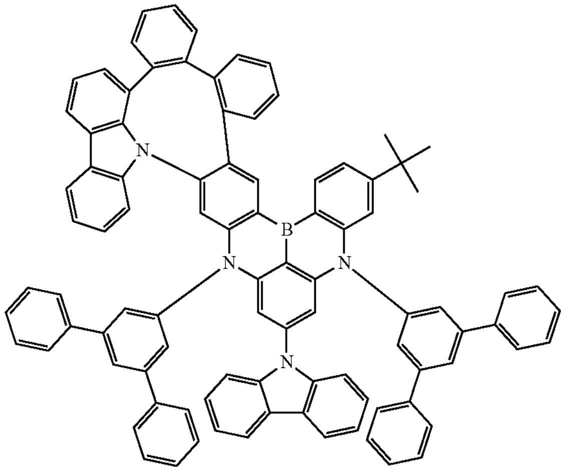
129
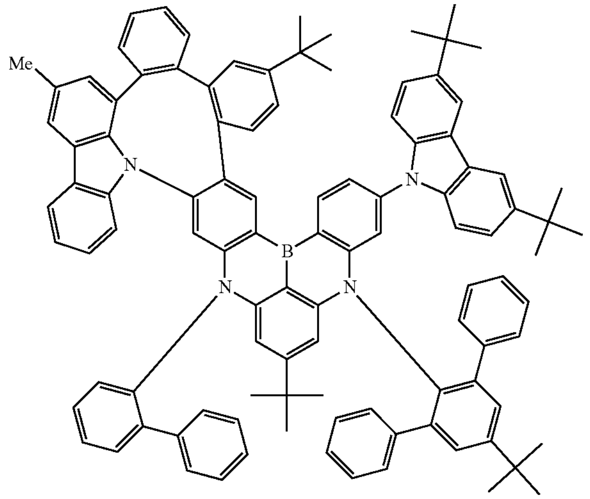

In one or more embodiments, in the compounds presented in Compound Group 1, "D" means a deuterium atom.

The fused polycyclic compound represented by Formula 1 according to one or more embodiments includes a structure in which the first substituent is introduced to the fused ring core at a specific position, and thus may achieve high luminous efficiency and long service life.

The fused polycyclic compound represented by Formula 1 of one or more embodiments may have a structure which includes the fused ring core in which the first to third aromatic rings are fused via the boron atom and the first and second nitrogen atoms, and in which the first heterocycle is linked to at least the first aromatic ring. The first heterocycle may include the biphenyl moiety linked at the meta-position with the boron atom of the fused ring core and the carbazole moiety inked to the para-position with the boron atom of the fused ring core. As the biphenyl moiety of the first heterocycle is linked to the carbazole moiety thereof, the fused polycyclic compound of one or more embodiments may have a structure in which an azonine moiety is fused at the fused ring core. Accordingly, the fused polycyclic compound of one or more embodiments may exhibit high luminous efficiency by having an increase in multiple resonance effects due to the first heterocycle.

In the polycyclic compound of one or more embodiments, the para position with the boron atom in the fused ring core is a position having a lower electron density than other carbon positions, and if the carbazole moiety of the first heterocycle having electron donor properties is substituted at said position, a highest occupied molecular orbital (HOMO) and a lowest unoccupied molecular orbital (LUMO) are sequentially separated, and thus multiple resonance effects may be enhanced. In addition, as the first heterocycle includes the azonine moiety having large steric hindrance, the fused polycyclic compound of one or more embodiments has an increase in the distance between adjacent molecules, and thus may suppress or reduce the Dexter energy transfer, thereby suppressing or reducing the deterioration of service life due to the increase of triplet concentration. In the fused polycyclic compound of one or more embodiments, although the azonine moiety having large steric hindrance is contained, the fused ring core structure responsible for luminescence transitions may not be distorted and the HOMO and the LUMO of the fused ring core structure may be maintained. Moreover, the fused polycyclic compound of one or more embodiments may have an increase in a compound stability effect by increasing the bonding force between the fused ring core and the carbazole moiety because the biphenyl moiety makes the carbazole moiety linked to the fused ring core. Accordingly, the dopant of one or more embodiments has a low AEST value and stabilized structure of the polycyclic aromatic ring, and thus may be selected so that the wavelength range is suitable as a blue luminescent material, and when the dopant is applied to the light emitting device ED, the efficiency of the light emitting device ED may be improved and the service life of the light emitting device ED may also be improved.

The fused polycyclic compound of one or more embodiments may be included in the emission layer EML. The fused polycyclic compound of one or more embodiments may be included as a dopant material in the emission layer EML. The fused polycyclic compound of one or more embodiments may be a thermally activated delayed fluorescence material. The fused polycyclic compound of one or more embodiments may be used as a thermally activated delayed fluorescence dopant. For example, in the light emitting device ED of one or more embodiments, the emission layer EML may include, as a thermally activated delayed fluorescence dopant, at least one selected from among the fused polycyclic compounds represented by Compound Group 1 as described above. However, a use of the fused polycyclic compound of one or more embodiments is not limited thereto.

In one or more embodiments, the emission layer EMIL may include a plurality of compounds. The emission layer EML of one or more embodiments may include the fused polycyclic compound represented by Formula 1, e.g., the first compound, and at least one selected from the second compound represented by Formula HT-1 below, the third compound represented by Formula ET-1 below, and the fourth compound represented by Formula D-1 below.

In one or more embodiments, the emission layer EML may include the second compound represented by Formula HT-1 below. In one or more embodiments, the second compound may be used as a hole transporting host material of the emission layer EML.

Formula HT-1

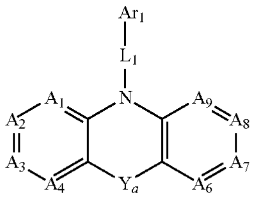

In Formula HT-1, $A_1$ to $A_9$ may be each independently N or $CR_{41}$. For example, all of $A_1$ to $A_9$ may be $CR_{41}$. In one or more embodiments, any one selected from among $A_1$ to $A_9$ may be N, and the rest may be $CR_{41}$.

In Formula HT-1, $L_1$ may be a direct linkage, a substituted or unsubstituted arylene group having 6 to 30 carbon atoms for forming a ring, or a substituted or unsubstituted heteroarylene group having 2 to 30 carbon atoms for forming a ring. For example, $L_1$ may be a direct linkage, a substituted or unsubstituted phenylene group, a substituted or unsubstituted divalent biphenyl group, a substituted or unsubstituted divalent carbazole group, etc., but embodiments of the present disclosure are not limited thereto.

In Formula HT-1, $Y_a$ may be a direct linkage, $CR_{42}R_{43}$, or $SiR_{44}R_{45}$. For example, it may mean that the two benzene rings linked to the nitrogen atom in Formula HT-1 are linked via a direct linkage,

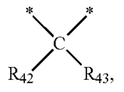

or

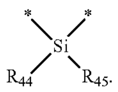

In Formula HT-1, when $Y_a$ is a direct linkage, the substituent represented by Formula HT-1 may include a carbazole moiety.

In Formula HT-1, $Ar_1$ may be a substituted or unsubstituted aryl group having 6 to 30 ring-forming carbon atoms, or a substituted or unsubstituted heteroaryl group having 2 to 30 ring-forming carbon atoms. For example, $Ar_1$ may be a substituted or unsubstituted carbazole group, a substituted or unsubstituted dibenzofuran group, a substituted or unsubstituted dibenzothiophene group, a substituted or unsubstituted biphenyl group, etc., but embodiments of the present disclosure are not limited thereto.

In Formula HT-1, $R_{41}$ to $R_{45}$ may be each independently a hydrogen atom, a deuterium atom, a halogen atom, a cyano group, a substituted or unsubstituted silyl group, a substituted or unsubstituted thio group, a substituted or unsubstituted oxy group, a substituted or unsubstituted amine group, a substituted or unsubstituted boron group, a substituted or unsubstituted alkyl group having 1 to 20 carbon atoms, a substituted or unsubstituted alkenyl group having 2 to 20 carbon atoms, a substituted or unsubstituted aryl group having 6 to 60 ring-forming carbon atoms, or a substituted or unsubstituted heteroaryl group having 2 to 60 ring-forming carbon atoms. In one or more embodiments, each of $R_{41}$ to $R_{45}$ may be bonded to an adjacent group to form a ring. For example, $R_{41}$ to $R_{45}$ may be each independently a hydrogen atom or a deuterium atom. $R_{41}$ to $R_{45}$ may be each independently an unsubstituted methyl group or an unsubstituted phenyl group.

In one or more embodiments, the second compound represented by Formula HT-1 may be represented by any one selected from among the compounds represented by Compound Group 2 below. The emission layer EML may include at least one selected from among the compounds represented by Compound Group 2 as a hole transporting host material.

Compound Group 2

HT1

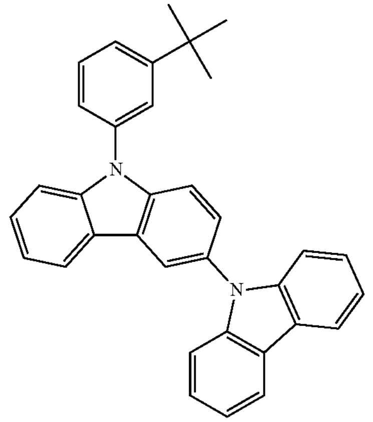

HT2

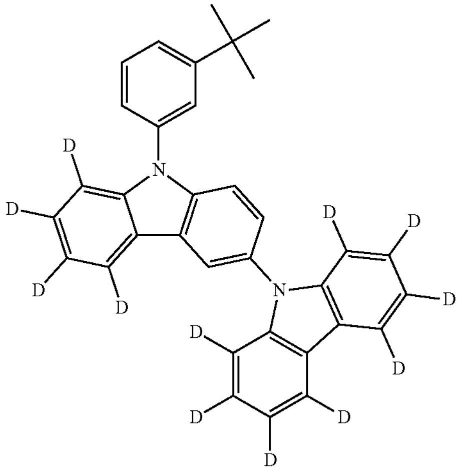

-continued

HT3

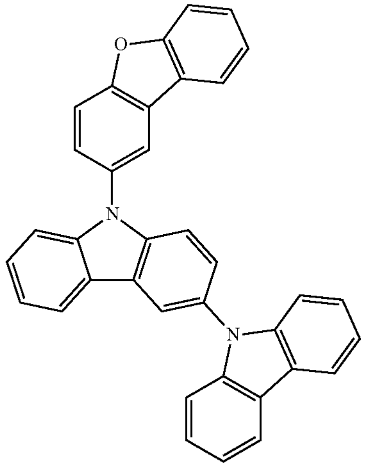

HT4

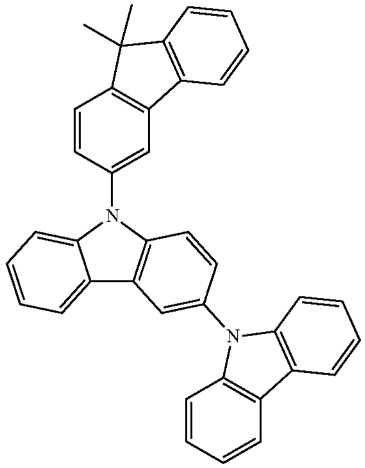

HT5

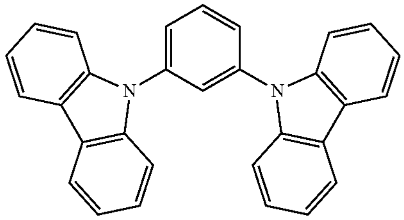

HT6

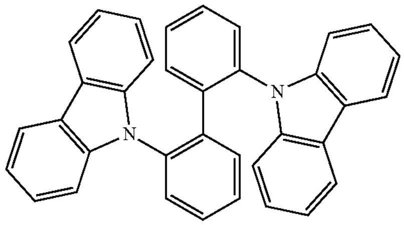

HT7
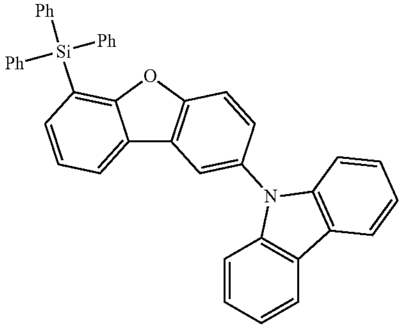
HT8
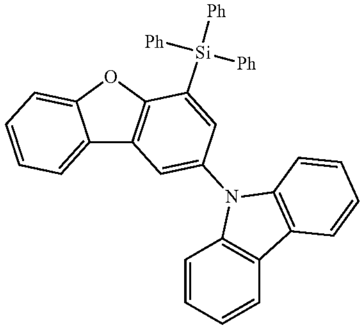
HT9
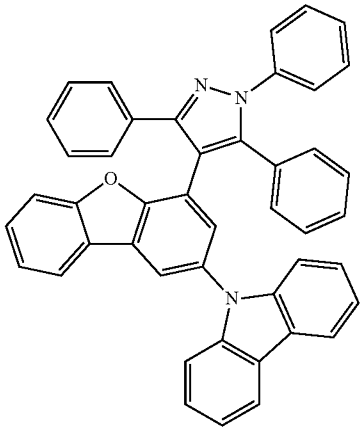
HT10
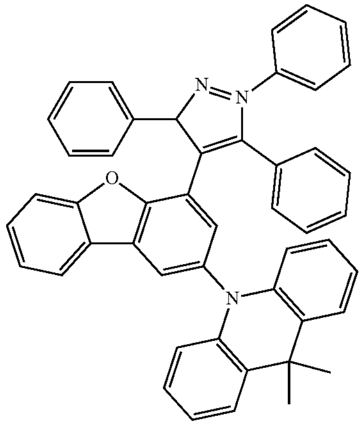
HT11
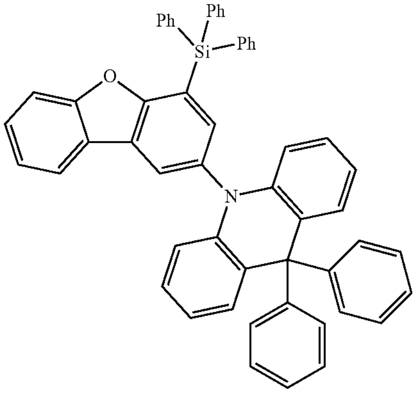
HT12
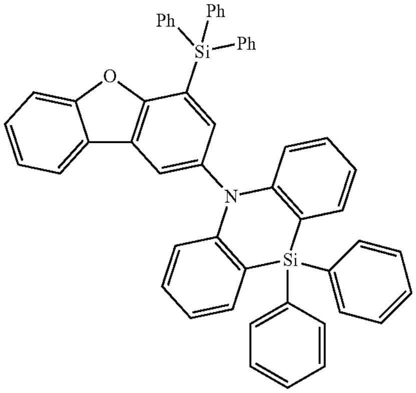
HT13
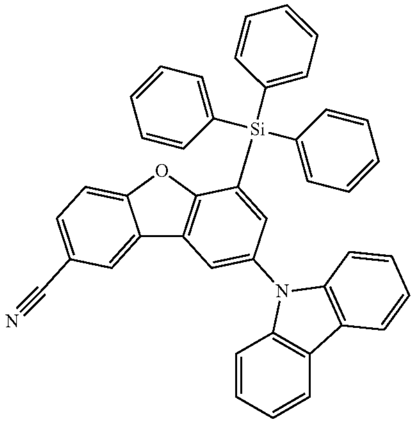
HT14
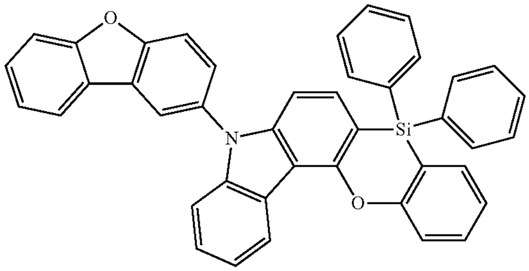

HT15
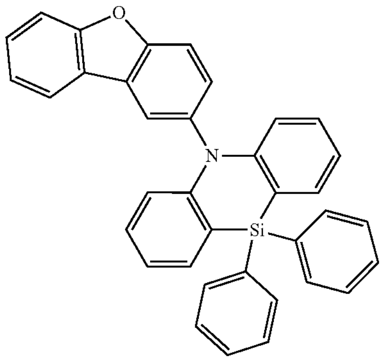
HT16
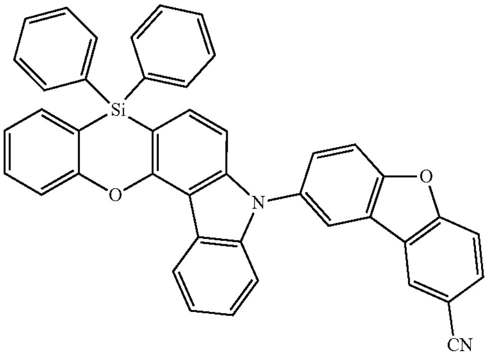
HT17
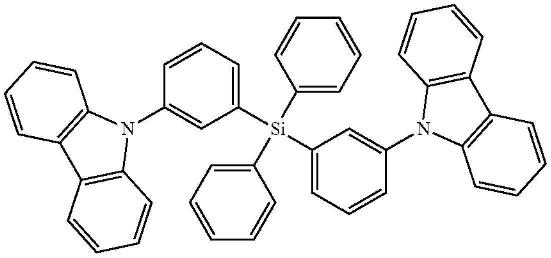
HT18
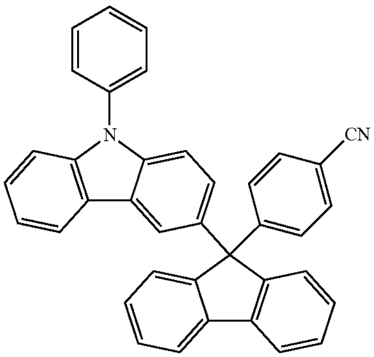
HT19
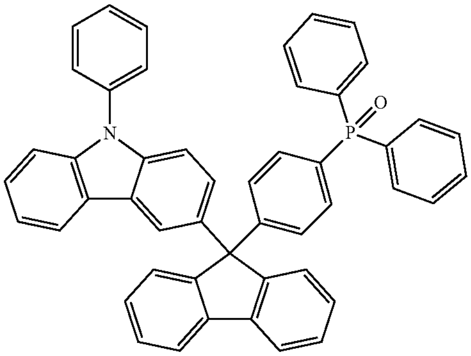
HT20
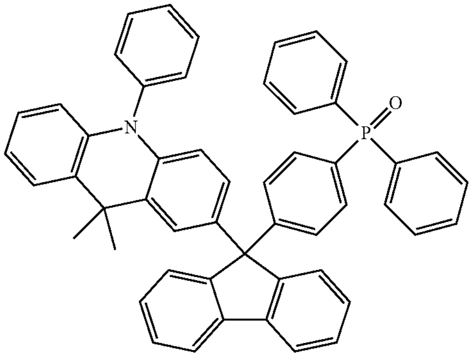
HT21
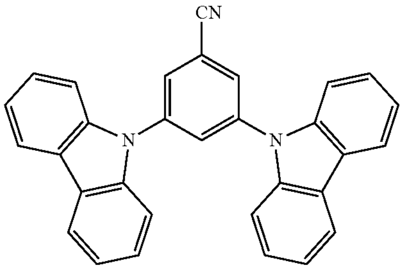
HT22
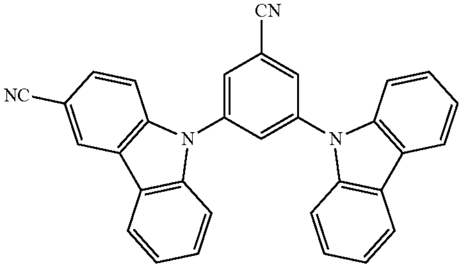
HT23
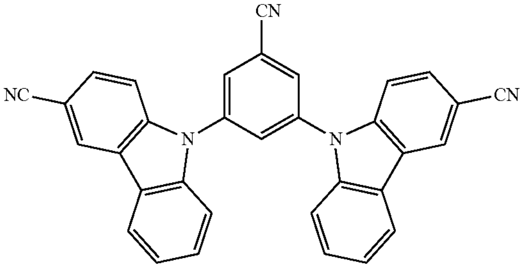

-continued
HT24
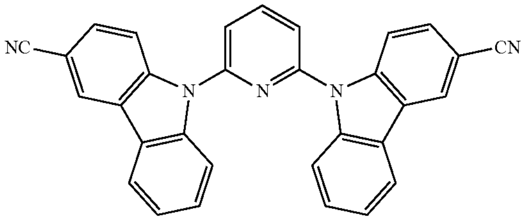
HT25
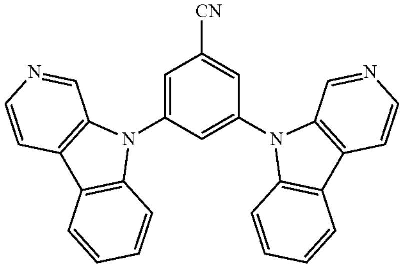
HT26
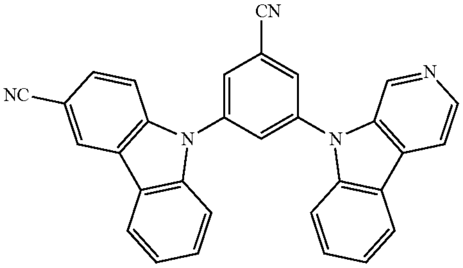
HT27
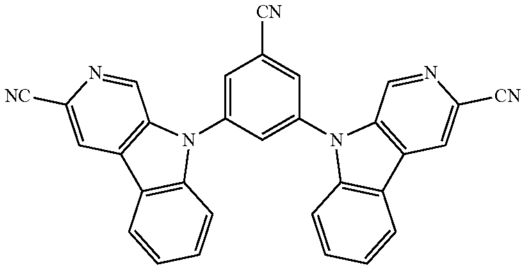
HT28
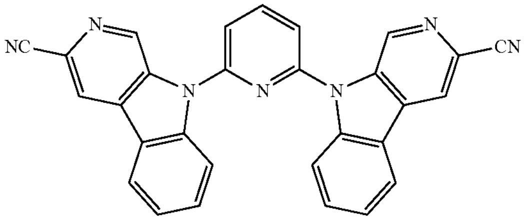
HT29
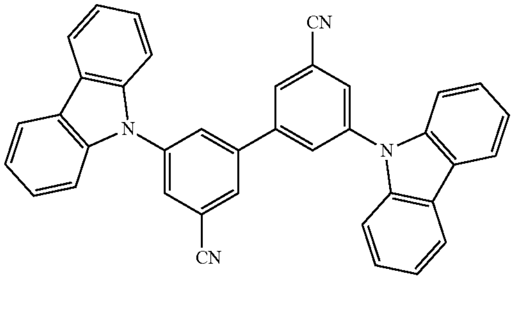
-continued
HT30
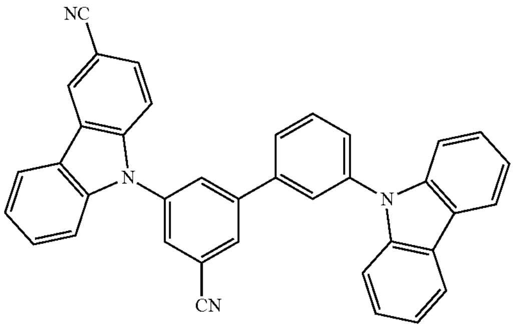
HT31
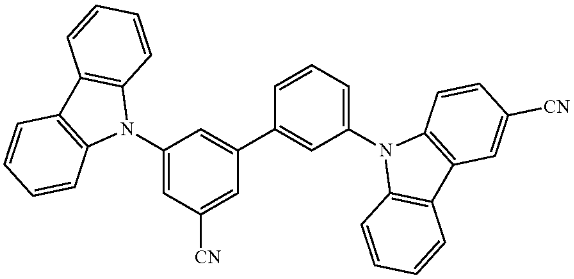
HT32
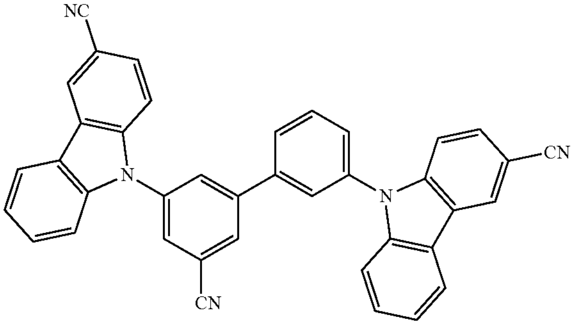
HT33
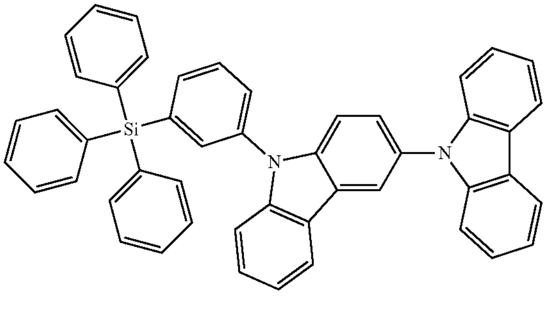

-continued
HT34
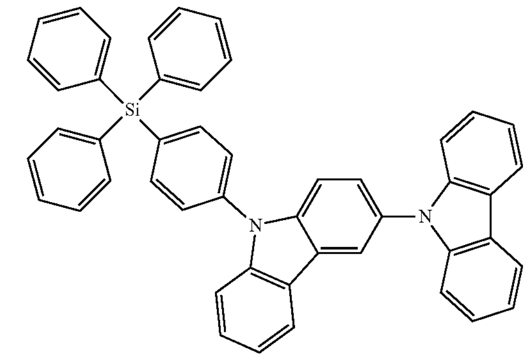
HT35
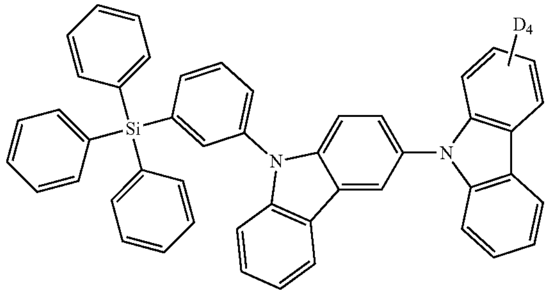
HT36
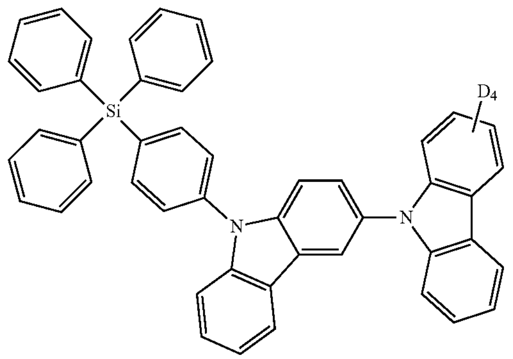
HT37
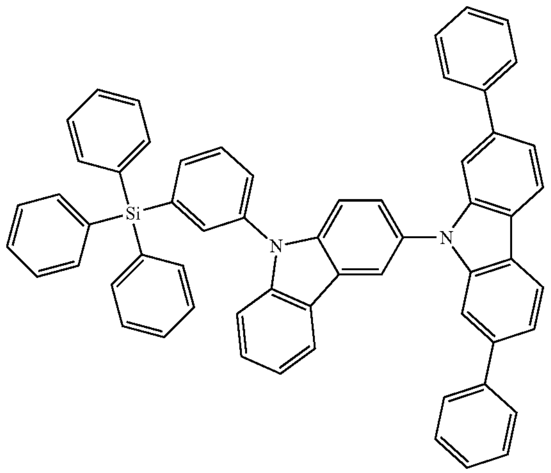
-continued
HT38
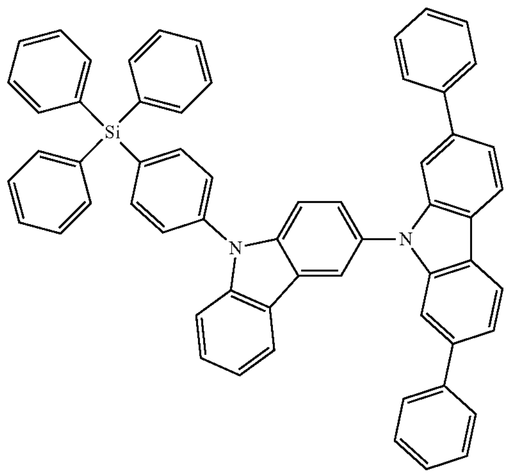
HT39
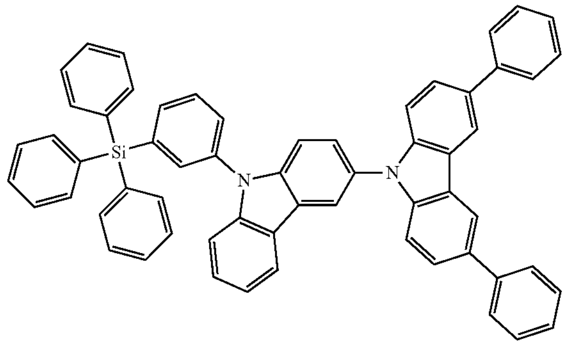
HT40
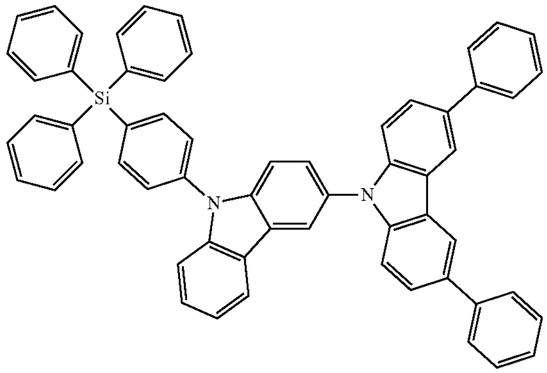
HT41
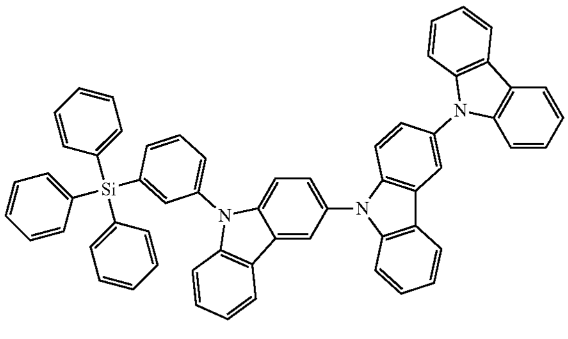

-continued
HT42
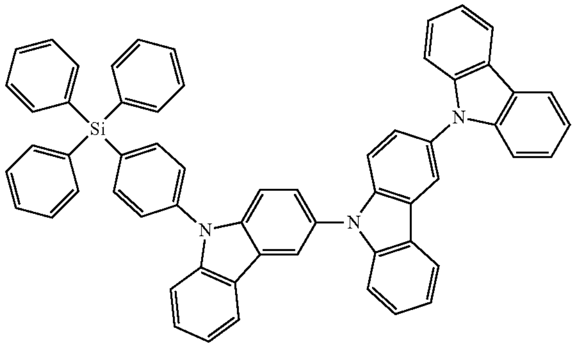
HT43
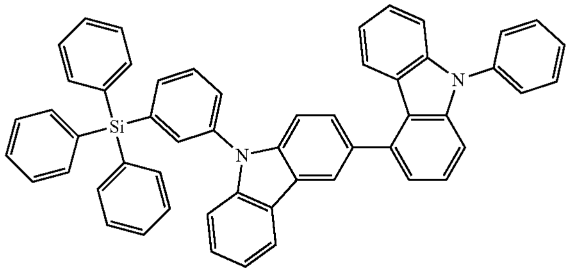
HT44
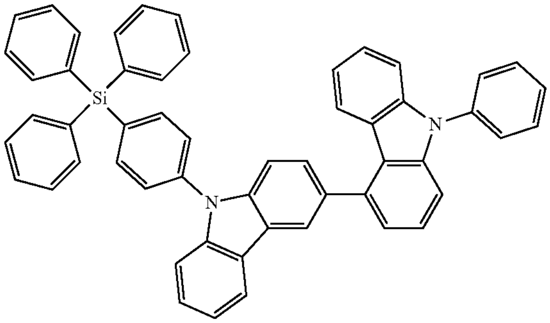
HT45
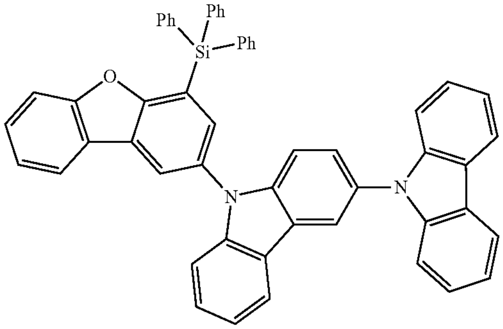
-continued
HT46
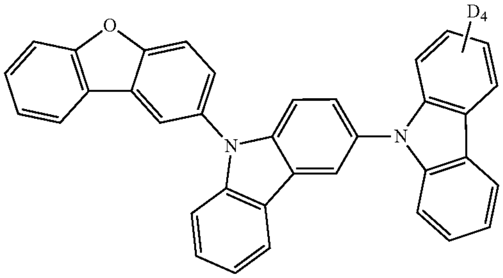
HT47
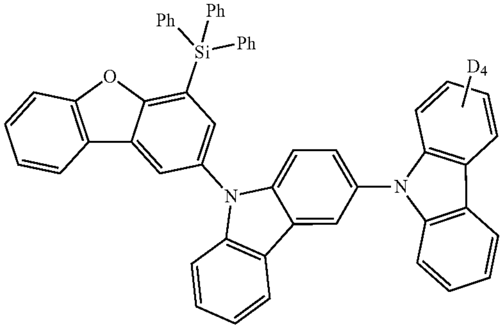
HT48
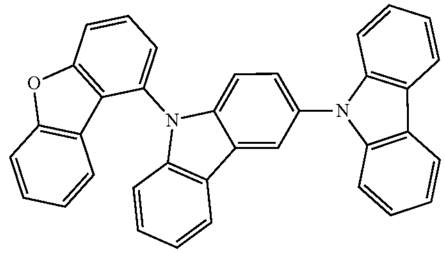
HT49
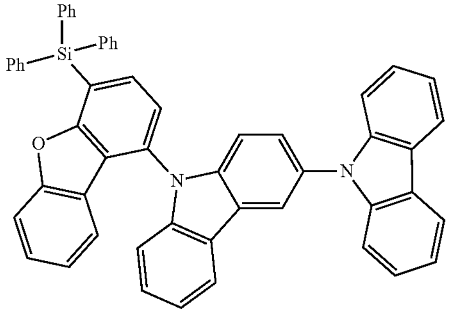
HT50
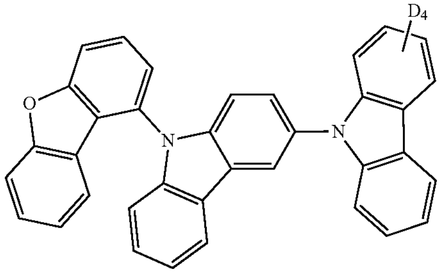

-continued
HT51
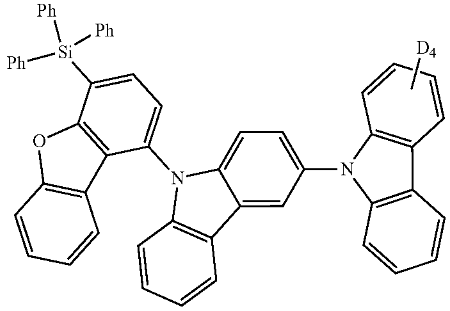
HT52
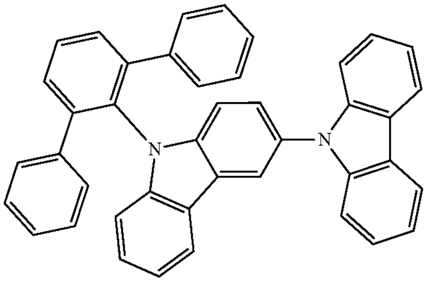
HT53
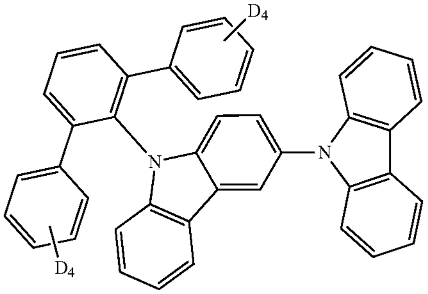
HT54
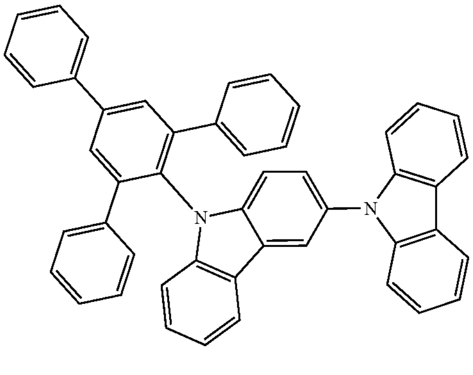
-continued
HT55
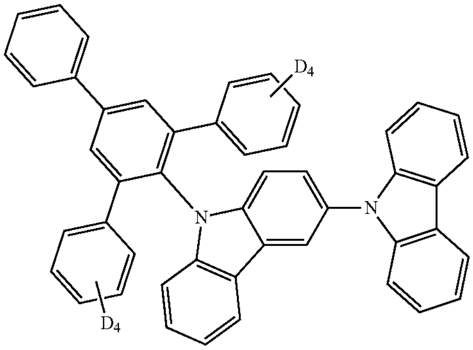
HT56
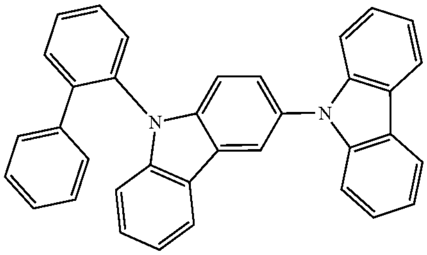
HT57
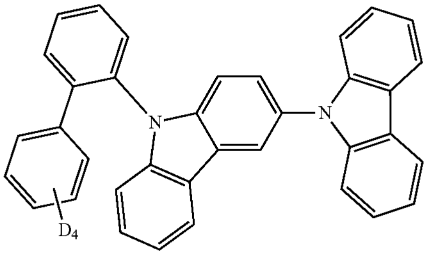
HT58
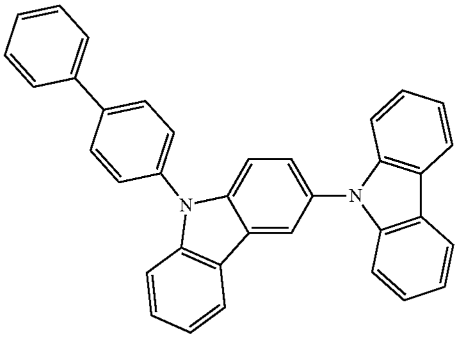
HT59
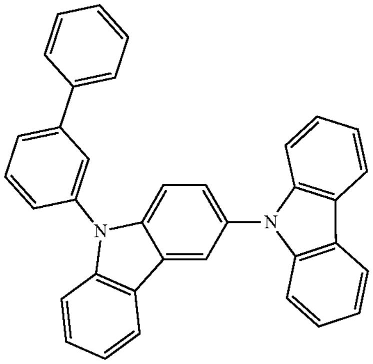

In embodiment compounds presented in Compound Group 2, "D" may mean a deuterium atom, and "Ph" may mean an unsubstituted phenyl group.

In one or more embodiments, the emission layer EM may include the third compound represented by Formula ET-1 below. For example, the third compound may be used as an electron transport host material for the emission layer EML.

Formula ET-1

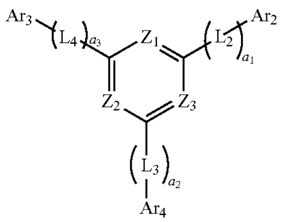

In Formula ET-1, at least one selected from among $Z_1$ to $Z_3$ may be N, and the rest may be $CR_{a3}$, and $R_{a3}$ may be a hydrogen atom, a deuterium atom, a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms.

$a_1$ to $a_3$ are each independently an integer of 0 to 10.

$L_2$ to $L_4$ may be each independently a direct linkage, a substituted or unsubstituted arylene group having 6 to 30 ring-forming carbon atoms, or a substituted or unsubstituted heteroarylene group having 2 to 30 ring-forming carbon atoms. In one or more embodiments, when each of $a_1$ to $a_3$ is an integer of 2 or greater, $L_2$ to $L_4$ may be each independently a substituted or unsubstituted arylene group having 6 to 30 ring-forming carbon atoms, or a substituted or unsubstituted heteroarylene group having 2 to 30 ring-forming carbon atoms.

$Ar_2$ to $Ar_4$ may be each independently a hydrogen atom, a deuterium atom, a substituted or unsubstituted alkyl group having 1 to 20 carbon a oms, a substituted or unsubstituted aryl group having 6 to 30 ring-forming carbon atoms, or a substituted or unsubstituted heteroaryl group having 2 to 30 ring-forming carbon atoms. For example, $Ar_2$ to $Ar_4$ may be each independently a substituted or unsubstituted phenyl group, or a substituted or unsubstituted carbazole group.

The third compound may be represented by any one selected from among the compounds in Compound Group 3 below. The light emitting device ED of one or more embodiments may include any one selected from among the compounds in Compound Group 3 below.

Compound Group 3

ETH1

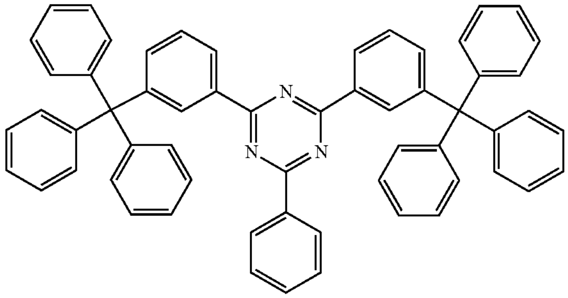

-continued

ETH2

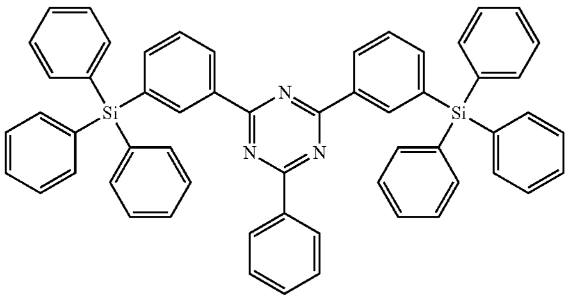

ETH3

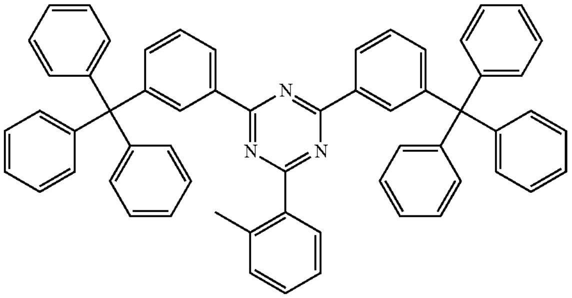

ETH4

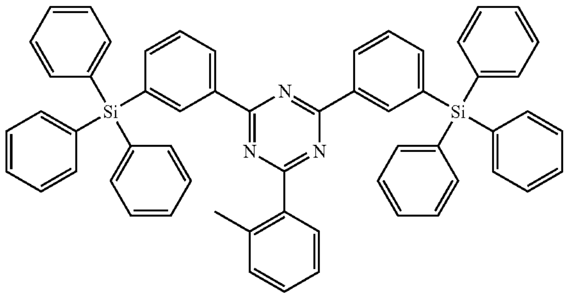

ETH5

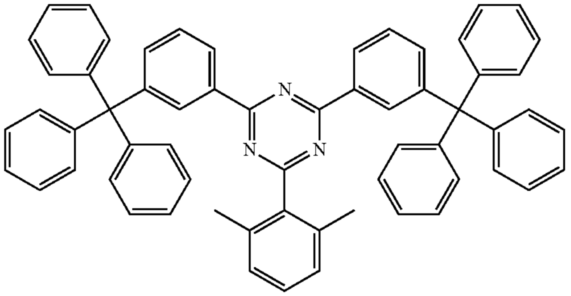

ETH6

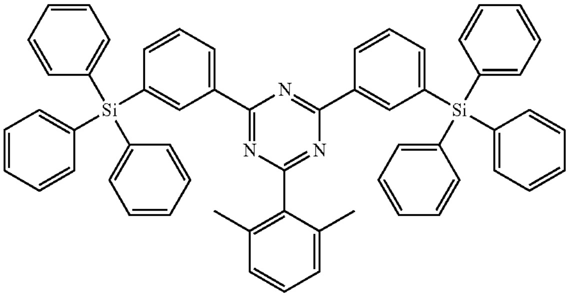

ETH7
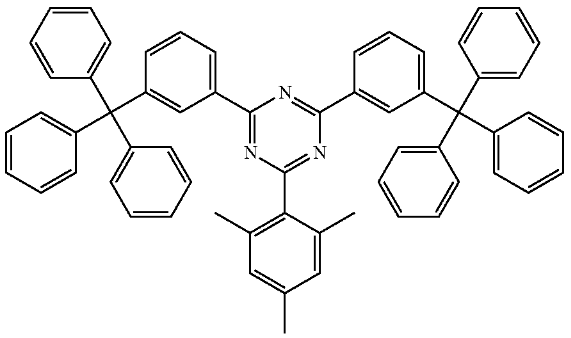
ETH8
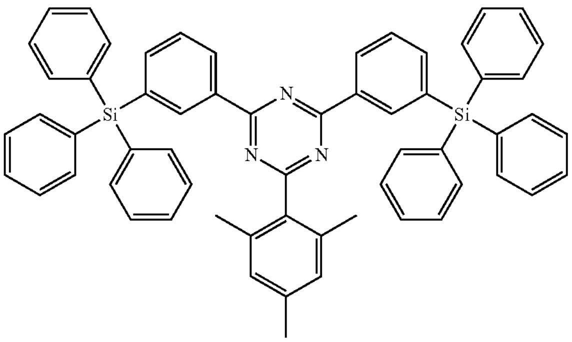
ETH9
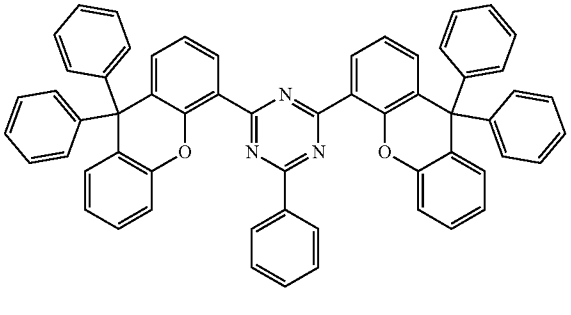
ETH10
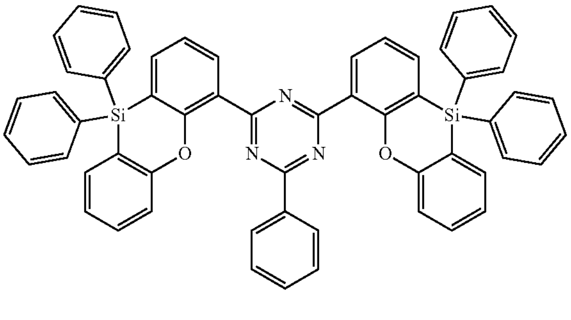
ETH11
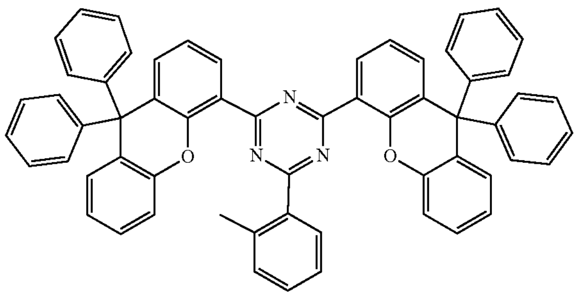
ETH12
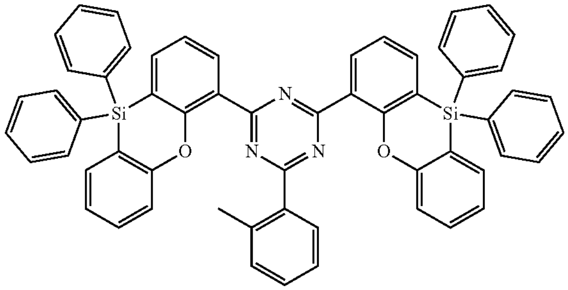
ETH13
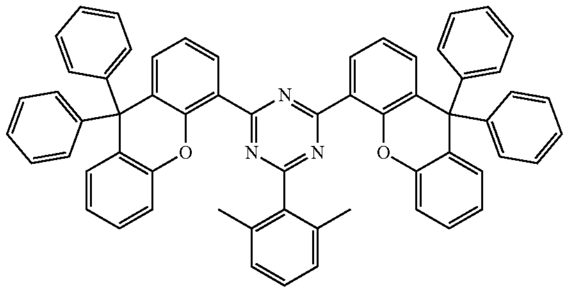
ETH14
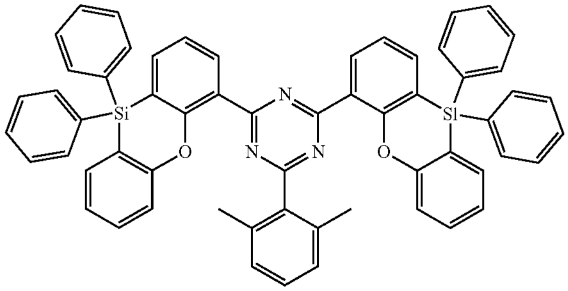
ETH15
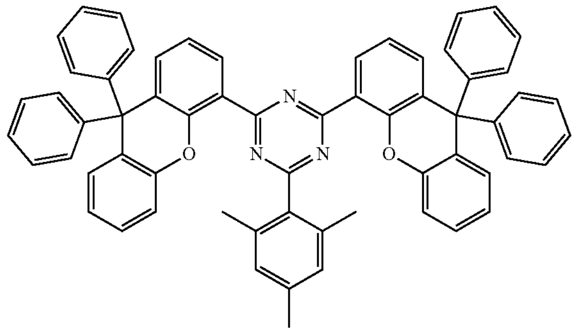

-continued
ETH16
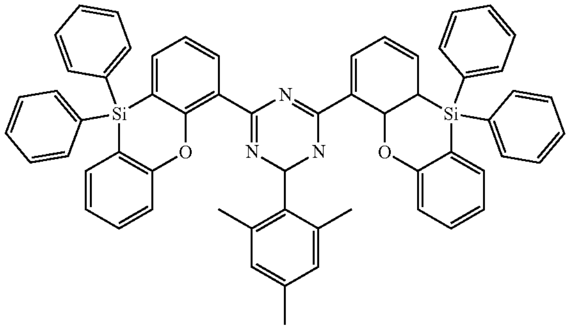
ETH17
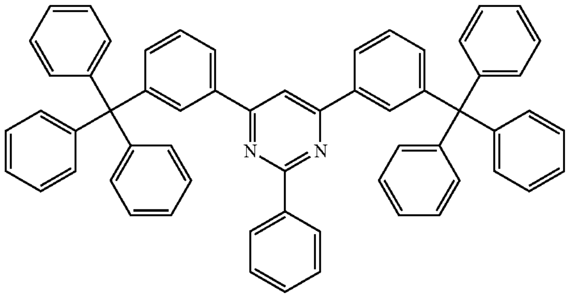
ETH18
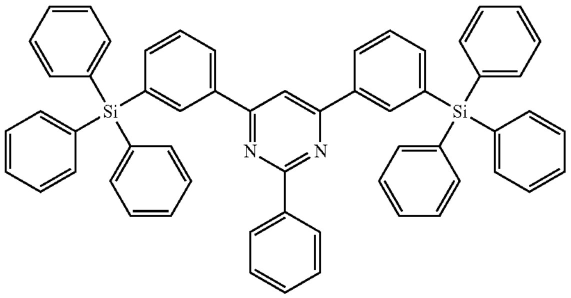
ETH19
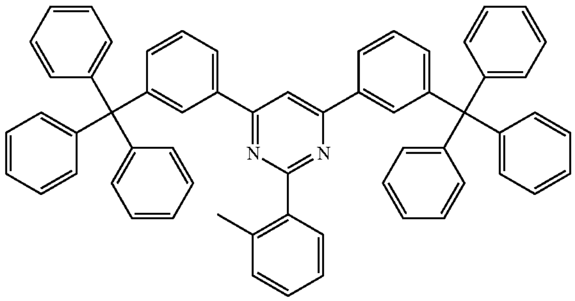
ETH20
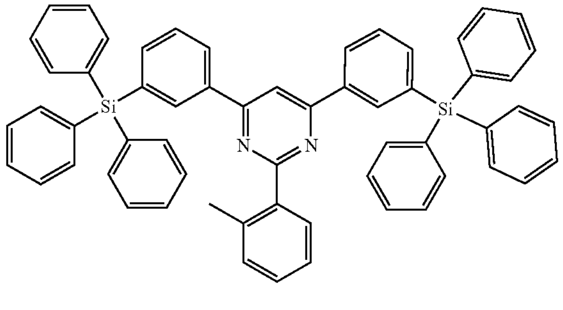
-continued
ETH21
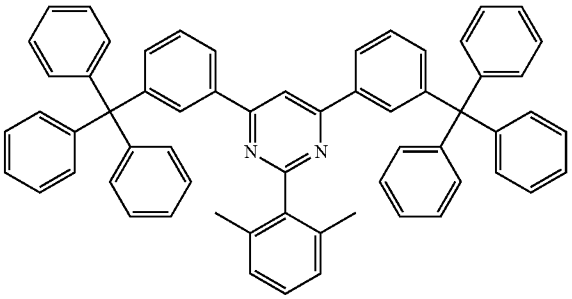
ETH22
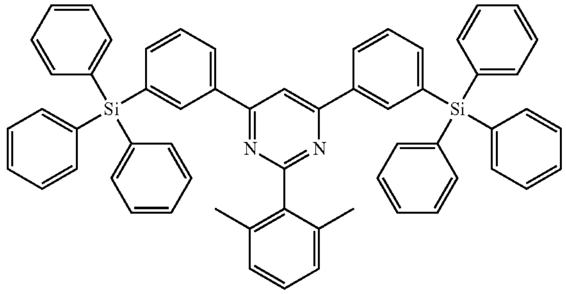
ETH23
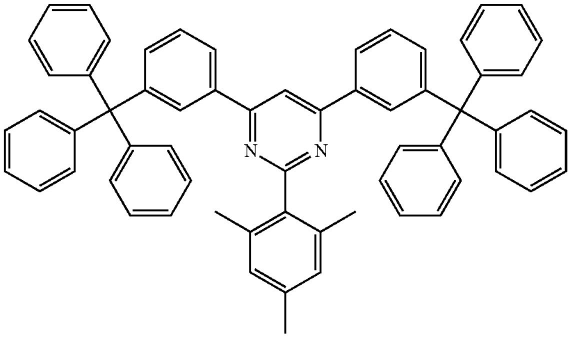
ETH24
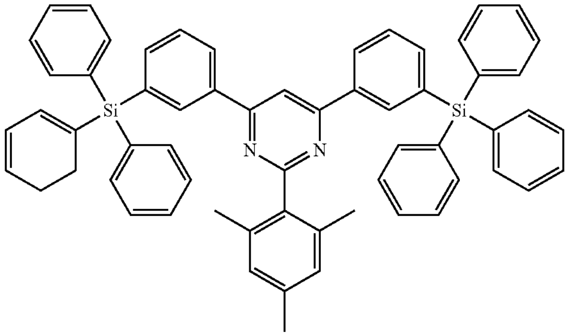

-continued
ETH25
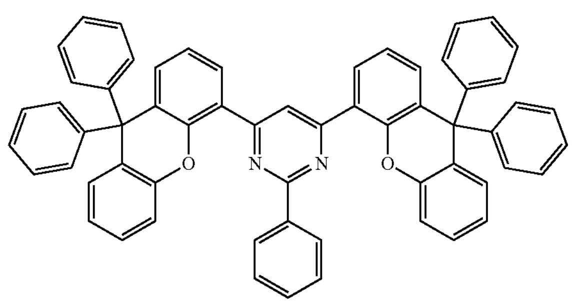
ETH26
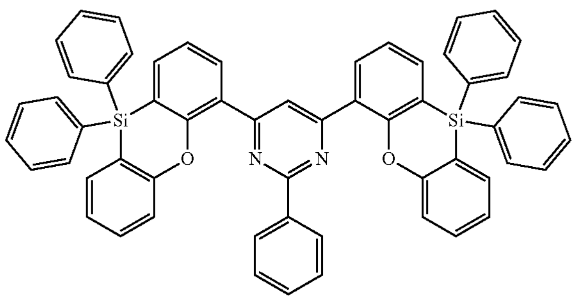
ETH27
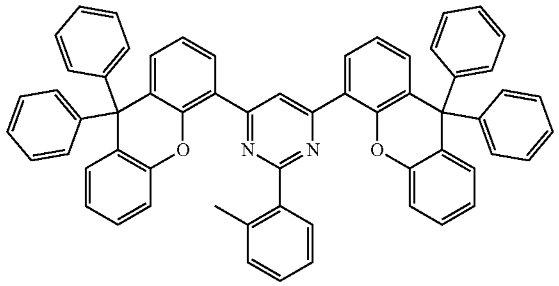
ETH28
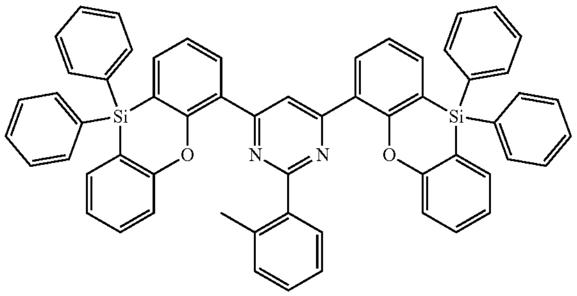
ETH29
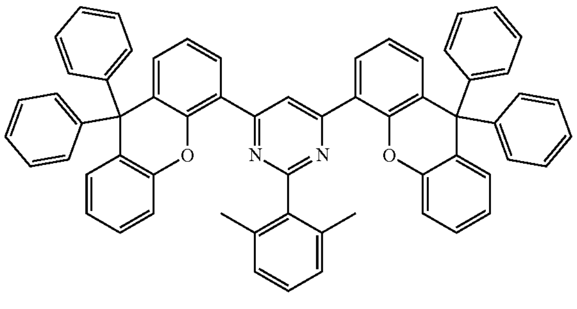
-continued
ETH30
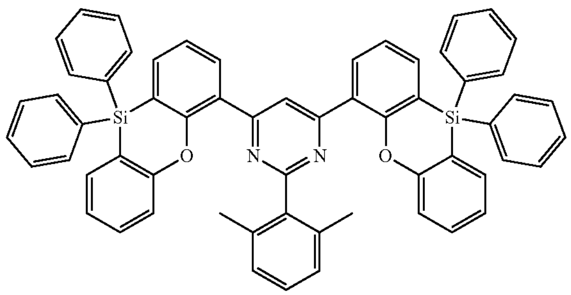
ETH31
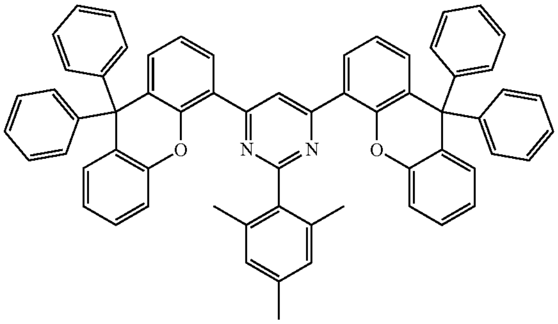
ETH32
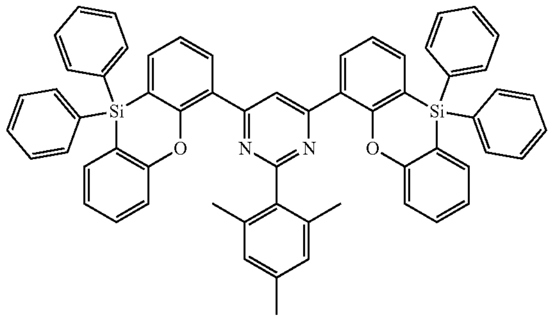
ETH33
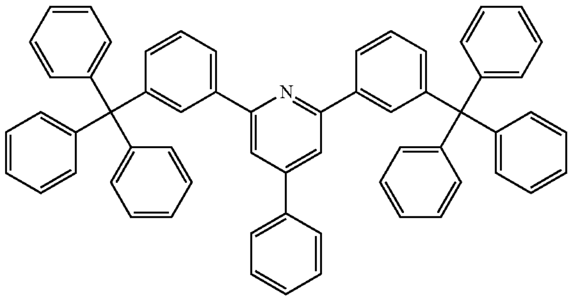
ETH34
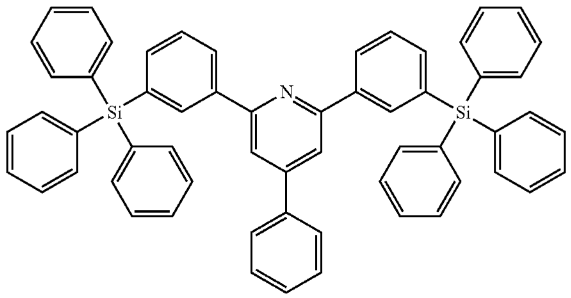

-continued
ETH35
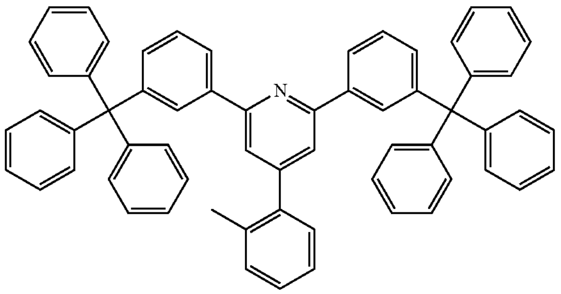
ETH36
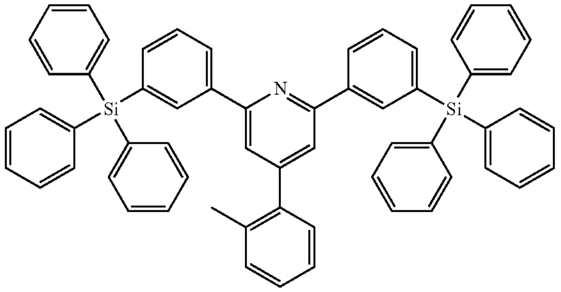
ETH37
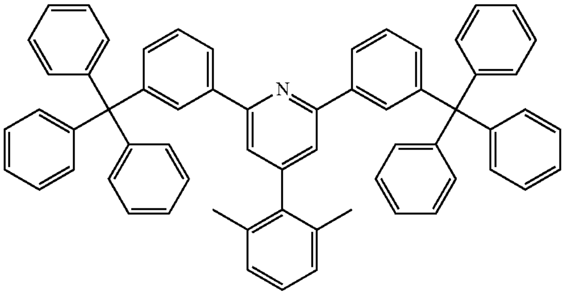
ETH38
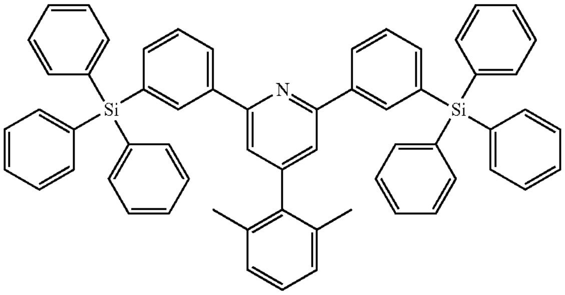
ETH39
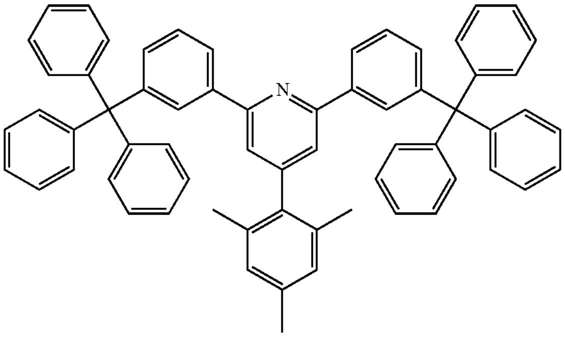
-continued
ETH40
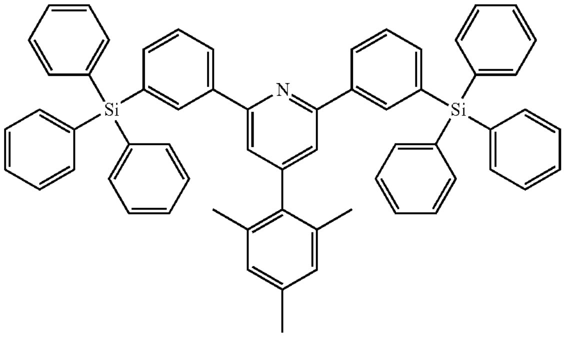
ETH41
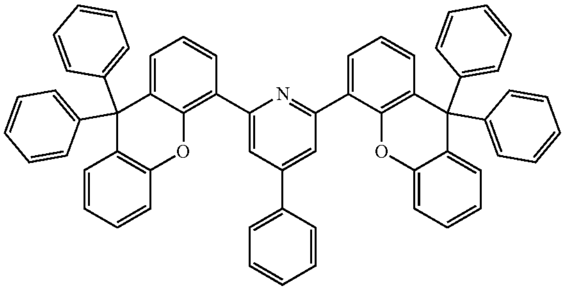
ETH42
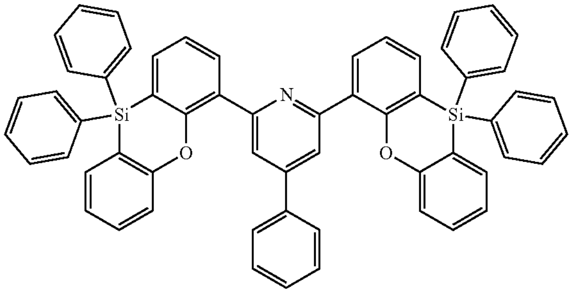
ETH43
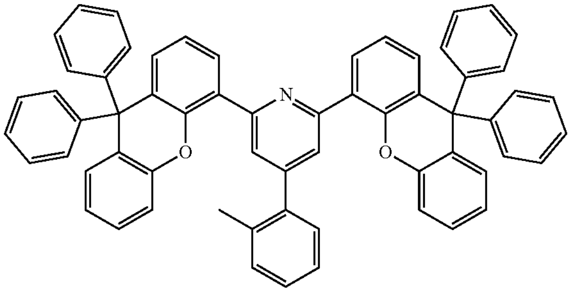
ETH44
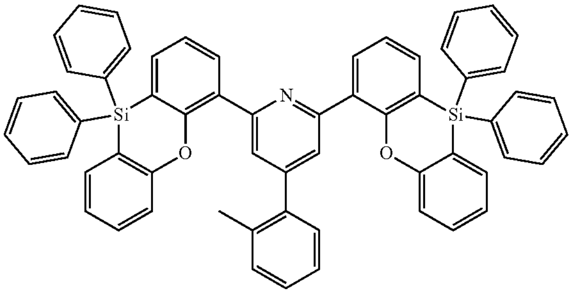

-continued
ETH45
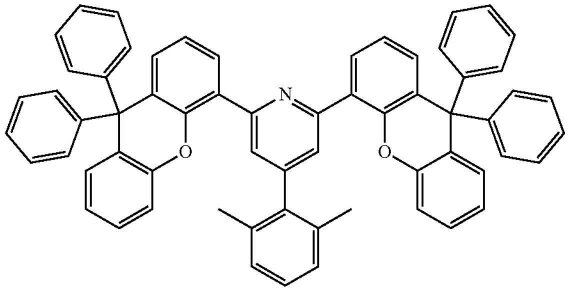
ETH46
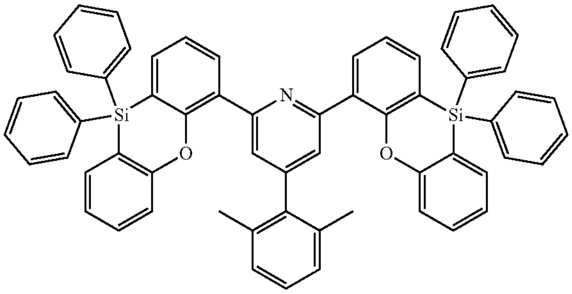
ETH47
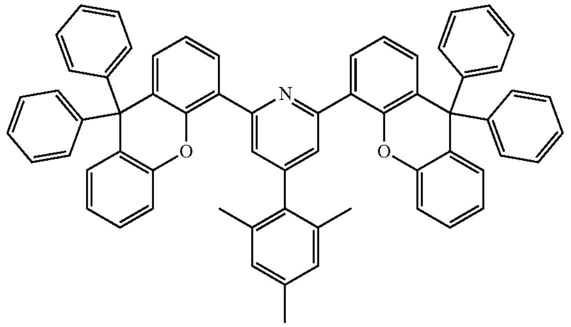
ETH48
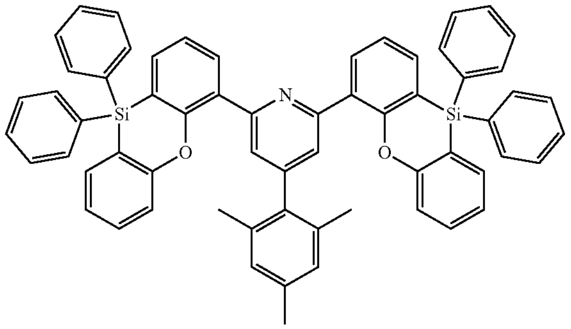
-continued
ETH49
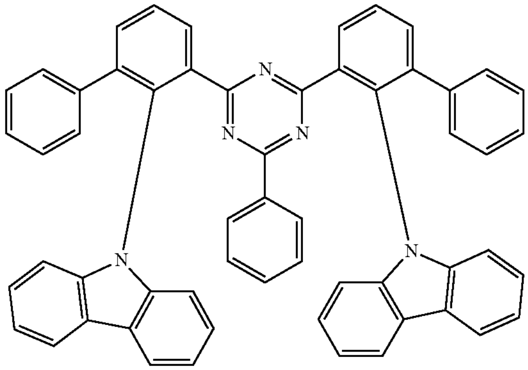
ETH50
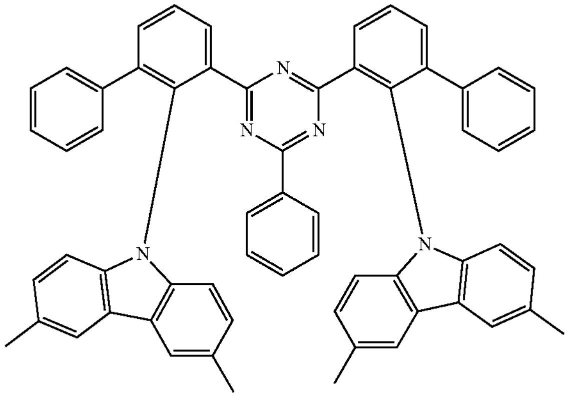
ETH51
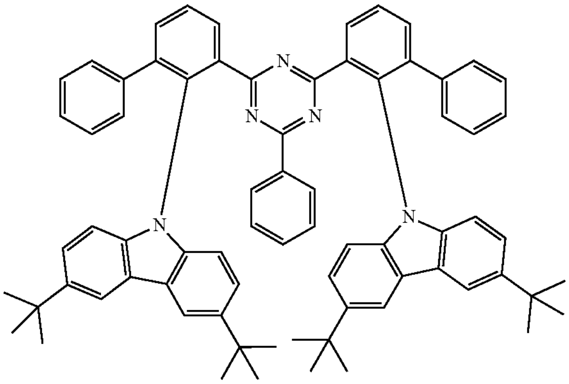
ETH52
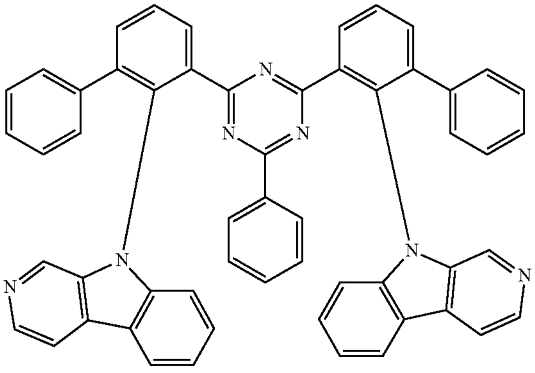

ETH53
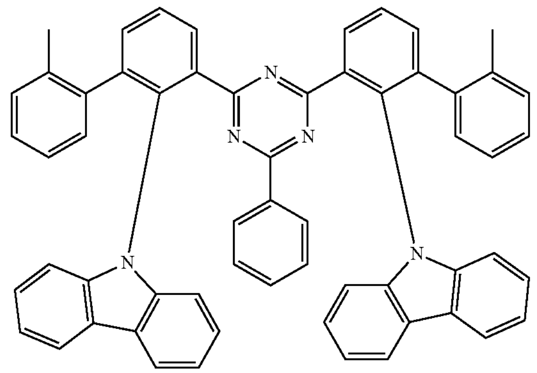
ETH54
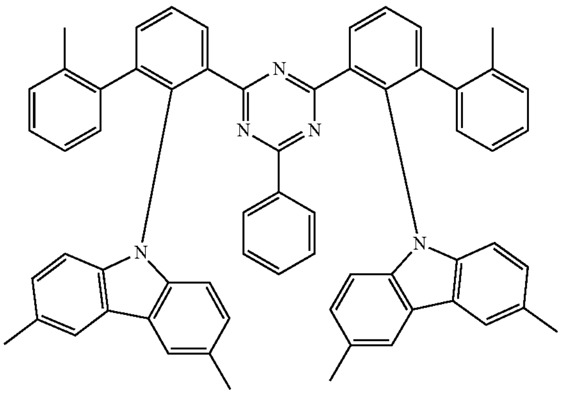
ETH55
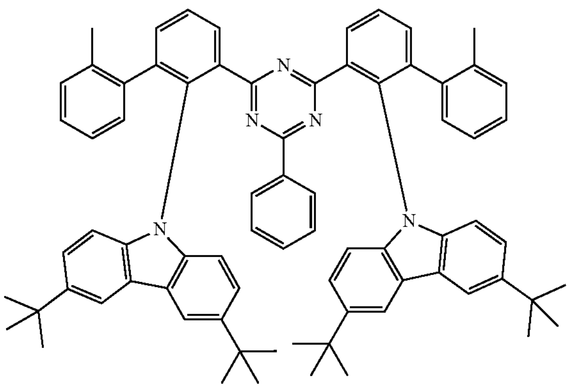
ETH56
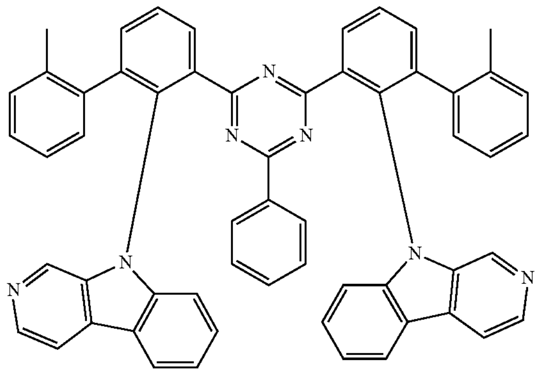
ETH57
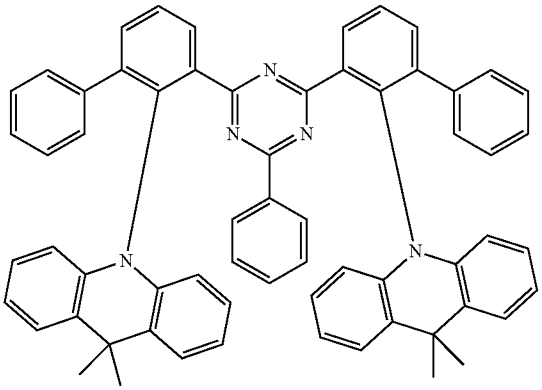
ETH58
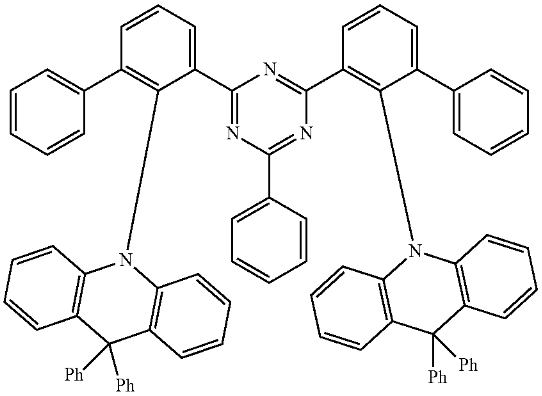
ETH59
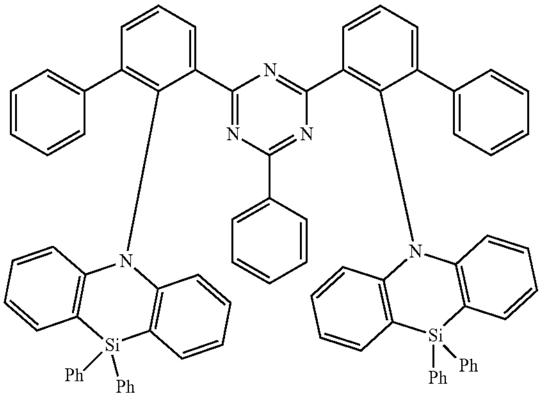

-continued
ETH60
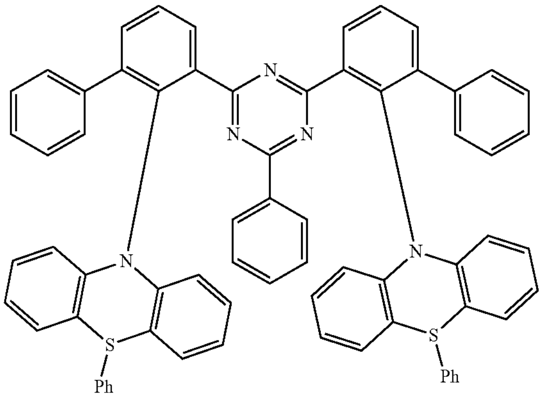
ETH61
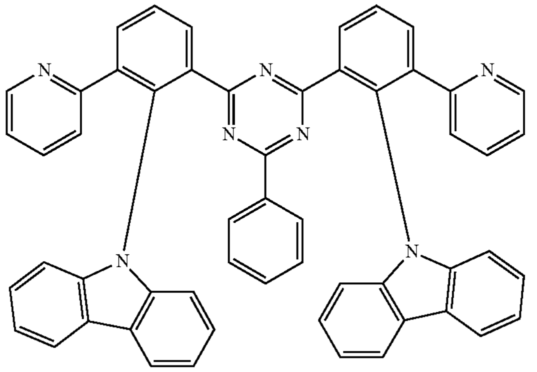
ETH62
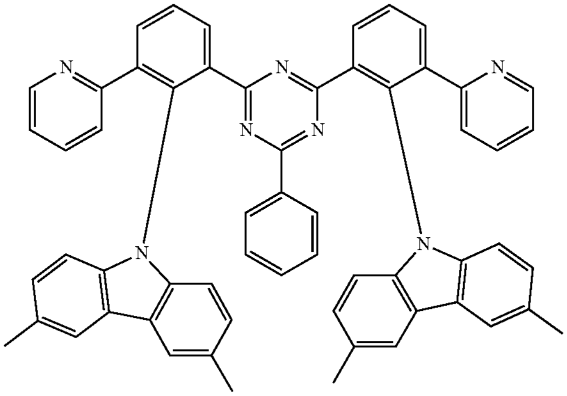
ETH63
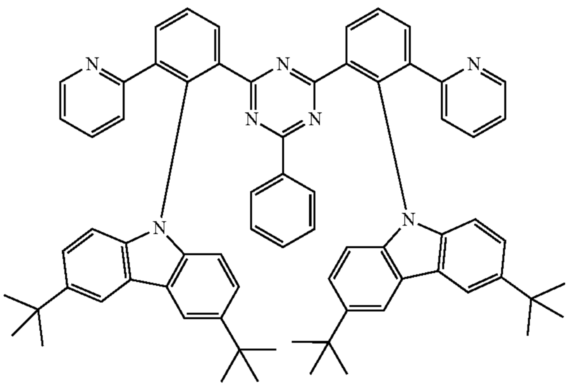
-continued
ETH64
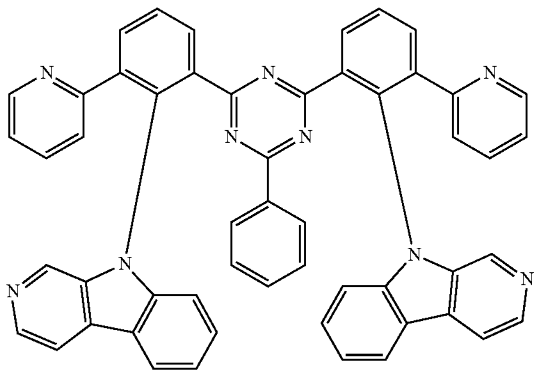
ETH65
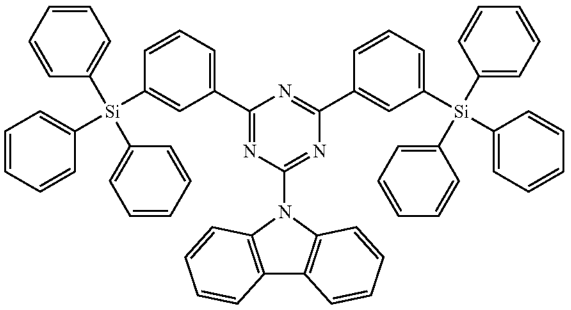
ETH66
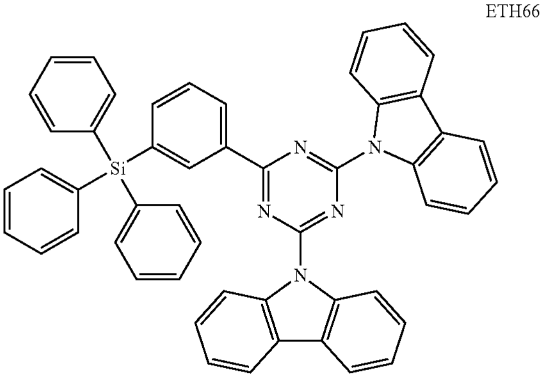
ETH67
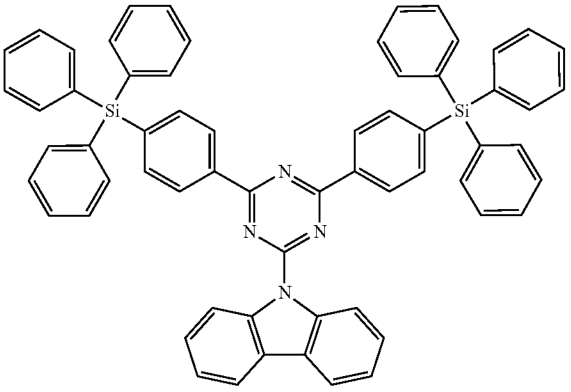

-continued
ETH68
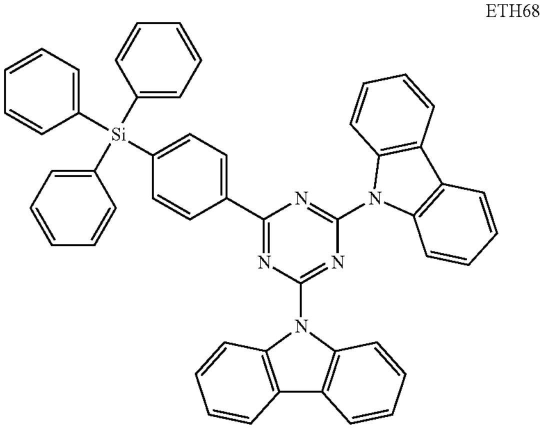
ETH69
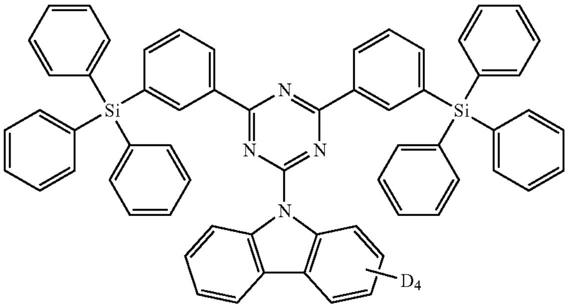
ETH70
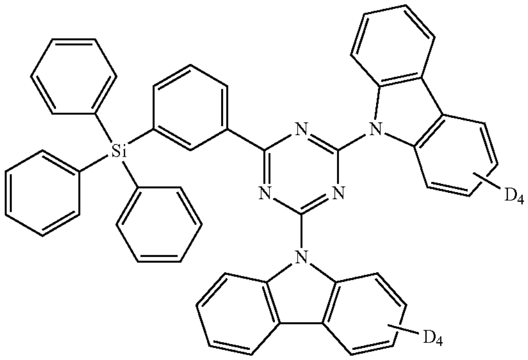
ETH71
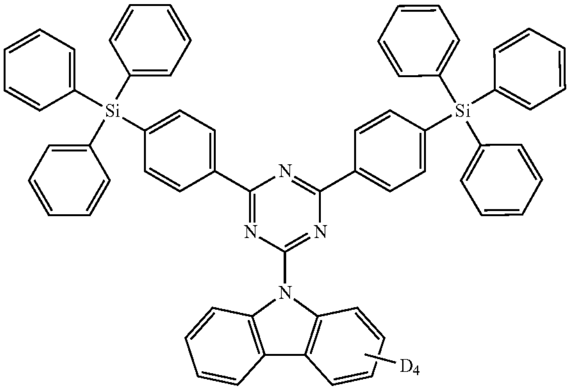
-continued
ETH72
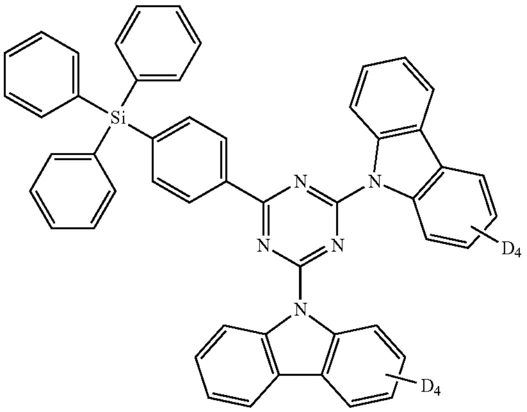
ETH73
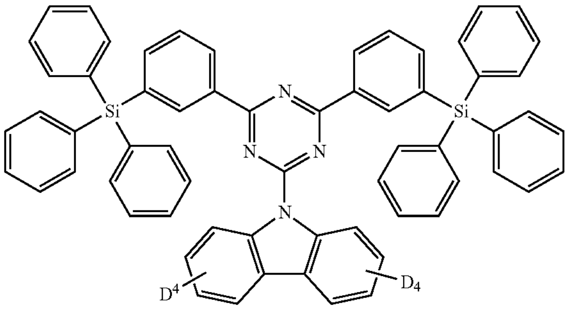
ETH74
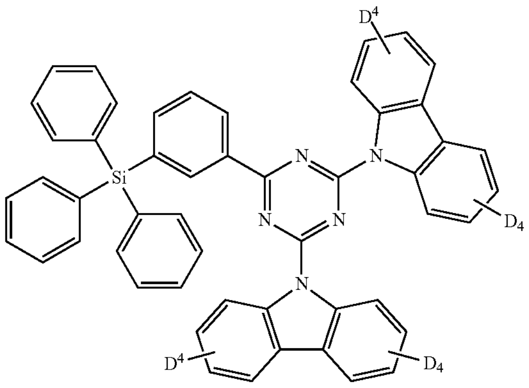
ETH75
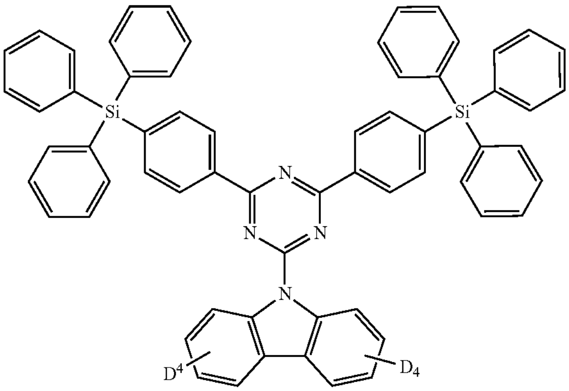

-continued
ETH76
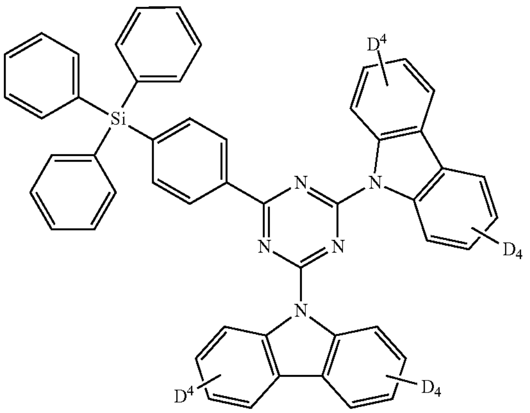
ETH77
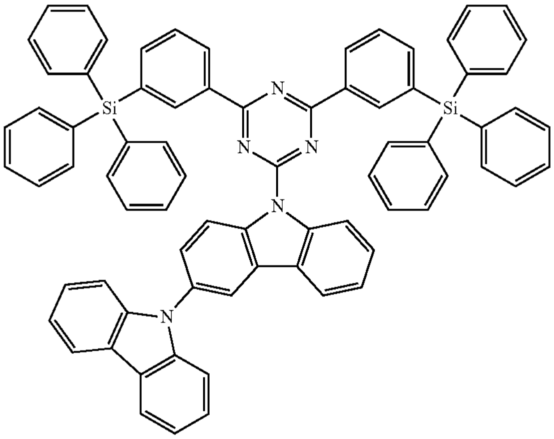
ETH78
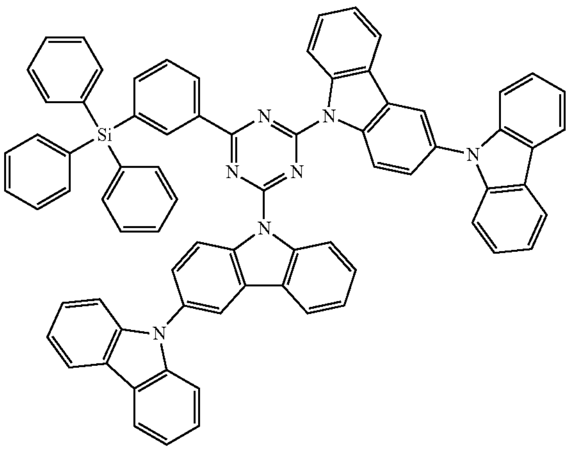
-continued
ETH79
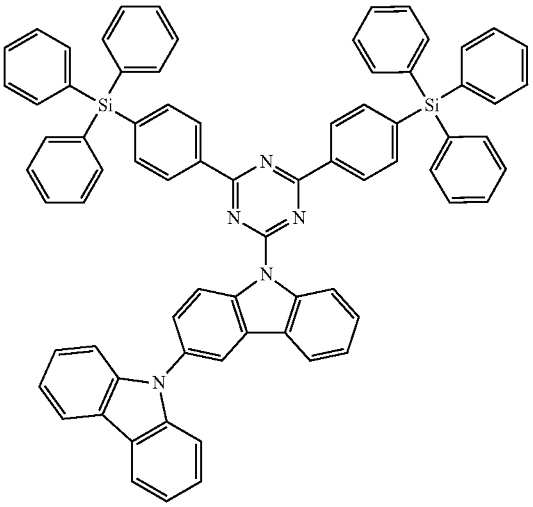
ETH80
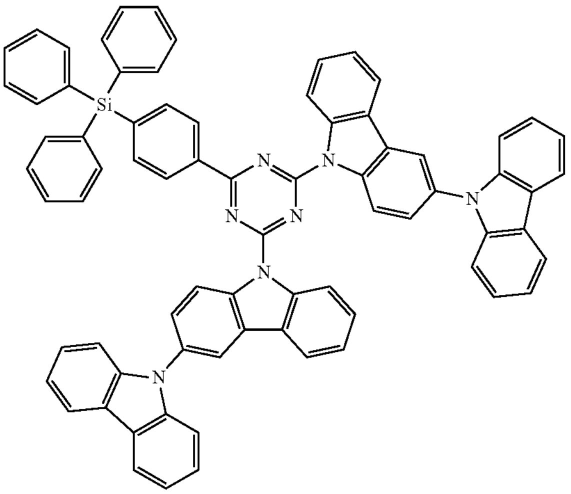
ETH81
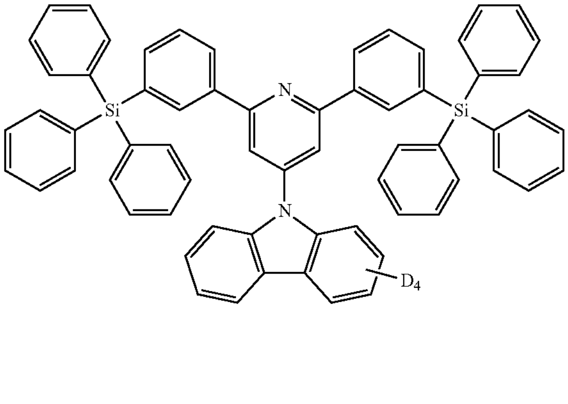

-continued

ETH82

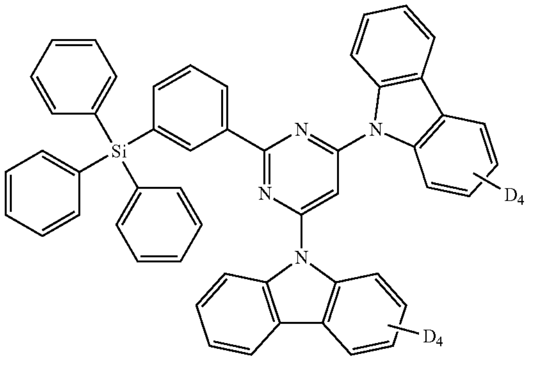

ETH83

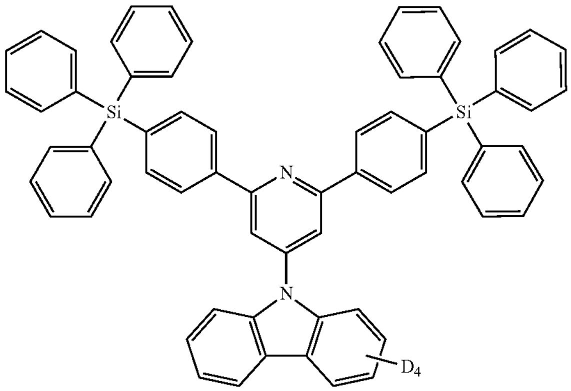

ETH84

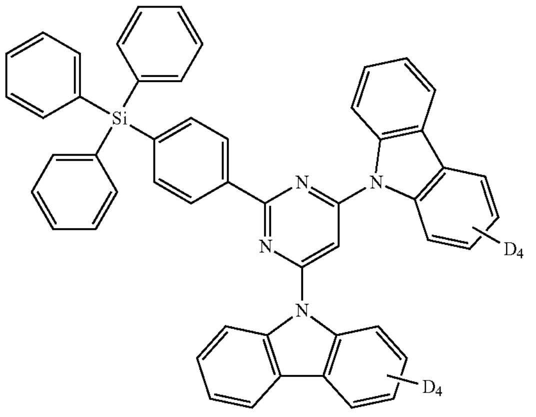

ETH85

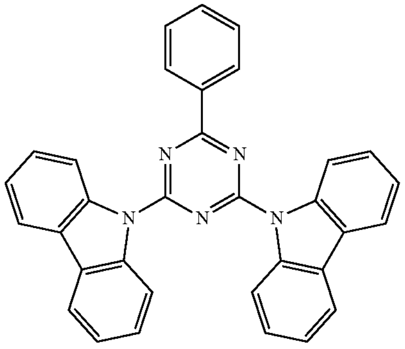

-continued

ETH86

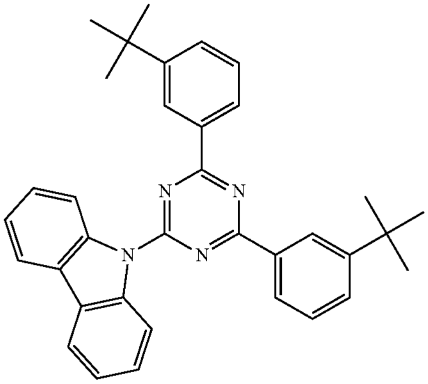

In one or more embodiments compounds presented in Compound Group 3, "D" refers to a deuterium atom and "Ph" refers to an unsubstituted phenyl group.

The emission layer EML may include the second compound and the third compound, and the second compound and the third compound may form an exciplex. In the emission layer EML, an exciplex may be formed by the hole transport host and the electron transport host. In this case, a triplet energy of the exciplex formed by the hole transporting host and the electron transporting host may correspond to the difference between a lowest unoccupied molecular orbital (LUMO) energy level of the electron transporting host and a highest occupied molecular orbital (HOMO) energy level of the hole transporting host.

For example, the absolute value of the triplet energy (T1) of the exciplex formed by the hole transporting host and the electron transporting host may be about 2.4 eV to about 3.0 eV. In addition, the triplet energy of the exciplex may be a value smaller than an energy gap of each host material. The exciplex may have a triplet energy of about 3.0 eV or less that is an energy gap between the hole transporting host and the electron transporting host.

In one or more embodiments, the emission layer EML may include a fourth compound in addition to the first compound to the third compound. The fourth compound may be used as a phosphorescent sensitizer of the emission layer EML. The energy may be transferred from the fourth compound to the first compound, thereby emitting light.

For example, the emission layer EML may include, as the fourth compound, an organometallic complex containing platinum (Pt) as a central metal atom and ligands linked to the central metal atom. The emission layer EML in the light emitting device ED of one or more embodiments may include, as the fourth compound, a compound represented by Formula D-1 below:

Formula D-1

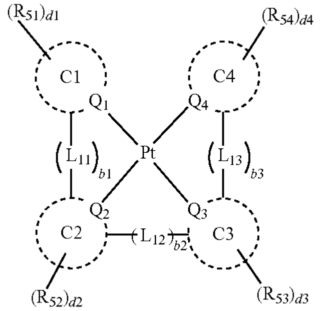

In Formula D-1, $Q_1$ to $Q_4$ may be each independently C or N.

In Formula D-1, C1 to C4 may be each independently a substituted or unsubstituted hydrocarbon ring having 5 to 30 ring-forming carbon atoms, or a substituted or unsubstituted heterocycle having 2 to 30 ring-forming carbon atoms.

In Formula D-1, $L_1$ to $L_{13}$ may be each independently a direct linkage,

*—O—*, *—S—*, 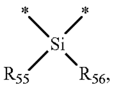,

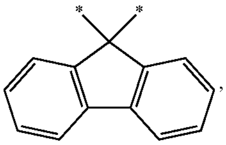, a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms. In $L_{11}$ to $L_{13}$, "-*" means a part linked to C1 to C4.

In Formula D-1, b1 to b3 may be each independently 0 or 1. If b1 is 0, C1 and C2 may not be linked to each other. If b2 is 0, C2 and C3 may not be linked to each other. If b3 is 0, C3 and C4 may not be linked to each other.

In Formula D-1, $R_{51}$ to $R_{56}$ may be each independently a hydrogen atom, a deuterium atom, a halogen atom, a cyano group, a substituted or unsubstituted silyl group, a substituted or unsubstituted thio group, a substituted or unsubstituted oxy group, a substituted or unsubstituted amine group, a substituted or unsubstituted boron group, a substituted or unsubstituted alkyl group having 1 to 20 carbon atoms, a substituted or unsubstituted alkenyl group having 2 to 20 carbon atoms, a substituted or unsubstituted aryl group having 6 to 60 ring-forming carbon atoms, or a substituted or unsubstituted heteroaryl group having 2 to 60 ring-forming carbon atoms. Alternatively, each of $R_{51}$ to $R_{56}$ may be bonded to an adjacent group to form a ring. $R_{51}$ to $R_{56}$ may be each independently a substituted or unsubstituted methyl group, or a substituted or unsubstituted t-butyl group.

In Formula D-1, d1 to d4 are each independently an integer of 0 to 4. In Formula D-1, if each of d1 to d4 is 0, the fourth compound may not be substituted with each of $R_{51}$ to $R_{54}$. The case where each of d1 to d4 is 4 and $R_{51}$'s to $R_{54}$' are each hydrogen atoms may be the same as the case where each of d1 to d4 is 0. When each of d1 to d4 is an integer of 2 or more, a plurality of $R_{51}$'s to $R_{54}$'s may each be the same or at least one selected from among the plurality of $R_{51}$'s to $R_{54}$'s may be different from the others.

In Formula D-1, C1 to C4 may be each independently a substituted or unsubstituted hydrocarbon ring or a substituted or unsubstituted heterocycle represented by any one selected from among C-1 to C-4 below:

C-1

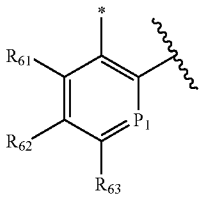

C-2

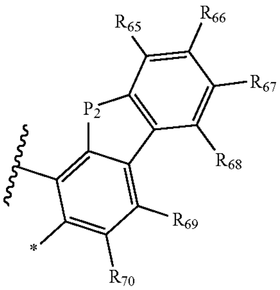

C-3

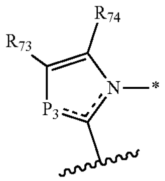

C-4

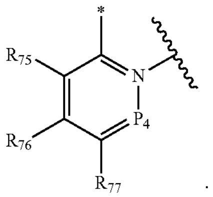

In C-1 to C-4, $P_1$ may be C—* or $CR_{64}$, $P_2$ may be N—* or $NR_{71}$, $P_3$ may be N—* or $NR_{72}$, and $P_4$ may be C—* or $CR_{78}$. $R_{61}$ to $R_{68}$ may be each independently a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In addition, in C-1 to C-4,

"  "

corresponds to a part linked to Pt that is a central metal atom, and "-*" corresponds to a part linked to a neighboring cyclic group (C1 to C4) or a linker ($L_{11}$ to $L_{13}$).

The emission layer EML of one or more embodiments may include the first compound, which is a fused polycyclic compound, and at least one selected from the second to fourth compounds. For example, the emission layer EML may include the first compound, the second compound, and the third compound In the emission layer EML, the second compound and the third compound may form n exciplex, and the energy may be transferred from the exciplex to the first compound, thereby emitting light.

In addition, the emission layer EML may include the first compound, the second compound, the third compound, and the fourth compound. In the emission layer EML, the second compound and the third compound may form an exciplex, and the energy may be transferred from the exciplex to the fourth compound and the first compound, thereby emitting light. In one or more embodiments, the fourth compound may be a sensitizer. The fourth compound included in the emission layer EML in the light emitting device ED of one or more embodiments may serve as a sensitizer to deliver energy from the host to the first compound that is a light emitting dopant. For example, the fourth compound serving as an auxiliary dopant accelerates energy delivery to the first compound that is a light emitting dopant, thereby increasing the emission ratio of the first compound. Therefore, the emission layer EML of one or more embodiments may improve luminous efficiency. In addition, when the energy delivery to the first compound is increased, an exciton formed in the emission layer EML is not accumulated inside the emission layer EML and emits light rapidly, and thus deterioration of the device may be reduced. Therefore, the service life of the light emitting device ED of one or more embodiments may increase.

The light emitting device ED of one or more embodiments may include all of the first compound, the second compound, the third compound, and the fourth compound, and the emission layer EML may include the combination of two host materials and two dopant materials. In the light emitting device ED of one or more embodiments, the emission layer EML may concurrently (e.g., simultaneously) include the second compound and the third compound, which are two different hosts, the first compound that emits a delayed fluorescence, and the fourth compound including an organometallic complex, thereby exhibiting excellent luminous efficiency characteristics.

In one or more embodiments, the fourth compound represented by Formula D-1 may represented at least one selected from among the compounds represented by Compound Group 4 below. The emission layer EML may include at least one selected from among the compounds represented by Compound Group 4 as a sensitizer material.

AD-01

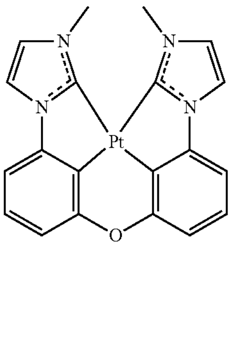

-continued

AD-02

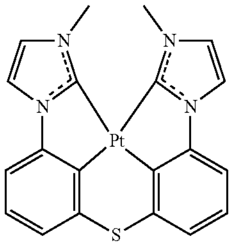

AD-03

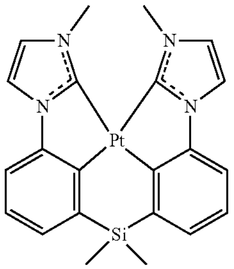

AD-04

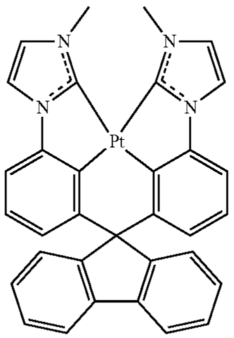

AD-05

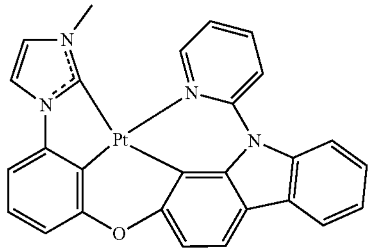

AD-06

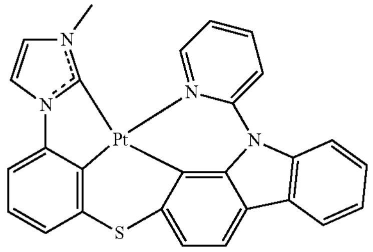

-continued
AD-07
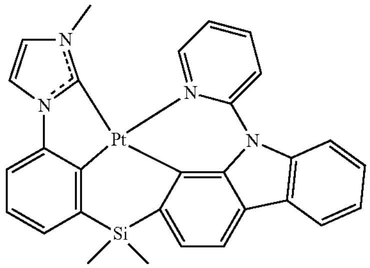
AD-08
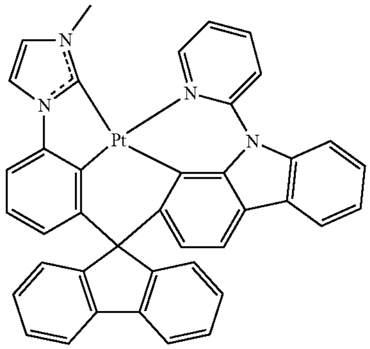
AD-09
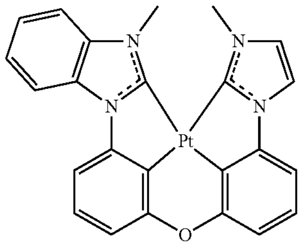
AD-10
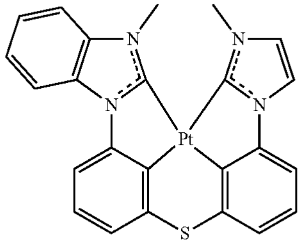
AD-11
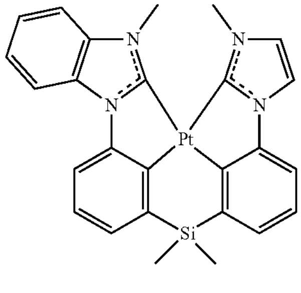
-continued
AD-12
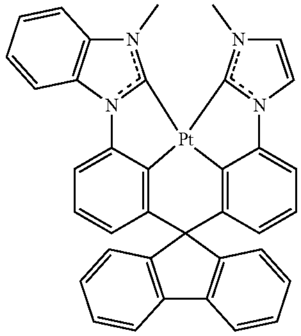
AD-13
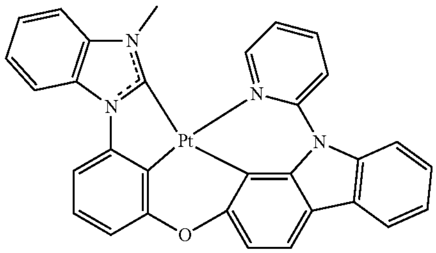
AD-14
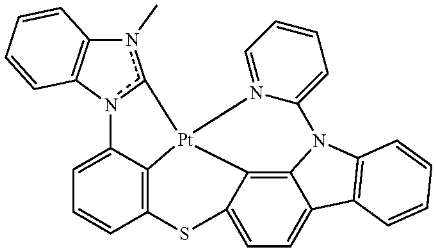
AD-15
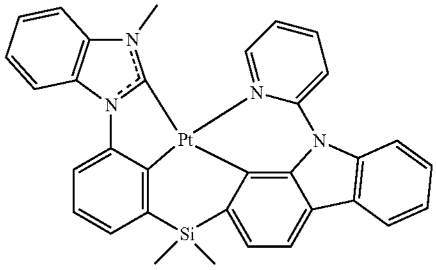
AD-16
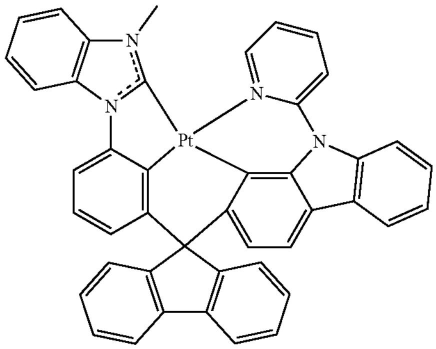

-continued
AD-17
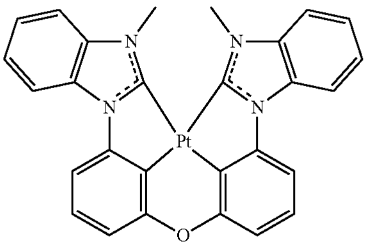
AD-18
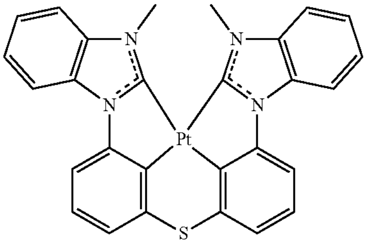
AD-19
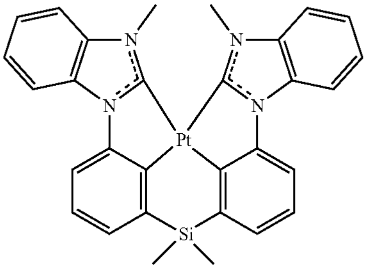
AD-20
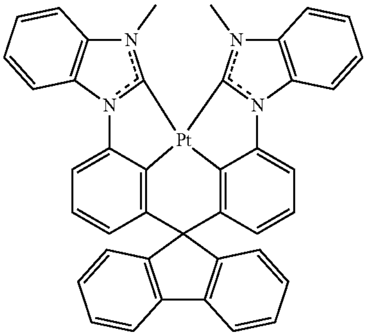
AD-21
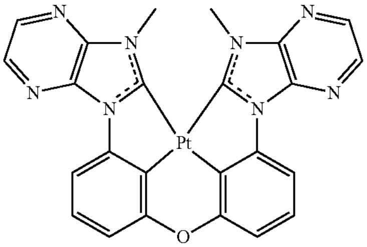
AD-22
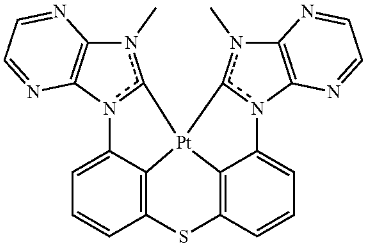
-continued
AD-23
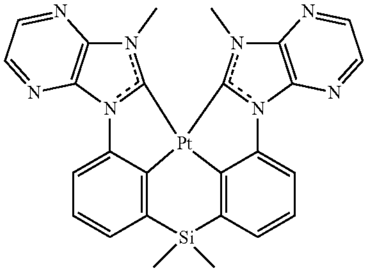
AD-24
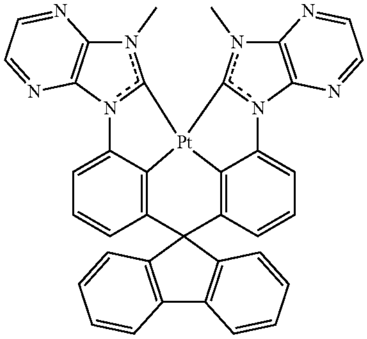
AD-25
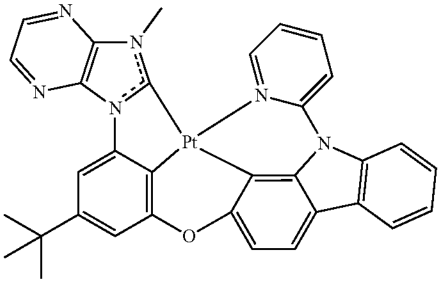
AD-26
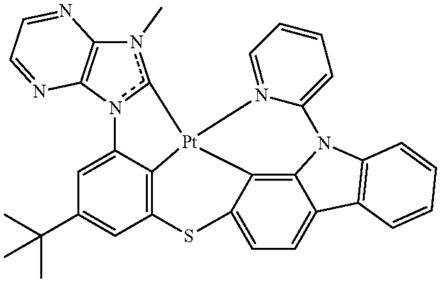
AD-27
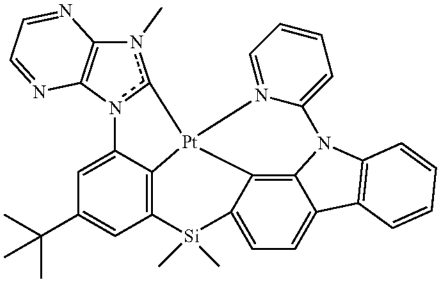

-continued
AD-28
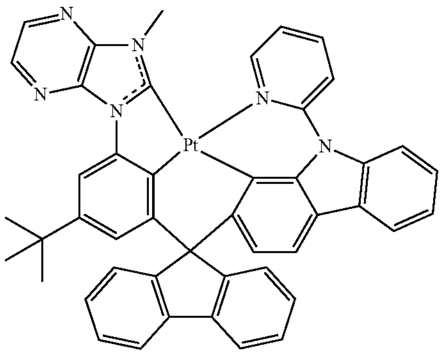
AD-29
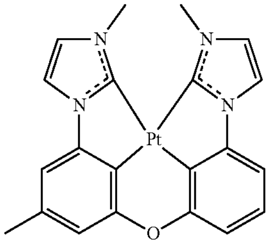
AD-30
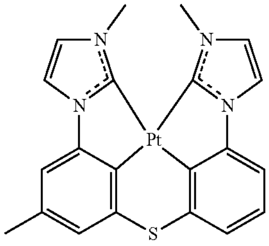
AD-31
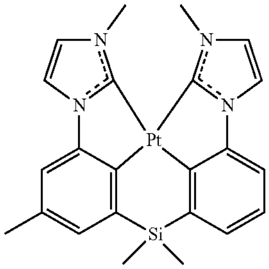
AD-32
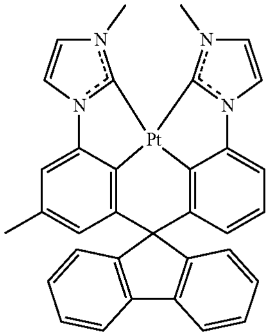
-continued
AD-33
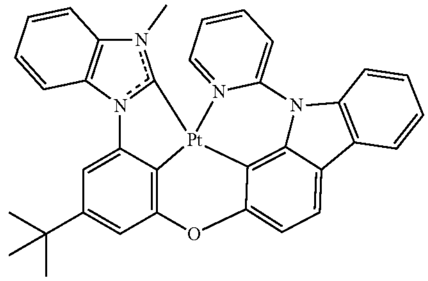
AD-34
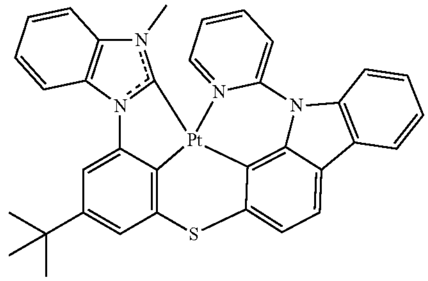
AD-35
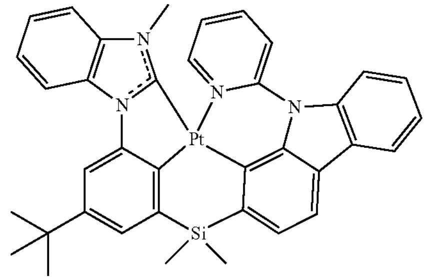
AD-36
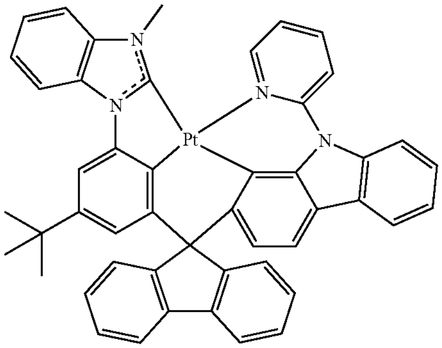
AD-37
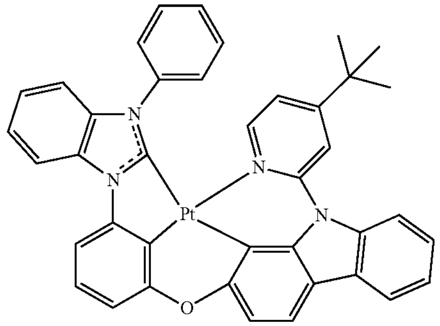

-continued

AD-38

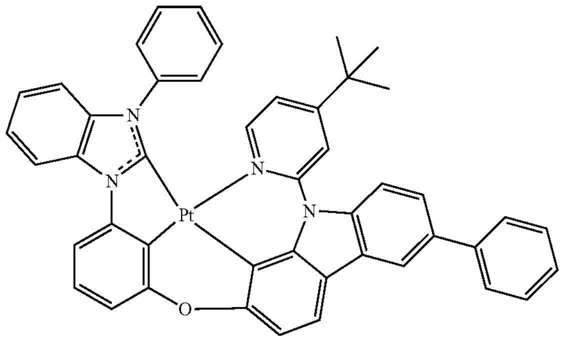

AD-39

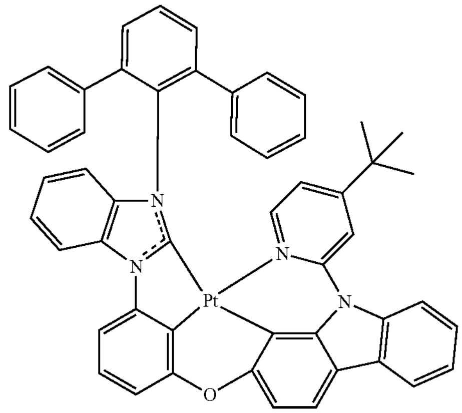

AD-40

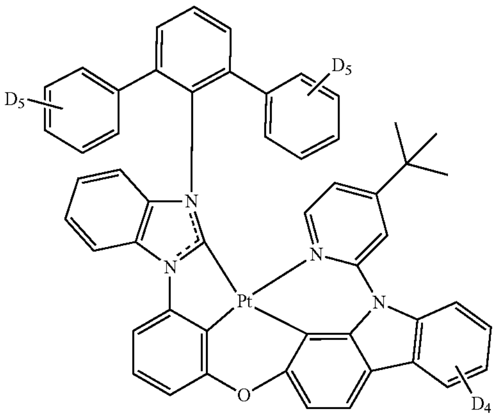

-continued

AD-41

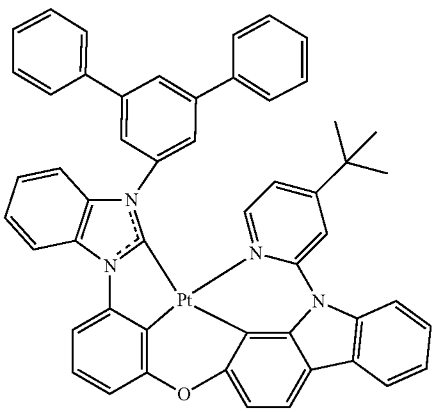

AD-42

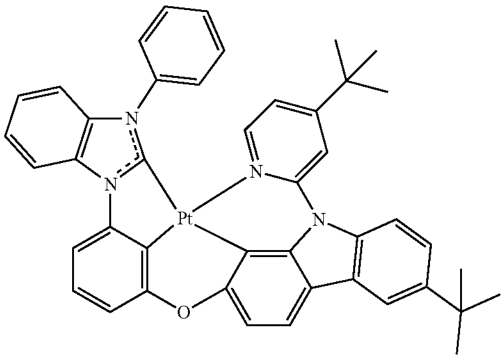

AD-43

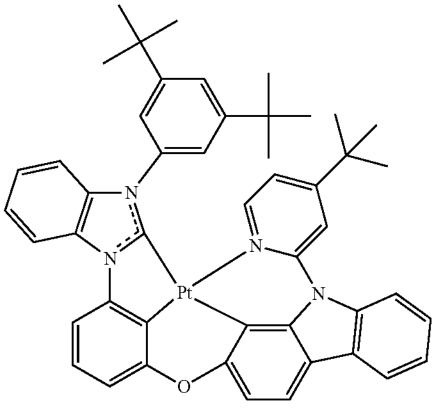

The light emitting device ED of one or more embodiments may include a plurality of emission layers. The plurality of emission layers may be sequentially stacked and provided, and for example, the light emitting device ED including the plurality of emission layers may emit white light. The light emitting device including the plurality of emission layers may be a light emitting device having a tandem structure. When the light emitting device ED includes a plurality of emission layers, at least one emission layer EML may include the first compound represented by Formula 1 of one or more embodiments. In addition, when the light emitting device ED includes the plurality of emission layers, at least one emission layer EML may include all of the first compound, the second compound, the third compound, and the fourth compound as described above.

When the emission layer EML in the light emitting device ED of one or more embodiments includes all of the first compound, the second compound, and the third compound, with respect to the total weight of the first compound, the second compound, and the third compound, the content of the first compound may be about 0.1 wt % to about 5 wt %. For example, the content of the first compound may be about 0.1 wt % to about 3 wt %. However, embodiments of the present disclosure are not limited thereto. When the content of the first compound satisfies the above-described proportion, the energy transfer from the second compound and the third compound to the first compound may increase, and thus the luminous efficiency and device service life may increase.

The contents of the second compound and the third compound in the emission layer EML may be the rest excluding the weight of the first compound. For example, the contents of the second compound and the third compound in the emission layer EML may be about 60 wt % to about 95 wt % with respect to the total weight of the first compound, the second compound, and the third compound.

In the total weight of the second compound and the third compound, the weight ratio of the second compound and the third compound may be about 3:7 to about 7:3.

When the contents of the second compound and the third compound satisfy the above-described ratio, a charge balance characteristic in the emission layer EML are improved, and thus the luminous efficiency and device service life may increase. When the contents of the second compound and the third compound deviate from the above-described ratio range, a charge balance in the emission layer EML is broken, and thus the luminous efficiency may be reduced and the device may be easily deteriorated.

When the emission layer EML includes the fourth compound, the content of the fourth compound in the emission layer EML may be about 4 wt % to about 40 wt % with respect to the total weight of the first compound, the second compound, the third compound, and the fourth compound. However, embodiments of the present disclosure are not limited thereto. When the content of the fourth compound satisfies the above-described content, the energy delivery from the host to the first compound which is a light emitting dopant may be increased, thereby a luminous ratio may be improved, and thus the luminous efficiency of the emission layer EML may be improved. When the first compound, the second compound, the third compound, and the fourth compound included in the emission layer EML satisfy the above-described content ratio range, excellent luminous efficiency and long service life may be achieved.

In the light emitting device ED of one or more embodiments, the emission layer EML may include an anthracene derivative, a pyrene derivative, a fluoranthene derivative, a chrysene derivative, a dehydrobenzanthracene derivative, and/or a triphenylene derivative. For example, the emission layer EML may include the anthracene derivative and/or the pyrene derivative.

In each light emitting device ED of embodiments illustrated in FIGS. 3 to 6, the emission layer EML may further include any suitable host and dopant generally used in the art besides the above-described host and dopant, and for example the emission layer EML may include a compound represented by Formula E-1 below. The compound represented by Formula E-1 below may be used as a fluorescent host material.

Formula E-1

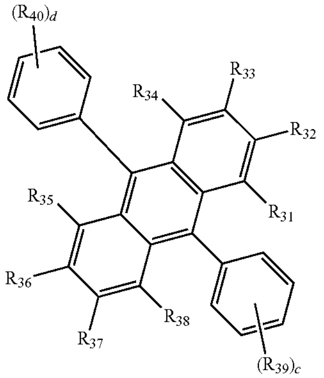

In Formula E-1, $R_{31}$ to $R_{40}$ may be each independently a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In one or more embodiments, $R_{31}$ to $R_{40}$ may be bonded to an adjacent group to form a saturated hydrocarbon ring or an unsaturated hydrocarbon ring, a saturated heterocycle, or an unsaturated heterocycle.

In Formula E-1, c and d may be each independently En integer of 0 to 5.

Formula E-1 may be represented by any one selected from among Compound E1 to Compound E19 below:

E1

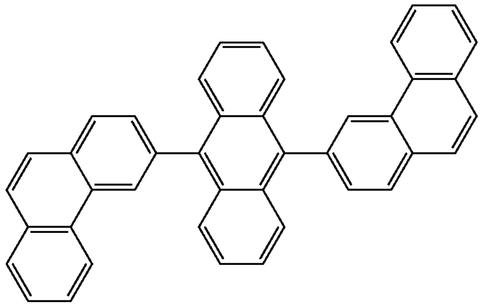

E2

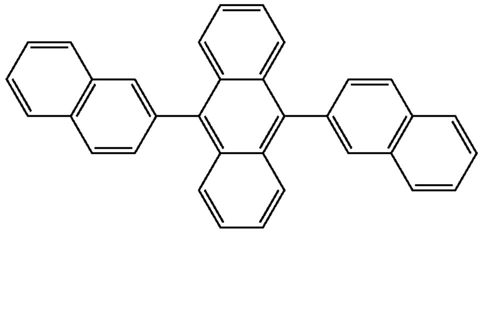

-continued
E3
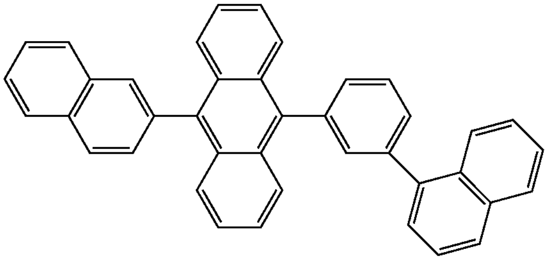
E4
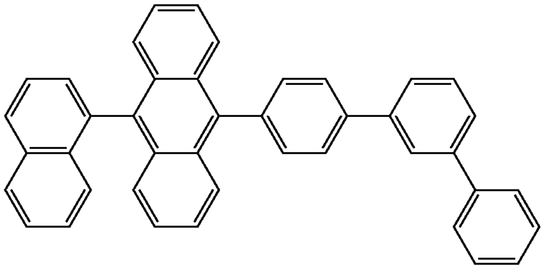
E5
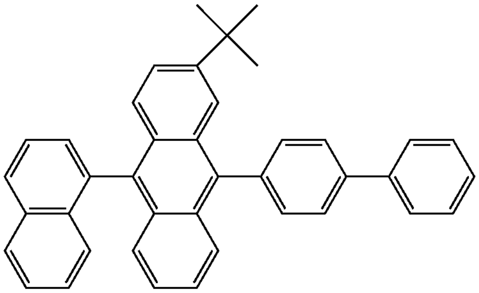
E6
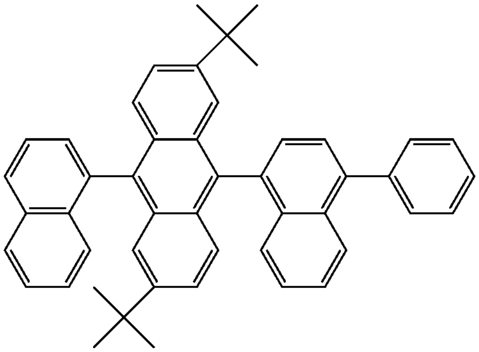
E7
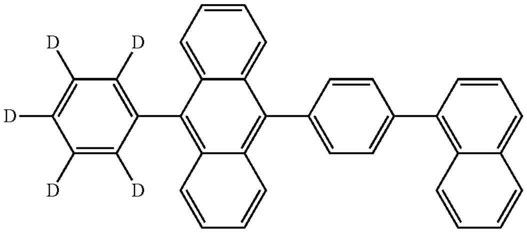
-continued
E8
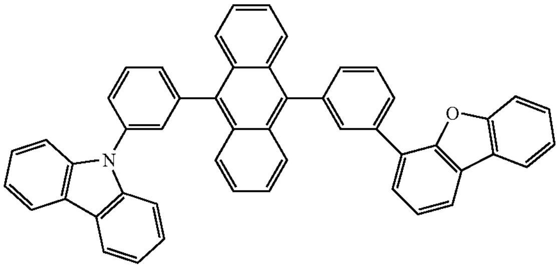
E9
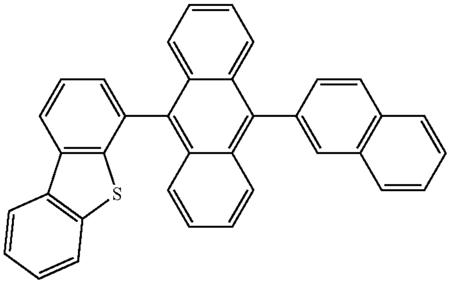
E10
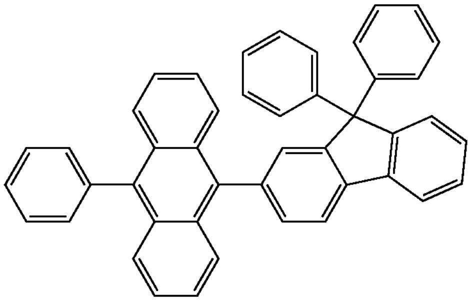
E11
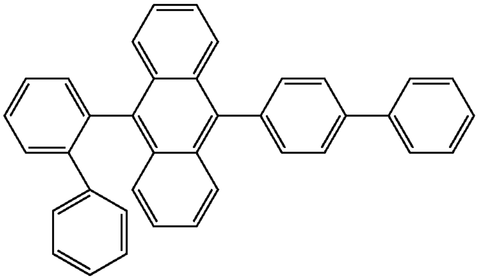
E12
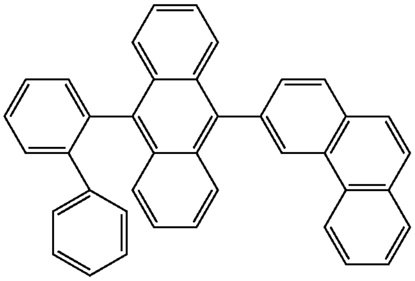

-continued
E13
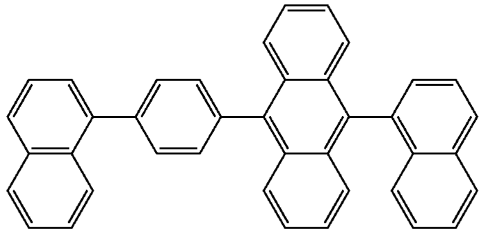
E14
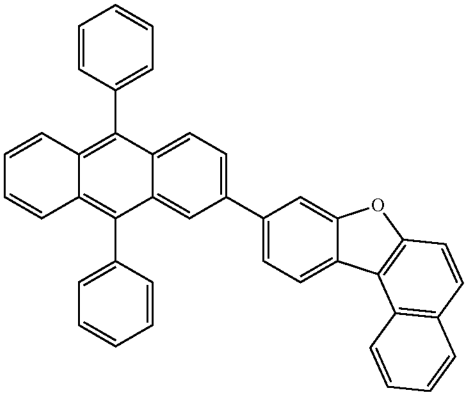
E15
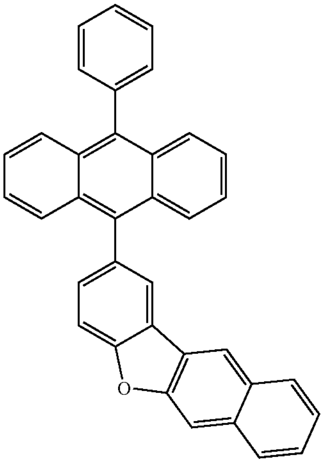
E16
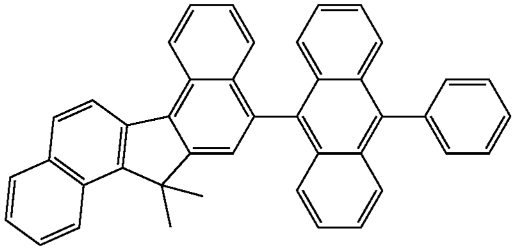
-continued
E17
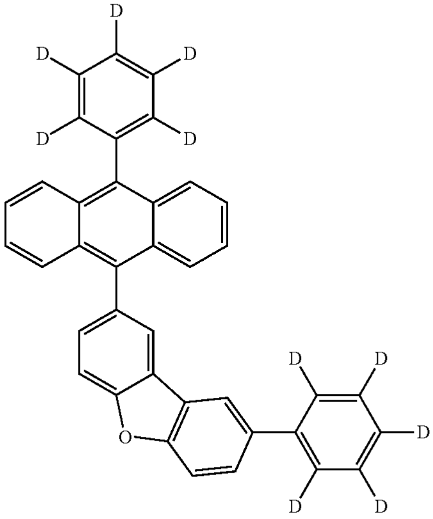
E18
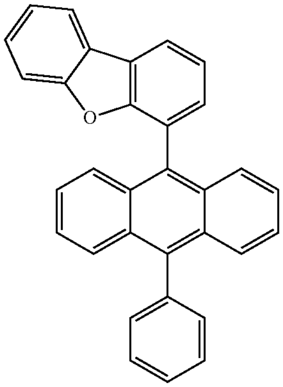
E19
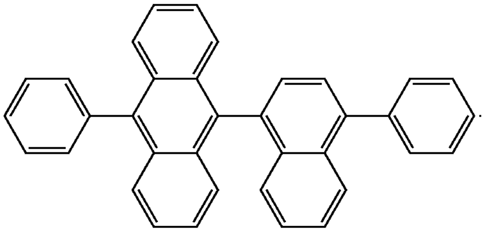
.
In one or more embodiments, the emission layer EML may include a compound represented by Formula E-2a or Formula E-2b below. The compound represented by Formula E-2a or Formula E-2b below may be used as a phosphorescent host material.

Formula E-2a

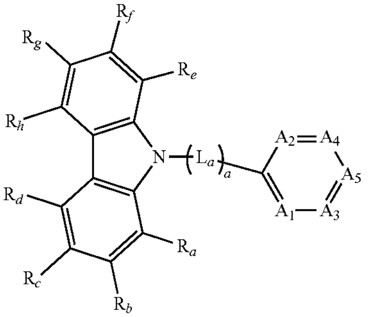

In Formula E-2a, a may be an integer of 0 to 10, $L_a$ may be a direct linkage, a substituted or unsubstituted arylene group having 6 to 30 ring-forming carbon atoms, or a substituted or unsubstituted heteroarylene group having 2 to 30 ring-forming carbon atoms. In one or more embodiments, when a is an integer of 2 or more, a plurality of $L_a$'s may be each independently a substituted or unsubstituted arylene group having 6 to 30 ring-forming carbon atoms, or a substituted or unsubstituted heteroarylene group having 2 to 30 ring-forming carbon atoms.

In addition, in Formula E-2a, $A_1$ to $A_5$ may be each independently N or $CR_i$. $R_a$ to $R_i$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. $R_a$ to $R_i$ may be bonded to an adjacent group to form a hydrocarbon ring or a heterocycle containing N, O, S, etc., as a ring-forming atom.

In one or more embodiments, in Formula E-2a, two or three selected from among $A_1$ to $A_5$ may be N, and the rest may be $CR_i$.

Formula E-2b $$(Cbz1)\text{—}(L_b)_b\text{—}(Cbz2)$$

In Formula E-2b, Cbz1 and Cbz2 may be each independently an unsubstituted carbazole group, or a carbazole group substituted with an aryl group having 6 to 30 ring-forming carbon atoms. $L_b$ is a direct linkage, a substituted or unsubstituted arylene group having 6 to 30 ring-forming carbon atoms, or a substituted or unsubstituted heteroarylene group having 2 to 30 ring-forming carbon atoms. In one or more embodiments, b is an integer of 0 to 10, and when is an integer of 2 or more, a plurality of $L_b$'s may be each independently a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be represented by any one selected from among the compounds of Compound Group E-2 below. However, the compounds listed in Compound Group E-2 below are examples, and the compound represented by Formula E-2a or Formula E-2b is not limited to those represented in Compound Group E-2 below.

Compound Group E-2

E-2-1

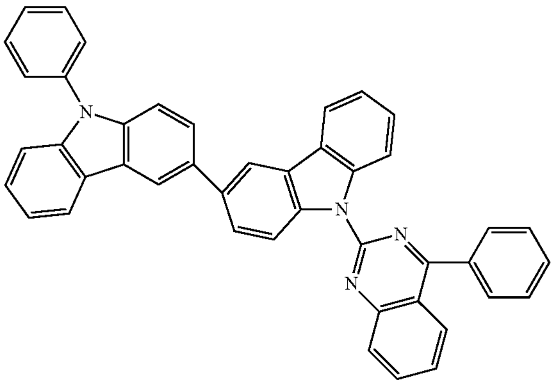

E-2-2

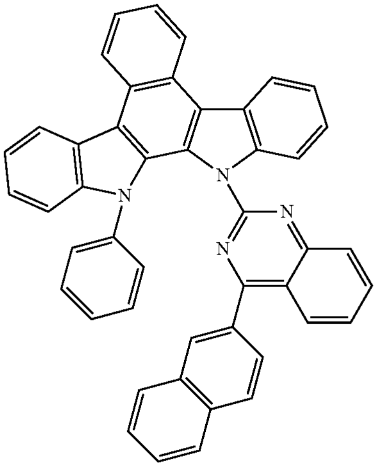

E-2-3

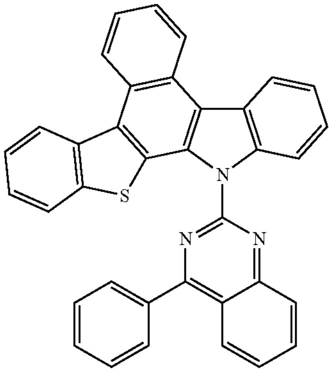

-continued
E-2-4
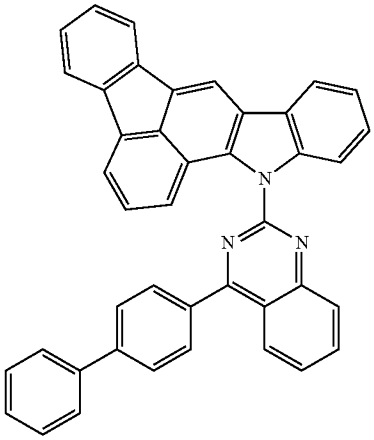
E-2-5
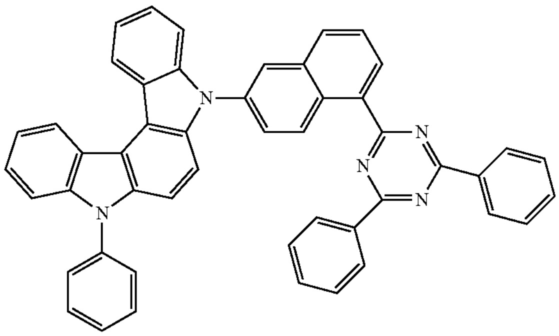
E-2-6
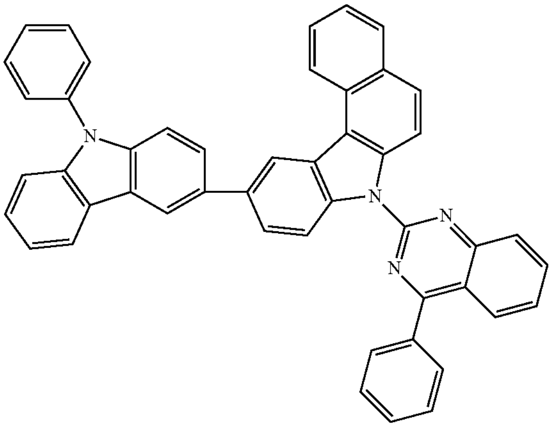
-continued
E-2-7
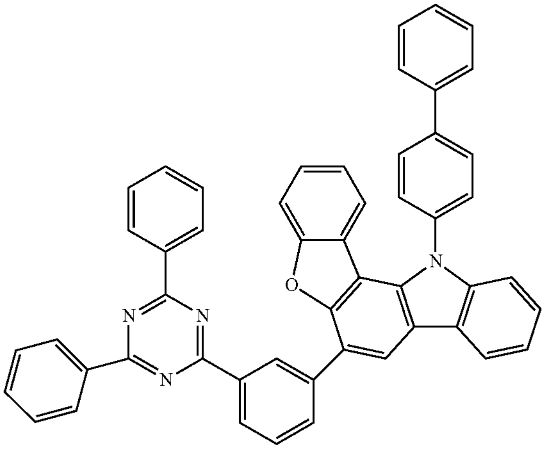
E-2-8
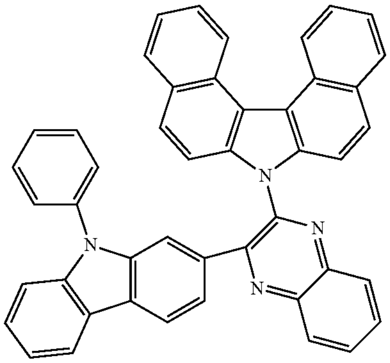
E-2-9
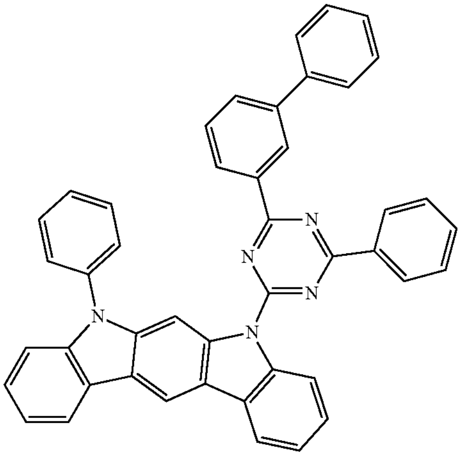

-continued
E-2-10
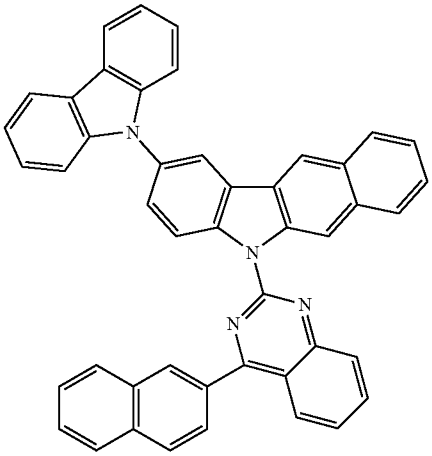
E-2-11
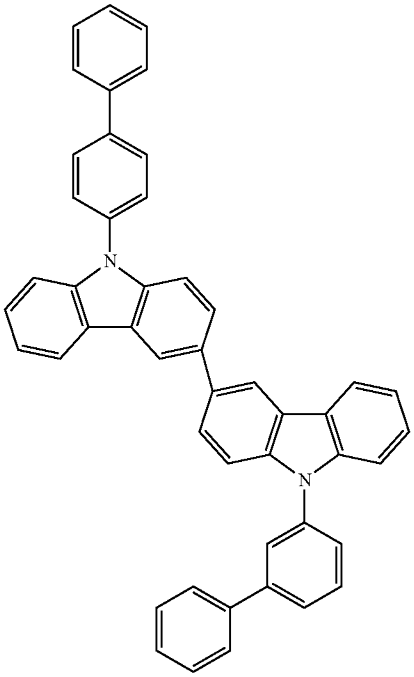
E-2-12
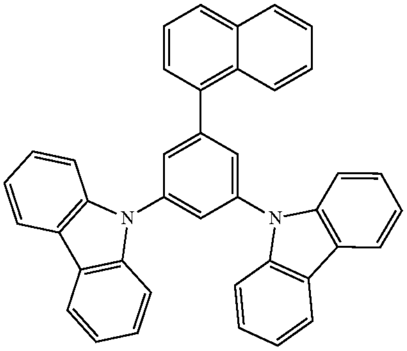
-continued
E-2-13
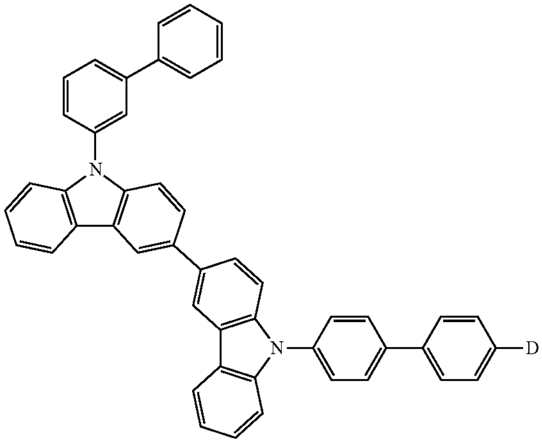
E-2-14
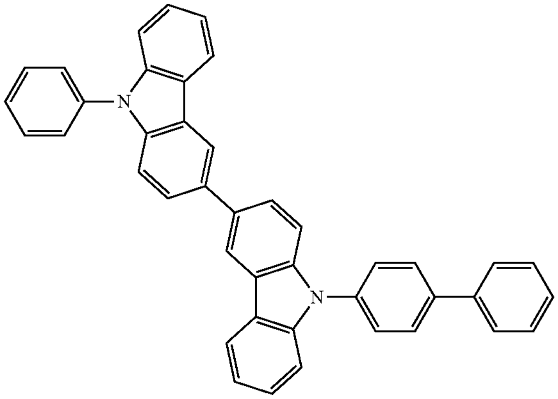
E-2-15
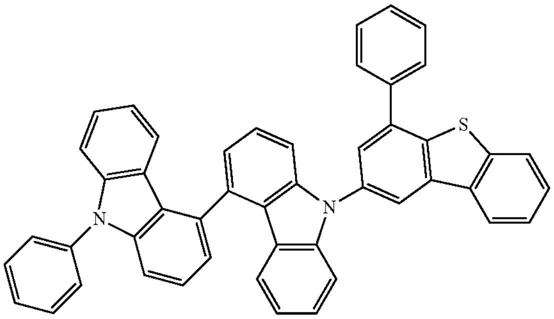
E-2-16
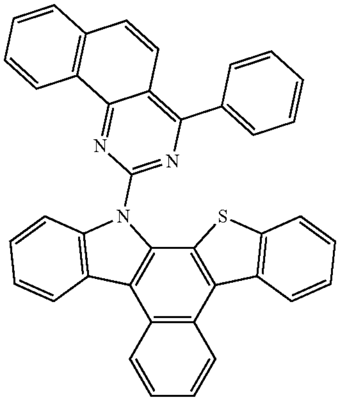

-continued
E-2-17
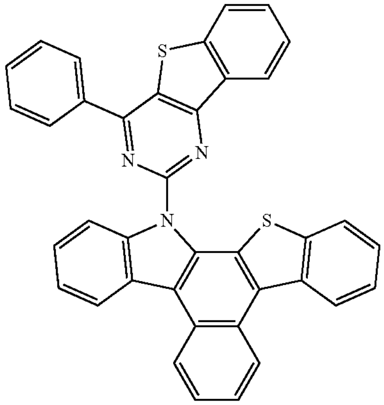
E-2-18
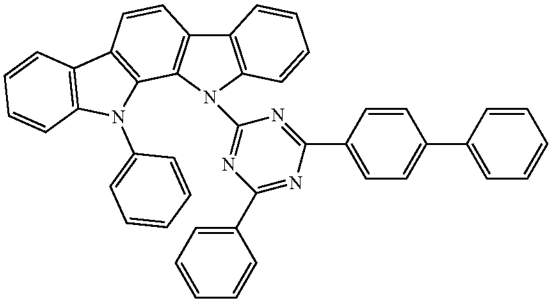
E-2-19
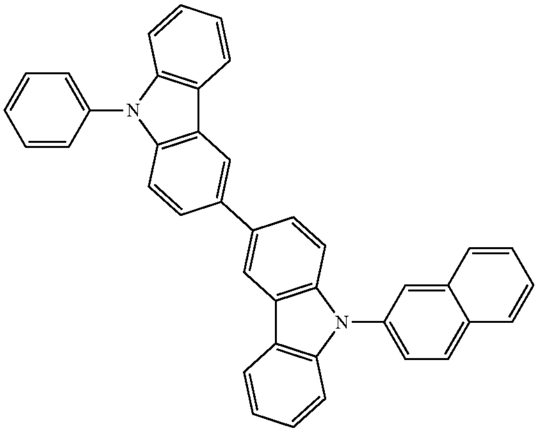
E-2-20
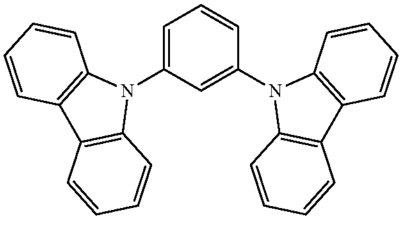
-continued
E-2-21
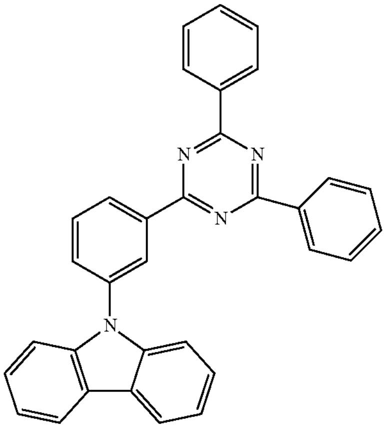
E-2-22
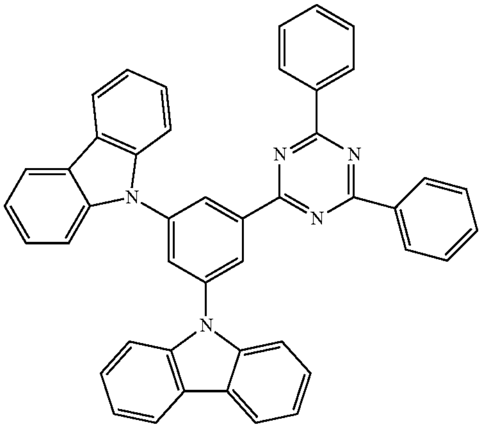
E-2-23
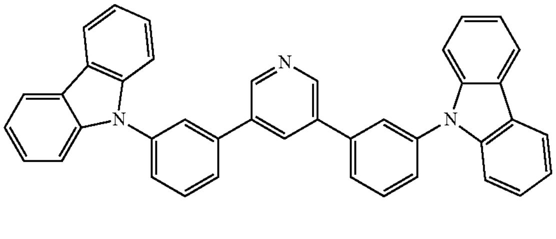

-continued

E-2-24

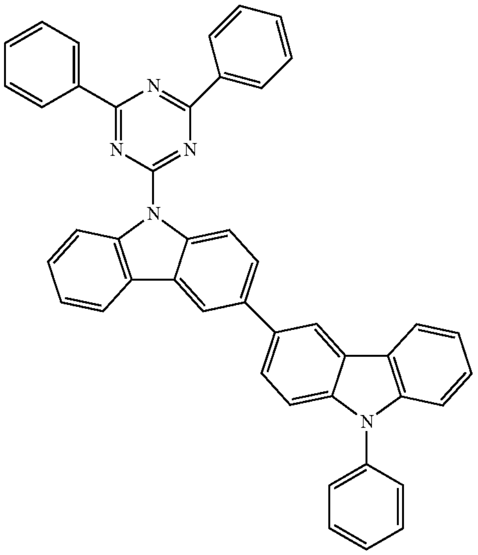

The emission layer EML may further include any suitable material generally used in the art as a host material. For example, the emission layer EML may include, as a host material, at least one selected from bis(4-(9H-carbazol-9-yl)phenyl)diphenylsilane (BCPDS), (4-(1-(4-(diphenylamino)phenyl)cyclohexyl)phenyl)diphenyl-phosphine oxide (POPCPA), bis[2-(diphenylphosphino)phenyl]ether oxide (DPEPO), 4,4'-bis(N-carbazolyl)-1,1'-biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), and 1,3,5-tris(1-phenyl-1H-benzo[d]imidazole-2-yl)benzene (TPBi). However, embodiments of the present disclosure are not limited thereto, for example, tris(8-hydroxyquinolino)aluminum ($Alq_3$), 9,10-di(naphtalene-2-yl)anthracene (and), 2-tert-butyl-9;10-di(naphth-2-yl)anthracene (TBADN), distyrylarylene (DSA), 4,4'-bis(9-carbazolyl)-2,2'-dimethyl-biphenyl (CDBP), 2-methyl-9,10-is(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), etc. may be used as a host material.

The emission layer EML may include the compound represented by Formula M-a below. The compound represented by Formula M-a below may be used as a phosphorescent dopant material.

Formula M-a

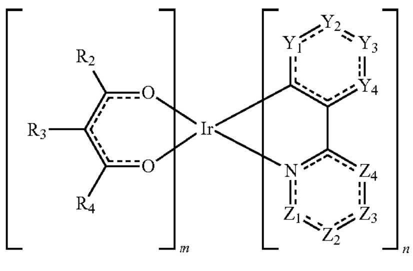

In Formula M-a above, $Y_1$ to $Y_4$ and $Z_1$ to $Z_4$ may be each independently $CR_1$ or N, $R_1$ to $R_4$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group t form a ring. In Formula M-a, m is 0 or 1, and n is 2 or 3. In Formula M-a, when m is 0, n is 3, and when m is 1, n is 2.

The compound represented by Formula M-a may be used as a phosphorescent dopant.

The compound represented by Formula M-a may be represented by any one selected from among Compound M-a1 to Compound M-a25 below. However, Compounds M-a1 to M-a25 below are examples, and the compound represented by Formula M-a is not limited to those represented by Compounds M-a1 to M-a25 below.

M-a1

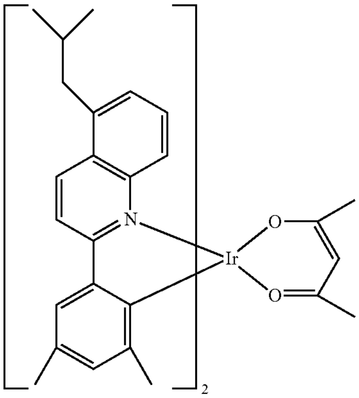

M-a2

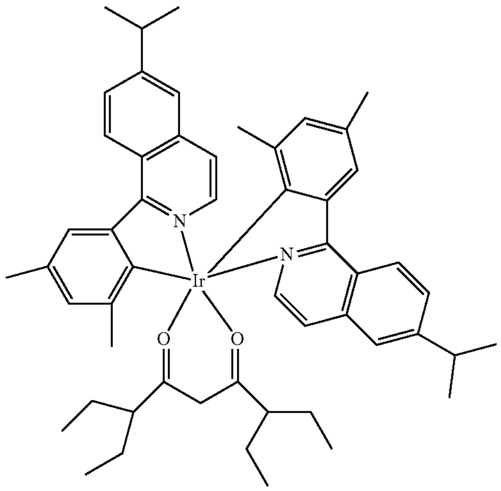

M-a3
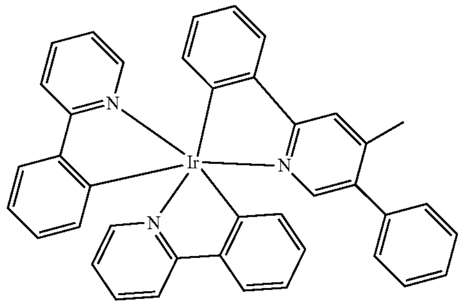
M-a4
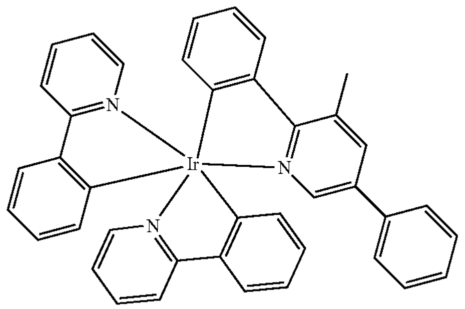
M-a5
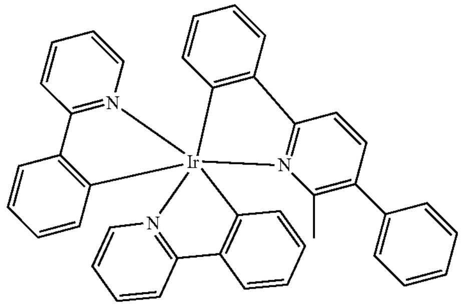
M-a6
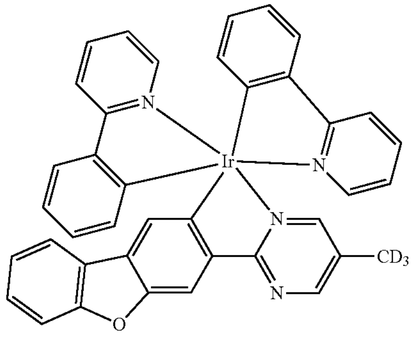
M-a7
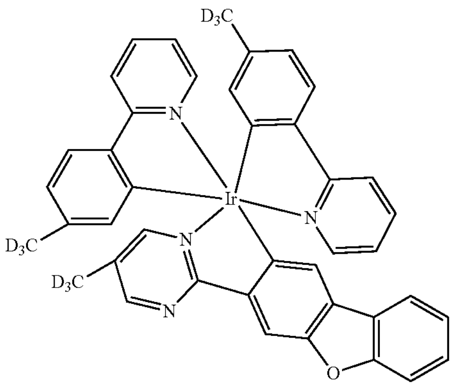
M-a8
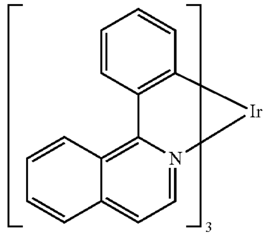
M-a9
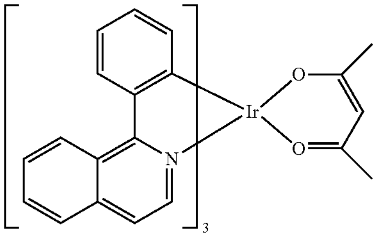
M-a10
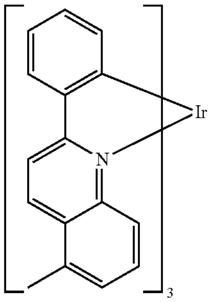
M-a11
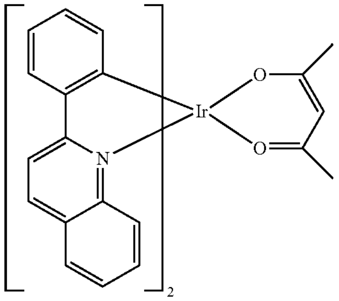

-continued
M-a12
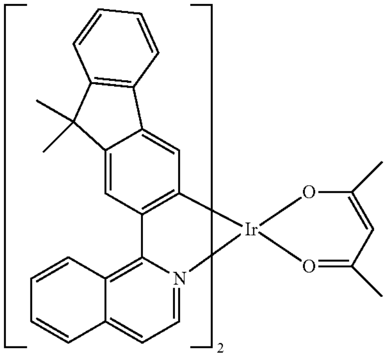
M-a13
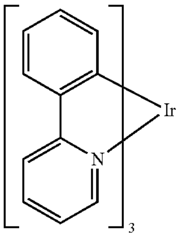
M-a14
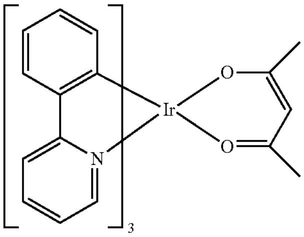
M-a15
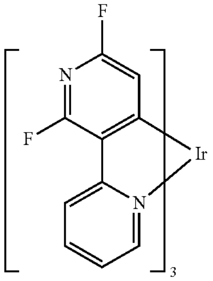
M-a16
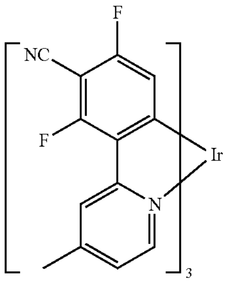
-continued
M-a17
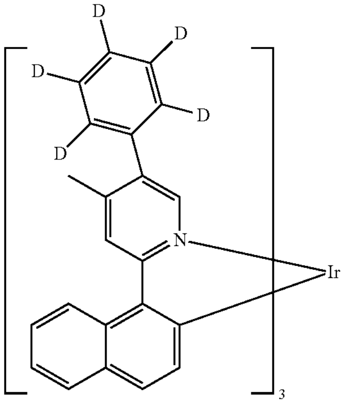
M-a18
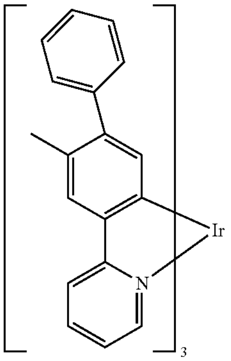
M-a19
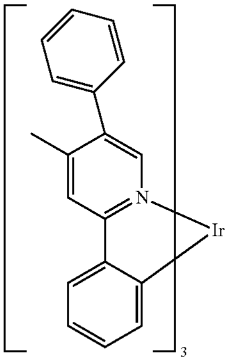
M-a20
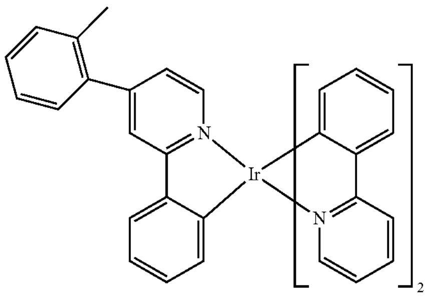

-continued

M-a21

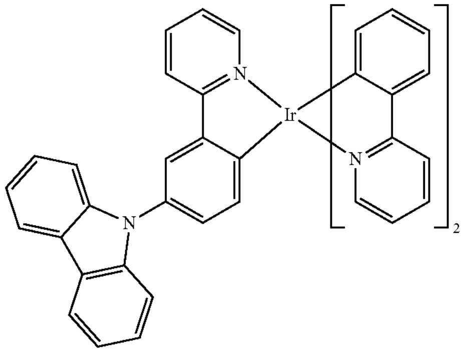

M-a22

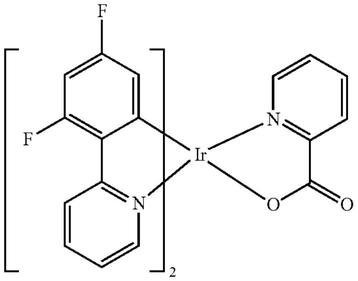

M-a23

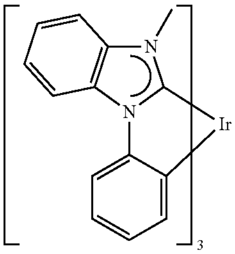

M-a24

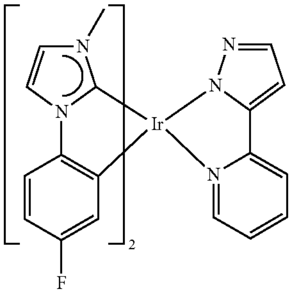

M-a25

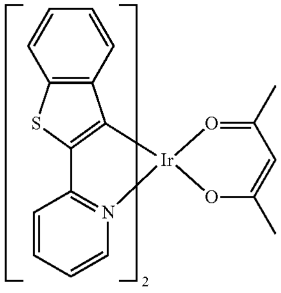

The emission layer EML may include a compound represented by any one selected from among Formula F-a to Formula F-c below. The compound represented by Formula F-a or Formula F-c below may be used as a fluorescence dopant material.

Formula F-a

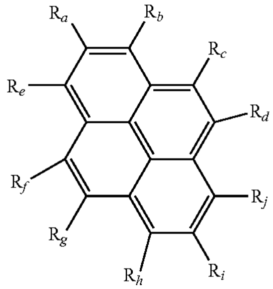

In Formula F-a above, two selected from among $R_a$ to $R_j$ may each independently be substituted with $*\text{—}NAr_1Ar_2$. The others, which are not substituted with $*\text{—}NAr_1Ar_2$, among $R_a$ to $R_j$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In $*\text{—}NAr_1Ar_2$, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carb n atoms. For example, at least one selected from $Ar_1$ and $Ar_2$ may be a heteroaryl group containing O or S as a ring-forming atom.

Formula F-b

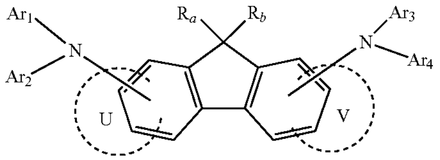

In Formula F-b above, $R_a$ and $R_b$ may be each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. $Ar_1$ to $Ar_4$ may be each independently a substituted or unsubstituted aryl group having 6 to 30 ring-forming carbon atoms, or a substituted or unsubstituted heteroaryl group having 2 to 30 ring-forming carbon atoms.

In Formula F-b, U and V may be each independently a substituted or unsubstituted hydrocarbon ring having 5 to 30 ring-forming carbon atoms, or a substituted or unsubstituted heterocycle having 2 to 30 ring-forming carbon atoms. At least one selected from among $Ar_1$ to $Ar_4$ may be a heteroaryl group containing O or S as a ring-forming atom.

In Formula F-b, the number of rings represented by U and V may be each independently 0 or 1. For example, in Formula F-b, it means that when the number of U or V is 1, one ring constitutes a fused ring at a portion indicated by U or V, and when the number of U or V is 0, a ring indicated by U or V does not exist. In one or more embodiments, when the number of U is 0 and the number of V is 1, or when the number of U is 1 and the number of V is 0, the fused ring having a fluorene core in Formula F-b may be a cyclic compound having four rings. In addition, when each number of U and V is 0, the fused ring in Formula F-b may be a cyclic compound having three rings. In addition, when each number of U and V is 1, the fused ring having a fluorene core in Formula F-b may be a cyclic compound having five rings.

Formula F-c

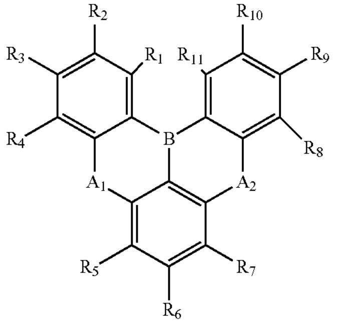

In Formula F-c, $A_1$ and $A_2$ may be each independently O, S, Se, or $NR_m$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ are each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring.

In Formula F-c, $A_1$ and $A_2$ may each independently be bonded to substituents of an adjacent ring to form a fused ring. For example, when $A_1$ and $A_2$ are each independently $NR_m$, $A_1$ may be bonded to $R_4$ or $R_5$ to form a ring. In addition, $A_2$ may be bonded to $R_7$ or $R_8$ to form a ring.

In one or more embodiments, the emission layer EML may further include, as any suitable dopant material generally used in the art, styryl derivatives (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi), 4,4'-bis[2-(4-(N,N-diphenylamino)phenyl)vinyl]biphenyl (DPAVBi), perylene and the derivatives thereof (e.g., 2,5,8,11-tetra-t-butylperylene (TBP)), pyrene and the derivatives thereof (e.g., 1,1-dipyrene, 1,4-dipyrenylbenzene, 1,4-bis(N,N-diphenylamino)pyrene), etc.

The emission layer EML may further include any suitable phosphorescence dopant material generally used in the art. For example, a metal complex containing iridium (Ir), platinum (Pt), osmium (Os), aurum (Au), titanium (Ti), zirconium (Zr), hafnium (Hf), europium (Eu), terbium (Tb), or thulium (Tm) may be used as a phosphorescent dopant. In one or more embodiments, iridium(III) bis(4,6-difluorophenylpyridinato-N,C2')picolinate (Flrpic), bis(2,4-difluorophenylpyridinato)-tetrakis(1-pyrazolyl)borate iridium(III) (Fir6), or platinum octaethyl porphyrin (PtOEP) may be used as a phosphorescent dopant. However, embodiments of the present disclosure are not limited thereto.

The emission layer EML may include a quantum dot material. The core of the quantum dot may be selected from among a Group II-VI compound, a Group III-VI compound, a Group I-III-IV compound, a Group III-V compound, a Group III-II-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and/or $In_2Se_3$, a ternary compound such as $InGaS_3$ and/or $InGaSe_3$, or any combination thereof.

The Group 1-III-VI compound may be selected from a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$, and a mixture thereof, and/or a quaternary compound such as $AgInGaS_2$ and/or $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. In one or more embodiments, the Group III-V compound may further include a Group II metal. For example, InZnP, etc., may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In this case, the binary compound, the ternary compound, or the quaternary compound may be present in a particle with a uniform (e.g., substantially uniform) concentration distribution, or may be present in the same particle with a partially different concentration distribution. In addition, the quantum dot may have a core/shell structure in which one quantum dot surrounds another quantum dot. The core/shell structure may have a concentration gradient in which the concentration of elements present in the shell decreases along a direction toward the core.

In some embodiments, the quantum dot may have the above-described core/shell structure including a core containing nanocrystals and a shell surrounding the core. The shell of the quantum dot may serve as a protection layer to prevent or reduce chemical deformation of the core to maintain semiconductor properties, and/or a charging layer to impart electrophoresis properties to the quantum dot. The shell may be a single layer or a multilayer. An example of the shell of the quantum dots may include a metal and/or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, COO, $Co_3O_4$, and/or NiO, and/or a ternary compound such as $MgAl_2O_4$, $CoFe_2O_4$, $NiFe_2O_4$, and/or $CoMn_2O_4$, but embodiments of the present disclosure are not limited thereto.

Also, examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments of the present disclosure are not limited thereto.

The quantum dot may have a full width of half maximum (FWHM) of a light emitting wavelength spectrum of about 45 nm or less, about 40 nm or less, or, for example, about 30 nm or less, and color purity and/or color reproducibility may be improved in the above range. In addition, light emitted through such a quantum dot is emitted in all (e.g., substantially all) directions, and thus a wide viewing angle may be improved.

In addition, although the form of the quantum dot is not particularly limited as long as it is a suitable form generally used in the art. In one or more embodiments, the quantum dot in the form of spherical, pyramidal, multi-arm, or cubic nanoparticles, nanotubes, nanowires, nanofibers, nanoplate particles, etc., ma be used.

A quantum dot may control the color of emitted light according to the particle size thereof and thus the quantum dot may have various suitable light emission colors such as green, red, etc.

In each light emitting device ED of embodiments illustrated in FIGS. 3 to 6, the electron transport region ETR is provided on the emission layer EML. The electron transport region ETR may include at least one selected from the hole blocking layer HBL, the electron transport layer ETL, and the electron injection layer EIL, but embodiments of the present disclosure are not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of the electron injection layer EIL or the electron transport layer ETL, and may have a single layer structure formed of an electron injection material and an electron transport material. In addition, the electron transport region ETR may have a single layer structure formed of a plurality of different materials, or may have a structure in which an electron transport layer ETL/electron injection layer EIL, a hole blocking layer HBL/electron transport layer ETL/electron injection layer EIL are stacked in order from the emission layer EML, but embodiments of the present disclosure are not limited thereto. The electron transport region ETR may have a thickness, for example, from about 1,000 Å to about 1,500 Å.

The electron transport region ETR may be formed by using various suitable methods such as, for example, a vacuum deposition method, a spin coating method, a cast method, a Langmuir-Blodgett (LB) method, an inkjet printing method, a laser printing method, and/or a laser induced thermal imaging (LITI) method.

The electron transport region ETR may include a compound represented by Formula ET-2 below:

Formula ET-2

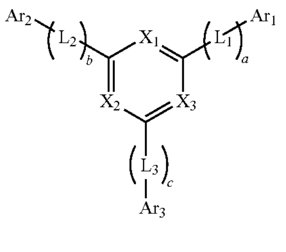

In Formula ET-2, at least one selected from among $X_1$ to $X_3$ is N, and the rest are $CR_a$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_3$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-2, a to c may be each independently an integer of 0 to 10. In Formula ET-2, $L_1$ to $L_3$ may be each independently a direct linkage, a substituted or unsubstituted arylene group having 6 to 30 ring-forming carbon toms, or a substituted or unsubstituted heteroarylene group having 2 to 30 ring-forming carbon atoms. In one or more embodiments, when a to c are each independently an integer of 2 or more, $L_1$ to $L_3$ may be each independently a substituted or unsubstituted arylene group having 6 to 30 ring-forming carbon atoms, or a substituted or u substituted heteroarylene group having 2 to 30 ring-forming carbon atoms.

The electron transport region ETR may include an anthracene-based compound. However, embodiments of the present disclosure are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl) phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate ($Bebq_2$), 9,10-di(naphthalene-2-yl)anthracene (ADN), 1,3-Bis[3,5-di(pyridin-3-yl)phenyl]benzene (BmPyPhB), or a mixture thereof.

The electron transport region ETR may include at least one selected from among Compound ET1 to Compound ET36 below:

-continued
ET1
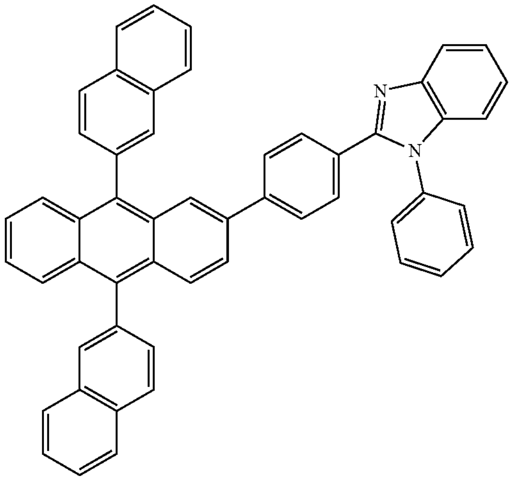
ET2
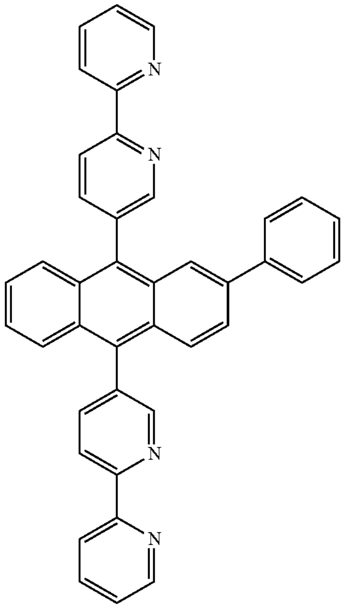
ET3
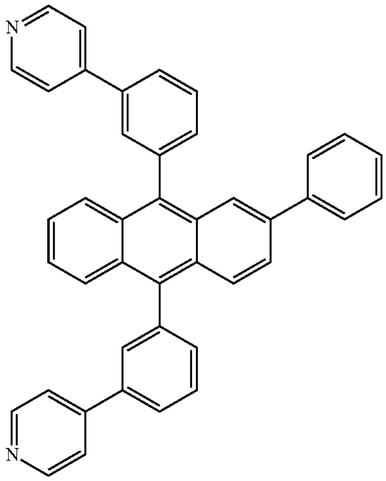
ET4
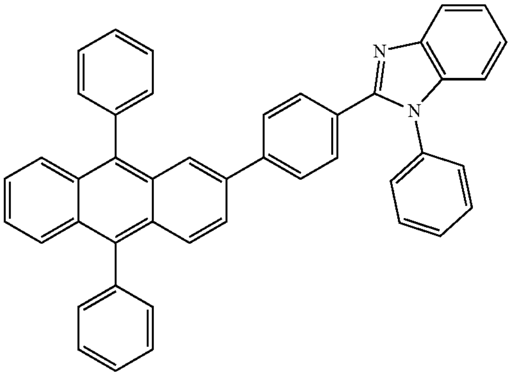
ET5
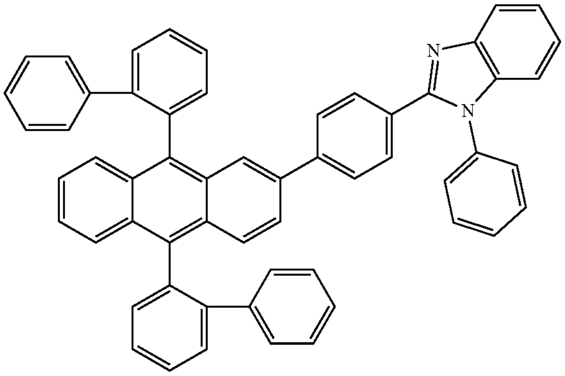
ET6
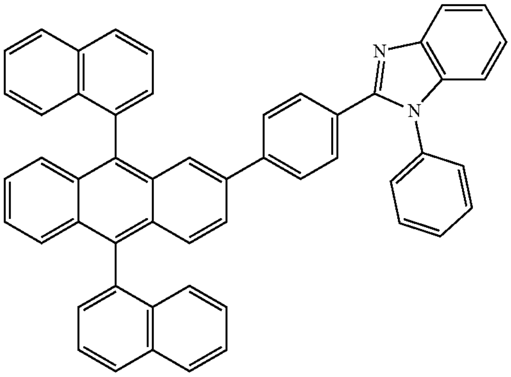
ET7
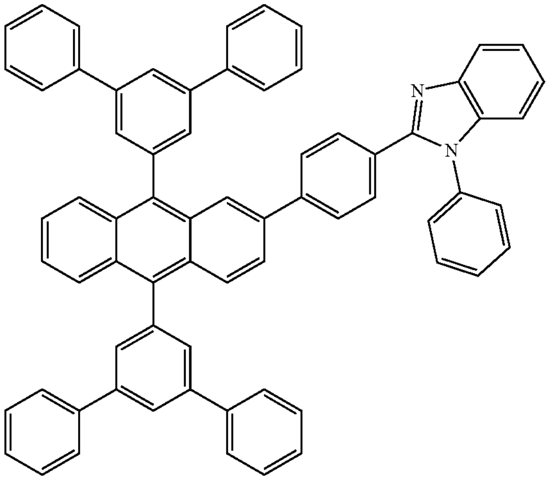

-continued
ET8
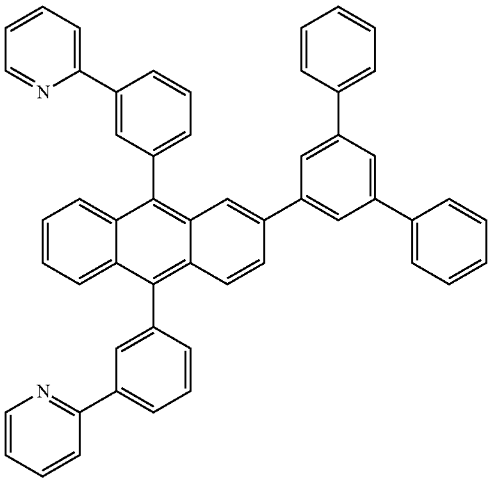
ET9
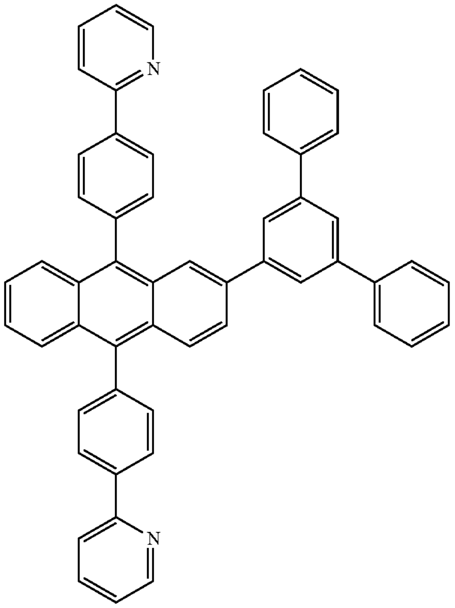
-continued
ET10
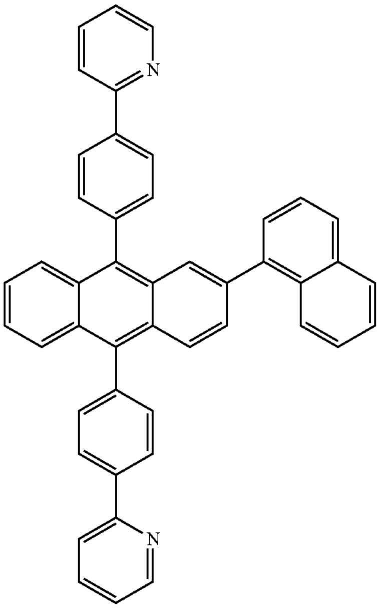
ET11
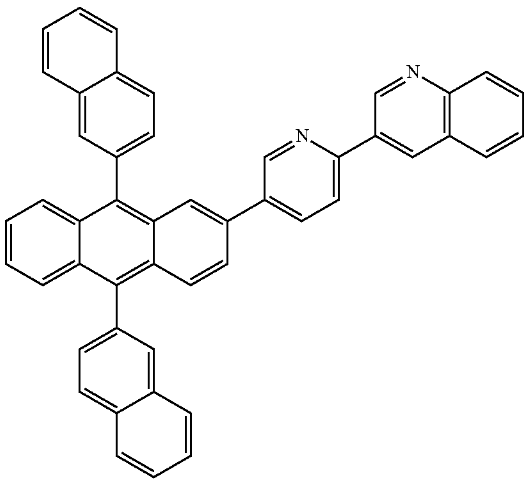
ET12
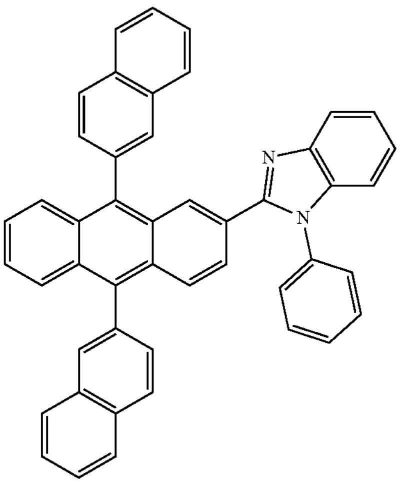

-continued
ET13
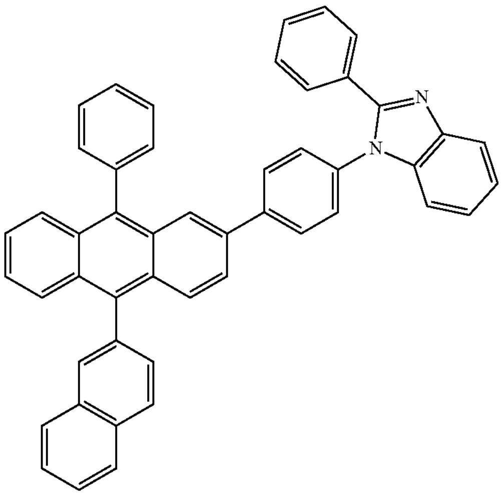
ET14
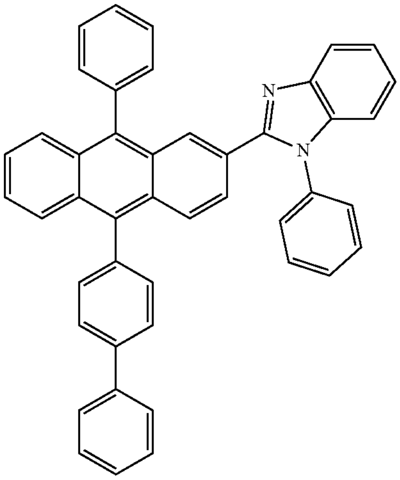
ET153
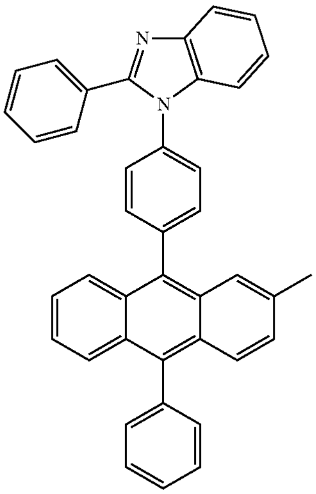
-continued
ET16
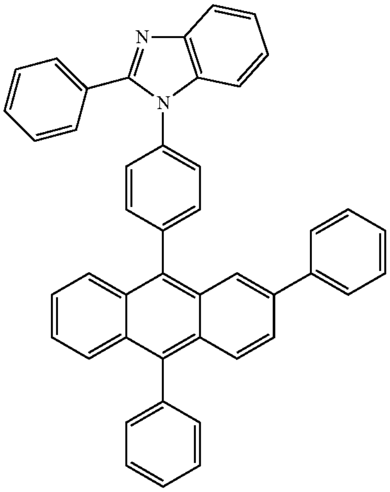
ET17
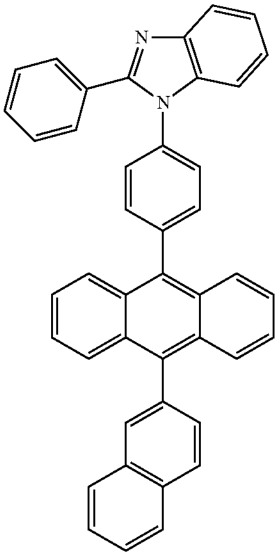
ET18
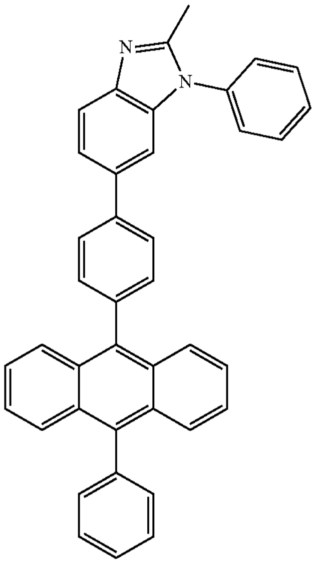

-continued
ET19
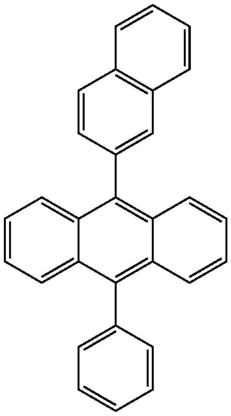
ET20
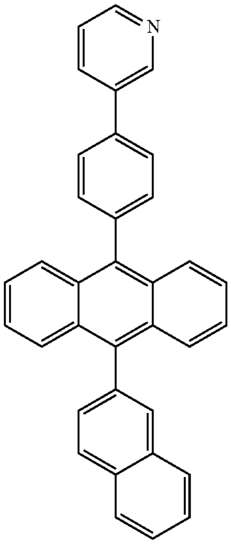
ET21
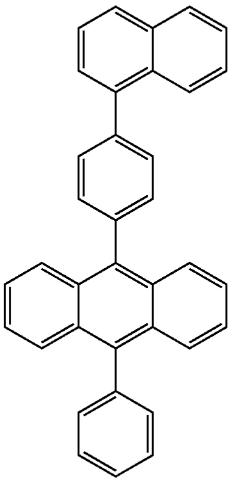
-continued
ET22
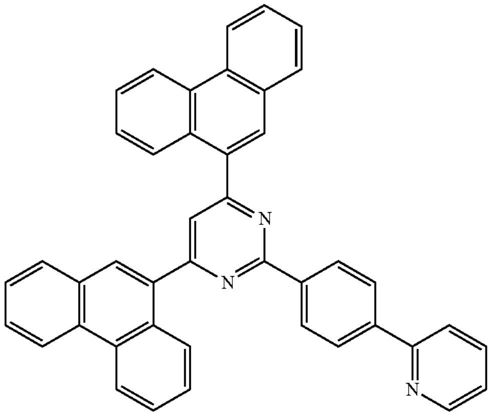
ET23
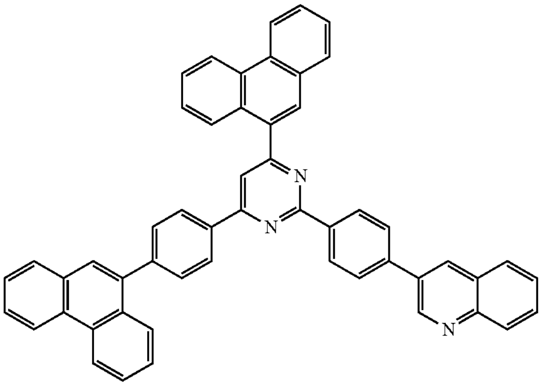
ET24
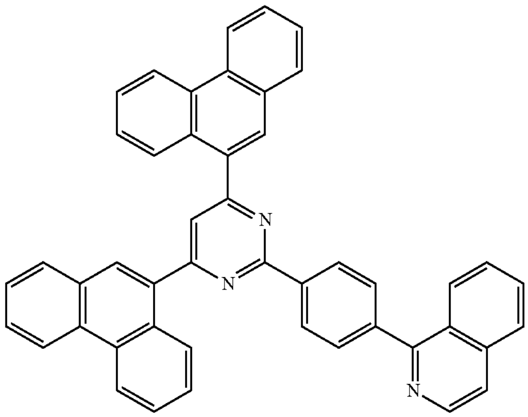

-continued
ET25
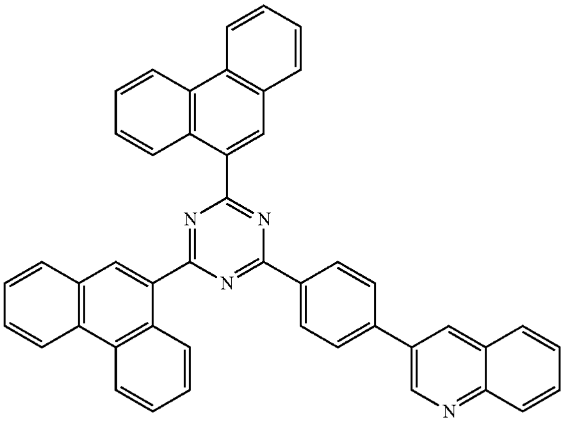
ET26
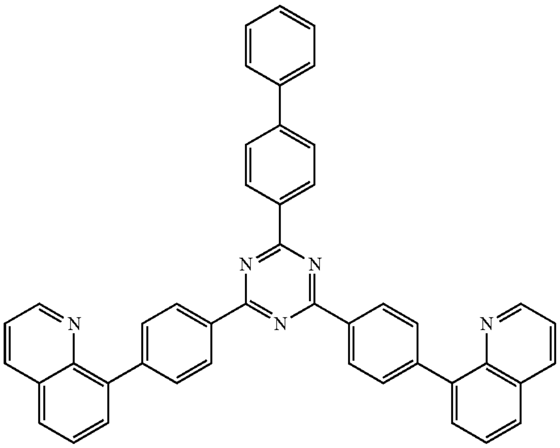
ET27
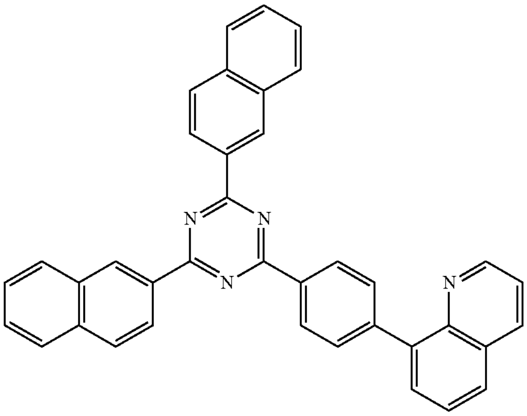
-continued
ET28
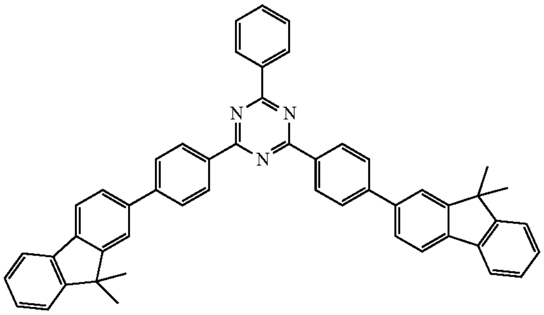
ET29
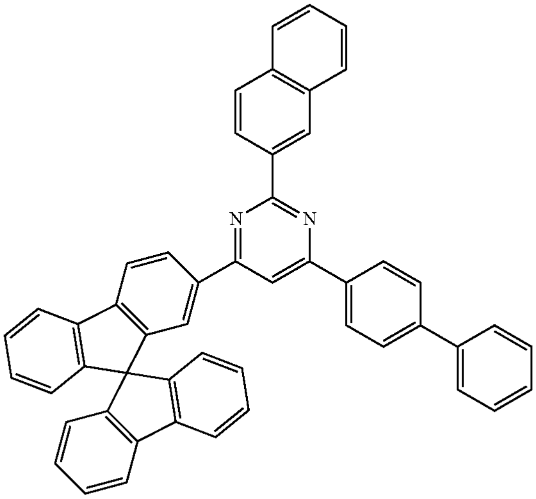
ET30
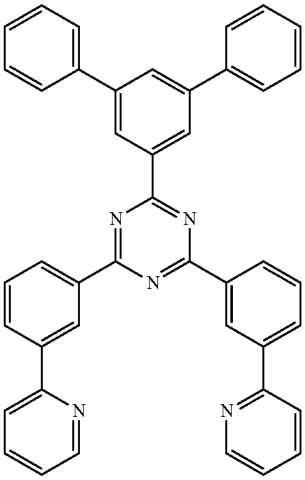

-continued

ET31

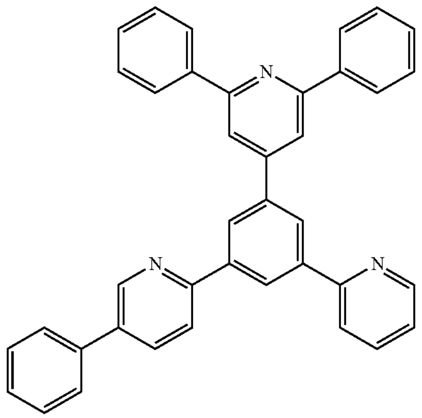

ET32

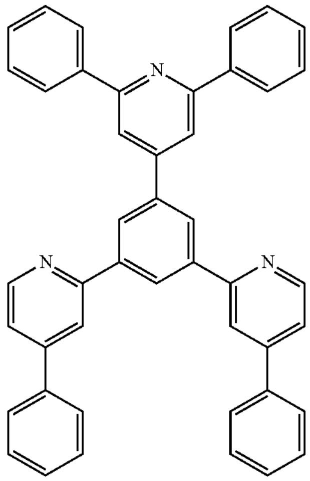

ET33

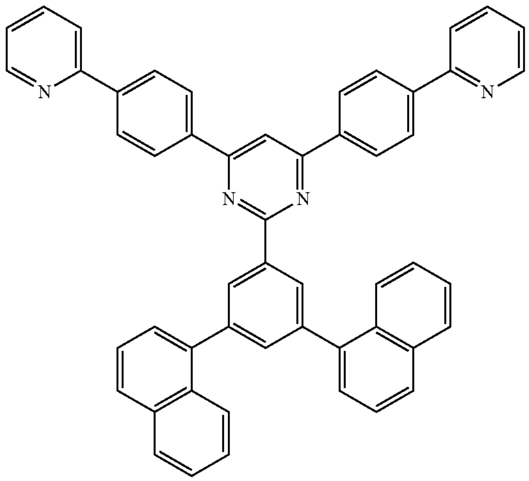

-continued

ET34

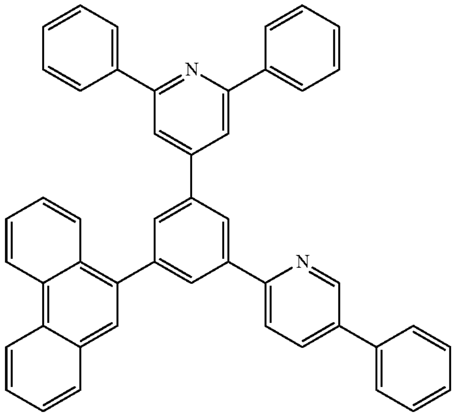

ET35

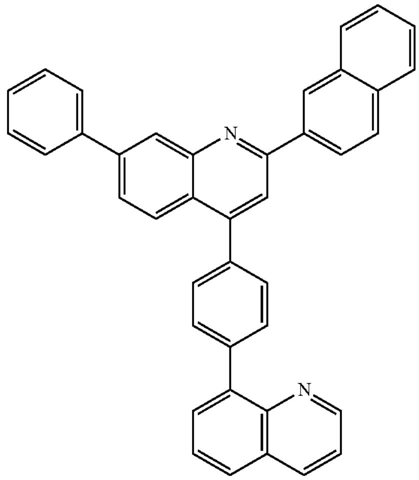

ET36

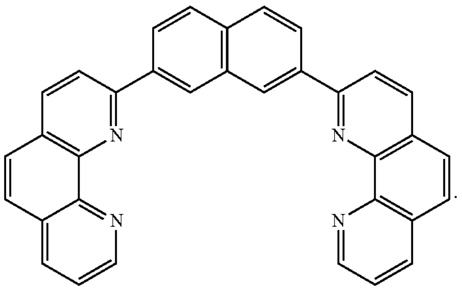

In addition, the electron transport regions ETR may include a metal halide such as LiF, NaCl, CsF, RbCl, RbI, CuI, and/or KI, a lanthanide metal such as Yb, and a co-deposited material of the metal halide and the lanthanide metal. For example, the electron transport region ETR may include KI:Yb, RbI:Yb, LiF:Yb, etc., as a co-deposited material. In one or more embodiments, the electron transport region ETR may be formed using a metal oxide such as $Li_2O$ and/or BaO, and/or 8-hydroxyl-lithium quinolate (Liq), etc., but embodiments of the present disclosure are not limited thereto. The electron transport region ETR may also be formed of a mixture material of an electron transport material and an insulating organometallic salt. The organometallic salt may be a material having an energy band gap of about 4 eV or more. For example, the organometallic salt may include, for example, a metal acetate, a metal benzoate, a metal acetoacetate, a metal acetylacetonate, and/or a metal stearate.

The electron transport region ETR may further include at least one selected from 2,9-dimethyl-4,7-diphenyl-1,10-phenanthroline (BCP), diphenyl(4-(triphenylsilyl)phenyl) phosphine oxide (TSPO1), and 4,7-diphenyl-1,10-phenanthroline (Bphen) in addition to the above-described materials, but embodiments of the present disclosure are not limited thereto.

The electron transport region ETR may include the above-described compounds of the hole transport region in at least one selected from the electron injection layer EIL, the electron transport layer ETL, and the hole blocking layer HBL.

When the electron transport region ETR includes the electron transport layer ETL, the electron transport layer ETL may have a thickness of about 100 Å to about 1,000 Å, for example, about 150 Å to about 500 Å. If the thickness of the electron transport layer ETL satisfies the aforementioned range, suitable or satisfactory electron transport characteristics may be obtained without a substantial increase in driving voltage. When the electron transport region ETR includes the electron injection layer EIL, the electron injection layer EIL may have a thickness of about 1 Å to about 100 Å, for example, about 3 Å to about 90 Å. If the thickness of the electron injection layer EIL satisfies the above-described range, suitable or satisfactory electron injection characteristics may be obtained without a substantial increase in driving voltage.

The second electrode EL2 is provided on the electron transport region ETR. The second electrode EL2 may be a common electrode. The second electrode EL2 may be a cathode or an anode, but embodiments of the present disclosure are not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is the transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, or a compound or mixture thereof (e.g., AgMg, AgYb, and/or MgAg). In one or more embodiments, the second electrode EL2 may have a multilayer structure including a reflective film or a transflective film formed of the above-described materials, and a transparent conductive film formed of ITO, IZO, ZnO, ITZO, etc. For example, the second electrode EL2 may include the above-described metal materials, combinations of at least two metal materials of the above-described metal materials, oxides of the above-described metal materials, and/or the like.

In one or more embodiments, the second electrode EL2 may be connected with an auxiliary electrode. If the second electrode EL2 is connected with the auxiliary electrode, the resistance of the second electrode EL2 may be decreased.

In one or more embodiments, a capping layer CPL may further be on the second electrode EL2 of the light emitting device ED of one or more embodiments. The capping layer CPL may include a multilayer or a single layer.

In one or more embodiments, the capping layer CPL may be an organic layer or an inorganic layer. For example, when the capping layer CPL contains an inorganic material, the inorganic material may include an alkaline metal compound (e.g., LiF), an alkaline earth metal compound (e.g., $MgF_2$), SiON, $SiN_x$, SiOy, etc.

For example, when the capping layer CPL includes an organic material, the organic material may include α-NPD, NPB, TPD, m-MTDATA, $Alq_3$, CuPc, N4,N4,N4',N4'-tetra (biphenyl-4-yl)biphenyl-4,4'-diamine (TPD15), 4,4',4"-tris (carbazol-9-yl)triphenylamine (TCTA), etc., and/or an epoxy resin, and/or acrylate such as methacrylate. However, embodiments of the present disclosure are not limited thereto, and the capping layer CPL may include at least one selected from among Compounds P1 to P5 below:

P1

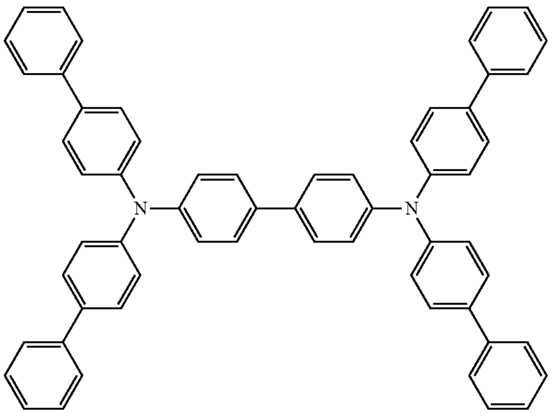

P2

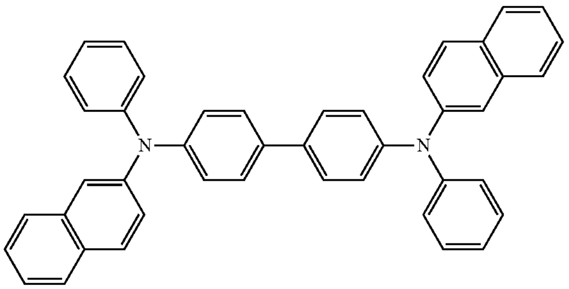

P3

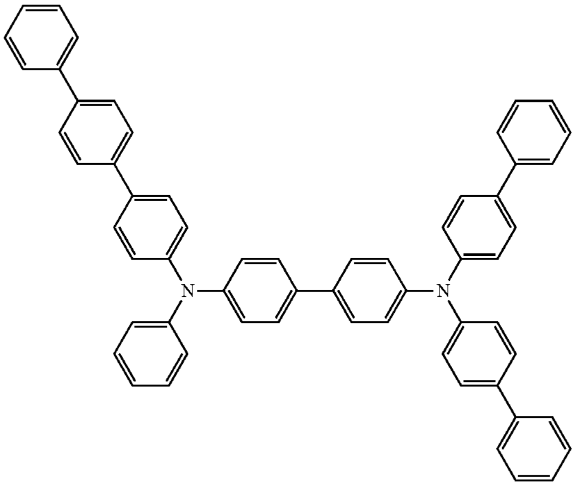

-continued

P4

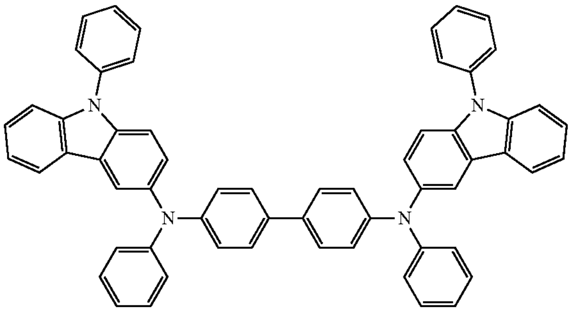

P5

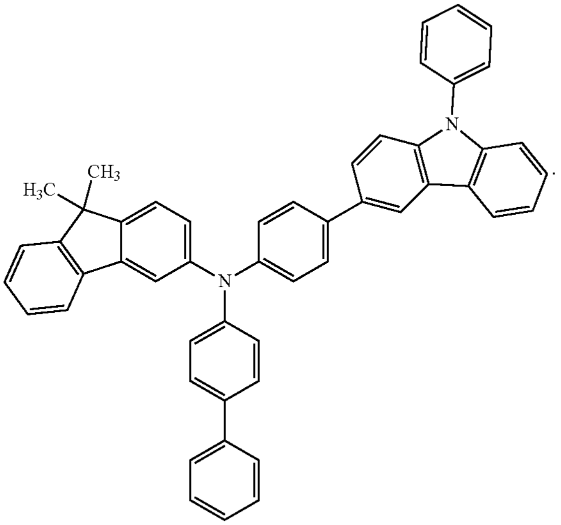

In one or more embodiments, the refractive index of the capping layer CPL may be about 1.6 or more. For example, the refractive index of the capping layer CPL may be 1.6 or more with respect to light in a wavelength range of about 550 nm to about 660 nm.

Each of FIGS. 7 and 8 is a cross-sectional view of a display apparatus according to embodiments of the present disclosure. Hereinafter, in describing the display apparatuses of embodiments with reference to FIGS. 7 and 8, the duplicated features which have been described in FIGS. 1 to 6 are not described again, but their differences will be mainly described.

Referring to FIG. 7, the display apparatus DD according to one or more embodiments may include a display panel DP including a display device layer DP-ED, a light control layer CCL on the display panel DP, and a color filter layer CFL.

In one or more embodiments illustrated in FIG. 7, the display panel DP may include a base layer BS, a circuit layer DP-CL provided on the base layer BS, and the display device layer DP-ED, and the display device layer DP-ED may include a light emitting device ED.

The light emitting device ED may include a first electrode EL1, a hole transport region HTR on the first electrode EL1, an emission layer EML on the hole transport region HTR, an electron transport region ETR on the emission layer EML, and a second electrode EL2 on the electron transport region ETR. In one or more embodiments, the structures of the light emitting devices of FIGS. 3 to 6 as described above may be equally applied to the structure of the light emitting device ED illustrated in FIG. 7.

The emission layer EML of the light emitting device ED included in the display apparatus DD-a according to one or more embodiments may include the above-described fused polycyclic compound of one or more embodiments.

Referring to FIG. 7, the emission layer EML may be in an opening OH defined in a pixel defining film PDL. For example, the emission layer EML which is divided by the pixel defining film PDL and provided corresponding to each light emitting regions PXA-R, PXA-G, and PXA-B may emit light in the same wavelength range. In the display apparatus DD of one or more embodiments, the emission layer EML may emit blue light. In one or more embodiments, the emission layer EML may be provided as a common layer in the entire light emitting regions PXA-R, PXA-G, and PXA-B.

The light control layer CCL may be on the display panel DP. The light control layer CCL may include a light conversion body. The light conversion body may be a quantum dot, a phosphor, and/or the like. The light conversion body may emit provided light by converting the wavelength thereof. For example, the light control layer CCL may include a layer containing the quantum dot and/or a layer containing the phosphor.

The light control layer CCL may include a plurality of light control parts CCP1, CCP2 and CCP3. The light control parts CCP1, CCP2, and CCP3 may be spaced apart from each other.

Referring to FIG. 7, divided patterns BMP may be between the light control parts CCP1, CCP2 and CCP3 which are spaced apart from each other, but embodiments of the present disclosure are not limited thereto. FIG. 7 illustrates that the divided patterns BMP do not overlap the light control parts CCP1, CCP2 and CCP3, but at least a portion of the edges of the light control par s CCP1, CCP2 and CCP3 may overlap the divided patterns BMP.

The light control layer CCL may include a first light control part CCP1 containing a first quantum dot QD1 which converts a first color light provided from the light emitting device ED into a second color light, a second light control part CCP2 containing a second quantum dot QD2 which converts the first color light into a third color light, and a third light control part CCP3 which transmits the first color light.

In one or more embodiments, the first light control part CCP1 may provide red light that is the second color light, and the second light control part CCP2 may provide green light that is the third color light. The third light control part CCP3 may provide blue light by transmitting the blue light that is the first color light provided from the light emitting device ED. For example, the first quantum dot QD1 may be a red quantum dot, and the second quantum dot QD2 may be a green quantum dot. The same as described above may be applied with respect to the quantum dots QD1 and QD2.

In addition, the light control layer CCL may further include a scatterer SP (e.g., a light scatterer SP). The first light control part CCP1 may include the first quantum dot QD1 and the scatterer SP, the second light control part CCP2 may include the second quantum dot QD2 and the scatterer SP, and the third light control part CCP3 may not include any quantum dot but include the scatterer SP.

The scatterer SP may be inorganic particles. For example, the scatterer SP may include at least one selected from $TiO_2$, ZnO, $Al_2O_3$, $SiO_2$, and hollow sphere silica. The scatterer SP may include any one selected from among $TiO_2$, ZnO, $Al_2O_3$, $SiO_2$, and hollow sphere silica, or may be a mixture of at least two materials selected from among $TiO_2$, ZnO, $Al_2O_3$, $SiO_2$, and hollow sphere silica.

The first light control part CCP1, the second light control part CCP2, and the third light control part CCP3 each may include base resins BR1, BR2, and BR3 in which the quantum dots QD1 and QD2 and the scatterer SP are dispersed. In one or more embodiments, the first light control part CCP1 may include the first quantum dot QD1 and the scatterer SP dispersed in a first base resin BR1, the second light control part CCP2 may include the second quantum dot QD2 and the scatterer SP dispersed in a second base resin BR2, and the third light control part CCP3 may include the scatterer SP dispersed in a third base resin BR3. The base resins BR1, BR2, and BR3 are media in which the quantum dots QD1 and QD2 and the scatterer SP are dispersed, and may be formed of various suitable resin compositions, which may be generally referred to as a binder. For example, the base resins BR1, BR2, and BR3 may be acrylic-based resins, urethane-based resins, silicone-based resins, epoxy-based resins, etc. The base resins BR1, BR2, and BR3 may be transparent resins. In one or more embodiments, the first base resin BR1, the seco d base resin BR2, and the third base resin BR3 may be the same as or different from each other.

The light control layer CCL may include a barrier layer BFL1. The barrier layer BFL1 may serve to prevent or reduce the penetration of moisture and/or oxygen (hereinafter, referred to as 'moisture/oxygen'). The barrier layer BFL1 may be on the light control parts CCP1, CCP2, and CCP3 to block the light control parts CCP1, CCP2 and CCP3 from being exposed to moisture/oxygen. In one or more embodiments, the barrier layer BFL1 may cover the light control parts CCP1, CCP2, and CCP3. In addition, the barrier layer BFL2 may be provided between the light control parts CCP1, CCP2, and CCP3 and the color filter layer CFL.

The barrier layers BFL1 and BFL2 may include at least one inorganic layer. For example, the barrier layers BFL1 and BFL2 may include an inorganic material. For example, the barrier layers BFL1 and BFL2 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, a metal thin film which secures a transmittance, etc. In one or more embodiments, the barrier layers BFL1 and BFL2 may further include an organic film. The barrier layers BFL1 and BFL2 may be formed of a single layer or a plurality of layers.

In the display apparatus DD of one or more embodiments, the color filter layer CFL may be on the light control layer CCL. For example, the color filter layer CFL may be directly on the light control layer CCL. In this case, the barrier layer BFL2 may be omitted.

The color filter layer CFL may include a light shielding part BM and color filters CF1, CF2, and CF3. The color filter layer CFL may include a first filter CF1 configured to transmit the second color light, a second filter CF2 configured to transmit the third color light, and a third filter CF3 configured to transmit the first color light. For example, the first filter CF1 may be a red filter, the second filter CF2 may be a green filter, and the third filter CF3 may be a blue filter. The filters CF1, CF2, and CF3 each may include a polymeric photosensitive resin and a pigment and/or dye. The first filter CF1 may include a red pigment and/or dye, the second filter CF2 may include a green pigment and/or dye, and the third filter CF3 may include a blue pigment and/or dye. Embodiments of the present disclosure are not limited thereto, however, and the third filter CF3 may not include a pigment or dye. The third filter CF3 may include a polymeric photosensitive resin and may not include a pigment of dye. The third filter CF3 may be transparent. The third filter CF3 may be formed of a transparent photosensitive resin.

Furthermore, in one or more embodiments, the first filter CF1 and the second filter CF2 may be a yellow filter. The first filter CF1 and the second filter CF2 may not be separated but be provided as one filter.

The light shielding part may be a black matrix. The light shielding part may include an organic light shielding material or an inorganic light shielding material containing a black pigment and/or dye. The light shielding part may prevent or reduce light leakage, and may separate boundaries between the adjacent filters CF1, CF2, and CF3. In addition, in one or more embodiments, the light shielding part may be formed of a blue filter.

The first to third filters CF1, CF2, and CF3 may correspond to the red light emitting region PXA-R, the green light emitting region PXA-G, and the blue light emitting region PXA-B, respectively.

A base substrate BL may be on the color filter layer GFL. The color filter layer CFL, the light control layer CCL, and the like may be on a base surface of the base substrate BL. The base substrate BL may be a glass substrate, a metal substrate, a plastic substrate, etc. However, embodiments of the present disclosure are not limited thereto, and the base substrate BL may be an inorganic layer, an organic layer, or a composite material layer. In addition, unlike the configuration illustrated, in one or more embodiments, the base substrate BL may be omitted.

FIG. 8 is a cross-sectional view illustrating a portion of a display apparatus according to one or more embodiments. In the display apparatus DD-TD of one or more embodiments, the light emitting device ED-BT may include a plurality of light emitting structures OL-B1, OL-B2, and OL-B3. The light emitting device ED-BT may include a first electrode EL1 and a second electrode EL2 which face each other, and the plurality of light emitting structures OL-B1, OL-B2, and OL-B3 sequentially stacked in the thickness direction between the first electrode EL1 and the second electrode EL2. The light emitting structures OL-B1, OL-B2, and OL-B3 each may include an emission layer EML (FIG. 7) and a hole transport region HTR and an electron transport region ETR having the emission layer EML (FIG. 7) therebetween.

In one or more embodiments, the light emitting device ED-BT included in the display apparatus DD-TD of one or more embodiments may be a light emitting device having a tandem structure and including a plurality of emission layers.

In one or more embodiments illustrated in FIG. 8, all light beams respectively emitted from the light emitting structures OL-B1, OL-B2, and OL-B3 may be blue light. However, embodiments of the present disclosure are not limited thereto, and the light beams respectively emitted from the light emitting structures OL-B1, OL-B2, and OL-B3 may have wavelength ranges different from each other. For example, the light emitting device ED-BT including the plurality of light emitting structures OL-B1, OL-B2, and OL-B3 which emit light beams having wavelength ranges different from each other may emit white light.

Charge generation layers CGL1 and CGL2 may be respectively between two of the neighboring light emitting structures OL-B1, OL-B2, and OL-B3. The charge generation layers CGL1 and CGL2 may include a p-type charge generation layer and/or an n-type charge generation layer.

At least one selected from among the light emitting structures OL-B1, OL-B2, and OL-B3 included in the display apparatus DD-TD of one or ore embodiments may contain the above-described fused polycyclic compound of one or more embodiments. For example, at least one selected from among the plurality of emission layers included in the light emitting device ED-BT may include the fused polycyclic compound of one or more embodiments.

FIG. 9 is a cross-sectional view illustrating a display apparatus according to embodiments of the present disclosure. FIG. 10 is a cross-sectional view illustrating a display apparatus according to embodiments of the present disclosure.

Referring to FIG. 9, the display apparatus DD-b according to one or more embodiments may include light emitting devices ED-1, ED-2, and ED-3 in which two emission layers are stacked. Compared with the display apparatus DD of one or more embodiments illustrated in FIG. 2, one or more embodiments illustrated in FIG. 9 have a difference in that the first to third light emitting devices ED-1, ED-2, and ED-3 each include two emission layers stacked in the thickness direction. In each of the first to third light emitting devices ED-1, ED-2, and ED-3, the two emission layers may emit light in the same wavelength region.

The first light emitting device ED-1 may include a first red emission layer EML-R1 and a second red emission layer EML-R2. The second light emitting device ED-2 may include a first green emission layer EML-G1 and a second green emission layer EML-G2. In addition, the third light emitting device ED-3 may include a first blue emission layer EML-B1 and a second blue emission layer EML-B2. An emission auxiliary part OG may be between the first red emission layer EML-R1 and the second red emission layer EML-R2, between the first green emission layer EML-G1 and the second green emission layer EML-G2, and between the first blue emission layer EML-B1 and the second blue emission layer EML-B2.

The emission auxiliary part OG may include a single layer or a multilayer. The emission auxiliary part OG may include a charge generation layer. For example, the emission auxiliary part OG may include an electron transport region, a charge generation layer, and a hole transport region that are sequentially stacked. The emission auxiliary part OG may be provided as a common layer in the whole of the first to third light emitting devices ED-1, ED-2, and ED-3. However, embodiments of the present disclosure are not limited thereto, and the emission auxiliary part OG may be provided by being patterned within the openings OH defined in the pixel defining film PDL.

The first red emission layer EML-R1, the first green emission layer EML-G1, and the first blue emission layer EML-B1 may be between the hole transport region HTR and the emission auxiliary part OG. The second red emission layer EML-R2, the second green emission layer EML-G2, and the second blue emission layer EML-B2 may be between the emission auxiliary part OG and the electron transport region ETR.

In one or more embodiments, the first light emitting device ED-1 may include the first electrode EL1, the hole transport region HTR, the second red emission layer EML-R2, the emission auxiliary part OG, the first red emission layer EML-R1, the electron transport region ETR, and the second electrode EL2 that are sequentially stacked. The second light emitting device ED-2 may include the first electrode EL1, the hole transport region HTR, the second green emission layer EML-G2, the emission auxiliary part OG, the first green emission layer EML-G1, the electron transport region ETR, and the second electrode EL2 that are sequentially stacked. The third light emitting device ED-3 may include the first electrode EL1, the hole transport region HTR, the second blue emission layer EML-B2, the emission auxiliary part OG, the first blue emission layer EML-B1, the electron transport region ETR, and the second electrode EL2 that are sequentially stacked.

In one or more embodiments, an optical auxiliary layer PL may be on the display device layer DP-ED. The optical auxiliary layer PL may include a polarizing layer. The optical auxiliary layer PL may be on the display panel DP and control reflected light in the display panel DP due to external light. Unlike the configuration illustrated, the optical auxiliary layer PL in the display apparatus according to one or more embodiments may be omitted.

At least one emission layer included in the display apparatus DD-b of one or more embodiments illustrated in FIG. 9 may include the above-described fused polycyclic compound of one or more embodiments. For example, in one or more embodiments, at least one selected from the first blue emission layer EML-B1 and the second blue emission layer may include the fused polycyclic compound of one or more embodiments.

Unlike FIGS. 8 and 9, FIG. 10 illustrates that a display apparatus DD-c includes four light emitting structures OL-B1, OL-B2, OL-B3, and OL-C1. A light emitting device ED-CT may include a first electrode EL1 and a second electrode EL2 which face each other, and first to fourth light emitting structures OL-B1, OL-B2, OL-B3, and OL-C1 that are sequentially stacked in the thickness direction between the first electrode EL1 and the second electrode EL2. Charge generation layers CGL1, CGL2, and CGL3 may be between the first to fourth light emitting structures OL-B1, OL-B2, OL-B3, and OL-C1. Among the four light emitting structures, the first to third light emitting structures OL-B1, OL-B2, and OL-B3 may emit blue light, and the fourth light emitting structure OL-C1 may emit green light. However, embodiments of the present disclosure are not limited thereto, and the first to fourth light emitting structures OL-B1, OL-B2, OL-B3, and OL-C1 may emit light beams in different wavelength regions.

The charge generation layers CGL1, CGL2, and CGL3 between adjacent light emitting structures OL-B1, OL-B2, OL-B3, and OL-C1 may include a p-type charge generation layer and/or an n-type charge generation lay r.

At least one selected from among the light emitting structures OL-B1, OL-B2, OL-B3, and OL-C1 included in the display apparatus DD-c of one or more embodiments may contain the above-described fused polycyclic compound of one or more embodiments. For example, in one or more embodiments, at least one selected from among the first to third light emitting structures OL-B1, OL-B2, and OL-B3 may include the described-above fused polycyclic compound of one r more embodiments.

FIG. 11 is a perspective view schematically illustrating an electronic apparatus including a display apparatus according to embodiments of the present disclosure. FIG. 11 illustrates an electronic apparatus including display apparatuses for a vehicle as an example.

Referring to FIG. 11, the electronic device ED of one or more embodiments may include display apparatuses DD-1, DD-2, DD-3, and DD-4 for a vehicle AM. FIG. 11 illustrates the first to fourth display apparatuses DD-1, DD-2, DD-3, and DD-4 as display apparatuses for a vehicle AM inside the vehicle AM. FIG. 11 illustrates a vehicle, but this is an example, and the first to fourth display apparatuses DD-1, DD-2, DD-3, and DD-4 may be in various suitable transportation means such as bicycles, motorcycles, trains, ships, and airplanes. At least one selected from among the first to fourth display apparatuses DD-1, DD-2, DD-3, and DD-4 may include the same configuration as the display apparatuses DD, DD-a, DD-b, and DD-c as described with reference to FIG. 1, FIG. 2, and FIGS. 7 to 10.

In one or more embodiments, at least one selected from among the first to fourth display apparatuses DD-1, DD-2, DD-3, and DD-4 may include the light emitting device ED as described with reference to FIGS. 3 to 6. The fir t to fourth display apparatuses DD-1, DD-2, DD-3, and DD-4 may each independently include a plurality of light emitting devices ED, and each of the light emitting devices ED may include a first electrode EL1, a hole transport region HTR on the upper portion of the first electrode EL1, an emission layer EML on the upper portion of the hole transport region HTR, an electron transport region ETR on the upper portion of the emission layer EML, and a second electrode on the upper portion of the electron transport region ETR. Also, the emission layer EML may include the above-described polycyclic compound represented by Formula 1 of one or more embodiments. Accordingly, the electronic device ED of one or more embodiments may exhibit improved image quality.

Referring to FIG. 11, the vehicle AM may include a steering wheel HA and a gear GR for driving the vehicle AM, and a front window GL may face the driver.

The first display apparatus DD-1 may be in a first region overlapping the steering wheel HA. For example, the first display apparatus DD-1 may be a digital cluster for displaying first information of the vehicle AM. The first information may include a scale for indicating a driving speed of the vehicle AM, a scale for indicating an engine speed (that is, revolutions per minute (RPM)), an image for indicating a fuel state, etc. A first scale and a second scale may be indicated as a digital image.

The second display apparatus DD-2 may be in a second region facing the driver's seat and overlapping the front window WD. The driver's seat may be a seat corresponding to the steering wheel HA. For example, the second display apparatus DD-2 may be a head up display (HUD) for displaying second information of the vehicle AM. The second display apparatus DD-2 may be optically transparent. The second information may include digital numbers DN for indicating a driving speed, and may further include information such as the current time.

The third display apparatus DD-3 may be in a third region adjacent to the gear GR. For example, the third display apparatus DD-3 may be between the driver's seat and the passenger seat and may be a center information display (CID) for a vehicle for displaying third information. The passenger seat may be a seat spaced apart from the driver's seat with the gear GR therebetween. The third information may include information about traffic (e.g., navigation information), playing music or radio, playing video, temperatures inside the vehicle AM, etc.

The fourth display apparatus DD-4 may be spaced apart from the steering wheel HA and the gear GR, and may be in a fourth region adjacent to the side of the vehicle AM. For example, the fourth display apparatus DD-4 array be a digital side-view mirror for displaying fourth information. The fourth display apparatus DD-4 may display an image outside the vehicle AM taken by a camera module CM outside the vehicle AM. The fourth information may include an image outside the vehicle AM.

The above-described first to fourth information may be examples, and the first to fourth display apparatuses DD-1, DD-2, DD-3, and DD-4 may further display information about the inside and outside of the vehicle. The first to fourth information may include different information. However, embodiments of the present disclosure are not limited thereto, and a part of the first to fourth information may include the same information as one another.

Hereinafter, with reference to Examples and Comparative Examples, a fused polycyclic according to embodiments of the present disclosure and a luminescence device of embodiments of the present disclosure will be described in more detail. In addition, the Examples described below are only illustrations to assist understanding of the subject matter of the present disclosure, and the scope of the present disclosure is not limited thereto.

EXAMPLES

1. Synthesis of Fused Polycyclic Compound

First, a synthetic method of the fused polycyclic compound according to one or more embodiments will be further explained by illustrating the synthetic methods of Compounds 3, 21, 47, 57, 83 and 92. In addition, the synthetic methods of the fused polycyclic compounds as described below are only examples, and the synthetic method of the fused polycyclic compound according to embodiments of the present disclosure is not limited to the following examples.

(1) Synthesis of Compound 3

Fused Polycyclic Compound 3 according to an example may be synthesized for example, by the reaction below:

Synthesis of Intermediate 3-1

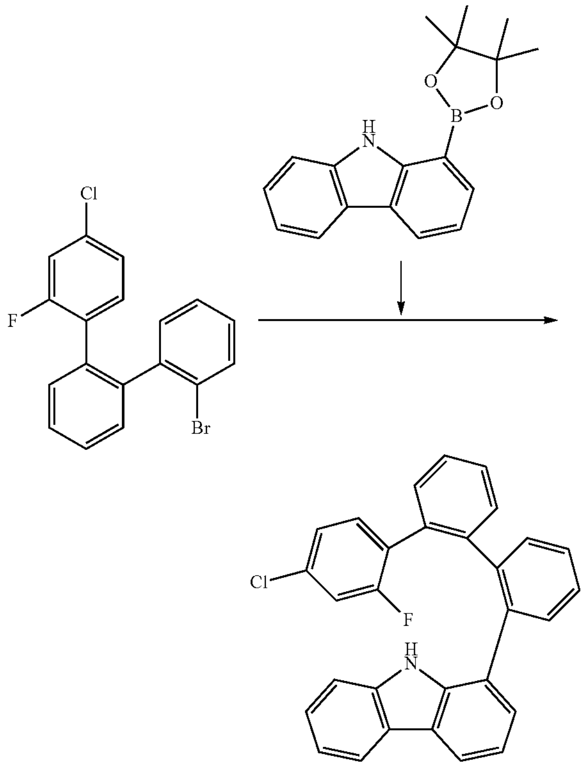

3-1

2"-bromo-4-chloro-2-fluoro-1,1':2',1"-terphenyl (1 eq), 1-(4,4,5,5-tetramethyl-1,3,2-dioxaborolan-2-yl)-9H-carbazole (1.1 eq), $Pd(PPh_3)_4$ (0.0 eq), and $K_2CO_3$ (3 eq) were dissolved in a mixed solution of water and THE (2:1), and then the resultant mixture was stirred at about 80° C. for about 12 hours. After being cooled, the mixture was washed three times with ethyl acetate and water, and then subjected to liquid separation to obtain an organic layer. The obtained organic layer was dried over $MgSO_4$, and then dried under reduced pressure. The resulting product was purified by column chromatography using methylene chloride and n-hexan to obtain Intermediate 3-1. (yield: 67%)

Synthesis of Intermediate 3-2

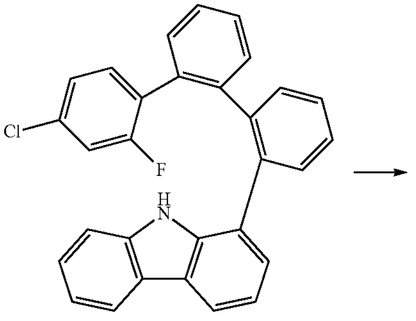

3-1

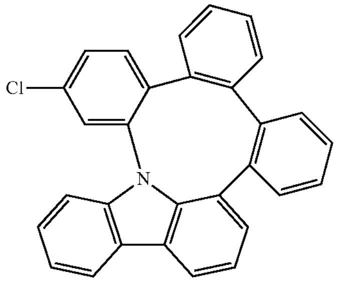

3-2

Intermediate 3-1 (0.1 eq), and $K_3PO_4$ (2 eq) were dissolved in DMF and then stirred at about 140° C. for about 12 hours. After the resultant mixture was cooled, the solvent was removed under reduced pressure, and the residue was washed three times with ethyl acetate and water, and then subjected to liquid separation to obtain an organic layer. The obtained organic layer was dried over $MgSO_4$, and then dried under reduced pressure. The resulting product was purified by column chromatography using methylene chloride and n-hexane to obtain Intermediate 3-2. (yield: 35%)

Synthesis of Intermediate 3-3

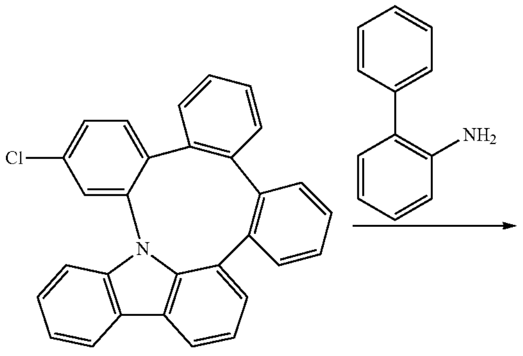

3-2

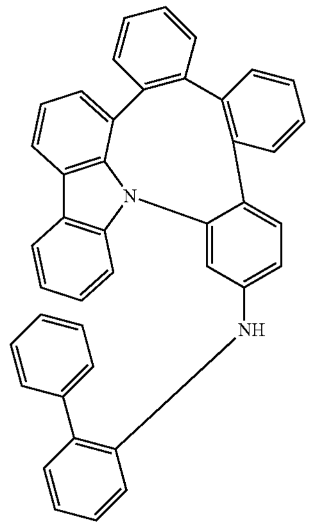

3-3

Intermediate 3-2 (1 eq), [1,1'-biphenyl]-2-amine (1.2 eq), tris(dibenzylideneacetone)dipalladium(0) (0.05 eq), tri-tert-butylphosphine (0.1 eq), and sodium tert-butoxide (3 eq) were dissolved in toluene, and then the resultant mixture was stirred at about 90° C. for about 8 hours. After being cooled, the mixture was washed three times with ethyl acetate and water, and then subjected to liquid separation to obtain an organic layer. The obtained organic layer was dried over $MgSO_4$, and then dried under reduced pressure. The resulting product was purified by column chromatography using methylene chloride and n-hexane to obtain Intermediate 3-3. (yield: 51%)

Synthesis of Intermediate 3-4

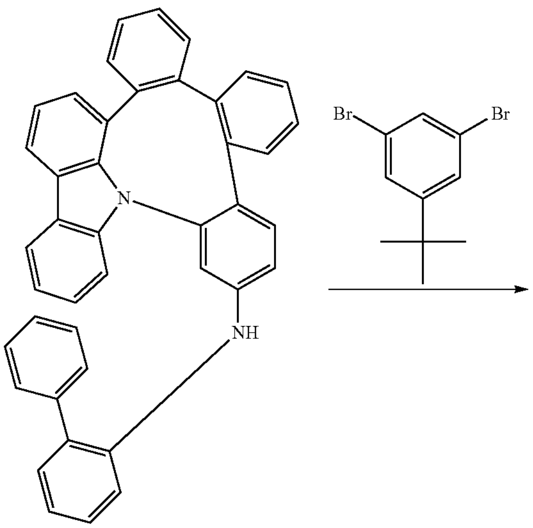

3-3

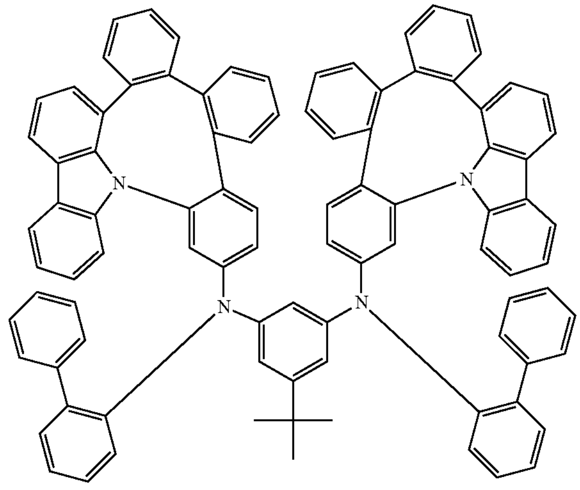

3-4

1,3-dibromo-5-(tert-butyl)benzene (1 eq), Intermediate 3-3 (2.05 eq), tris(dibenzylideneacetone)dipalladium(0) (0.05 eq), tri-tert-butylphosphine (0.1 eq), and sodium tert-butoxide (3 eq) were dissolved in toluene, and then the resultant mixture was stirred at about 110° C. for about 24 hours. After being cooled, the mixture was washed three times with ethyl acetate and water, and then subjected to liquid separation to obtain an organic layer. The obtained organic layer was dried over $MgSO_4$, and then dried under reduced pressure. The resulting product was purified by column chromatography using methylene chloride and n-hexane to obtain Intermediate 3-4. (yield: 63%)

Synthesis of Compound 3

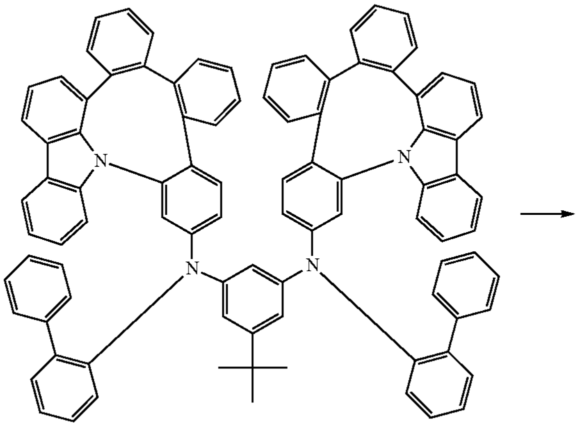

3-4

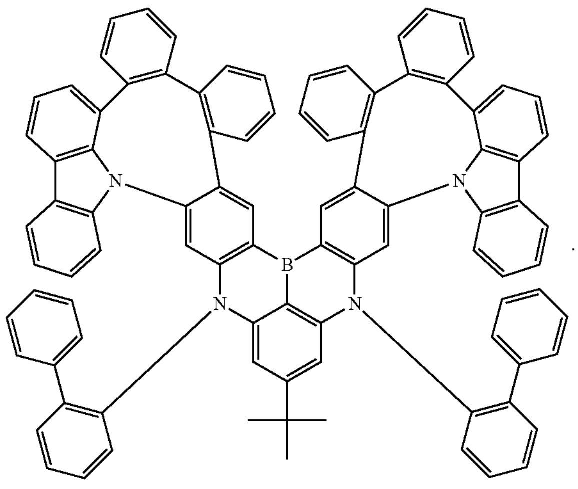

3

Intermediate 3-4 (1 eq) was dissolved in ortho dichlorobenezene, the mixture was then cooled to about 0° C., and then $BBr_3$ (4 eq) was slowly injected thereto in a nitrogen atmosphere. After dropping was completed, the temperature was elevated to about 180° C., and the resultant mixture was stirred for about 48 hours. After being cooled, the reaction was terminated by slowly dropping triethylamine in the flask containing the reactant, and then ethyl alcohol was added to the reactant, followed by extraction and filtration to obtain solids. The obtained solids were purified by column chromatography using methylene chloride and n-hexane, and were then subjected to recrystallization using toluene and acetone to obtain Compound 3. (yield: 4%)

(2) Synthesis of Compound 21

Fused Polycyclic Compound 21 according to an example may be synthesized by, for example, the reaction below:

Synthesis of Intermediate 21-1

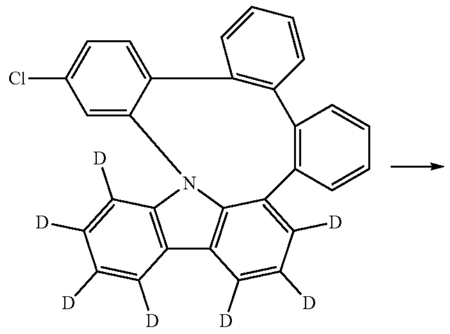

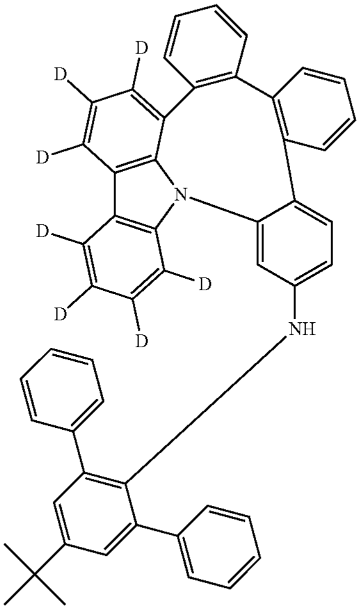

21-1

10-chlorotribenzo[4,5:6,7:8,9]azonino[3,2,1-jk]carbazole-1,2,3,4,5,6,7-d7 (1 eq), 5'-(tert-butyl)-[1,1':3',1"-terphenyl]-2'-amine (1.2 eq), tris(dibenzylideneacetone)dipalladium(0) (0.05 eq), tri-tert-butylphosphine (0.1 eq), and sodium tert-butoxide (3 eq) were dissolved in toluene, and then the resultant mixture was stirred at about 100° C. for about 12 hours. After being cooled, the mixture was washed three times with ethyl acetate and water, and then subjected to liquid separation to obtain an organic layer. The obtained organic layer was dried over $MgSO_4$, and then dried under reduced pressure. The resulting product was purified by column chromatography using methylene chloride and n-hexane to obtain Intermediate 21-1. (yield: 67%)

Synthesis of Intermediate 21-2

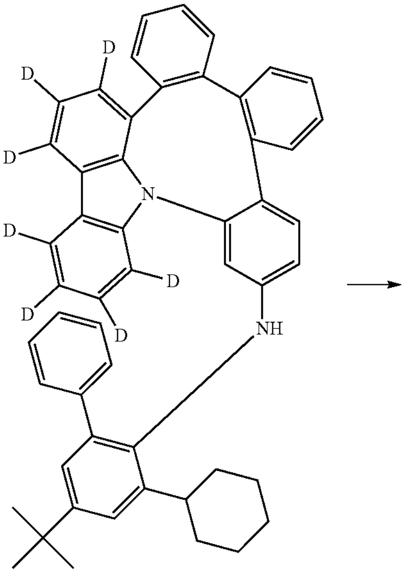

21-1

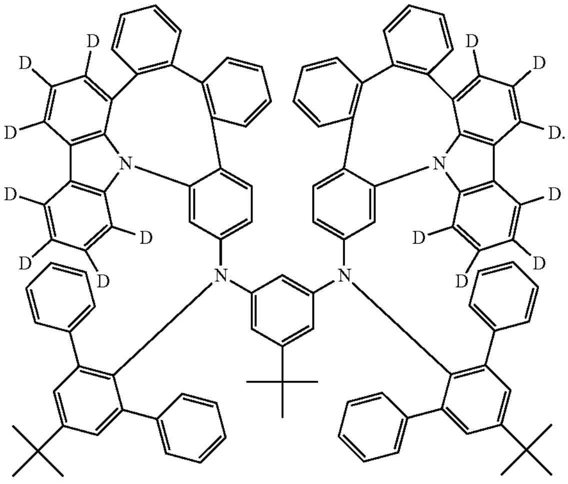

21-2

1,3-dibromo-5-(tert-butyl)benzene (1 eq), Intermediate 21-1 (2 eq), tris(dibenzylideneacetone)dipalladium(0) (0.2 eq), tri-tert-butylphosphine (0.4 eq), and sodium tert-butoxide (3 eq) were dissolved in o-xylene, and then the resultant mixture was stirred at about 150° C. for about 60 hours. After being coiled, the mixture was washed three times with ethyl acetate and water, and then subjected to liquid separation to obtain an organic layer. The obtained organic layer was dried over $MgSO_4$, and then dried under reduced pressure. The resulting product was purified by column chromatography using methylene chloride and n-hexane to obtain Intermediate 21-2. (yield: 32%)

Synthesis of Compound 21

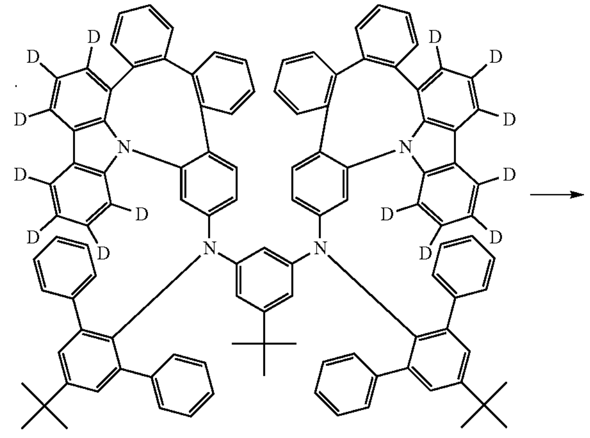

21-2

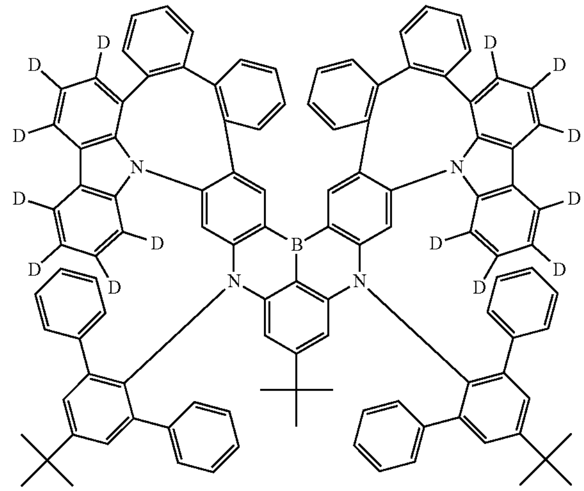

21

Intermediate 21-2 (1 eq) was dissolved in ortho dichlorobenzene, the mixture was then cooled to about 0° C., and then $BBr_3$ (4 eq) was slowly injected thereto in a nitrogen atmosphere. After dropping was completed, the temperature was elevated to about 180° C., and the resultant mixture was stirred for about 48 hours. After being cooled, the reaction was terminated by slowly dropping triethylamine in the flask containing the reactant, and then ethyl alcohol was added to the reactant, followed by extraction and filtration to obtain solids. The obtained solids were purified by column chromatography using methylene chloride and n-hexane, and were then subjected to recrystallization using toluene and acetone to obtain Compound 21. (yield: 3%)

(3) Synthesis of Compound 47

Fused Polycyclic Compound 47 according to an example may be synthesized, for example, by the reaction below:

Synthesis of Intermediate 47-1

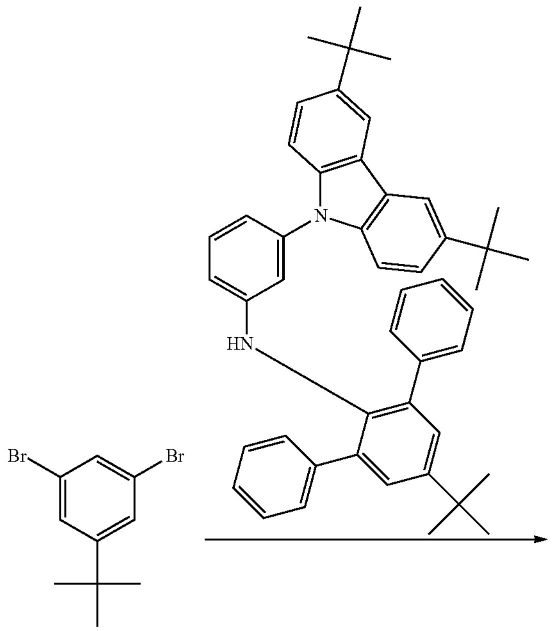

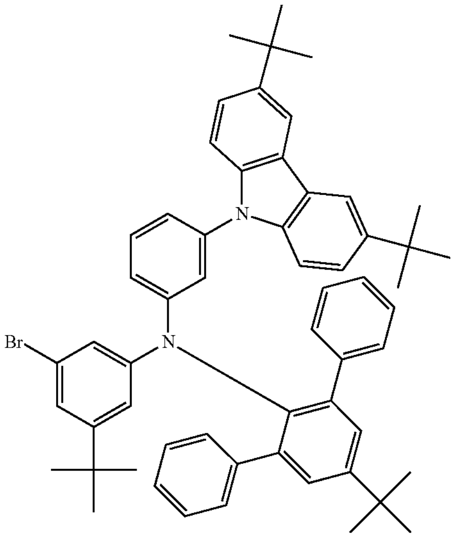

47-1

1,3-dibromo-5-(tert-butyl)benzene (1 eq), 5'-(tert-butyl)-N-(3-(3,6-di-tert-butyl-9H-carbazol-9-yl)phenyl)-[1,1':3', 1"-terphenyl]-2'-amine (1 eq), tris(dibenzylideneacetone)dipalladium(0) (0.05 eq), tri-tert-butyl phosphine (0.1 eq), and sodium tert-butoxide (3 eq) were dissolved in toluene, and then the resultant mixture was stirred at about 110° C. for about 12 hours. After being cooled, the mixture was washed three times with ethyl acetate and water, and then subjected to liquid separation to obtain an organic layer. The obtained organic layer was dried over $MgSO_4$, and then dried under reduced pressure. The resulting product was purified by column chromatography using methylene chloride and n-hexane to obtain Intermediate 47-1. (yield: 31%)

Synthesis of Intermediate 47-2

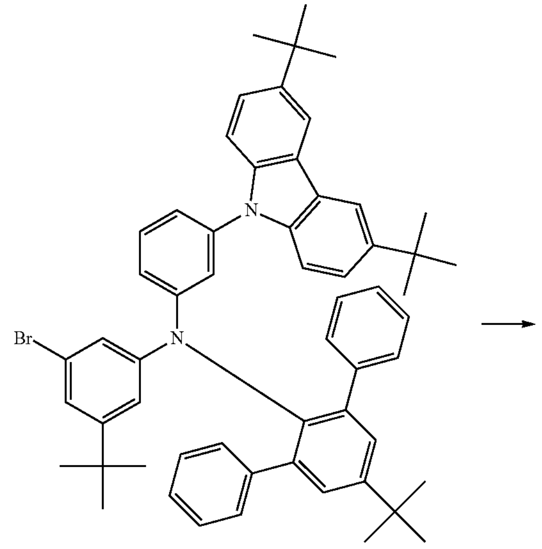

47-1

-continued

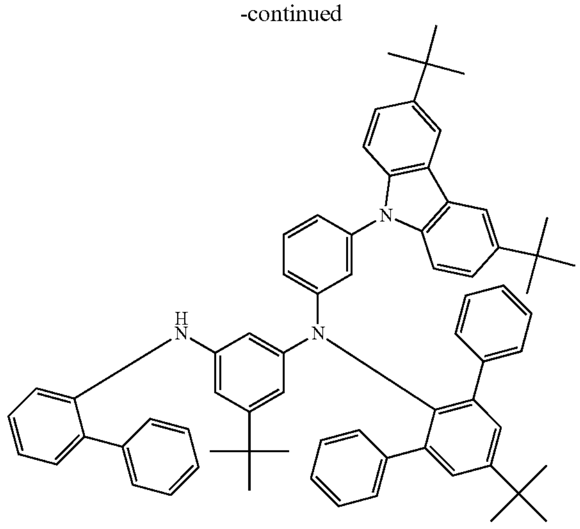

47-2

Intermediate 47-1 (1 eq), [1,1'-biphenyl]-2-amine (1.3 eq), tris(dibenzylideneacetone)dipalladium(0) (0.05 eq), tri-tert-butylphosphine (0.1 eq), and sodium tert-butoxide (3 eq) were dissolved in toluene, and then the resultant mixture was stirred at about 100° C. for about 12 hours. After being cooled, the mixture was washed three times with ethyl acetate and water, and then subjected to liquid separation to obtain an organic layer. The obtained organic layer was dried over $MgSO_4$, and then dried under reduced pressure. The resulting product was purified by column chromatography using methylene chloride and n-hexane to obtain Intermediate 47-2. (yield: 88%)

Synthesis of Intermediate 47-3

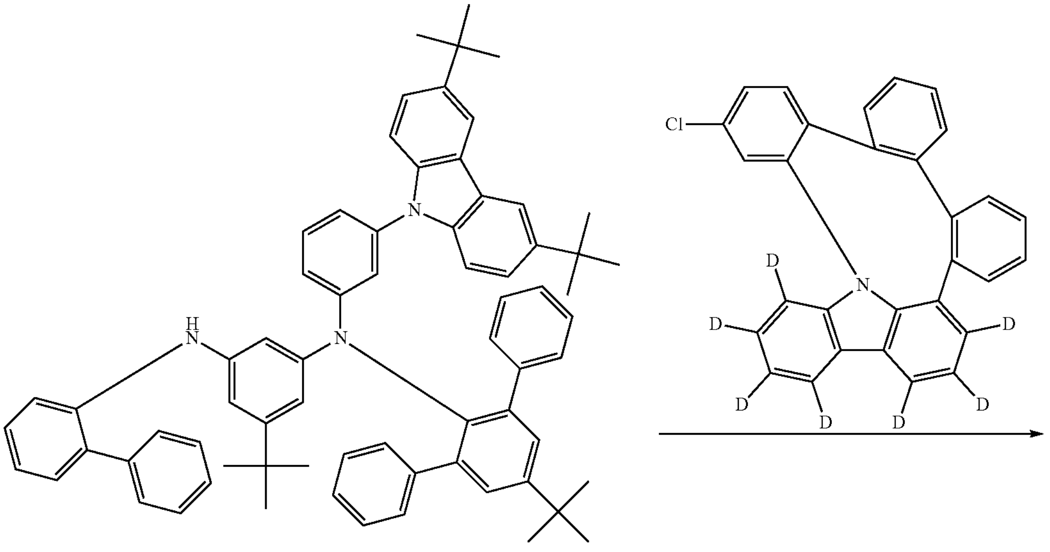

47-2

-continued

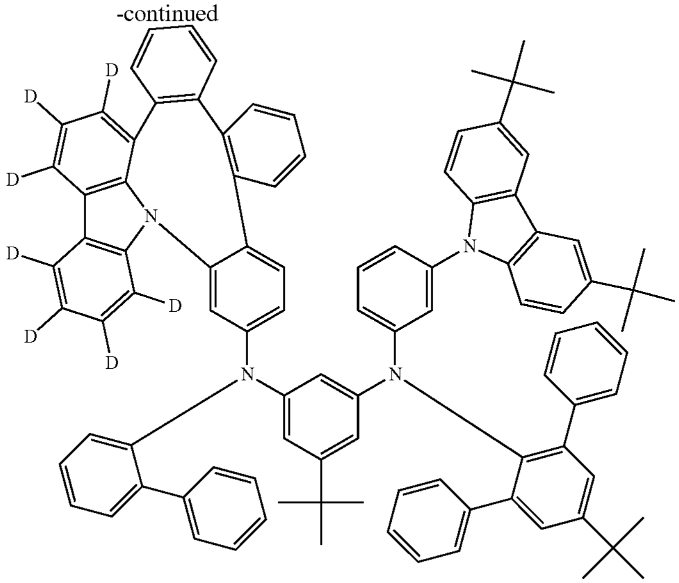

47-3

Intermediate 47-2 (1 eq), 10-chlorotribenzo[4,5:6,7:8,]azonino[3,2,1-jk]carbazole-1,2,3,4,5,6,7-d7 (1 eq), tris(dibenzylideneacetone)dipalladium(0) (0.15 eq), tri-tert-butylphosphine (0.3 eq), and sodium tert-butoxide (3 eq) were dissolved in o-xylene, and then the resultant mixture was stirred at about 15° C. for about 48 hours. After being cooled, the mixture was washed three times with ethyl acetate and water, and then subjected to liquid separation to obtain an organic layer. The obtained organic layer was dried over $MgSO_4$, and then dried under reduced pressure. The resulting product was purified by column chromatography using methylene chloride and n-hexane to obtain Intermediate 47-3. (yield: 40%)

Synthesis of Compound 47

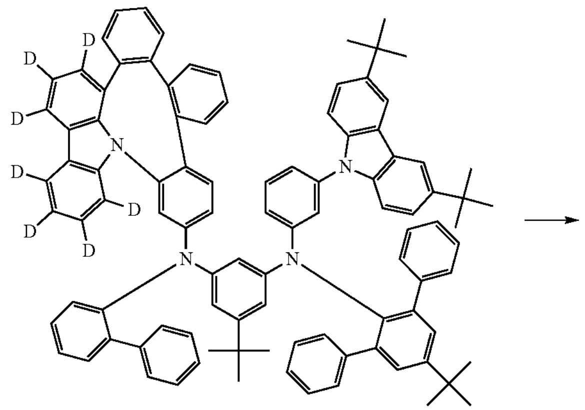

47-3

-continued

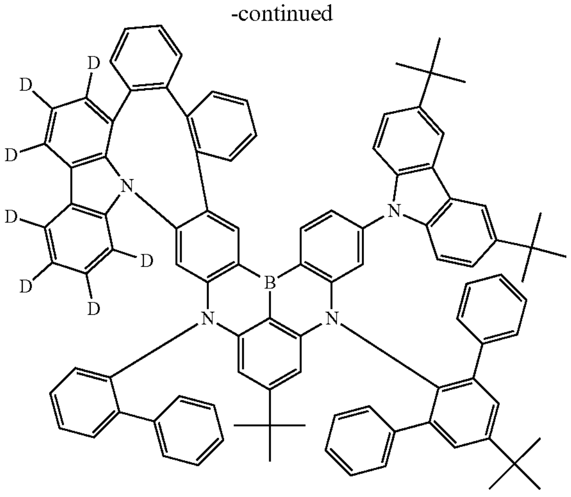

47

Intermediate 47-3 (1 eq) was dissolved in ortho dichlorobenezene, the mixture was then cooled to about 0° C., and then $BBr_3$ (4 eq) was slowly injected thereto in a nitrogen atmosphere. After dropping was completed, the temperature was elevated to about 180° C., and the resultant mixture was stirred for about 48 hours. After being cooled, the reaction was terminated by slowly dropping triethylamine in the flask containing the reactant, and then ethyl alcohol was added to the reactant, followed by extraction and filtration to obtain solids. The obtained solids were purified by column chromatography using methylene chloride and n-hexane, and were then subjected to recrystallization using toluene and acetone to obtain Compound 47. (yield: 5%)

(4) Synthesis of Compound 57

Fused Polycyclic Compound 57 according to an example may be synthesized, for example, by the reaction below:

Synthesis of Intermediate 57-1

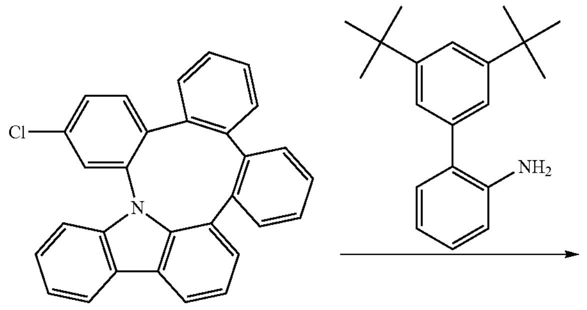

3-2

-continued

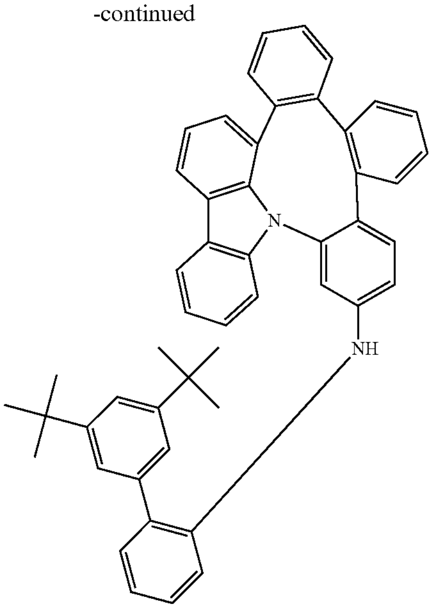

57-1

Intermediate 3-2 (1 eq), 3',5'-di-tert-butyl-[1,1'-biphenyl]-2-amine (1.2 eq), tris(dibenzylideneacetone)dipalladium(0) (0.05 eq), tri-tert-butylphosphine (0.1 eq), and sodium tert-butoxide (3 eq) were dissolved in toluene, and then the resultant mixture was stirred at about 90° C. for about 12 hours. After being cooled, the mixture was washed three times with ethyl acetate and water, and then subjected to liquid separation to obtain an organic layer. The obtained organic layer was dried over $MgSO_4$, and then dried under reduced pressure. The resulting product was purified by column chromatography using methylene chloride and n-hexane to obtain Intermediate 57-1. (yield: 66%)

Synthesis of Intermediate 57-2

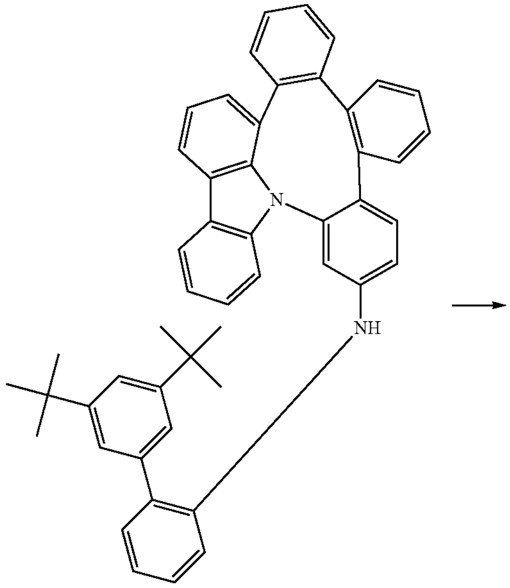

57-1

-continued

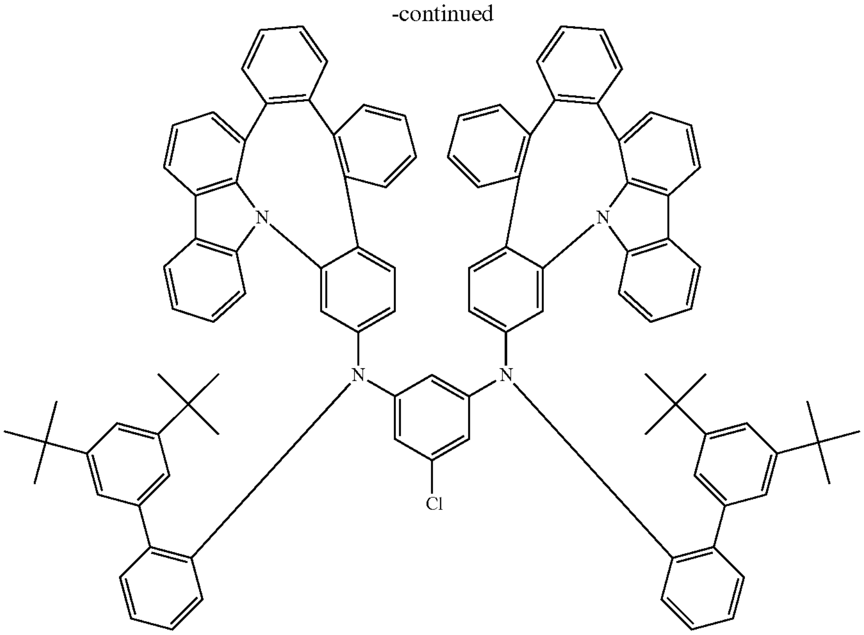

57-2

1,3-dibromo-5-chlorobenzene (1 eq), Intermediate 57-1 (2 eq), tris(dibenzylideneacetone)dipalladium(0) (0.05 eq), tri-tert-butylphosphine (0.1 eq), and sodium tert-butoxide (3 eq) were dissolved in toluene, and then the resultant mixture was stirred at about 100° C. for about 12 hours. After being cooled, the mixture was washed three times with ethyl acetate and water, and then subjected to liquid separation to obtain an organic layer. The obtained organic layer was dried over $MgSO_4$, and then dried under reduced pressure. The resulting product was purified by column chromatography using methylene chloride and n-hexane to obtain Intermediate 57-2. (yield: 60%)

Synthesis of Intermediate 57-3

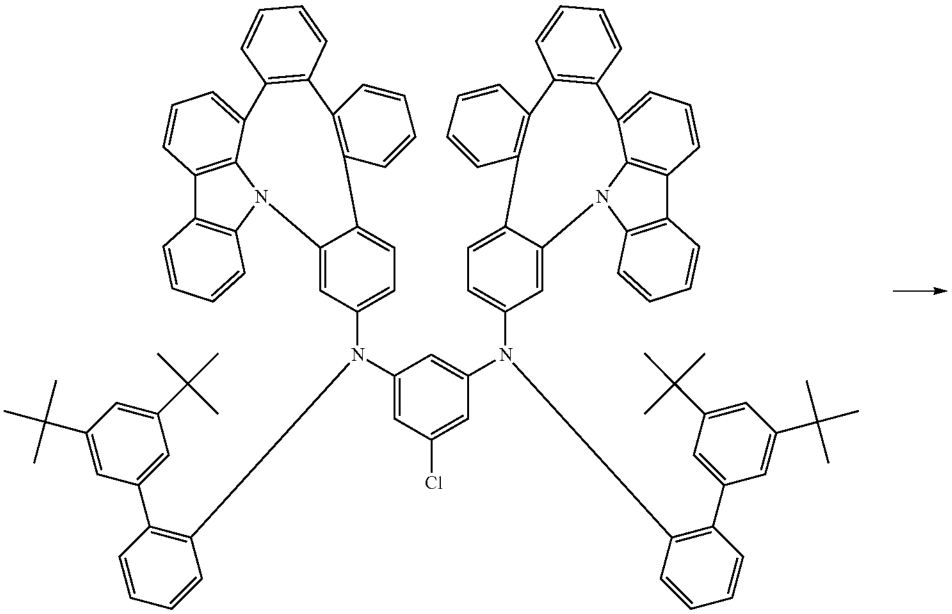

57-2

-continued

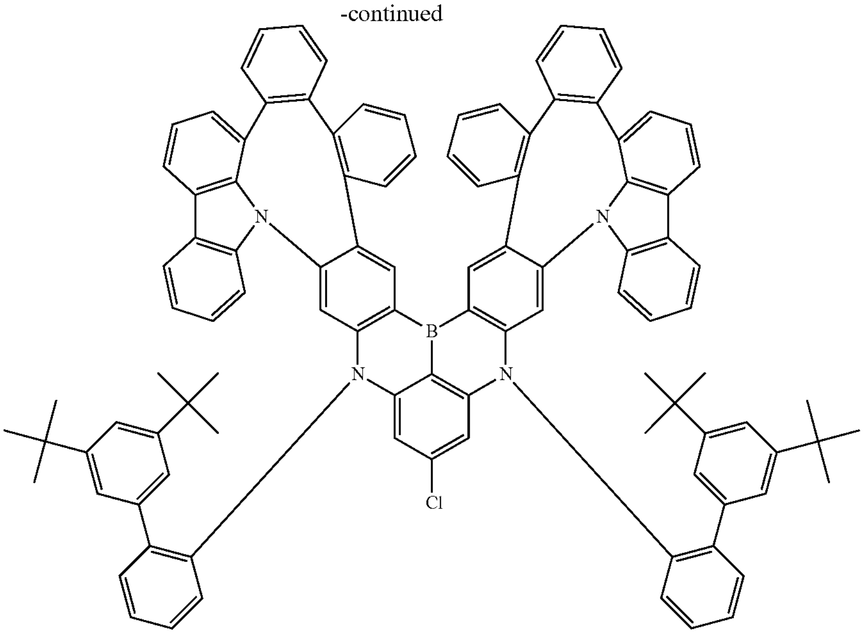

57-3

Intermediate 57-2 (1 eq) was dissolved in ortho dichlorobenezene, the mixture was then cooled to about 0° C., and then $BBr_3$ (3 eq) was slowly injected thereto in a nitrogen atmosphere. After dropping was completed, the temperature was elevated to about 180° C., and the mixture was stirred for about 24 hours. After being cooled, the reaction was terminated by slowly dropping triethylamine in the flask containing the reactant, and then ethyl alcohol was added to the reactant, followed by extraction and filtration to obtain solids. The obtained solids were purified by column chromatography using methylene chloride and n-hexane, and were then subjected to recrystallization using toluene and acetone to obtain Intermediate 57-3. (yield: 3%) (Synthesis of Compound 57)

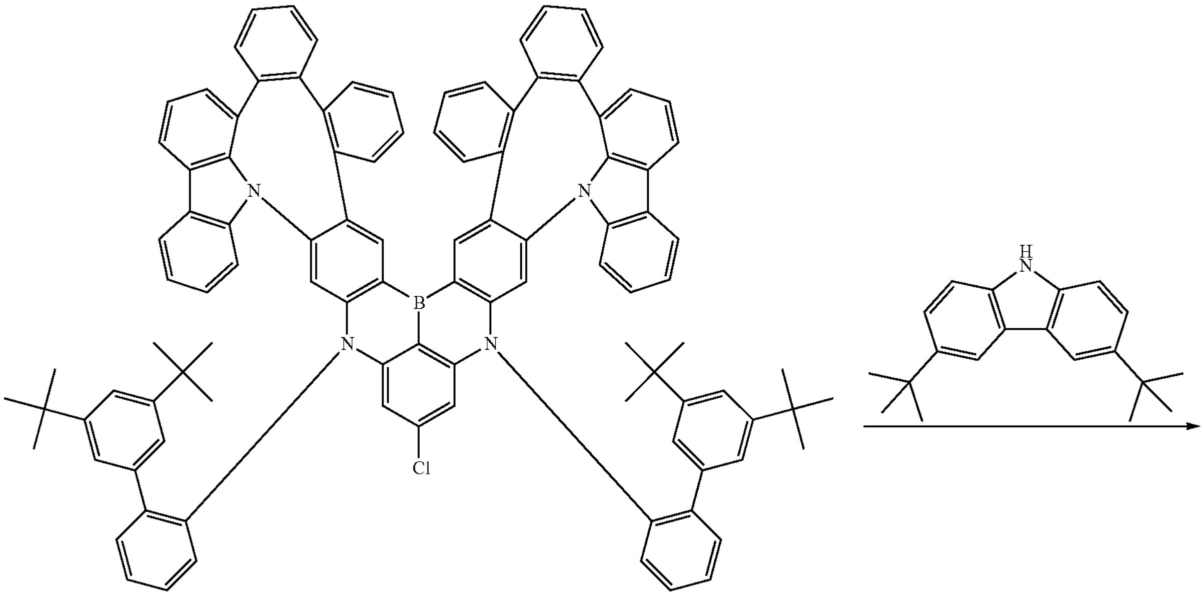

57-3

-continued

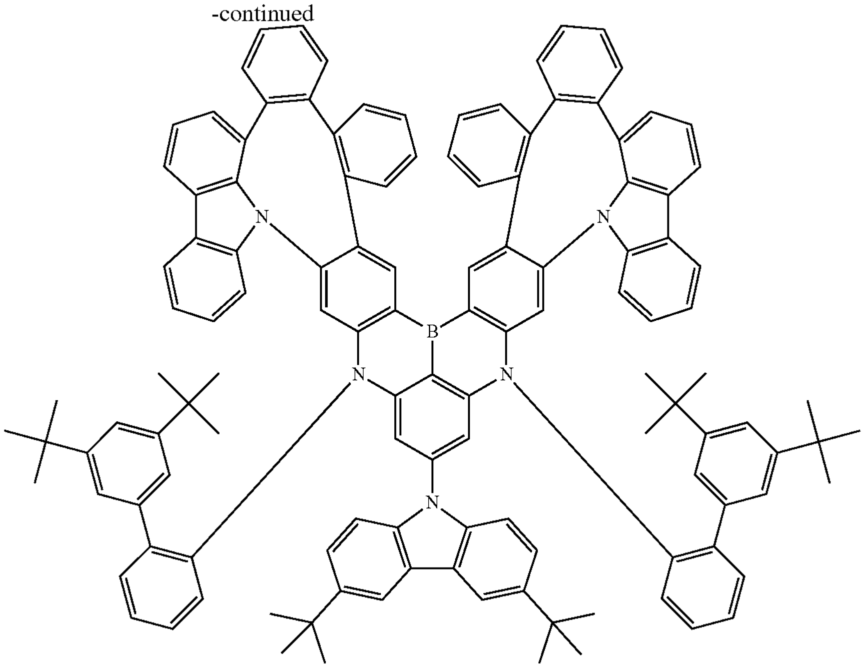

57

Intermediate 57-3 (1 eq), 3,6-di-tert-butyl-9H-carbazole (1.5 eq), tris(dibenzylideneacetone)dipalladium(0) (0.1 eq), tri-tert-butylphosphine (0.2 eq), and sodium tert-butoxide (3 eq) were dissolved in o-xylene, and then the resultant mixture was stirred at about 140° C. for about 12 hours. After being cooled, the mixture was washed three times with ethyl acetate and water, and then subjected to liquid separation to obtain an organic layer. The obtained organic layer was dried over $MgSO_4$, and then dried under reduced pressure. The resulting product was purified by column chromatography using methylene chloride and n-hexane to obtain Compound 57. (yield: 71%)

(5) Synthesis of Compound 83

Fused Polycyclic Compound 83 according to an example may be synthesized, for example, by the reaction below:

Synthesis of Intermediate 83-1

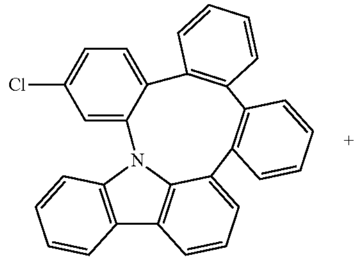

3-2

-continued

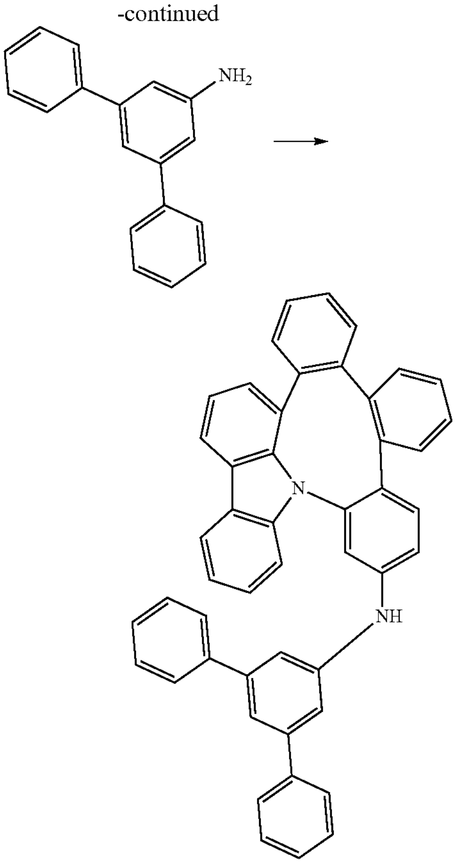

83-1

Intermediate 3-2 (1 eq), [1,1':3',1"-terphenyl]-5'-amine (1.2 eq), tris(dibenzylideneacetone)dipalladium(0) (0.05 eq), tri-tert-butylphosphine (0.1 eq), and sodium tert-butoxide (3 eq) were dissolved in toluene, and then the resultant mixture was stirred at about 90° C. for about 12 hours. After being cooled, the mixture was washed three times with ethyl acetate and water, and then subjected to liquid separation to obtain an organic layer. The obtained organic layer was dried over $MgSO_4$, and then dried under reduced pressure. The resulting product was purified by column chromatography using methylene chloride and n-hexane to obtain Intermediate 83-1. (yield: 56%)

Synthesis of Intermediate 83-2

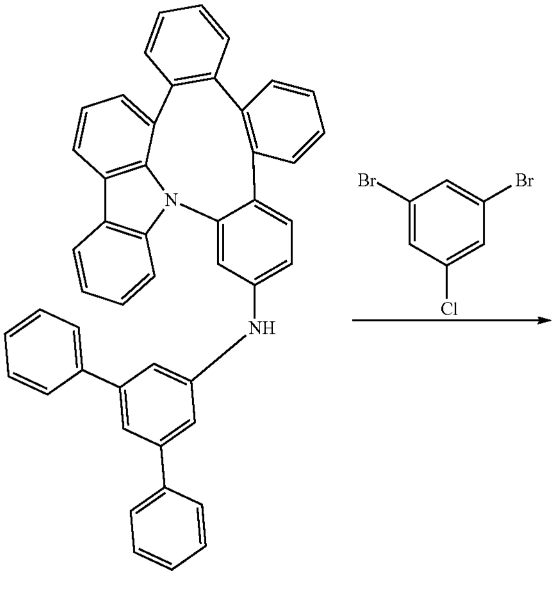

83-1

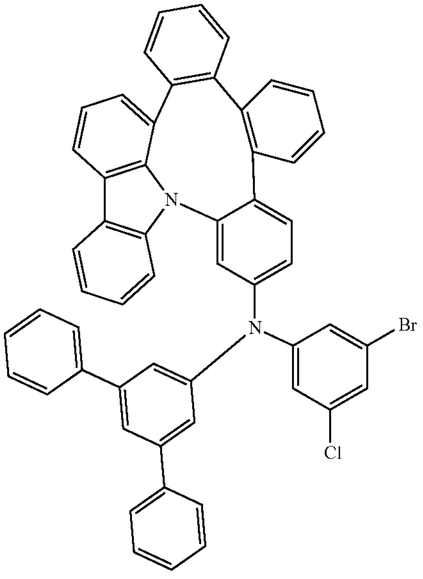

83-2

Intermediate 83-1 (1 eq), 1,3-dibromo-5-chlorobenzene (2.5 eq), tris(dibenzylideneacetone)dipalladium(0) (0.05 eq), tri-tert-butylphosphine (0.1 eq), and sodium tert-butoxide (3 eq) were dissolved in toluene, and then the resultant mixture was stirred at about 90° C. for about 6 hours. After being cooled, the mixture was washed three times with ethyl acetate and water, and then subjected to liquid separation to obtain an organic layer. The obtained organic layer was dried over $MgSO_4$, and then dried under reduced pressure. The resulting product was purified by column chromatography using methylene chloride and n-hexane to obtain Intermediate 83-2. (yield: 62%)

Synthesis of Intermediate 83-3

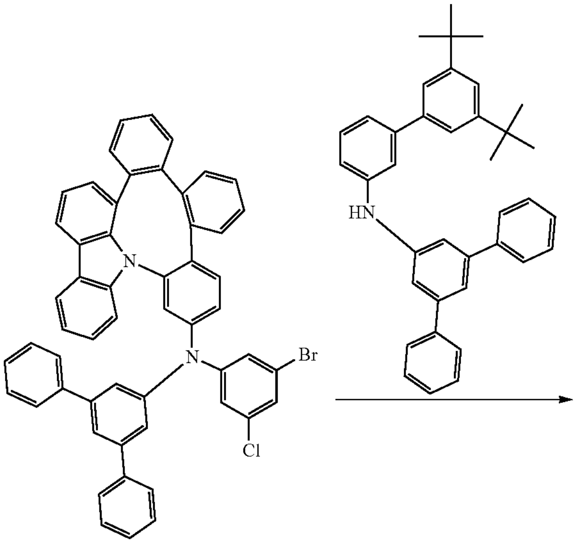

83-2

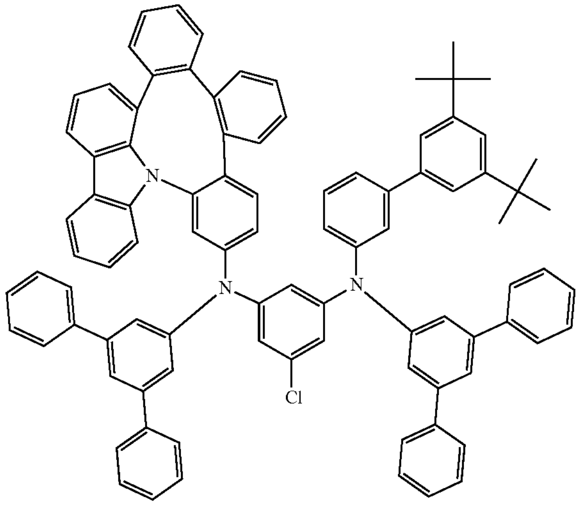

83-3

Intermediate 83-2 (1 eq), N-(3',5'-di-tert-butyl-[1,1'-biphenyl]-3-yl)-[1,1':3',1"-terphenyl]-5'-amine (0.9 eq), tris(dibenzylideneacetone)dipalladium(0) (0.05 eq), tri-tert-butylphosphine (0.1 eq), and sodium tert-butoxide (3 eq) were dissolved in toluene, and then the resultant mixture was stirred at about 90° C. for about 6 hours. After being cooled, the mixture was washed three times with ethyl acetate and water, and then subjected to liquid separation to obtain an organic layer. The obtained organic layer was dried over $MgSO_4$, and then dried under reduced pressure. The resulting product was purified by column chromatography using methylene chloride and n-hexane to obtain Intermediate 83-3. (yield: 47%)

Synthesis of Intermediate 83-4

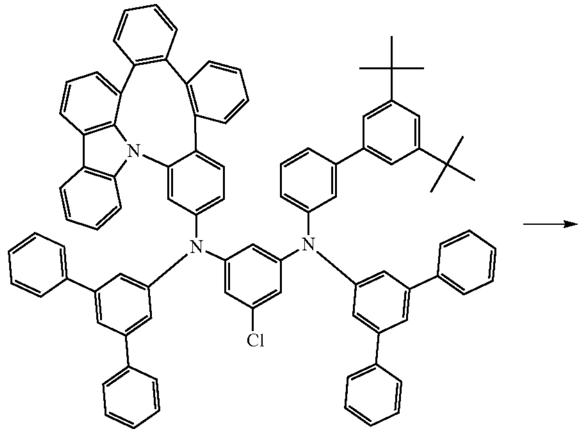

83-3

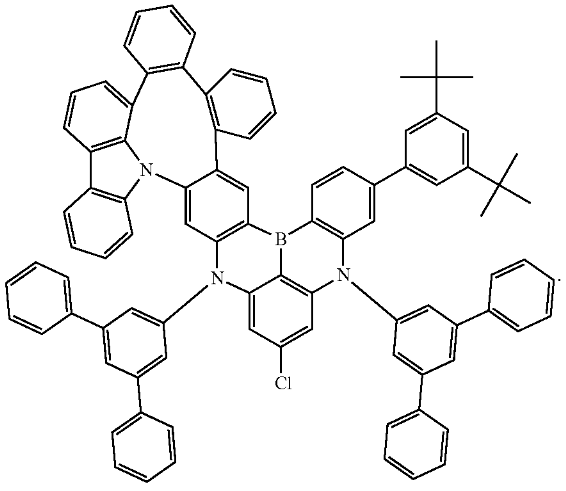

83-4

Intermediate 83-3 (1 eq) was dissolved in ortho dichlorobenzene, the mixture was then cooled to about 0° C., and then $BBr_3$ (3 eq) was slowly injected thereto in a nitrogen atmosphere. After dropping was completed, the temperature was elevated to about 180° C., and the resultant mixture was stirred or about 24 hours. After being cooled, the reaction was terminated by slowly dropping triethylamine in the flask containing the reactant, and then ethyl alcohol was added to the reactant, followed by extraction and filtration to obtain solids. The obtained solids were purified by column chromatography using methylene chloride and n-hexane, and were then subjected to recrystallization using toluene and acetone to obtain Intermediate 83-4. (yield: 4%)

Synthesis of Compound 83

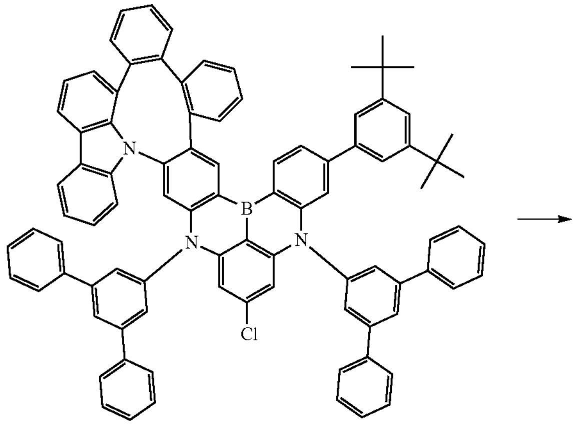

83-4

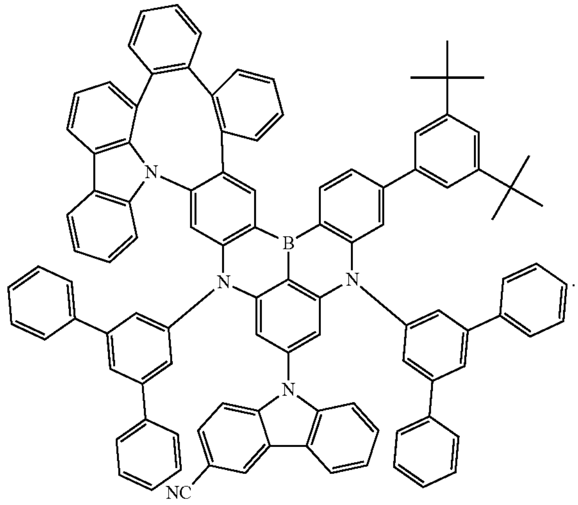

83

Intermediate 83-4 (1 eq), 9H-carbazole-3-carbonitrile (2 eq), tris(dibenzylideneacetone)dipalladium(0) (0.15 eq), tri-tert-butyl phosphine (0.3 eq), and sodium tert-butoxide (3 eq) were dissolved in o-xylene, and then the resultant mixture was stirred at about 150° C. for about 36 hours. After being cooled, the mixture was washed three times with ethyl acetate and water, and then subjected to liquid separation to obtain an organic layer. The obtained organic layer was dried over $MgSO_4$, and then dried under reduced pressure. The resulting product was purified by column chromatography using methylene chloride and n-hexan to obtain Compound 83. (yield: 59%)

(6) Synthesis of Compound 92

Fused Polycyclic Compound 92 according to an example may be synthesized by, for example, the reaction below:

Synthesis of Intermediate 92-1

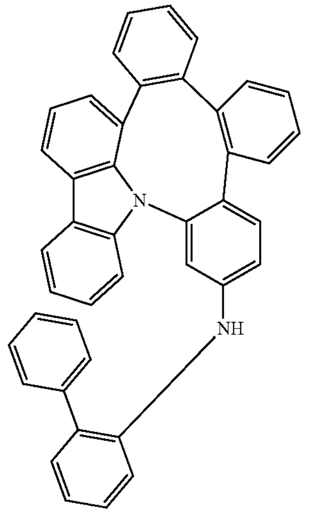

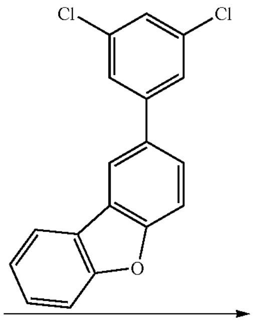

3-3

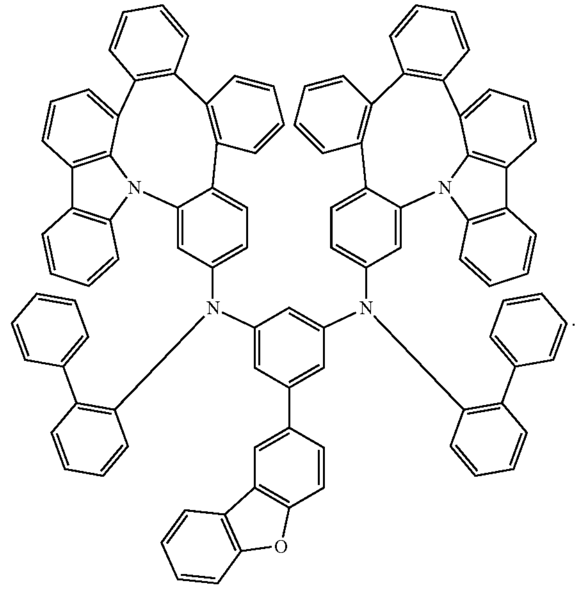

92-1

Intermediate 3-3 (2 eq), 2-(3,5-dichlorophenyl)dibenzo[b,d]furan (1 eq), tris(dibenzylideneacetone)dipalladium(0) (0.15 eq), tri-tert-butylphosphine (0.3 eq), and sodium tert-butoxide (3 eq) were dissolved in o-xylene, and then the resultant mixture was stirred at about 150° C. for about 24 hours. After being cooled, the mixture was washed three times with ethyl acetate and water, and then subjected to liquid separation to obtain an organic layer. The obtained organic layer was dried over $MgSO_4$, and then dried under reduced pressure. The resulting product was purified by column chromatography using MC and n-hexane to obtain Intermediate 92-1. (yield: 53%)

Synthesis of Compound 92

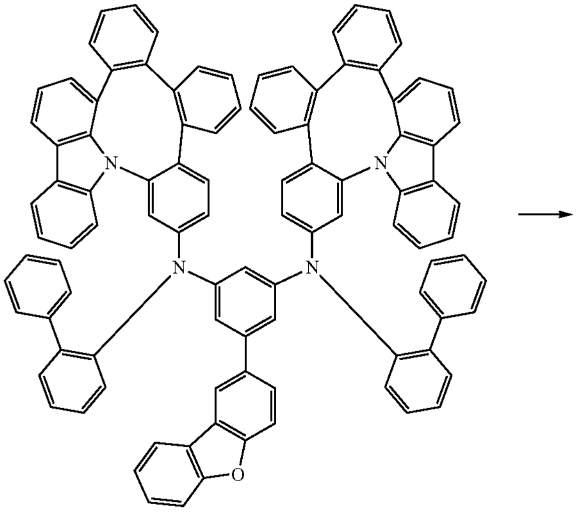

92-1

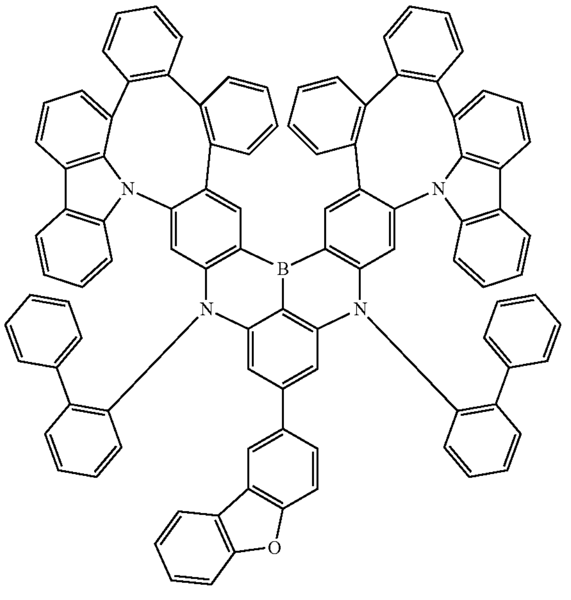

92

Intermediate 92-1 (1 eq) was dissolved in ortho dichlorobenzene, the mixture was then cooled to about 0° C., and then $BBr_3$ (3 eq) was slowly injected thereto in a nitrogen atmosphere. After dropping was completed, the temperature was elevated to about 180° C., and the resultant mixture was stirred for about 24 hours. After being cooled, the reaction was terminated by slowly dropping triethylamine in the flask containing the reactant, and then ethyl alcohol was added to the reactant, followed by extraction and filtration to obtain solids. The obtained solids were purified by column chromatography using methylene chloride and n-hexane, and were then subjected to recrystallization using toluene and acetone to obtain Compound 92. (yield: 6%)

Mass spectrometry-fast atom bombardment (MS/FAB) results for the synthesized compounds of Synthetic Examples (1) to (6) above are shown in Table 1 below. The synthetic methods of other compounds may be easily recognized by those skilled in the art with reference to the above synthetic path and raw materials.

TABLE 1

| | Calc | found |
|---|---|---|
| 3 | 1259.38 | 1259.36 |
| 21 | 1537.87 | 1537.79 |
| 47 | 1360.66 | 1360.64 |
| 57 | 1705.11 | 1705.05 |
| 83 | 1418.62 | 1418.61 |
| 92 | 1369.45 | 1369.44 |

1. Manufacture and Evaluation of Light Emitting Device Including Fused Polycyclic Compound The light emitting device of an example including the fused polycyclic compound of an example in an emission layer was manufactured as follows. Fused polycyclic compounds of Compounds 3, 21, 47, 57, 83, and 92, which are Example Compounds as described above, were respectively used as dopant materials for the emission layers to manufacture the light emitting devices of Examples 1 to 15. Comparative Examples 1 to 8 correspond to the light emitting devices manufactured by using Comparative Example Compounds C1 to C4 as emission layer dopant materials, respectively.

EXAMPLE COMPOUNDS

3

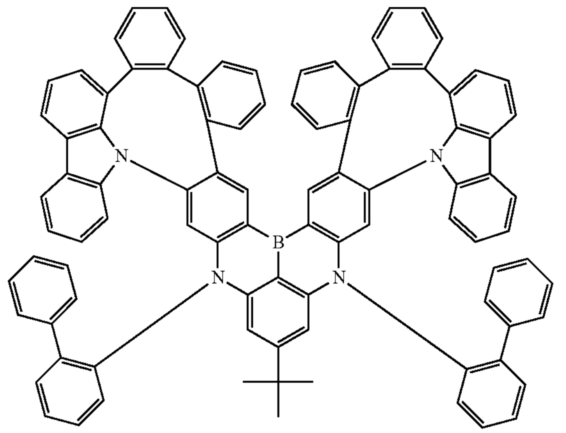

21

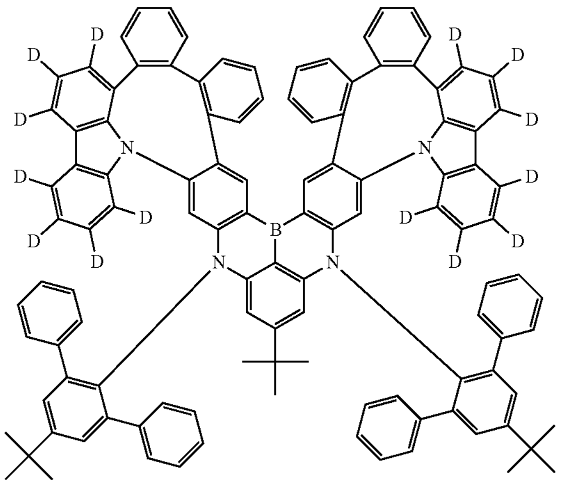

47

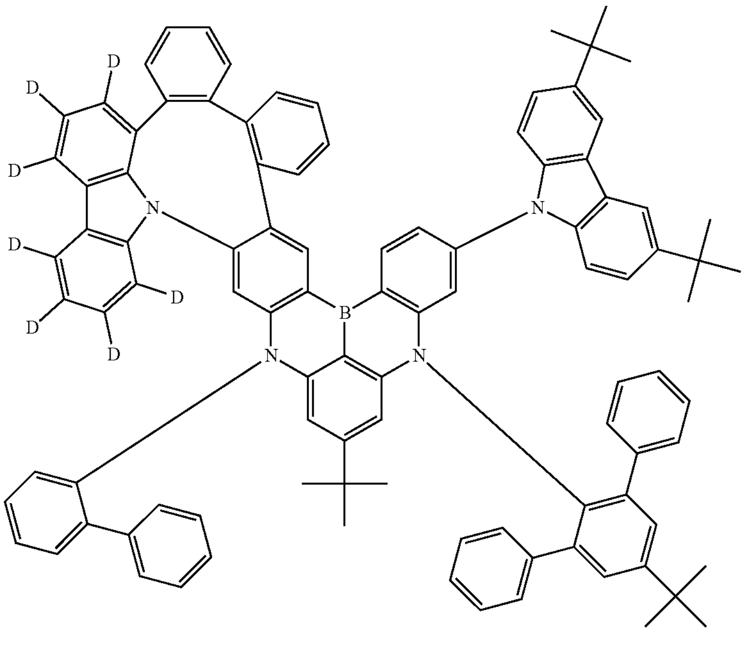

-continued
57
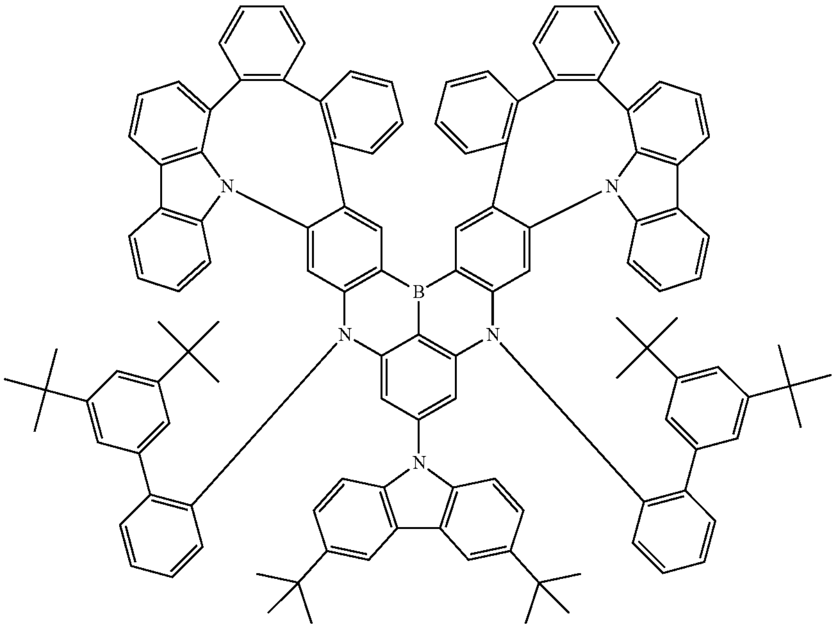
83
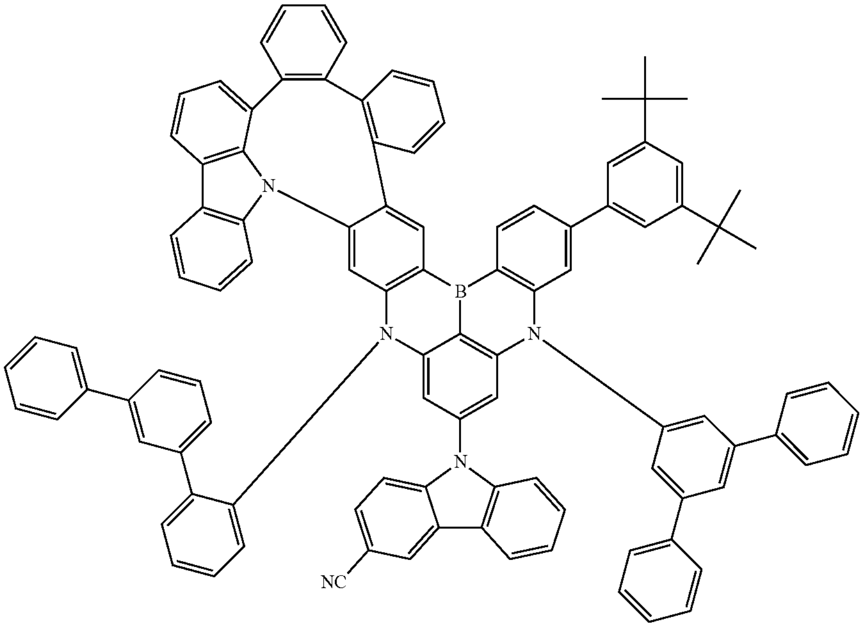

-continued
92
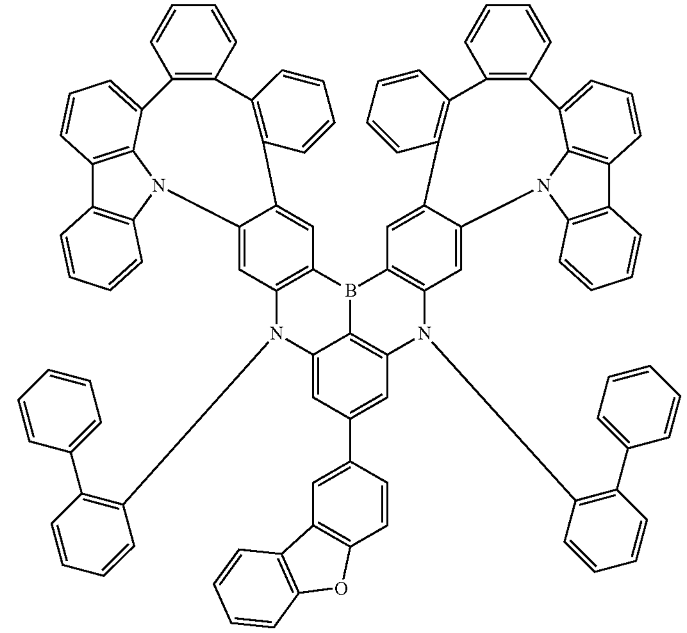
COMPARATIVE EAXAMPLE COMPOUNDS
C1
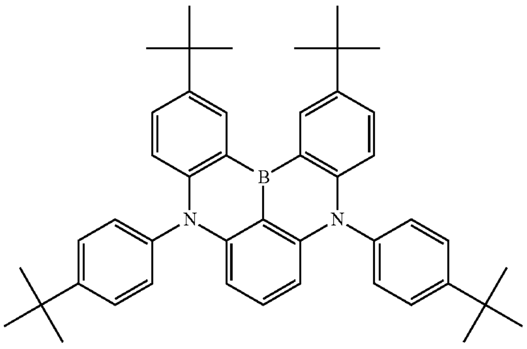
C2
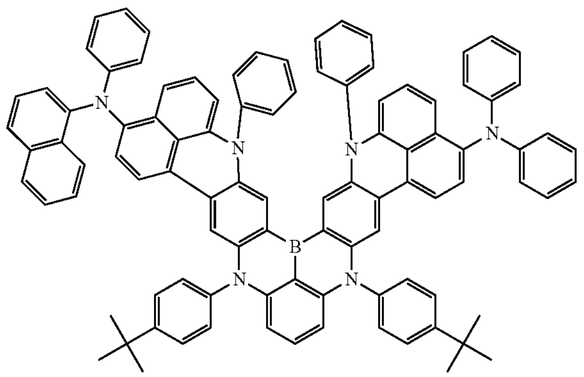
-continued
C3
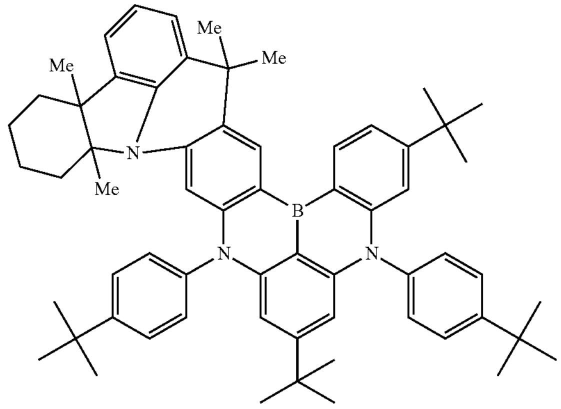
C4
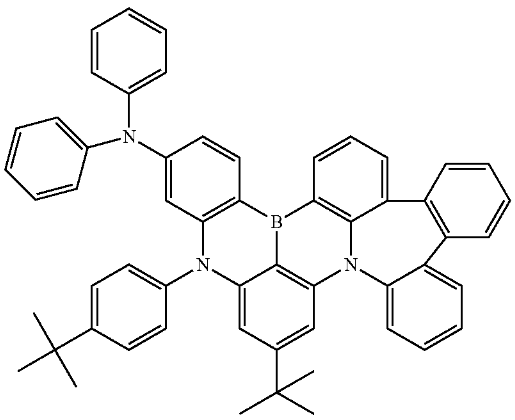
Manufacture of Light Emitting Devices
In the light emitting devices of Examples and Comparative Examples, a glass substrate (made by Corning Co.), on which an ITO electrode of about 15 Ω/$cm^2$ (about 1200 Å) is formed as an anode, was cut to a size of about 50 mm×50 mm×0.7 mm, cleansed by ultrasonic waves using isopropyl alcohol and pure water for about five minutes each, and then irradiated with ultraviolet rays for about 30 minutes and exposed to ozone and cleansed. The glass substrate was installed on a vacuum deposition apparatus.

NPD was deposited on the upper portion of the anode to form a 300 Å-thick hole injection layer, H-1-1 was then deposited on the upper portion of the hole injection layer to form a 200 Å-thick hole transport layer, and CzSi was then deposited on the upper portion of the hole transport layer to form a 100 Å-thick emission-auxiliary layer.

Then, a host mixture in which the second compound and the third compound according to one or more embodiments were mixed together in an amount of about 1:1, the fourth compound, and Example Compound or Comparative Example Compound were co-deposited in a weight ratio of about 85:14:1 to form a 200 Å-thick emission layer, and on the upper portion of the emission layer, TSPO1 was deposited to form a 200 Λ-thick hole blocking layer. Then, on the upper portion of the hole blocking layer, TPBI was deposited to form a 300 Å-thick electron transport layer, and then on the upper portion of the electron transport layer, LiF was deposited to form a 10 Å-thick electron injection layer. Next, on the electron injection layer, Al was deposited to form a 3,000 Å-thick cathode, thereby manufacturing a light emitting device.

Each layer was formed by a vacuum deposition method. In one or more embodiments, HT3 and HT33 among the compounds in Compound Group 2 as described above were used as the second compound, ETH66 and ETH86 among the compounds in Compound Group 3 as described above were used as the third compound, and AD-38 and AD-43 among the compounds in Compound Group 4 as described above were used as the fourth compound.

Compounds used for manufacturing the light emitting devices of Examples and Comparative Examples are disclosed below. The materials below were used to manufacture the devices by subjecting commercial products to sublimation purification.

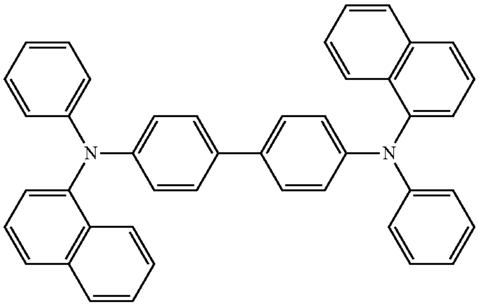

NPD

-continued

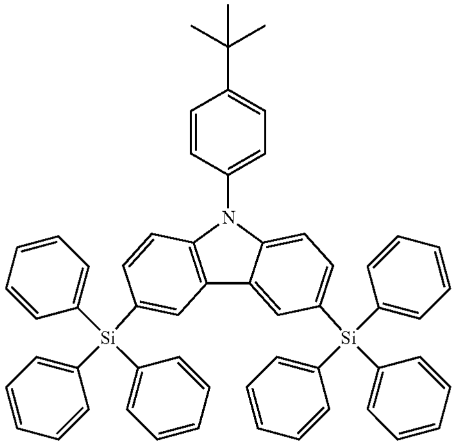

CzSi

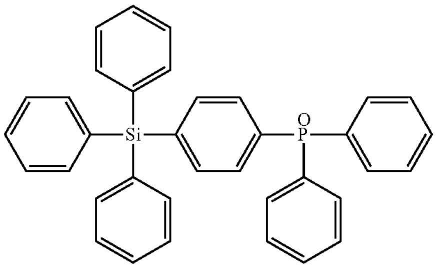

TSPO1

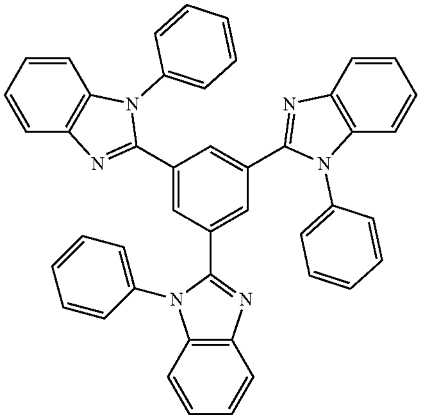

TPBI

-continued
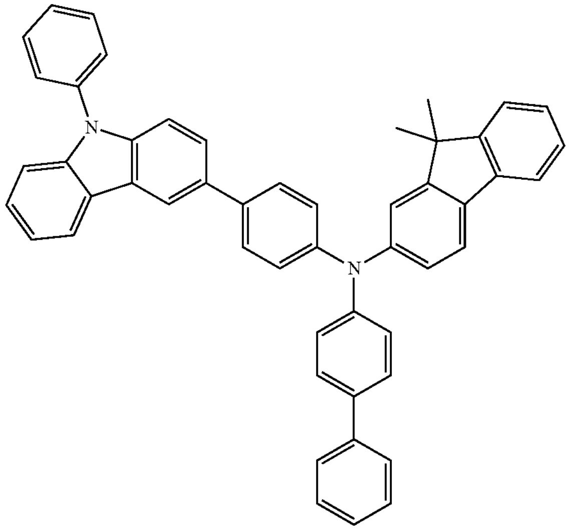
H-1-1
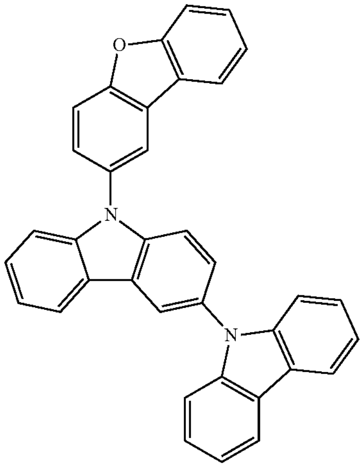
HT3
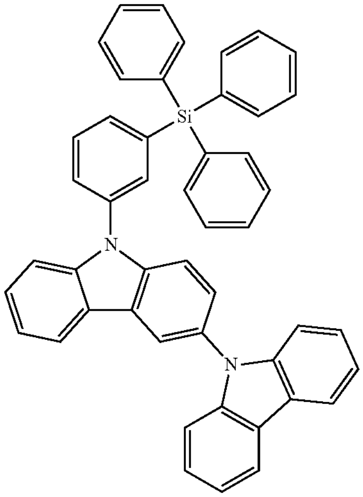
HT33
-continued
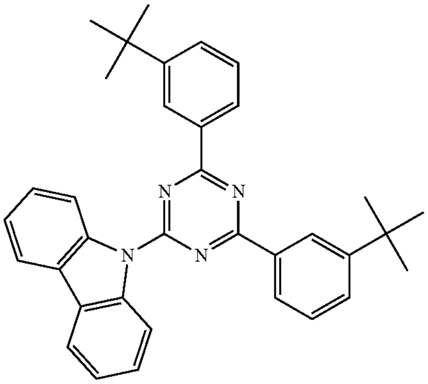
ETH86
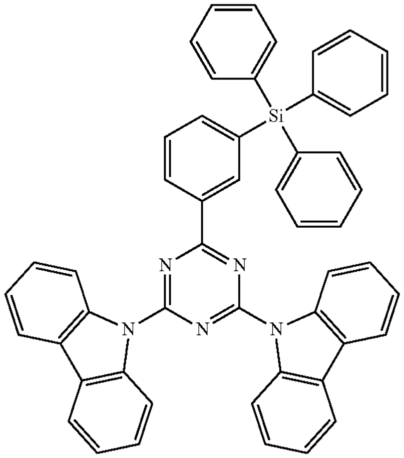
ETH86
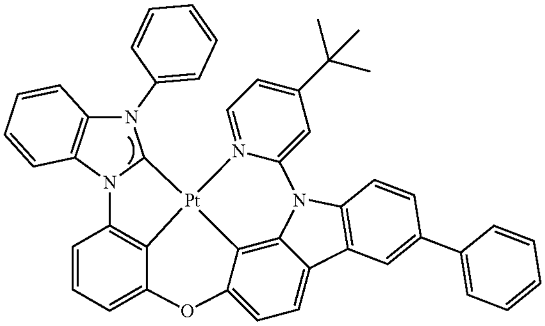
AD-38

-continued

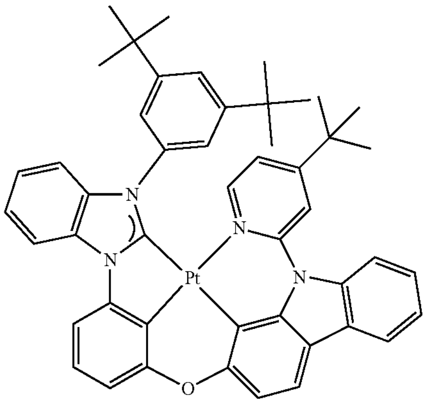

AD-43

Evaluation of Light Emitting Device Characteristics

Device efficiency and device service life of the light emitting device 25 manufactured with Example Compounds 3, 21, 47, 57, 83 and 92 and Comparative Example Compound C1 as described above were evaluated. Evaluation results of the light emitting devices of Examples 1 to 15 and Comparative Examples 1 to 8 are listed in Table 2. To evaluate the characteristics of the light emitting devices manufactured in Examples 1 to 15 and Comparative Examples 1 to 8 above, each of driving voltages (V), luminous efficiencies (Cd/A), and emission colors at a current density of 1,000 cd/$m^2$ was measured by using a Keithley MU 236 and a luminance meter PR650, and the time taken to reach 95% brightness relative to an initial brightness was measured as a service life (T95), and a relative service life was the basis of the device of Comparative Example 2, and the results are listed in Table 2.

TABLE 2

| | Host (second compound:third compound = 5:5) | Fourth compound | First compound | Driving voltage (V) | Efficiency (cd/A) | Luminous wavelength (nm) | Service life ratio (T95) |
|---|---|---|---|---|---|---|---|
| Example 1 | HT33/ETH66 | AD-43 | Compound 3 | 4.4 | 25.9 | 461 | 5.3 |
| Example 2 | HT33/ETH66 | AD-43 | Compound 21 | 4.4 | 26.3 | 460 | 6.1 |
| Example 3 | HT33/ETH66 | AD-43 | Compound 47 | 4.3 | 26.1 | 461 | 6.3 |
| Example 4 | HT33/ETH66 | AD-43 | Compound 57 | 4.5 | 25.4 | 458 | 5.6 |
| Example 5 | HT33/ETH66 | AD-43 | Compound 83 | 4.4 | 26.2 | 460 | 5.9 |
| Example 6 | HT33/ETH66 | AD-43 | Compound 92 | 4.4 | 27.2 | 462 | 6.2 |
| Example 7 | HT3/ETH66 | AD-38 | Compound 3 | 4.5 | 25.8 | 462 | 6.0 |
| Example 8 | HT3/ETH66 | AD-38 | Compound 21 | 4.4 | 26.8 | 460 | 6.2 |
| Example 9 | HT3/ETH66 | AD-38 | Compound 47 | 4.3 | 26.4 | 462 | 5.7 |
| Example 10 | HT3/ETH66 | AD-38 | Compound 57 | 4.5 | 27.2 | 461 | 5.4 |
| Example 11 | HT3/ETH66 | AD-38 | Compound 83 | 4.5 | 25.9 | 462 | 5.5 |
| Example 12 | HT3/ETH66 | AD-38 | Compound 92 | 4.5 | 26.8 | 463 | 5.9 |
| Example 13 | HT33/ETH86 | AD-38 | Compound 3 | 4.4 | 26.4 | 463 | 5.6 |
| Example 14 | HT33/ETH86 | AD-38 | Compound 21 | 4.3 | 25.8 | 461 | 5.9 |
| Example 15 | HT33/ETH86 | AD-38 | Compound 57 | 4.5 | 25.7 | 461 | 5.7 |
| Comparative Example 1 | HT33/ETH66 | x | Comparative Example Compound C1 | 5.7 | 13.4 | 460 | — |
| Comparative Example 2 | HT33/ETH66 | AD-43 | Comparative Example Compound C1 | 4.9 | 19.5 | 464 | 1.0 |
| Comparative Example 3 | HT33/ETH66 | x | Comparative Example Compound C2 | 5.9 | 10.2 | 498 | — |
| Comparative Example 4 | HT33/ETH66 | AD-43 | Comparative Example Compound C2 | 5.7 | 13.8 | 494 | 0.7 |
| Comparative Example 5 | HT33/ETH66 | x | Comparative Example Compound C3 | 5.5 | 15.5 | 456 | — |
| Comparative Example 6 | HT33/ETH66 | AD-43 | Comparative Example Compound C3 | 5.2 | 19.9 | 460 | 2.2 |
| Comparative Example 7 | HT33/ETH66 | x | Comparative Example Compound C4 | 5.4 | 14.3 | 478 | — |
| Comparative Example 8 | HT33/ETH66 | AD-43 | Comparative Example Compound C4 | 5.0 | 18.5 | 474 | 1.4 |

Referring to the results of Table 2, it can be seen that Examples of the light emitting devices in which the fused polycyclic compounds according to examples of the present disclosure are used as a luminescent material exhibit lower driving voltage, and have improved luminous efficiency and service life characteristics as compared with the Comparative Examples. Example Compounds include the fused ring core in which the first to third aromatic rings are fused around the boron atom and the first and second nitrogen atoms, and the first and/or second heterocycles containing the carbazole moiety and the biphenyl moiety in the first aromatic ring and/or second aromatic ring are bonded, and thus Example Compounds may have an increase in the multiple resonance effects and have a low AEST value. Accordingly, because reverse intersystem crossing (RISC) from the triplet excited state to the singlet excited state easily occurs, delayed fluorescence characteristics may be enhanced, thereby improving the luminous efficiency.

The light emitting device of an example includes the first dopant of an example as a light emitting dopant of a thermally activated delayed fluorescence (TADF) light emitting device, and thus may achieve high device efficiency in a blue wavelength region, for example, a deep blue wavelength region.

Referring to Comparative Example 1 and Comparative Example 2, it can be seen that Comparative Example Compound C1 has substantially the same fused ring core as the Example Compounds, but has a t-butyl group as a substituent rather than the first heterocycle, and thus the driving voltage is higher and the luminous efficiency and device service life deteriorate compared to Examples.

Referring to Comparative Example 3 and Comparative Example 4, Comparative Example Compound C2 has substantially the same fused ring core as the Example Compounds, but is not substituted with the first heterocycle. While the present disclosure is not limited by any particular mechanism or theory, it is thought that Comparative Example Compound C2 has an excessively broad conjugation structure and a planar structure, and thus the light emission wavelength is red-shifted to about 490 nm or more. In addition, it is thought that Comparative Example Compound C2 includes a naphthalene moiety, a triarylamine moiety, and the like as a substituent rather than the first heterocycle, and thus a higher EST value makes the delayed fluorescence characteristics reduced compared to Examples, and thus the luminous efficiency is low.

Referring to Comparative Example 5 and Comparative Example 6, Comparative Example Compound C3 has substantially the same fused ring core as the Example Compounds, but is not substituted with the first heterocycle. In Comparative Example Compound C3, it can be seen that as a ring rather than the first heterocycle is fused at the fused ring core, the robustness is weak and the driving voltage is higher and the luminous efficiency and device service life deteriorate compared to Examples.

Referring to Comparative Example 7 and Comparative Example 8, Comparative Example Compound C4 has substantially the same fused ring core as Example Compounds, but is not substituted with the first heterocycle. It is thought that because Comparative Example C4 has a structure in which a substituent containing an azepine moiety rather than the first heterocycle is bonded, it is difficult to achieve steric hindrance effects, and thus the driving voltage is higher and the luminous efficiency and device service life deteriorate compared to the Examples.

Therefore, like the fused polycyclic compound of embodiments of the present disclosure, when the first heterocycle linked to the fused ring core is substituted at the aromatic ring of the fused ring core, high luminous efficiency an a long service life may be achieved.

The light emitting device of one or more embodiments may exhibit improved device characteristics with high efficiency and a long service life.

The fused polycyclic compound of one or more embodiments may be included in the emission layer of the light emitting device to contribute to high efficiency and a long service life of the light emitting device.

Although the subject matter of the present disclosure kas been described with reference to example embodiments, it will be understood that the present disclosure should not be limited to these example embodiments but various changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims, and equivalents thereof.

What is claimed is:

1. A light emitting device comprising:

a first electrode;

a second electrode facing the first electrode; and an emission layer between the first electrode and the second electrode, wherein the emission layer comprises a first compound represented by Formula 1 below:

Formula 1

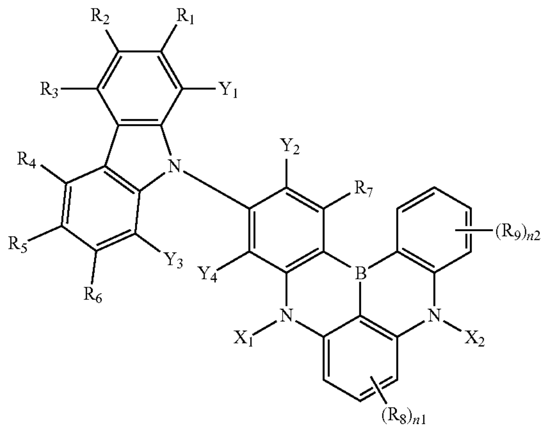

wherein, in Formula 1 above, $R_1$ to $R_9$ and $Y_1$ to $Y_4$ are each independently a hydrogen atom, a deuterium atom, a halogen atom, a cyano group, a substituted or unsubstituted silyl group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, $X_1$ and $X_2$ are each independently a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, n1 is an integer of 0 to 3, n2 is an integer of 0 to 4, and any one pair of $Y_1$ and $Y_2$ or $Y_3$ and $Y_4$ is a position to which a substituent represented by Formula 2 below is linked:

Formula 2

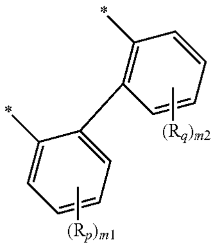

wherein, in Formula 2 above,

-* is a position linked to any one pair of $Y_1$ and $Y_2$, or $Y_3$ and $Y_4$ linked in Formula 1, $R_p$ and $R_q$ are each independently a hydrogen atom, a deuterium atom, a halogen atom, a cyano group, a substituted or unsubstituted silyl group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and m1 and m2 are each independently an integer of 0 to 4.

2. The light emitting device of claim 1, wherein the first compound represented by Formula 1 above is represented by Formula 1-2 below:

Formula 1-2

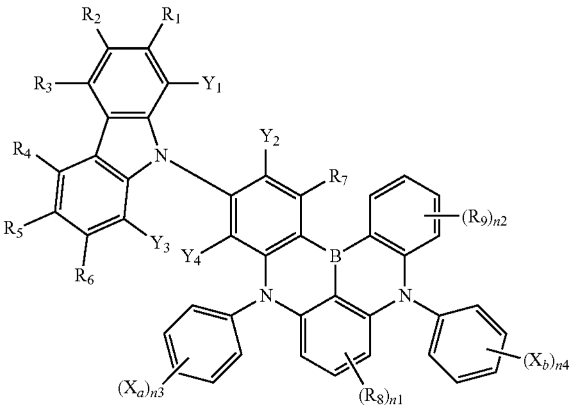

wherein, in Formula 1-2 above, $X_a$ and $X_b$ are each independently a hydrogen atom, a deuterium atom, a cyano group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, n3 and n4 are each independently an integer of 0 to 5, and $R_1$ to $R_9$, $Y_1$ to $Y_4$, n1, and n2 are the same as defined with respect to Formula 1.

3. The light emitting device of claim 2, wherein, in Formula 1-2 above, $X_a$ and $X_b$ are each independently a substituted or unsubstituted butyl group, a substituted or unsubstituted aryl group having 6 to 30 ring-forming carbon atoms, or a substituted or unsubstituted heteroaryl group having 2 to 30 ring-forming carbon atoms.

4. The light emitting device of claim 1, wherein the first compound represented by Formula 1 above is represented by Formula 1-3 or 1-4 below:

Formula 1-3

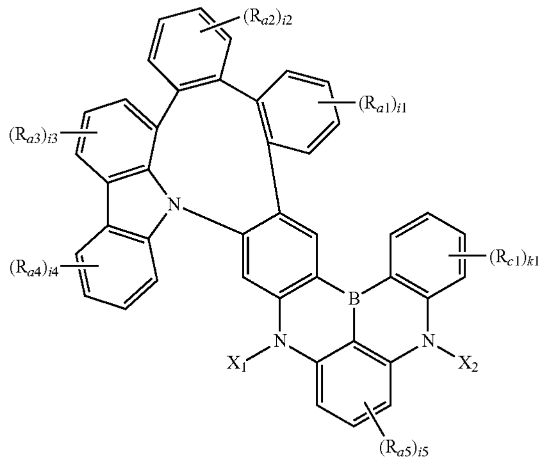

Formula 1-4

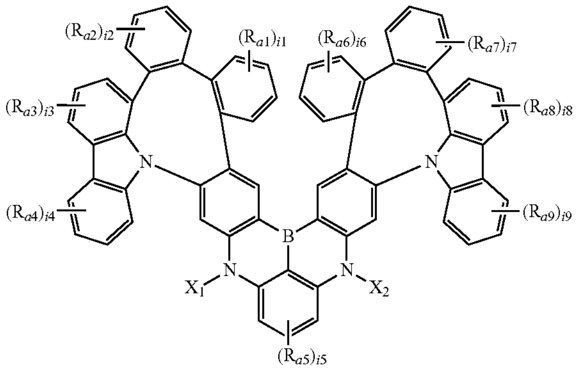

wherein, in Formula 1-3 and Formula 1-4 above, $R_{a1}$ to $R_{a9}$ are each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, $R_{c1}$ is a hydrogen atom, a deuterium atom, a halogen atom, a cyano group, a substituted or unsubstituted silyl group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or is bonded to an adjacent group to form ring, i1, i2, i4, i6, i7, i9 and k1 are each independently an integer of 0 to 4, i3, i5 and i8 are each independently an integer of 0 to 3, and $X_1$ and $X_2$ are the same as defined with respect to Formula 1.

5. The light emitting device of claim 4, wherein $R_{a1}$ to $R_{a4}$ and $R_{a6}$ to $R_{a9}$ are each independently a hydrogen atom or a deuterium atom.

6. The light emitting device of claim 1, wherein the first compound represented by Formula 1 above is represented by Formula 1-5 or 1-6 below:

Formula 1-5

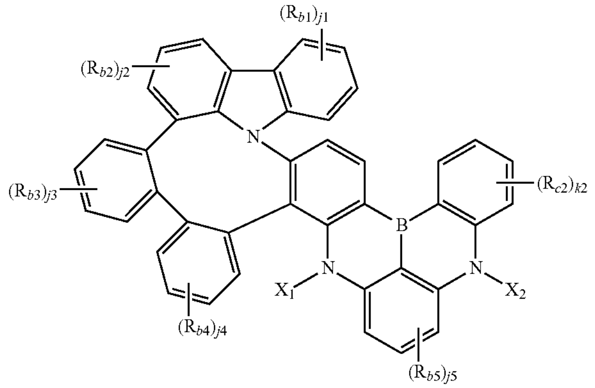

Formula 1-6

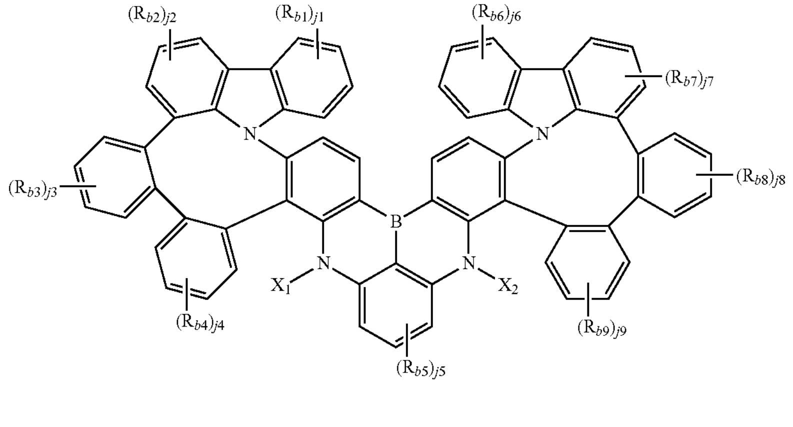

wherein, in Formula 1-5 and Formula 1-6 above, $R_{b1}$ to $R_{b9}$ are each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, $R_{c2}$ is a hydrogen atom, a deuterium atom, a halogen atom, a cyano group, a substituted or unsubstituted silyl group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or is bonded to an adjacent group to form a ring, j1, j3, j4, j6, j7, j9 and k2 are each independently an integer of 0 to 4, j2, j5 and j8 are each independently an integer of 0 to 3, and $X_1$ and $X_2$ are the same as defined with respect to Formula 1.

7. The light emitting device of claim 6, wherein $R_{b1}$ to $R_{b4}$ and $R_{b8}$ to $R_{b9}$ are each independently a hydrogen atom or a deuterium atom.

8. The light emitting device of claim 1, wherein $R_p$ and $R_q$ are each independently a hydrogen atom or a deuterium atom.

9. The light emitting device of claim 1, wherein the first compound represented by Formula 1 above is represented by Formula 1-1 below:

Formula 1-1

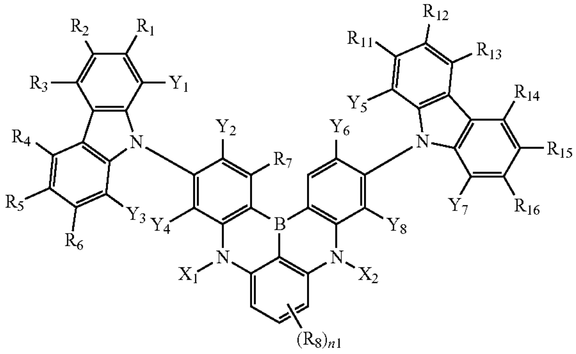

wherein, in Formula 1-1 above, $R_{11}$ to $R_{16}$ and $Y_5$ to $Y_8$ are each independently a hydrogen atom, a deuterium atom, a halogen atom, a cyano group, a substituted or unsubstituted silyl group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, any one pair of $Y_5$ and $Y_6$ or $Y_7$ and $Y_8$ is a position to which a substituent represented by Formula 2 above is linked, and $R_1$ to $R_8$, $Y_1$ to $Y_4$, $X_1$, $X_2$, and n1 are the same as defined with respect to Formula 1.

10. The light emitting device of claim 1, wherein the first compound represented by Formula 1 above comprises at least one from among compounds in Compound Group 1 below:

Compound Group 1

1

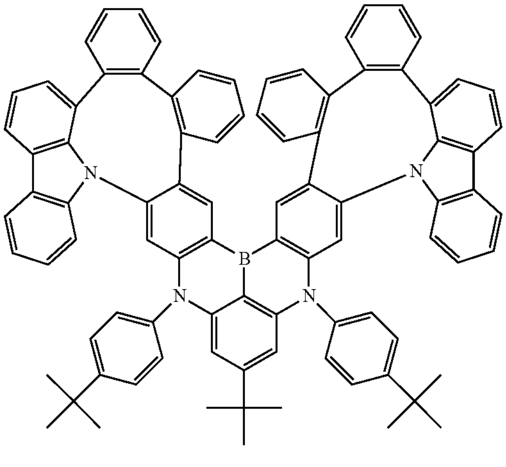

2

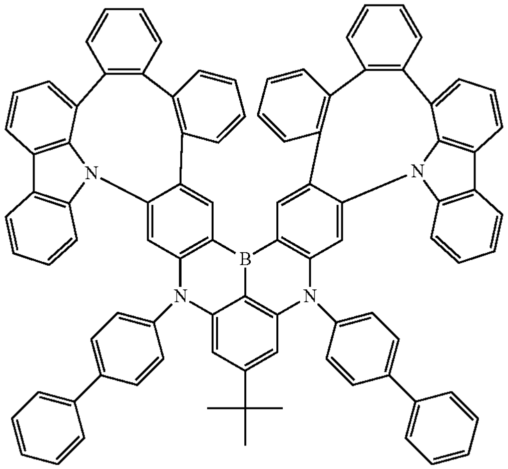

-continued
3
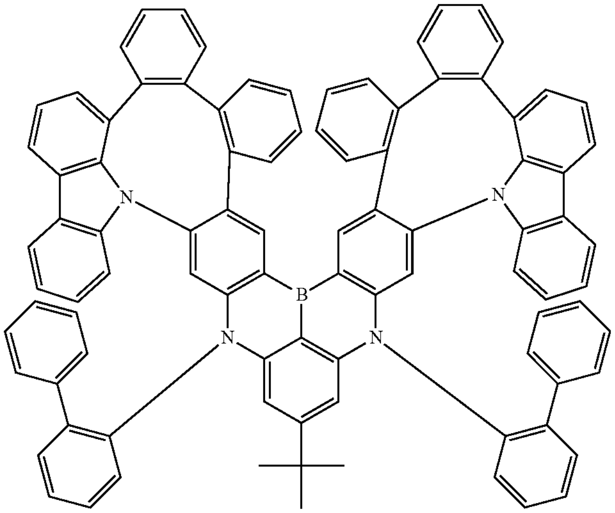
4
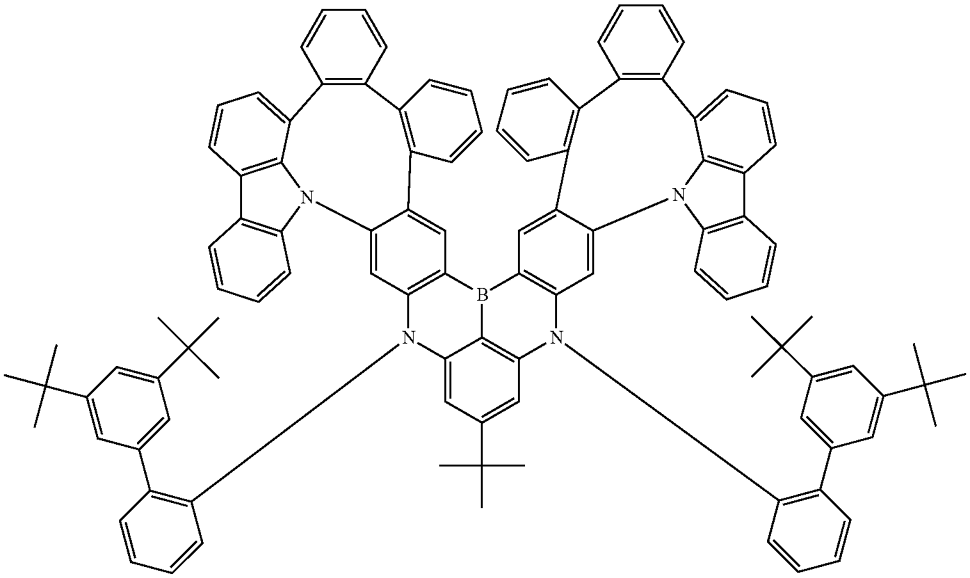
5
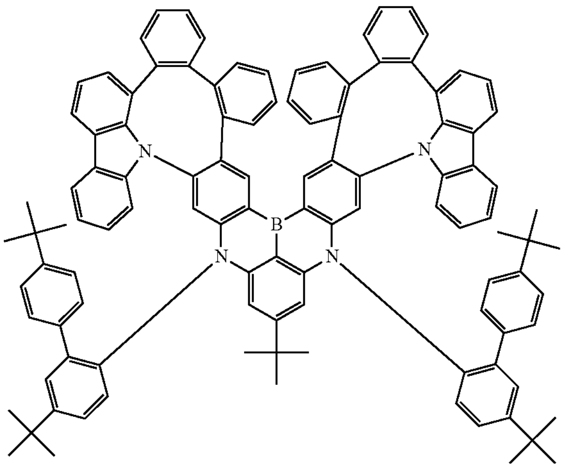
6
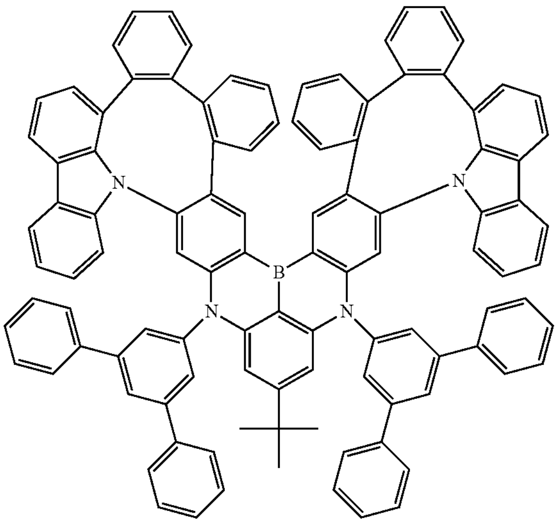

-continued
7
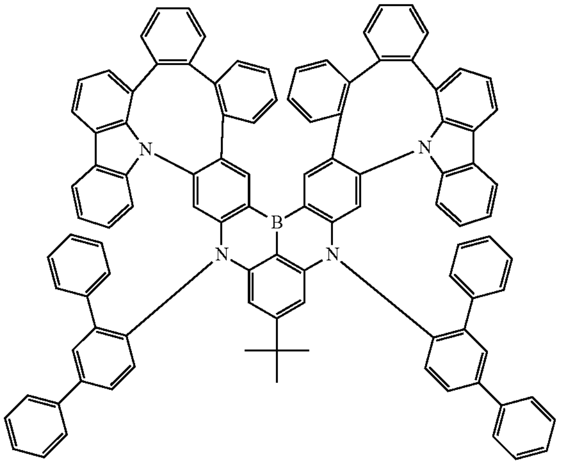
8
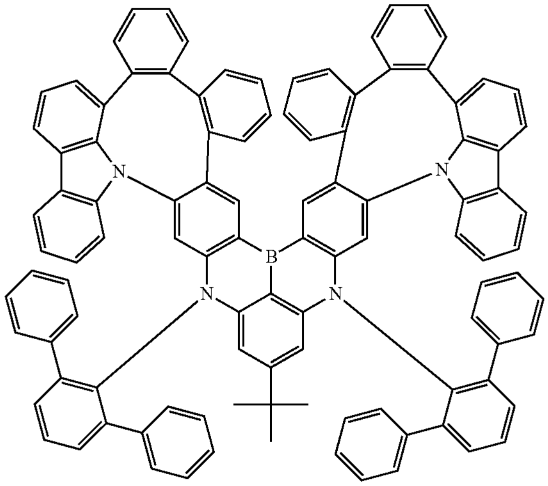
9
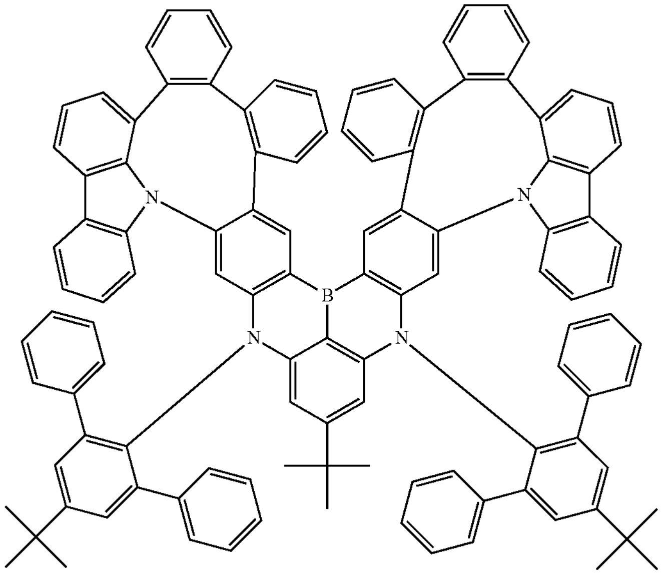

-continued
10
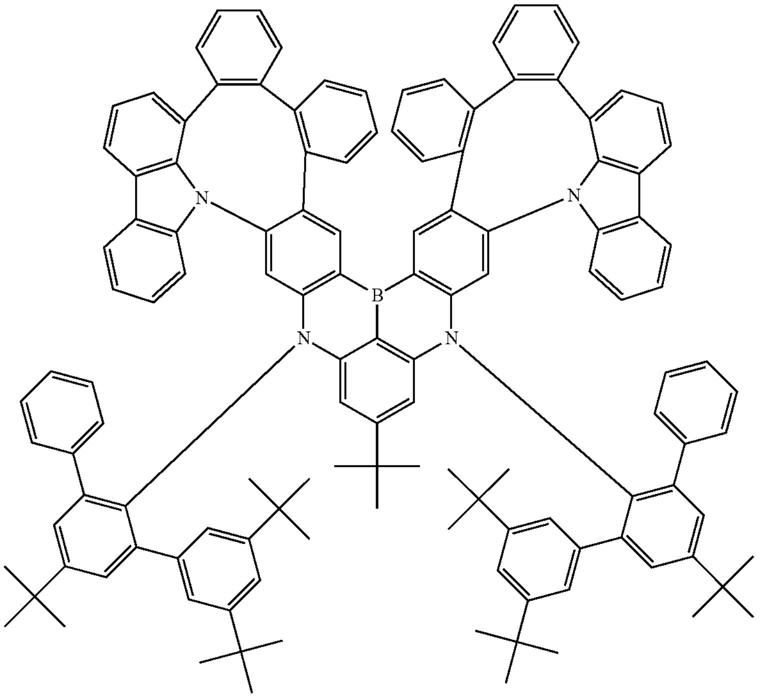
11
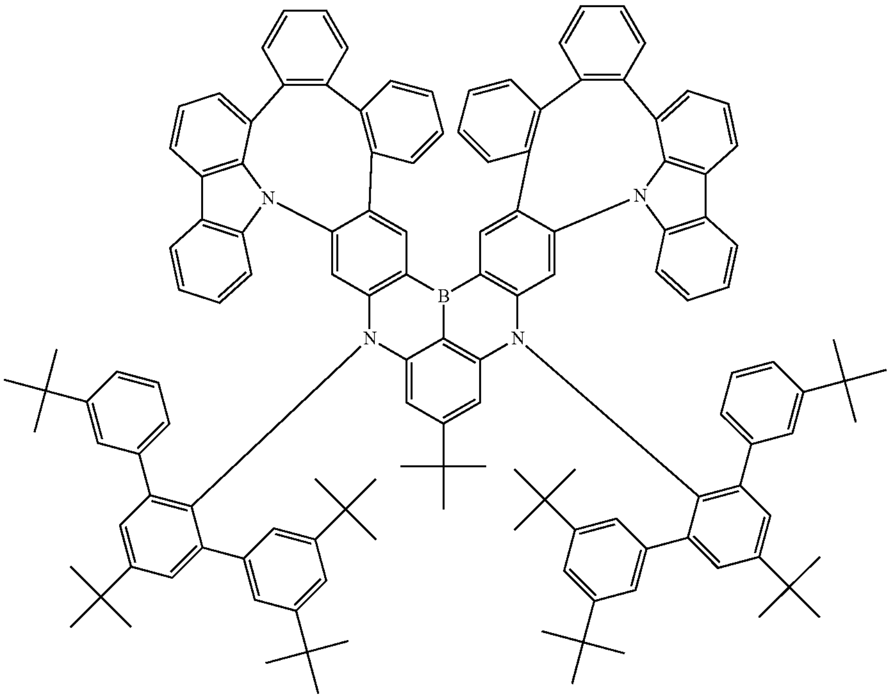

-continued
12
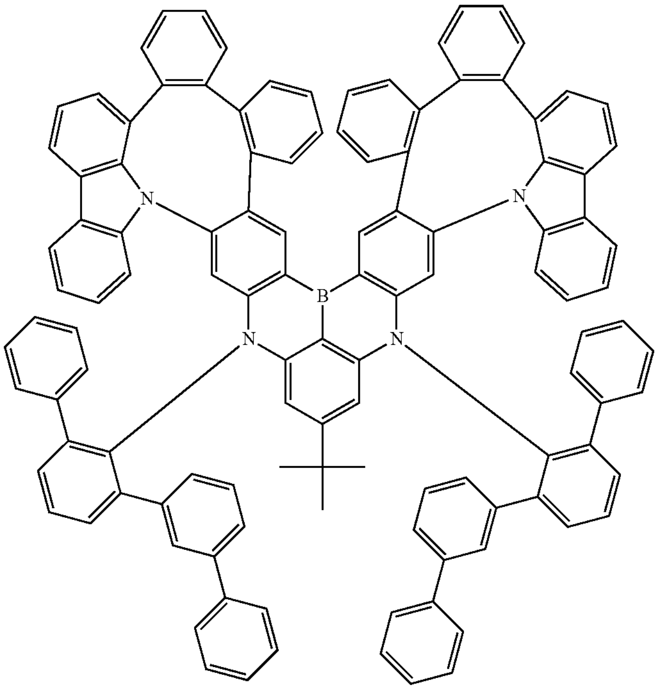
13
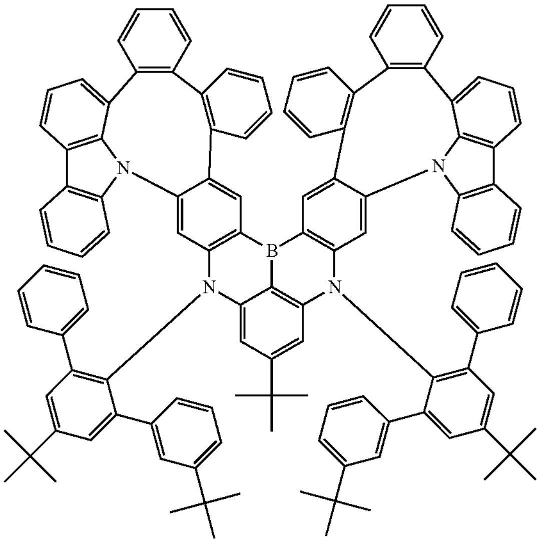
14
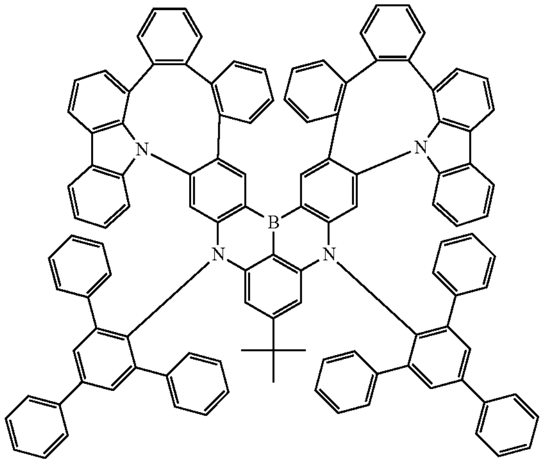

-continued
15
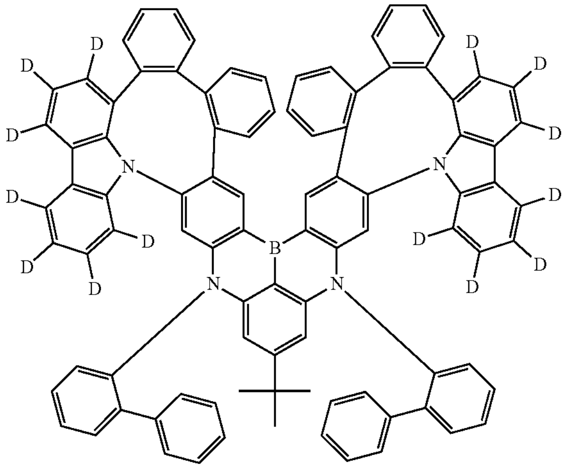
16
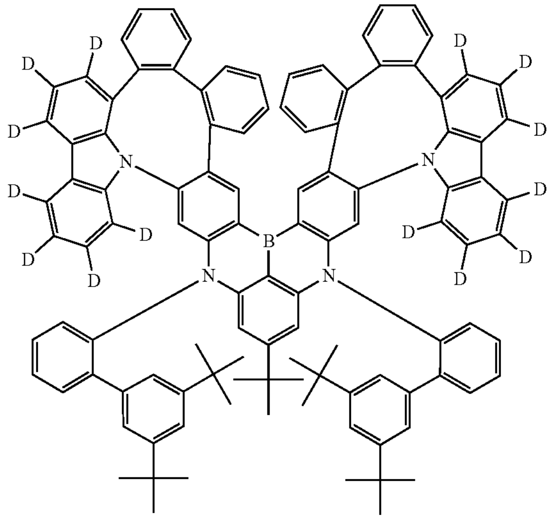
17
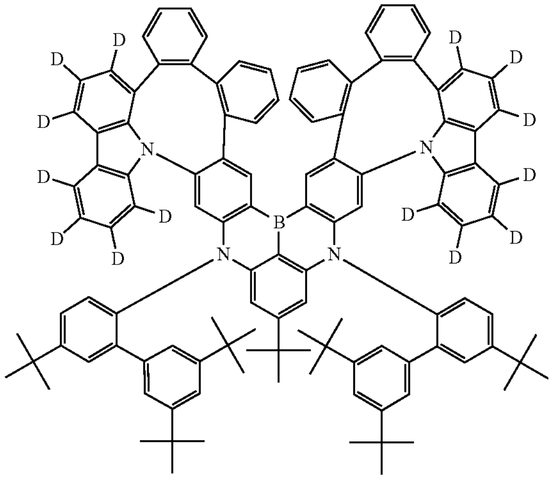
18
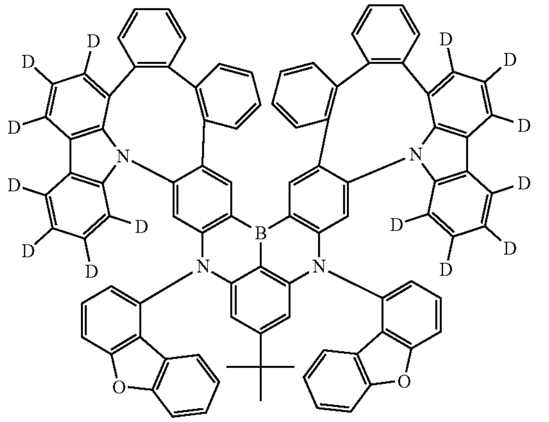
19
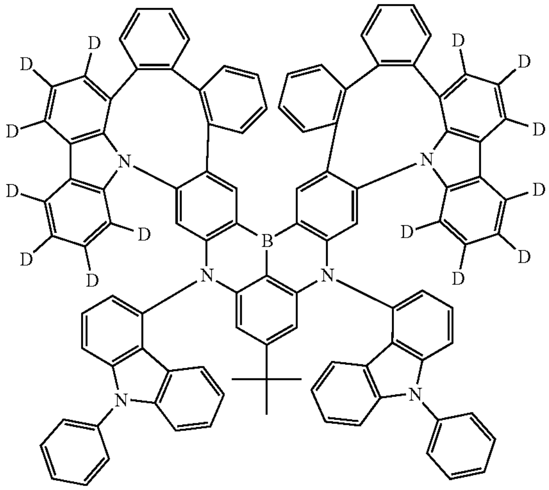
20
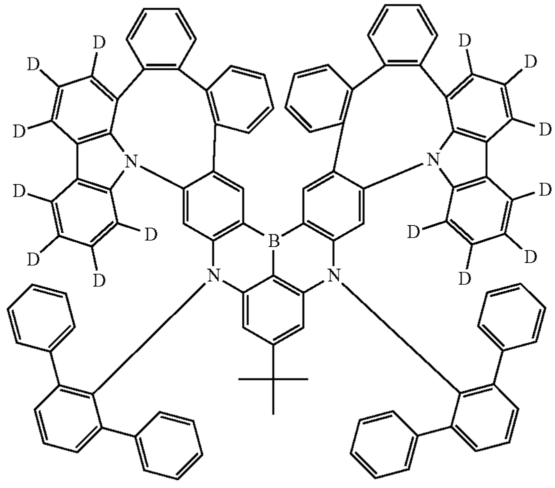

-continued
21
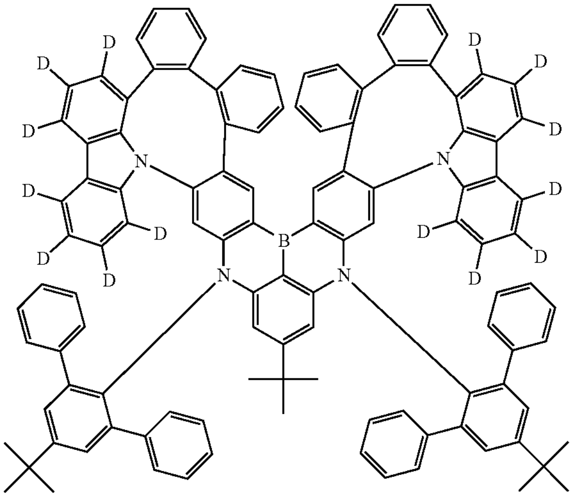
22
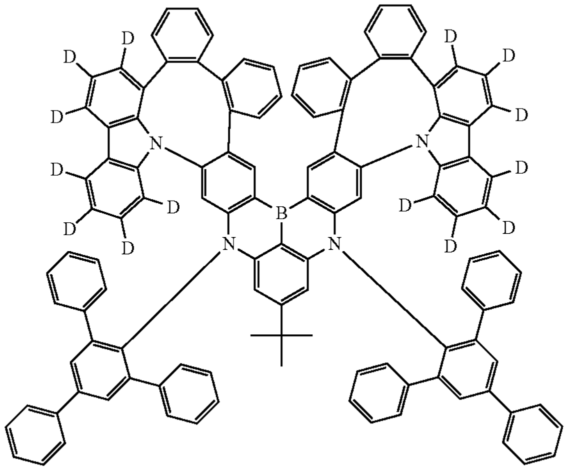
23
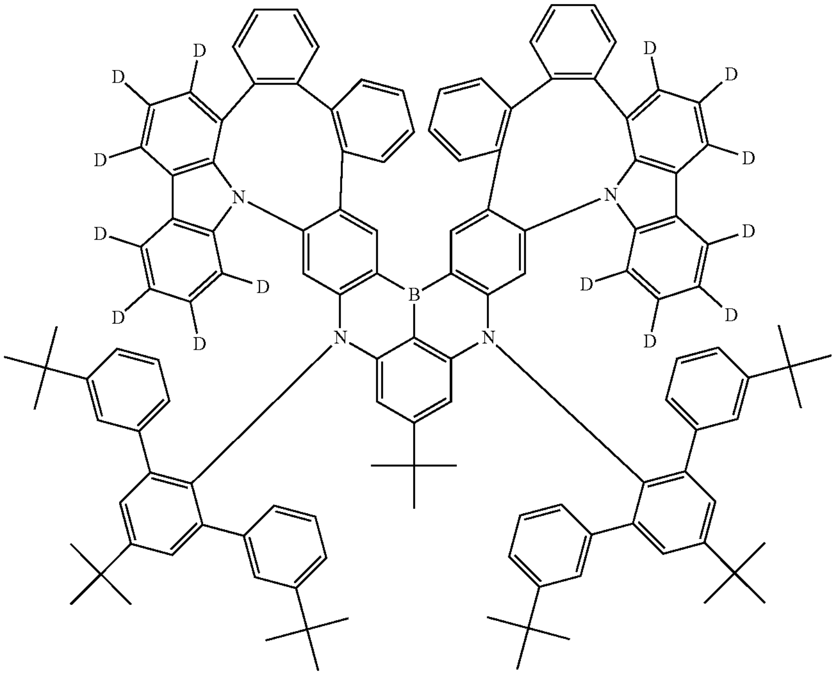

-continued
24
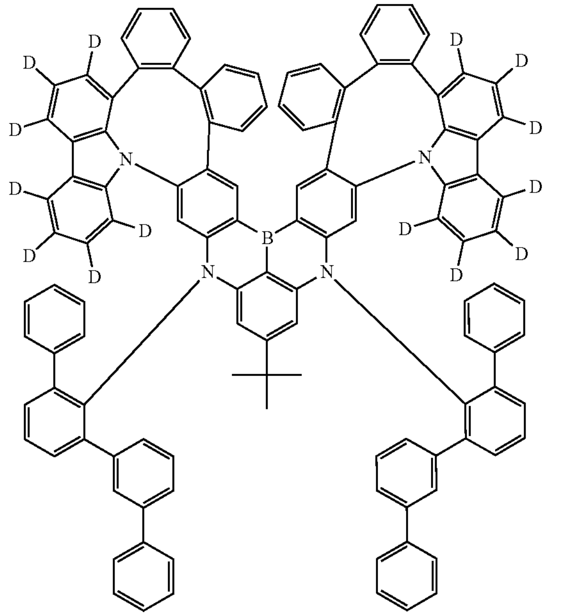
25
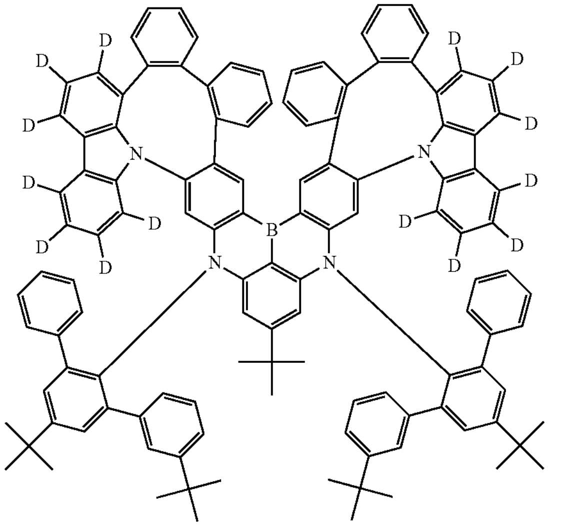
26
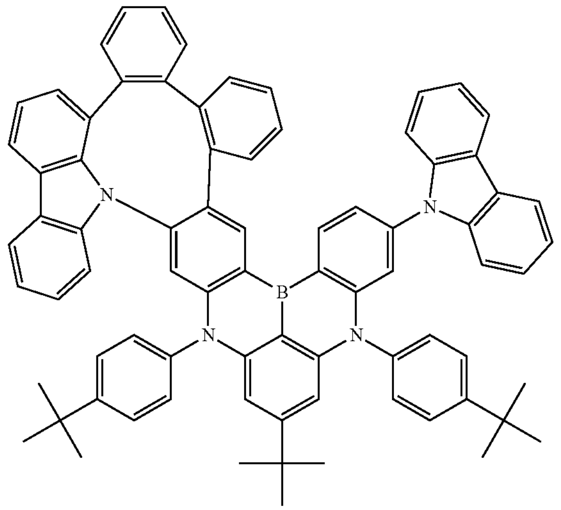
27
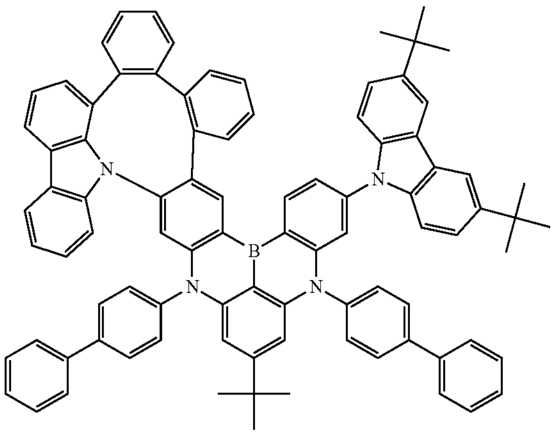
28
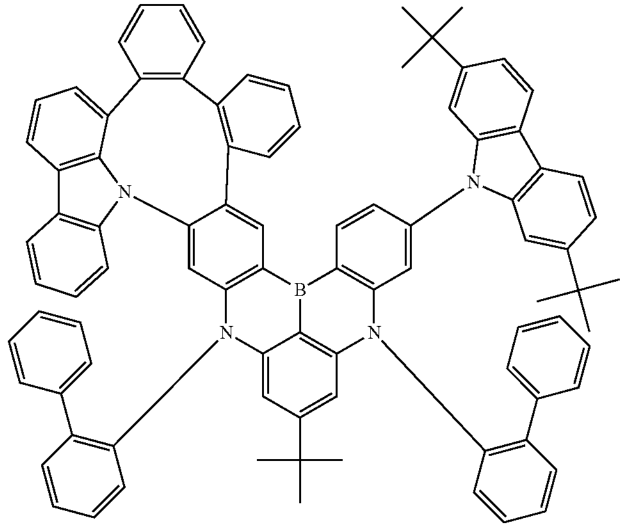

-continued
29
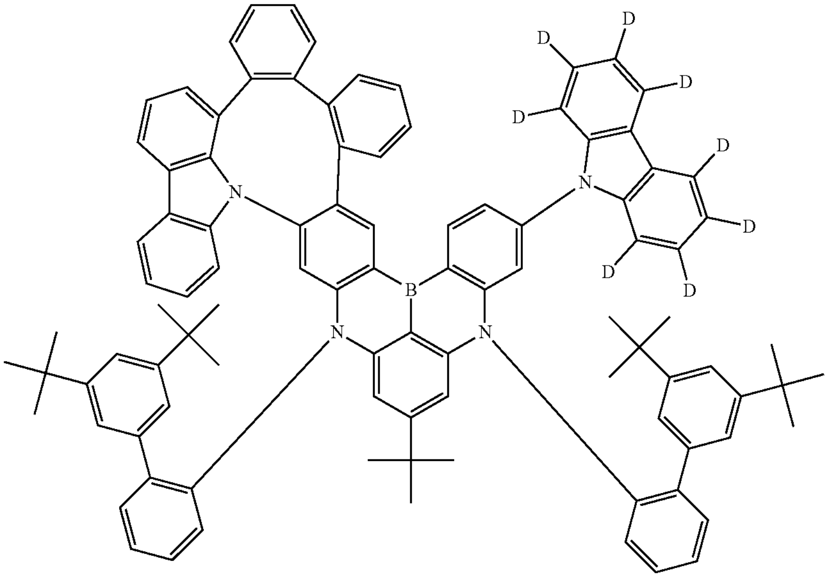
30
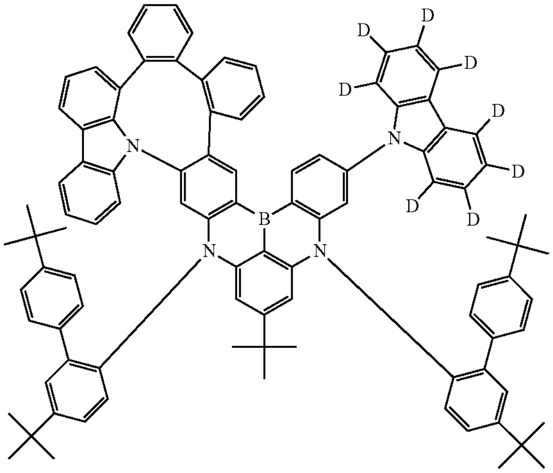
31
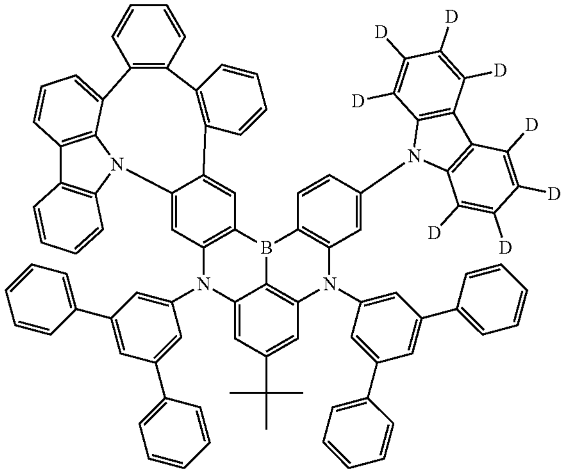
32
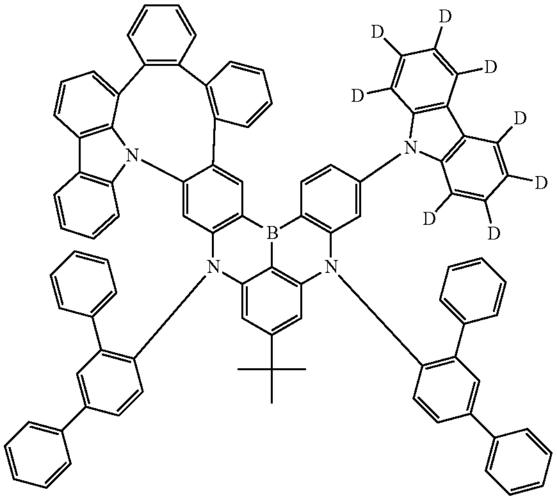
33
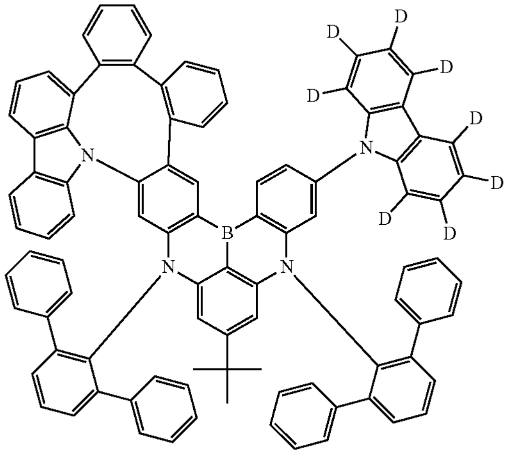

-continued
34
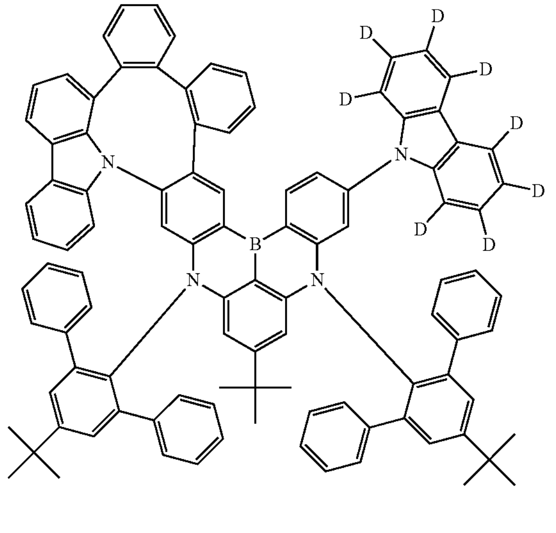
35
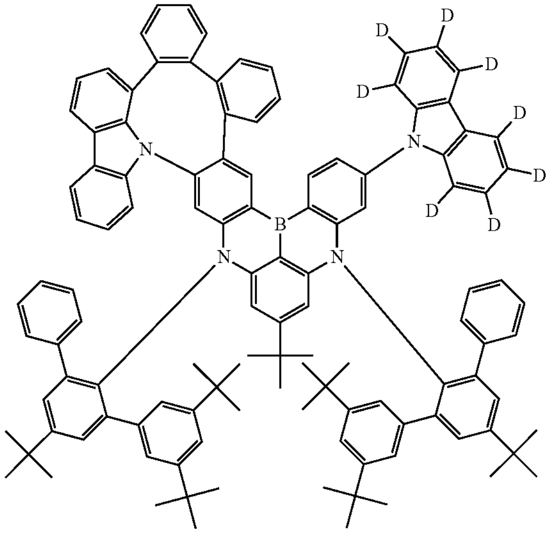
36
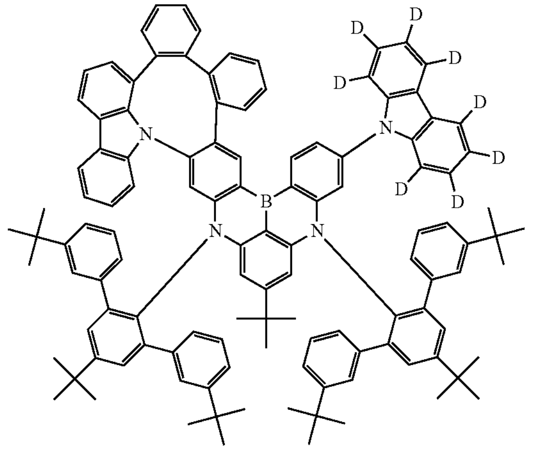
37
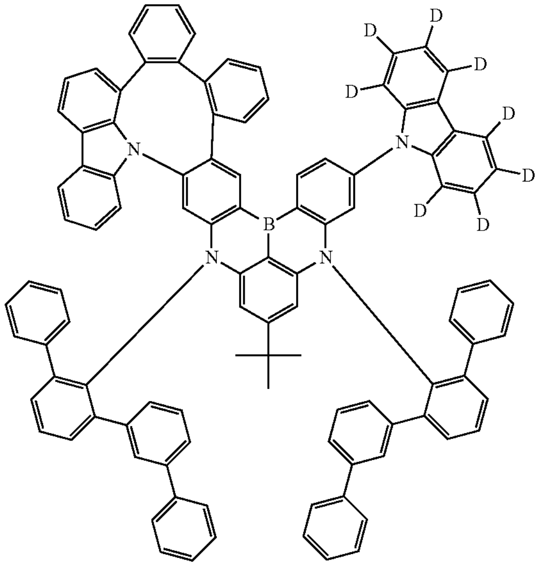
38
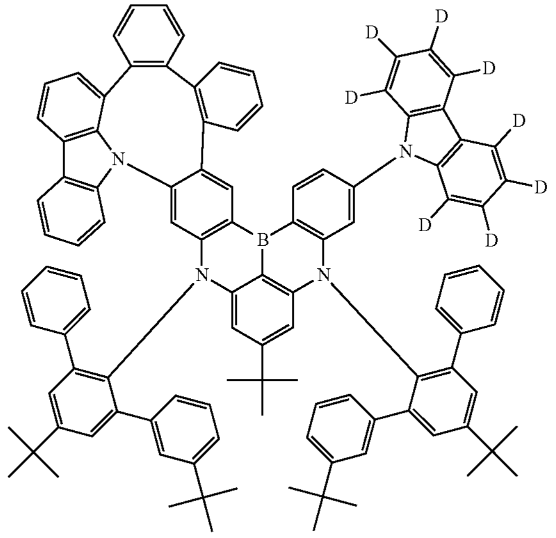
39
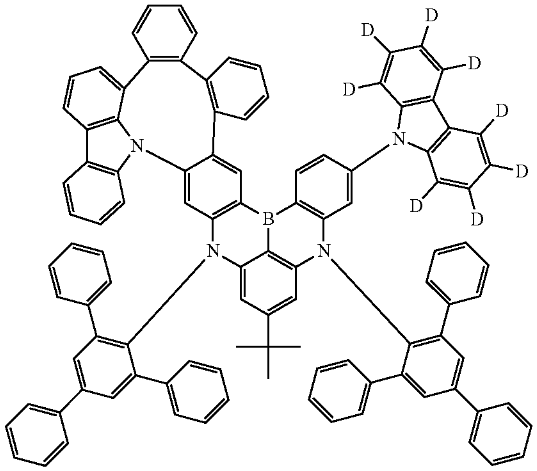

-continued
40
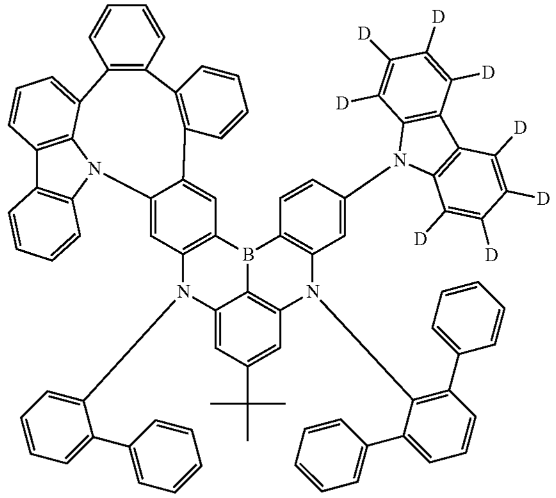
40
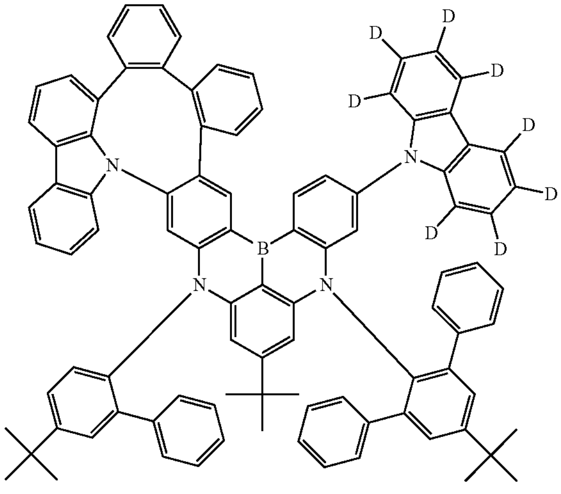
42
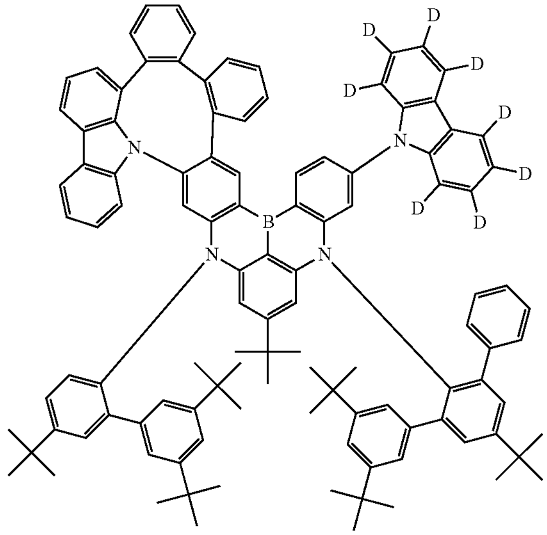
43
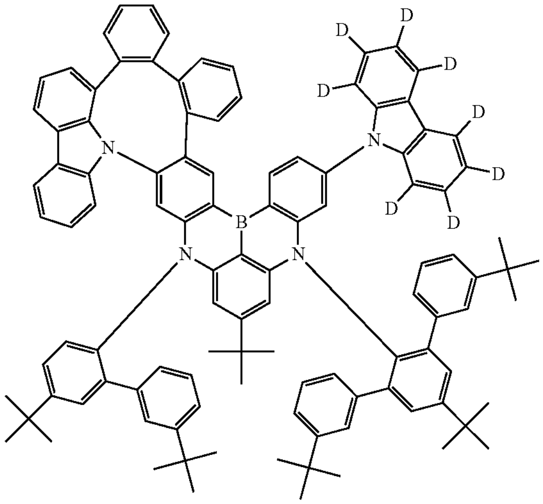
44
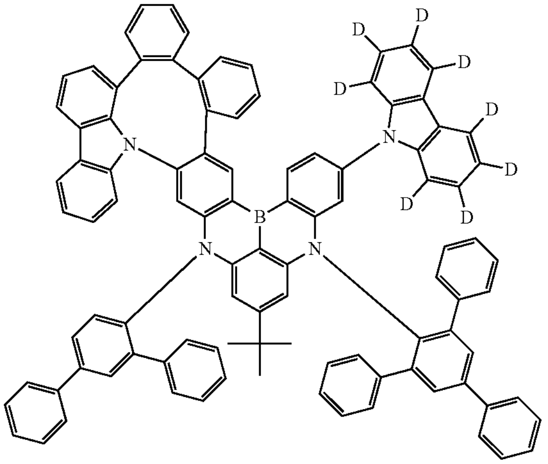
45
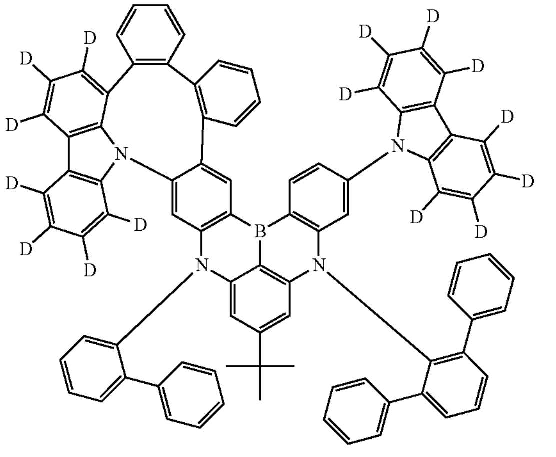

-continued
46
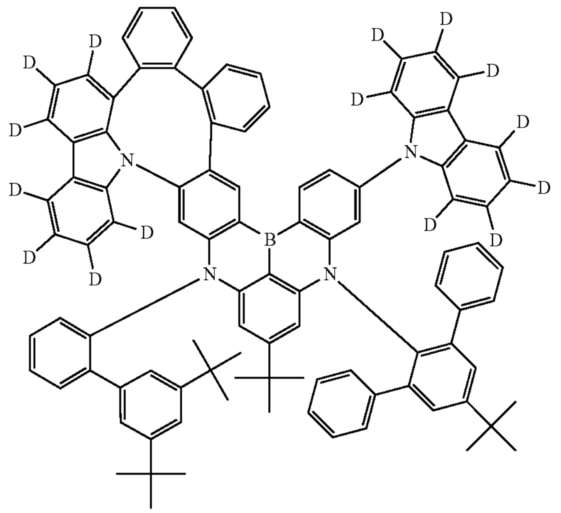
47
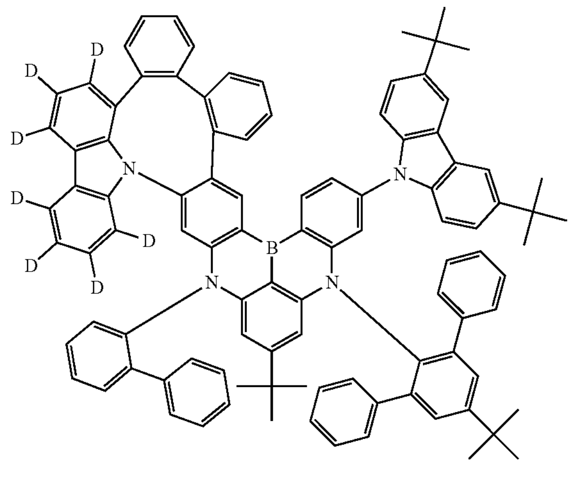
48
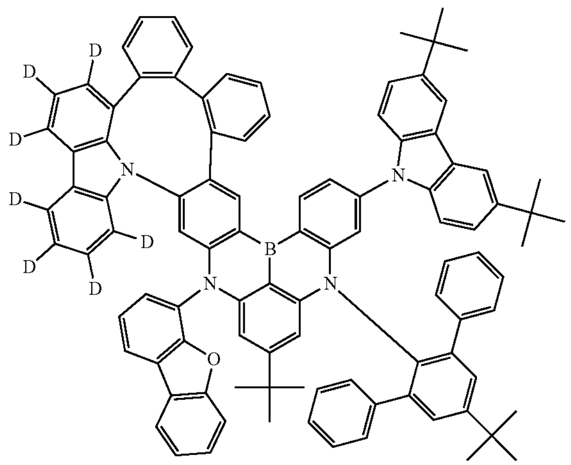
49
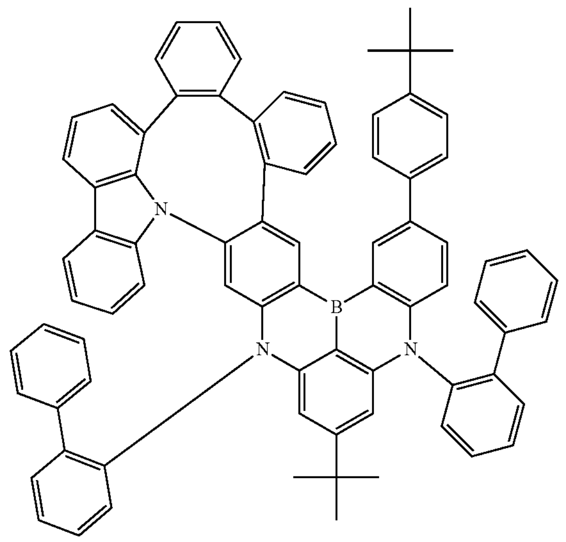
50
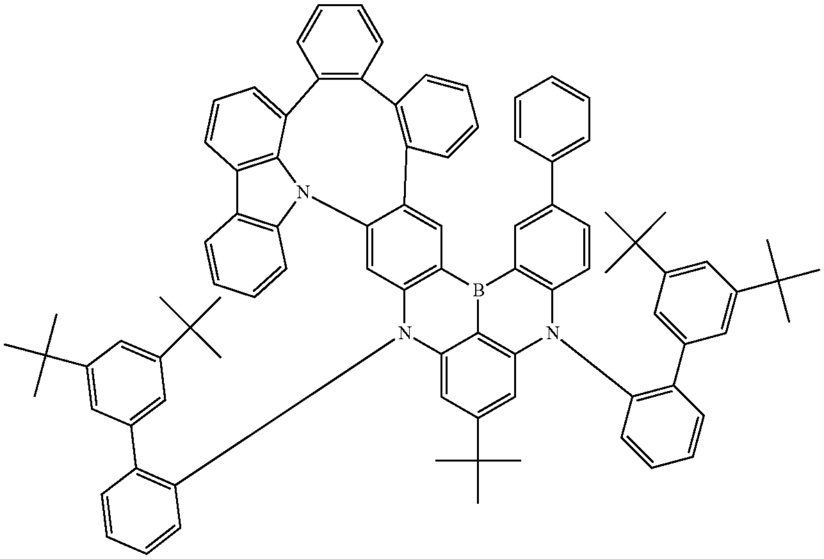

-continued
51
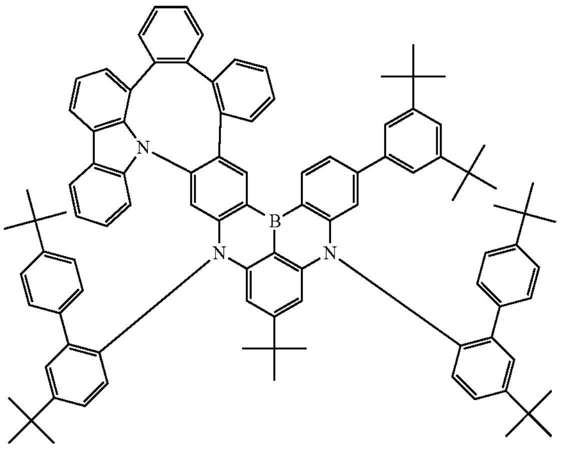
52
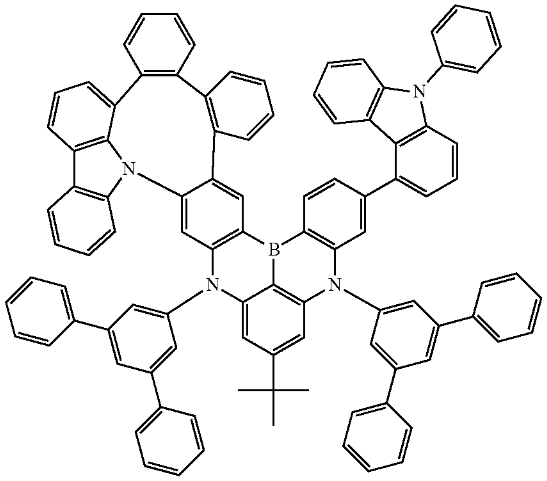
53
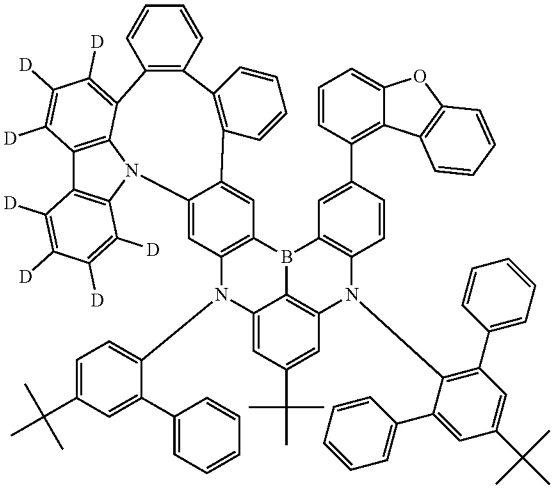
54
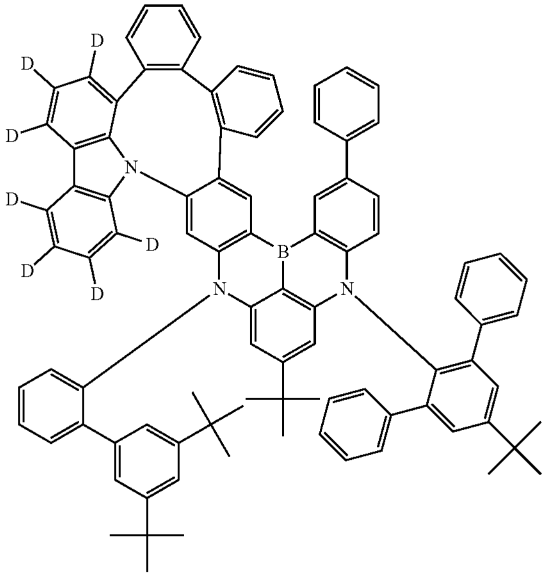
55
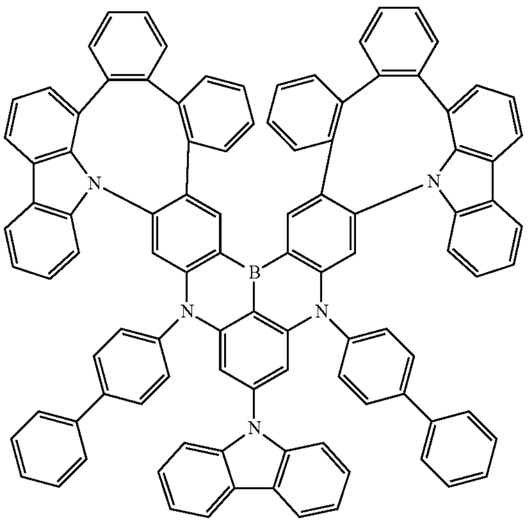
56
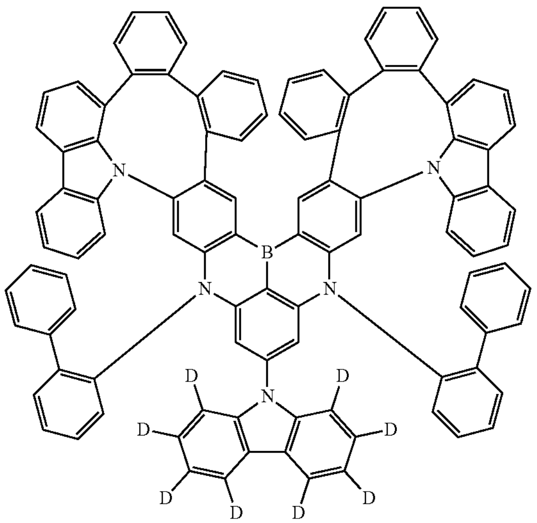

-continued
57
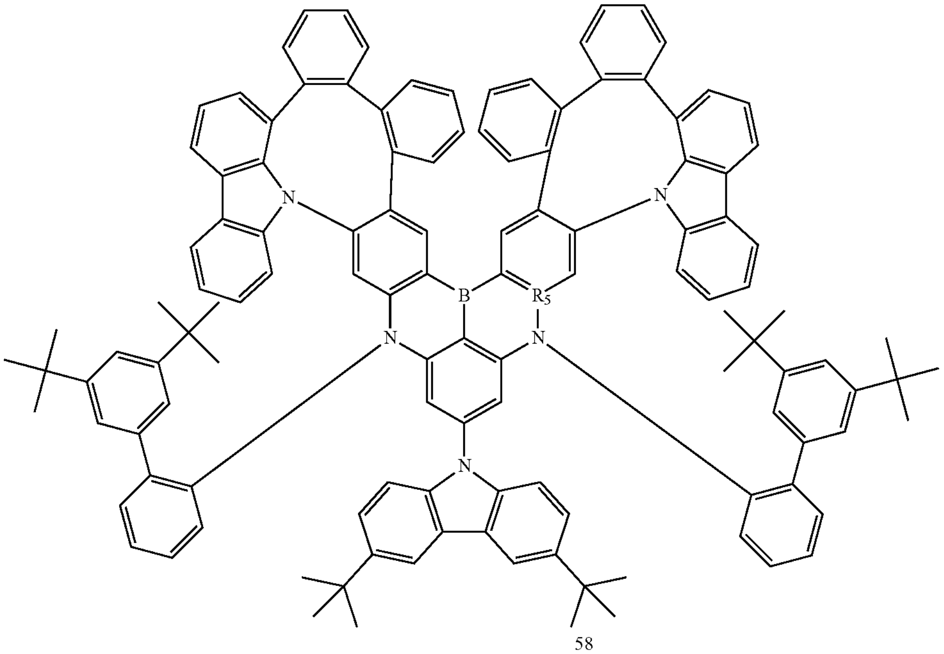
58
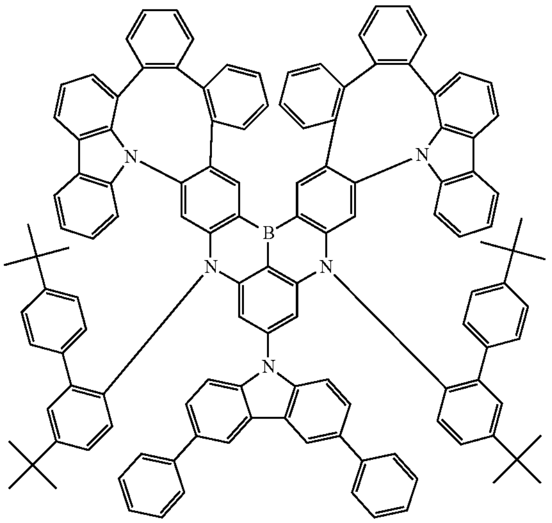
59
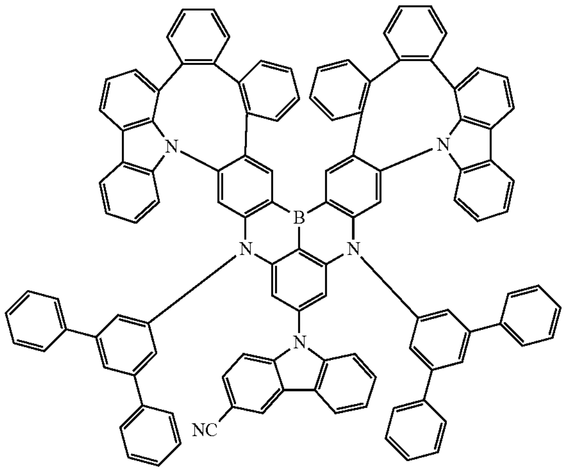
60
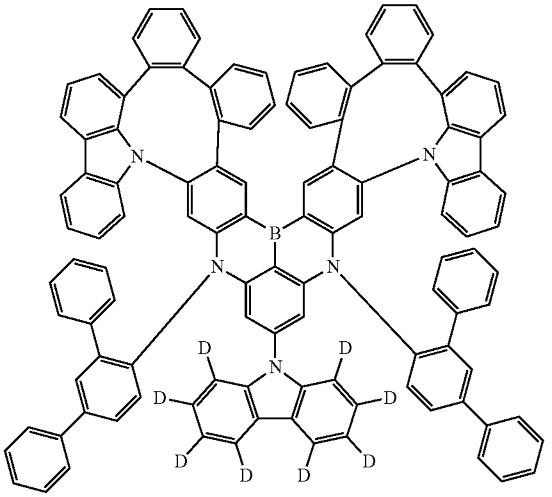
61
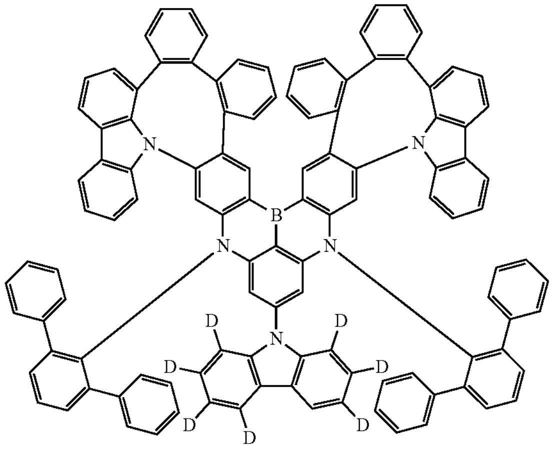

-continued
62
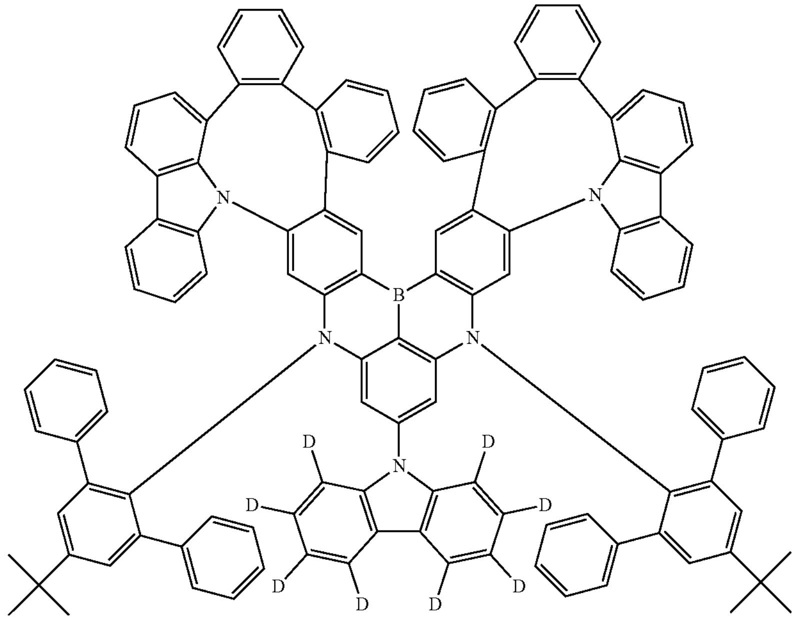
63
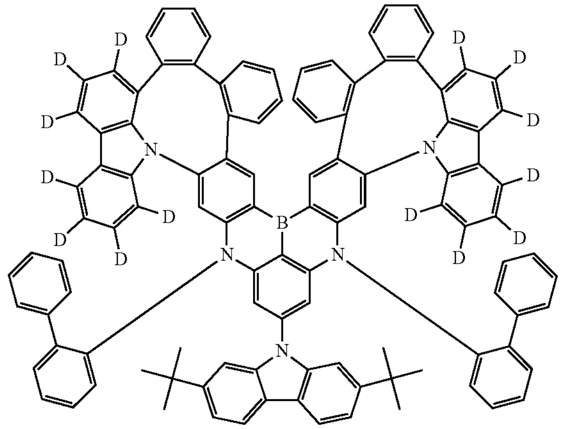

-continued
64
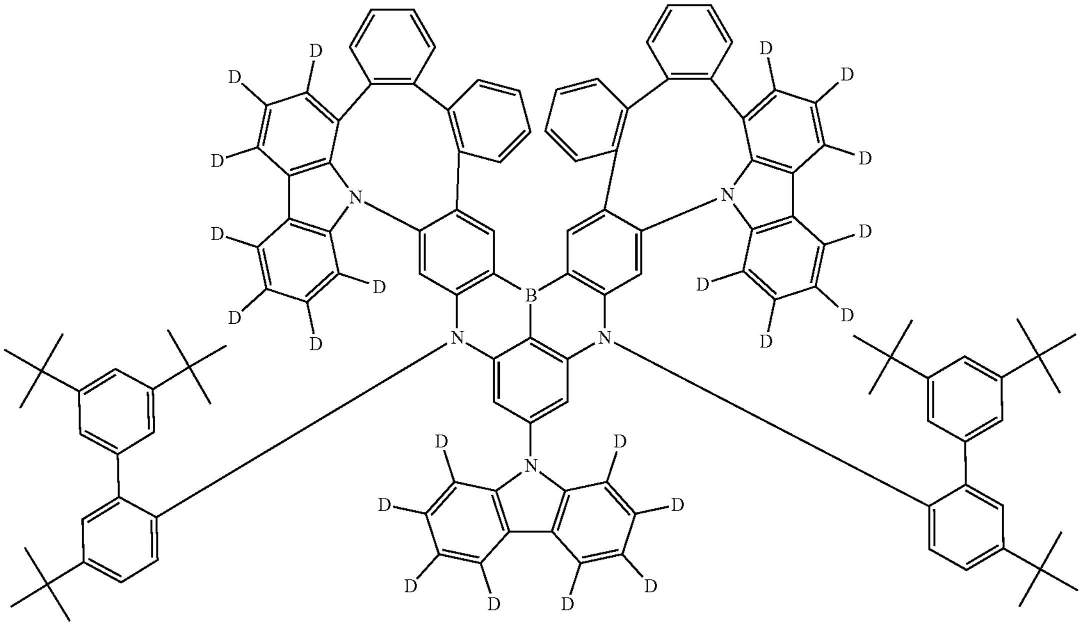
65
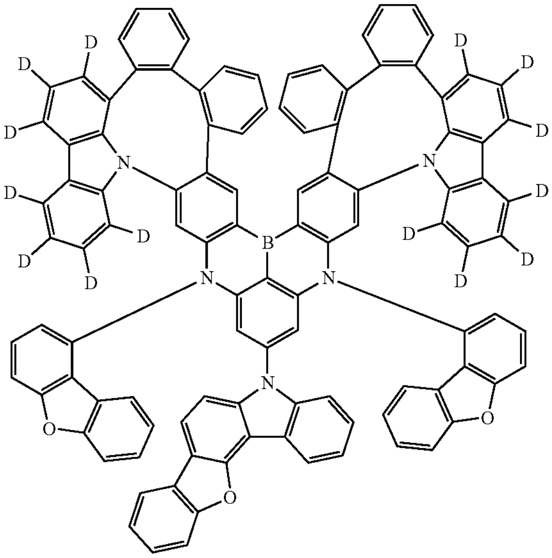
66
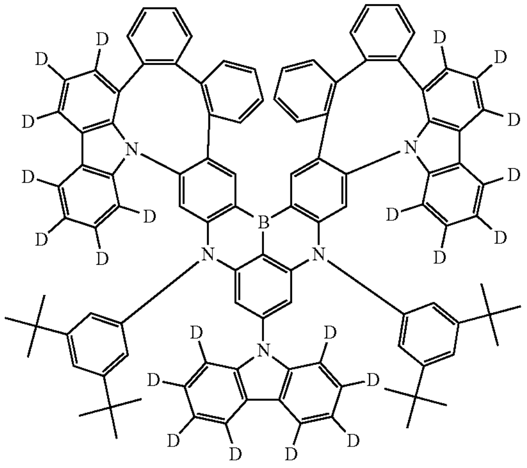

-continued
67
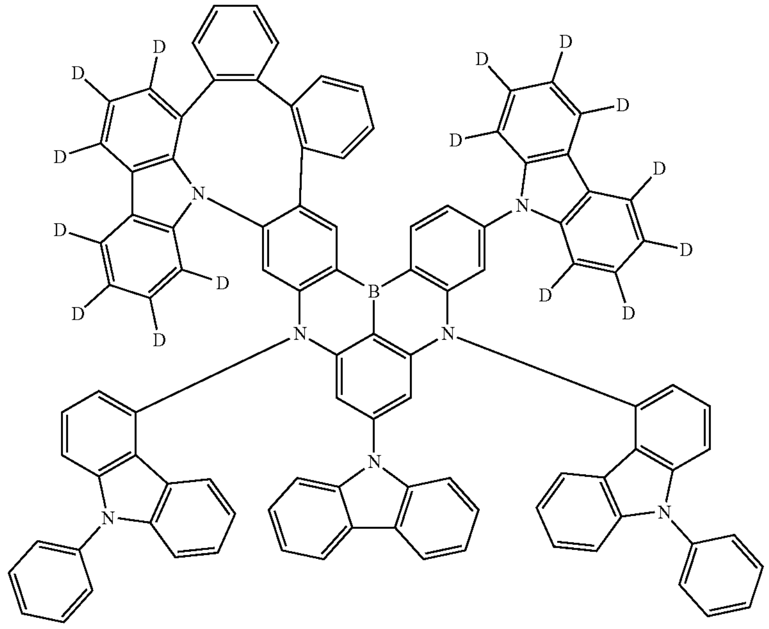
68
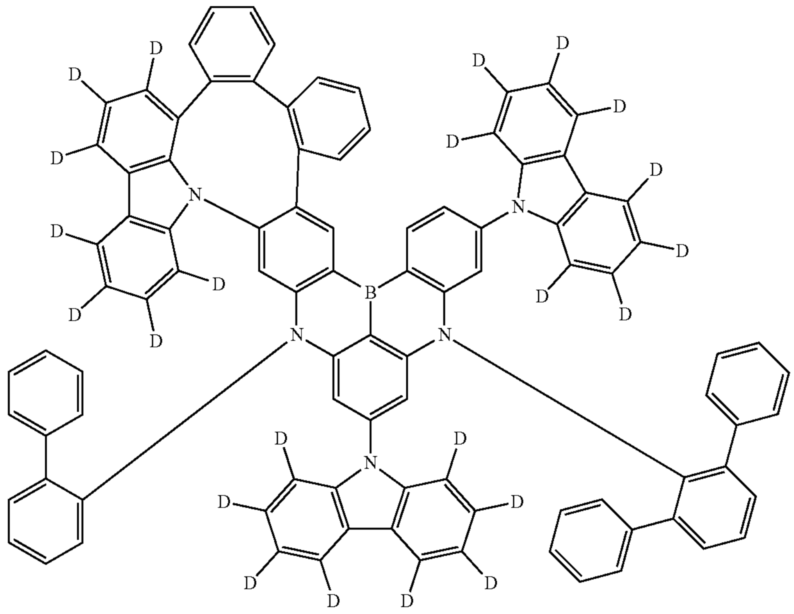

-continued
69
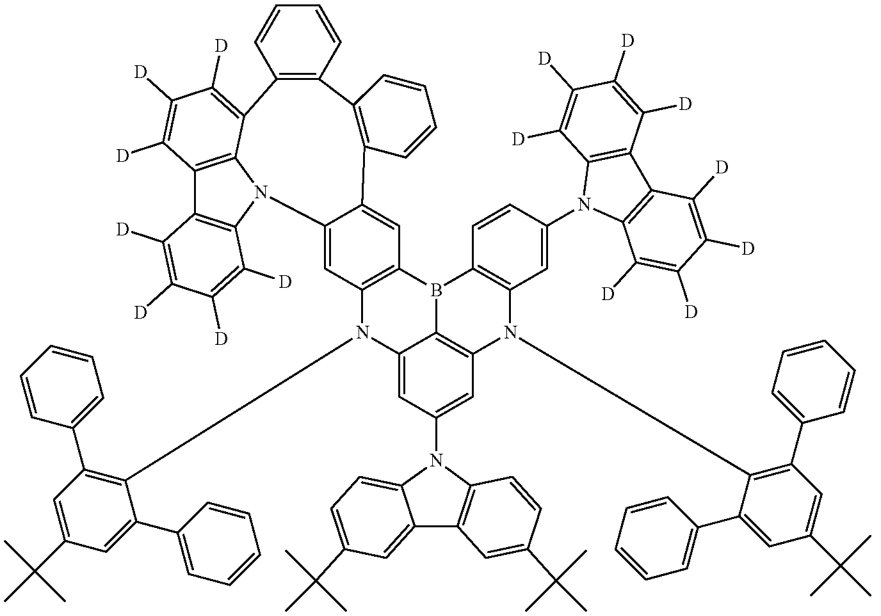
70
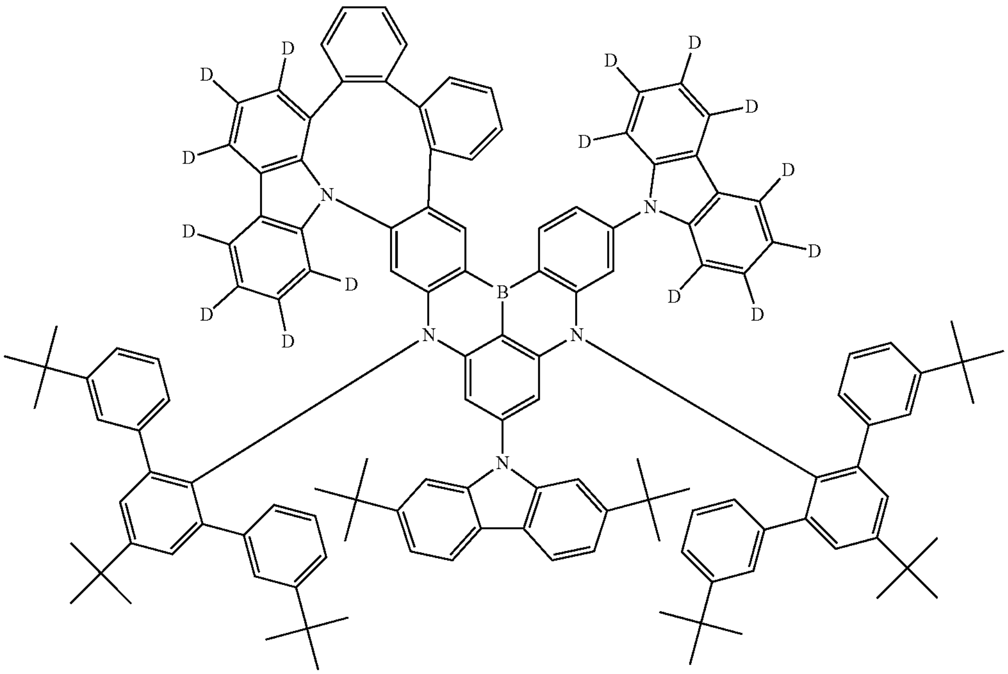

-continued
71
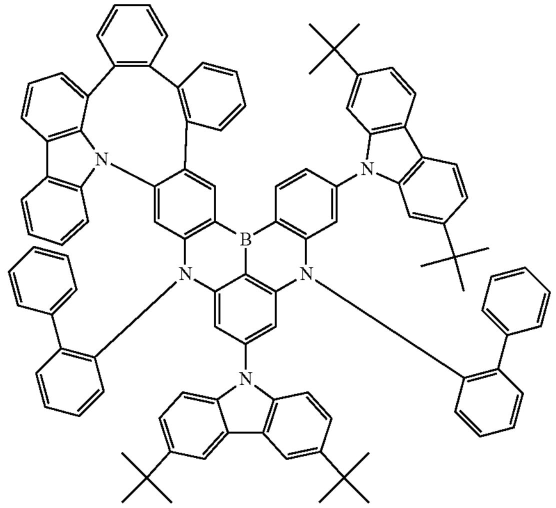
72
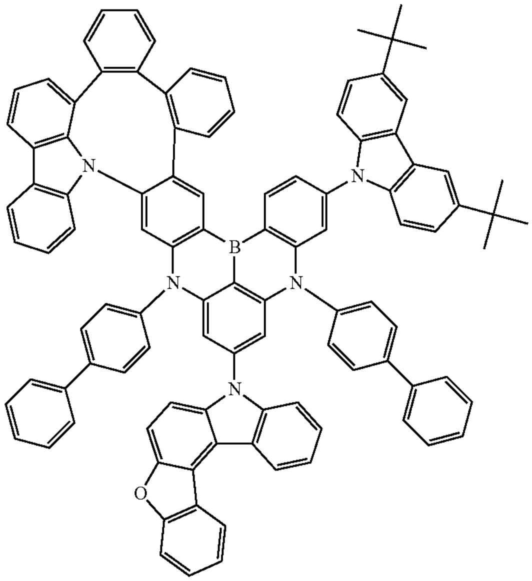
73
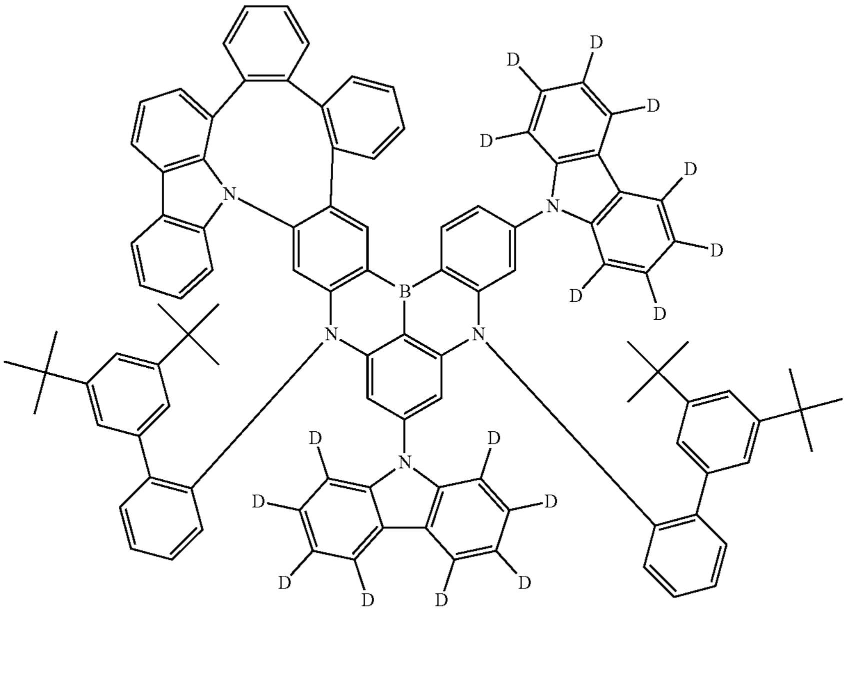

-continued
74
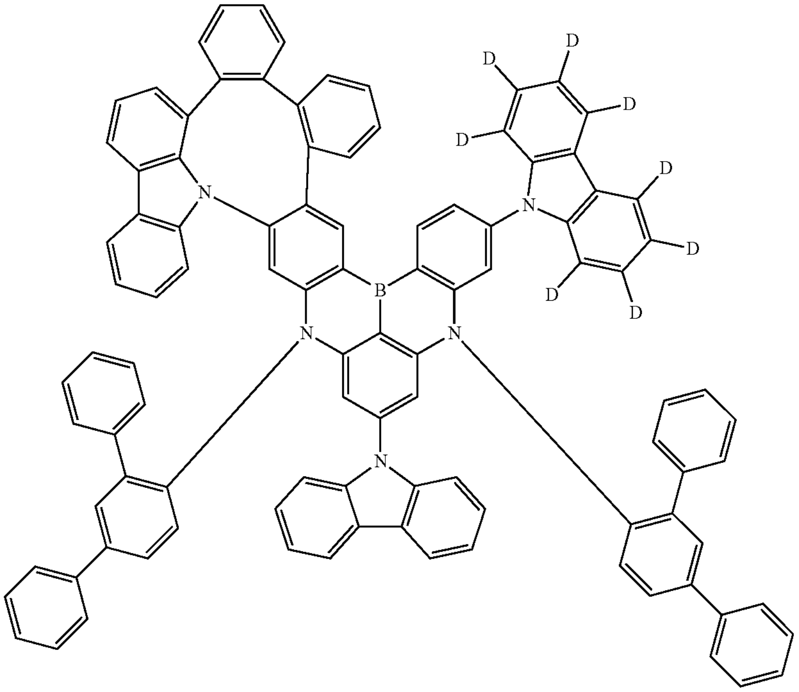
75
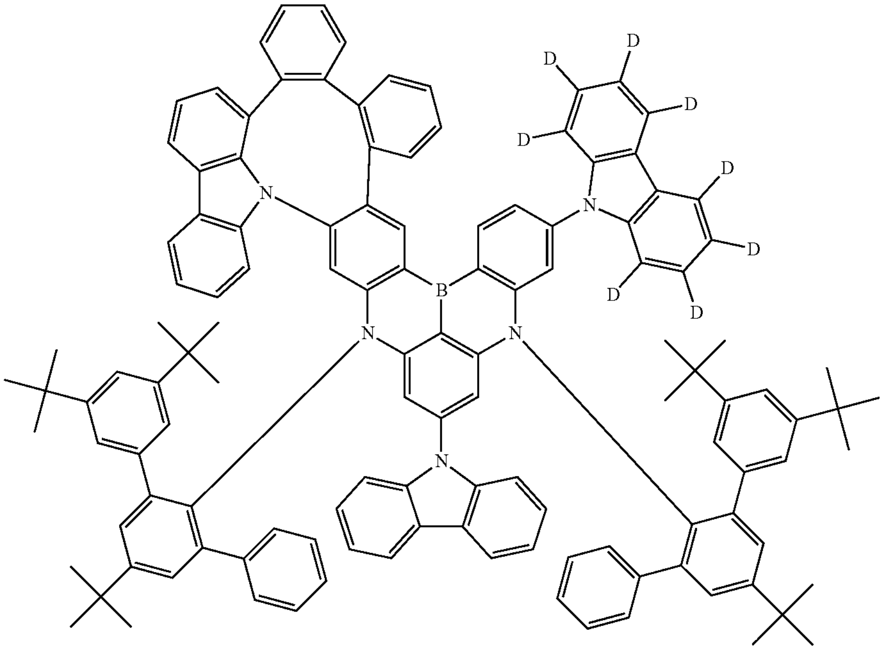

-continued
76
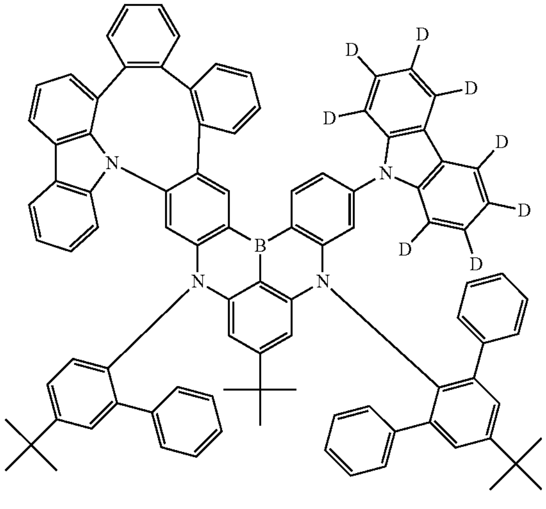
77
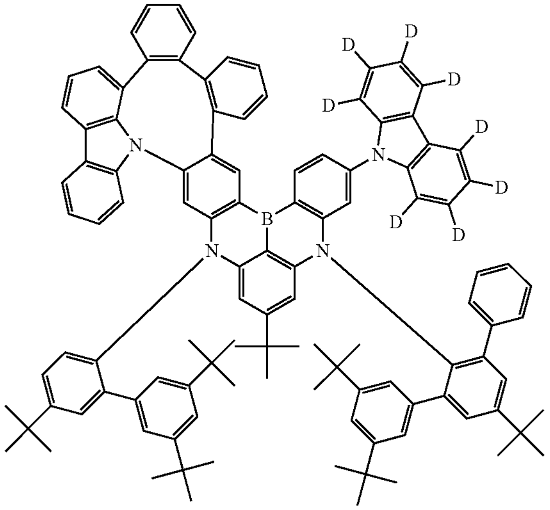
78
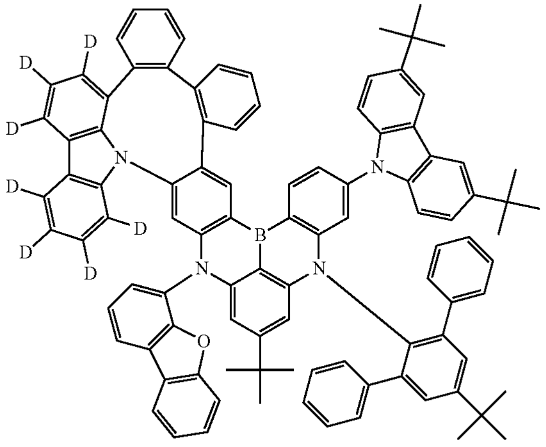
79
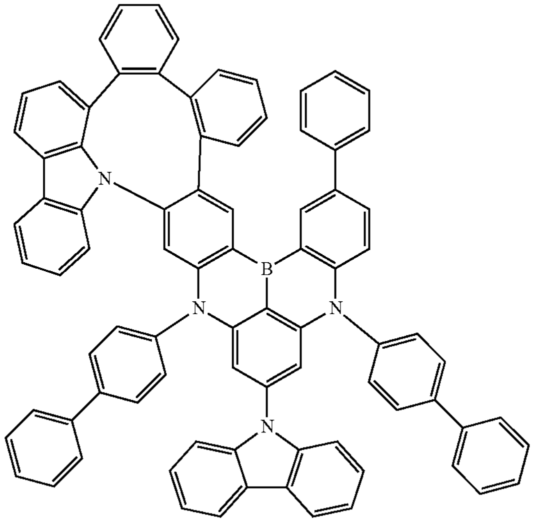
80
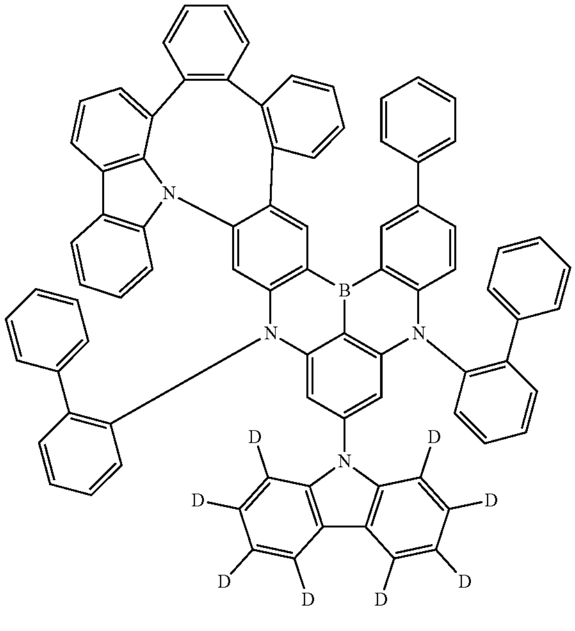
81
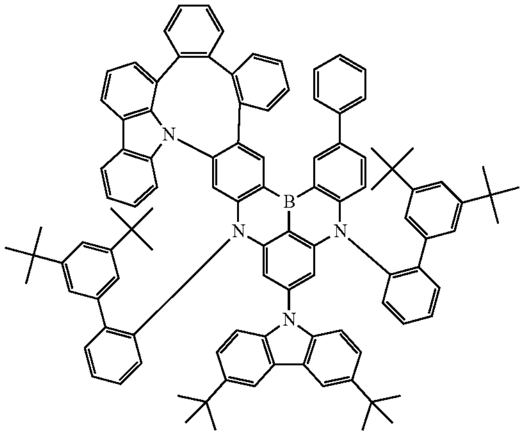

-continued
82
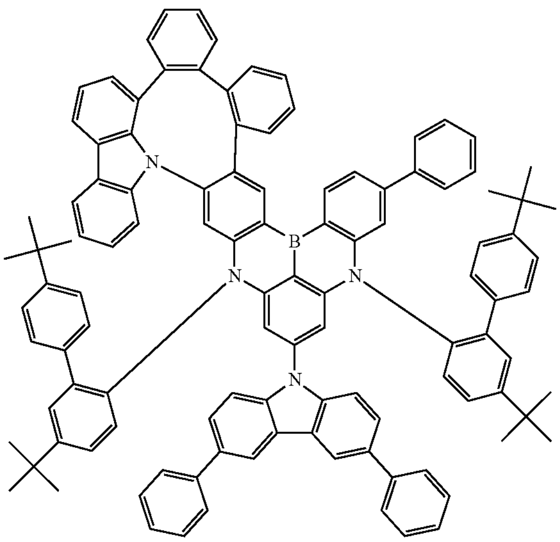
83
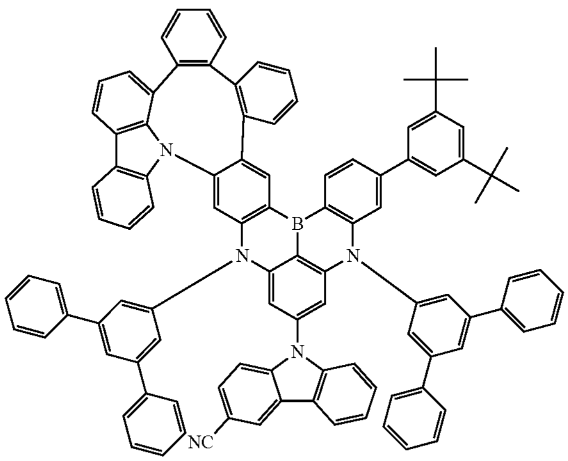
84
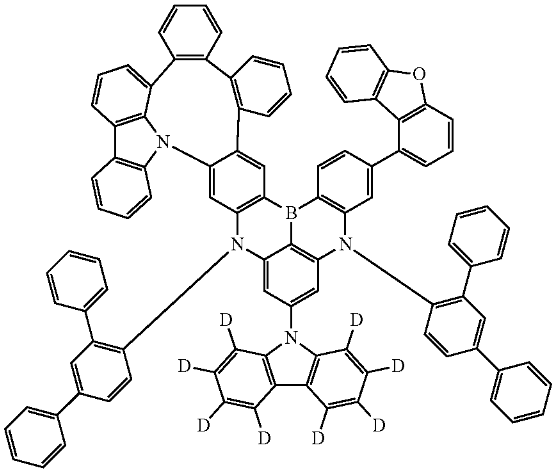
85
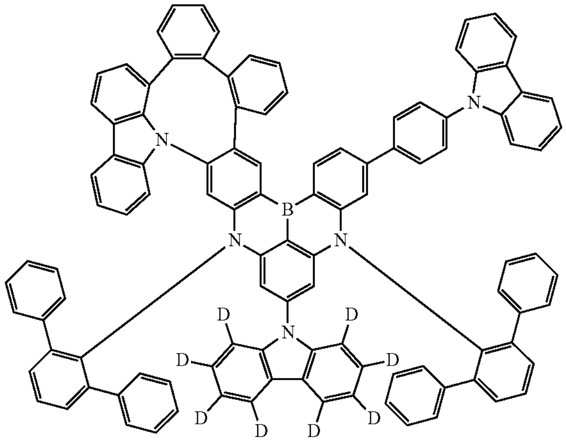
86
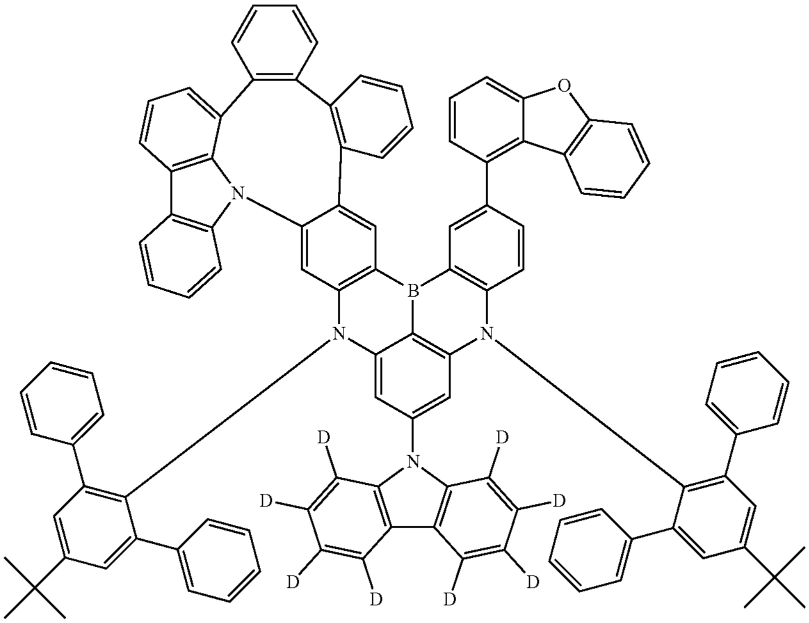

-continued
87
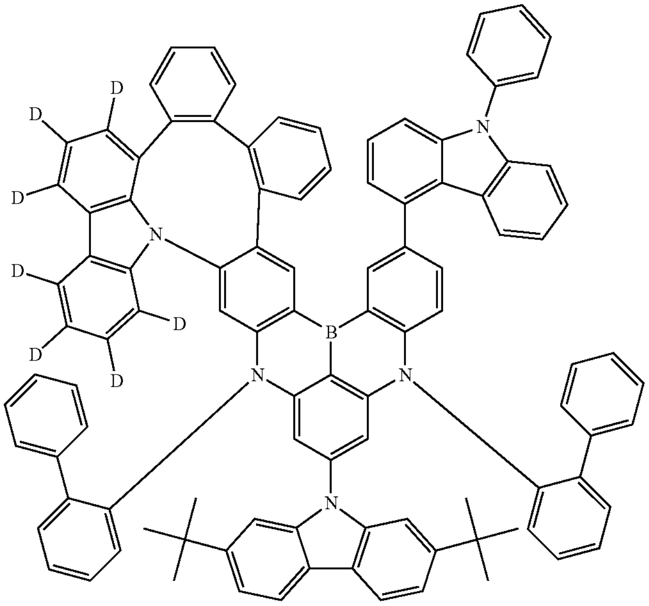
88
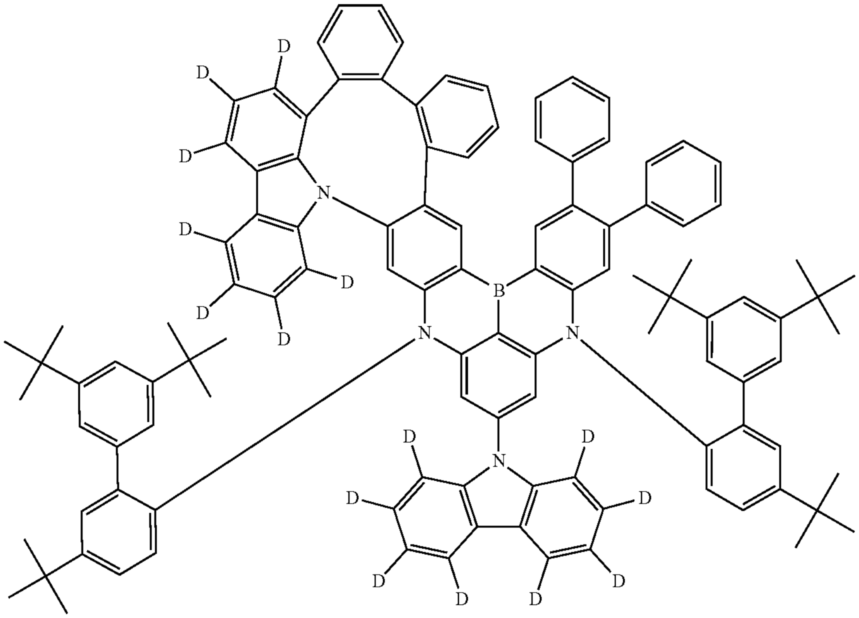

-continued
89
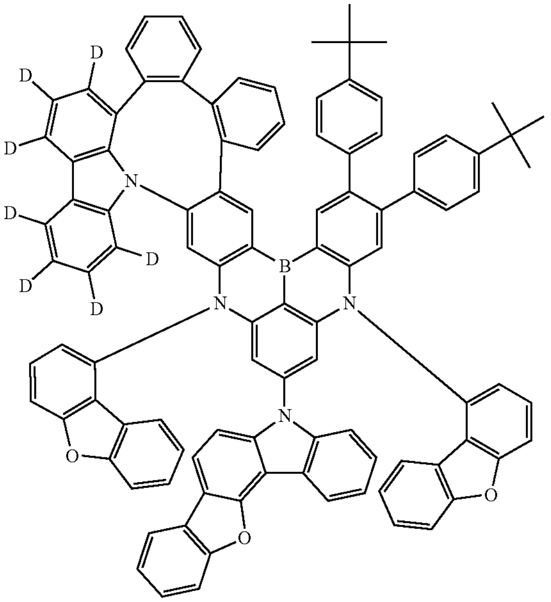
90
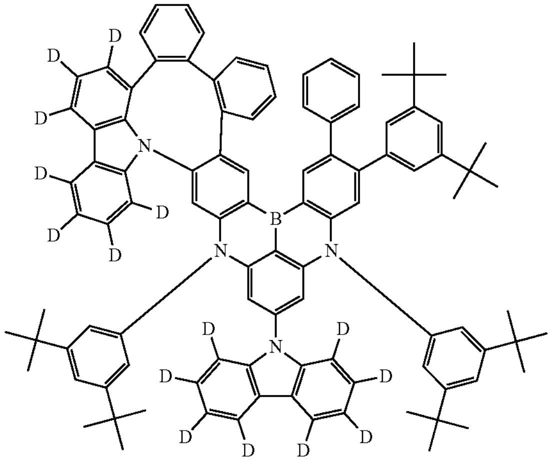
91
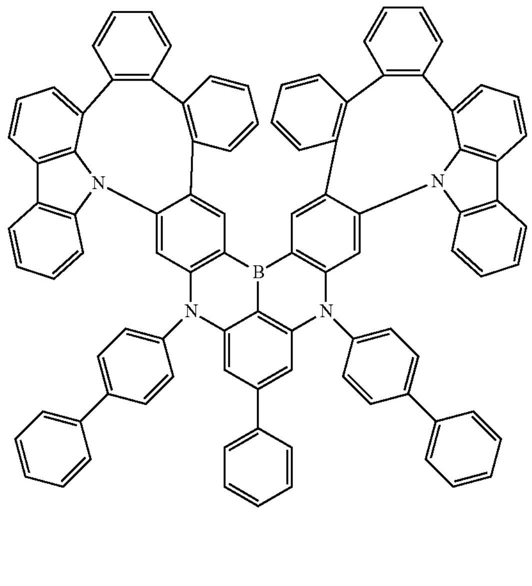
92
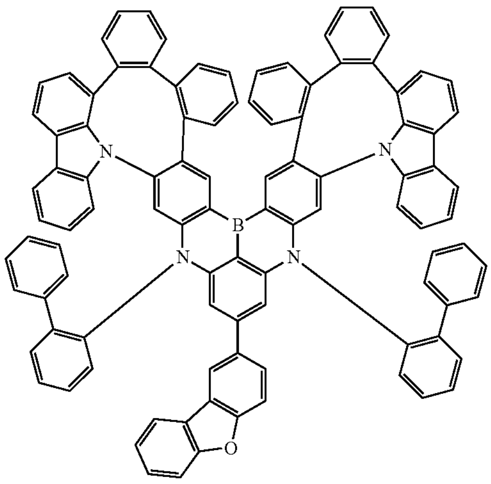

-continued
93
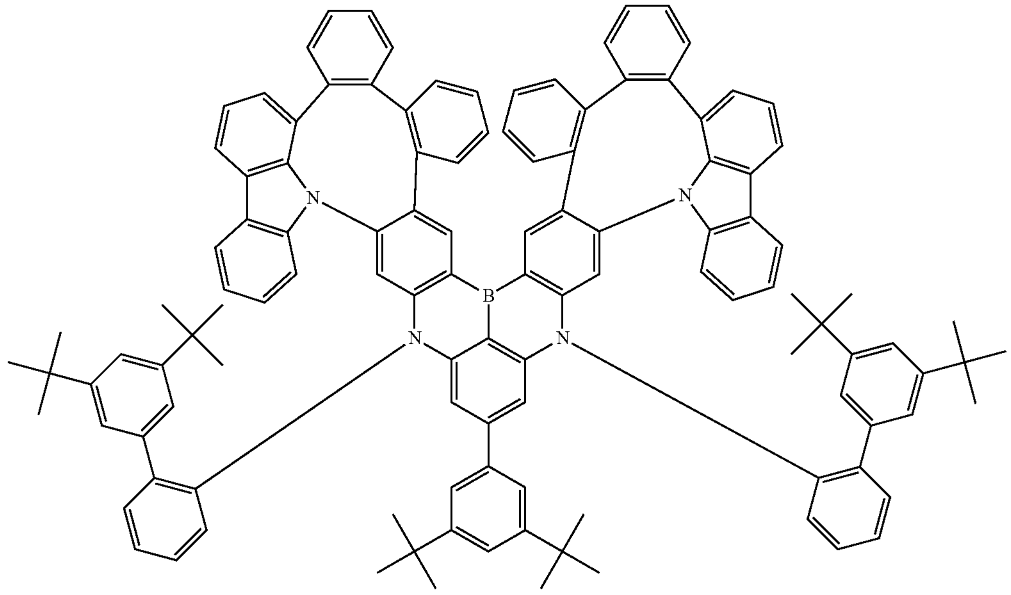
94
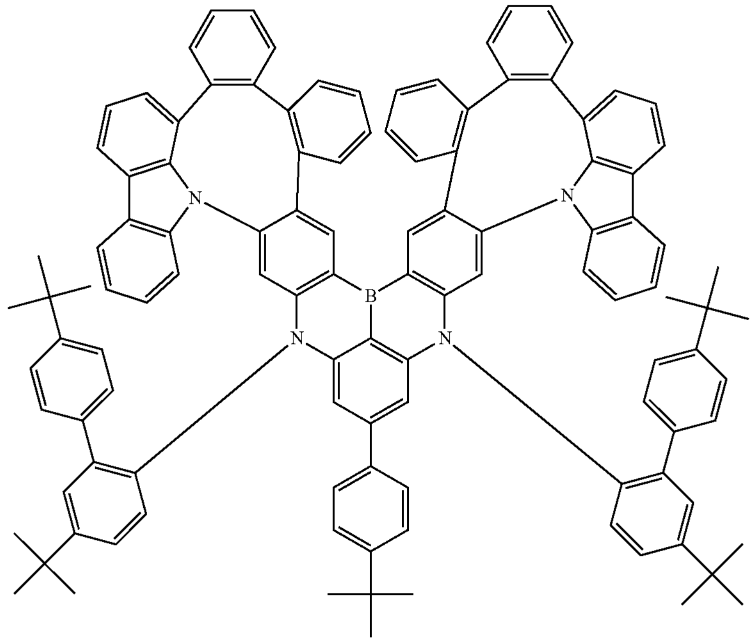

-continued
95
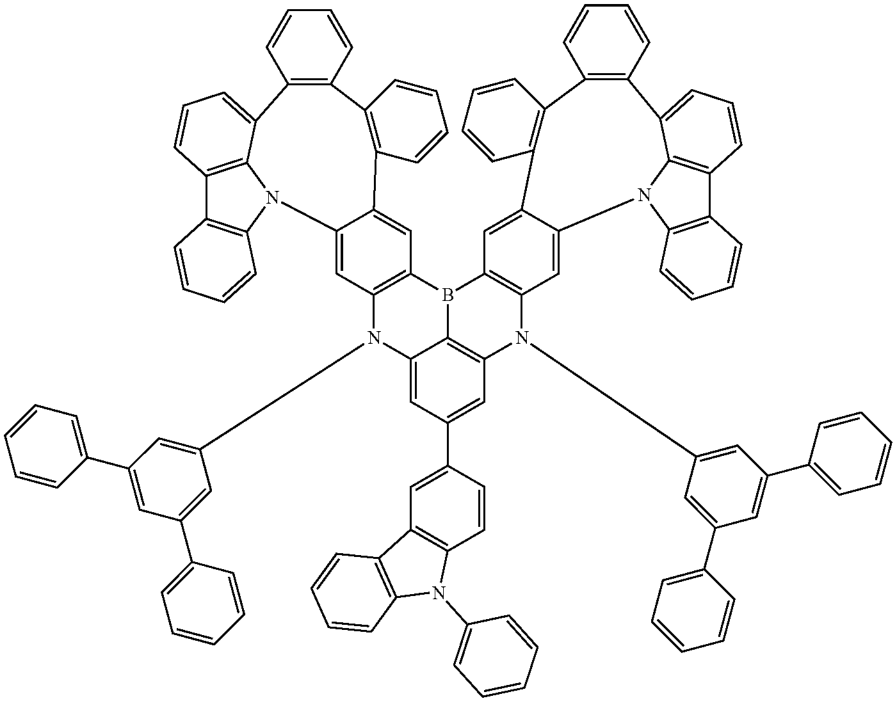
96
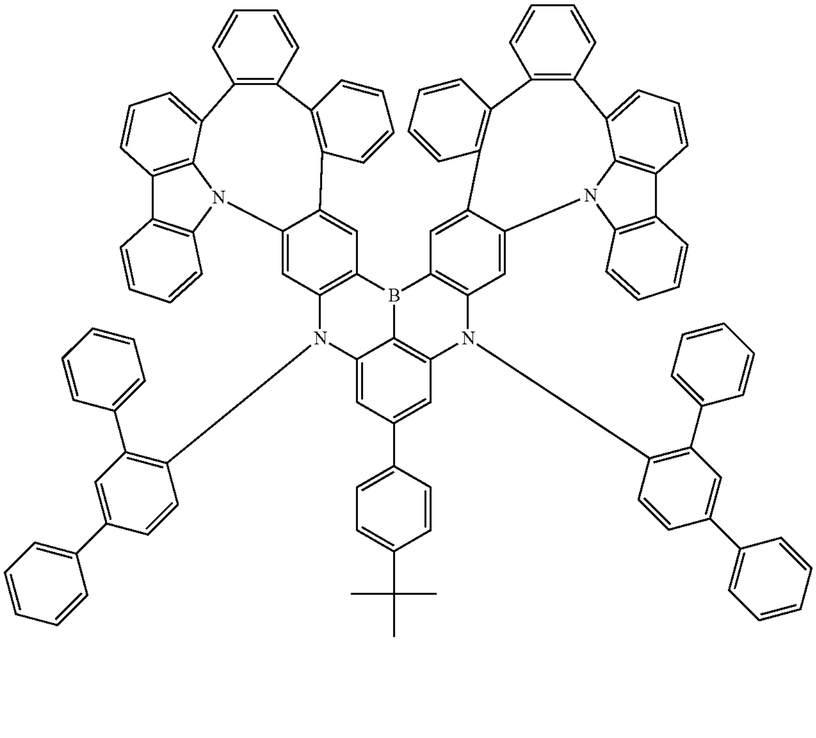

-continued
97
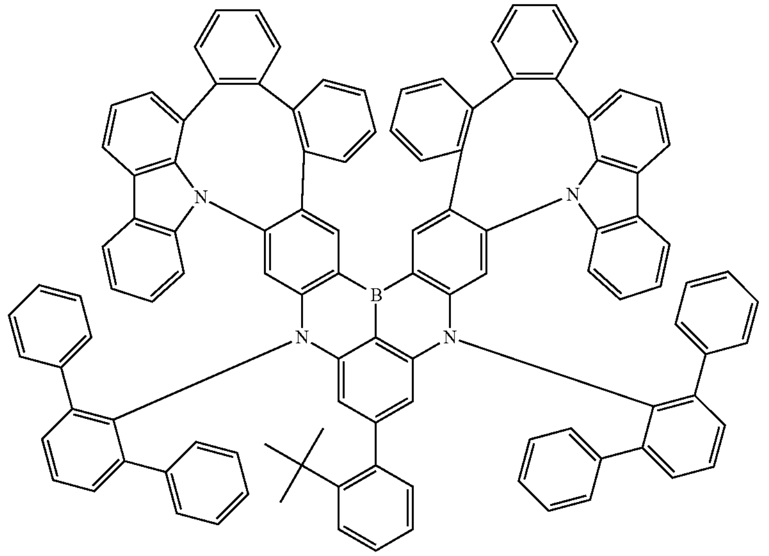
98
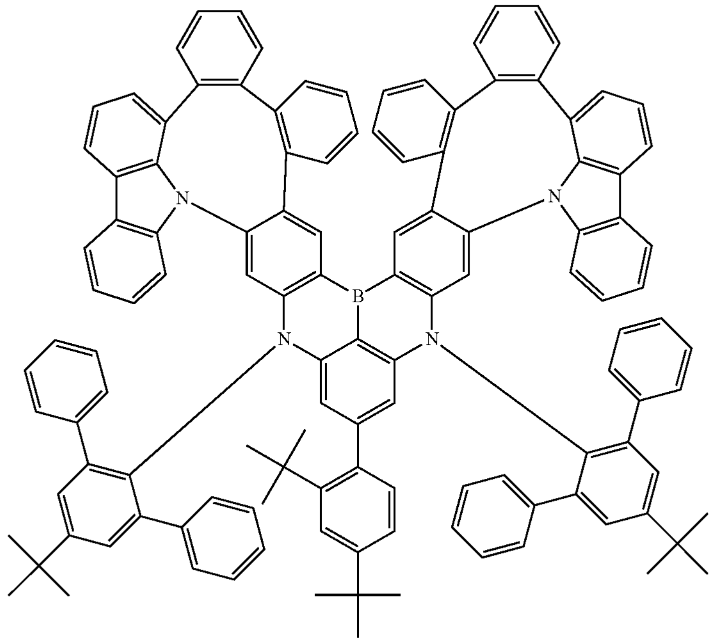

-continued
99
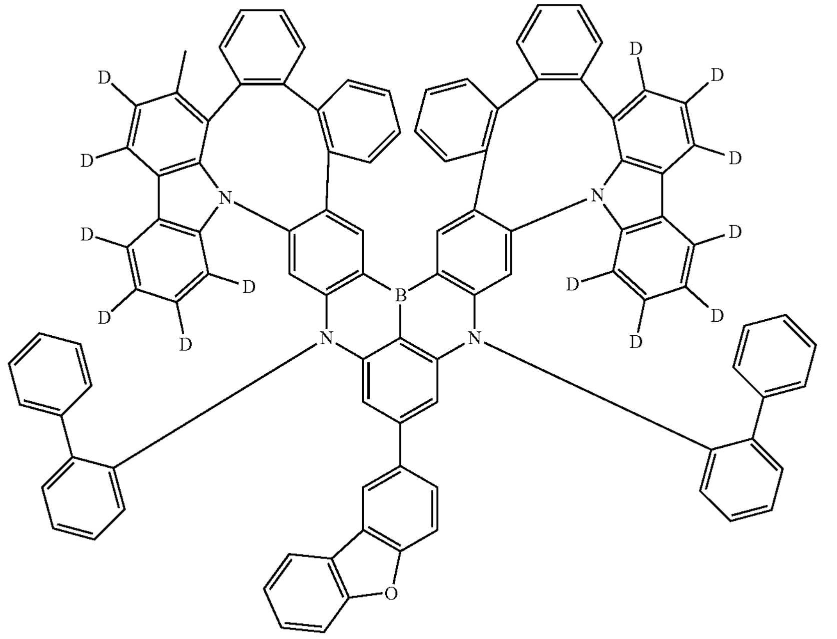
100
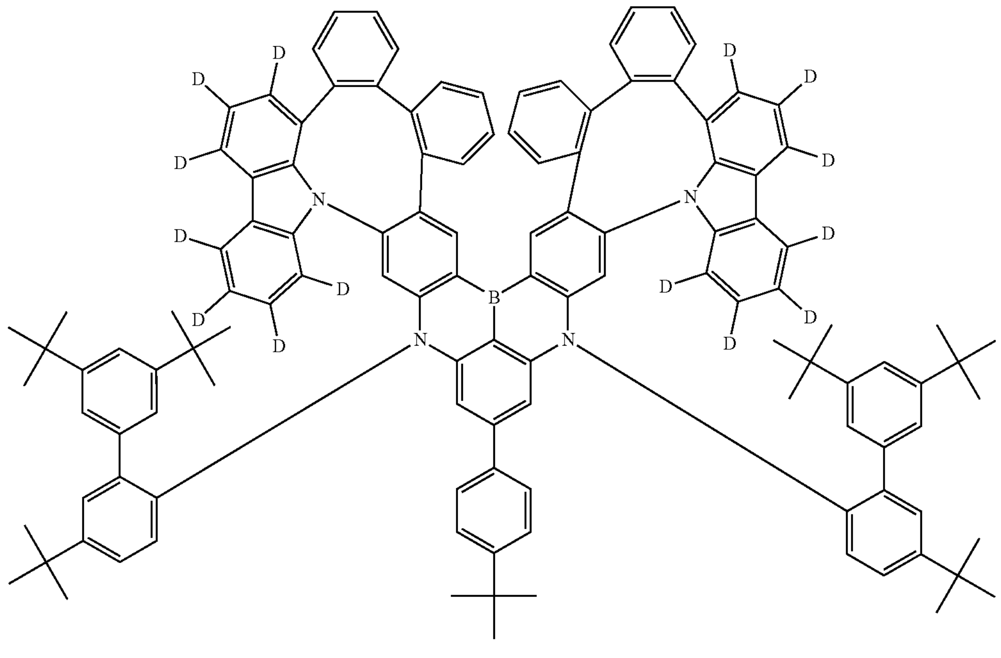

-continued
101
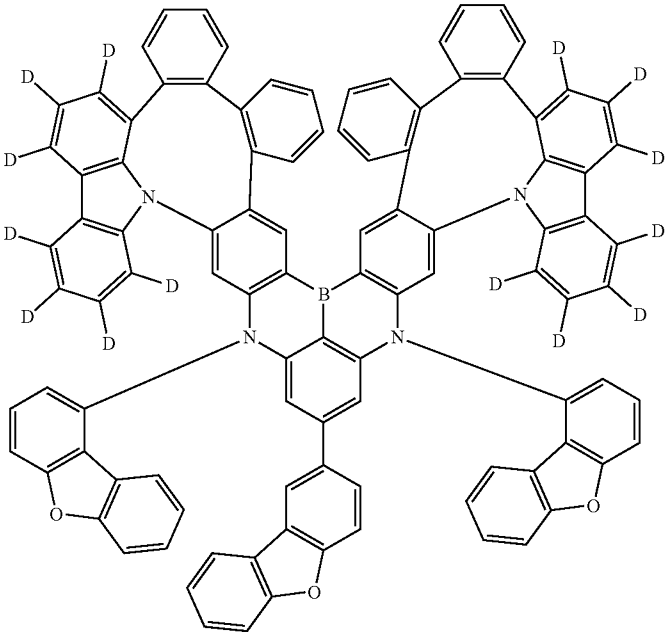
102
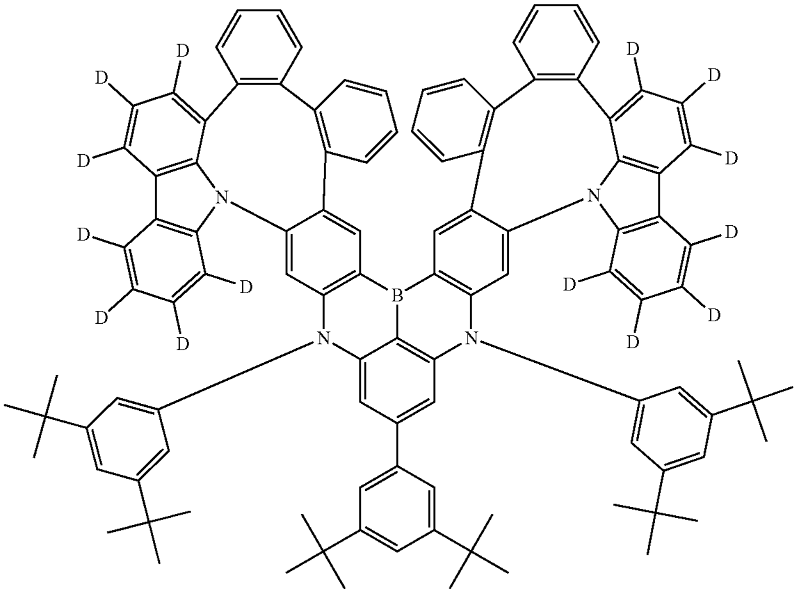

-continued
103
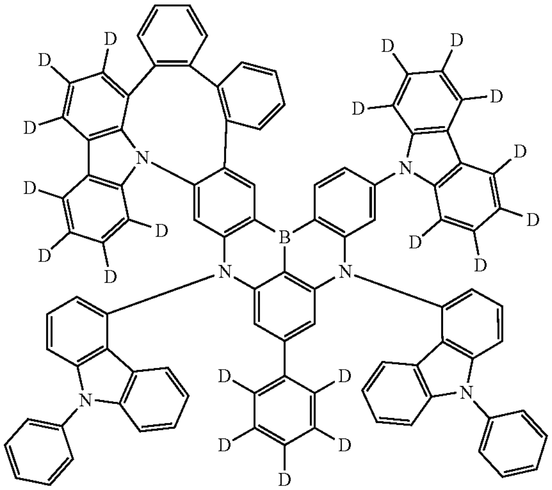
104
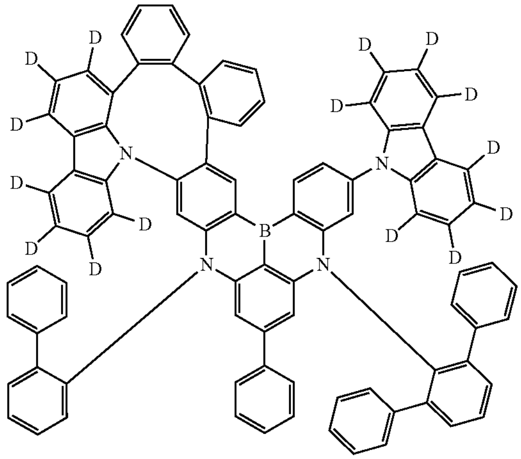
105
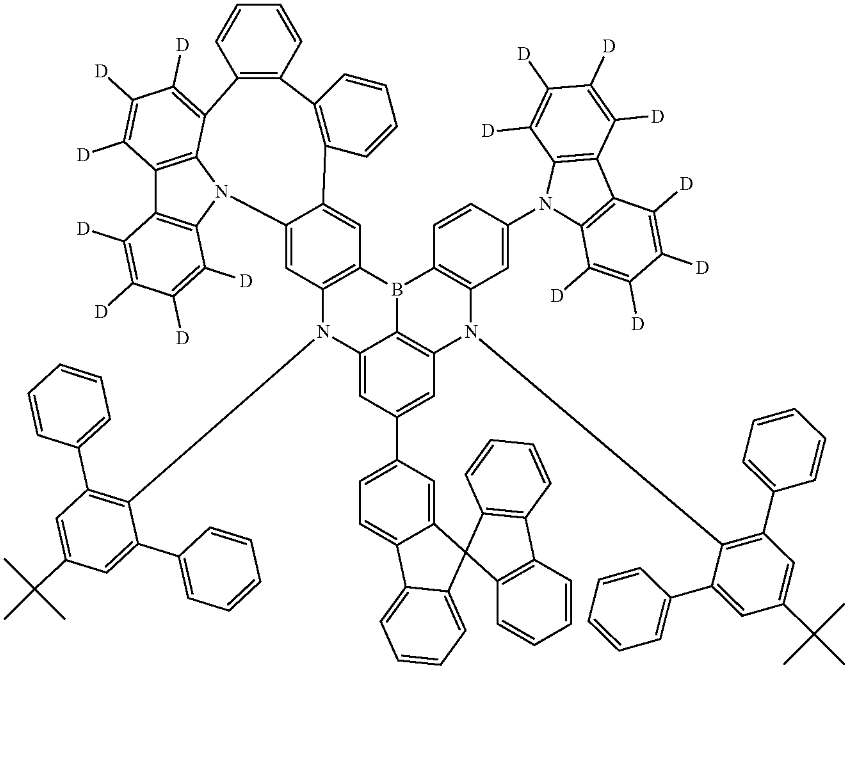

-continued
106
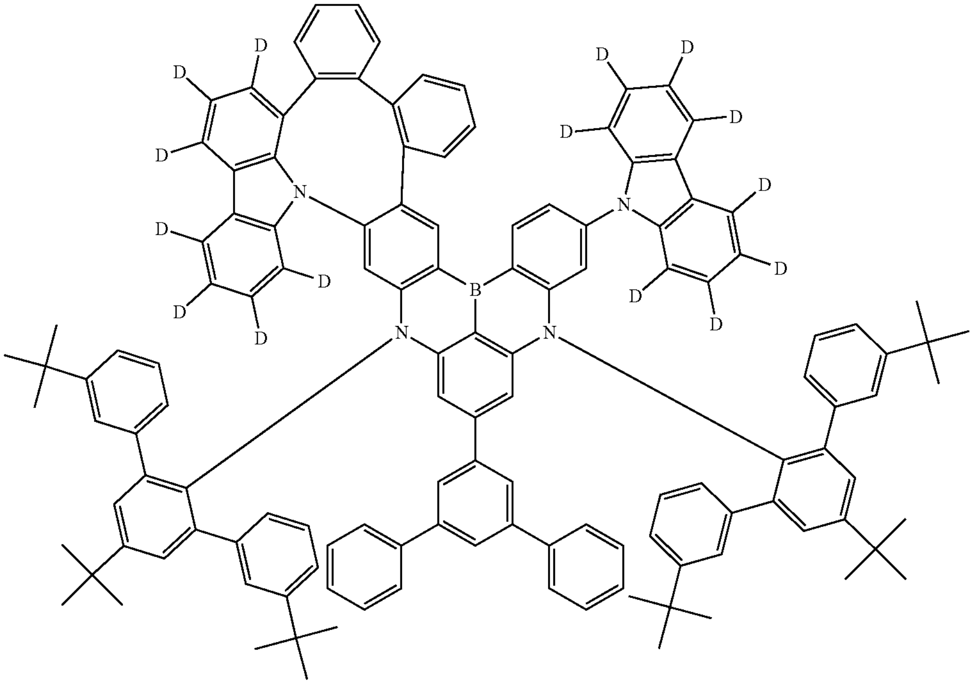
107
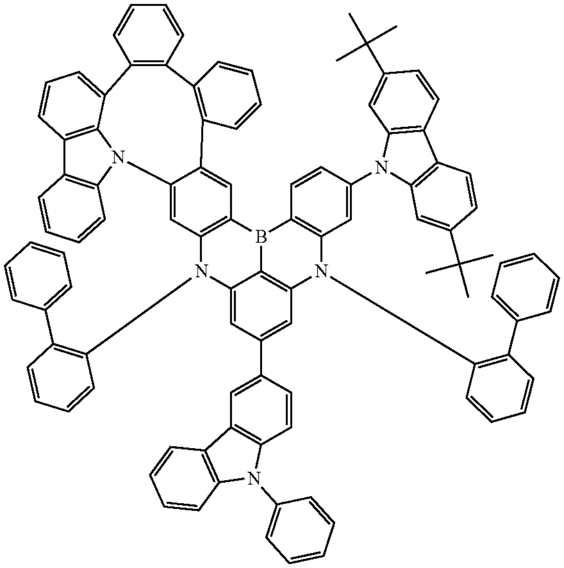
108
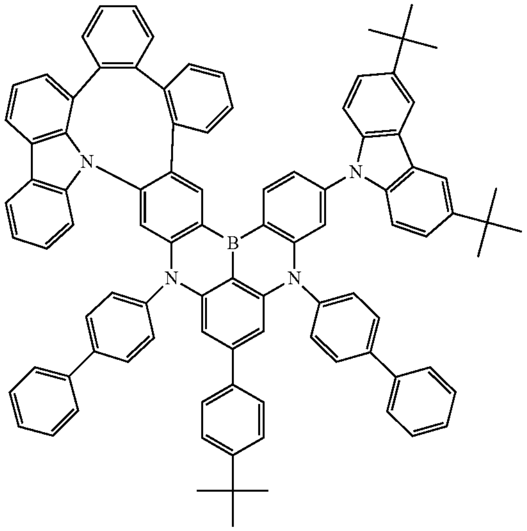

-continued
109
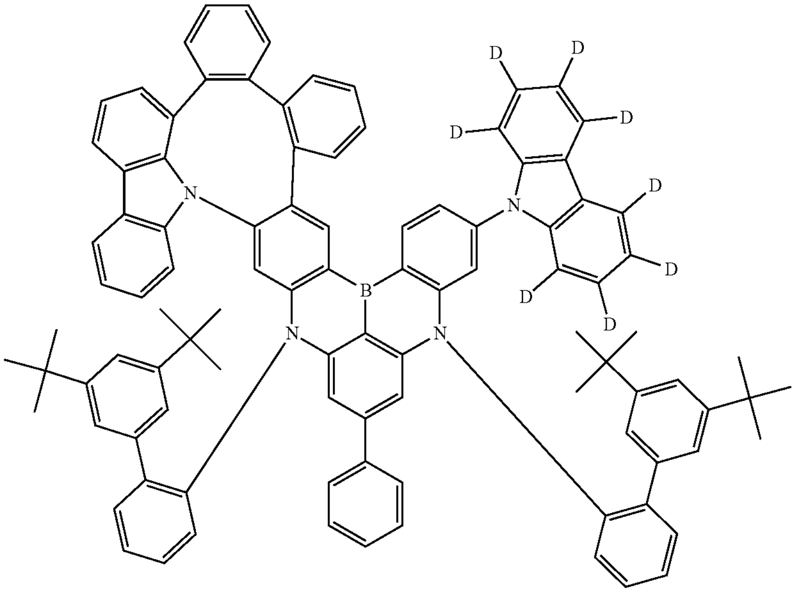
110
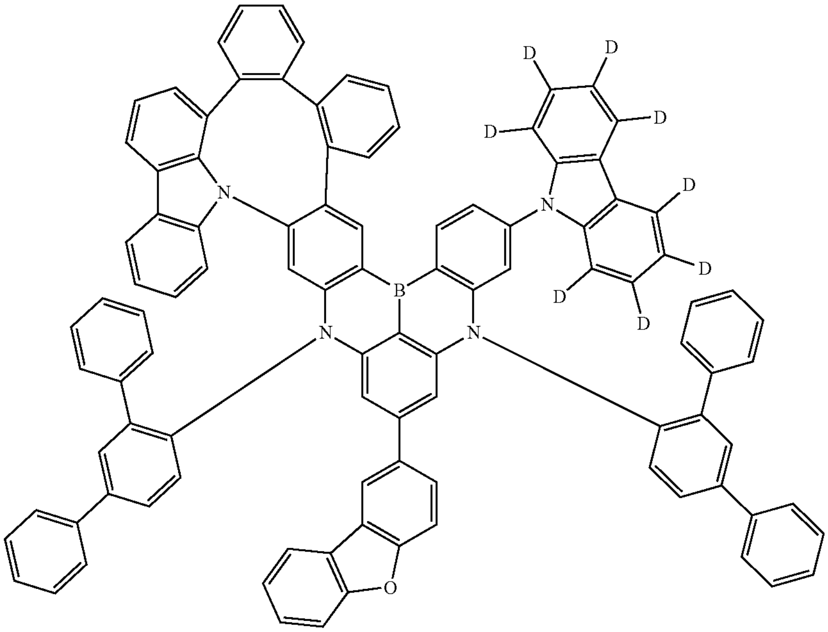

-continued
111
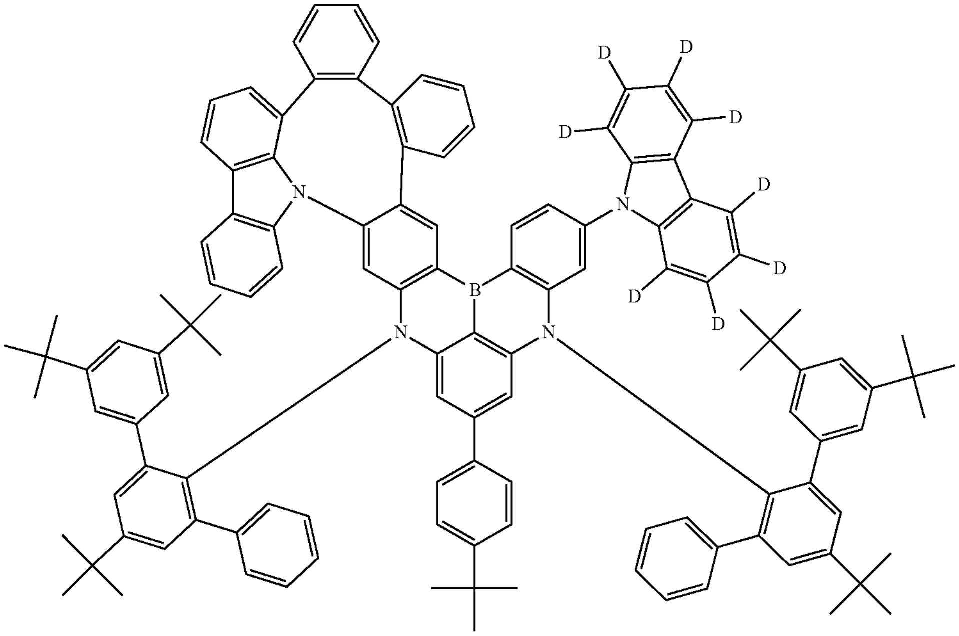
112
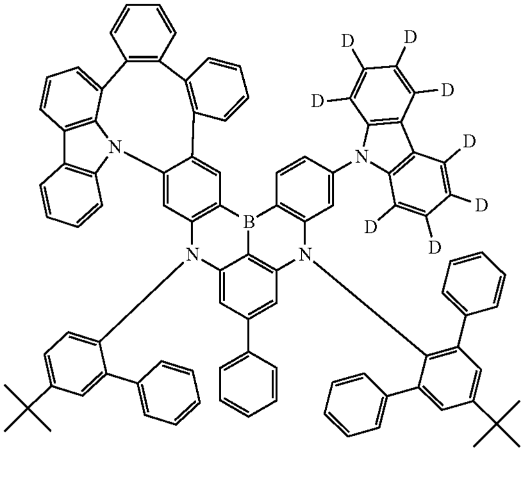
113
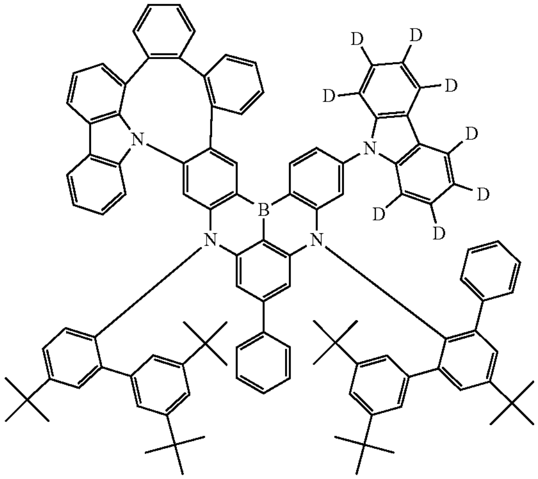
114
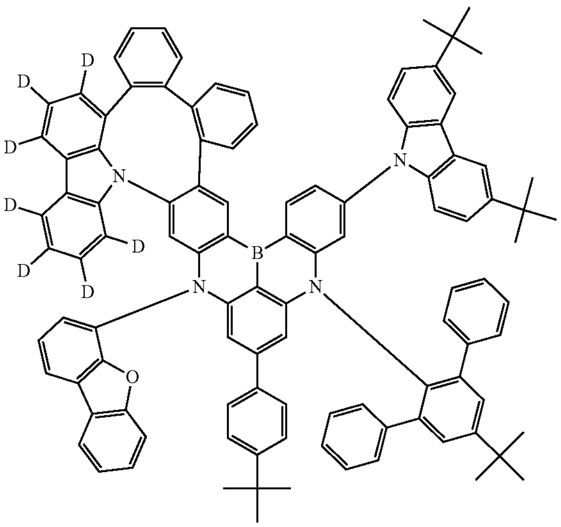
115
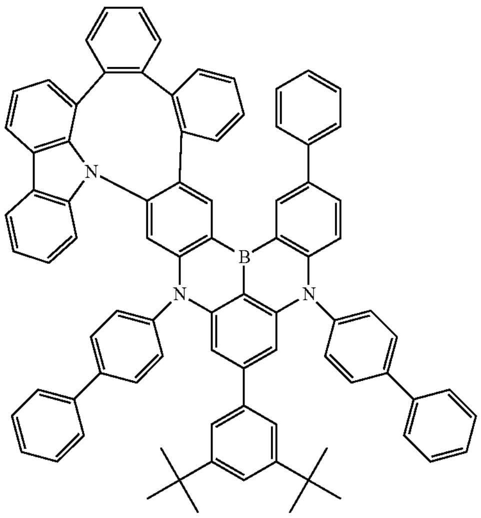

-continued
116
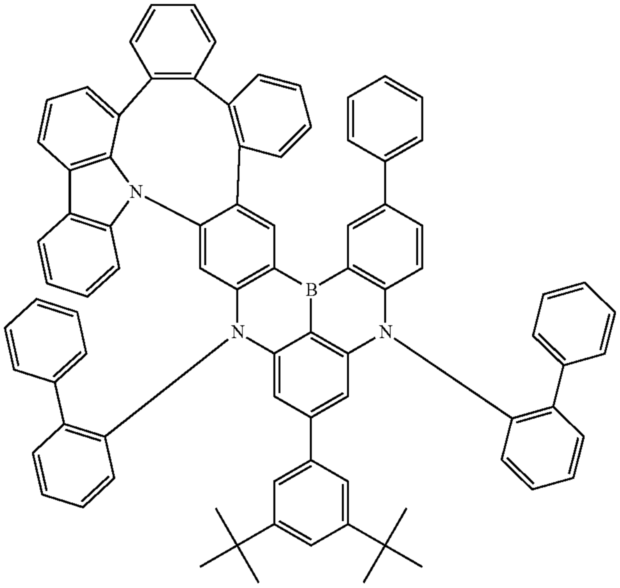
117
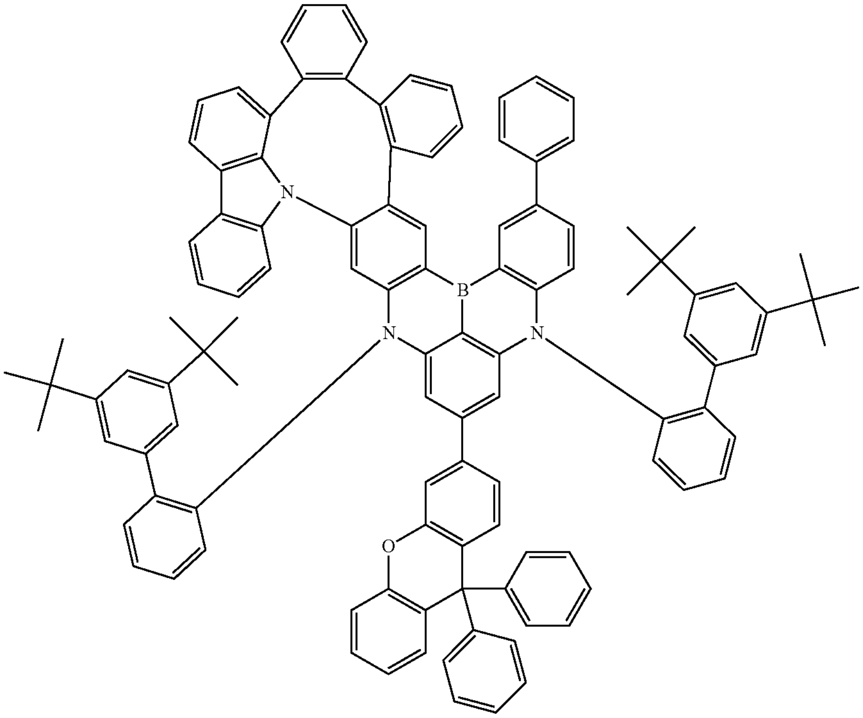

-continued
118
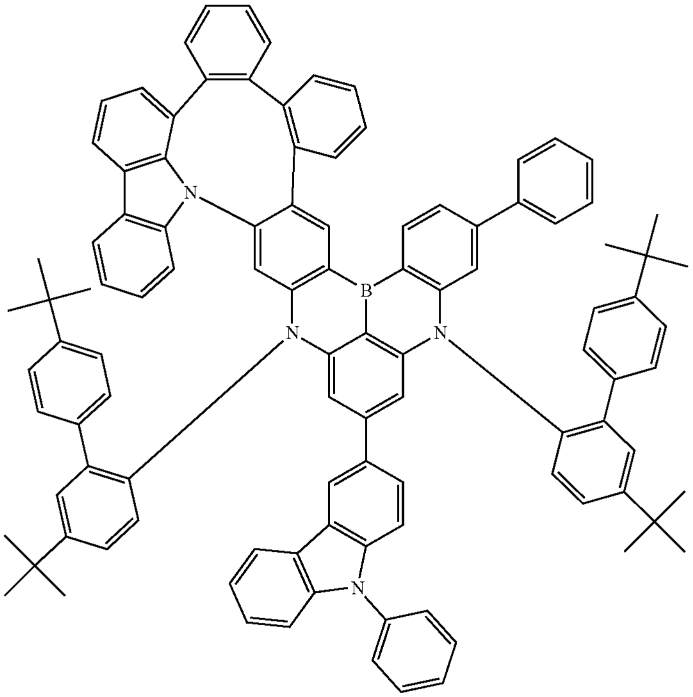
119
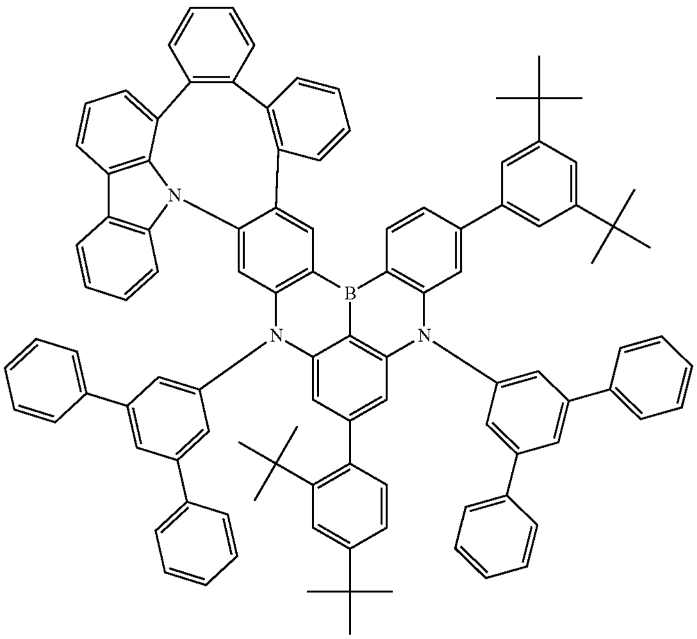

-continued
120
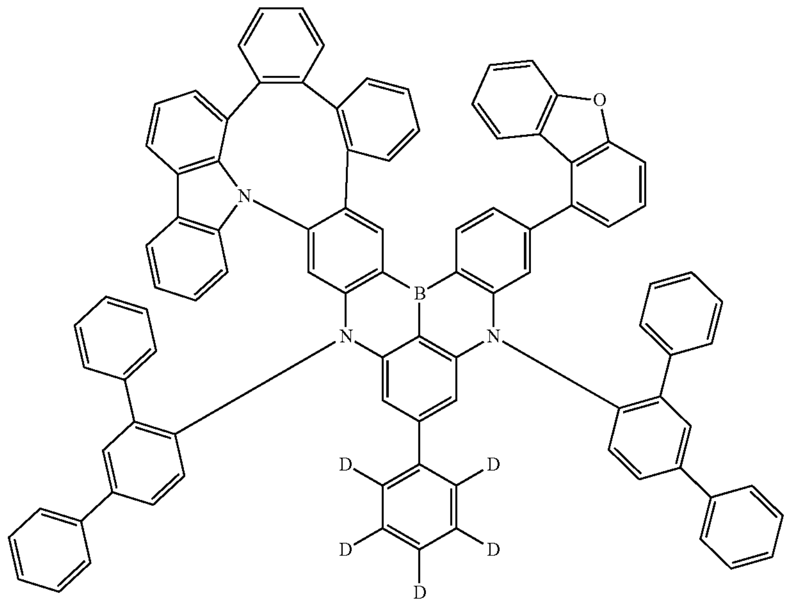
121
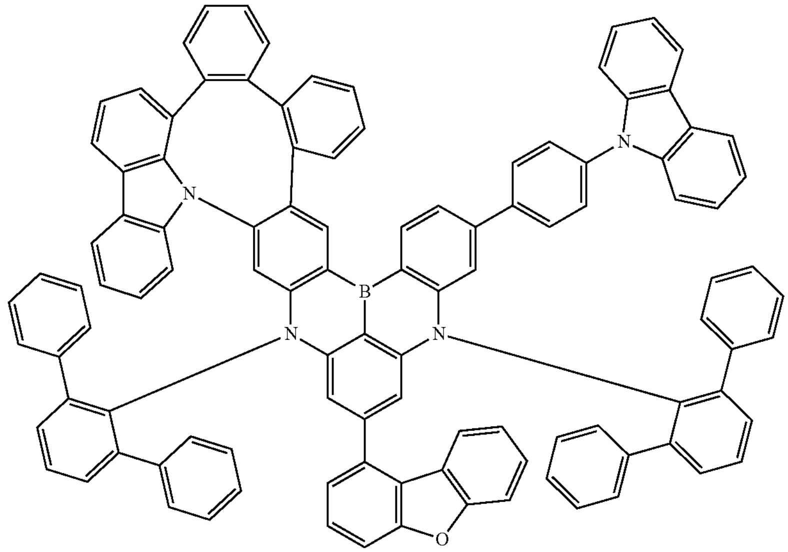

-continued
122
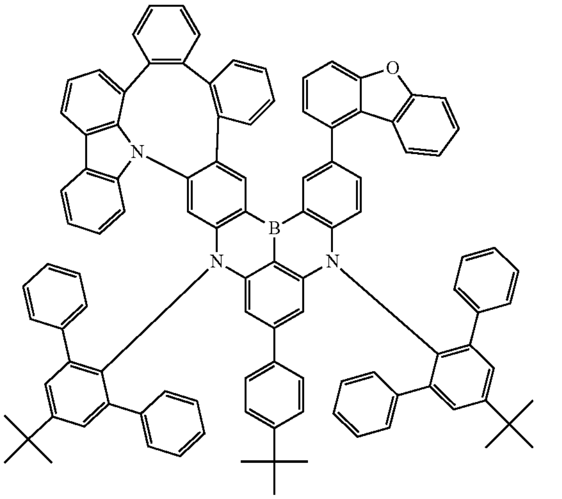
123
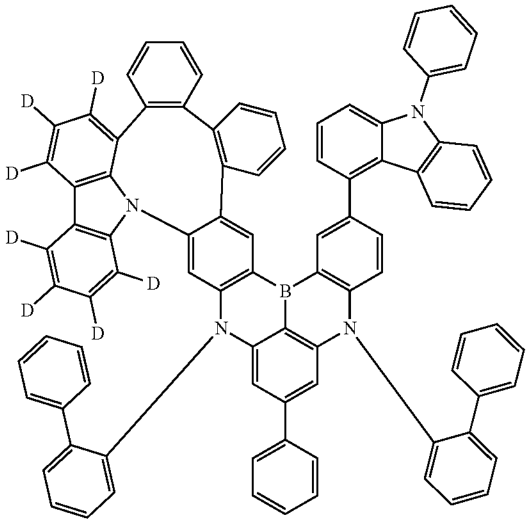
124
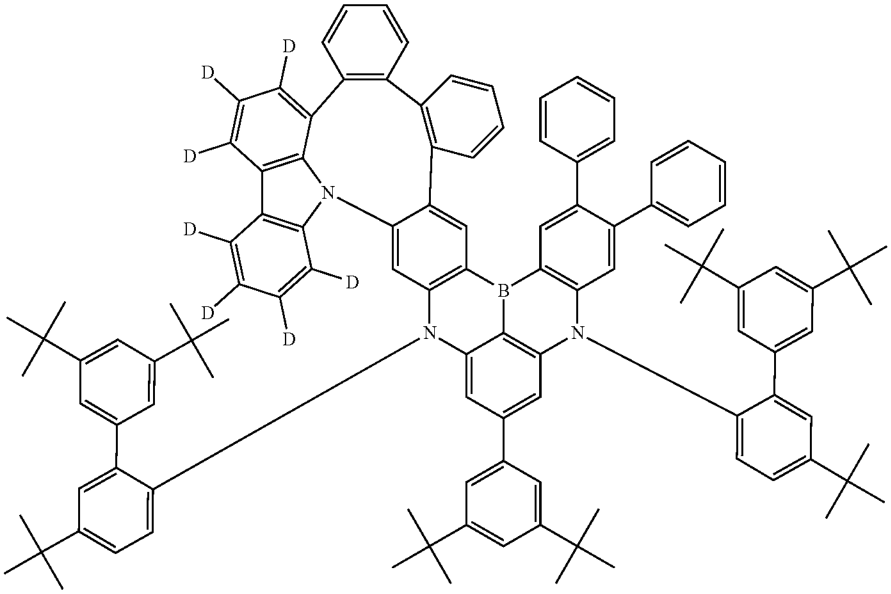

-continued
125
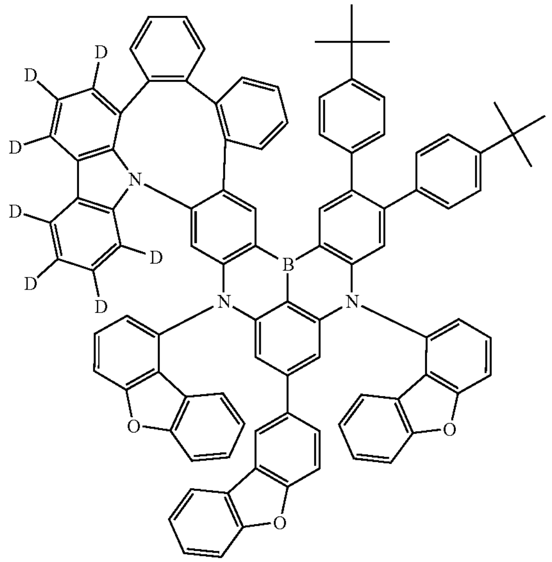
126
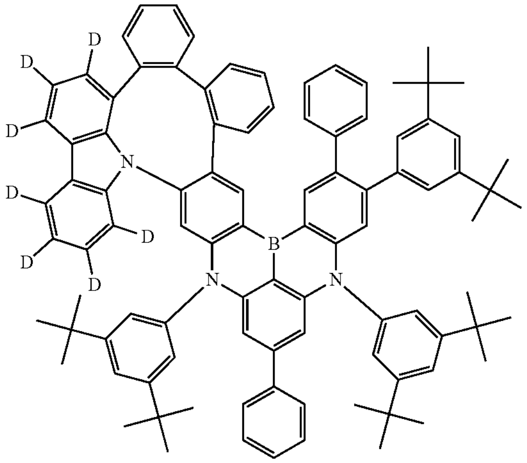
127
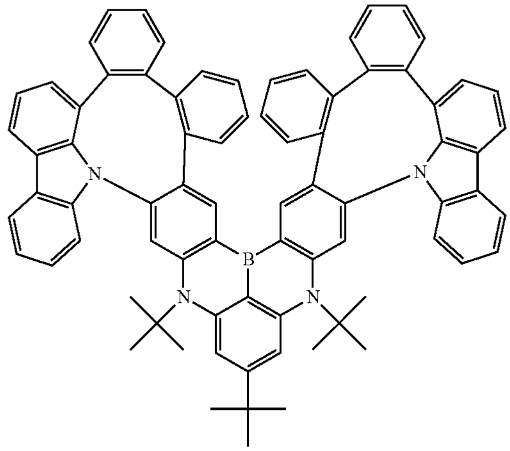
128
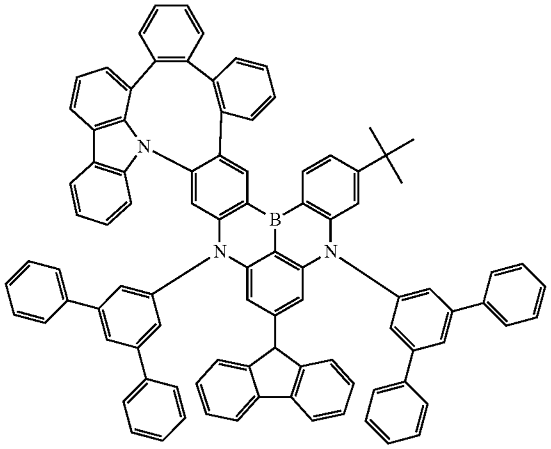
129
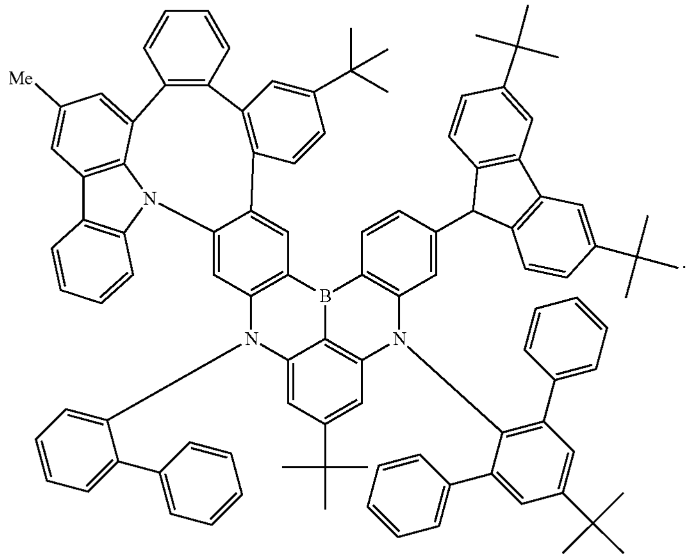
.

11. The light emitting device of claim 1, wherein the emission layer further comprises at least one selected from a second compound represented by Formula HT-1 below and a third compound represented by Formula ET-1 below:

Formula HT-1

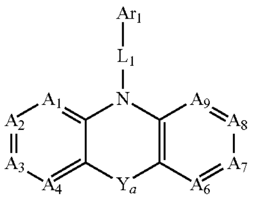

wherein, in Formula HT-1 above, $A_1$ to $A_9$ are each independently N or $CR_{41}$, $L_1$ is a direct linkage, a substituted or unsubstituted arylene group having 6 to 30 carbon atoms for forming a ring, or a substituted or unsubstituted heteroarylene group having 2 to 30 carbon atoms for forming a ring, $Y_a$ is a direct linkage, $CR_{42}R_{43}$, or $SiR_{44}R_{45}$, $Ar_1$ is a substituted or unsubstituted aryl group having 6 to 30 ring-forming carbon atoms, or a substituted or unsubstituted heteroaryl group having 2 to 30 ring-forming carbon atoms, and $R_{41}$ to $R_{45}$ are each independently a hydrogen atom, a deuterium atom, a halogen atom, a cyano group, a substituted or unsubstituted silyl group, a substituted or unsubstituted thio group, a substituted or unsubstituted oxy group, a substituted or unsubstituted amine group, a substituted or unsubstituted boron group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, and Formula ET-1

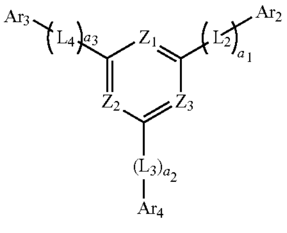

wherein, in Formula ET-1 above, at least one selected from among $Z_1$ to $Z_3$ is N, and the rest are $CR_{46}$, $R_{46}$ is a hydrogen atom, a deuterium atom, a substituted or unsubstituted alkyl group having 1 to 20 carbon atoms, a substituted or unsubstituted aryl group having 6 to 60 ring-forming carbon atoms, or a substituted or unsubstituted heteroaryl group of 2 to 60 ring-forming carbon atoms, $a_1$ to $a_3$ are each independently an integer of 0 to 10, $L_2$ to $L_4$ are each independently a direct linkage, a substituted or unsubstituted arylene group having 6 to 30 ring-forming carbon atoms, or a substituted or unsubstituted heteroarylene group having 2 to 30 ring-forming carbon atoms, when each of $a_1$ to $a_3$ is an integer of 2 or greater, $L_2$ to $L_4$ re each independently a substituted or unsubstituted arylene group having 6 to 30 ring-forming carbon atoms, or a substituted or unsubstituted heteroarylene group having 2 to 30 ring-forming carbon atoms, and $Ar_2$ to $Ar_4$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

12. The light emitting device of claim 1, wherein the emission layer further comprises a fourth compound represented by Formula D-1 below:

Formula D-1

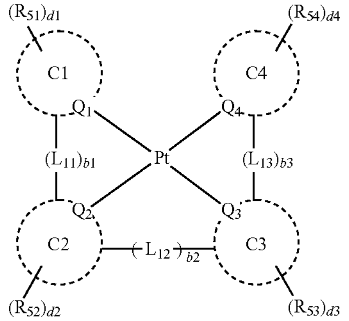

wherein, in Formula D-1 above, $Q_1$ to $Q_4$ are each independently C or N,

C1 to C4 are each independently a substituted or unsubstituted hydrocarbon ring having 5 to 30 ring-forming carbon atoms, or a substituted or unsubstituted heterocycle having 2 to 30 ring-forming carbon atoms, $L_{11}$ to $L_{13}$ are each independently a direct linkage,

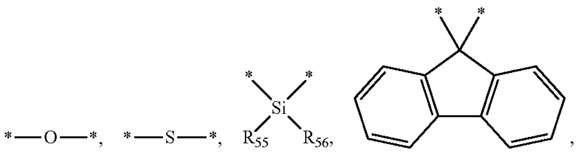

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, b1 to b3 are each independently 0 or 1, $R_{51}$ to $R_{56}$ are each independently a hydrogen atom, a deuterium atom, a halogen atom, a cyano group, a substituted or unsubstituted silyl group, a substituted or unsubstituted thio group, a substituted or unsubstituted oxy group, a substituted or unsubstituted amine group, a substituted or unsubstituted boron group, a substituted or unsubstituted alkyl group having 1 to 20 carbon atoms, a substituted or unsubstituted alkenyl group having 2 to 20 carbon atoms, a substituted or unsubstituted aryl group having 6 to 60 ring-forming carbon atoms, or a substituted or unsubstituted heteroaryl group having 2 to 60 ring-forming carbon atoms, or are bonded to an adjacent group to form a ring, and d1 to d4 are each independently an integer of 0 to 4.

13. A fused polycyclic compound represented by Formula 1 below:

Formula 1

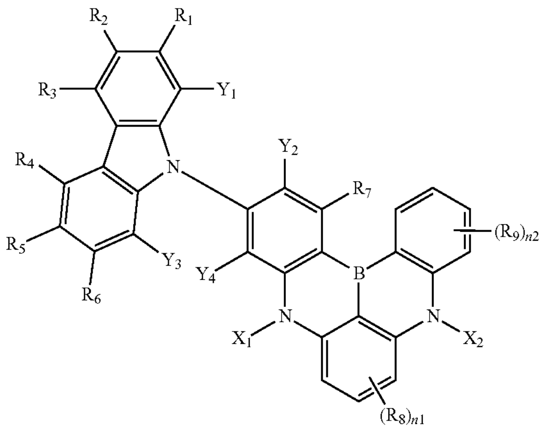

wherein, in Formula 1 above, $R_1$ to $R_9$ and $Y_1$ to $Y_4$ are each independently a hydrogen atom, a deuterium atom, a halogen atom, a cyano group, a substituted or unsubstituted silyl group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, $X_1$ and $X_2$ are each independently a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, n1 is an integer of 0 to 3, n2 is an integer of 0 to 4, and any one pair of $Y_1$ and $Y_2$ or $Y_3$ and $Y_4$ is a position to which a substituent represented by Formula 2 below is linked:

Formula 2

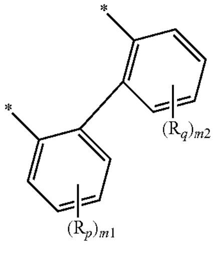

in Formula 2 above,

-* is a position linked to any one pair of $Y_1$ and $Y_2$, or $Y_3$ and $Y_4$ linked in Formula 1, $R_p$ and $R_q$ are each independently a hydrogen atom, a deuterium atom, a halogen atom, a cyano group, a substituted or unsubstituted silyl group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and m1 and m2 are each independently an integer of 0 to 4.

14. The fused polycyclic compound of claim 13, wherein the fused polycyclic compound represented by Formula 1 above is represented by Formula 1-3 or Formula 1-4 below:

Formula 1-3

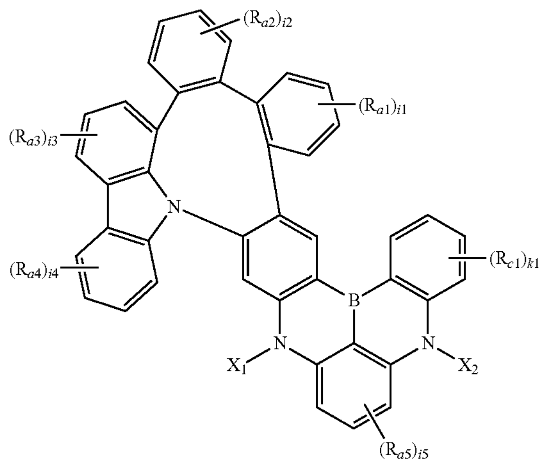

Formula 1-4

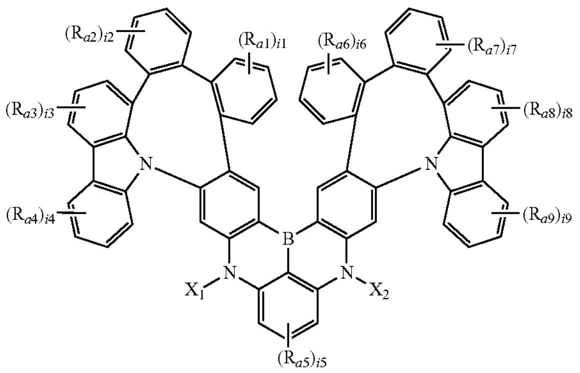

wherein, in Formula 1-3 and Formula 1-4 above, $R_{a1}$ to $R_{a9}$ are each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, $R_{c1}$ is a hydrogen atom, a deuterium atom, a halogen atom, a cyano group, a substituted or unsubstituted silyl group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or is bonded to an adjacent group to form a ring, i1, i2, i4, i6, i7, i9 and k1 are each independently an integer of 0 to 4, i3, i5 and i8 are each independently an integer of 0 to 3, and $X_1$ and $X_2$ are the same as defined with respect to Formula 1.

15. The fused polycyclic compound of claim 14, wherein $R_{a1}$ to $R_{a4}$ and $R_{a6}$ to $R_{a9}$ are each independently a hydrogen atom or a deuterium atom.

16. The fused polycyclic compound of claim 13, herein $R_p$ and $R_q$ are each independently a hydrogen atom or a deuterium atom.

17. The fused polycyclic compound of claim 13, wherein the fused polycyclic compound represented by Formula 1 above is represented by Formula 1-1 below:

Formula 1-1

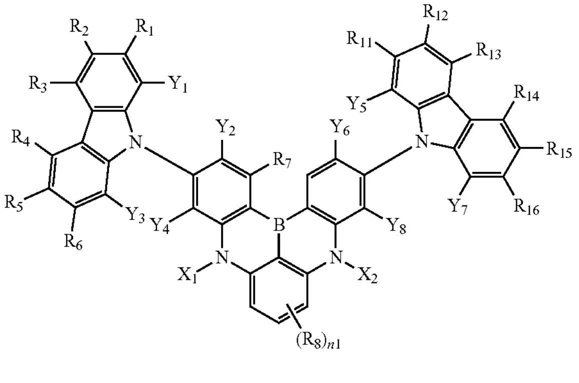

wherein, in Formula 1-1 above, $R_{11}$ to $R_{16}$ and $Y_5$ to $Y_8$ are each independently a hydrogen atom, a deuterium atom, a halogen atom, a cyano group, a substituted or unsubstituted silyl group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, any one pair of $Y_5$ and $Y_6$ or $Y_7$ and $Y_8$ is fused with a substituent represented by Formula 2 above, and $R_1$ to $R_8$, $Y_1$ to $Y_4$, $X_1$, $X_2$, and n1 are the same as defined with respect to Formula 1.

18. The fused polycyclic compound of claim 13, wherein the fused polycyclic compound represented by Formula 1 above is represented by Formula 1-2 below:

Formula 1-2

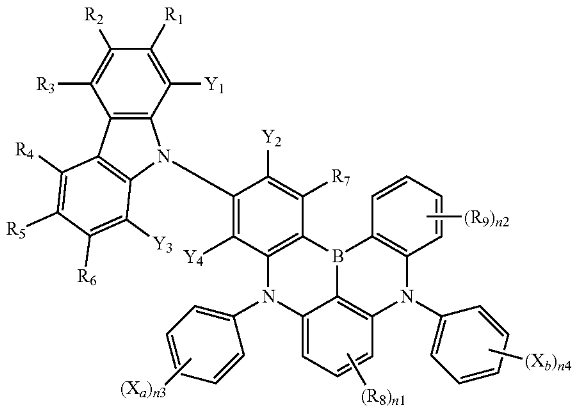

wherein, in Formula 1-2 above, $X_a$ and $X_b$ are each independently a hydrogen atom, a deuterium atom, a cyano group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, n3 and n4 are each independently an integer of 0 to 5, and $R_1$ to $R_9$ and $Y_1$ to $Y_4$, and n1, and n2 are the same as defined with respect to Formula 1.

19. The fused polycyclic compound of claim 13, wherein the fused polycyclic compound represented by Formula 1 above is represented by Formula 1-5 or Formula 1-6 below:

Formula 1-5

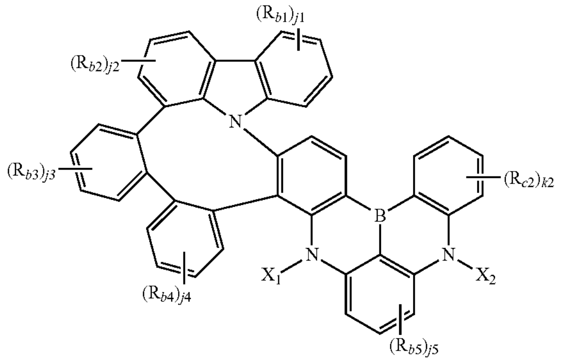

-continued

Formula 1-6

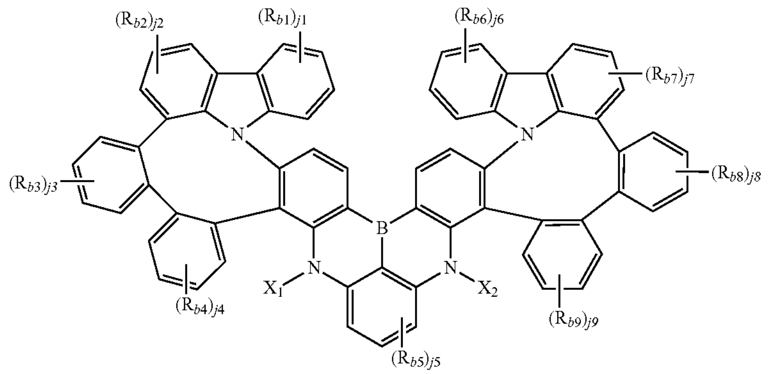

wherein, in Formula 1-5 and Formula 1-6 above, $R_{b1}$ to $R_{b9}$ are each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, $R_{c2}$ is a hydrogen atom, a deuterium atom, a halogen atom, a cyano group, a substituted or unsubstituted silyl group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or is bonded to an adjacent group to form ring, j1, j2, j4, j6, j7, j9 and k2 are each independently an integer of 0 to 4, j3, j5 and j8 are each independently an integer of 0 to 3, and $X_1$ and $X_2$ are the same as defined with respect to Formula 1.

20. The fused polycyclic compound of claim 13, wherein the fused polycyclic compound represented by Formula 1 above comprises at least one selected from among compounds represented by Compound Group 1 below:

Compound Group 1

1

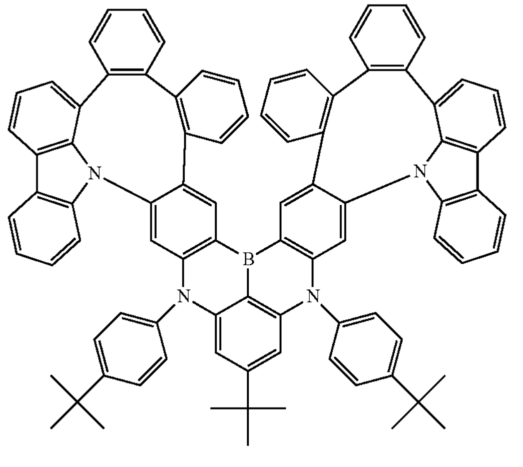

2

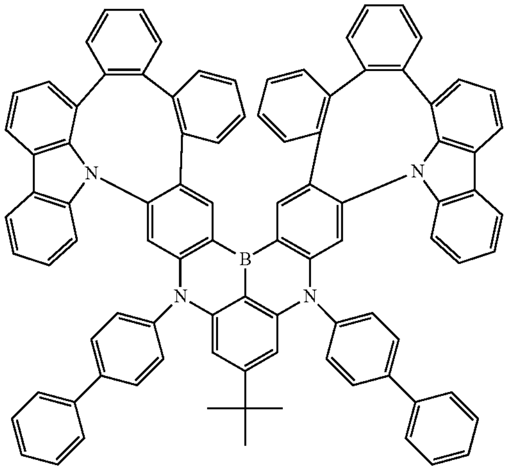

-continued
3
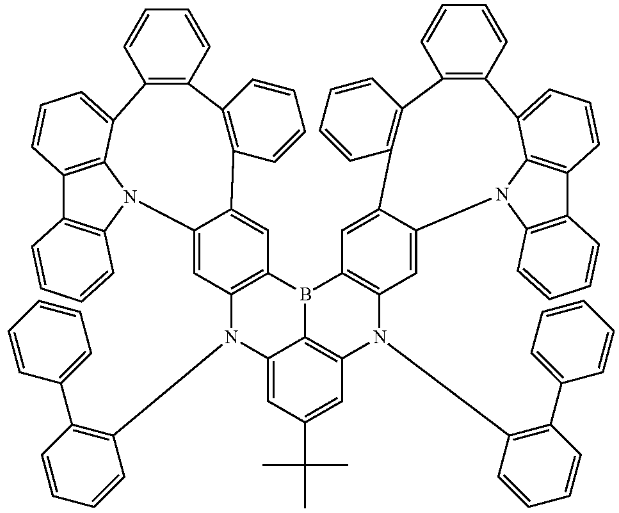
4
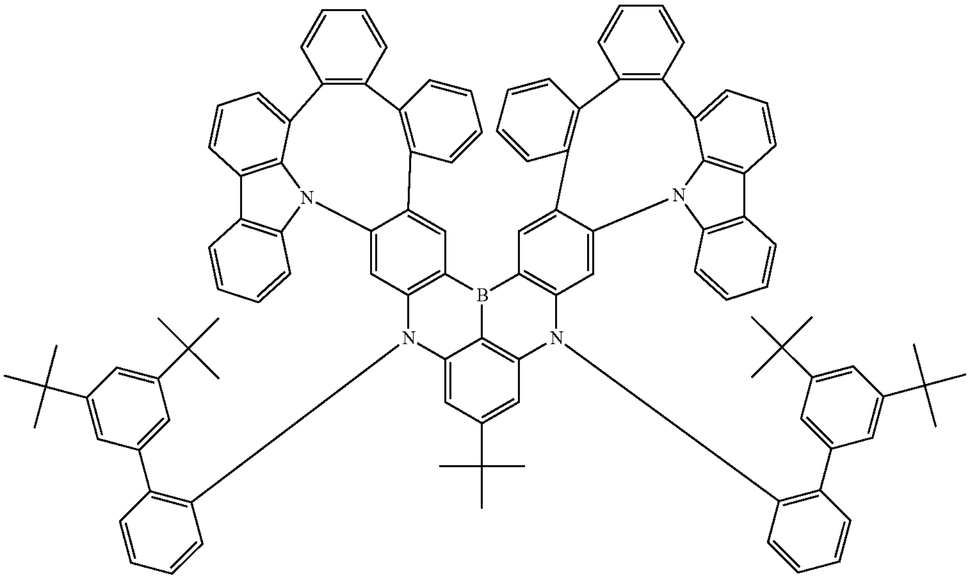
5
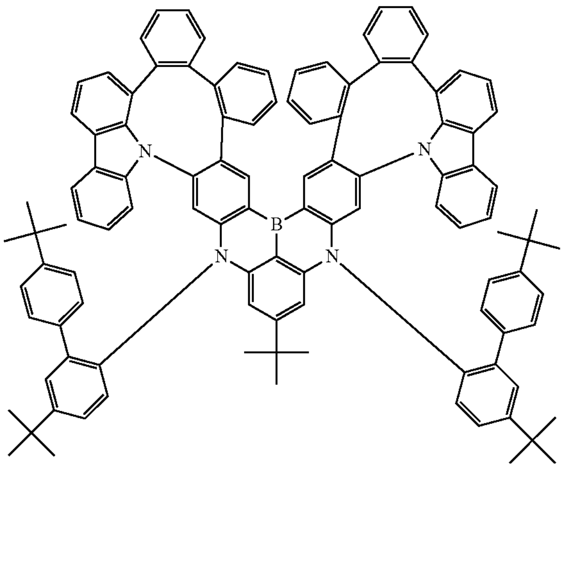
6
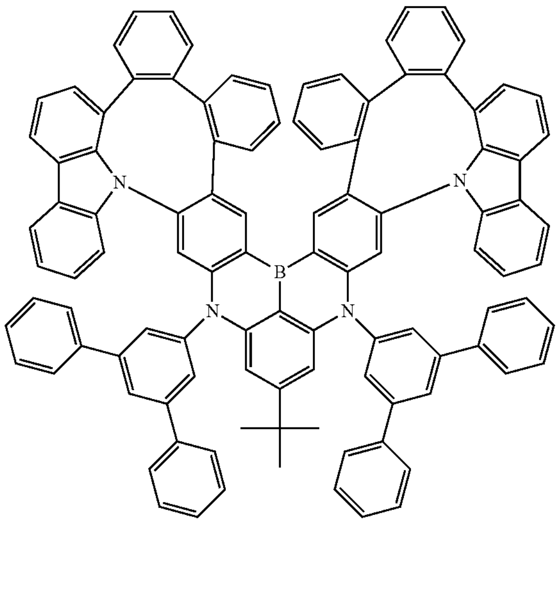

-continued
7
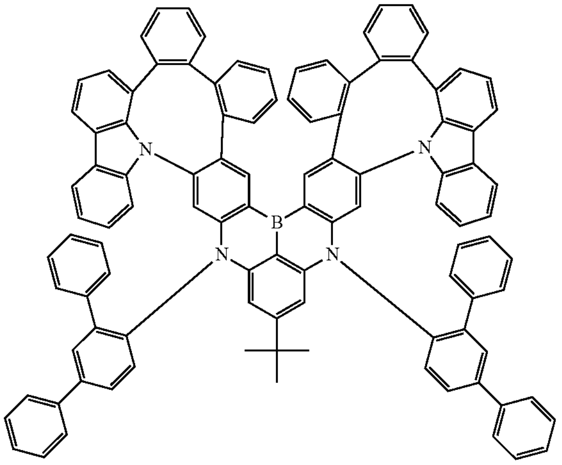
8
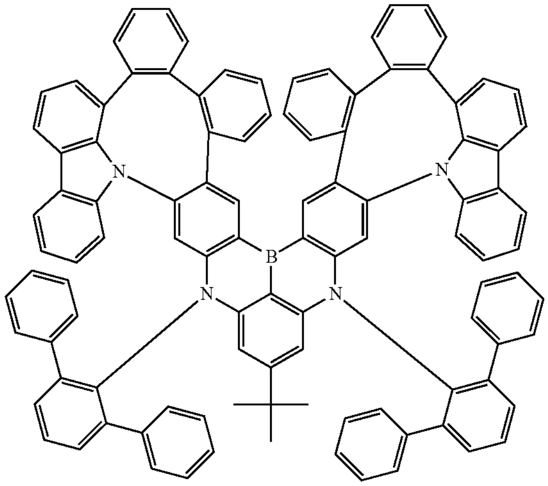
9
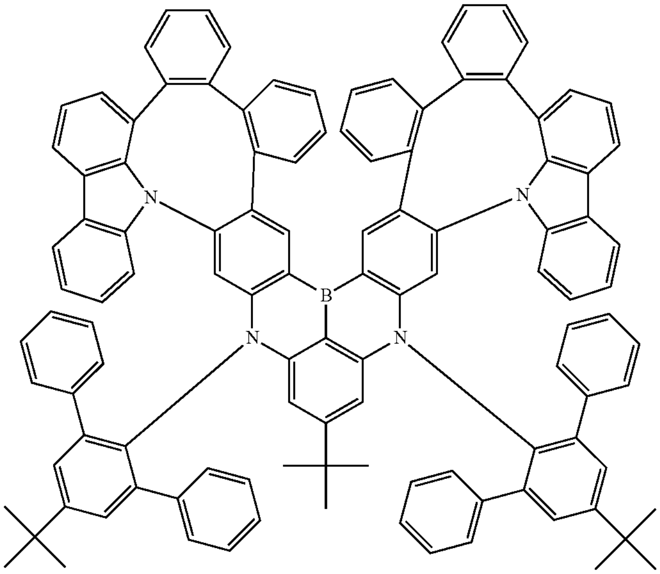

-continued
10
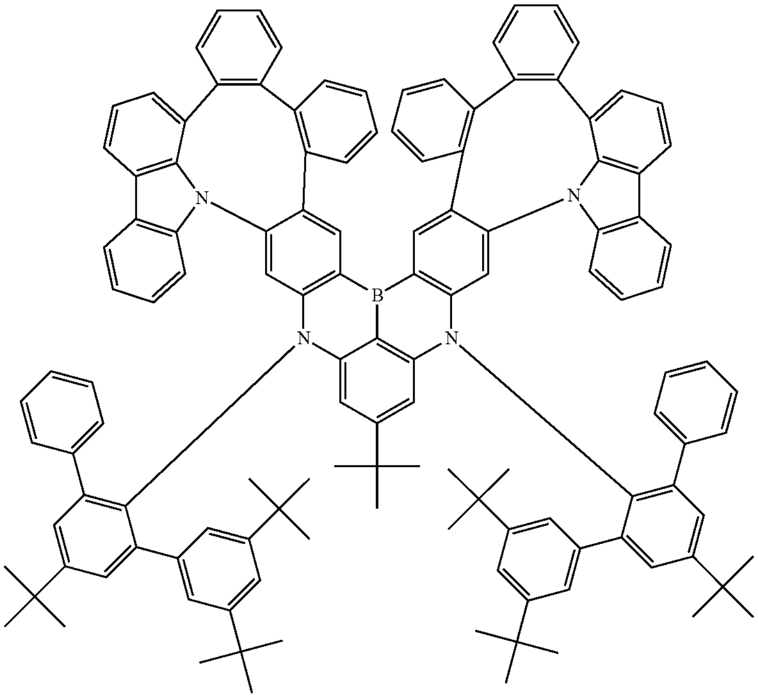
11
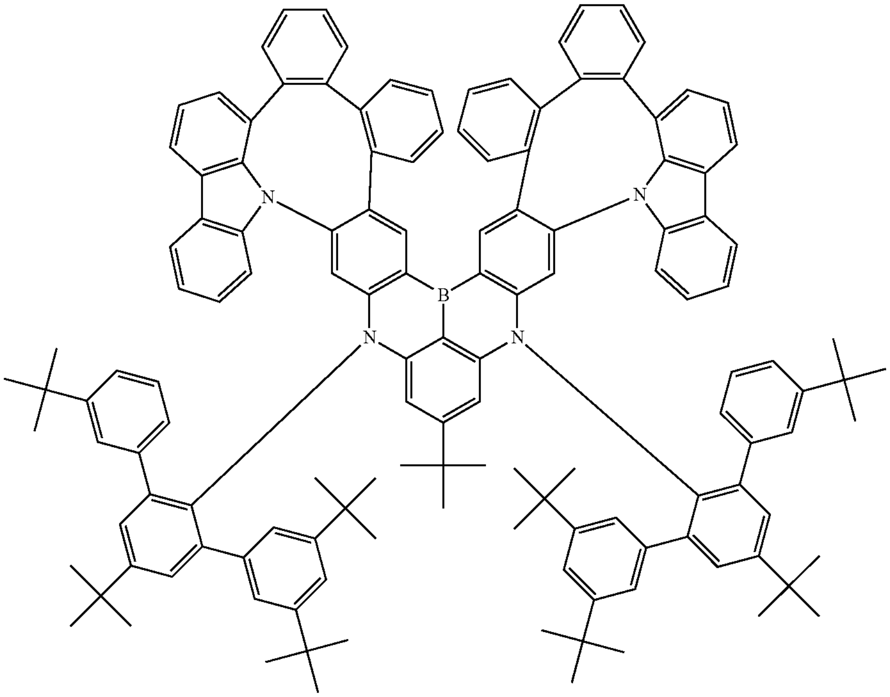

-continued
12
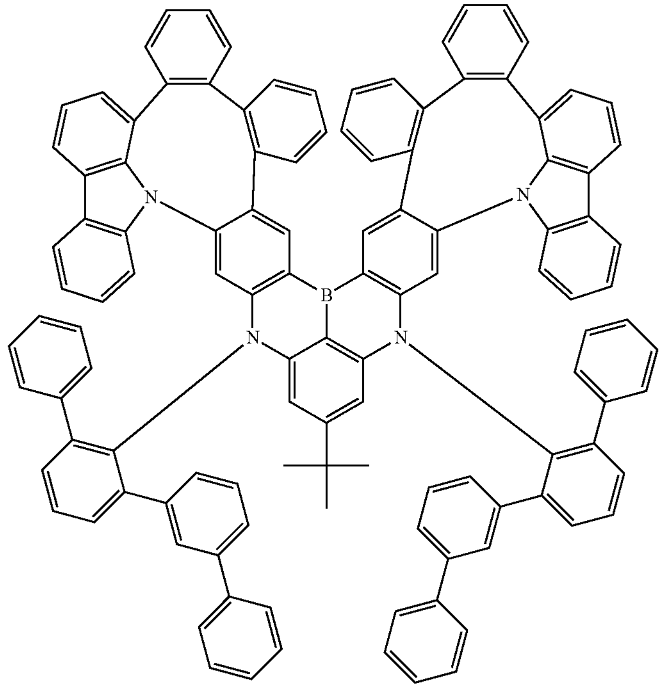
13
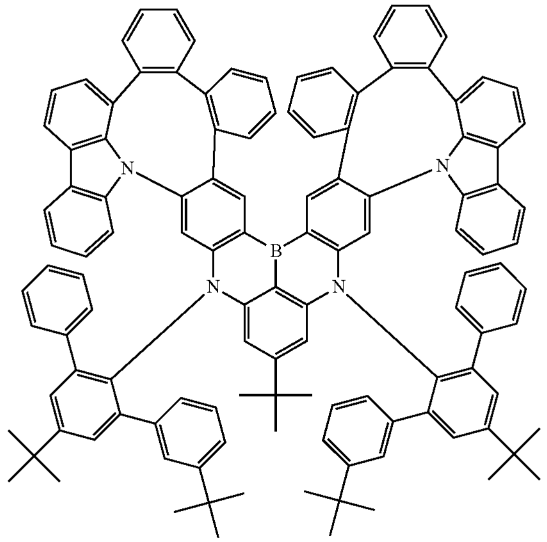
14
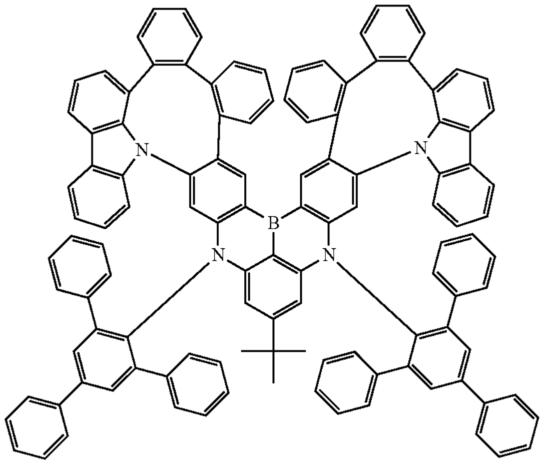

-continued
15
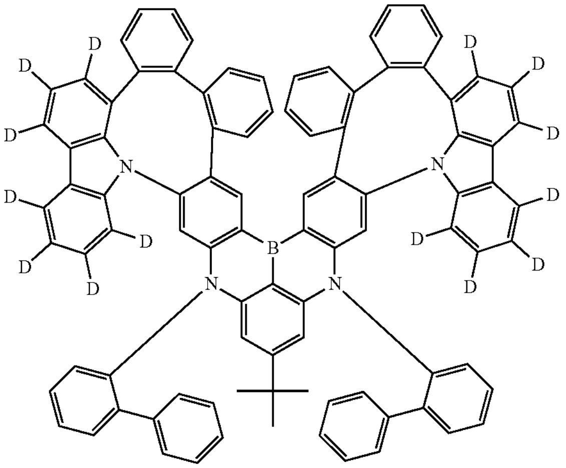
16
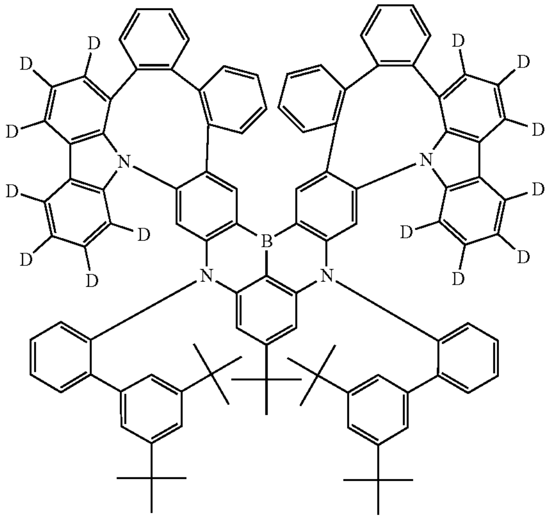
17
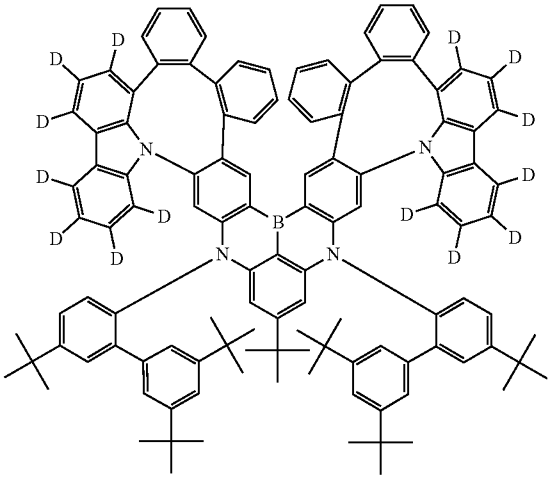
18
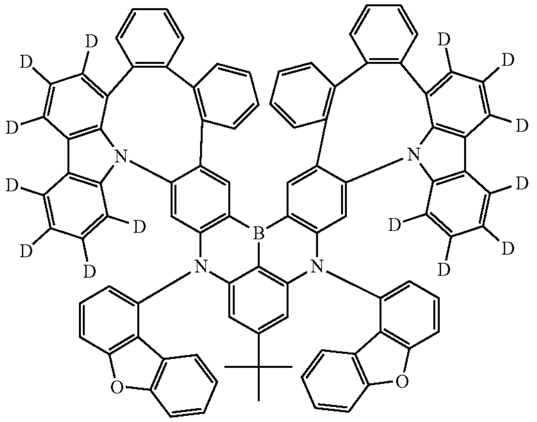
19
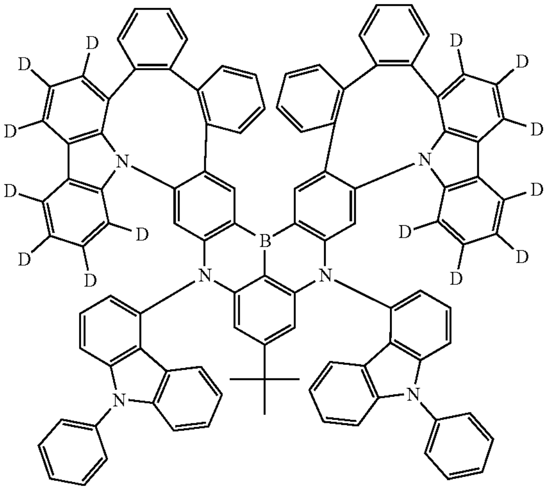
20
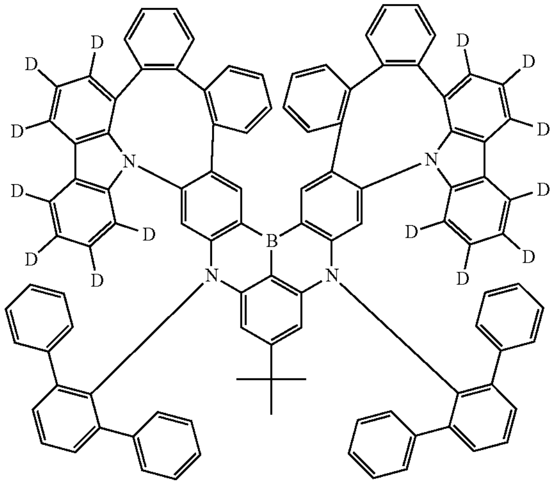

-continued
21
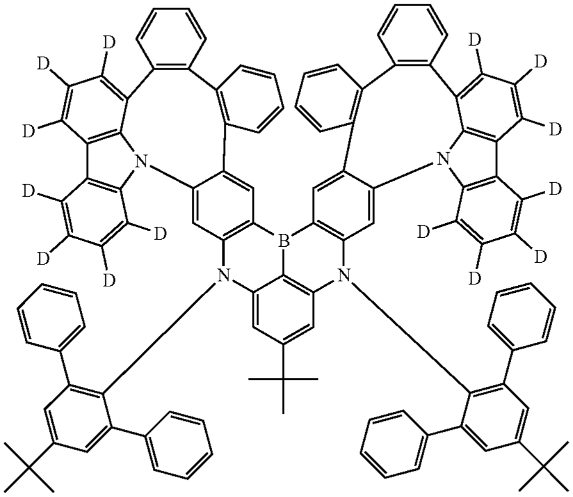
22
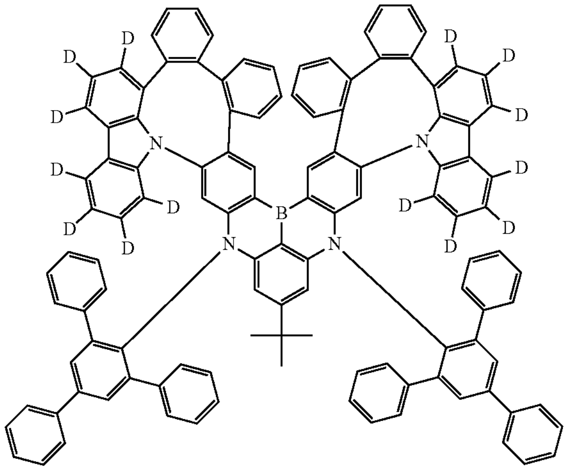
23
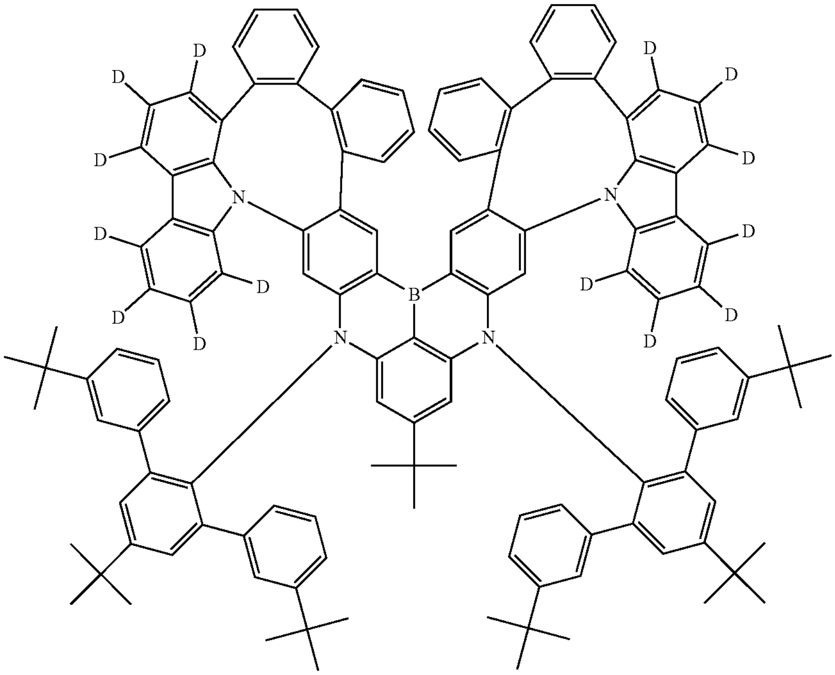

-continued
24
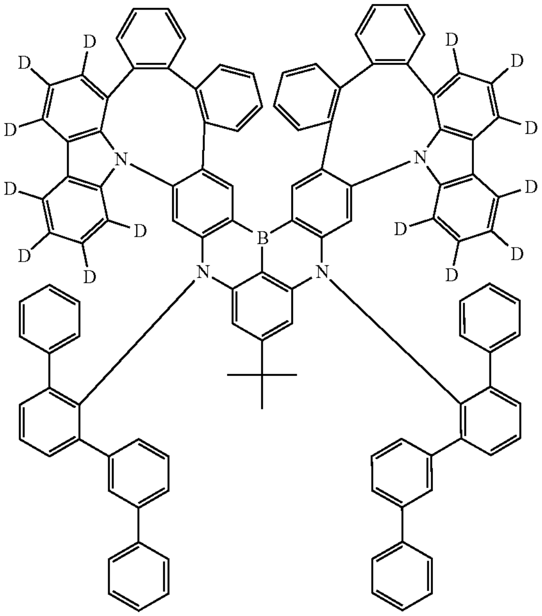
25
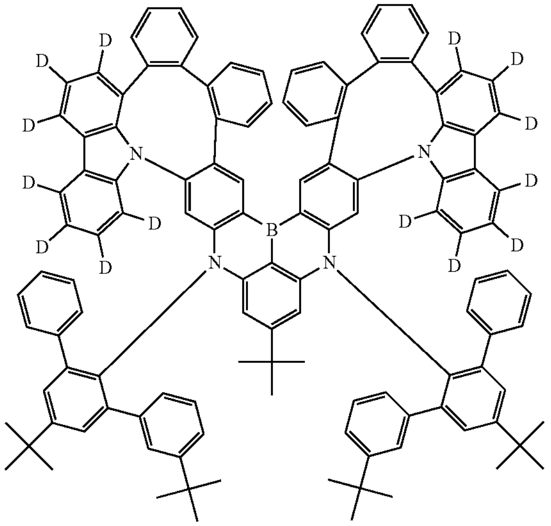
26
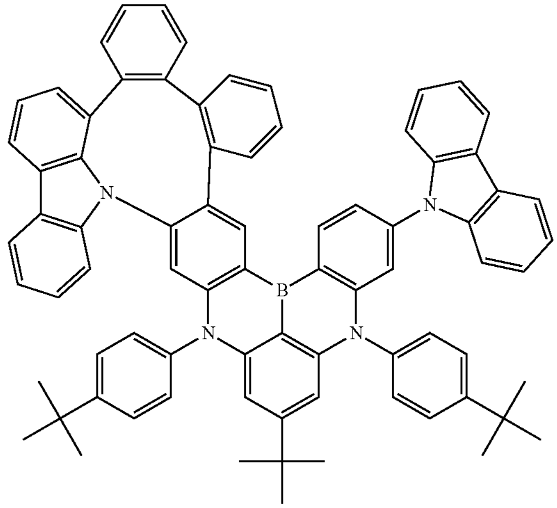
27
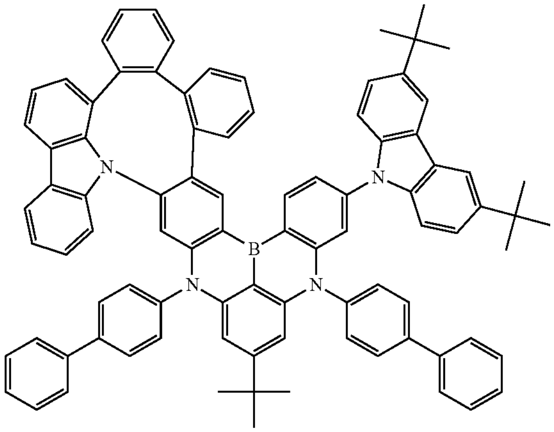
28
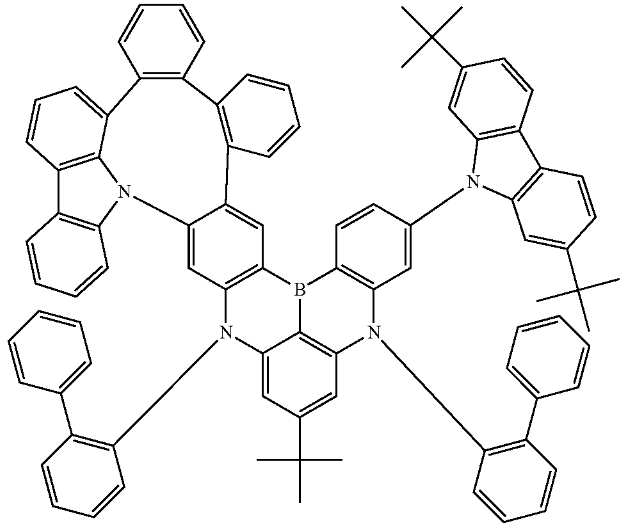

-continued
29
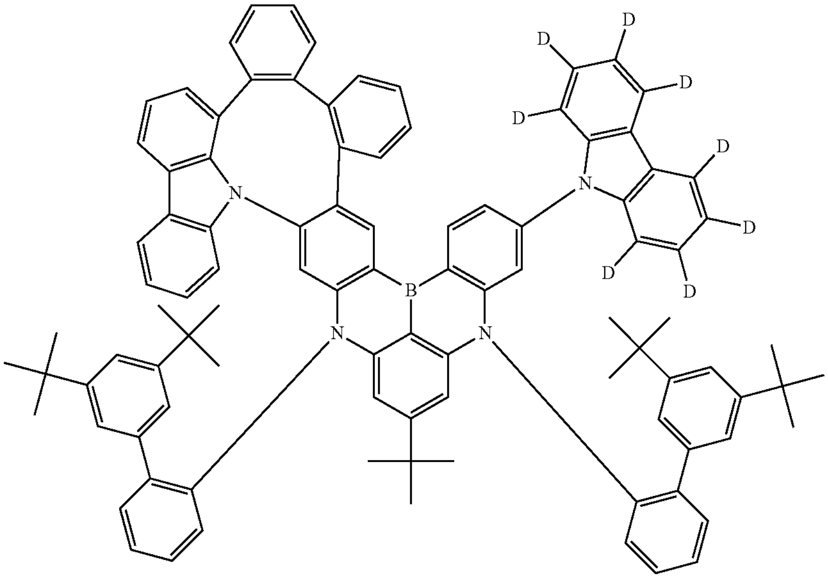
30
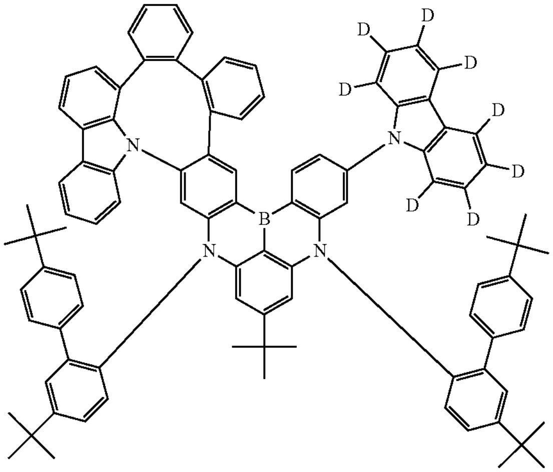
31
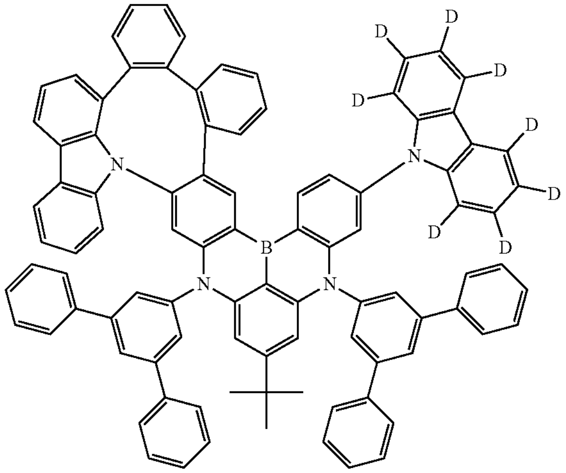
32
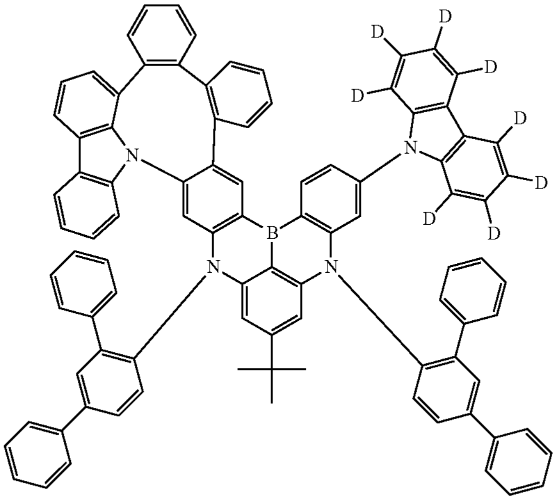
33
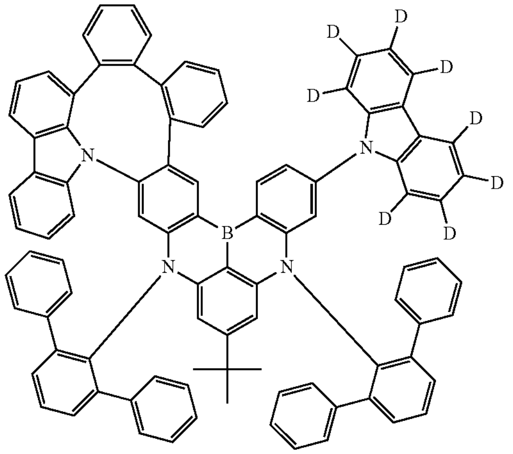

-continued
34
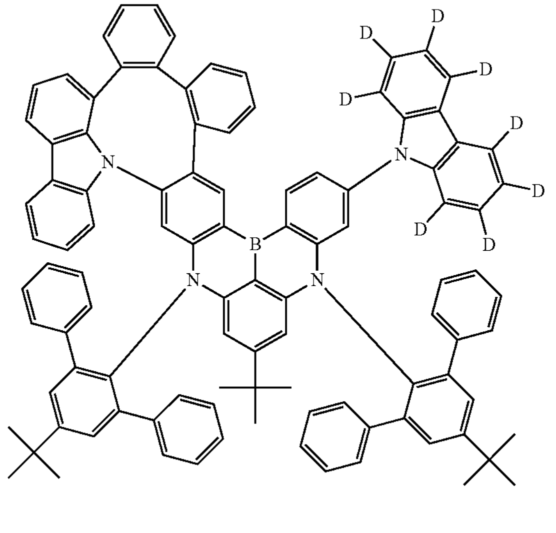
35
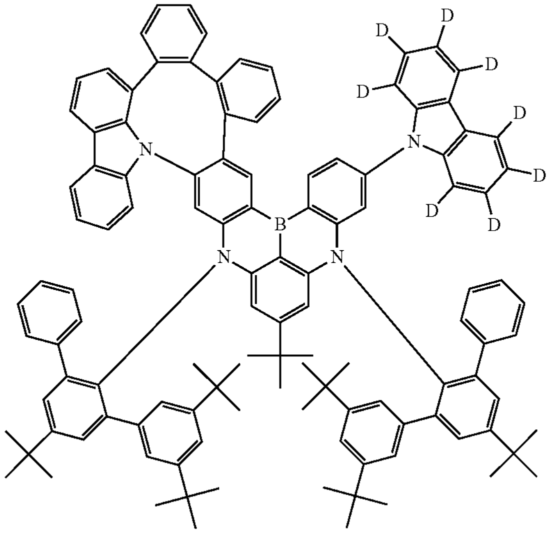
36
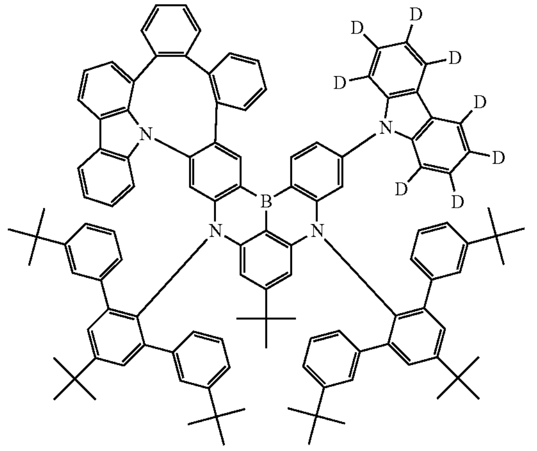
37
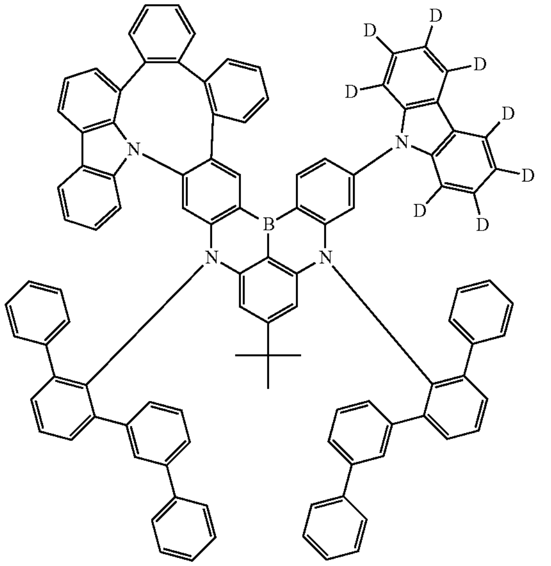
38
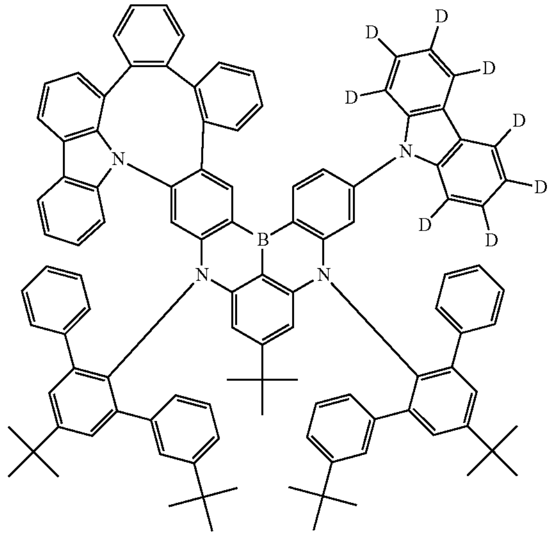
39
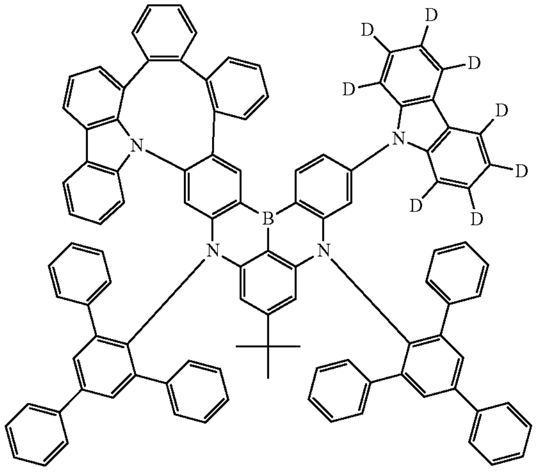

-continued
40
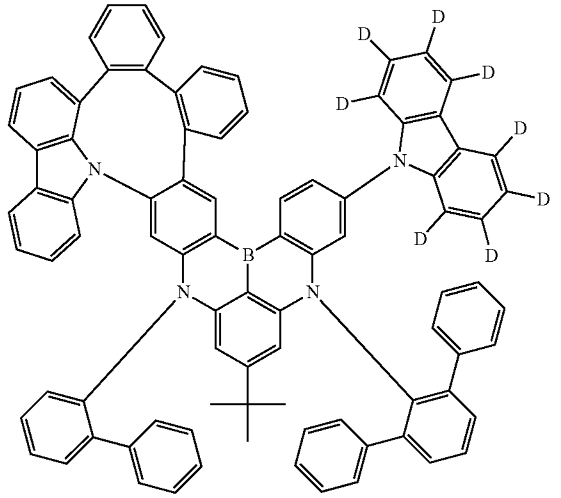
40
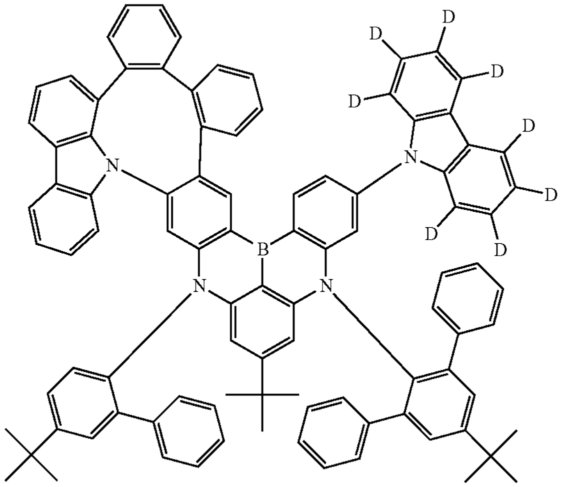
42
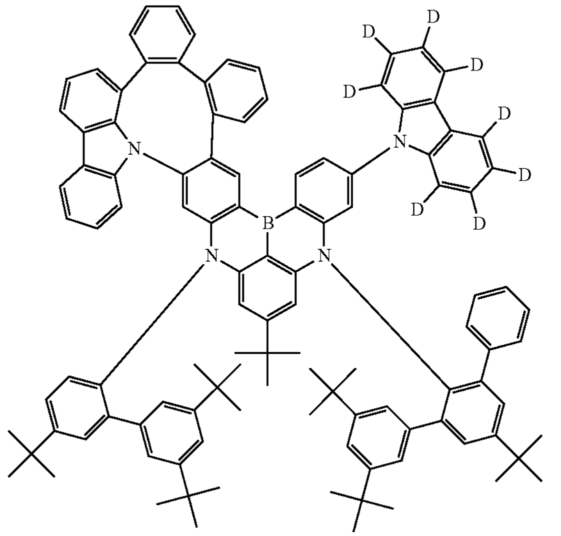
43
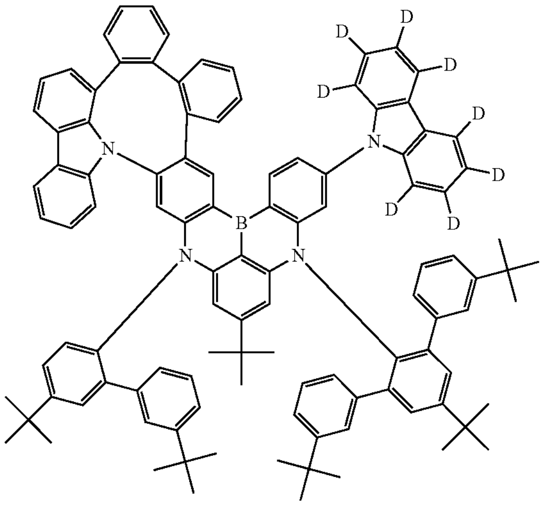
44
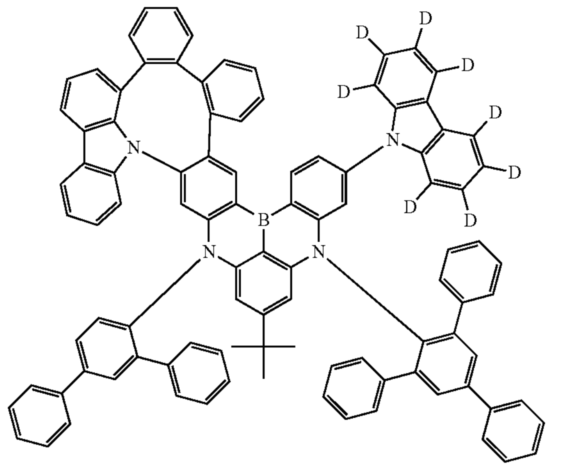
45
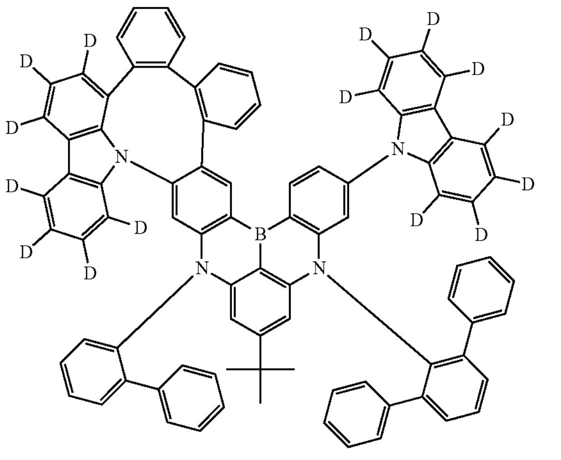

-continued
46
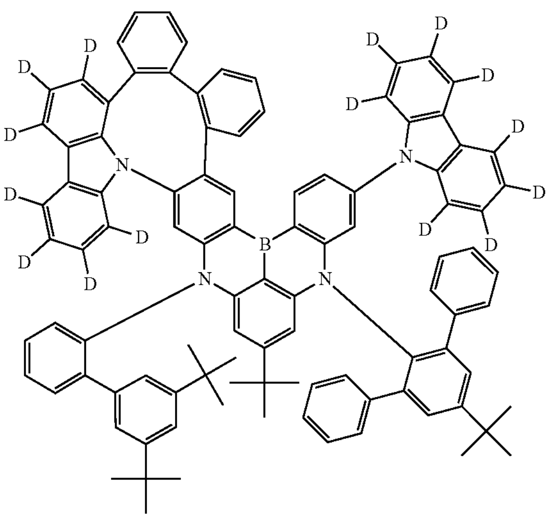
47
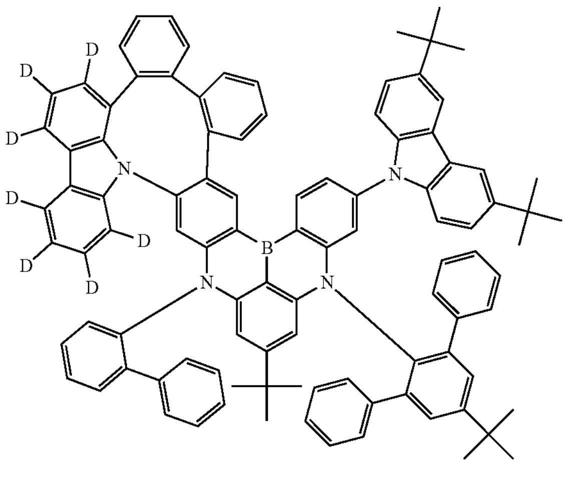
48
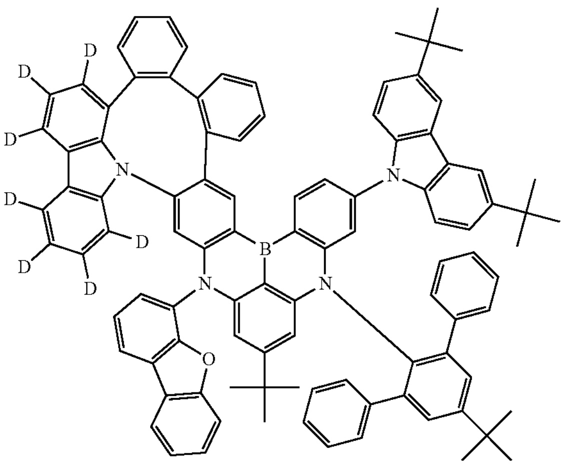
49
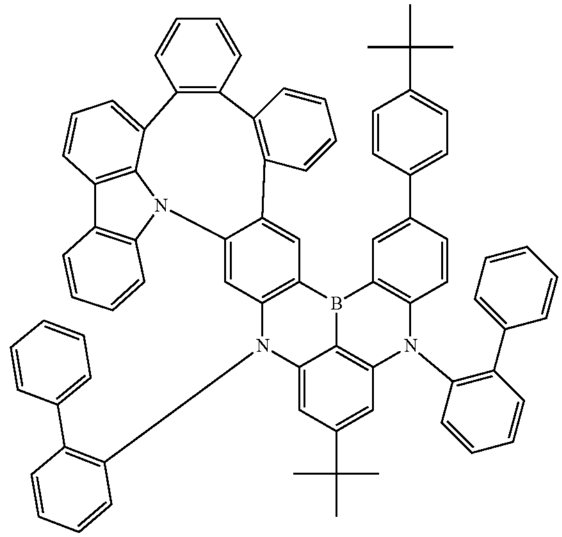
50
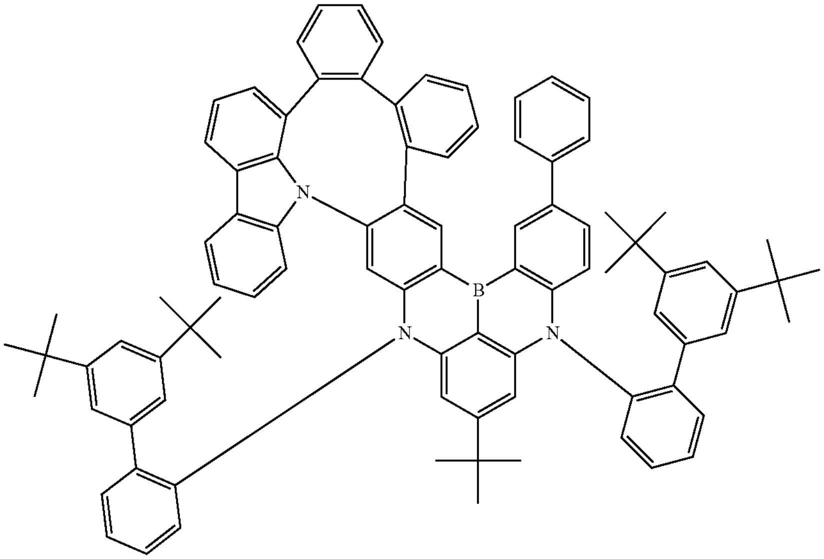

-continued
51
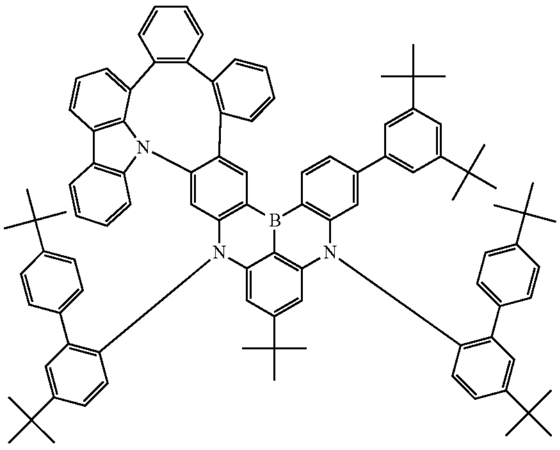
52
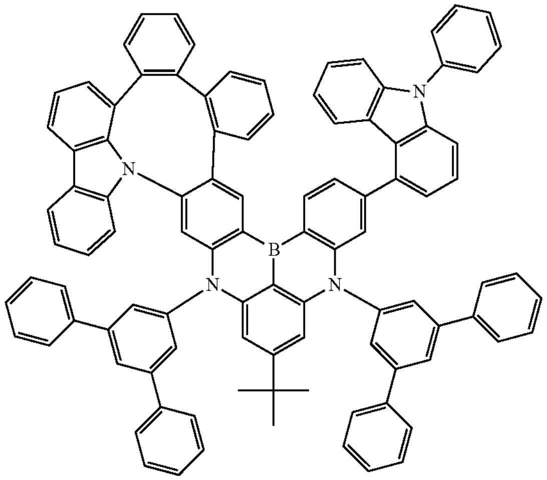
53
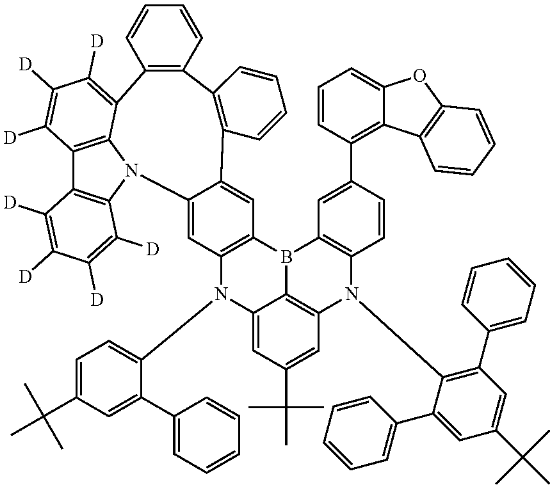
54
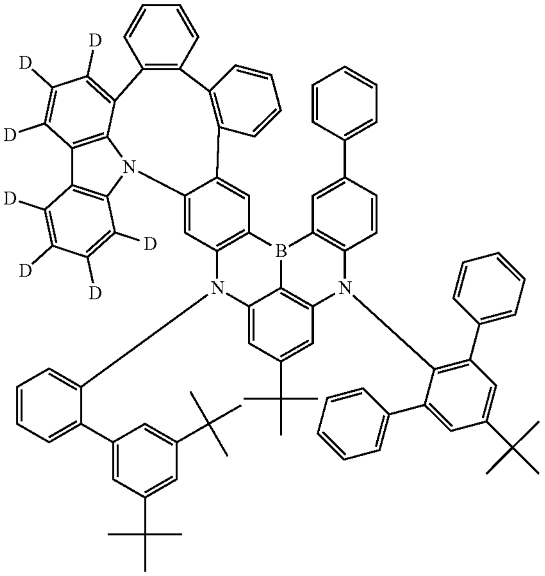
55
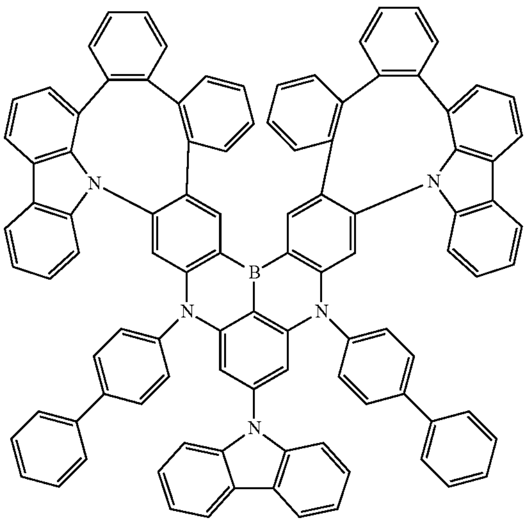
56
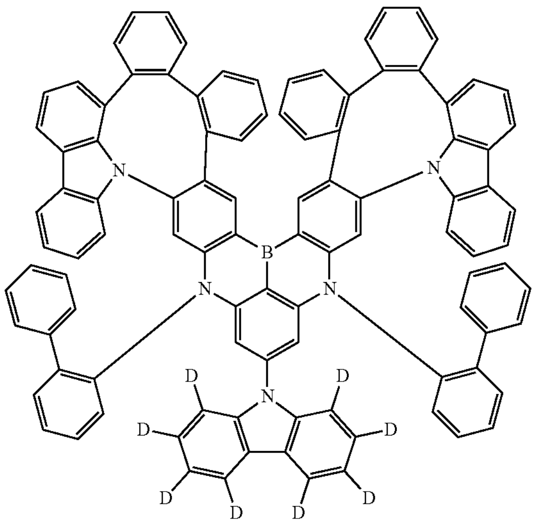

-continued
57
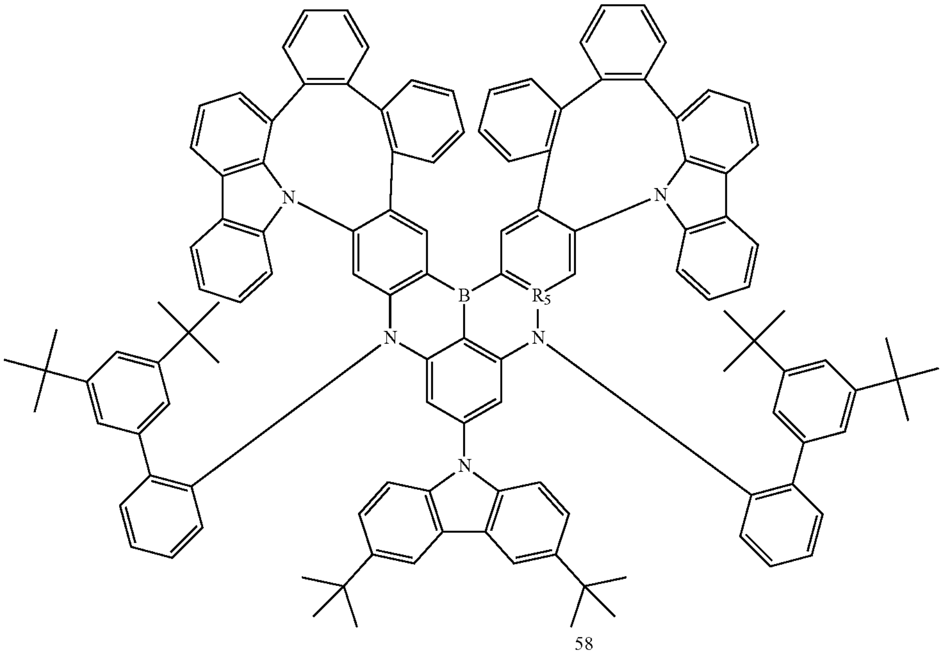
58
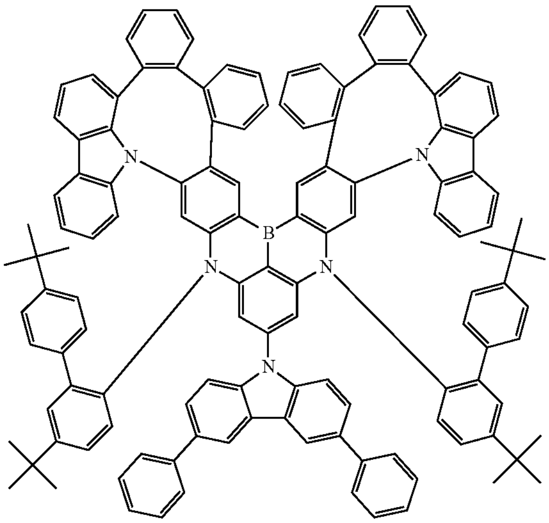
59
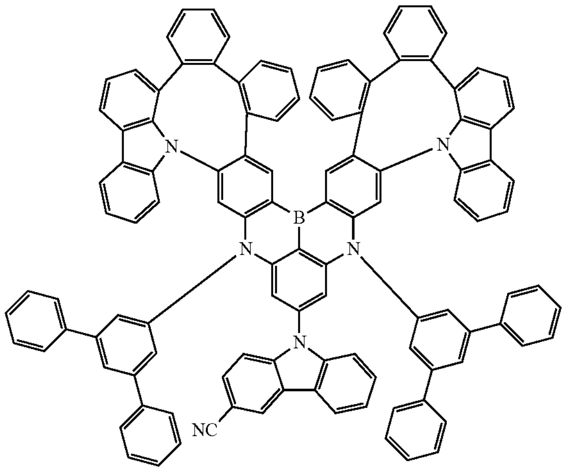
60
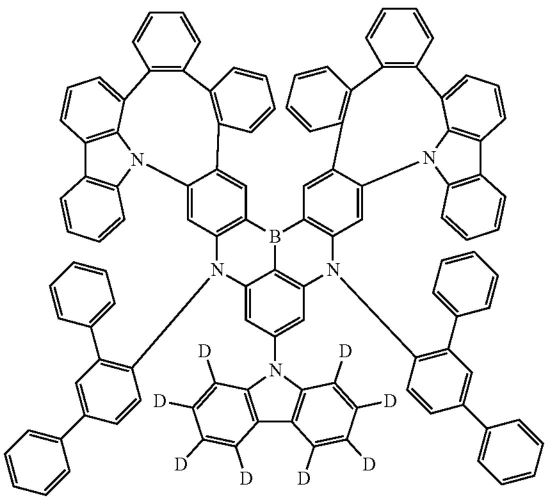
61
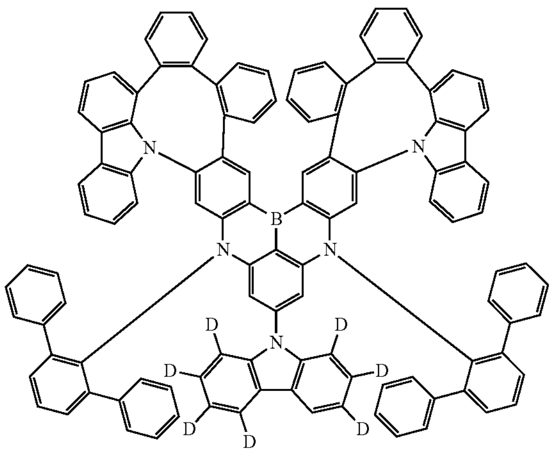

-continued
62
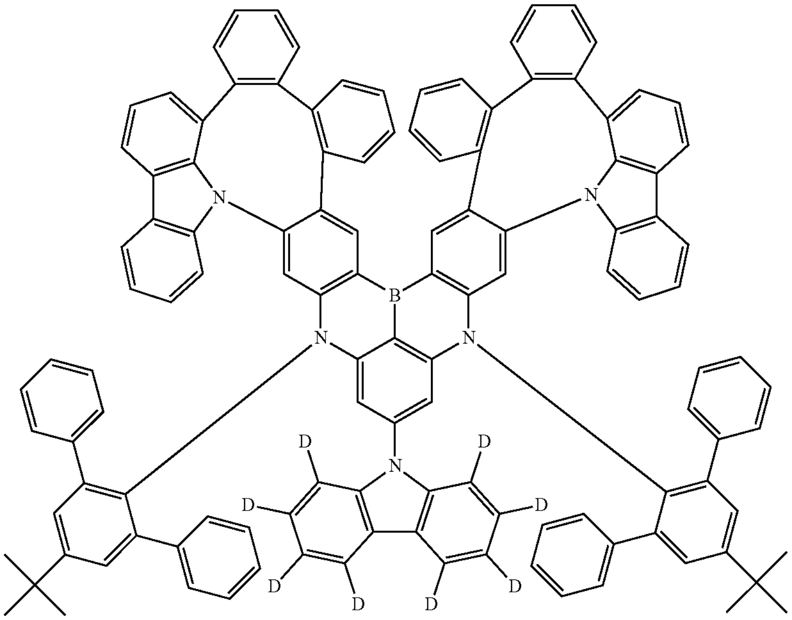
63
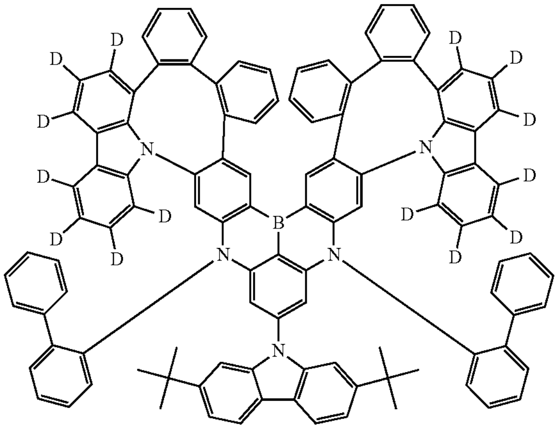

-continued
64
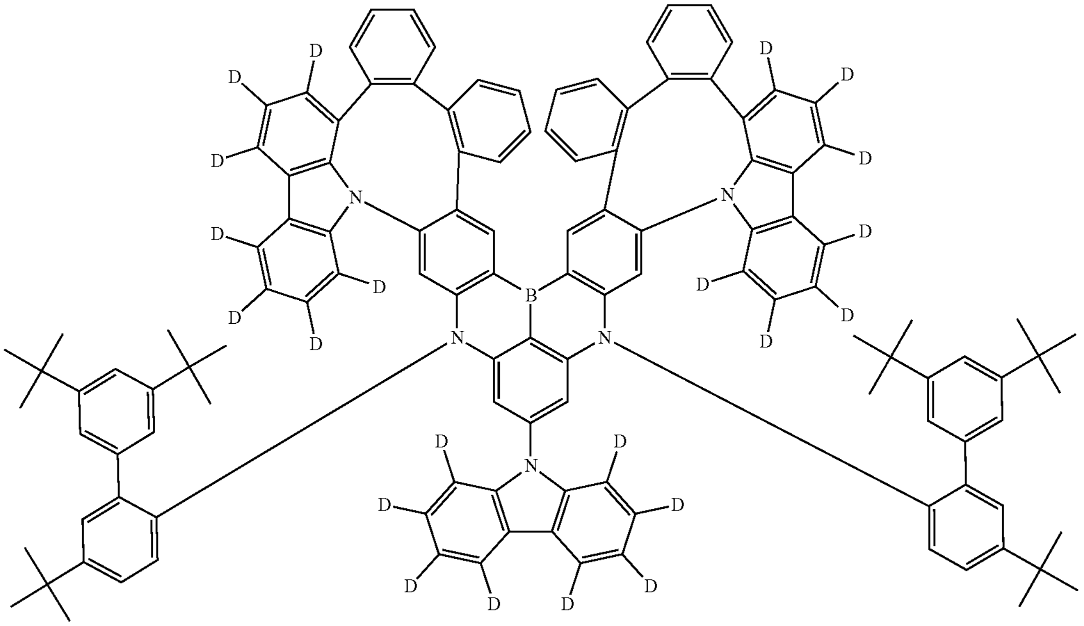
65
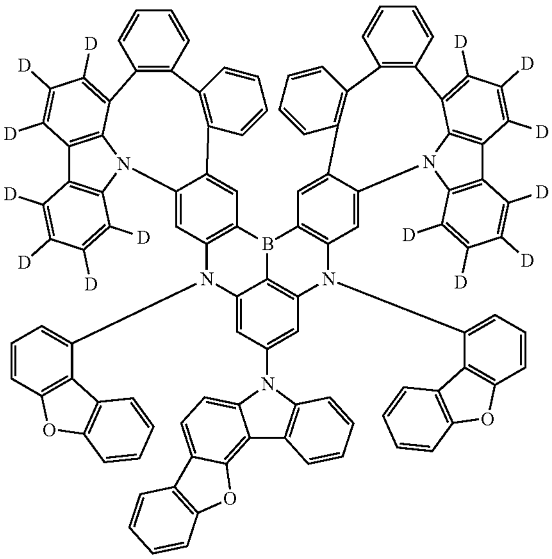
66
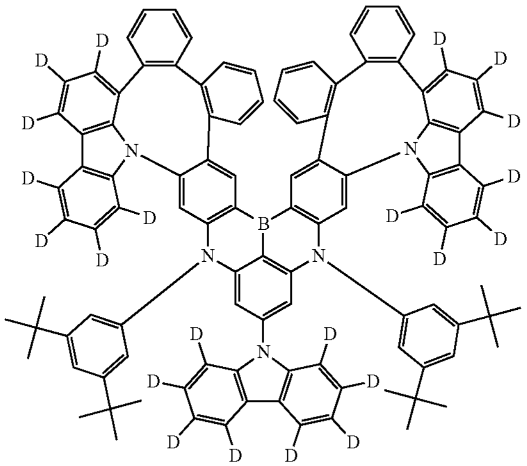

-continued
67
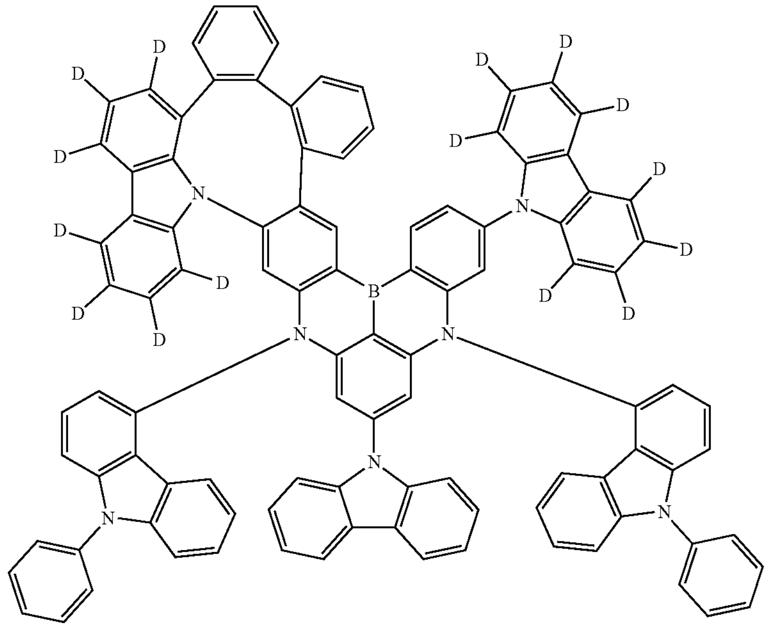
68
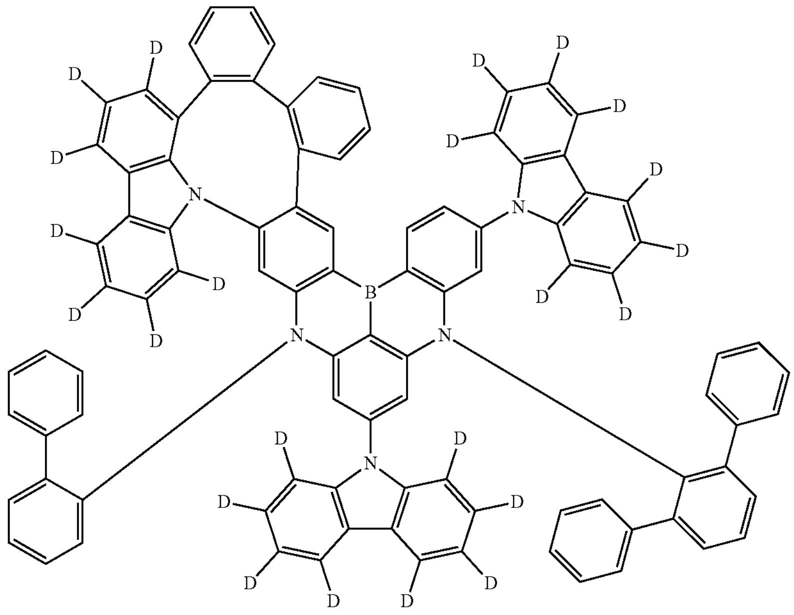

-continued
69
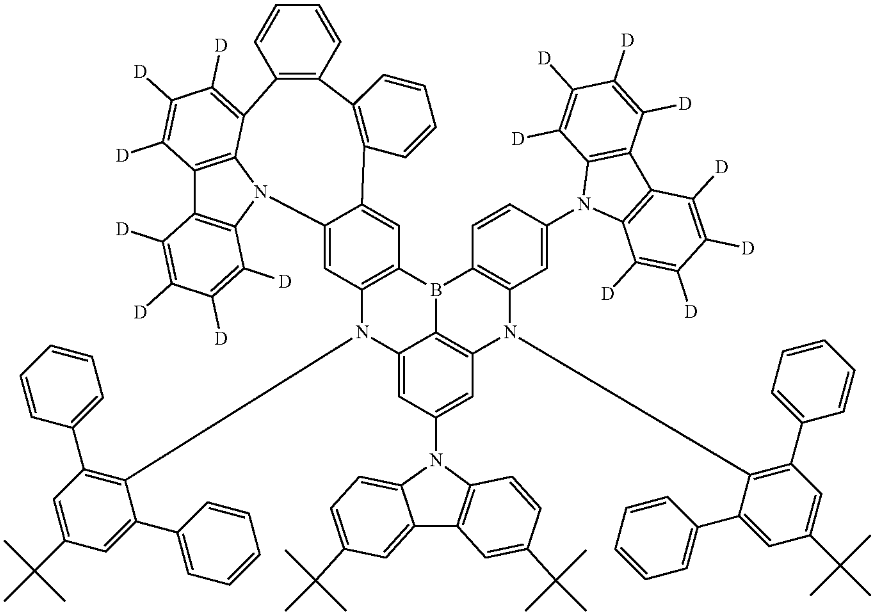
70
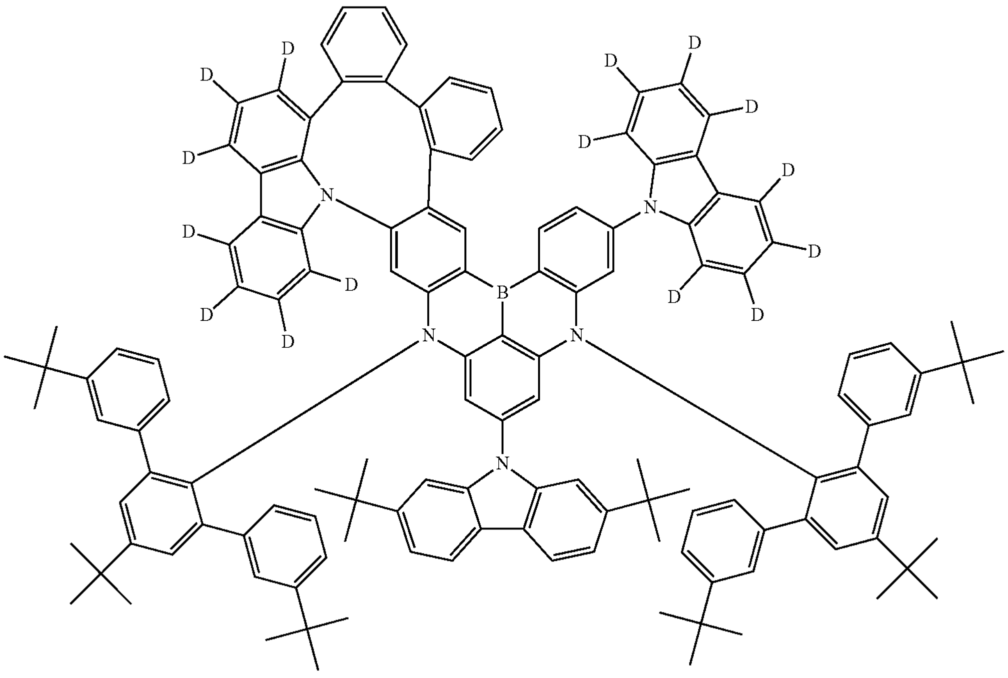

-continued
71
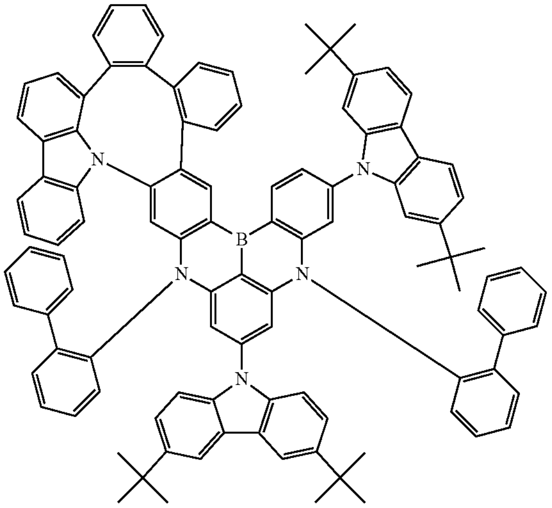
72
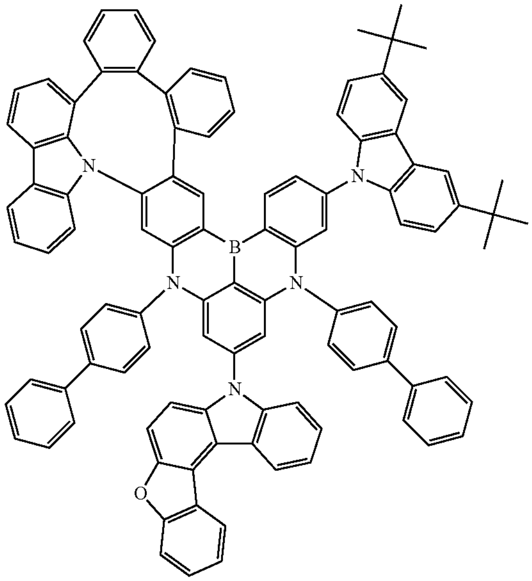
73
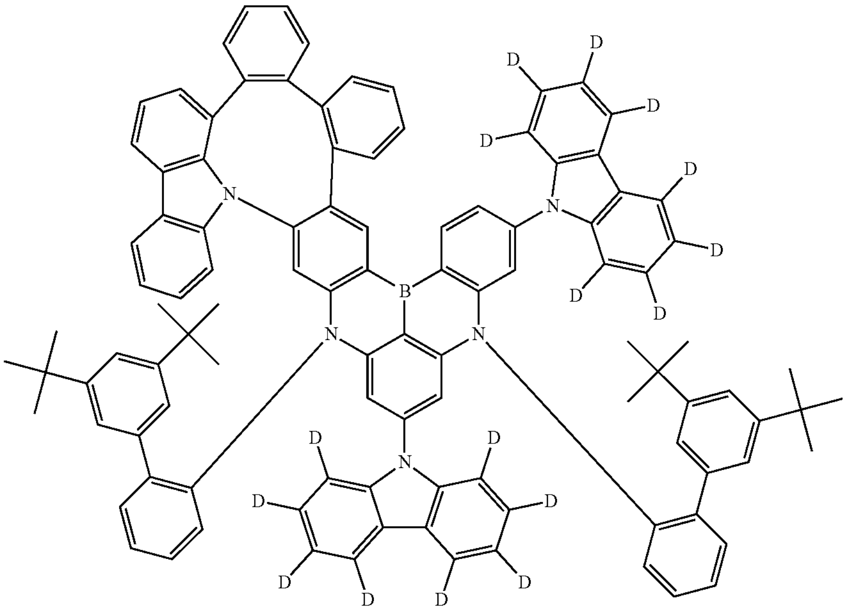

-continued
74
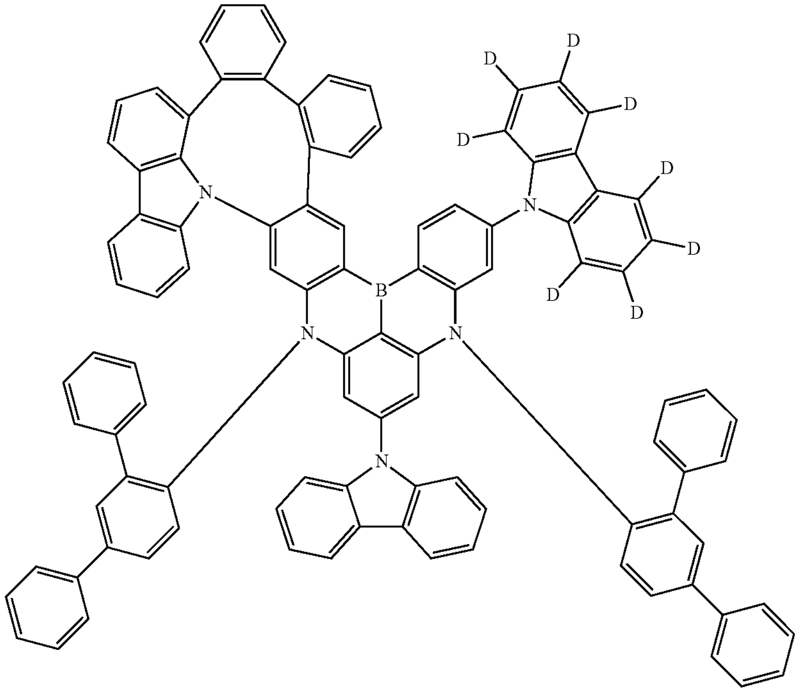
75
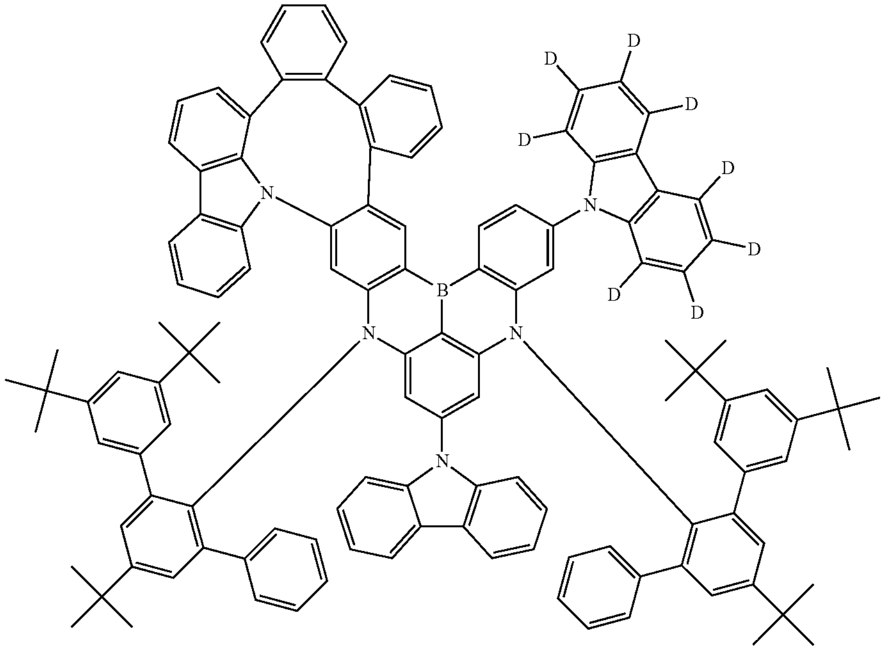

-continued
76
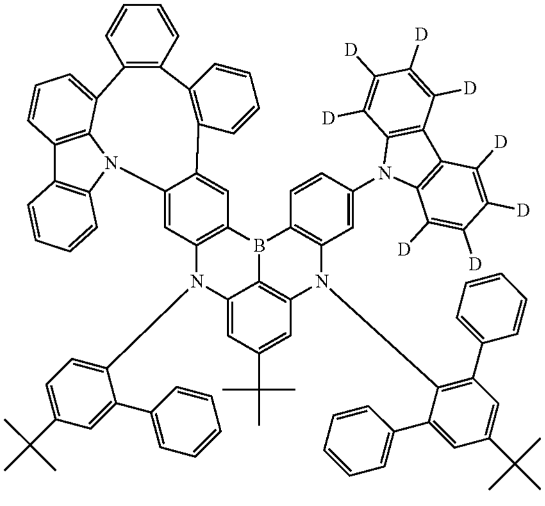
77
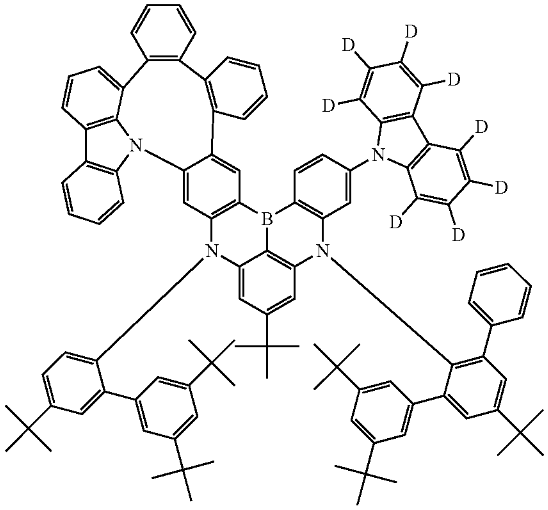
78
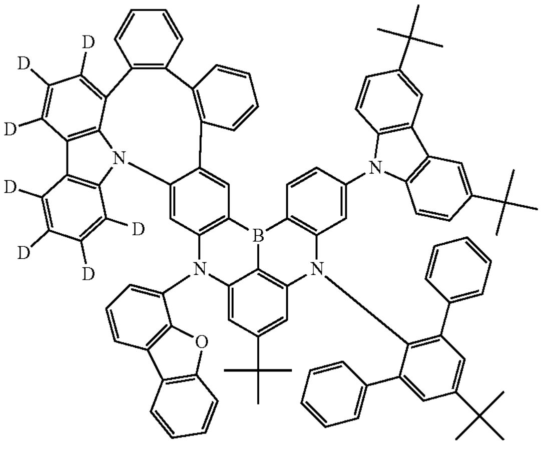
79
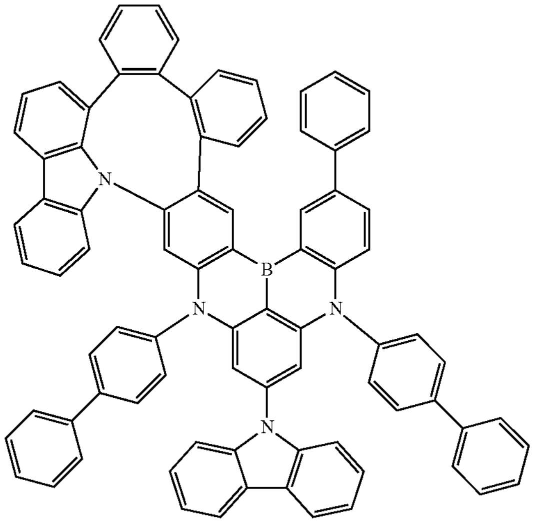
80
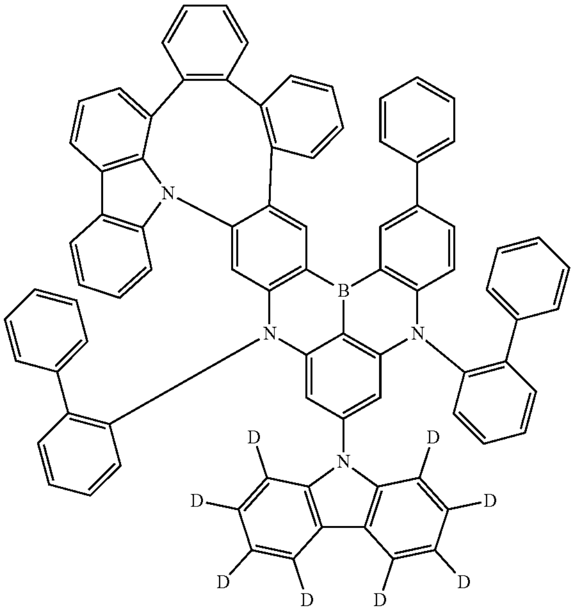
81
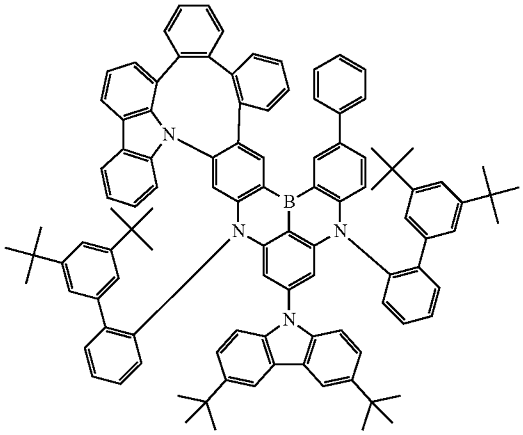

-continued
82
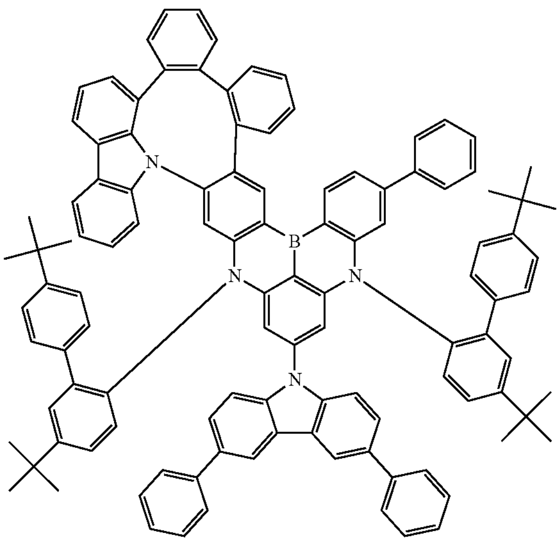
83
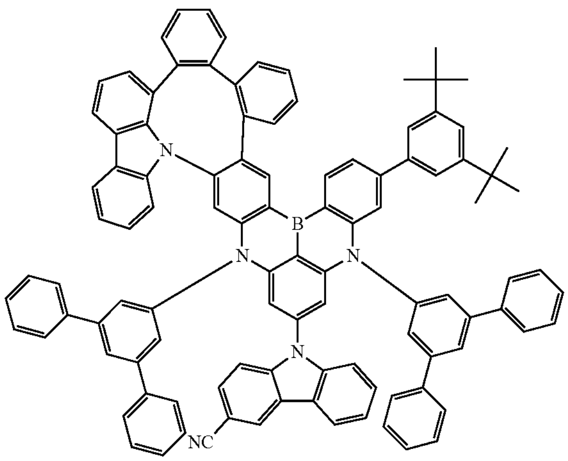
84
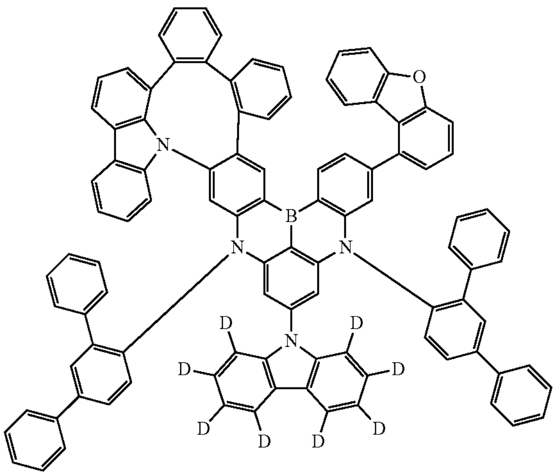
85
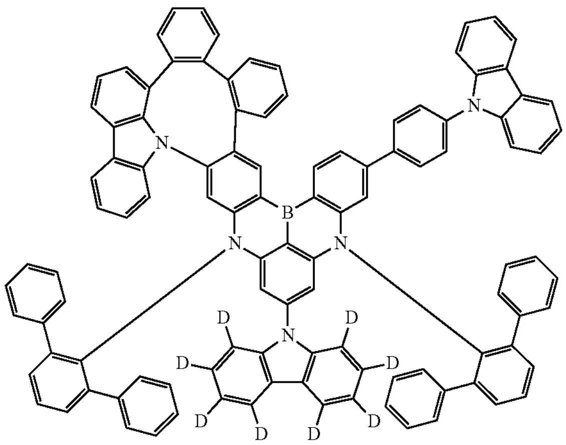
86
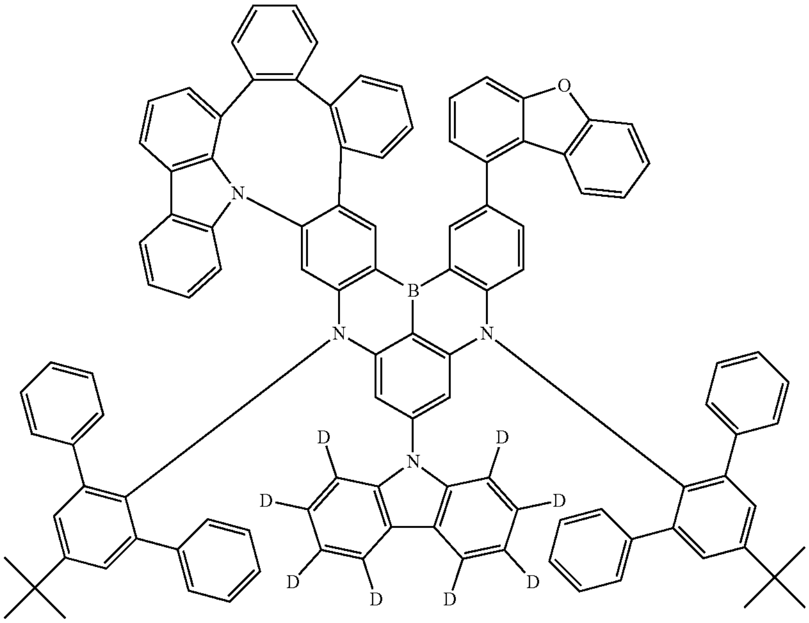

-continued
87
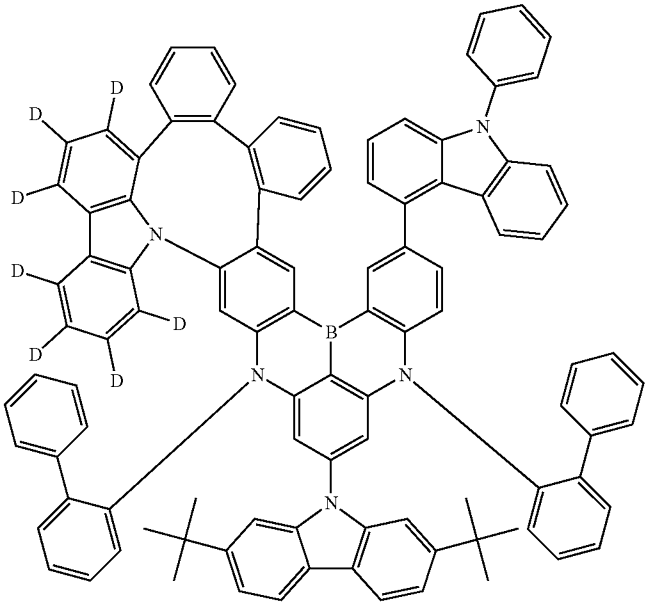
88
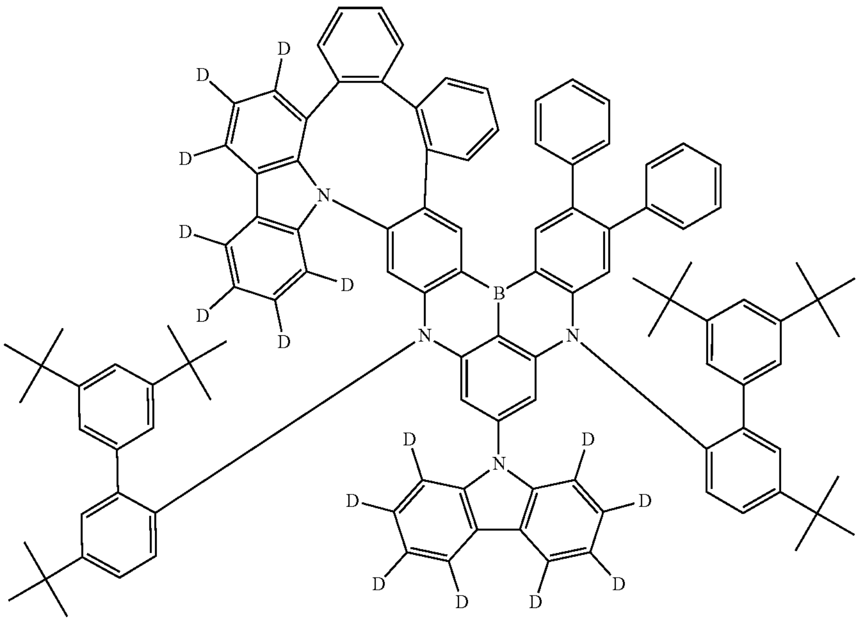

-continued
89
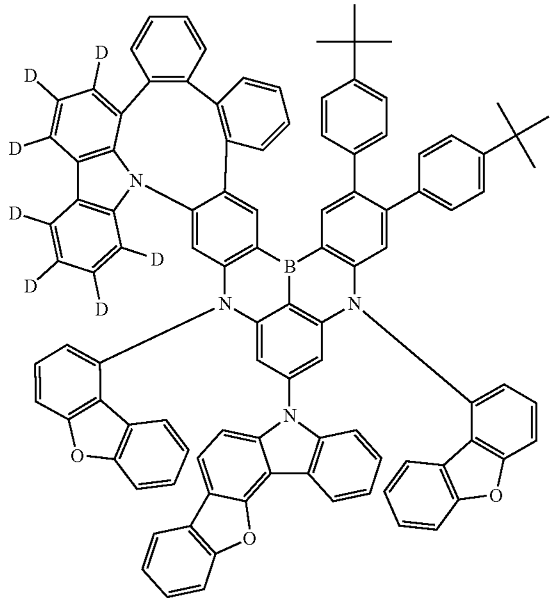
90
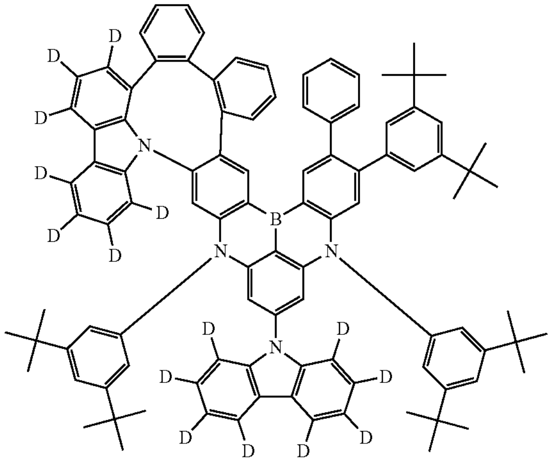
91
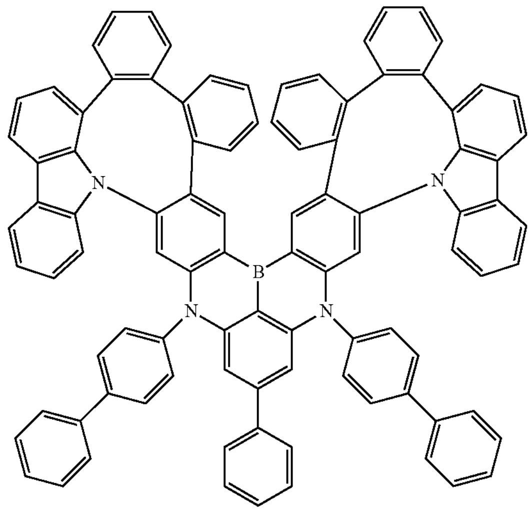
92
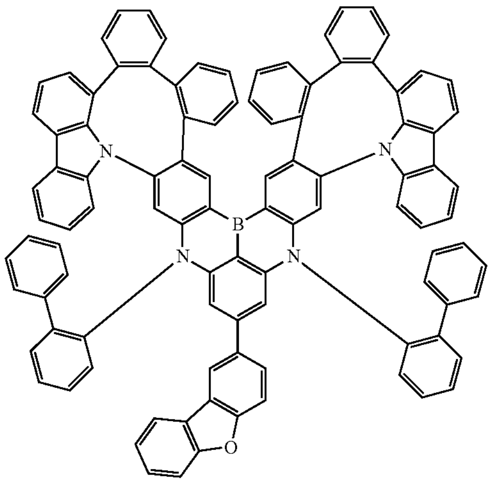

-continued
93
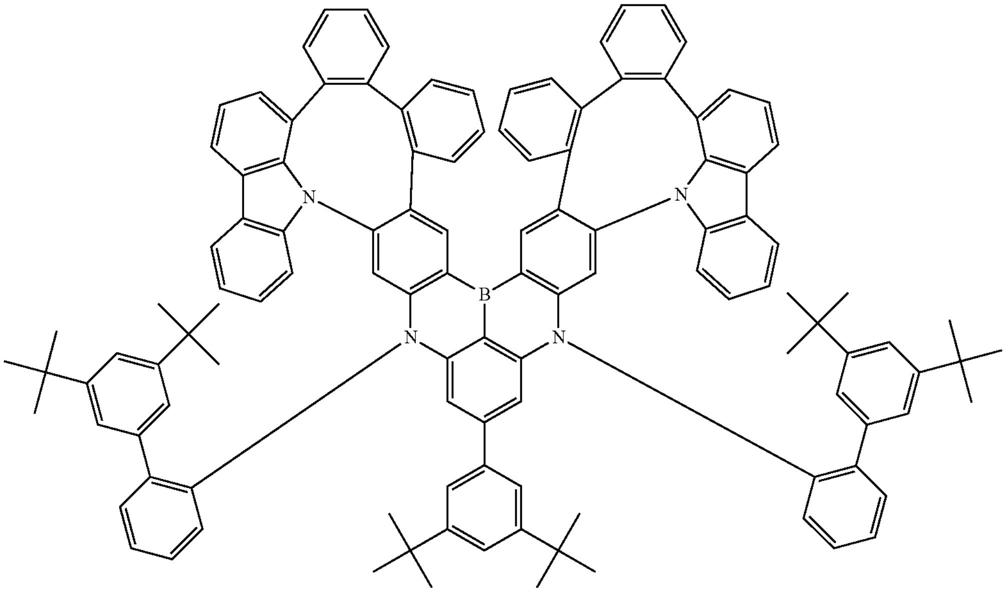
94
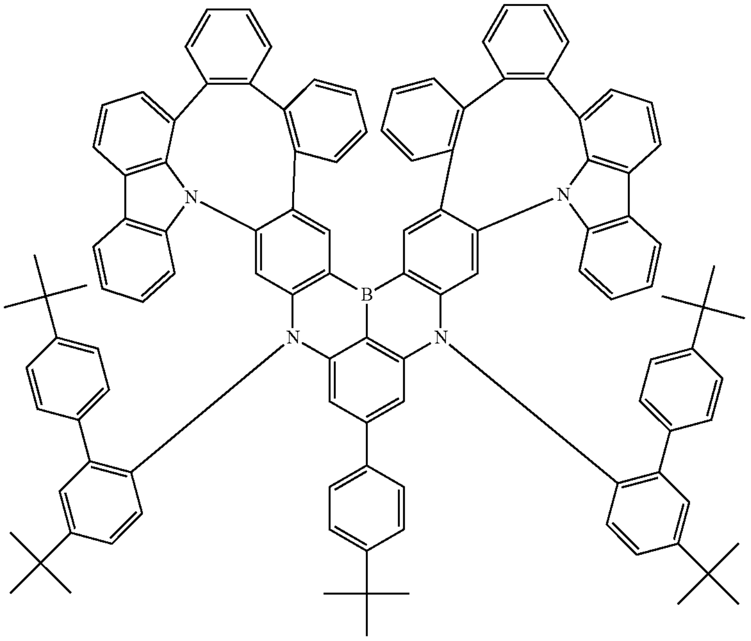

-continued
95
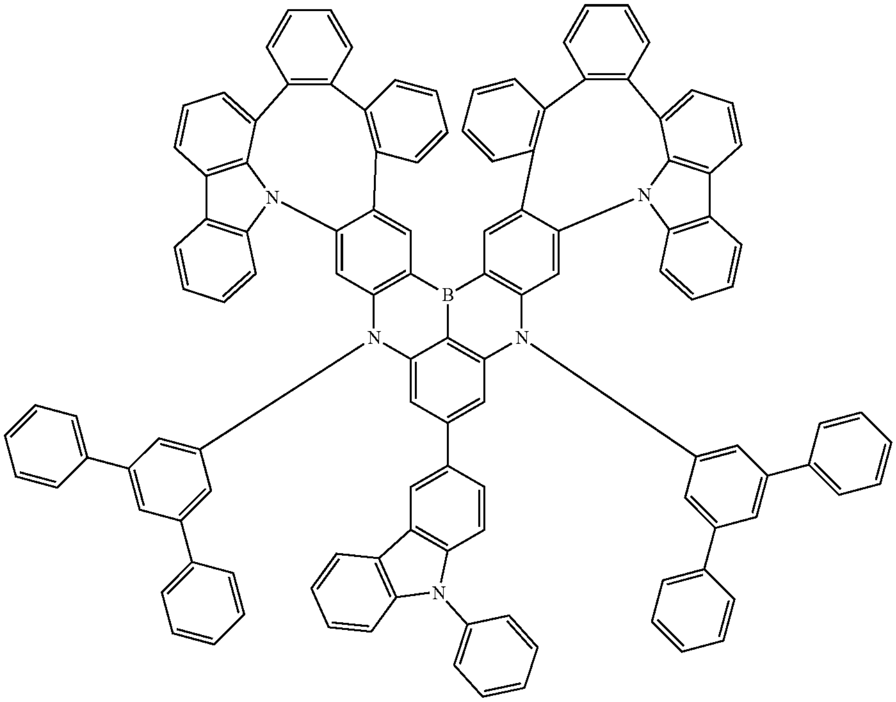
96
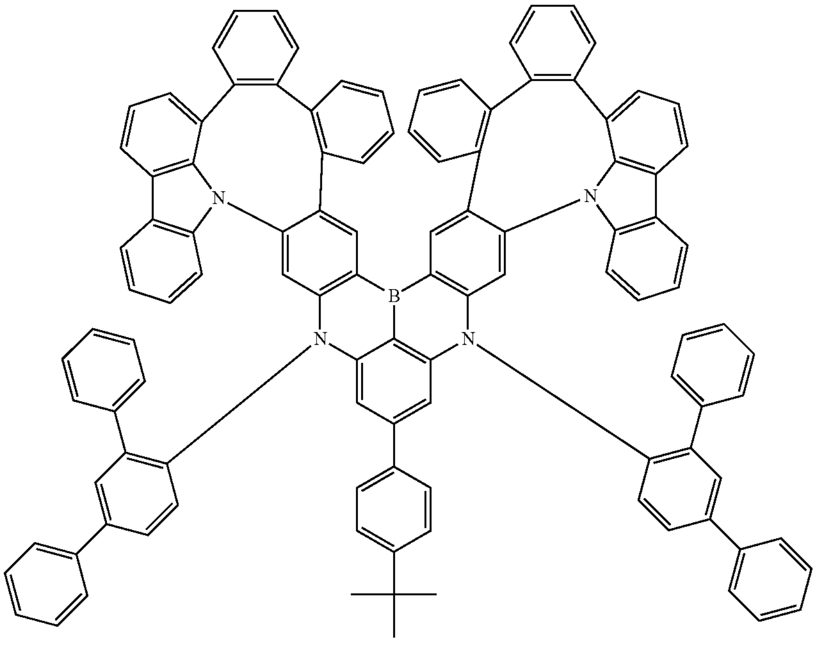

-continued
97
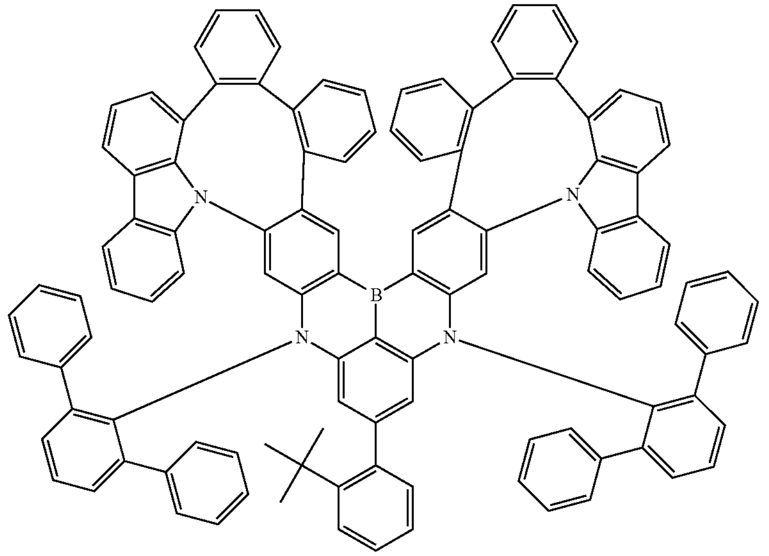
98
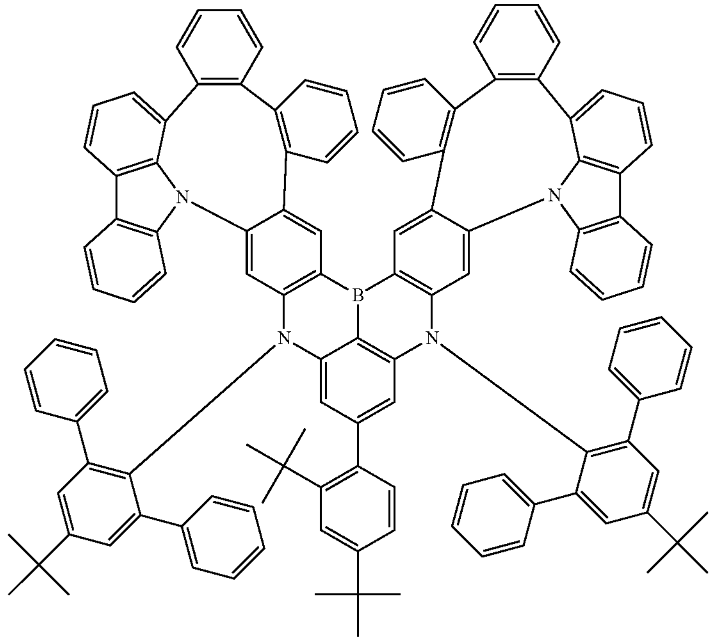

-continued
99
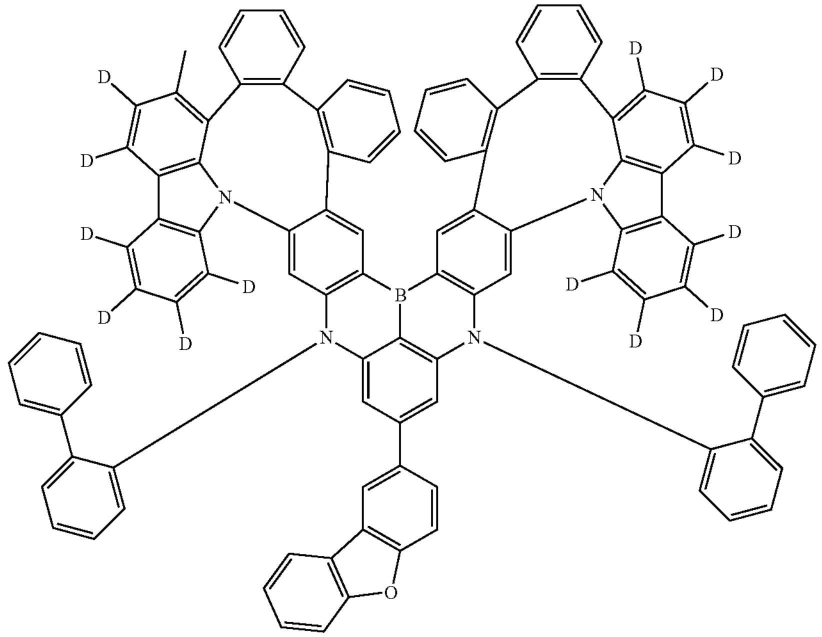
100
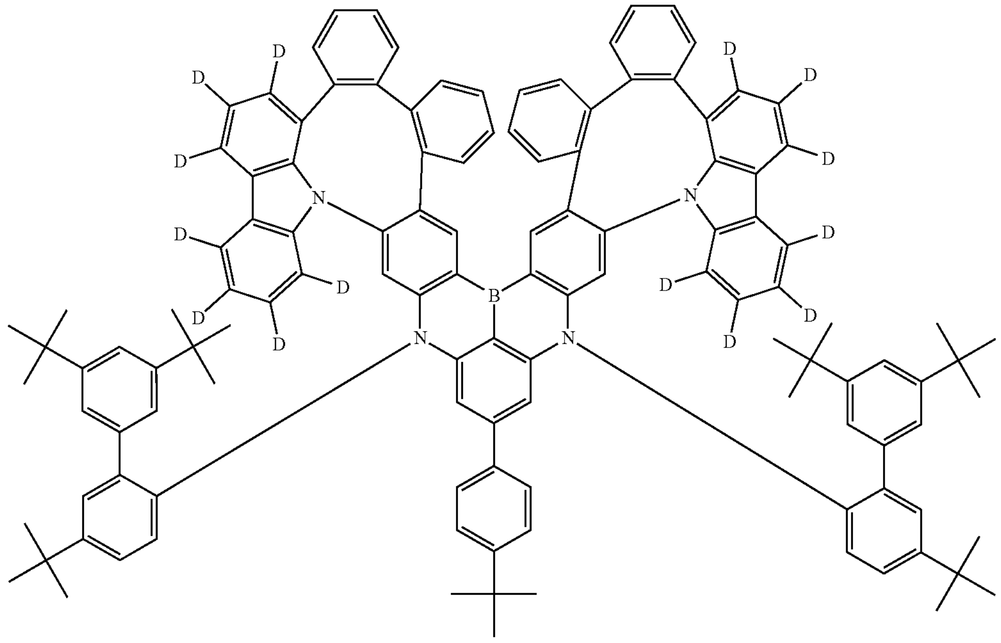

-continued
101
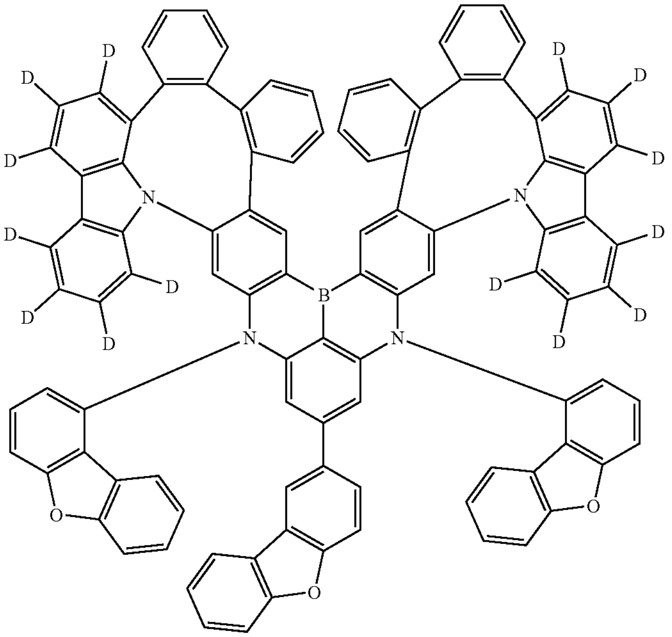
102
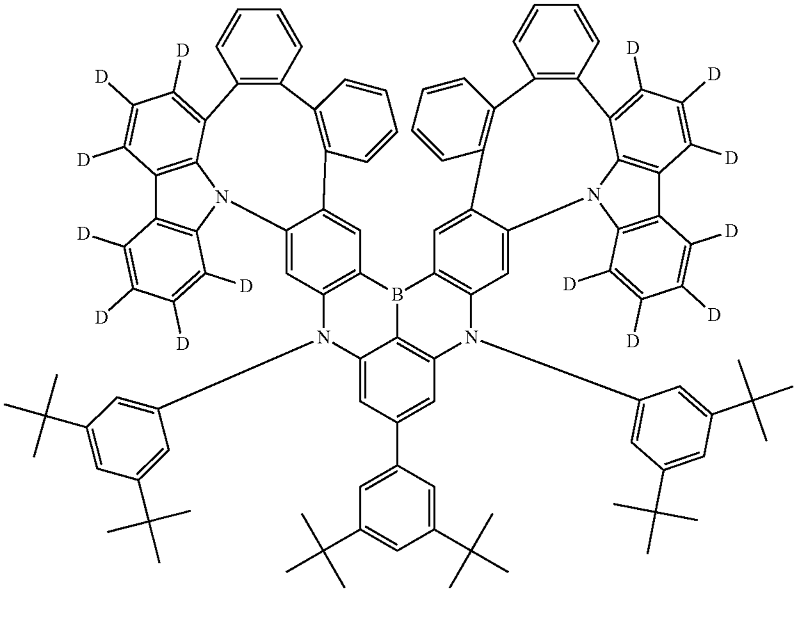

-continued
103
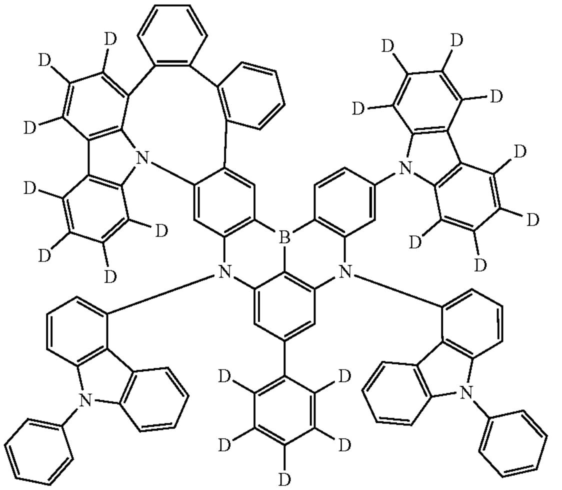
104
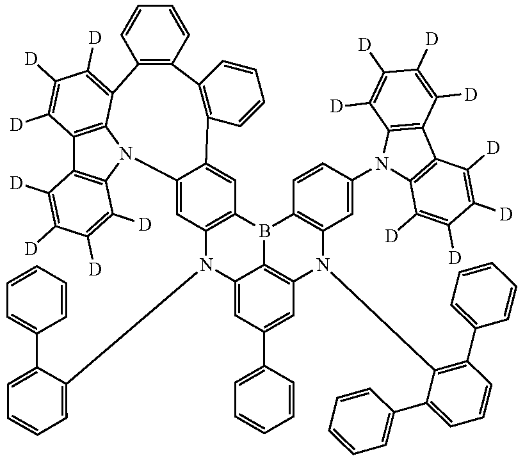
105
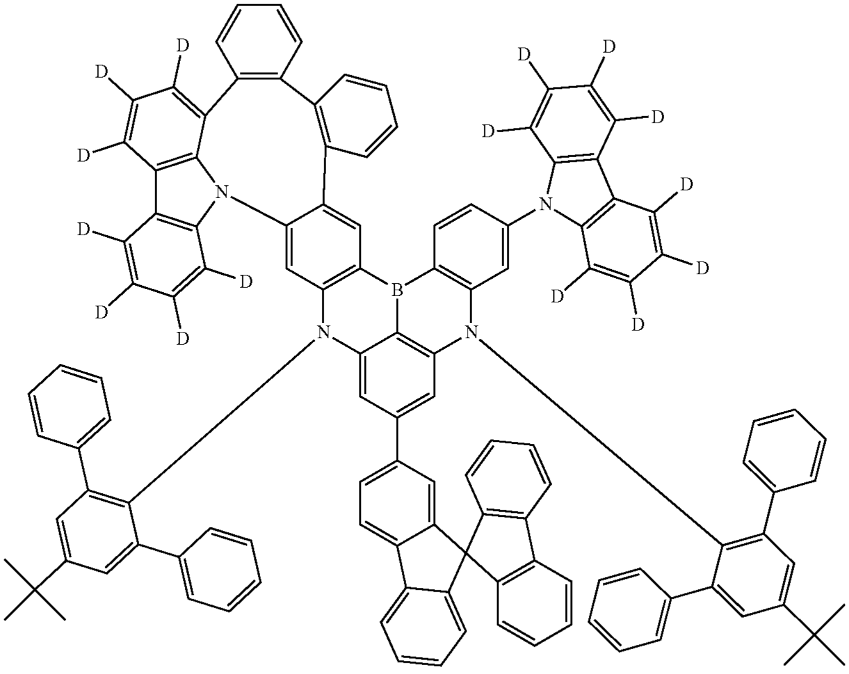

-continued
106
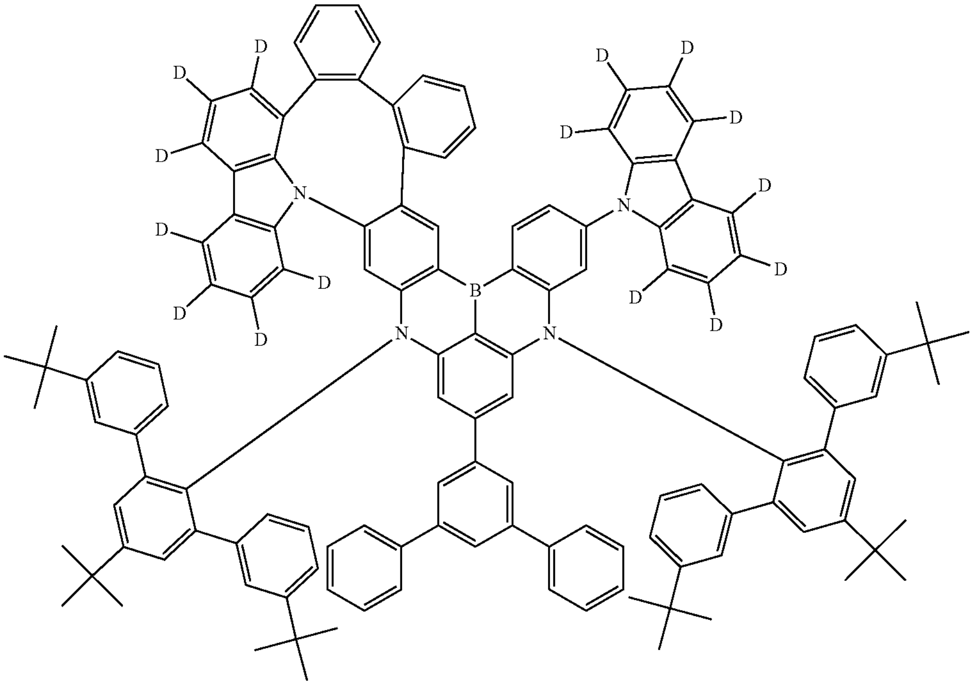
107
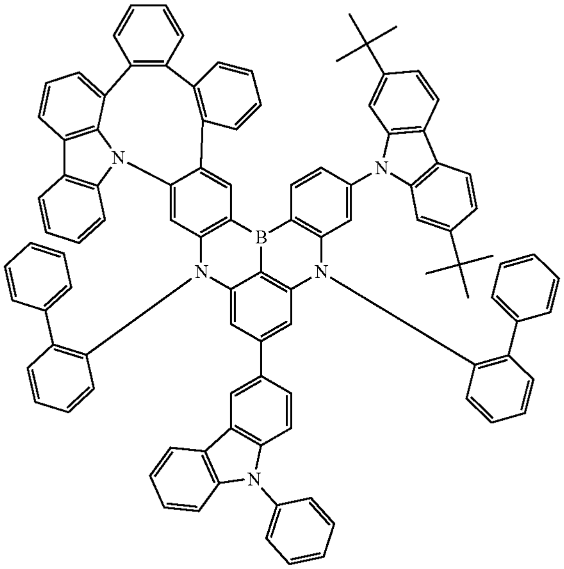
108
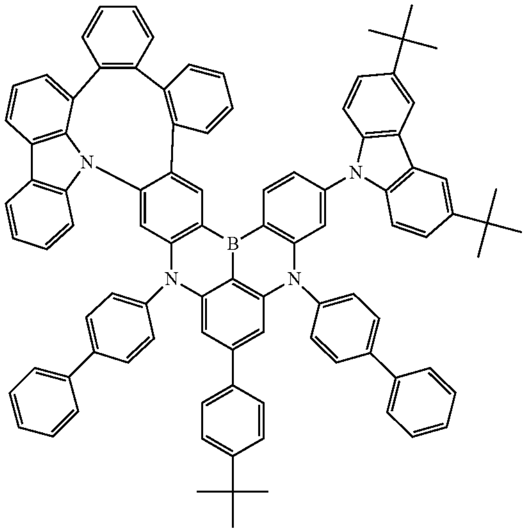

-continued
109
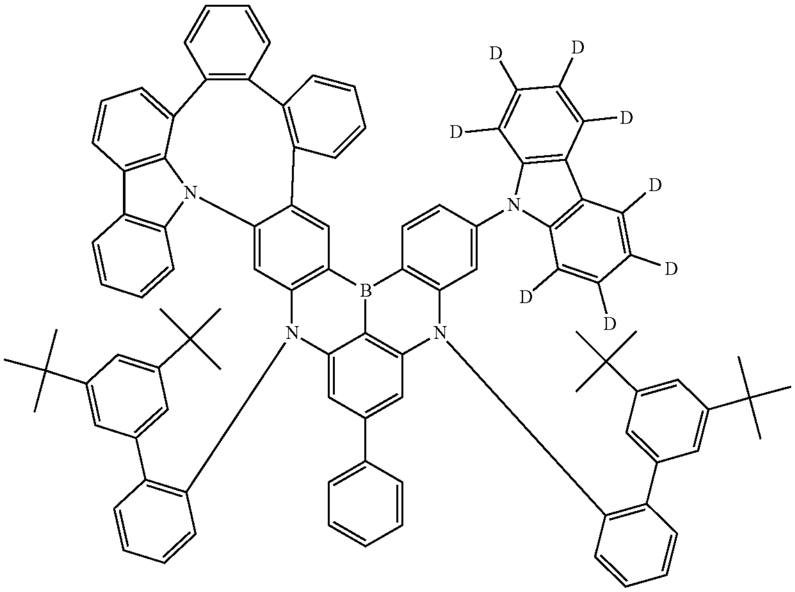
110
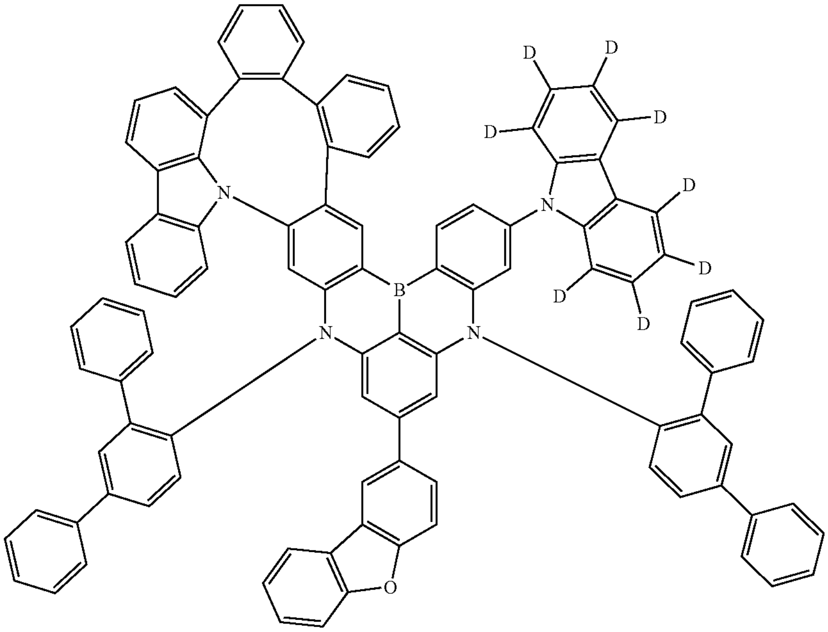

-continued
111
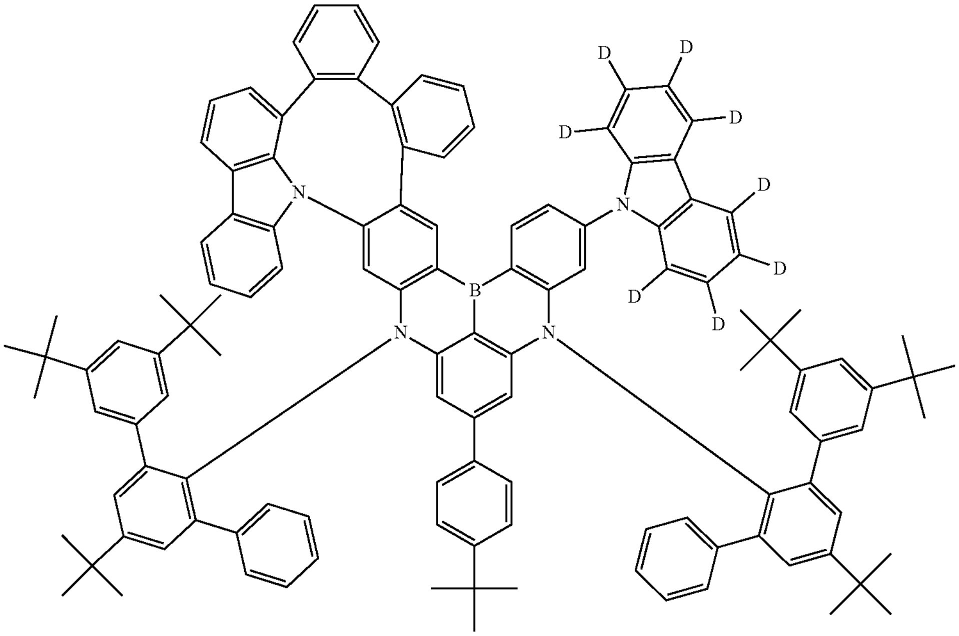
112
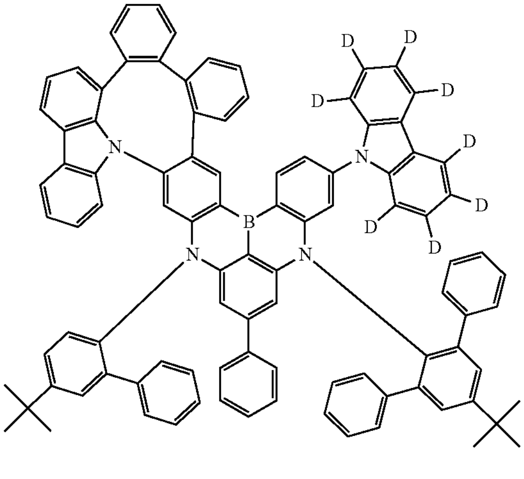
113
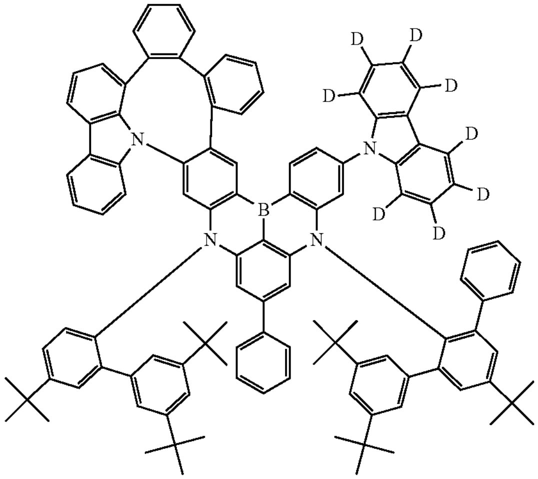
114
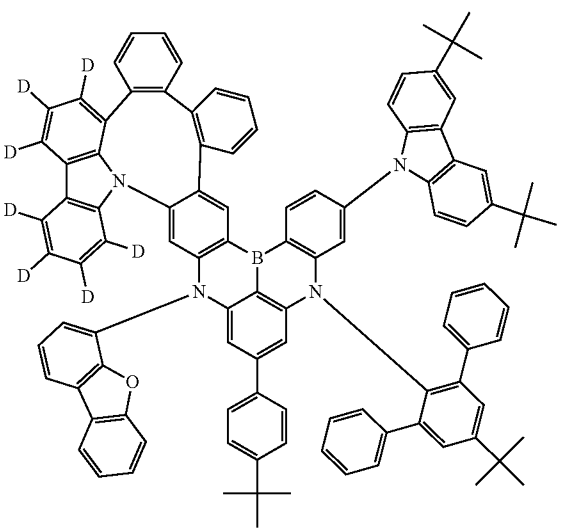
115
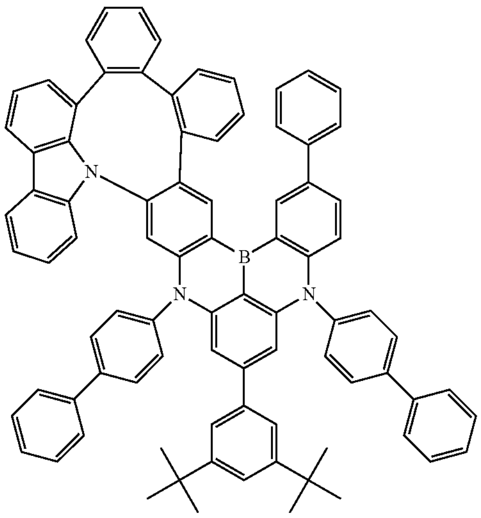

-continued
116
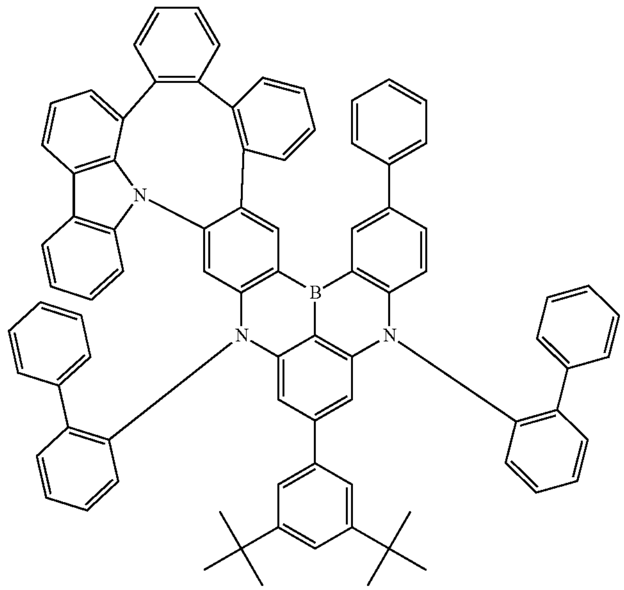
117
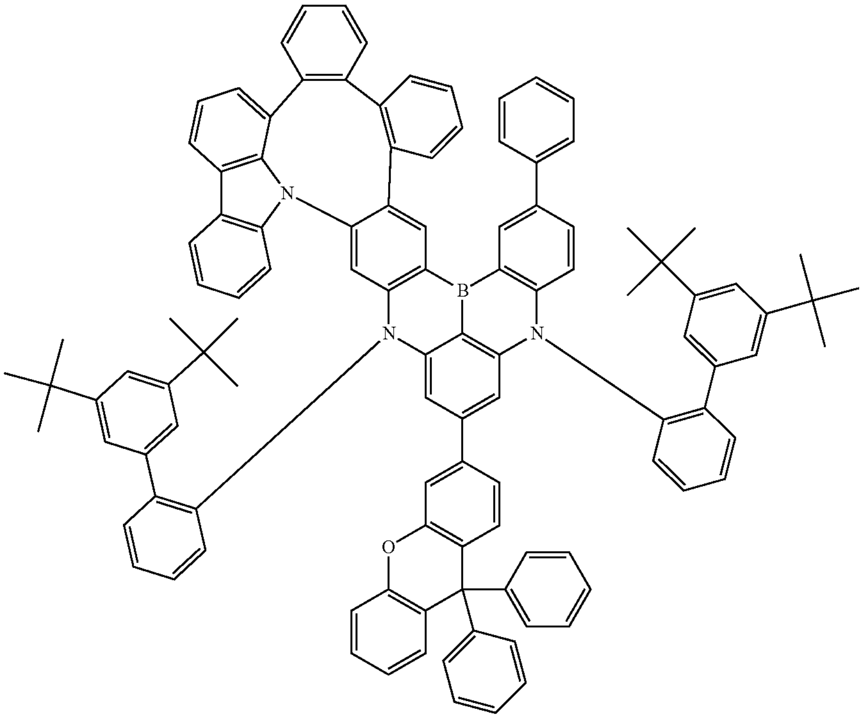

-continued
118
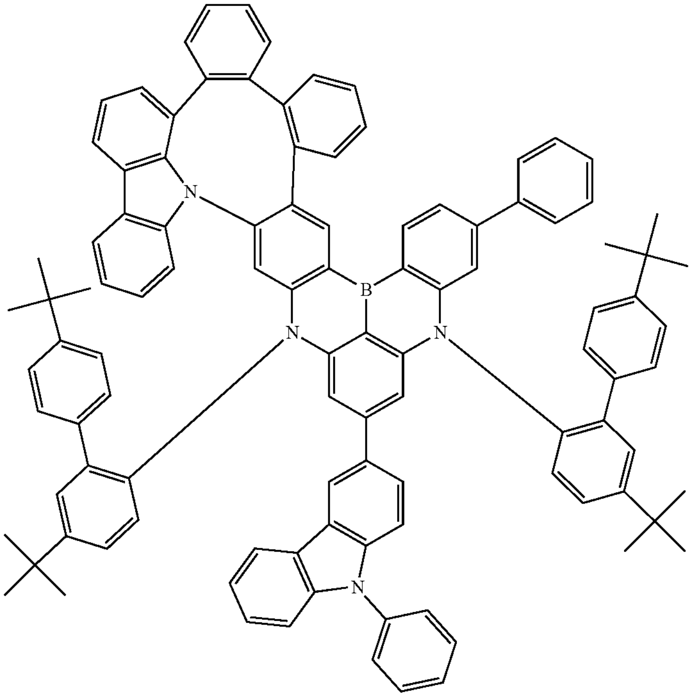
119
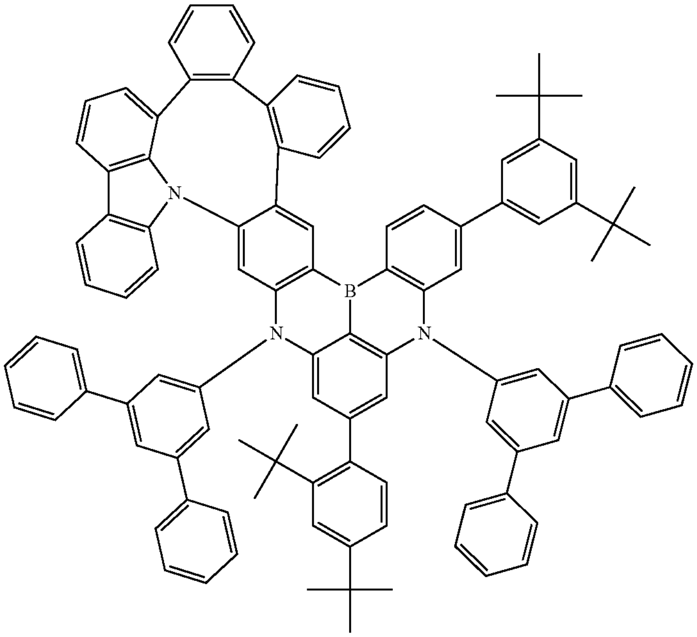

-continued
120
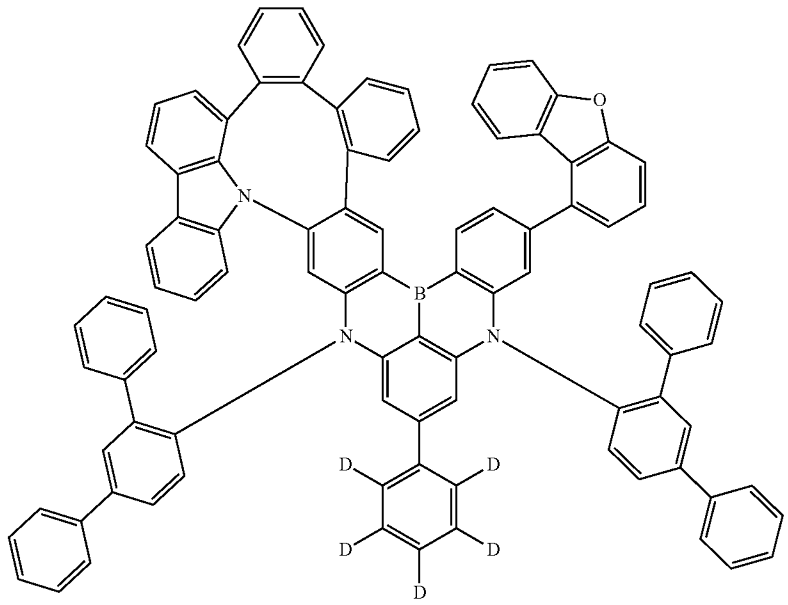
121
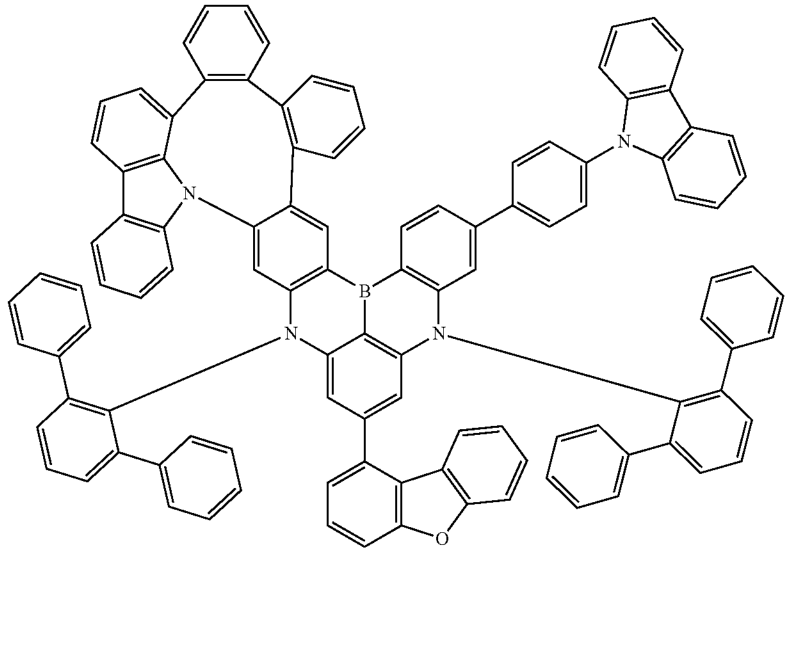

-continued
122
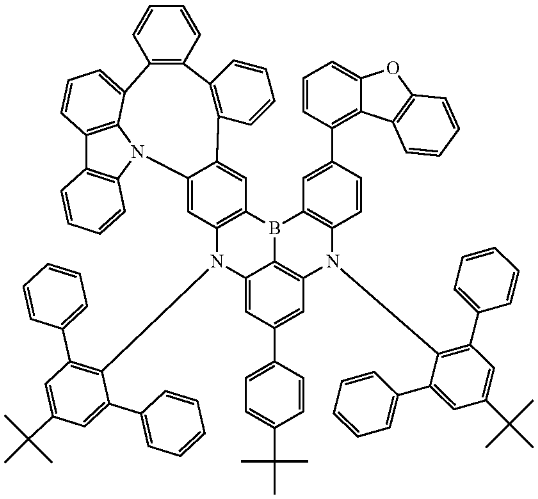
123
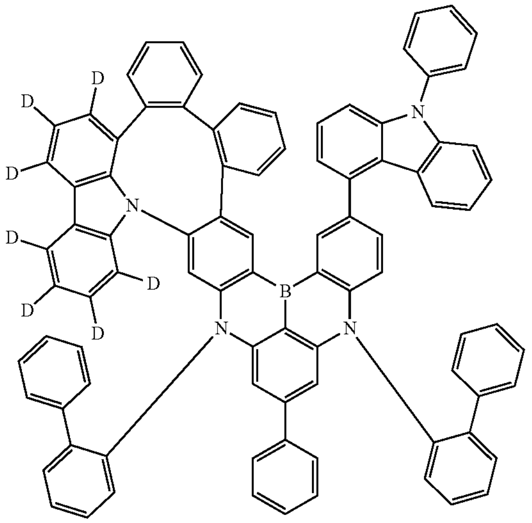
124
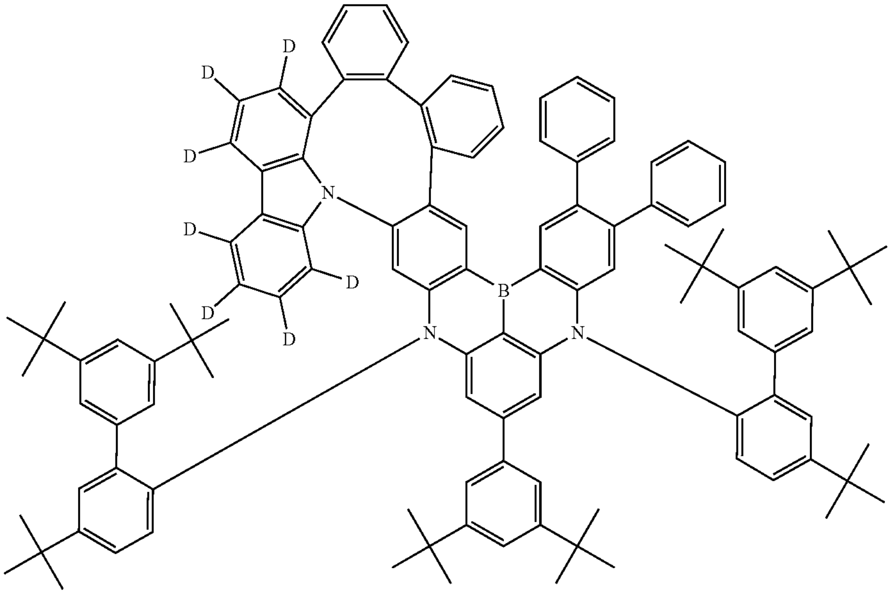

-continued
125
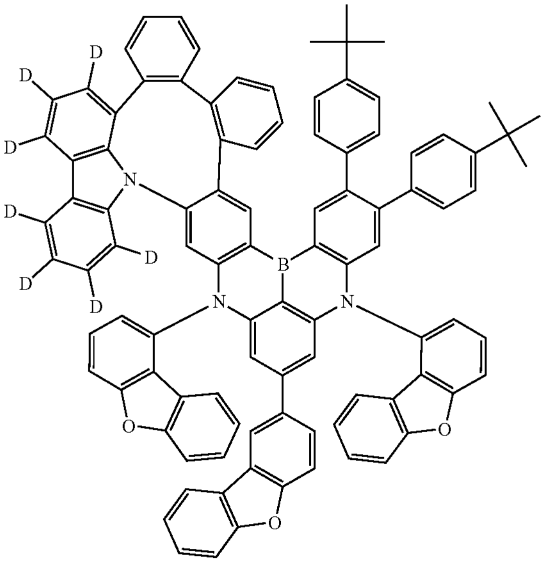
126
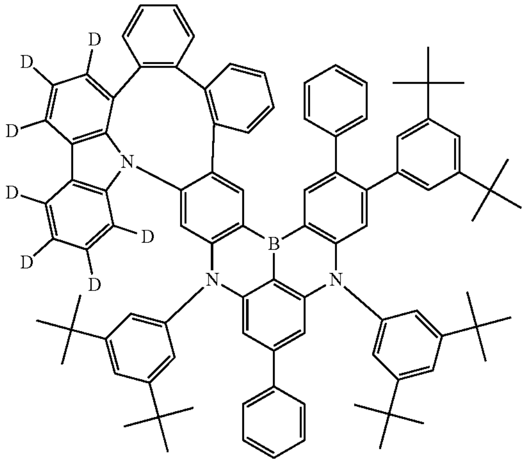
127
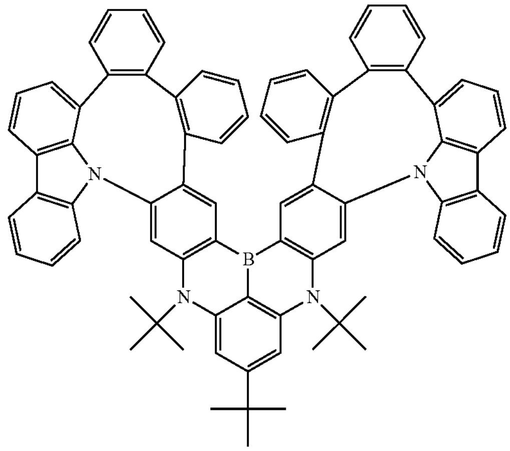
128
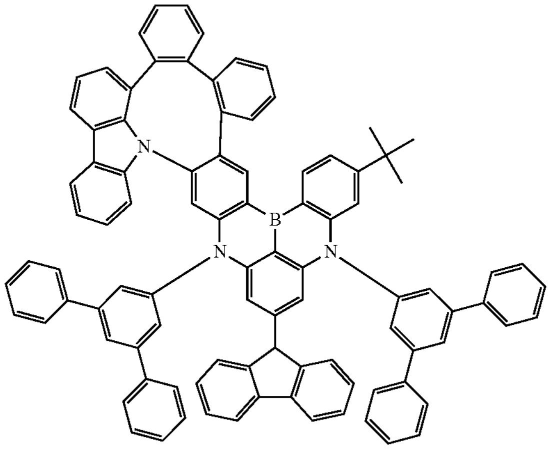
129
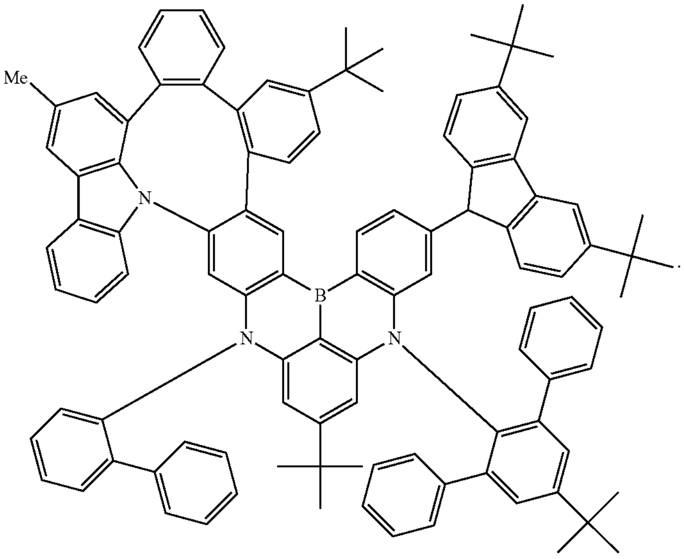
* * * * *